US005602999A

United States Patent [19]

Hyatt

[11] Patent Number: 5,602,999

[45] Date of Patent: Feb. 11, 1997

[54] MEMORY SYSTEM HAVING A PLURALITY OF MEMORIES, A PLURALITY OF DETECTOR CIRCUITS, AND A DELAY CIRCUIT

[76] Inventor: Gilbert P. Hyatt, 7841 Jennifer Cir., La Palma, Calif. 90623

[21] Appl. No.: 517,005

[22] Filed: Apr. 30, 1990

Related U.S. Application Data

[63] Continuation of Ser. No. 279,592, Dec. 2, 1988, Pat. No. 5,459,846, and a continuation-in-part of Ser. No. 661,649, Oct. 17, 1984, abandoned, Ser. No. 848,017, Apr. 3, 1986, and Ser. No. 849,243, Apr. 7, 1986, Pat. No. 5,410,621, which is a continuation-in-part of Ser. No. 849,733, Nov. 9, 1977, abandoned, and Ser. No. 425,731, Sep. 28, 1982, Pat. No. 4,581,715, which is a continuation-in-part of Ser. No. 160,872, Jun. 19, 1980, Pat. No. 4,491,930, Ser. No. 860, 257, Dec. 14, 1977, Pat. No. 4,371,923, Ser. No. 101,881, Dec. 28, 1970, abandoned, Ser. No. 134,958, Apr. 19, 1971, Ser. No. 135,040, Apr. 19, 1971, Ser. No. 229,213, Apr. 13, 1972, Pat. No. 3,820,894, Ser. No. 230,872, Mar. 1, 1972, Pat. No. 4,531,182, Ser. No. 232,459, Mar. 7, 1972, Pat. No. 4,370,720, Ser. No. 246,867, Apr. 24, 1972, Pat. No. 4,310, 878, Ser. No. 288,247, Sep. 11, 1972, Pat. No. 4,121,284, Ser. No. 291,394, Sep. 22, 1972, Pat. No. 4,396,976, Ser. No. 302,771, Nov. 1, 1972, Ser. No. 325,933, Jan. 22, 1973, Pat. No. 4,016,540, Ser. No. 325,941, Jan. 22, 1973, Pat. No. 4,060,848, Ser. No. 366,714, Jun. 4, 1973, Pat. No. 3,986, 022, Ser. No. 339,817, Mar. 9, 1973, Pat. No. 4,034,276, Ser. No. 402,520, Oct. 1, 1973, Pat. No. 4,825,364, Ser. No. 490,816, Jul. 22, 1974, Pat. No. 4,029,853, Ser. No. 476,743, Jun. 5, 1974, Pat. No. 4,364,110, Ser. No. 522,559, Nov. 11, 1974, Pat. No. 4,209,852, Ser. No. 550,231, Feb. 14, 1975, Pat. No. 4,209,843, Ser. No. 727,330, Sep. 27, 1976, abandoned, Ser. No. 730,756, Oct. 7, 1976, abandoned, Ser. No. 754,660, Dec. 27, 1976, Pat. No. 4,486,850, Ser. No. 752, 240, Dec. 20, 1976, abandoned, Ser. No. 801,879, May 13, 1977, Pat. No. 4,144,582, Ser. No. 812,285, Jul. 1, 1977, Pat. No. 4,371,953, Ser. No. 844,765, Oct. 25, 1977, Pat. No. 4,523,290, Ser. No. 849,812, Nov. 9, 1977, Ser. No. 860,278, Dec. 13, 1977, Pat. No. 4,471,385, and Ser. No. 889,301, Mar. 23, 1978, Pat. No. 4,322,819.

[51] Int. Cl.[6] .................................................... G06F 12/00

[52] U.S. Cl. ............................................................ 395/401

[58] Field of Search ...................... 364/DIG. 1 MS File, 364/DIG. 2 MS File; 395/400, 425, 550, 600, 800, 401; 365/189.01, 191, 194, 205, 222, 189.05

[56] References Cited

U.S. PATENT DOCUMENTS

| | | | |
|---|---|---|---|
| 3,462,742 | 8/1969 | Miller et al. | 364/200 |
| 3,631,408 | 12/1971 | Kubo | 365/222 |

(List continued on next page.)

FOREIGN PATENT DOCUMENTS

| | | |
|---|---|---|
| 0020908A1 | 1/1981 | European Pat. Off. . |
| 0025801A1 | 4/1981 | European Pat. Off. . |
| 0087868A2 | 9/1983 | European Pat. Off. . |
| 0226950A2 | 7/1987 | European Pat. Off. . |

OTHER PUBLICATIONS

Hyatt, Justifyable DNC, NC:1971 (Mar. 1971).

(List continued on next page.)

*Primary Examiner*—Robert B. Harrell
*Attorney, Agent, or Firm*—Gilbert P. Hyatt

[57] ABSTRACT

Memory technologies for storing filter samples include RAMs and CCDs. Adaptive memory capability and memory servo capability improve memory characteristics. In a RAM embodiment, a detector is used to detect a memory address condition and to control the memory and the memory address register in response thereto. In a CCD embodiment, a detector is used to detect a memory reference signal and to refresh the memory signals in response thereto. Improved memory refresh, memory performance, and memory capacity enhance system characteristics. Improved memory architecture provides advantages of increased speed, lower cost, and efficiency of implementation. Information stored in memory can be scanned out at a rate greater than the addressing rate associated with the memories. This permits higher speed operation with lower cost memories. Use of an output buffer, such as a FIFO, permits normalization of memory clock rates.

76 Claims, 51 Drawing Sheets

U.S. PATENT DOCUMENTS

| | | | |
|---|---|---|---|
| 3,648,255 | 3/1972 | Beausoleil | 364/200 |
| 3,665,422 | 5/1972 | McCoy et al. . | |
| 3,685,027 | 8/1972 | Allen | 365/188 |
| 3,702,988 | 11/1972 | Haney et al. | 364/200 X |
| 3,810,110 | 5/1974 | Kotoh et al. | 395/425 |
| 3,821,715 | 6/1974 | Hoff, Jr. et al. | 395/800 |
| 3,896,419 | 7/1975 | Lange et al. | 364/200 |
| 3,972,024 | 7/1976 | Schroeder et al. | 364/200 |
| 4,016,545 | 4/1977 | Lipovski | 364/900 |
| 4,037,212 | 7/1977 | Nomiya et al. | 364/200 |
| 4,050,096 | 9/1977 | Bennett et al. | 395/425 |
| 4,056,711 | 11/1977 | Lamar | 364/200 |
| 4,056,845 | 11/1977 | Churchill, Jr. | 364/200 |
| 4,087,855 | 5/1978 | Bennett et al. | 364/200 |
| 4,093,982 | 6/1978 | Heuer et al. | 364/200 |
| 4,099,236 | 7/1978 | Goodman et al. | 364/200 |
| 4,112,490 | 9/1978 | Pohlman et al. | 364/200 |
| 4,117,469 | 9/1978 | Levine | 364/200 |
| 4,142,233 | 2/1979 | Suzuki | 364/200 |
| 4,144,562 | 3/1979 | Cooper | 364/200 |
| 4,144,563 | 3/1979 | Heuer et al. | 364/200 |
| 4,149,264 | 4/1979 | Hamada et al. | 364/900 |
| 4,152,761 | 5/1979 | Louie | 364/200 |
| 4,153,933 | 5/1979 | Blume, Jr. et al. | 364/200 |
| 4,159,520 | 6/1979 | Prioste | 364/200 |
| 4,161,784 | 7/1979 | Cushing et al. | 364/748 |
| 4,164,787 | 8/1979 | Aranguren | 364/200 |
| 4,479,180 | 10/1984 | Miller et al. . | |
| 4,546,451 | 10/1985 | Alan . | |
| 4,611,300 | 9/1986 | Taylor, Jr. et al. | 364/900 X |
| 4,646,262 | 2/1987 | Smith | 364/900 |
| 4,683,555 | 7/1987 | Pinkham . | |
| 4,817,026 | 3/1989 | Inoue et al. | 364/724.01 |
| 4,825,364 | 4/1989 | Hyatt | 364/200 |
| 4,896,260 | 1/1990 | Hyatt | 364/200 |
| 4,954,951 | 9/1990 | Hyatt . | |
| 5,459,846 | 10/1995 | Hyatt . | |

OTHER PUBLICATIONS

Atley "Can you build a system with off the shelf LSI?", Electronic Design, No. 5, (Mar. 1, 1970) pp. 46–51.

Atley "LSI Poses Dilemma for System Designers", Electronic Design; No. 3, (Feb. 1, 1970) pp. 45–52.

Boysel et al. "Four Phase Logic Offers New Approach to Computer Designer", Computer Design (Apr. 1970) pp. 141–146.

"4004 4–bit Central Processor Unit", Intel Chip Description (Oct. 1, 1970) pp. 1 and 2.

"CPU on a Chip Goes Public", EDN May 1, 1971 p. 17.

Hyatt "Universal Control Logic for Photoelectric Punched Tape Readers", Computer Design (Oct. 1968 and Nov. 1968) pp. 56–59 and 68–75.

Hughes et al. "International Conference on Microelectronics" Congress Theatre, Eastbourne (Jun. 1969) pp. 33 and 34.

Beelitz et al; System Architecture For Large–Scale Integration; AFIPS Conf. Proc.; Nov. 1967.

Bursky; Cache Controller Ties Into Any Microprocessor System; Aug. 11, 1988, Electronic Design.

Bursky; Memory ICs; Feb. 18, 1988, Electronic Design.

Bursky; Multifeatured Static RAM Trims Microcoded System's Part Count; Mar. 3, 1988, Electronic Design.

Bursky; Triple–port DRAM Fuels Graphic Displays; Apr. 30, 1987, Electronic Design.

Capece; Memories; Oct. 26, 1978, Electronics.

Conner; 1M–Bit Video RAMs Offer Speed for High–Resolution Graphics Displays; Mar. 31, 1988, EDN.

Cormier; Specialty DRAMs Accelerate Video System Performance; Apr. 1988, Electronic System Design Magazine.

Cormier; SRAMs Link Hardware and Software; Sep. 1987, Electronic System Design Magazine.

Johnson; Busting Image Barriers with a Mac II; Jul. 1988, Electronic System Design Magazine.

Kumar; Consider Static–RAM Cache Memory for 32–Bit uC Design; Jun. 11, 1987, EDN.

Altman; Special Report: Semiconductor RAMs land computer mainframe jobs; Aug. 28, 1972, Electronics.

LaRocca et al; One Chip MMU–cache Gives Boost to CPU Hit Rate; Nov. 15, 1987, Electronic Design.

Leonard; Cache Tag RAMs Hasten Main Memory Response; Mar. 3, 1988, Electronic Design.

Leonard; 1–Mbit Video RAMs Offload Host CPU; Sep. 17, 1987, Electronic Design.

LeVine; In–Line Code is Faster for Refreshing RAMs by Software; Dec. 20, 1979, Electronic Design.

Leibson; Dynamic–RAM–Controller ICs Squeeze Maximum Performance From DRAMs.

Levy et al; System Utilization of Large Scale Integration; IEEE Transactions of Electronic Computers, Oct. 1967.

McKeon; An Algorithm for Disk Caching with Limited Memory; Sep. 1985, Byte.

McManus; Take Care When Choosing Controllers for Flat–Panel Displays; Apr. 28, 1988, EDN.

Matlin; Image Compression for Document Storage; Jul. 1988, Electronic System Design Magazine.

Mokhoff; Chip pair eases dynamic RAM refresh; Sep. 14, 1978; Electronics.

Morton; Smart Memories Beat Bottleneck Blues; Jul. 1988, Electronic System Design Magazine.

Olson; Variable–width FIFO Buffer Sequences Large Data Words; Jun. 11, 1987, Electronic Design.

Pieper et al; 200–MHz Video FIFO Buffer Juggles Multiple Windows; Feb. 5, 1987, Electronic Design.

Saussy et al; A Cache Memory Chip For High Performance Image Warping; 1985, IEEE.

Shear; Cache–memory Systems Benefit From On–chip Solutions; Dec. 10, 1987, EDN.

Siddique et al; Fast Controller Converts Large Static RAMs to FIFO Buffers; Feb. 19, 1987, Electronic Design.

Toyoda; Get the Most Out of Top Performing RAMs by Designing Memory Systems Properly; Nov. 8, 1979, Electronic Design.

Waugh; Programmable Array Serves as a Controller for Dynamic RAMs; Feb. 18, 1988, EDN.

Wilson; Nonvolatile, Ferroelectric RAMs Defy Speed Barriers; May 1988, Electronic System Design Magazine.

Wright; CMOS Dynamic–RAM–Controller ICs Support 256K–, and 4M–Bit Devices; Jan. 22, 1987, EDN.

Intel Memory Design Handbook; Intel Corp.; 1977.

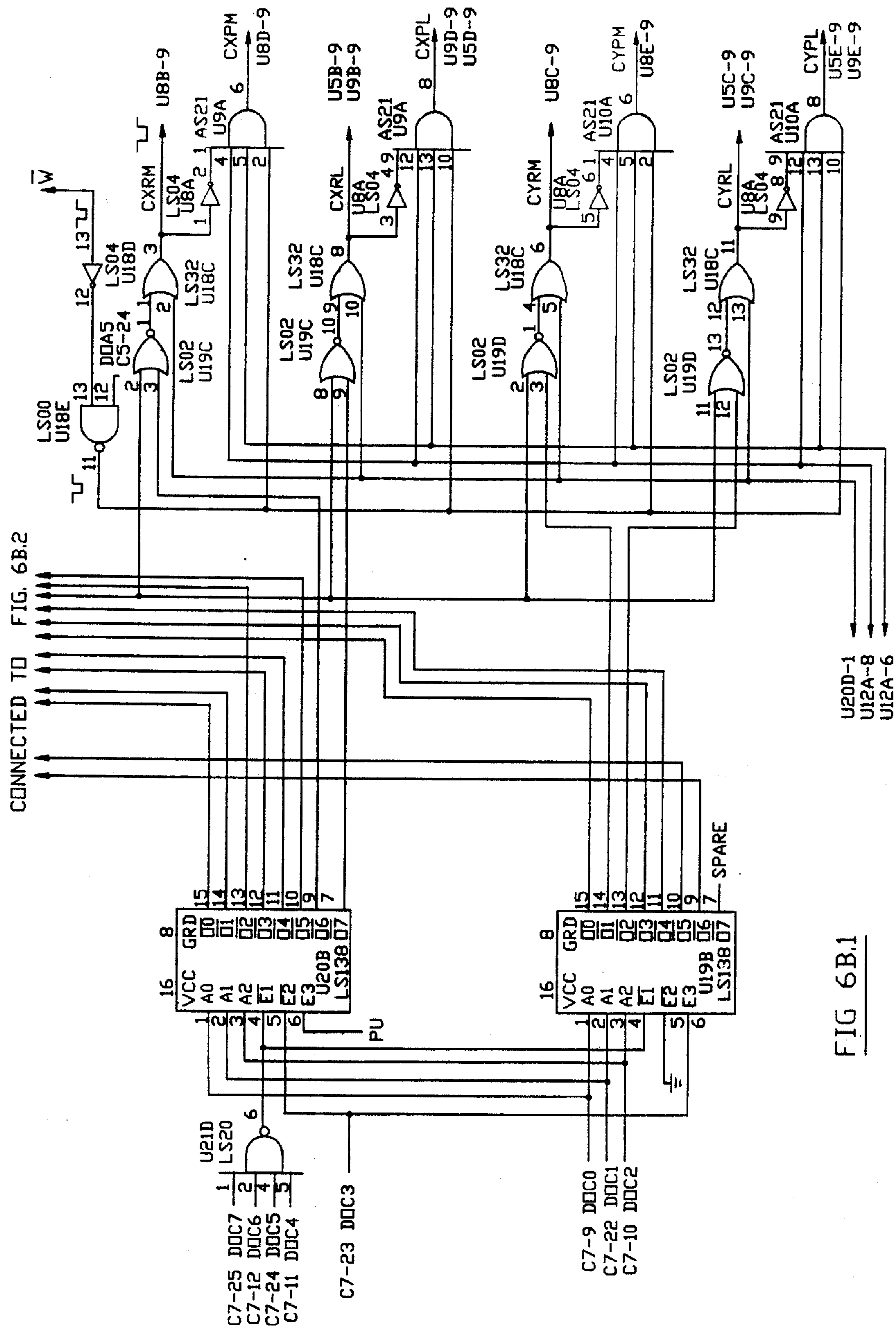
FIG 6B.1

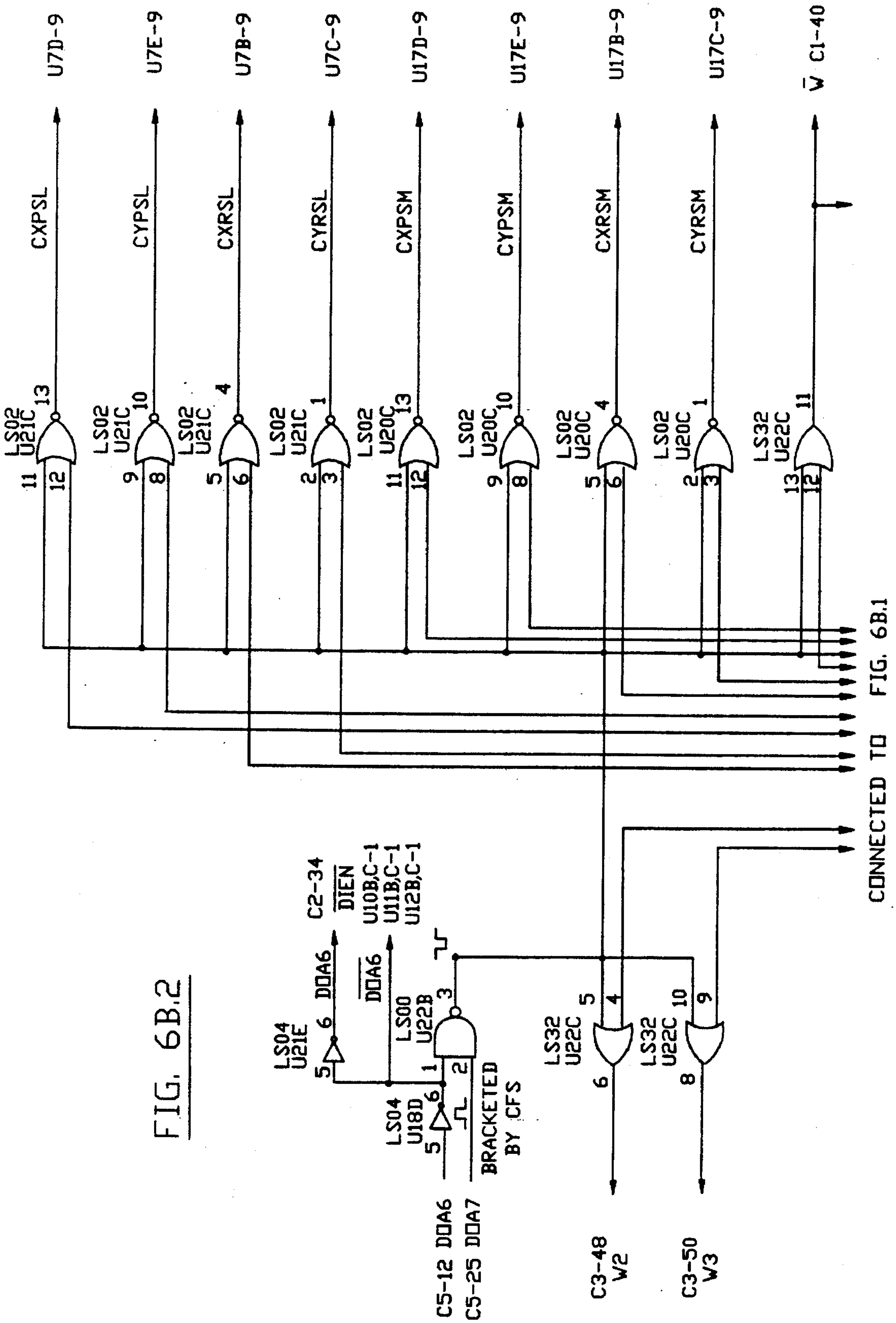
FIG. 6B.2

MEMORY SYSTEM HAVING A PLURALITY OF MEMORIES, A PLURALITY OF DETECTOR CIRCUITS, AND A DELAY CIRCUIT

CROSS REFERENCE TO RELATED APPLICATIONS

The present application is a continuation of application A COMPUTER SYSTEM HAVING AN IMPROVED MEMORY ARCHITECTURE Ser. No. 07/279,592 filed on Dec. 2, 1988 and now U.S. Pat. No. 5,459,846 issued on Oct. 17, 1995; the present application is a continuation in part of application IMAGE PROCESSING SYSTEM HAVING A SAMPLED FILTER Ser. No. 06/849,243 filed on Apr. 7, 1986 and now U.S. Pat. No. 5,410,621 issued on Apr. 25, 1995 and which is a continuation in part of application INTELLIGENT DISPLAY SYSTEM Ser. No. 05/849,733 filed on Nov. 9, 1977 now abandoned and application FOURIER TRANSFORM PROCESSOR Ser. No. 06/425,731 filed on Sep. 28, 1982 and now U.S. Pat. No. 4,581,715 issued on Apr. 8, 1986; and the present application is further a continuation in part of application AN INTEGRATED CIRCUIT FILTER PROCESSOR Ser. No. 06/848,017 filed on Apr. 3, 1986; which application Ser. No. 06/425,731 is a continuation in part of each application in the following chain of ancestor patent applications:

(A) MEMORY SYSTEM USING FILTERABLE SIGNALS Ser. No. 06/160,872 filed on Jun. 19, 1980 and now U.S. Pat. No. 4,491,930 issued on Jan. 1, 1985:

(B) COMPUTER SYSTEM ARCHITECTURE Ser. No. 05/860,257 filed Dec. 14, 1977 and now U.S. Pat. No. 4,371,923 issued on Feb. 1, 1983:

(1) FACTORED DATA PROCESSING SYSTEM FOR DEDICATED APPLICATIONS Ser. No. 05/101,881 filed on Dec. 28, 1970; proceedings therein having been terminated:

(2) CONTROL SYSTEM AND METHOD Ser. No. 05/134,958 filed on Apr. 19, 1971; still pending in the PTO:

(3) CONTROL APPARATUS Ser. No. 05/135,040 filed on Apr. 19, 1971; still pending in the PTO:

(4) APPARATUS AND METHOD FOR PRODUCING HIGH REGISTRATION PHOTO-MASKS Ser. No. 05/229,213 filed on Apr. 13, 1972 and now U.S. Pat. No. 3,820,894 issued on Jun. 28, 1974:

(5) MACHINE CONTROL SYSTEM OPERATING FROM REMOTE COMMANDS Ser. No. 05/230,872 filed on Mar. 1, 1972 and now U.S. Pat. No. 4,531,182 issued on Jul. 23, 1985:

(6) COORDINATE ROTATION FOR MACHINE CONTROL SYSTEM Ser. No. 05/232,459 filed on Mar. 7, 1972 and now U.S. Pat. No. 4,370,720 issued on Jan. 25, 1983:

(7) DIGITAL FEEDBACK CONTROL SYSTEM Ser. No. 05/246,867 filed on Apr. 24, 1972 and now U.S. Pat. No. 4,310,878 issued on Jan. 12, 1982:

(8) COMPUTERIZED SYSTEM FOR OPERATOR INTERACTION Ser. No. 05/288,247 filed on Sep. 11, 1972 and now U.S. Pat. No. 4,121,284 issued on Oct. 17, 1978:

(9) A SYSTEM FOR INTERFACING A COMPUTER TO A MACHINE Ser. No. 05/291,394 filed on Sep. 22, 1972 and now U.S. Pat. No. 4,396,976 issued on Aug. 2, 1983:

(10) DIGITAL ARRANGEMENT FOR PROCESSING SQUAREWAVE SIGNALS Ser. No. 05/302,771 filed on Nov. 1, 1972; still pending in the PTO:

(11) APPARATUS AND METHOD FOR PROVIDING INTERACTIVE AUDIO COMMUNICATION Ser. No. 05/325,933 filed on Jan. 22, 1973 and now U.S. Pat. No. 4,016,540 issued on Apr. 5, 1977:

(12) ELECTRONIC CALCULATOR SYSTEM HAVING AUDIO MESSAGES FOR OPERATOR INTERACTION Ser. No. 05/325,941 filed on Jan. 22, 1973 and now U.S. Pat. No. 4,060,848 issued on Nov. 29, 1977:

(13) ILLUMINATION CONTROL SYSTEM Ser. No. 05/366,714 filed on Jun. 4, 1973 and now U.S. Pat. No. 3,986,022 issued on Oct. 12, 1976:

(14) DIGITAL SIGNAL PROCESSOR FOR SERVO VELOCITY CONTROL Ser. No. 05/339,817 filed on Mar. 9, 1973 and now U.S. Pat. No. 4,034,276 issued on Jul. 5, 1977:

(15) MONOLITHIC DATA PROCESSOR WITH MEMORY REFRESH Ser. No. 05/402,520 filed on Oct. 1, 1973; now U.S. Pat. No. 4,825,364 issued on Apr. 25, 1989:

(16) HOLOGRAPHIC SYSTEM FOR OBJECT LOCATION AND IDENTIFICATION Ser. No. 05/490,816 filed on Jul. 22, 1974 and now U.S. Pat. No. 4,029,853 issued on Jun. 24, 1980:

(17) COMPUTERIZED MACHINE CONTROL SYSTEM Ser. No. 05/476,743 filed on Jun. 5, 1974 and now U.S. Pat. No. 4,364,110 issued on Dec. 14, 1982:

(18) SIGNAL PROCESSING AND MEMORY ARRANGEMENT Ser. No. 05/522,559 filed on Nov. 11, 1974 and now U.S. Pat. No. 4,209,852 issued on Jun. 24, 1980:

(19) METHOD AND APPARATUS FOR SIGNAL ENHANCEMENT WITH IMPROVED DIGITAL FILTERING Ser. No. 05/550,231 filed on Feb. 14, 1975 and now U.S. Pat. No. 4,209,843 issued on Jun. 24, 1980:

(20) ILLUMINATION SIGNAL PROCESSING SYSTEM Ser. No. 05/727,330 filed on Sep. 27, 1976; now abandoned:

(21) PROJECTION TELEVISION SYSTEM USING LIQUID CRYSTAL DEVICES Ser. No. 05/730,756 filed on Oct. 7, 1976; now abandoned:

(22) INCREMENTAL DIGITAL FILTER Ser. No. 05/754,660 filed on Dec. 27, 1976 and now U.S. Pat. No. 4,486,850 issued on Dec. 4, 1984:

(23) MEANS AND METHOD FOR COMPUTERIZED SOUND SYNTHESIS Ser. No. 05/752,240 filed on Dec. 20, 1976; now abandoned:

(24) VOICE SIGNAL PROCESSING SYSTEM Ser. No. 05/801,879 filed on May 13, 1977 and now U.S. Pat. No. 4,144,582 issued on Mar. 13, 1979:

(25) ANALOG READ ONLY MEMORY Ser. No. 05/812,285 filed on Jul. 1, 1977 and now U.S. Pat. No. 4,371,953 issued on Feb. 1, 1983:

(26) DATA PROCESSOR ARCHITECTURE Ser. No. 05/844,765 filed on Oct. 25, 1977; now U.S. Pat. No. 4,523,290 issued on Jun. 11, 1985:

(27) DIGITAL SOUND SYSTEM FOR CONSUMER PRODUCTS Ser. No. 05/849,812 filed on Nov. 9, 1977; now pending in the PTO:

(28) ELECTRO-OPTICAL ILLUMINATION CONTROL SYSTEM Ser. No. 05/860,278 filed on Dec. 13, 1977 and now U.S. Pat. No. 4,471,385 issued on Sep. 11, 1984:

(29) MEMORY SYSTEM HAVING SERVO COMPENSATION Ser. No. 05/889,301 filed on Mar. 23, 1978 and now U.S. Pat. No. 4,322,819 issued on Mar. 30, 1982:

where this application is further a continuation in part of copending parent applications IMPROVED MEMORY ARCHITECTURE HAVING MULTI-DIMENSIONAL ADDRESSING Ser. No. 06/661,649 filed on Oct. 17, 1984 and now abandoned in favor of continuing applications; MICROCOMPUTER CONTROL OF MACHINES Ser. No. 05/860,256 filed on Dec. 14, 1977 and now U.S. Pat. No. 4,829,419 issued on May 9, 1989; and MONOLITHIC DATA PROCESSOR WITH MEMORY REFRESH Ser. No. 05/402,520 filed on Oct. 1, 1973 now U.S. Pat. No. 4,825, 364 issued on Apr. 25, 1989:

where all of the above referenced patent applications are by Gilbert P. Hyatt;

where the benefit of the filing dates of all of the above referenced applications are herein claimed in accordance with the United States Code such as with 35 USC 120 and 35 USC 121;

where all of the above listed patents and patent applications are incorporated herein by reference as if fully set forth at length herein; and where one skilled in the art will be able to combine the disclosures in said applications and patents that are incorporated by reference with the disclosure in the instant application from the disclosures therein and the disclosures herein.

BACKGROUND OF THE INVENTION

1. Field of the Invention

The field of the present invention is memory systems.

2. Prior Art

The prior art in memory systems includes integrated circuit, core, bubble, CCD, RAM and other types of memory systems. The most pertinent prior art is integrated circuit RAM systems. The prior art provides RAMs having tristate control for memory data lines to permit bussing of memory data lines and to facilitate bi-directional communication to the RAM for reading and writing of information from the bus. The most pertinent prior art in memory systems is discussed in the parent applications related to memories and is represented by the art cited herein.

The prior art is further represented by the art of record in the instant application and in the related applications.

SUMMARY OF THE INVENTION

The present invention is generally directed to improved filter, display, and memory architecture. The filter architecture provides a simpler filter processor, such as with filtering on the fly and with single bit filter processing. The display architecture provides an improved filter display for displaying filtered images and for displaying graphics images. The memory architecture provides an improved memory for filter and display processing and for memory applications in general for greater performance and economy of implementation.

In one memory configuration, a speed improvement is obtained by a combination of addressing the memory at a relatively low rate and scanning information out of the memory at a relatively high rate. This may be characterized as a multi-dimensional memory architecture, where the addressing logic forms a first dimension and the scanout logic forms a second dimension. This speed improvement can be implemented by using the memory tristate control logic for data scanout operations in conjunction with addressing logic to provide both, re-addressing and scanout of memory data.

In accordance with a feature of the present invention, a sampled filtering display system is provided.

In accordance with another feature of the present invention, a filtering system having a display for an operator to determine when adequate filtering has been performed is provided.

In accordance with another feature of the present invention, a filter display system having iterative filter processing for iteratively enhancing an image is provided.

In accordance with another feature of the present invention, an improved sampled filter display system is provided.

In accordance with another feature of the present invention, an improved sampled filter device is provided in the form of a correlator.

A further feature of the present invention provides an improved display system.

A still further feature of the present invention provides an improved filter processor for a display system.

In accordance with still another feature of the present invention, a compositing-after-correlation display arrangement is provided.

Yet another feature of the present invention provides a multi-channel filter display arrangement.

A still further feature of the present invention provides for generation and processing of overlapping signature signals.

Yet another feature of the present invention provides a filter memory arrangement.

Yet another feature of the present invention provides an improved performance memory arrangement.

Yet another feature of the present invention provides a closed loop memory arrangement.

Yet another feature of the present invention provides an adaptive memory arrangement.

Yet another feature of the present invention provides a memory detector arrangement.

Yet another feature of the present invention provides a memory delay arrangement.

Yet another feature of the present invention provides an improved DRAM arrangement.

Yet another feature of the present invention provides an improved memory refresh arrangement.

Yet another feature of the present invention provides an improved memory addressing arrangement.

Yet another feature of the present invention provides an improved memory architecture.

Yet another feature of the present invention provides an improved memory controller arrangement.

The foregoing and other objects, features, and advantages of the present invention will become apparent from the following detailed description of preferred embodiments of this invention as illustrated in the accompanied drawings.

BRIEF DESCRIPTION OF THE DRAWINGS

A better understanding of the present invention may be obtained from a consideration of the detailed description hereinafter taken in conjunction with the drawings, which are briefly descried below.

FIG. 4A is a diagram of an address generator concatenating an X-address component and a Y-address component; FIGS. 4B and 4C are block diagram representations of memory addressing arrangements; FIG. 4D is a block diagram and schematic representation of a memory overflow detector and comparator detector arrangement; FIG. 4E is a block diagram and schematic representation of a memory comparator detector arrangement; FIG. 4F is a block diagram of a two dimensional memory addressing arrangement; FIG. 4G is a block diagram of a single dimensional memory addressing arrangement; FIGS. 4H, 4I, 4J, 4K, and 4L are schematic diagrams of memory addressing arrangements; FIGS. 4M, 4N, and 4O are schematic diagrams of memory detector arrangements; FIG. 4P is a schematic diagram of a memory refresh arrangement; and FIGS. 4Q, 4R, 4S, and 4T are schematic diagrams of multiple memory detector arrangements.

FIG. 5A is a block diagram representation of a spatial filter arrangement; FIG. 5B is a block diagram representation of a sum-of-the-products arrangement that can be used with the arrangement of FIG. 5A; and FIG. 5C is a block diagram of a 3-channel sum-of-the-products arrangement.

FIGS. 6A, 6B.1, 6B.2, 6C, 6D, 6E, 6F, 6G, 6H, 6I, 6J, 6K, 6L, 6M, 6N, 6O, 6P, 6Q, 6R, 6S, 6T, 6U, 6V, 6W, and 6X (herein referred to as FIG. 6O comprise detailed designs: where FIG. 6A is a block diagram representation of a system configuration for implementation of the present invention; FIG. 6B is a detailed schematic diagram of clock steering logic; FIGS. 6O and 6P are detailed schematic diagram representations of one configuration of an address generator that can be used in the system of the present invention.

FIGS. 7A, 7B, 7C, and 7D are waveform diagrams of memory signals; FIGS. 7E, 7F, and 7G are schematic diagrams of one memory controller configuration; and FIGS. 7H and 7I are waveform diagrams of memory RAS and CAS signals.

Figure 1:
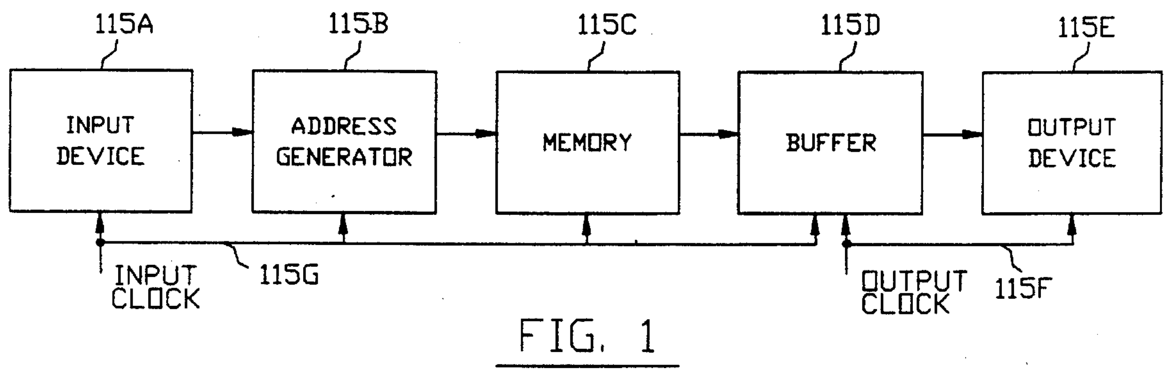
FIG. 1 is a block diagram representation of an arrangement for implementing the system of the present invention.

To facilitate disclosure of the illustrated embodiments, the components shown in FIGS. 1 to 7 of the drawings have been assigned reference numerals and a description of such components is given in the following detailed description. The components in the figures have in general been assigned reference numerals, where the hundreds digit of each reference numeral corresponds to the figure number. For example, the components in FIG. 1 have reference numerals between 100 and 199 and the components in FIG. 2 have reference numerals between 200 and 299, except that a component appearing in successive drawing figures has maintained the first reference numeral.

DETAILED DESCRIPTION OF THE INVENTION

Graphics Processor

A graphics processor architecture can be implemented with a address generator and control logic generating graphics vectors for storing into image memory. Image memory can then be scanned out, such as in a raster scan form to refresh a display. In one configuration, graphics vectors can be written into image memory on an offline basis and can be used to refresh the display on an online basis. Alternately, graphics vectors can be written into image memory on an online basis time shared with refreshing of the display on an online basis.

One arrangement of the graphics system of the present invention is shown in FIG. 1. Supervisory processor 115A loads graphics commands into address generators 115B. Address generators 115B generate addresses of graphics vectors for loading into image memory 115C and for raster scanning image memory 115C. The raster scan addresses scan-out the image in image memory 115C through the CRT interface 115D to refresh CRT 115E.

An experimental system has been constructed to demonstrate operation of the graphics display capability. The arrangement shown in FIG. 1 has been implemented in hardware for refreshing the display in real time. A program, such as the BASIC PROGRAM LISTING GRAPH.ASC, can be used to control that experimental hardware for refreshing the display. In this experimental system, the graphics vectors are loaded in an offline manner with the LD.ASC Basic program set forth in the BASIC PROGRAM LISTING LD.ASC herein; emulating hardware loading of graphics vectors in an online manner. In this experimental system, graphics operation is initiated each frame with supervisory processor 115A and hardware refresh is performed with address generators 115B and image memory 115C.

In a hardware configuration, graphics vector generation can be performed in real time using the software emulated vector generation capability implemented in hardware form. In one hardware configuration, graphic vectors can be generated cotemporaneously with refresh, such as with one set of address generators (i.e., the XR-address generator and the YR-address generator shown in FIGS. 6Q and 6R) generating graphics vectors into image memory while a second set of address generators (i.e., the XP-address generator and the YP-address generator shown in FIGS. 6O and 6P) are generating the raster scan addresses for scanning-out image memory for display. In this configuration, image memory can be implemented as a dual-ported image memory for simultaneously loading vectors into image memory and scanning-out image memory. In an alternate hardware configuration, graphic vectors can be generated and loaded into image memory during the vertical sync pulse period when the raster scan is blanked; time sharing the logic and memory between raster scanout and graphics generation. In this configuration, during the vertical sync period, the address generators can generate graphic vector addresses for loading the graphic vectors into image memory and, after the vertical sync period, the address generators can generate the raster scan addresses for scanning-out image memory for display.

The address generators can be used to generate graphic vectors and windows. For example, the LD.ASC program set forth in the BASIC PROGRAM LISTING LD.ASC herein has been used to load graphic vectors into image memory. This is achieved by using the address generators to generate the addresses of a vector and by strobing the color intensity of the vector into image memory.

Periods of time exist when the address generators are in a stand-by condition. For example, in a configuration where the address generators are scanning-out image memory to refresh a display; the address generators may not be used during the vertical blanking period and therefore may be available for graphic generation. Also, in a configuration where the address generators are not used during the horizontal blanking period, the address generators and therefore may be available for graphic generation during the horizontal blanking period. For example, a vertical blanking period of 1-millisecond will permit the address generators to draw about 5,000-graphic vector pixels operating at a 5-MHz pixel rate. Consequently, a meaningful number of graphic vector pixels can be generated during standby periods, permitting time sharing of the address generators for both, scanning-out an image to refresh a display and graphic vector generation.

A vector memory can be implemented to store parameters associated with the vectors to be generated. Vector memory can be loaded from various sources, such as from the supervisory processor that initializes the address generators, from a host processor, or from other sources. The vector memory can contain the start point coordinates and the vector deltas for the address generators and a quantity parameter or distance-to-go (DTG) parameter related to the quantity of vector steps to be generated for the particular vector. During image processing standby periods, graphic vector parameters can be loaded from the vector memory for generating the vectors with the address generators, similar to that performed with the LD.ASC program. After various standby periods, such as the horizontal and vertical synchronization periods; the address generators can be reinitialized; thereby overcoming the need to buffer scanout parameters. However, if the address generators will not be reinitialized following vector generation, it may be necessary to buffer the scanout address parameters in a buffer memory for reloading the pixel address generators after vector generation.

In the LD.ASC program, the number of steps for a vector are counted under program control in the supervisory processor. In a hardwired implementation, the number of steps for a vector can be counted with a hardware counter circuit. For example, the quantity or DTG parameter from the vector memory can be loaded into a 74LS169 counter as a parallel load parameter and the counter can be decremented in the count-down mode for each pixel step during vector generation. Generation of the vector can be terminated by detecting the underflow signal from the counter at the zero count.

Loading of the address generators from the vector memory can be performed in a manner similar to loading the address generators from the supervisory processor, as shown in the LD.ASC program listing herein and as discussed relative to the supervisory processor interface herein. Setting of the vector color intensity from the vector memory can be performed in a manner similar to setting of the vector color intensity from the supervisory processor in the LD.ASC program. Selecting of the write-mode for the image memory can be performed in a manner similar to setting of the write-mode with the load command signal DOA6 by the supervisory processor in the LD.ASC program.

Window generation can be implemented with parameters for a plurality of images stored in a window buffer memory and selected as the address generators scan across window boundaries during scanout and refresh of the CRT monitor. When the address generators cross window boundaries, the previous display parameters can be buffered in the buffer memory and the display parameters associated with the new image can be loaded from the window buffer memory into the address generators. Loading of display parameters associated with the new image from the window buffer memory can be accomplished as discussed above for loading of vector parameters during graphic vector generation. Storing of display parameters associated with the prior image into the window buffer memory can be accomplished by reversing the vector generation loading operation to obtain a window generation store operation.

Spatial Filtering

Display systems can be implemented with spatial filters for anti-aliasing, pattern recognition, enhancement, and other purposes. A spatial filter arrangement will now be discussed with reference to FIGS. 5A to 5C.

Figure 5A:
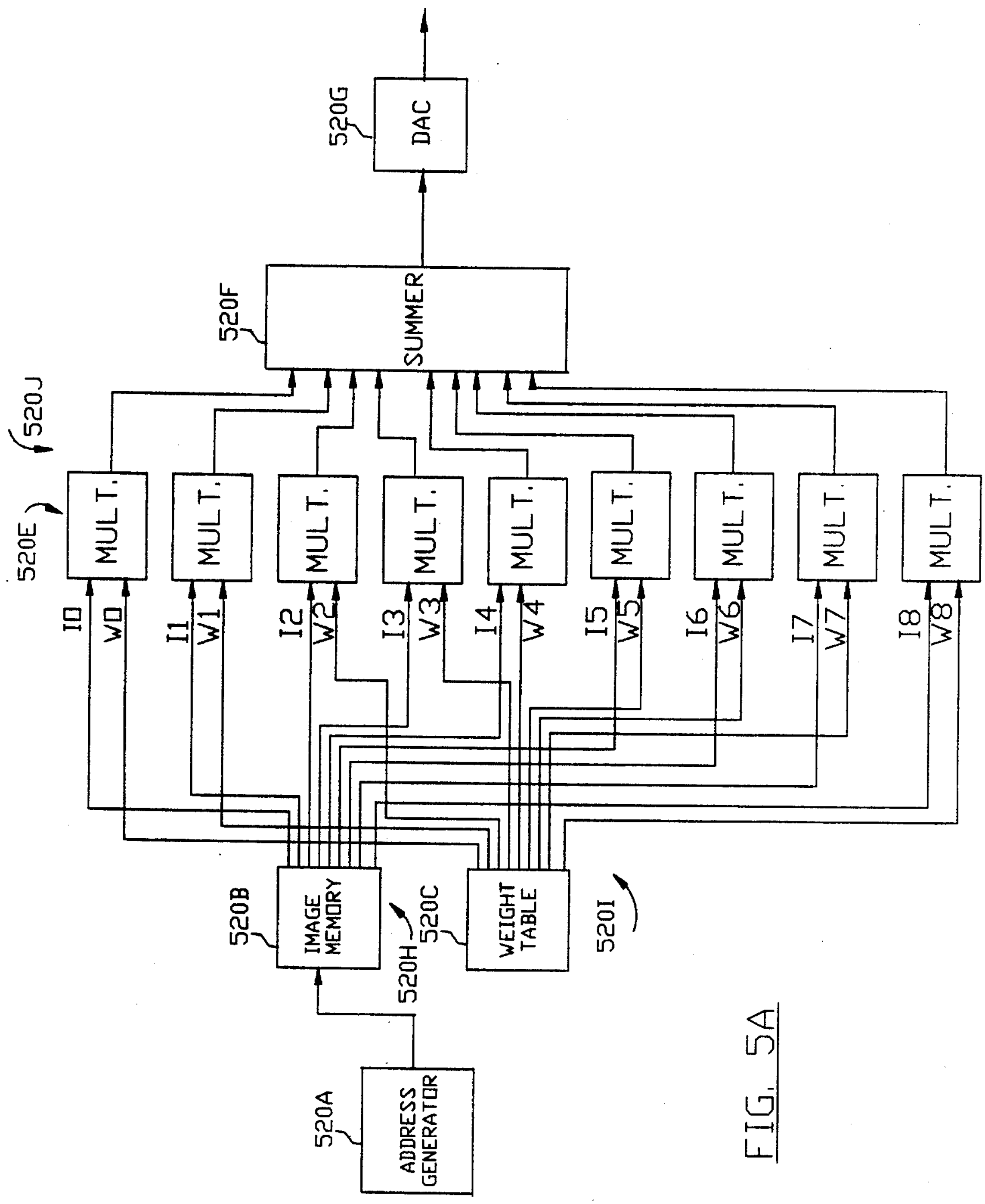
FIGS. 5A, 5B, and 5C (herein referred to as FIG. 5) comprise spatial filtering arrangements: where
Figure 5B:
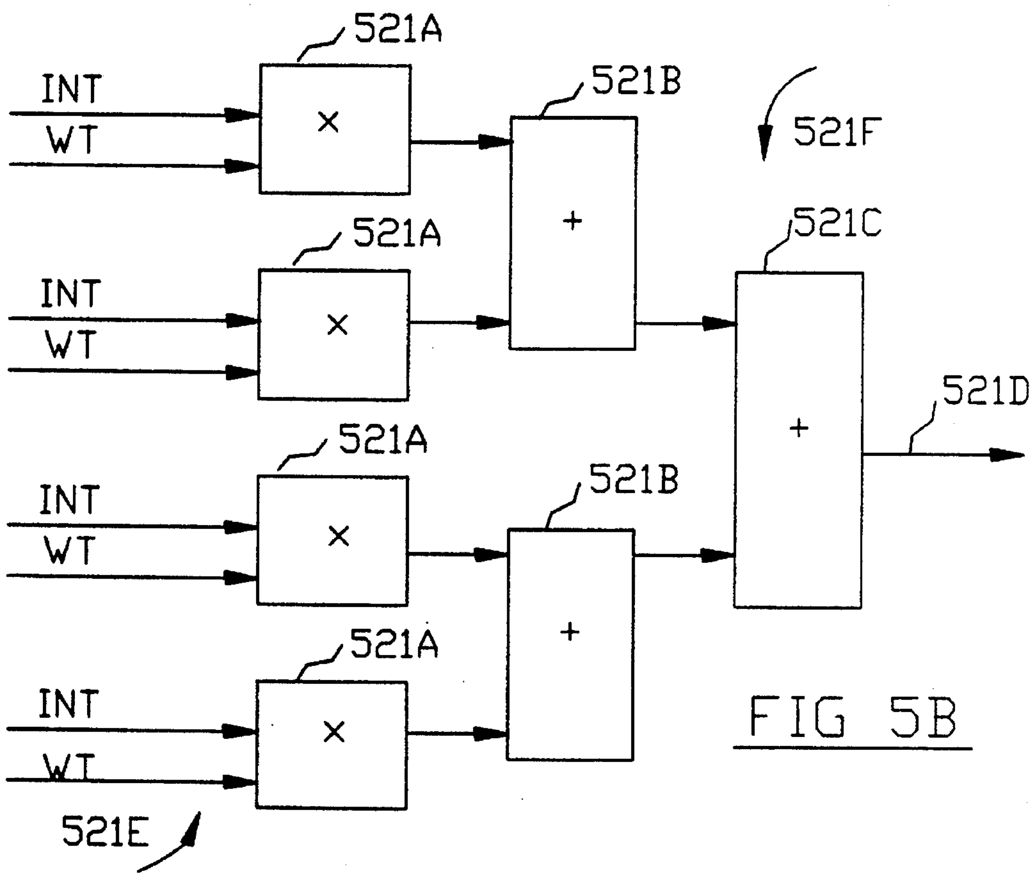

FIG. 5A shows an arrangement of a display system. Address generator 520A generates pixel addresses to access a plurality of pixels, such as a 9-pixel kernel 520H, from image memory 520B. Pixel information can be latched in registers to provide parallel pixel words or can be accessed sequentially as provided with the BASIC PROGRAM LISTING GRAPH.ASC herein. Weight table 520C supplies a plurality of kernel weights appropriate to spatial filtering of the pixel kernel, such as a kernel of 9-weights 520I, from weight table 520C. Weight information can be latched in registers or in the weight table to provide parallel pixel words or can be accessed sequentially as provided with the BASIC PROGRAM LISTING GRAPH.ASC herein. The pixel intensities I0 to I8 are each applied to a corresponding multiplier 520E and the weights W0 to W8 are each applied to a corresponding multiplier 520E for multiplying the corresponding intensity and weight together to generate product signals 520J. Product signals 520J are summed together with summer 520F to generated a weighted and mixed pixel intensity, which is converted to analog signal form with DAC 520G to excite a CRT display.

Figure 3:
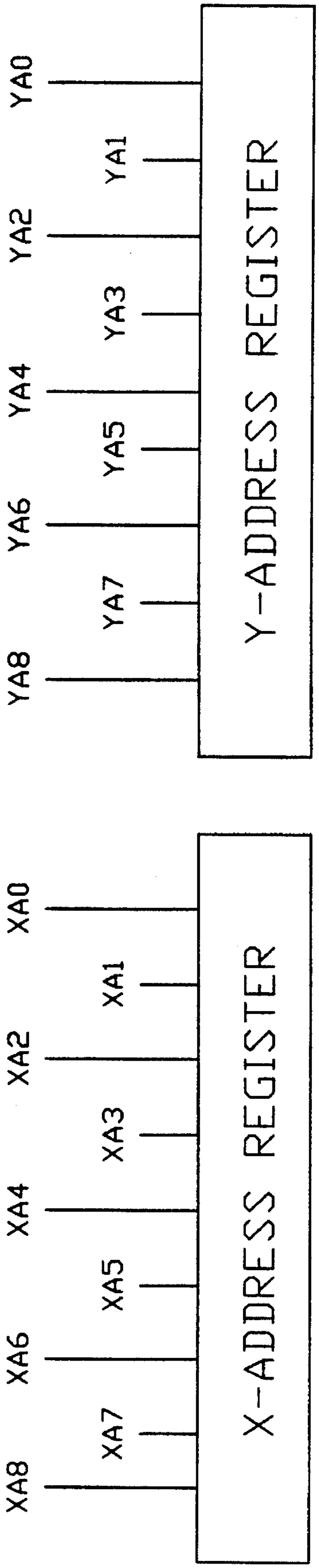
FIG. 3 is a diagram of an address generator partitioned into an X-address component and a Y-address component.
Figure 5C:
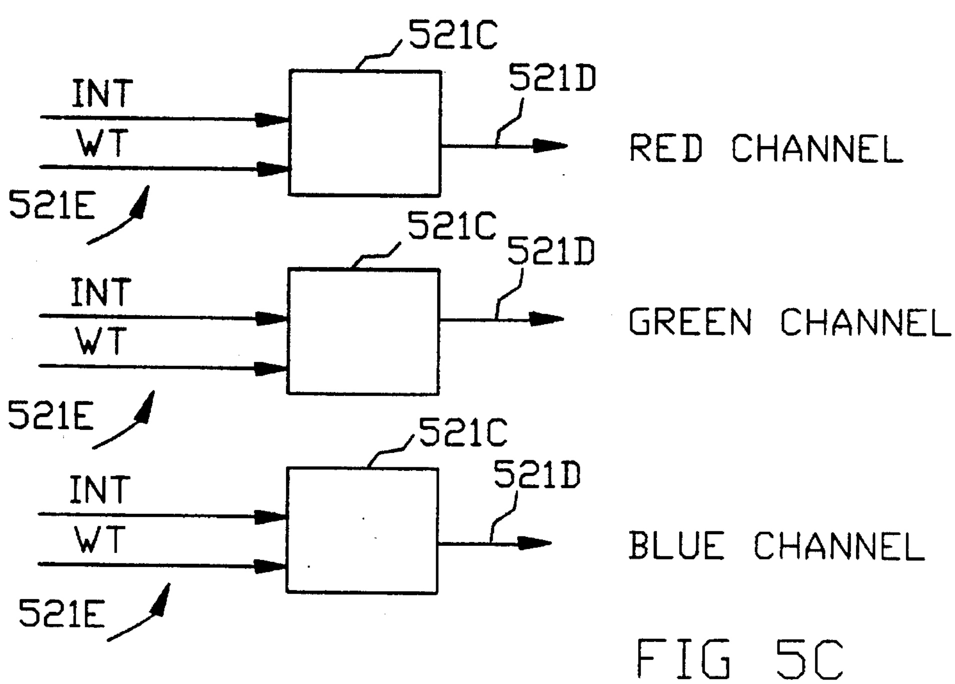

The arrangement discussed with reference to FIG. 5A is representative of a single color channel, such a single channel of a multiple color pixel; i.e., a red, green, or blue channel; and such as a monochromatic single channel. Intensity information INT and weight information WT can be input to multipliers 521A for weighting the pixel intensities, which in turn can be input to adders 521B and 521D for generating weighted and summed signal 521D. Three channels of the arrangement discussed with reference to FIG. 5B can be combined to provide a 3-channel color spatial filter. For example, as shown in FIG. 5C, 3-channels of intensity and weight information 521E are processed with sum-of-the-products logic 521F to generate 3-channels of signals 521G; such as red, green, and blue signals 521D.

The sum-of-the-products processing discussed above can be implemented with commercially available integrated circuit components, such as multiplier chips and adder chips. For example, multiplier chips are manufactured by TRW and adder chips are manufactured by Texas Instruments.

Memory Considerations

General

The memory architecture of the present invention has important advantages in implementing digital systems. It is applicable to special purpose systems; such as display systems, array processors, and pipeline processors; and is applicable to general purpose systems; such as general purpose digital computers. It incorporates various features that may be used individually or in combinations to enhance performance and efficiency. One feature provides for accessing of memory at a relatively slow addressing rate and at a relatively fast scanout rate. Another feature provides a buffer memory to permit accessing of memory at a lower rate and higher duty cycle for information that is utilized at a higher rate and lower duty cycle. Various other features are also discussed herein.

Memory speed is an important consideration for design of digital systems; such as display systems, array processing systems, and pipeline systems. A configuration is discussed herein where system speed can be implemented to be significantly faster than implied by memory speed considerations. This configuration uses a combination of novel architectural features for outputting of relatively high bandwidth information with a relatively low bandwidth memory.

Memory arrangements have previously been disclosed in the related patent applications referenced herein in accordance with the present invention; such as implementing re-addressing and scanout operations to enhance memory capabilities. Various embodiments were disclosed; including filter configurations, display configurations, and general purpose computer configurations. Now, filter configurations; display configurations; and general purpose computer configurations, including microcomputer and microprocessor configurations will be further disclosed. Also, other configurations; such as television, array processor, signal processor, cache memory, artificial intelligence, and DMA configurations; will be disclosed. These disclosures are intended to be illustrative of other configurations; such as other special purpose computer configurations and other general purpose computer configurations. Display, signal processing, and filter processing configurations may be considered to be special purpose computer configurations. Also; filter processors, speech processors, signal processors, and display processors may be considered to be array processors. Also; filter processors and speech processors may be considered to be signal processors. Further; filter processors include correlation processors, Fourier transform processors, recursive filter processors, and others. Correlation processors include convolution processors and Fourier processors include fast Fourier transform (FFT) and discrete Fourier transform (DFT) processors. Nevertheless, the teachings herein are generally applicable to processor systems and memory systems and are not limited to the specific applications disclosed herein. The terms computer and processor may be used interchangeably herein. Some of the features of the present invention may be characterized as adaptive memory control, closed loop memory control, and memory servo control. For example, the memory may be considered to adaptively adjust to address characteristics. Also, the memory system may be considered to be in a closed loop or a servo loop by controlling address generation in response to the generated address. In one configuration; a detector detects a characteristic of the address, such as a change in the address MSBs, and invokes a time delay to delay generation of the next address in response thereto.

The various features of the present invention and alternate implementations and uses thereof are disclosed herein. Although many of the disclosures are applicable to multiple categories, they are often placed in only one section herein in order to reduce replication and for convenience of disclosure. Also, although the various features of the present invention are applicable to many implementations and uses, they are often disclosed with specific examples of implementation and use in order to reduce replication and for convenience of disclosure. Hence, it is herein intended that the various disclosures be used in combinations and permutations independent of the section or context in which they are contained and it is herein intended that the various disclosures have different uses and implementations that are not limited to the specific examples of implementation and uses provided therewith.

Memory performance can be significantly increased in accordance with the features of the present invention, such as increased by nearly four-fold based upon currently available DRAMs. For example, the Toshiba TC514256P-10 fast page mode DRAM has a read cycle period of 190-ns ($t_{RC}$=190-ns) and a fast page mode period of 55-ns ($t_{PC}$=55-ns) for almost a four-fold improvement (190/55=3.45). See the MOS MEMORY PRODUCTS DATA BOOK; 1986–1987; by Toshiba; such as at pages 119, 121, 123, and 125. This near four-fold improvement may be degraded by various considerations; such as the need for RAS cycles to be interspersed with CAS cycles, the need for refresh cycles to be interspersed with CAS cycles, other time delays (i.e., rise times and fall times) in the CAS cycles, optimizing synchronous timing based upon a finite resolution master clock pulse, and other considerations. However, a significant improvement approaching a four-fold improvement can be achieved with this Toshiba DRAM. Further, custom DRAMs that are specially configured for a memory architecture in accordance with the present invention may achieve improvements of greater than the above discussed near four-fold improvement. This near four-fold improvement may be enhanced by various considerations; such as reduced propagation delay for monolithic circuits on-the-chip and optimizing scanout circuitry on-the-chip for increased speed. The memory architectures previously disclosed in the related patent applications and as further disclosed herein provides the architecture to facilitate this memory enhancement.

Memory performance may be further increased in accordance with the memory refresh features of the present invention based upon currently available DRAMs. For example, detecting a time available period where memory refreshing can be performed without contention with processor memory operations and invoking memory refresh operations therein can increase memory performance over other methods, such as over cycle stealing methods.

Many of the features of the present invention are related to control of a memory and control of a processor in response to an address. Many types of processors; such as general purpose processors, special purpose processors, display processors, television display processors, signal processors, array processors, database processors, filter processors, stored program processors, DMA processors, cache memory processors, artificial intelligence processors, etc.; and many types of memories; such as DRAMs, SRAMs, ROMs, CCD memories, magnetic bubble memories, core memories, magnetostrictive delay line memories, and other types of memories; can be implemented in accordance with features of the present invention. Microprocessors, display processors, and other processors disclosed herein are examples of other types of processors that can be utilized. Also; SRAMs, DRAMs, and other memories disclosed herein and in said related patent applications are examples of other types of memories that can be utilized.

The features of the present invention are discussed in the context of RAMs. These RAM-related discussions can also be implemented for read only memories (ROMs); such as well known mask programmable ROMs, EROMs, and EEROMs. For example, ROMs can be constructed having output enable circuits for implementing external scanout, having RAS circuits for row addressing, and CAS circuits for column addressing; which circuits can be used to implement the scanout and re-addressing features of the present invention, such as using detectors and delaying circuits.

An arrangement is disclosed herein for gating a clock (i.e., FIGS. 6C and 6D); such as to slow down memory operations for re-addressing and to speed up memory operations for scanout. Such clock gating arrangements can be used for disabling and delaying computer operations to facilitate use of the disclosed memory architecture. Other arrangements can also be used. For example, conventional computers have circuits for disabling or delaying operations, such as "wait state" circuits and "hold" circuits, which are appropriate for disabling and delaying computer operations to facilitate scanout and re-addressing.

One objective of the present memory architecture is to use lower speed and lower cost memories (i.e., one-megabit DRAMs) in applications that need higher speed memories (i.e., 256K SRAMs and higher speed DRAMs) by controlling the lower speed memories to operate as if they were higher speed and higher cost memories. In a DRAM based configuration; it is often desirable for the processor to be able to intensively access information, for the memory refresh controller to refresh the memories, and for memory refreshing to take a minimum of time away from processing. The combination of a fast scanout arrangement and a memory refresh arrangement having a minimum of contention between memory refreshing and processing permits lower speed DRAMs to perform as if they were higher speed memories. Several arrangements are disclosed herein.

The various features of the present invention can be used in combination with other features of the present invention or can be used independent of other features of the present invention. For example, memory refreshing features of the present invention can be used in combination with memory scanout and re-addressing features of the present invention. Alternately, memory refreshing features of the present invention can be used independent of memory scanout and re-addressing features of the present invention.

Various configurations of systems, memory architectures, memory circuits, detectors, etc. are discussed herein to illustrate different ways of practicing the present invention.

Various system configurations can be provided in accordance with the present invention. FIGS. 4B and 4C show many of the elements of systems implemented in accordance with the present invention. Many of these elements are described together with reference to FIGS. 4B and 4C and may be described separately with reference to other figures. Because there are various ways to implement the features of the present invention and because there are various elements and methods taught in conjunction with the features of the present invention, it is herein intended that these elements be usable in various combinations theretogether and in various combinations with prior art elements and methods. For example, a memory architecture disclosed herein may have particular advantages when used with the CAS scanout and RAS re-addressing features of the present invention and may also have advantages when used with prior full cycle RAS and CAS addressing. Various configurations will now be discussed with reference to FIGS. 4B and 4C.

Processor 216 controls address register 218 with control signals 217 to generate address signals 219 (i.e., FIGS. 6A and 6O to 6R). In a display system, processor 216 may include an arithmetic unit adding a delta parameter to an address parameter or to a position parameter stored in address register 218 for generating address 219. In a television system, processor 216 may include a display processor adding a delta parameter to an address parameter or to a position parameter stored in address register 218 for generating address 219. In a computer system, processor 216 may include a program counter or address register incrementing an address or loading an address stored in address register 218 to address instructions or operands with address 219. In an array processor system, processor 216 may include an array processor for processing array information, controlling address register 218 to address array information with address 219. In signal processor system, processor 216 may include a signal processor for processing signal information, controlling address register 218 to address signal information with address 219. In a database memory system, processor 216 may include a relational processor for comparing database information to locate desired information in the database and for controlling address register 218 to address database information with address 219. Address 219 stored in address register 218 is used to address memory 222; such as for accessing a pixel for display in a display system or for accessing an instruction or operand for use in a stored program computer.

Address 219 stored in address register 218 can be further processed by detector 220, such as to detect a change in the MSBs of address 219 (i.e.; FIGS. 4D, 4F, 6C, and 6W). Memory 222 can be a single memory or can include a plurality of memories, such as memories 222A to 222B, and other circuits 222K (i.e.; FIGS. 4F to 4K and 6E to 6N). Detector 220 can be a single detector or can include a plurality of detectors, such as detectors 220A, 220B, 220C, and 220D for detecting different conditions of address 219 for controlling memory operations and processor operations. For example, if a change in the MSBs of the address is not detected, scanout operations can proceed for higher performance, and if a change in the MSBs of the address is detected, alternate operations can be commanded. Such alternate operations can include re-addressing memory 222, such as by generating a RAS memory cycle for controlling memory 222 in response to detector signal 221, and can include slowing down, disabling, or otherwise modifying operation of processor 216 in response to detector signal 221 to be consistent with the re-addressing or RAS cycle operation.

FIGS. 4B and 4C are shown in different ways to illustrate different ways of portraying the system architecture. For example, FIG. 4B shows detector signals 221 controlling processor 216, such as for invoking a delay, and controlling memory 222, such as for generating a RAS cycle and FIG. 4C shows detector signals 221 controlling processor 216, such as for invoking a delay, without expressly showing detector signals controlling memory 222, such as for generating a RAS cycle. However, all details of implementation need not be shown in the more general block diagrams because they will become apparent when discussed in conjunction with the more detailed implementation diagrams.

FIG. 4C shows a configuration having a plurality of detectors 220C to 220D for invoking a plurality of different delays with detector signals 221C to 221D. Different delays can be implemented for different addressing conditions; such as for invoking a first short delay for internal scanout operations, invoking a second longer delay for external scanout operations, and invoking a third even longer delay for re-addressing operations or such as for invoking a first short delay for operations in a first memory, invoking a second longer delay for operations in a second memory, and invoking a third even longer delay for operations in a third memory. Different memories, such as memories 222A to 222B generating memory output signals 223A to 223B respectively, and other circuits 222K generating signals 223C can be implemented in a multiple memory configuration.

Figure 6A:
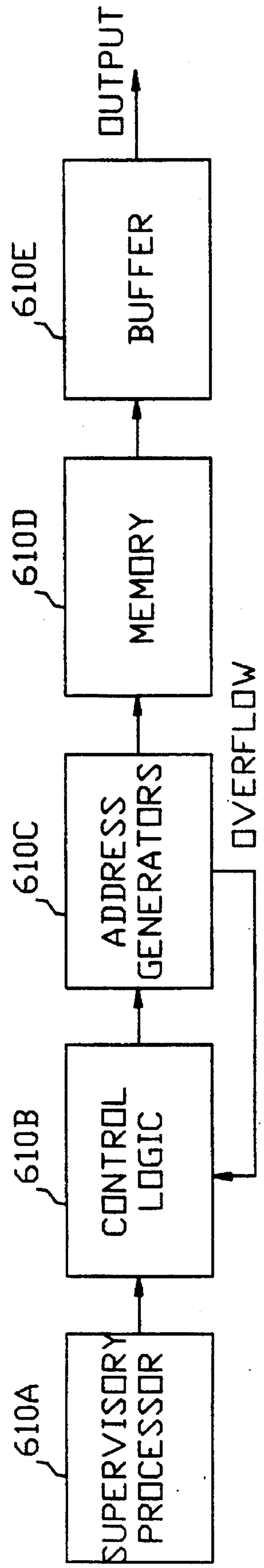
Figure 6C:
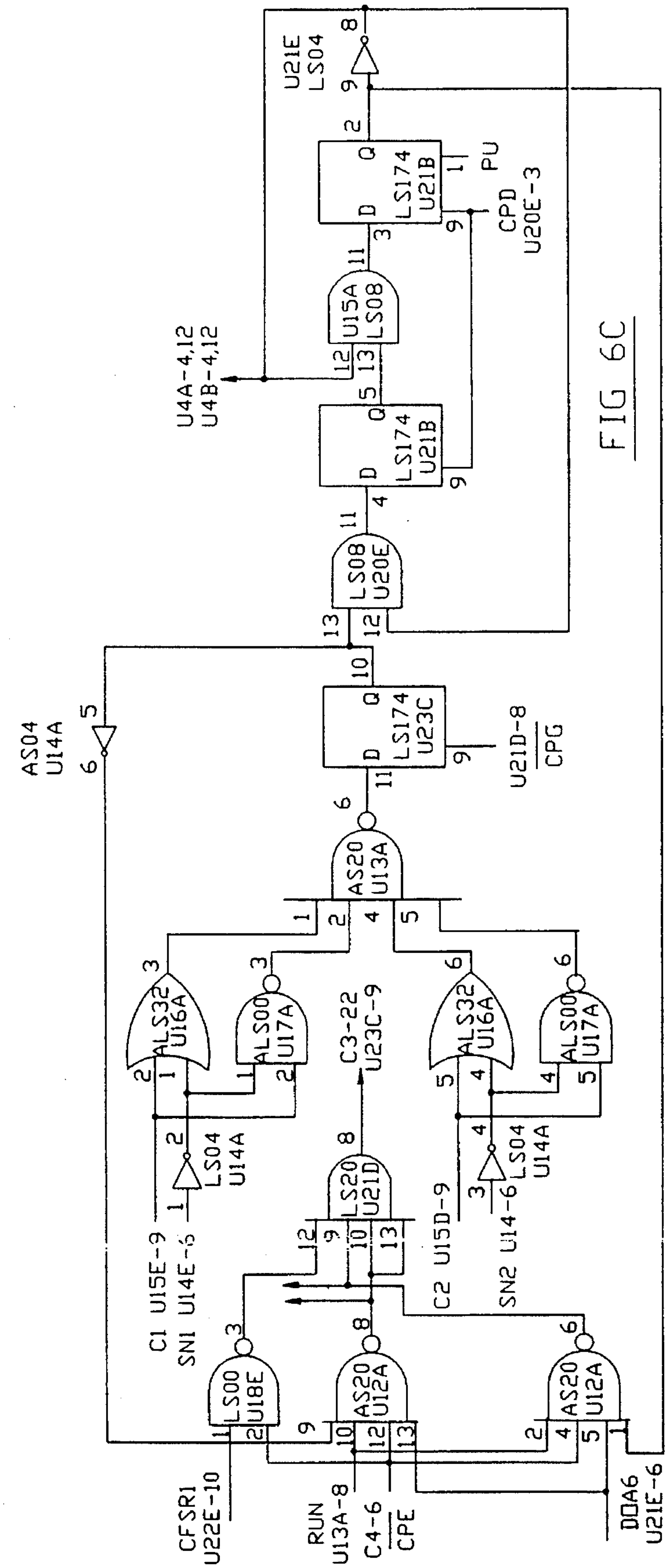
FIG. 6C is a detailed schematic diagram of clock gating logic.
Figure 6D:
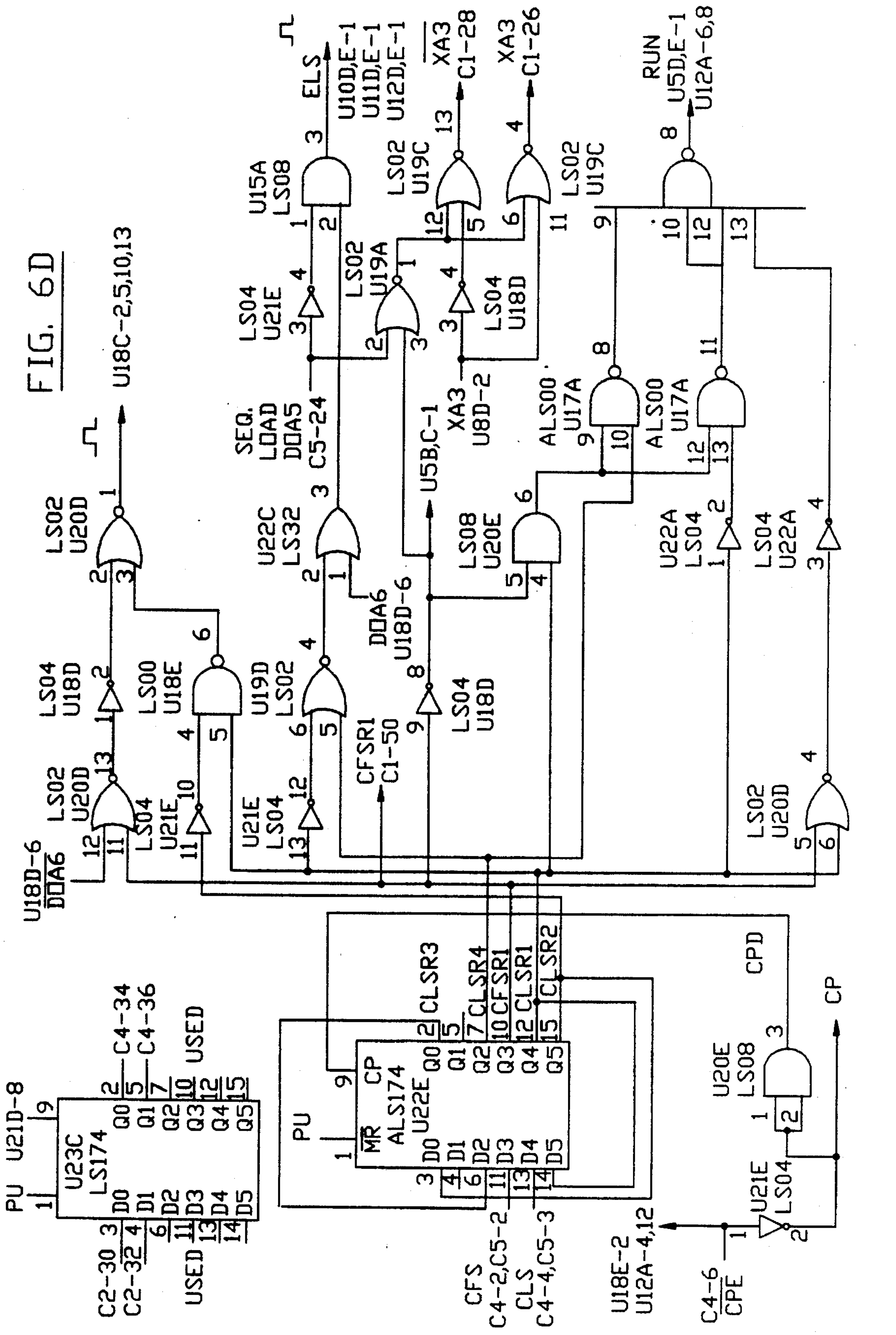
FIG. 6D is a detailed schematic diagram of control logic.

A very detailed example of one way to implement features of the present invention for a display system is discussed with reference to FIGS. 1 to 4, 5A to 5D, and 6A to 6X. The arrangement shown in FIG. 4B corresponds to this detailed discussion of a display system and FIG. 4C provides a variation to this detailed discussion of a display system. For example; processor 216 corresponds-to the supervisory processor, the supervisory processor interface, and the sync pulse processing logic (i.e.; FIGS. 6A, 6B, and 6D and the discussions related thereto). Processor 216 controls address register 218 (i.e.; FIGS. 6O, 6P, 6Q, and 6R and the discussions related thereto) with control signals 217 (i.e.; FIGS. 6B and 6D and the discussions related thereto) to generate address signals 219 (i.e.; FIGS. 6E, 6F, 6O, 6P, 6Q, and 6R and the discussions related thereto). Address signals 219 (i.e.; FIGS. 6E, 6F, 6O, 6P, 6Q, and 6R and the discussions related thereto) stored in address register 218 (i.e.; FIGS. 6O, 6P, 6Q, and 6R and the discussions related thereto) is used to address memory 222 (i.e.; FIGS. 6E to 6N and the discussions related thereto) ; such as for accessing a pixel for display. Address signals 219 (i.e.; FIGS. 6E, 6F, 6O, 6P, 6Q, and 6R and the discussions related thereto) stored in address register 218 (i.e.; FIGS. 6O, 6P, 6Q, and 6R and the discussions related thereto) is further processed by detector 220 (i.e.; FIG. 6C and the discussions related thereto) to detect a change in the MSBs of the address (i.e.; overflow signals C1, C2, SN1, and SN2 in FIG. 6C and the discussions related thereto). If a change in the MSBs of the address is not detected by the detector (i.e.; gate U13A-6 and flip-flop U23C-10 in FIG. 6C and the discussions related thereto), scanout operations (i.e.; controlled by scanout clock U12A-8 in FIGS. 6B and 6C) can proceed for higher performance. If a change in the MSBs of the address is detected by the detector (i.e.; gate U13A-6 and flip-flop U23C-10 in FIG. 6C and the discussions related thereto), alternate operations can be commanded. Such alternate operation can include re-addressing memory 222 with a RAS-type re-addressing operation (i.e.; controlled by re-addressing clock U12A-6 in FIGS. 6B and 6C).

The configuration shown in FIG. 4B will now be discussed in greater detail in the context of the display system disclosed in FIGS. 1 to 4, 5A to 5D, and 6A to 6X. Processor 216 may include supervisory processor 610A and control logic 610B, address register 218 may include address generators 610C, memory 222 may include memory 610D, and detector 220 may be represented by the overflow circuitry in address generators 610C generating the overflow signal (FIGS. 4B, 4C, and 6A).

The configuration shown in FIG. 4B will now be discussed in the context of a television system, similar to the display system supra. Processor 216 may include supervisory processor 610A and control logic 610B, address register 218 may include address generators 610C, memory 222 may include memory 610D, and detector 220 may be represented by the overflow circuitry in address generators 610C generating the overflow signal (FIGS. 4B, 4C, and 6A).

The configuration shown in FIG. 4B will now be disclosed in the context of a stored program computer system. Processor 216 may be a microprocessor IC chip controlling address register 218 on the same IC chip by incrementing address register 218 in accordance with program counter operations and by loading address register 218 in accordance with transfer operations. Memory 222 may be the computer main memory storing instructions to be accessed under control of address signal 219 for instruction execution by processor 216. Address 219 stored in address register 218 is further processed by detector 220 to detect a change in the MSBs of the address. If a change in the MSBs of the address is not detected, scanout operations can proceed for higher performance. If a change in the MSBs of the address is detected, alternate operation can be commanded. Such alternate operation can include re-addressing memory 222, such as by generating a RAS memory cycle for DRAMs under control of detector signal 221, and can include slowing down, disabling, or otherwise modifying operation of processor 216 to be consistent with the re-addressing or RAS cycle operation.

The configuration shown in FIG. 4B will now be disclosed in the context of an array processor system. Processor 216 may be an array processor advancing address register 218 in accordance with an array processor addressing algorithm, such as an FFT addressing algorithm or a correlation on the fly addressing algorithm. Memory 222 may be the array memory storing an array of information to be accessed under control of address signal 219 for array processing by processor 216. Address 219 stored in address register 218 is further processed by detector 220 to detect a change in the MSBs of the address. If a change in the MSBs of the address is not detected, scanout operations can proceed for higher performance. If a change in the MSBs of the address is detected, alternate operation can be commanded. Such alternate operation can include re-addressing memory 222, such as by generating a RAS memory cycle for DRAMs under control of detector signal 221, and can include slowing down, disabling, or otherwise modifying operation of array processor 216 to be consistent with the re-addressing or RAS cycle operation.

The configuration shown in FIG. 4B will now be disclosed in the context of a database memory system. Processor 216 may be a relational processor for relational database processing by advancing address register 218 in accordance with a database memory addressing algorithm. Memory 222 may be the database memory storing database information to be accessed under control of address signal 219 for relational processing by processor 216. Address 219 stored in address register 218 is further processed by detector 220 to detect a change in the MSBs of the address. If a change in the MSBs of the address is not detected, scanout operations can proceed for higher performance. If a change in the MSBs of the address is detected, alternate operation can be commanded. Such alternate operation can include re-addressing memory 222, such as by generating a RAS memory cycle for DRAMs under control of detector signal 221, and can include slowing down, disabling, or otherwise modifying operation of relational processor 216 to be consistent with the re-addressing or RAS cycle operation.

The configuration shown in FIG. 4B will now be disclosed in the context of a signal processing system. Processor 216 may be a signal processor for signal processing by updating address register 218 in accordance with a signal processing addressing algorithm. Memory 222 may be the signal processing memory storing information for signal processing to be accessed under control of address signal 219 for signal processing by processor 216. Address 219 stored in address register 218 is further processed by detector 220 to detect a change in the MSBs of the address. If a change in the MSBs of the address is not detected, scanout operations can proceed for higher performance. If a change in the MSBs of the address is detected, alternate operation can be commanded. Such alternate operation can include re-addressing memory 222, such as by generating a RAS memory cycle for DRAMs under control of detector signal 221, and can include slowing down, disabling, or otherwise modifying operation of filter processor 216 to be consistent with the re-addressing or RAS cycle operation.

The configuration shown in FIG. 4B will now be disclosed in the context of a filter system. Processor 216 may be a filter processor for filter processing by updating address register 218 in accordance with a filter addressing algorithm. Memory 222 may be the filter memory storing information for filtering to be accessed under control of address signal 219 for filter processing by processor 216. Address 219 stored in address register 218 is further processed by detector 220 to detect a change in the MSBs of the address. If a change in the MSBs of the address is not detected, scanout operations can proceed for higher performance. If a change in the MSBs of the address is detected, alternate operation can be commanded. Such alternate operation can include re-addressing memory 222, such as by generating a RAS memory cycle for DRAMs under control of detector signal 221, and can include slowing down, disabling, or otherwise modifying operation of filter processor 216 to be consistent with the re-addressing or RAS cycle operation.

The configuration shown in FIG. 4B will now be disclosed in the context of an artificial intelligence system. Processor 216 may be an artificial intelligence processor for artificial intelligence processing, such as inference processing, by updating address register 218 in accordance with an artificial intelligence addressing algorithm. Memory 222 may be the artificial intelligence memory storing information for artificial intelligence processing to be accessed under control of address signal 219 for artificial intelligence processing by processor 216. Address 219 stored in address register 218 is further processed by detector 220 to detect a change in the MSBs of the address. If a change in the MSBs of the address is not detected, scanout operations can proceed for higher performance. If a change in the MSBs of the address is detected, alternate operation can be commanded. Such alternate operation can include re-addressing memory 222, such as by generating a RAS memory cycle for DRAMs under control of detector signal 221, and can include slowing down, disabling, or otherwise modifying operation of artificial intelligence processor 216 to be consistent with the re-addressing or RAS cycle operation.

Various alternate memory configurations are discussed herein and in the related patent applications. For example; SRAM, DRAM, CCD, magnetic bubble memory, and other memory configurations are disclosed in the related patent applications and are further disclosed herein.

Configurations using Mitsubishi RAMs are disclosed herein, such as with reference to FIGS. 6E to 6N. These Mitsubishi RAM configurations implement column and row logic for MSB re-addressing and for LSB scanout, respectively. Toshiba DRAMs are configured with columns and rows, as with said Mitsubishi RAM configuration, but the columns and rows are reversed in designation. Hence, the Toshiba DRAM columns and rows correspond to the scanout and re-addressing respectively (Mitsubishi RAM rows and columns respectively) of the previously disclosed FIGS. 6E to 6N configuration.

The memory architecture of the present invention, discussed with reference to FIGS. 6E to 6N using Mitsubishi RAMs, excites the memory IC chips simultaneously using the LSBs and MSBs of the memory address (i.e., FIG. 6F). In the alternate DRAM configuration, it may be desirable to multiplex the MSBs (rows) and the LSBs (columns) under control of RAS and CAS strobes respectively (i.e., FIGS. 4H to 4K). Hence, in alternate configurations; it may be desirable to modify the clock gating logic to separate the re-addressing and scanout clocks to be RAS and CAS signals respectively. For example, the shorter period scanout clock U12A-8 and the longer period re-addressing clock U12A-6 (FIG. 6C) are shown combined to generate a dual rate clock signal U21D-8 (FIG. 6C) for the Mitsubishi RAM configuration (i.e., FIGS. 6E to 6N). Alternately, the dual rate control signals can be maintained separate as a CAS signal (i.e., U12A-8) and a RAS signal (i.e., U12A-6O supra to strobe said alternate DRAM configuration and to control the address multiplexer.

CCD memory configurations and magnetic bubble memory configurations have previously been disclosed in the related patent applications. These CCD memory configurations and magnetic bubble memory configurations are disclosed implementing improved access circuits, such as with multiple recirculation paths; implementing various types of refreshing, such as adaptive refreshing; and implementing various other memory inventive features.

Brief Description

A memory architecture in accordance with the present invention will now be discussed with reference to FIGS. 1 and 2. Alternate configurations can be provided to implement the system of the present invention. However, this configuration is exemplary of the system of the present invention. Input device 115A generates input information under control of input clock 115G. Address generator 115B generates addresses for memory 115C under control of input clock 115G, such as for storing information from input device 115A in memory 115C or for accessing information from memory 115C under control of input device 115A. Memory 115C outputs information accessed with address generator 115B under control of input clock 115G. Buffer 115D receives information accessed from memory 115C for buffering therein under control of input clock 115G and generates information buffered therein under control of output clock 115F. Output device 115E, such as a display monitor, receives buffered information from buffer 115D under control of output clock 115F. This permits information to be accessed from memory 115C asynchronous with information to be output to output device 115E. Hence, buffer 115D can input information under control of input clock 115G and can output information under control of output clock 115F for resynchronizing of information flow, averaging of information rate, reorganizing of information into groups, and for other purposes.

In an alternate configuration, information from memory 115C can be output directly to output device 115E under control of input clock 115G, such as with input clock 115G and output clock 115F being the same clock and being connected theretogether.

Figure 2:
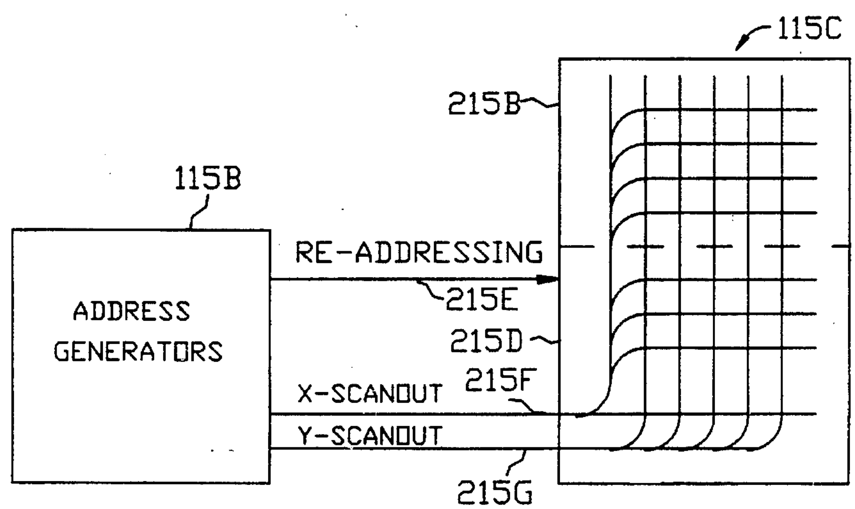
FIG. 2 is a block diagram representation of an arrangement for implementing the addressing and architecture of the memory of the present invention.

A multi-dimensional address configuration is shown in FIG. 2. Address generator 115B generates an address word having a re-addressing portion 215E, a Y-scanout portion, 215G, and an X-scanout portion 215F. This arrangement has particular advantages because the X-scanout signal 215F and the Y-scanout signal 215G can be generated more rapidly than re-addressing signal 215E to access or to write into memory 115C.

Memory 115C is shown partitioned onto 2-boards 215B and 215D. RAMs on the 2-boards can be addressed with re-addressing logic 215E. The RAMs are shown organized in an X-Y array of rows and columns. The X-scanout signals are decoded into a plurality of row signals shown radiating horizontally right from the X-scanout line 115F. The Y-scanout signals are decoded into a plurality of column signals shown radiating vertically up from the Y-scanout line 115G. The decoded row and column line signals enabled 1-row and 1-column as a function of the X-scanout and Y-scanout address portions, respectively. Consequently, 1-RAM at the intersection of the row and column enable signals is enabled to output the information addressed with re-addressing signal 215E and all other RAMs are disabled from outputting the information addressed with re-addressing signal 215E.

Various address register configurations will now be discussed with reference to FIGS. 3 and 4. FIG. 3 shows a dual address register configuration having an X-address register and a Y-address register. This arrangement is particularly applicable to display systems having a 2-dimensional memory map and generating vectors for storing into an image memory or for reading out of an image memory. The X-address register and the Y-address register can be separately controlled to generate a 2-dimensional vector for accessing a pixel in the memory. Actually, the 2-address registers can be considered to be concatenated to form a single address parameter for memory accessing. However, two separate 2-dimensional address registers are a convenient way of visualizing a single dimensional memory configured into a 2-dimensional memory map. In a configuration discussed for the experimental system herein, the 6-most significant bits of each register are combined for an 11-bit re-addressing word and a 1-bit board select signal while the 3-least significant bits of each register are separately decoded to select one of 8-rows and one of 8-columns on each board in accordance with the X-scanout signal 215F and Y-scanout signal 215G discussed with reference to FIG. 3.

Figure 4A:
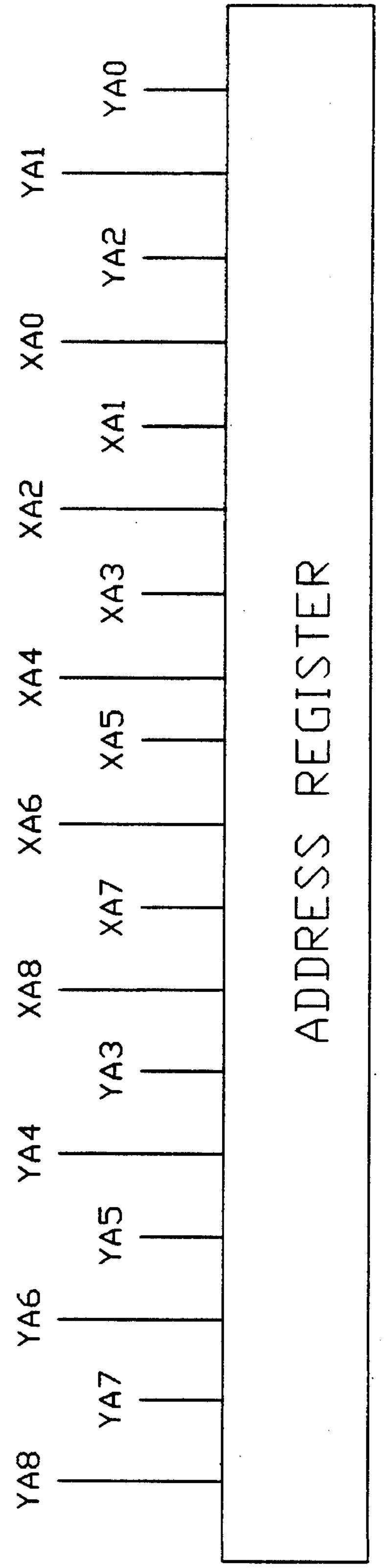
FIGS. 4A, 4B, 4C, 4D, 4E, 4F, 4G, 4H, 4I, 4J, 4K, 4L, 4M, 4N, 4O, 4P, 4Q, 4R, and 4S (herein referred to as FIG. 4) comprise memory designs: where
Figure 4B:
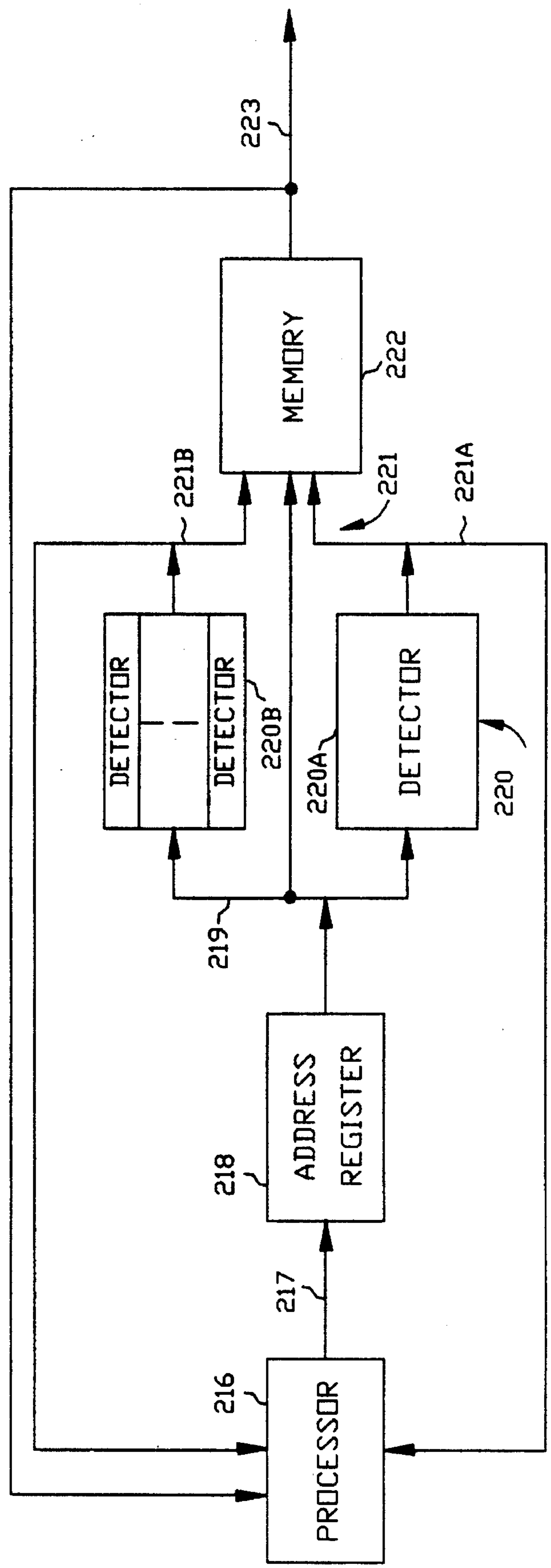
Figure 4C:
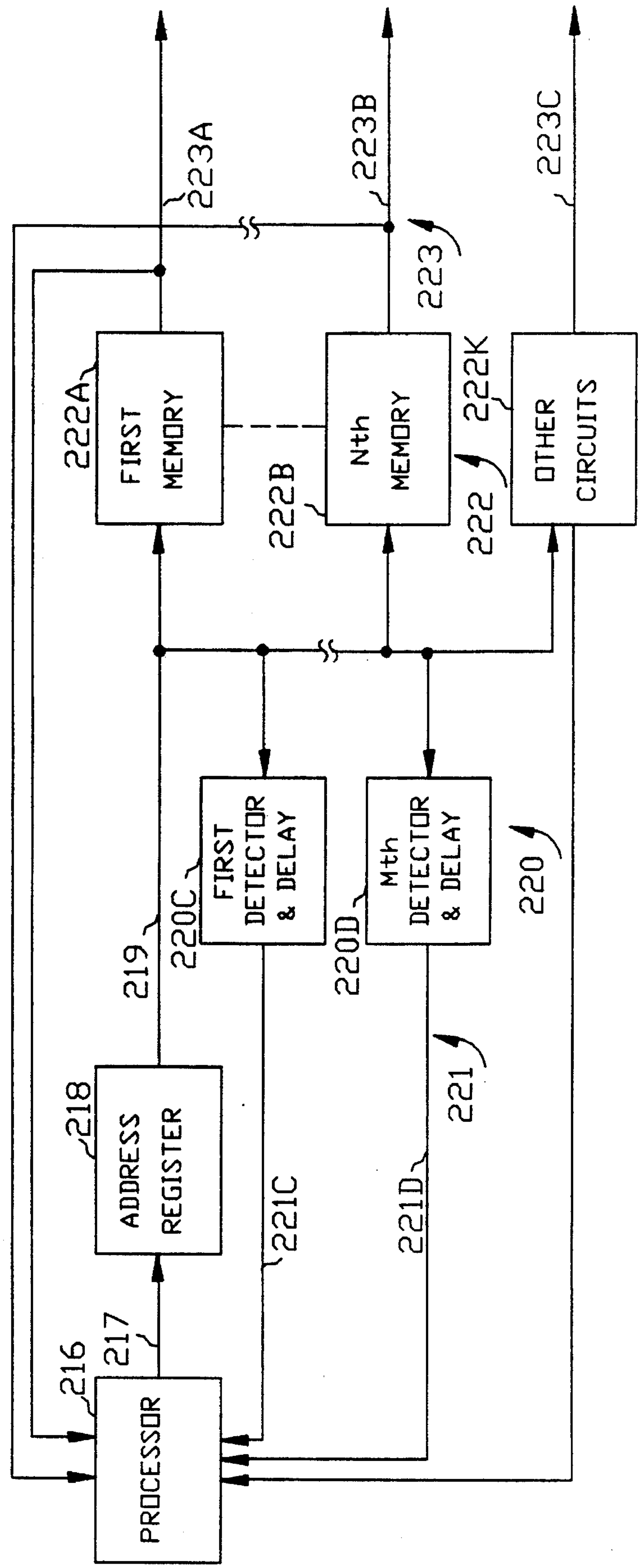

FIG. 4A shows a single address register configuration, which can be implemented by concatenating the X-register and Y-register shown in FIG. 3 or, alternately, may be conceptually defined as a single register, a quadruple register, or other configurations. Selected bits of this single address register may be used to control re-addressing and row and column select for the memory in accordance with FIG. 2. Many configurations of signal groupings can be implemented; such as using signals XA0, XA1, XA4, XA6, YA3, YA4, and YA6 for re-addressing; signals XA3, XA7, YA5, and YA8 for X-scanout decoding; and signals YA0, YA1, YA2, XA2, XA5, XA8, and YA7 for Y-scanout decoding as an alternate to the above configuration discussed with reference to FIG. 3.

Memory addressing may be configured in a multi-dimensional form; such as 2-dimensional, 3-dimensional, or 4-dimensional form. For example, address generation may be performed with a plurality of different address generators; such as an X-address generator for one portion of a 2-dimensional address and a Y-address generator for the other portion of a 2-dimensional address, as discussed for a 2-dimensional memory map configuration herein. Also, addresses that are generated with a single address generator can be partitioned into multi-dimensional addresses; such as a 16-bit computer instruction address being partitioned into a W-dimension address for the most significant 4-bits, an X-dimension address for the next less significant 4-bits, a Y-dimension address for the next less significant 4-bits, and a Z-dimension address for the least significant 4-bits. Also, a multi-dimensional address, such as the X-dimensional address and Y-dimensional address for a display configuration, can be concatenated into a single address by combining the different portions thereof; such as combining the Y-address dimension as the most significant portion of the address word and the X-address dimension as the least significant portion of the address word.

In describing the novel architecture of the memory of the present invention, the word "dimension" and words relating thereto have been adapted to mean the different forms of addressing the RAMs. For example, the RAMs are addressed with a re-addressing portion of the address and a scanout portion of the address, which may be considered to be 2-dimensional addressing, and the scanout portion of the address are divided into row select signals to the G-bar pins and column select signals to the S-bar pins of the RAMs, which may be considered to be 2-dimensional scanout addressing. A memory having an address with the combination of a 1-dimensional re-addressing portion and a 2-dimensional scanout portion may be considered to be a 3-dimensional memory. This terminology is different from terminology associated with 2-spatial dimensions of an image, such as implemented in a memory map, and 2-spatial dimensions of an image, such as displayed on a monitor.

The memory arrangement discussed herein can be applied to a display system, as discussed in greater detail herein. Image pixels can be accessed in sequence for output to a display monitor. The memory can be configured in a 2-dimensional form, such as 1-dimension being the data block address and the other dimension being the pixel address within a block. Alternately, the address can be partitioned into a plurality of bytes from a least significant byte to a most significant byte and each byte can be used to address a different dimension of the memory. Image memory scanout can be implemented by scanning sequential addresses at a higher rate and by re-addressing the memory at a lower rate, such as with a gated clock. A gating signal can be used to gate the memory access clock without gating the output clock, such as a DAC clock; permitting display operations to proceed under control of the non-gated output clock without being affected by gating of the memory clock. An output buffer memory can be used to temporarily store pixel information to reduce sensitivity of the display to gating of the memory clock. A buffer memory also permits accessing of the image memory at a relatively high duty cycle even though the information may be output to the display at a lower duty cycle, or at a relatively low portion of the time that the memory information is available, or by not utilizing the information immediately after the information becomes available from the image memory. A buffer memory also permits accessing of image memory substantially as fast as image memory can be accessed, reducing constraint from output speed considerations.

The memory arrangement discussed herein can also be applied to a correlator processor memory. Data can be accessed in sequence for execution by the correlator. The memory can be configured in a 2-dimensional form, such as 1-dimension being the data block address and the other dimension being the data address within a block. Alternately, the address can be partitioned into a plurality of bytes from a least significant byte to a most significant byte and each byte can be used to address a different dimension of the memory. Data scanout can be implemented by scanning sequential addresses at a higher rate and by re-addressing the memory at a lower rate, such as with a gated clock. A gating signal can be used to gate the memory access clock without gating the output clock, permitting correlator operations to proceed under control of the non-gated output clock without being effected by gating of the memory clock. A buffer memory can be used to temporarily store correlation information to reduce sensitivity of the correlator to gating of the memory clock. A buffer memory also permits accessing of the correlator data at a relatively high duty cycle even though the information may be processed at a lower duty cycle, or at a relatively low portion of the time that the memory information is available, or by not utilizing the information immediately after the information becomes available. A buffer memory also permits accessing of correlator data substantially as fast as the data memory can be accessed, reducing constraints from output speed considerations.

The memory arrangement discussed herein can also be applied to an FFT processor memory. Data can be accessed in sequence for execution by the FFT processor. The memory can be configured in a 2-dimensional form, such as 1-dimension being the data block address and the other dimension being the data address within a block. Alternately, the address can be partitioned into a plurality of bytes from a least significant byte to a most significant byte and each byte can be used to address a different dimension of the memory. Data scanout can be implemented by scanning sequential addresses at a higher rate and by re-addressing the memory at a lower rate, such as with a gated clock. A gating signal can be used to gate the memory access clock without gating the output clock, permitting FFT operations to proceed under control of the non-gated output clock without being effected by gating of the memory clock. A buffer memory can be used to temporarily store FFT information to reduce sensitivity of the FFT processor to gating of the memory clock. A buffer memory also permits accessing of the FFT data at a relatively high duty cycle even though the information may be processed at a lower duty cycle, or at a relatively low portion of the time that the memory information is available, or by not utilizing the information immediately after the information becomes available. A buffer memory also permits accessing of FFT data substantially as fast as the data memory can be accessed, reducing constraints from output speed considerations.

The memory arrangement discussed herein can also be applied to general purpose computer memory. Instructions can be accessed in sequence for execution by the computer arithmetic and control logic. The memory can be configured in a 2-dimensional form, such as 1-dimension being the instruction or data block address and the other dimension being the instruction or data address within a block. Alternately, the address can be partitioned into a plurality of bytes from a least significant byte to a most significant byte and each byte can be used to address a different dimension of the memory. Instruction and data scanout can be implemented by scanning sequential addresses at a higher rate and by re-addressing the memory at a lower rate, such as with a gated clock. A gating signal can be used to gate the memory access clock without gating-the output clock, permitting processing to proceed under control of the non-gated output clock without being effected by gating of the memory clock. A buffer memory can be used to temporarily store computer instructions and data to reduce sensitivity of the computer to gating of the memory clock. A buffer memory also permits accessing of the computer instructions and data at a relatively high duty cycle even though the information may be processed at a lower duty cycle, or at a relatively low portion of the time that the memory information is available, or by not utilizing the information immediately after the information becomes available. A buffer memory also permits accessing of computer instructions and data substantially as fast as the memory can be accessed, reducing constraints from output speed considerations.

Memory architectural features pertaining to high speed scanout in conjunction with re-addressing can provide speed enhancement, such as a 3-fold improvement in speed. These feature are particularly pertinent to RAMs having multiple tristate control signals; such as the Mitsubishi Electric M58725P RAMs. RAMs having a single tristate control signal can also be used with this configuration, but may involve additional decoder logic to decode scanout address signals, such as with linear select architecture consistent with a single tristate control signal.

The memory architecture of the present invention may be discussed in the content of a display application for purposes of illustration. However, this memory architecture is applicable to computer main memories, buffer memories, signal processing memories, and other memory applications in addition to display memories.

Re-Addressing and Scanout Memory Architecture

Multiple dimension image memory architecture, as previously discussed, involves simultaneous accessing of multiple pixels, such as in a 2-dimensional X/Y array, to increase effective memory speed. Such a configuration is appropriate for a 2-dimensional horizontal and vertical scanout for refreshing a display monitor and is also appropriate for other applications; such as general purpose computers and special purpose processors. Such a memory architecture may need buffer registers for temporary storage of accessed information, such as for temporary storage of accessed pixels so that a new memory access cycle may be initiated while the previously accessed pixels are being output to refresh the display monitor. An alternate configuration is discussed herein where a block of pixels is simultaneously accessed and is scanned-out without the need for buffer registers or overlapping memory accesses. This configuration can involve a multiple access period, where stored information is scanned out from an accessed block at high rate (shorter period) and a new block of stored information is accessed at a lower rate (lower period). A buffer memory, such as a FIFO or a double buffer memory, can be used to equalize these rate and period differences.

A novel memory architecture will now be discussed which enhances memory speed and economy. This architecture can be characterized as a multi-dimensional memory architecture that is divided into 2-address portions, a high speed address portion and a slow speed address portion. Another characteristic is a combination scanout and re-addressing architecture. Another characterization is use of tristate memory control logic to reduce the need for buffer registers and multiplexing logic. This can be accomplished by taking advantage of certain features of RAMs.

Conventional RAMs have a plurality of input address lines for addressing stored information, tristate output data direction control logic for selecting data input for writing and data output for reading, and tristate chip select logic for gating output information onto a bus. Use of these circuit features in a novel form implemented in the memory architecture described herein provides important advantages. For example, tristate data input and output control logic can be used in conjunction with tristate chip select logic to provide a high speed 2-dimensional scanout for rapid accessing of RAMs. The 2-dimensional scanout arrangement reduces auxiliary decoding and selection logic, reduces output buffer logic, is compatible with 2-dimensional memory map architectures, and facilitates relatively high speed operation with relatively low speed RAMs.

Higher speed scanout can be used in conjunction with slower speed addressing of the RAMs to provide an average access rate that is significantly higher than the addressing rate. For example, the Mitsubishi Electric M58725P RAMs have a 200-ns address period and a 100-ns scanout period. Assuming that a system will scanout 4-parameters before re-addressing is necessary and assuming that re-addressing is implemented with 3-scanout clock periods, 5-parameters can be accessed in 7-clock periods; 4-parameters times 1-clock period per parameter plus 1-parameter times 3-clock periods per parameter; in comparison to conventional re-addressing, where 5-parameters can be accessed in 15-clock periods (5-parameters times 3-clock periods/parameter). This scanout and re-addressing example yields an average of 1.4-clock periods per pixel for the scanout and re-addressing configuration compared to 3-clock periods per pixel for the re-addressing configuration, yielding an improvement of about 2-times in speed for this example.

RAMs are conventionally addressed with a number of address lines, such as 11-address lines for a 2,048 word RAM. Address signals typically propagate through the memory array and consequently can have relatively long propagation delays. RAMs conventionally have tristate enable signals to permit bussing of output signals and to select data input for storing and data output for accessing of data. The tristate enable signals can be used to gate the RAM outputs and consequently can have relatively short propagation delays.

The present multi-dimensional memory configuration uses less frequent accessing of data with the slower address signals (re-addressing) and uses more frequent accessing of data with the faster scanout control signals. Therefore, the average propagation delay is reduced, being a weighted average of several shorter scanout propagation delays and a single longer address propagation delay.

Speed is enhanced by changing the clock period to be a function of the addressing operation, such as a longer clock period for re-addressing and a shorter clock period for scanout. A buffer memory; such as a FIFO, double buffer, cache, or scratchpad memory; can be used to buffer output information from the memory for providing a constant memory output clock period in response to the variable memory input clock period.

A specific example will now be provided to illustrate use of relatively longer propagation delay address signals to select a single block of 64-pixelsand using relatively shorter propagation delay tristate control signals to select a pixel from the selected block. Each address generator generates a concatenated address having a 3-bit tristate control signal portion and a 6-bit address signal portion. The 3-bit tristate control signal address can be implemented with the least significant bits (LSBs) of the address word and the 6-address bits can be implemented with the most significant bits (MSBs) of the address word. The address generators can be implemented to update the address, where the LSBs can be updated more frequently than the MSBs and where the addresses can scan through a block of pixels as the LSBs are updated and change to a different block of pixels when the MSBs are updated. Updating of the MSBs can be detected with an overflow from the LSBs to the MSBs in the address generator. Therefore, the LSBs can be updated relatively rapidly to scanout with the faster tristate control signals through the pixels within a block and the MSBs can be updated relatively slowly to change the selected block.

For purposes of illustration, an experimental configuration with an image memory having 262,144-pixels arranged in a 512-by-512 pixel memory map was implemented. Also for simplicity, Mitsubishi 58725P RAMs, Texas Instruments 7400 series TTL logic, and Intel logic is used. The Mitsubishi RAMs have 2K-words by 8-bits per word. Therefore, 128-RAMs are used to provide 262,144-pixels. For efficiency of implementation, the RAMs are arranged in two 2-dimensional boards each having a binary quantity (i.e., 8) RAMs for each dimension. Consequently, the 128-RAMs are arranged on 2-boards each having 64-RAMs, arranged in an 8-by-8 block of RAMs per board.

Each RAM has an 11-bit address for accessing one of 2048-words. Another address bit is used in this configuration for selecting one of the two RAM boards. For convenience of discussion, the 11-bit address and the 1-bit board select signals are organized in a 6-bit X-address dimension and a 6-bit Y-address dimension to select one block of 64-pixels out of 4096 blocks of 64-pixels. This arrangement is shown in the memory diagrams and tables included herewith. The memory map contains a 64-by-64 array of blocks for a total of 4096 blocks. The 12-address bits are organized into a 6-bit Y-axis address and a 6-bit X-axis address for a 64-by-64 array of blocks. The 6-bit X-axis address is divided into a 5-bit X-axis address to each RAM and a 6th X-axis address bit to select one of the two 64-RAM boards. Use of the X-address bit as a board select bit causes the 64-by-64 array of RAMs to have alternate X-dimensional columns to be selected from different boards. Alternately, use of the most significant X-address bit for the board select bit would cause the 64-by-64 array of RAMs to have all of the X-dimensional RAMs in one board adjacent to each other and all of the X-dimensional RAMs in the other board adjacent to each other.

Each of the 4096-blocks of pixels can be configured in an 8-by-8 array of 64-pixels. One of the 8-by-8 arrays of 64-pixels is shown in the image memory diagrams and tables included herewith. The 8-by-8 array can be addressed with a 2-dimensional 3-bit by 3-bit address organized in a 3-bit X-address and a 3-bit Y-address format. Each of the two 3-bit address portions can be decoded into 8-address lines, yielding an 8-by-8 array of address lines. If one of the first group of 8-address lines is excited to select a row of pixels and the second group of 8-address lines is excited to select a column of pixels, then the one pixel at the intersection of the row address line and column address line is selected out of the 64-pixels per block.

The memory scanout and re-addressing architecture can be implemented for cutting across image memory lines to generate a vector drawn at an angle to the raster lines and can be efficiently used in a raster scan image memory. For example, raster scan outputs proceed on a line-by-line basis; consistent with the line organization of the image memory. In such an arrangement, a single tri-state control signal can be used for scanout as the line progresses, with re-addressing being performed at block boundaries. In this configuration, a block may be a 1-dimensional line of pixels; in contrast to the above described 2-dimensional array of pixels per block. Block traversing in a 1-dimensional memory system is more nearly constant than in a multi-dimensional memory system. For example, a linear block along a scanline can have all pixels in the block accessed frame-after-frame independent of vector considerations. This may be different from a system having a 2-dimensional scanout block with vectors because a 2-dimensional scanout block may have different numbers of pixels traversed within a block as a function of the vector parameters. For example, the number of pixels traversed may be a function of the pixel entry point to the block and a function of the scanout vector angle through the block, where the pixel entry point may be a function of vector position and the scanout angle may be a function of vector slope.

The maximum, typical, average, and minimum number of pixels scanned in a block can be different for different configurations. For example, in a raster scan arrangement; all pixels in a block may be scanned for each traverse of the linear block. Therefore, in a 1-dimensional block configuration; the maximum, typical., average, and minimum number of pixels scanned in a block may be the same; which is the total number of pixels per block. In a 2-dimensional block configuration having vector directions, the maximum number of pixels may be the number of pixels along the diagonal of the block; the minimum number of pixels may be a single pixel, such as a scan clipping the corner of a block; and the typical number and average number may be inbetween the maximum and minimum, such as determined by typical and average block geometry relationships. Consequently, in a linear block raster scanout configuration, greater average scanout rates may be obtained due to the scanout of more pixels per block.

A buffer memory configuration can have the form of a multiple buffer, such as a double buffer. Alternately, the memory configuration discussed herein having gated clocks and a plurality of clock periods can be implemented with a smaller buffer memory to average a plurality of clock periods. For example, a 16-word FIFO can be used for loading at an input word rate under control of the gated clock pulse having a plurality of clock periods and for unloading at a clock rate consistent with the output word rate. The FIFO may be implemented with the S/N 74LS222, S/N 74LS224, or S/N 74S225 circuits which provide 16-words having 4-bits or 5-bits. These FIFOs can be configured in parallel to provide the 8-bits per word, as shown for the experimental configuration, or can provide other word sizes.

Memory Enhancement

The output of memory in the experimental configuration can be implemented to propagate down a datapipe to a buffer memory without communication with the front end control logic and address generators. Therefore, it can be considered to be implemented in a pipeline form. This pipeline permits introducing clock skew, where the clock to the output data pipe can be skewed ahead of the clock to the input at the data pipe. This permits greater speed in view of propagation delay considerations. For example, in the experimental configuration, the output registers are clocked with the 180-degree-phase clock and, consequently, provide a 1.5-clock period for propagation delay. One design consideration for this configuration is that propagation delay through the memory is less than ½-clock period or the newer high speed information from the next clock may be clocked into the datapipe with the 1.5-clock period clock.

Memory Map Display Architecture

An architecture of one form of memory map for a display will now be discussed. This memory map stores an image as a 2-dimensional array of pixels. In a monochromatic configuration, each pixel contains 1-intensity parameter. In a color configuration, each pixel contains 3-intensity parameters; red, blue, and green intensity parameters. Additional information can be contained in a pixel word; such as other parameters, flags, and control information. All information for a particular pixel can be packed together in a pixel word. Accessing of a pixel word can be implemented to access all information pertaining to the particular pixel word with one access or, alternately, can access portions of the pixel word for each of multiple accesses per pixel word. For simplicity of discussion herein, operations on a pixel word may be discussed as operations on a pixel.

Memory map configurations having 1-dimensional and multi-dimensional architectures have been discussed. Multi-dimensional architectures provide enhanced performance and flexibility, such as by accessing multiple pixels simultaneously.

Multi-dimensional architecture provides important advantages. It provides high speed, because of the addressing of 64-pixels in parallel and because the tristate select signals have shorter propagation delays than the address signals. It provides flexibility, because the tristate select signals can traverse the 64-pixel block at any vector angle and through any continuous sequence of pixels. It provides circuit efficiency because much of the address decode and tristate logic is implemented on the memory chips, because a multi-dimensional addressing arrangement is more efficient than a 1-dimensional addressing arrangement, and because the tristate logic reduces the need for output registers.

A configuration for simultaneous accessing of an 8-by-8 2-dimensional array of 64-pixels is shown in FIGS. 6E to 6N. A pixel address selects 64-pixels at a time out of the total array of pixels, such as out of 262,144-pixels in a 512-pixel by 512-pixel array. A subset of the 64-pixel block is then addressed with tristate enable signals, such as chip select and output select signals. Tristate select signals can be used to scan through a 64-pixel block to select a sequence of pixels therefrom.

The experimental configuration has been constructed having a 512-pixel by 512-pixel memory map. For convenience of experimentation, static 16K-RAM chips are used for memory map implementation. Typical circuits are the TMS-4016 RAM from Texas Instruments Inc. and the M58725P static RAM from Mitsubishi Electric. These circuits are configured in the form of a 2K-word by 8-bit static RAM having an 11-bit address, a tristate chip select, and a tristate output enable. Conventionally, the chip select and output enable are used to provide output bussing and to reduce the need for an output register. In the present configuration, the chip select and output enable signals are used to provide 2-additional dimensions of memory addressing. For example, the 11-address lines are used to select a block of 64-pixels out of 262,144-pixels; the chip select signal is used to select a column of 8-pixels out of the selected block of 64-pixels; and the output enable signal is used to select a row of 8-pixels out of the selected block of 64-pixels. The selection of a column of 8-pixels and a row of 8-pixels with the chip select signal and the output enable signal selects a single pixel at the intersection of that column and row from the selected block of 64-pixels. Consequently, a 3-dimensional architecture having address selection of a 64-pixel block, chip selection of an 8-pixel column in that block, and output enable selection of an 8-pixel row in that block uniquely selects a single pixel out of 262,144-pixels.

Memory chips have particular characteristics that can be adapted to memory architectures which are particularly appropriate for the systems discussed herein. For example, memory circuits conventionally have address lines and tristate select lines. The address lines are typically used to select a pixel per chip and the tristate select lines are typically used to disconnect undesired chips from the output bus and to reverse data direction for read and write operations. However, use of the address lines to select a block of pixels and use of the tristate select lines to scan through the block of pixels provides particular advantages. The access time from the address select is significantly greater than the access time from the chip select or the output enable select. Therefore, accessing with the chip select and output enable signals can proceed at a significantly faster rate than accessing with the address select.

The address select lines can be excited with the most significant bits (MSBs) of the X-address and Y-address generated with the address generators. The chip select and output enable signals can be excited with the decoded least significant bits (LSBs) of the X-address and Y-address generated with the address generators. For a 512-pixel by 512-pixel memory map having block of 64-pixels, the 6-MSBs of the Y-address and the 6-MSBs of the X-address can be combined into a 12-bit address to select one of 4096 blocks of 64-pixels. The 3-LSBs of the Y-address and the 3-LSBs of the X-address can be used to select one of 8-rows and one of 8 columns, respectively. As the address generation proceeds within a block of pixels, the address proceeds along a line at the appropriate vector angle through the block as the 3-LSBs of the X-address and the 3-LSBs of the Y-address are updated. When the address update progresses into the MSBs of either the X-address or Y-address, such as with an overflow; a new block of pixels is accessed and the address generation then proceeds within this new block of pixels along a line at the appropriate angle through the block.

The time period for memory accessing of a new block of pixels can be implemented to be longer than the time period for scanning pixels within a previously accessed block of pixels. This can be provided by scanning the pixels within a block at a higher rate and then accessing a new block at a lower rate. This can be implemented by using a higher clock rate to scan pixels within a block, to detect an overflow condition in the X-address and Y-address generators from the LSBs to the MSBs as being indicative of the need to access a new block of pixels, and to switch over to a lower clock rate for accessing of the new block of pixels.

The arrangement discussed with reference to FIGS. 6E to 6N illustrates 64-RAM chips in an 8-by-8 array of chips. Two of these 8×8 arrays of chips are used for a 512-pixel by 512-pixel memory map that is implemented in 64-pixel blocks with 2K-by-8 static RAMs. Each 2K-block array of pixels is selected with 11-bits of the 12-bit address. The particular one of the two 64-chip boards is selected with the remaining bit of the 12-bit address. This is shown with the 5-bits from the X-address and the 6-bits from the Y-address being bussed to all 128-chips of both boards and with 1-bit of the X-address being used to select one of the 2-boards in the uncomplemented state and the other of the 2-boards in the complemented state. The row select and the column select are each implemented by decoding 3-bits with a decoder to generate one of 8-signals to select one of 8-rows and one of 8-columns, respectively. The 11-address lines are bussed to the address input lines of each RAM chip. The 8-data lines are bussed from the data output lines of each RAM chip. Each column select line is bussed to all 8-chips in the related column for each of the two blocks. Each row select line is bussed to all 8-chips in the related row for each of the 2-boards. Consequently, the 11-address lines select 2-boards of 64-chips each, the twelfth address line selects one of 2-boards, and the 6 "scanout" lines select one of 64-pixels per board.

Image Memory

An image memory for a display in accordance with the present invention can take various forms; such as being implemented with static RAMs, dynamic RAMs, CCDs, ROMs, and other memory devices. The memory architecture can be a random access, sequential access, block access, or other form of architecture. The image memory can be implemented in an unbuffered form, or in a buffered form; such as with a double buffer, in conjunction with various line buffers, and in conjunction with frame buffers. These various alternatives can be adapted to operate with the present invention based upon the teachings herein showing a detailed design of a RAM image memory using static RAMs and accessed in a block oriented scanout arrangement. This configuration will now be discussed in detail with reference to FIGS. 6E to 6N.

Address generators for use with the memory arrangement shown in FIGS. 6E to 6N are discussed with reference to FIGS. 6O to 6R. The address generators can generate sequential addresses at the appropriate vector angle through image memory. Multiple RAM chips, in this example all RAM chips, are addressed with the more significant bits of the same address word for simultaneously. accessing the corresponding word in each of the multiple RAM chips. The less significant bits of the address word are used to select which of the chips is to be enabled for outputting onto the output bus. The chip enable control is a higher speed control and hence permits higher speed memory operations when scanning out within a memory block and the chip address control is a lower speed control and hence involves lower speed memory operations when re-addressing. Therefore, two types of addressing will be described with reference to FIGS. 6E to 6N, which are re-addressing with the more significant address bits and scanout with the less significant address bits.

Re-addressing is performed with fanout buffers U19A for the Y-address bits and U19D for the X-address bits. These buffers generate the drive current necessary to fanout to a large number of RAM chips. In this configuration, 64-RAM chips are grouped on each of two image memory boards with each board having replicated buffers to facilitate increased speed and modularity. The buffer outputs are applied to the address inputs of the RAM chips. During scanout, the addresses are maintained constant. During re-addressing, the addresses are changed.

Scanout is performed with decoders U19B, U19C, and U19E. The less significant address bits are applied to these decoders and decoded into X-address and Y-address signals. The X-address signals select rows of RAM chips and the Y-address signals select columns of RAM chips in a 2-dimensional configuration on each board. Replicating memory address logic on each board facilitates increased speed and modularity. Each row and each column is composed of 8-RAM chips for an 8-by-8 array of RAM chips per board.

The Y-axis decoder U19B is addressed with the less significant Y-address bits YA0, YA1, and YA2 for decoding of column signals. The decoded column signals are applied to the RAM chip select pin, pin 18, to select the column of RAM chips and are applied to the Intel 8216 bus interface chips associated with that column for outputting to the memory output bus.

Selection of one of the 2-boards is provided with the fourth from the least significant X-address bit XA3 applied to U19B-6 and to the Intel 8216 chip select logic. XA3-bar is used to select memory board-1, XA3 is used to select memory board-2. Therefore, as the scanout proceeds in the X-direction, the same block on alternate boards are selected without re-addressing; effectively providing a 16-column by 8-row aspect ratio of RAM chips. Enabling of U19B with XA3 or XA3-bar to pin-6 is an optional control; where selection of one of two memory boards is performed with the Intel 8216 bus interface logic, as described below. Gating the column addresses U19B-6 with the XA3 and XA3-bar signals reduces memory power consumption.

The X-axis decoders U19C and U19E are addressed with the least significant X-address bits XA0, XA1, and XA2 for decoding of row signals. Decoder U19C is used for read operations, where the decoded row signals are applied to the RAM data enable pin, pin 20, to select the row of RAM chips for read operations. The RAM data enable control, pin 20, is conventionally used for selecting data direction during read and write operations. However, in this configuration; it is also used to facilitate 2-dimensional scanout capability. Decoder U19E is used for write operations, where the decoded row signals are applied to the write control pin, pin 21, to select the row of RAM chips for write operations. The DIEN-bar signal is generated from the computer run/load-bar signal DOA6; enabling U19C-6 for read operations during the run mode when DIEN-bar is 1-set, disabling U19C-6 for read operations during the load mode when DIEN-bar is 0-set, enabling U19E-5 for write operations during the load mode when DIEN-bar is 0-set, and disabling U19E-5 for write operations during the run mode when DIEN-bar is 1-set. Therefore, during the run mode, U19C is enabled for reading image memory and U19E is disabled for preventing writing into image memory. Also, during the load mode, U19C is disabled to prevent reading of image memory and U19E is enabled for permitting writing into image memory. Enabling of U19E enables the write pulse W-bar input to U19E-4 to be steered to the appropriate row of RAM chips for writing into the RAM chip that is enabled with the chip select column signal to pin 18.

The RAM chip data lines carry the output byte from the selected RAM chip during read operations and carry the input byte to the selected RAM chip during write operations. A shared bi-directional bus structure is used for bi-directional communication with the RAM chips. Intel 8216 bus interface circuits are used for bi-directional communication between a read bus and a write bus and the RAM chip. Each Intel 8216 can accommodated 4-lines, where Intel 8216 chips are used in pairs; U17A and U18A, U17B and U18B, U17C and U18C, and U17D and U18D; to accommodate the 8-lines of a RAM data byte. As can be seen in the memory schematics (FIGS. 6E to 6N); on the system bus side, the 8-input unidirectional lines for each pair of Intel 8216s are connected to different lines on the system write bus and the 8-output unidirectional lines for each pair of Intel 8216s are connected to different lines on the system read bus. On the memory side, the bi-directional input and output buffers of the 8216s are internally connected together to provide 8-bi-directional lines connecting to the 8-lines for each RAM chip associated with the particular pair of Intel 8216s. The design connects the data buses for a pair of columns of RAM chips to a single pair of Intel 8216s. This facilitates a tradeoff of the number of Intel 8216 chips used and the speed of operation.

A pair of NAND-gates U17E and U18E are used to OR the two column select signals associated with the pair of Intel 8216s and to AND the board select signal XA3 or XA3-bar for selection of the pair of Intel 8216s as a function of the selected board and the selected column pair of RAMs on that board. The selected pair of Intel 8216s connect the selected-RAM to the input bus or output bus under control of the above described signals.

The run/load-bar signal applied as the DIEN-bar signal on pin 15 of the Intel 8216s selects the direction of data communication. If the DIEN-bar signal is 1-set, indicative of the run mode of operation; the 1-set signal applied to pin-15 of an Intel 8216 commands data output from the RAM data bus to the memory output data bus for reading of RAM. If the DIEN-bar signal is 0-set, indicative of the load mode of operation; the 0-set signal applied to pin-15 of an Intel 8216 commands data input to the RAM data bus from the memory input data bus for writing into RAM.

During read operations, all RAM chips are addressed with the same address signals and one of the RAM chips is selected with a combination of a column select signal and a row select signal. The selected RAM chip will have its output data lines enabled to be applied to the output data bus through the Intel 8216 bus interface chips. The column select signal also selects the Intel 8216 bus interface chips associated with selected column for applying the column-related RAM bus to the data bus for reading.

During write operations, all RAM chips are addressed with the same address signals and one of the RAM chips is selected with a combination of a column select signal and a row-selected write pulse for writing the information from the data lines into the selected RAM chip. The column select signal also selects the Intel 8216 bus interface chips associated with the selected column for applying the input data from the data bus to the RAM chips for writing.

Improved IC Memory Chip

An improved IC memory chip, can be implemented in accordance with the teachings of the present system and can provide important advantages over conventional memory chips. This improved memory chip can have multiple tristate control chip select inputs, similar to the 2-dimensional arrangement of the chip select and data enable signals. Also, each memory chip can have an output register to latch the accessed data, where the output register has an output tristate select with multi-dimensional selection. The data can be latched for scanout and new data can be accessed with a changing address. The data can be strobed into the output register before re-addressing the RAM, such as with a data hold strobe.

Multiple dimensions of tristate output select, can be implemented, exemplified by the 2D tristate control of the system disclosed herein. 2D, 4D, and other multi-dimensional tristate controls can provide further advantages in decoding and scanning-out from image memory.

Memory Logical Design

The memory implemented for the experimental configuration is implemented in a multiple board arrangement, where each board contains 64-RAMs organized in a logical 8-RAM column by 8-RAM row 2-dimensional array. All RAMs receive the same address. All 8-RAMs in an 8-RAM row receive the same X-select signal, which is different from the X-select signal for all other rows. All 8-RAMs in an 8-RAM column receive the same Y-select signal, which is different from the Y-select signal for all other columns. The input data and output data signals are bussed together for groups of 16-RAMs and interfaced with Intel 8216s for connecting to the system databus.

The regular array of RAMs lends itself to a tabular wire list type of documentation. MEMORY TABLE-A to MEMORY TABLE-D list the interconnections for the 64-RAM array on a board. The RAMs are organized in a physical 4-row by 16-column array comprising row-A to row-D and column-1 to column-8. Each RAM is identified by the physical row and column designation; where RAM U1A is the RAM that occupies the row-A and column-1 position, RAM U6C is the RAM that occupies the row-C and column-6 position, and the other RAMs occupy the other positions in row-A to row-D and column-1 to column-16.

MEMORY TABLE-A lists the connections for pin-1 to pin-12 of the first group of 32-RAMs. MEMORY TABLE-B lists the connections for pin-1 to pin-12 of the second group of 32-RAMs. MEMORY TABLE-C lists the connections for pin-13 to pin-24 of the first group of 32-RAMs. MEMORY TABLE-D lists the connections for pin-13 to pin-24 of the second group of 32-RAMs.

The address connections are the same for all RAMs; where pins 1 to 8, 19, 22, and 23 are connected to an 11-wire address bus; where each bus wire connects the same pin on each RAM. The vertical scanout pin, pin 18, for all 8-RAMs in a logical column are connected together and are connected to the vertical scanout signal from U19B corresponding to the particular logical column. The horizontal scanout pin, pin 20, for all 8-RAMs in a logical row are connected together and are connected to the horizontal scanout signal from U19C corresponding to the particular, logical row. The horizontal write pin, pin 21, for all 8-RAMs in a logical row are connected together and are connected to the horizontal write signal from U19E corresponding to the particular logical row.

The databus connections are the same for all RAMs in a double logical column or single physical column array; where pins 9 to 11 and 13 to 17 are connected to an 8-wire data bus connecting all 16-RAMs in the double logical column or single physical column group. A pair of Intel 8216s connect each 16-RAM databus to the system databus with bi-directional read and write signal paths. Four pairs of Intel 8216s hi-directionally connect all 64-RAMs to the system databus.

Other Memory Configurations

Various configurations of the memory of the present invention have been above to illustrate how the various features and devices of the memory of the present invention can be used to implement a system. These configurations are illustrative of a large number of other configurations that can be implemented from the teachings herein.

The memory configuration of the present invention has been discussed relative to implementing a 2D memory map for an image processing system and has briefly been discussed for other applications. It is herein intended that the memory architecture of the present invention be usable with other types of display systems and with other systems, such as computer systems and signal processing systems, that are not display systems.

The memory configuration of the present invention has been discussed in memory map form with an address derived from an X-axis address component and a Y-axis address component. Alternately, other addressing configurations can be implemented; such as a single address component for what may be considered to be a 1D memory, a 3-address component for what may be considered to be a 3D memory map, and other memory addressing configurations.

The memory configuration of the present invention has been discussed with reference to an integrated circuit RAM of the Mitsubishi M58725P-type. However, the teachings of the present invention are also appropriate for other integrated circuit RAMs and are also appropriate for integrated circuit ROMs and other memory technologies.

The memory configuration of the present invention has been discussed for a RAM component having 2-tristate control signals for controlling the tristate input and output of the RAM. Alternately, other numbers of tristate control signals can be accommodated; such as 1-tristate control signal, 3-tristate control signals, 5-tristate control signals, and other quantities of tristate control signals. The architecture for 2-tristate control signals permits implementation of what may be termed a 2-dimensional scanout arrangement having X-scanout control signals and Y-scanout control signals. Alternately, for a configuration having RAMs with 1-tristate control signal, a memory architecture that may be termed a 1-dimensional scanout arrangement can be implemented having 1-scanout signal to each RAM. The 1-scanout signal may be a single dimensional decode of the scanout portion of the address; such as 6-scanout bits being decoded to 64-RAM control signals with a different one of the 64-control signals going to each RAM tristate control signal input. Alternately, for a configuration having RAMs with more than 2-tristate control signals; such as 3-tristate control signals; a memory architecture that may be termed a multi-dimensional scanout arrangement; such as a 3D scanout arrangement; can be implemented with multiple scanout signals to each RAM; such as 3-scanout signals to each RAM. For example, the scanout portion of the address word can be divided into 3-groups of scanout signals, similar to the 2-groups of scanout signals for the arrangement discussed with reference to FIGS. 6E to 6N, and 1-signal from each of the 3-groups of scanout signals can be applied to a different one of the 3-tristate control inputs to the RAM for what may be considered to be a 3D-scanout control arrangement.

The memory configuration of the present invention has been discussed for an arrangement that applies the same re-addressing portion of the address word to all RAMs. Alternately, the re-addressing portion of the address word can be partitioned to different RAMs; such as with decoding of a portion of the address and selecting blocks of RAMs with the decoded signals, such as to the chip select pin of the RAMs.

The multi-dimensional memory addressing arrangement discussed herein has been illustrated with reference to RAMs having 2-tristate control pins. Such multi-dimensional addressing can be implemented with a memory having a single tristate control pin, as discussed above, with digital logic to convert the single tristate control pin to a multi-dimensional scanout addressing arrangement. For example, the single tristate control pin, if implemented in complement logic form for selecting with a complement signal, can be accessed with a 2-dimensional scanout arrangement by NANDing the 2-scanout address signals, such as the row select signal and the column select signal, with a NAND-gate to control the single tristate pin of the RAM. Similarly, multiple dimensional scanout control signals can be combined with logic external to the RAM to adapt the external scanout control signals to the particular capabilities of the RAM. For example, a 6-dimensional scanout arrangement can be adapted for a 3-dimensional tristate controlled RAM by combining the 6-dimensional scanout signals into pairs processed with two input NAND-gates to control the 3-tristate pins. Alternately, this 6-dimensional scanout arrangement can be adapted for a 2-dimensional tristate controlled RAM by combining the 6-dimensional scanout signals into groups of 3-signals processed with 3-input NAND-gates to control the 2-tristate pins.

The memory configuration of the present invention has been discussed for an arrangement that pre-buses the data lines of 16-RAMs into a pre-databus and then further buses the 16-RAM pre-bused signals together onto a system databus. Other partitioning of bused data signals can be provided. For example, all data signals can be bused together onto the system databus without the intervening pre-busing of the 16-RAM data outputs. Alternately, other combinations of RAMs than 16-RAMs can have the data lines pre-bused, such as pre-busing of the data lines of 8-RAMs together.

Memory Addressing

Introduction

Memory addressing can be performed in various ways. A new and novel memory addressing invention using memory scanout and memory re-addressing will now be is discussed in greater detail.

Memory addressing, such as addressing Toshiba TC514256P DRAMs, is conventionally implemented with a combination of a RAS (row) memory operation followed by a CAS (column) memory operation. See the MOS MEMORY PRODUCTS DATA BOOK by Toshiba.

Various examples are provided herein in the form of sync pulse related memory re-addressing. For simplicity of discussion; an interlaced scan configuration will be discussed, such as having a 17-ms field sync period, a 34-ms frame sync period, and a 64-us line sync period. Other scan configurations can also be provided; such as a progressive scan configuration having a 17-ms frame sync period and a 32-us line sync period.

Various memory addressing configurations are discussed below. Memory re-addressing is discussed in the context of detecting a suitable time; such as a time available period (i.e.; a horizontal sync pulse period or a vertical sync period in a display system, a suitable instruction execution period in a computer, etc) or a cycle stealing condition (i.e.; an overflow condition) or other condition and invoking memory re-addressing in response to this detection.

Various implementations of memory refreshing are discussed herein, such as time available memory refreshing and cycle stealing memory refreshing; which may also be used to implement memory re-addressing. For example; a memory re-addressing operation can often be invoked concurrently with a memory refresh operation because the memory-related processing is often not being performed during a memory refresh operation. Alternately; memory re-addressing operations and memory refresh operations can be invoked separately. Other memory re-addressing configurations can also be implemented.

The memory addressing configuration that uses a memory re-addressing detector to detect a suitable memory re-addressing period and that invokes a memory re-addressing operation in response thereto may be considered to be an adaptive memory re-addressing configuration. This is because it adapts to the operations of the memory to provide memory re-addressing operations rather than having a fixed memory re-addressing cycle (such as re-addressing for every memory read or for every write cycle). Such an adaptive memory arrangement can result in advantages, such as significantly increased performance.

Scanout And Re-addressing Characterization

Re-addressing and scanout in accordance with the present invention will now be discussed. Re-addressing is performed by addressing the array of memory locations in a memory element (i.e., in a DRAM chip or plurality of memory chips) to access the addressed data (i.e., a byte or a word) from the array of memory locations. This addressing or re-addressing is a relatively slow operation, such as due to propagation delays of the address signals through the memory array to select the data to be accessed. The addressed data that is accessed from the memory is often held stable for outputting in various configurations. In one configuration, the accessed data is held stable at the output of the memory by the address being held stable at the input to the memory. In another configuration, the accessed data is held stable at the output of the memory by the accessed data being loaded into an output register. In yet another configuration, the accessed data is held stable at the output of the memory by the sense amplifiers. Other configurations for holding the accessed data stable can also be provided.

Memory elements, such as RAMs, often have selection circuits in the output of the element, such as to select all of the output data being held stable or to select some of the output data being held stable. For example, the Mitsubishi RAMs discussed herein access 8-bits at a time and the selection circuit, the chip select or output enable circuit G*, selects all 8-bits for outputting. Alternately, the Toshiba DRAMs discussed herein access 256-columns of 4-bits each (1-million bits) at a time and the selection circuit, the CAS column address selects one of the 256-column 4-bit nibbles for outputting. In addition, control of the output enable OE* signal to the OE* circuit or gating of the CAS* signal to the CAS* circuit can provide a chip select function. Because the data being held stable at the output has already been accessed, gating of this data; such as with a CAS column address, a chip select signal, or an output enable signal; is a relatively high speed operation and is herein characterized as a scanout operation. For simplicity of discussion, scanout operations controlled with external decoding and selection circuits, such as 74LS138 decoders (i.e., FIG. 6F), are herein called external scanout operations and scanout operations controlled with internal decoding and selection circuits, such as CAS column addressing (i.e., FIGS. 4F to 4K), are herein called internal scanout operations. As further discussed herein, internal scanout operations and external scanout operations are compatible therebetween and can be used in combination, such as discussed with reference to FIGS. 4H to 4K herein.

In view of the above, the accessing of data from a memory array (addressing or re-addressing) is a relatively slow operation and gating out of already accessed data from a memory output circuit (scanout) is a relatively fast operation. Hence, in various configurations discussed herein; memory re-addressing operations may be minimized and scanout operations may be maximized.

DRAM systems, such as implemented in the IBM PCs, are conventionally implemented with a full cycle combined RAS and CAS cycle operation for reading and for writing and with a hardware bank or page select by combining the address MSBs to select the bank or page of DRAM chips.

The RAS and CAS cycle is conventionally implemented with a full cycle RAS row address operation followed by a CAS column address operation for each read or write cycle. The conventional full cycle RAS and CAS operations are significantly slower than scanout operations of the present invention. For example, in the example herein relative to a Toshiba TC514256P-10 DRAM; a conventional full cycle RAS and CAS memory operation may be nearly four-times slower than a CAS-related scanout operation in accordance with the present invention supra.

A bank or page select is conventionally implemented with an MSB address decoder for decoding MSBs to generate a chip select signal. The chip select signal is typically used for gating RAS or CAS signals to the chip RAS or CAS input. When this bank select or page select circuit is used in conjunction with conventional full cycle RAS and CAS operations, it is significantly slower than external scanout operations in accordance with the present invention. This is because external scanout operations are higher in speed then RAS row operations, about comparable in speed with CAS column address operations, and hence external scanout operations may be nearly four times faster than conventional full RAS and CAS operations supra. When external scanout is used in conjunction with internal scanout operations in accordance with the present invention, it extends the scanout address space into the spatial domain and hence permits more scanout operations before a RAS re-addressing operation is needed.

The conventional full RAS and CAS cycle and the conventional bank select or page select circuitry is illustrated with the IBM PC/XT DRAM architecture. This architecture teaches away from the re-addressing and scanout features of the present invention and also teaches away from the external scanout and internal scanout features of the present invention. Upgrades to the IBM PC to practice the features of the present invention is discussed herein.

The various features of the present invention need not be used in combination, but can be used separately from one another. For example; even though the re-addressing and scanout features of the present invention and the external scanout and internal scanout features of the present invention are significantly different from the full cycle RAS and CAS operations and the bank select or page select circuits in the IBM PC/XT, other features of the present invention are not inherently locked to the re-addressing and scanout features nor to the external scanout and internal scanout features of the present invention. These other features of the present invention can be used with conventional memory architectures; such as with a conventional full cycle RAS and CAS memory and with such as with a conventional bank select or page select memory. For example, the two dimensional (X-axis and Y-axis) address configuration is independent of whether the DRAMs are addressed with full cycle RAS and CAS operations, or bank select using address MSBs, or the re-addressing and scanout features of the present invention. Also, time available refreshing is independent of whether the DRAMs are addressed with RAS and CAS cycles, or bank select using address MSBs, or the re-addressing and scanout features of the present invention.

The external scanout features of the present invention may be characterized by selecting different memories (i.e., DRAM chips) to output data, such to output data to a data bus or to output data to dedicated data lines, without the need to RAS re-address the DRAM chips inbetween external scanout operations in the same bank or page of memory. For example, a plurality of DRAM chips can all be RAS row addressed (re-addressing) together and then can be sequentially chip selected (externally scanned out) in order to scan out the previously RAS row addressed data from the plurality of DRAM chips before having to be again re-addressed. In one configuration, a plurality of DRAM chips can all be simultaneously RAS row addressed and can then be sequentially chip selected in order to externally scan out the RAS row addressed data to a data bus from the plurality of DRAM chips before having to be again re-address. External scanout can be implemented by using the chip select to scanout the data without the need to re-address. The chip select can be implemented with an on-the-chip chip select circuit controlled by a chip select CS pin, or can be implemented by gating or steering the CAS signals to an on-the-chip CAS circuit controlled by a CAS pin, or can be implemented with an on-the-chip output enable circuit controlled by an output enable OE pin, or can be implemented with an off-the-chip chip select circuit, or can be implemented by gating or steering the CAS signals to an off-the-chip output enable circuit, or can be implemented by other circuits. Such chip selection is often significantly faster than a re-addressing operation and hence can result in significantly better performance than available with full cycle re-addressing operations.

For simplicity of discussion, the external scanout feature of the present invention may be shown herein having the external scanout-related DRAM chips all being RAS row addressed with the same row address. Alternate embodiments can be provided having the external scanout-related DRAM chips RAS loaded with different row addresses infra.

In alternate embodiments of the external scanout feature of the present invention, the external scanout-related DRAM chips need not all be RAS loaded with the same row address. For example, although it may be convenient to RAS-load all of the DRAM chips with the same address for reading and/or writing operations so that the information in the spatial domain stored in adjacent addresses (i.e., addresses having the same MSBs); other configurations can be implemented that achieve these features of the present invention without RAS-loading all of the DRAM chips with the same address for reading and/or writing operations. Various configurations of external scanout will now be discussed. The terminology "master" will be used, such as pertaining to non-adjacent re-addressing, to represent an address parameter where the bits have not as yet been complemented or otherwise adapted for non-adjacencies.

Non-adjacent re-addressing for external scanout will now be illustrated with a first example. If an MSB RAS-related address bit of a master address parameter is complemented for a first DRAM chip and is uncomplemented for a second DRAM chip, the RAS row address that is loaded into the first DRAM will be different from the RAS row address that is loaded into the second DRAM (by the complemented and uncomplemented bit, respectively) and hence the address space in the first DRAM chip will be different from the address in the second DRAM chip. The address spaces in the first DRAM chip and in the second DRAM chip have correspondence with the master address, where the scanout and re-addressing feature of the present invention can be utilized in such a configuration. For simplicity of discussion, complementing and noncomplementing is discussed for a single bit of the MSB RAS-related address bits. Multiple MSB RAS-related address bits can be complemented and uncomplemented in various combinations between a plurality of DRAM chips with consistent results.

Non-adjacent re-addressing for external scanout will now be illustrated with a second example. If MSB RAS-related address bits of a master address parameter are interchanged for a first DRAM chip and are either not interchanged or are interchanged differently for a second DRAM chip, the RAS row address that is loaded into the first DRAM chip will be different from the RAS row address that is loaded into the second DRAM chip (by the interchanged bits and either the non-interchanged bits or the different interchanged bits, respectively) and hence the address space in the first DRAM chip will be different from the address in the second DRAM chip. The address spaces in the first DRAM chip and in the second DRAM chip have correspondence with the master address, where the scanout and re-addressing feature of the present invention can be utilized in such a configuration. For simplicity of discussion, interchanging and either noninterchanging or different interchanging may be discussed for a single bit pair of the MSB RAS-related address bits. Multiple MSB RAS-related address bits can be interchanged and noninterchanged or interchanged differently in various combinations between a plurality of DRAM chips with consistent results.

Non-adjacent re-addressing for external scanout will now be illustrated with a third example. If two MSB RAS-related address bits of a master address-parameter are encoded in a first manner for a first DRAM chip and are either not encoded or are encoded in a second manner for a second DRAM chip, the RAS row address that is loaded into the first DRAM chip will be different from the RAS row address that is loaded into the second DRAM chip (by the first encoding and either the not encoding or the second encoding, respectively) and hence the address space in the first DRAM chip will be different from the address in the second DRAM chip. The address spaces in the first DRAM chip and in the second DRAM chip have correspondence with the master address, where the scanout and re-addressing feature of the present invention can be utilized in such a configuration. For simplicity of discussion, different methods of encoding and or not encoding for different DRAM chips may be discussed for a single bit pair of the MSB RAS-related address bits. Multiple MSB RAS-related address bits can be differently encoded in various combinations between a plurality of DRAM chips with consistent results.

DRAM chip selective re-addressing for external scanout will now be illustrated with a third example. If DRAM chips are selected for RAS re-addressing, such as by gating the RAS signals to different DRAM chips, then different DRAM chips can be re-addressed separately. Hence, the RAS row address that is loaded into the DRAM chips can be different from each other.

Many other configurations can be implemented; such as configurations having complementing and uncomplementing of master address MSBs, and/or having interchanging of master address MSBs, and/or having different encoding of master address MSBs, and/or having different decoding of master address MSBs before inputting to the DRAM chips, and/or having separate selection of different DRAM chips. These configurations can be used in combination; where for example complementing and uncomplementing of one or more master address MSBs, and/or interchanging or not interchanging of one pair or more master address MSBs, and/or encoding or either not encoding or encoding differently of master address MSBs, and/or decoding or either not decoding or encoding differently of master address MSBs, and/or having separate selection of different DRAM chips can be used in combinations therebetween with the same results.

In view of the above, it will become clear that the scanout and re-addressing features of the present invention can be practiced in various ways to achieve significant improvements in performance compared to conventional arrangements.

For simplicity of discussion and for consistency with the display system configuration previously discussed, memory operations may be disclosed herein in the form of memory accessing operations. However, a disclosure of memory accessing operations is herein intended to be illustrative of using the features of the present invention for writing operations, for read-modify-write operations, and for other memory operations. Further, the term memory scanout herein is intended to be equally applicable to write operations as well as to read operations; where memory scanout terminology is intended to illustrate or to encompass memory scanin terminology. One skilled in the art would readily be able to apply the disclosures of memory accessing operations to implement the features of the present invention for writing operations, for read-modify-write operations, and for other memory operations based upon the disclosures herein. For example, the differences between access (read) and write operations may be little more than controlling the WRITE signal, or other write related signal, to be high or low. Further, various write operations are disclosed herein, such as with reference to FIGS. 6E to 6N. Still further; write operations, read-modify-write operations, and other operations and the waveforms related thereto and the implementations thereof are well known in the art, such as disclosed in the Toshiba DATA BOOK referenced herein. Hence, one skilled in the art would readily be able to implement the teachings of the present invention with other memory operations, such as write operations and read-modify-write operations, from the teachings herein.

The term blocks of memory is used herein in conjunction with memory re-addressing and memory scanout operations. For example, a block of memory is the memory locations that are accessible with memory scanout operations without the need to invoke a memory re-addressing operation and a block of memory is changed with a re-addressing operation; providing scanout within a block of memory and re-addressing between blocks of memory.

External Scanout and Internal Scanout

External scanout and internal scanout can be implemented individually or in combination, such as to facilitate enhanced performance. The configurations discussed with reference to FIGS. 4H to 4K illustrate combinations of external scanout and internal scanout. The configurations discussed with reference to FIGS. 4F, 4G, 4L, and 7A to 7D illustrate internal scanout.

External scanout can be implemented by externally distributing the scanout address region, such as among multiple DRAM chips arrayed in a memory. Internal scanout can be implemented by internally distributing the scanout address region, such as among multiple bits arrayed in a register in the same DRAM chip. External scanout and internal scanout can be combined to generate a combination external scanout and internal scanout implementation by distributing the scanout address region among multiple memory elements arrayed in a memory and among multiple bits arrayed in each of the multiple memory elements. For example, external scanout and internal scanout can be combined by externally distributing the scanout address region among multiple DRAM chips arrayed in a memory and by internally distributing the scanout address region among multiple bits arrayed in a register in each of the multiple DRAM chips.

Detector Circuits

Introduction

Various detector circuits can be implemented to provide a control signal for controlling memory operations; such as re-addressing, scanout, and refreshing operations in accordance with the present invention. Detectors for detecting a memory re-address condition, for detecting a memory scanout condition, for detecting a memory refresh condition, and for detecting other memory conditions can be implemented from the teachings herein. Various detector circuits disclosed herein may be use in the configurations shown in FIGS. 4B and 4C. For example, overflow detectors are described with reference to FIG. 6C for controlling memory re-addressing and overflow detectors, comparitor detectors, anticipatory detectors, modal detectors, time available detectors, and refresh detectors are disclosed herein.

Memory operations can be controlled in response to memory detector circuitry for generating a detector signal in response to detecting a memory condition. Memory operation invoking circuitry; also called memory operation controlling, commanding, execution, or performing circuitry; controls the appropriate memory operation in response to the detector signals. For simplicity of discussion; memory detectors and memory operation invoking circuitry may be disclosed in the context of a memory detector; where the memory operation invoking circuitry may be implicit in the memory detector circuitry discussion. For example, the overflow detector discussed with reference to FIG. 6C has the memory operation invoking circuitry contained therewith, such as in the time delay circuitry associated with flip-flops K1 and K2 and the clock gating logic U12A-6 and U12A-8 which facilitates re-addressing operations.

For simplicity of discussion, memory re-addressing and memory scanout detectors may be discussed in the configuration of monitoring MSBs of an address register and generating a detector signal when the MSBs of the address register change. Alternately, other memory re-addressing and scanout detectors can be implemented; including an anticipatory detector for memory re-addressing and scanout that need not monitor address MSBs, a modal detector for memory re-addressing and scanout that need not monitor address MSBs, and a time available detector for memory re-addressing and scanout that need not monitor address MSBs infra. Other memory re-addressing and scanout detectors can also be implemented.

It is herein intended that various detectors can be used in combination. For example, address detectors and refresh detectors can be used in combination. Also, a modal detector can be used to invoke re-addressing for a mode change and an overflow detector or a comparitor detector or a time available detector can be used to invoke re-addressing for a change in the address MSBs without a mode change. Also, in a display configuration or a television configuration; a modal detector can be used to invoke re-addressing for an image change and an overflow detector or a comparitor detector or a time available detector can be used to invoke re-addressing for a memory block change without an image change. Also, in a microprocessor configuration; a modal detector can be used to invoke re-addressing for execution of a transfer instruction and an overflow detector or a comparitor detector or a time available detector can be used to invoke re-addressing for a block change without execution of a transfer instruction. Also, in an array processor configuration; a modal detector can be used to invoke re-addressing for an array change and an overflow detector or a comparitor detector or a time available detector can be used to invoke re-addressing for a memory block change without an array change. Also, in a filter processor configuration; a modal detector can be used to invoke re-addressing for a filter reference change and an overflow detector or a comparitor detector or a time available detector can be used to invoke re-addressing for a memory block change without a filter reference change. Also, in a signal processor configuration; a modal detector can be used to invoke re-addressing for a signal change and an overflow detector or a comparitor detector or a time available detector can be used to invoke re-addressing for a memory block change without a signal change. Also, in an artificial intelligence processor configuration; a modal detector can be used to invoke re-addressing for an artificial intelligence inference change and an overflow detector or a comparitor detector or a time available detector can be used to invoke re-addressing for a memory block change without an artificial intelligence inference change.

A memory re-addressing detector can be implemented with a combination of various memory re-addressing detector circuits, such as the combination of a time available memory re-addressing detector circuit and such as a non-time available memory re-addressing detector circuit (i.e., an overflow memory re-addressing detector circuit). In such a combination detector circuit, the time available detector circuit can initiate memory re-addressing operations and, when the time available detector circuit terminates the time available period, a non-time available detector circuit (i.e., an overflow detector circuit) can delay or disable processor operations to permit any memory re-addressing operation that is in process when the time available detector terminates the time available period to complete the memory re-addressing operation.

A detector can be implemented as a combination of detectors and memory operation invoking circuitry can be implemented to complete an invoked operation, as will now be illustrated with an example discussed with reference to FIG. 6W. In this example; signal F4* represents a time available condition, such as a RUN signal or a sync pulse signal. The time available condition can be detected with a detector circuit for invoking a memory operation, such as a memory re-addressing operation and/or a memory refresh operation. Detector signal F4* is shown generating signals U14A-6 and U21E-8 to invoke a memory re-addressing operation and can also be used to invoke a memory refresh operation. Once a memory operation is invoked with flip-flop K1; the memory operation continues until flip-flops K2 and K3 complete the cycle. If the F4* detector signal period ends before the memory operation cycle has been completed, the memory operation will still be completed because flip-flops K1, K2, and K3 store the detector signal until the cycle is completed. Other circuits that insure completion of a memory re-addressing operation or a memory refresh operation can also be implemented.

The memory refresh detector circuits can be discussed herein for detecting a condition that is suitable for invoking a plurality of memory refresh operations for each detection. However, it may not be necessary or it may not be desirable to invoke a plurality of re-addressing operations during the same condition with such detectors. This is because the re-addressing address might not change during a time available period having a duration sufficient for multiple memory refresh operations. Hence, it may be desirable to limit memory re-addressing to a single re-addressing operation in a time available condition envelope. This can be implemented in various ways; such as by processing the detector signal with a one-shot circuit as discussed with reference to FIG. 6W relative to detector signal F2*.

Memory detectors may be discussed herein in various forms; such as overflow detectors, comparitor detectors, anticipatory detectors, modal detectors, time available detectors, and other detectors. However, a detector may fit several characterizations. For example, the RUN signal discussed with reference to FIG. 6A et seq herein may be used to implement an anticipatory detector, a modal detector, and a time available detector.

Overflow Detector Circuits overflow detector circuits are discussed with reference to FIG. 6C for detecting when the MSBs of an address have changed in order to control re-addressing. This can be implemented as an alternate to or in addition to comparitor detector circuits, anticipatory detector circuits, time available detector circuits, modal detector circuits, and other detector circuits. This overflow detector monitors the carry signal as being indicative of an overflow as a function of the sign of the address in the slope register. Other overflow detectors can be provided. For example, an overflow detector that determines an overflow as a function of both, the sign of the address in the address register and the sign of the parameter added to or subtracted from the address, can be implemented from the teachings herein.

When an overflow is detected, overflow detector output signal U21B-2 and U12A-6 command a lower clock rate re-addressing operation (FIG. 6C). If an overflow is not detected, overflow detector output signal U23C-10 and U12A-8 command a higher clock rate scanout operation (FIG. 6C).

Figure 4D:
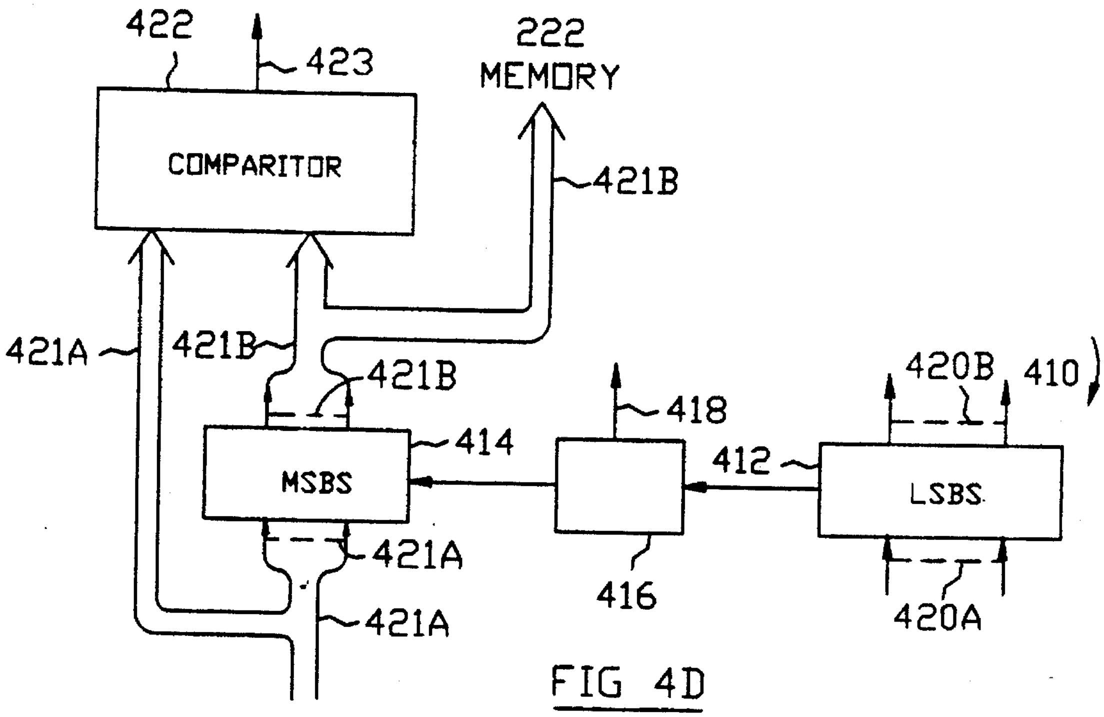

Overflow control signal generation will now be disclosed with reference to FIG. 4D. Address register 410 is composed of the least significant bits (LSBs) 412 and the most significant bits (MSBs) 414 connected by overflow logic 416 for generating overflow signal 418 in response to an overflow from the LSBs to the MSBs, as discussed with reference to FIG. 6C. The address stored in address register 410 can be changed in various ways; such as by adding a parameter 420A and/or 421A to the address stored in address register 410 and such as by loading an address 420A and/or 421A into address register 410.

An arrangement is disclosed with reference to FIG. 6C for generating a memory control signal to gate a clock by detecting an overflow of an address generator as being indicative of the need to re-address the memory. Such an arrangement is particularly appropriate to address counter type systems where an address counter advances toward an overflow condition and eventually overflows to change the more significant bits. The display processor disclosed with reference to FIGS. 6O to 6R is such an address counter system, thereby facilitating overflow detection to generate a memory control signal. Conventional computer systems have address counters or address counters, thereby facilitating overflow detection to generate a memory control signal.

A configuration that adds a parameter 420A and/or 421A into address register 410 will now be disclosed. For a configuration that adds a parameter 420A to the LSBs 412 of address register 410 but does not add a parameter 421A to the MSBs 412 of address register 410, the MSBs 414 of address register 410 are not changed if an overflow signal 418 is not generated and the MSBs 414 of address register 410 are changed if an overflow signal 418 is generated. This is in accordance with the overflow implementation shown in FIGS. 6C and 6O to 6R. For a configuration that adds a parameter 421A into the MSBs 414 of address register 410 in combination with adding a parameter 420A into the LSBs 414 of address register 410, the MSBs 414 of address register 410 are changed independent of whether an overflow signal 418 is generated. This is different from the overflow implementation shown in FIGS. 6C and 6O to 6R. For a configuration that adds a parameter 421A into the MSBs 414 of address register 410 without adding a parameter 420A into the LSBs 414 of address register 410, the MSBs 414 of address register 410 are changed but an overflow signal 418 is not generated. This also is different from the overflow implementation shown in FIGS. 6C and 6O to 6R. Hence, a configuration that adds a parameter into the MSBs 414 of address register 410 may need an implementation different from the overflow implementation shown in FIGS. 6C and 6O to 6R.

A configuration that loads an address 420A and/or 421A into address register 410 will now be discussed. For a configuration that loads an address 420A into the LSBs 412 of address register 410 but does not load an address 421A into the MSBs 414 of address register 410, the MSBs 414 of address register 410 are not changed and an overflow signal 418 is not generated. This is similar to the overflow implementation shown in FIGS. 6C and 6O to 6R. For a configuration that loads an address 421A into the MSBs 414 of address register 410 (either in combination with loading an address 420A into the LSBs 414 of address register 410 or without loading an address 420A into the LSBs 414 of address register 410), the MSBs 414 of address register 410 are changed but an overflow signal 418 is not generated. This is similar to the overflow implementation shown in FIGS. 6C and 6O to 6R. Hence, a configuration that loads an address 421A into the MSBs of address register 410 may need an implementation different from the previously disclosed overflow implementation.

In view of the above, overflow signal generation is particularly appropriate in configurations where the overflow bit position is more significant than the MSB position that is to be changed by the updating operations of the address counter so that the more significant bits are changed by an overflow from the less significant bits infra. This is the environment for the display processor disclosed with reference to FIGS. 6C and 6O to 6R because the slope parameter stored in the slope register, which was used to update the address register, is shown having a maximum magnitude that is less significant than the overflow magnitude. However, in other configurations, the MSBs 414 may be changed without generating an overflow signal 418 from the LSBs 412 supra. For example, in other configurations, the parameter added to address register 410 may have MSBs 421A that are more significant than the overflow bit position or the parameter loaded into address register 410 may load MSBs 421A that can change the MSBs 421A of address register 410 without generating an overflow signal 418. Also, in said display application, the more significant bits of the address register may be changed other than by an overflow from the less significant bits. For example, the slope parameter stored in the slope register can alternately be implemented to have a maximum magnitude that is more significant than the overflow magnitude and hence can change the more significant bits by a direct update of these more significant bits rather than by an overflow from the LSBs or in addition to an overflow from the LSBs.

Comparitor Detector Circuits

Comparitor detector circuits can be implemented as an alternate to or in addition to overflow detector circuits, anticipatory detector circuits, time available detector circuits, modal detector circuits, and other detector circuits. For example, in a comparitor detector configuration; a comparitor can be used to compare the prior MSBs and the next MSBs to detect a change in the MSBs of the address.

A comparitor detector arrangement is shown in FIG. 4D for use in conjunction with a memory address register; such as for implementation in a microprocessor, in a display processor, in a filter processor, in a database processor, in a cache memory processor, in an artificial intelligence processor, or in other processors. This configuration is particularly appropriate for implementation in close conjunction with the memory address register 410; such as on the same IC chip with the memory address register. In this configuration; comparitor 422 can be used to compare the prior MSBs, such as MSBs 421B stored in address register 410, and the next MSBs, such as MSBs 421A that will be clocked into the address register 410 on the next address register clock pulse, to detect a change in the MSBs 414 of the address stored in address register 410. If a difference is detected, comparitor detector output signal 423 can be used to invoke a slower re-addressing operation. If a difference is not detected, comparitor detector output signal 423 can be used to invoke a faster scanout operation.

Figure 4E:
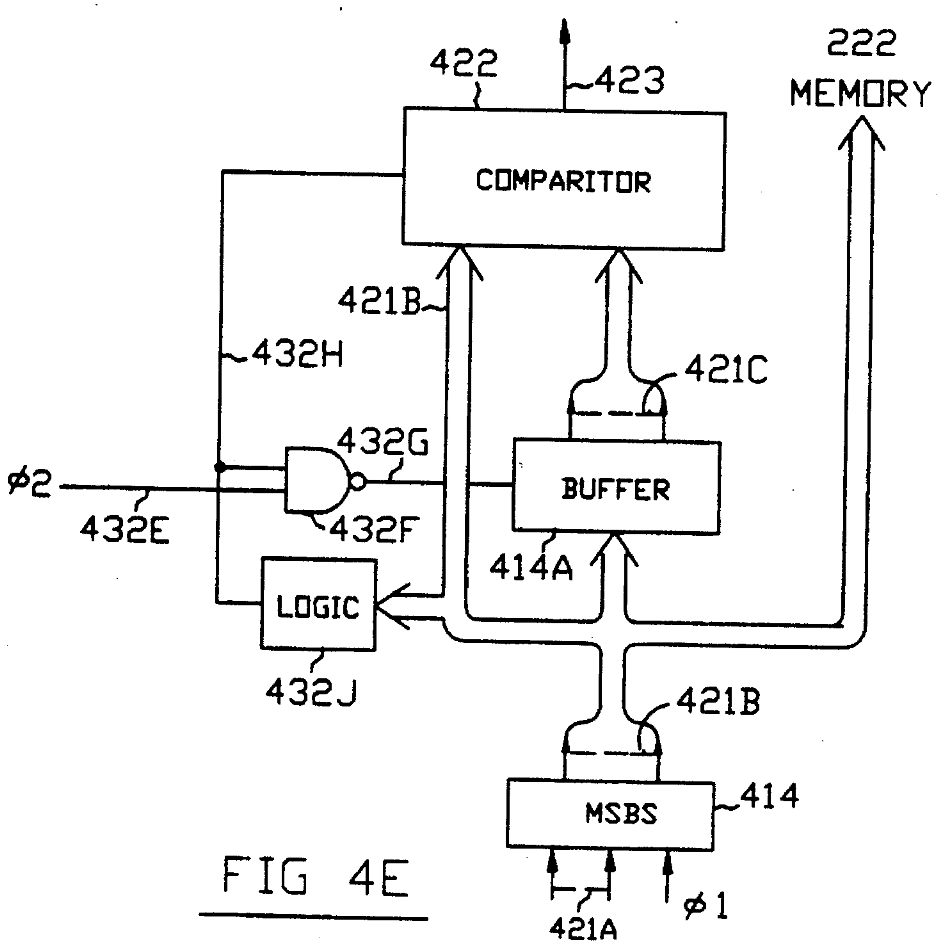

An alternate comparitor detector arrangement is shown in FIG. 4E for use in conjunction with a memory address register; such as for implementation in a microprocessor, in a display processor, in a filter processor, in a database processor, in a cache memory processor, in an artificial intelligence processor, or in other processors. This configuration is particularly appropriate for various memory implementations; such as for an off-the-chip detector that does not have access to all of the address signals and for a shared address register configuration.

A configuration that implements the detector external to the memory address register 410, such as off the IC chip that contains the memory address register, will now be discussed. The comparitor arrangement shown in FIG. 4E can be used with a processor already having an address register embedded therein, such as in an IC chip, and hence not being fully accessible for connection to the comparitor circuits. An existing microprocessor (i.e., FIG. 4E) can have MSB memory address signals 421B, which are output from MSB memory address register 414, available on the external address bus; but may not have MSB memory address signals 421A, which are input to MSB memory address register 414, available externally. This configuration (FIG. 4E) is particularly appropriate for updating an existing microprocessor that was not implemented with an address MSB change detector therein and which may have limited external access to the address register for implementing a FIG. 4D detector. In a limited accessibility case, an external MSB buffer register 414A can be implemented (in addition to the internal address register MSBs 414) to store the prior address MSBs (redundant with the address register MSBs 414), such as for implementation external to a microprocessor IC chip. In this configuration; comparitor 422 can be used to compare the prior MSBs, such as MSBs 421C stored in external buffer register 414A, and the next MSBs, such as MSBs 421B that will be clocked into the external MSB buffer register 414A, to detect a change in the MSBs 421B of the address stored in address register 410. If a difference is detected, comparitor detector output signal 423 can be used to invoke a slower re-addressing operation. If a difference is not detected, comparitor detector output signal 423 can be used to invoke a faster scanout operation.

A shared address register configuration, such as an address register configuration that shares the address register between RAM operations and non-RAM operations or between first RAM operations in a first RAM and second RAM operations in a second RAM, can use buffer 414A to store the RAM-related address MSBs while the address register 414 is being used to address other circuits. One configuration of such a comparitor arrangement is shown in FIG. 4E. For example, a microprocessor can have MSB memory address signals 421B, which are output from MSB memory address register 414, and loaded into buffer register 414A for temporary storage. This configuration (FIG. 4E) is particularly appropriate for storing the address MSBs from a prior operation in buffer 414A while the address register 414 is being used for addressing other circuits. In this configuration; comparitor 422 can be used to compare the prior MSBs and the next MSBs to detect a change in the MSBs 421 of the address stored in address register 410 supra and can also be used to buffer the address MSBs while the address register is being used to address other circuits, as discussed for a shared address register configuration below.

Various circuits can be used for loading the address MSBs 421B into external MSB buffer register 414A (FIG. 4E), such as a multiphase clock Ø1 and Ø2. In one configuration, the loading of the prior address MSBs 421B into buffer register 414A shortly follows Ø2. The loading of the MSBs 421A into the MSBs 414 of address register 410 under control of the Ø1 clock or otherwise changing of the MSBs 414 of address register 410 can precede the memory access operation. This facilitates generation of the control signal (i.e., comparitor signal 423) to initiate alternate memory operations, such as generating a re-addressing operation before accessing memory if the MSBs 421B have changed.

Various types of comparitors can be used. One common comparitor is a 74LS85 four bit comparitor having four A inputs to be compared with four B inputs and generating an output signal $O_{A=B}$ when the four A inputs are equal to the four B inputs. The four bit 74LS85 comparitor can be expanded to very large word sizes; as discussed in the Shottky TTL Data Book by Motorola Inc., such as at page 4-61.

In various configurations, such as a shared address register configuration; it may be desirable to control operation of buffer 414A and comparitor 422 with a control signal. For example, control signal 432H can be generated by logic 432J detecting whether address signals 421B are within the instant RAM address space or are outside of the instant RAM address space. Control signal 432H can be used to gate the Ø2 clock 432E with gate 432F, which is shown as a NAND gate for convenience of discussion, to generate gated Ø2 clock 432G to selectively control buffer register 414A. Also, control signal 432H can be used to control comparitor 422, such as to enable and disable comparitor signal 423 for enabling and disabling auxiliary memory operations. For example, in a 74LS85 four bit comparitor; the cascading input signals can be controlled to enable or disable the output signals.

Logic 432J can be implemented with conventional logic gates, such as And gates, OR gates, and NOT gates to generate address detector signal 432H to detect when the address-MSBs pertain to the instant RAM address space. If the instant RAM address space is continuous and can be represented by a simple combination of address signals and complements of address signals, such as with the top half of the memory address space being dedicated to the instant RAM; then a simple AND gate and inverter gates or their equivalents for ANDing together all of the address lines in complemented and non-complemented form may be sufficient to implement logic 432J. Alternately, if the RAM address space is not continuous or is otherwise not a simple binary combination of address bits; then various AND gates, OR gates and inverter gates or their equivalents may be needed to implement logic 432J.

In certain configurations there may be advantages to implementing a FIG. 4D type comparitor compared to a FIG. 4E type comparator. For example, placing the comparitor detector circuit on the processor IC chip and hence having access to internal signals rather than placing it on another IC chip and hence not having access to internal signals may include the advantages of a) reducing the IC chip count, b) reducing external IC chip interconnections, c) reducing circuitry, and d) increasing performance.

For example, placing detector circuitry on the IC processor chip should reduce additional IC chips needed to contain external detector circuitry and the related external interconnections. Further, there may be a reduction in the total amount of circuitry by eliminating the external buffer register 414A, shown in the FIG. 4E configuration, by using a FIG. 4D configuration. Also, the FIG. 4D type comparitor performs what may be called an early comparison before the address MSBs 421B are changed, which may have advantages in certain applications, while the FIG. 4E type comparitor performs what may be called a late comparison after the address MSBs 421B have changed. Such an early comparison can reduce the effect of propagation delays by providing an early initiation of propagation delays for improved performance. For example; in the FIG. 4D configuration, the propagation delay of address signal 421A through comparitor 422 can precede the clocking of register 414, while in the FIG. 4E configuration, the propagation delay of address signal 421B through comparitor 422 cannot precede the clocking of register 414.

Alternately, in other configurations there may be advantages to implementing a FIG. 4E type comparitor compared to a FIG. 4D type comparitor. One such configuration may be a shared address register configuration, such as discussed in the shared address register section herein. Further, some of the disadvantages of placing the detector circuit off-the-chip supra may not be pertinent to a particular configuration. For example, an off-the-chip comparitor detector may be implemented on another IC chip together with other circuitry and hence an off-the-chip detector may not involve an extra IC chip or extra circuitry; an additional address buffer register can be implemented for other reasons and hence an off-the-chip detector may not involve extra circuitry; and memory cycles may follow sufficiently later than the clocking of the internal address register that the required propagation delay time is readily available for an off-the-chip detector configuration and hence an off-the-chip detector may not reduce performance.

A comparitor detector can be used in the circuit of FIG. 6C in place of the overflow detector, such as by replacing overflow detector signal U13A-6 to U23C-11 with the comparitor detector output signal 423. Minor logical considerations may be necessary; such as inserting of an inverter for polarity, inserting of a buffer gate for fanout, use of higher speed gates for propagation delay reduction, and other considerations. For example, overflow detector signal U13A-6 generates a negative voltage logic (NVL) signal and inverter U14A-6 converts the NVL signal to a positive voltage logic (PVL) signal.

Anticipatory Detector Circuits

Anticipatory detector circuits can be implemented as an alternate to or in addition to overflow detector circuits, comparitor detector circuits, time available detector circuits, modal detector circuits, and other detector circuits. For example, in an anticipatory detector configuration; a re-addressing operation may not be actually detected but may be anticipated, such as by detecting a condition that anticipates the need for a re-addressing operation.

An anticipatory detector can be implemented with an overflow circuit that detects a future need for a re-addressing operation, rather than an immediate need for a re-addressing operation; such as detecting the need for a re-addressing operation that will be needed a propagation delay later, or a clock pulse later, or a line sync pulse later, or a memory access later, etc. For example, an anticipatory overflow detector can be implemented to anticipate an overflow by logically testing prior stages in an address adder, such as with the carry lookahead implemented in the address adder shown in FIGS. 6O to 6R. Said 74F283 adder stages incorporate a four bit fast carry lookahead. Other carry look-ahead circuits are well known. A separate carry lookahead circuit, such as implemented with a 74LS182 circuit, can be used for detection of a re-addressing condition, such as to anticipate an overflow to the address MSBs before the overflow to the address MSBs actually occurs. Alternately, a shared carry lookahead circuit can be implemented for both, detection of a re-addressing condition and generating a carry to the MSBs of the address register, such as disclosed with the carry lookahead circuit in the 74F283 adder circuits shown in FIGS. 6O to 6R.

Another type of anticipatory detector can be implemented by monitoring signals that are known to precede the need for a re-addressing operation, such as by designing an anticipatory detector circuit to generate such an anticipatory signal or by identifying such a signal that has been generated for other purposes and is available as an anticipatory detector signal. For example, the RUN signal U13A-8 is generated to enable gating of clock signals with gates U12A-6 and U12A-8; where the RUN signal going high is anticipatory of the start of a run mode of operation and hence is anticipatory of the need for a re-addressing operation associated with the start of a run mode. Hence, certain modal signals described herein for invoking a modal detector can also implement an anticipatory modal detector.

A stored program computer can implement anticipatory memory addressing operations, such as implementing memory re-addressing in response to conditions that are anticipated to invoke operations needing re-addressing. For example, an instruction detector can be used to detect instructions that anticipate re-addressing, such as long branch or long jump instructions. Signals associated with the start of execution of such instructions provide the anticipatory signals to invoke a re-addressing operation before the address counter is loaded with the new address and hence provide anticipatory control of re-addressing operations.

A processor having micro-operations; such as a state machine, a micro-programmable processor, or a processor having micro-operations; can implement anticipatory memory addressing operations, such as implementing memory re-addressing in response to states, micro-operations, or micro-instructions that are anticipated to invoke operations needing re-addressing. For example, a micro-instruction detector can be used to detect micro-instructions that anticipate re-addressing, such as branch or jump micro-instructions. Signals associated with the execution of such micro-instructions provide the anticipatory signals to invoke a re-addressing operation before the address counter is loaded with the new address and hence provide anticipatory control of re-addressing operations.

Various stored program computer configurations will now be discussed with reference to the Motorola 68HC11 single chip microcomputer; particularly with reference to Section-5 of the Motorola 68HC11 Programmer's Reference Manual; and with reference to the discussion in conjunction with time available detector circuits herein. An instruction execution cycle having time available is indicated with the symbol $FFFF in the "Address Bus" column and with the term "Irrelevant Data" in the "Data Bus" column. Each instruction first accesses the opcode, decodes the opcode thereby identifying the instruction to be executed, and then proceeds with the instruction execution including any time available cycles. The time available cycles always follow the opcode access and decoding for an instruction. Hence, time available cycles are implicitly known or implicitly anticipated one or more cycles before a time available cycle is invoked. Hence, the micro-operations in the 68HC11 can provide anticipatory micro-operation signals for memory re-addressing and memory refreshing.

An anticipatory detector arrangement can be used for implementation in a microprocessor, in a display processor, in a filter processor, in a database processor, in a cache memory processor, in an artificial intelligence processor, or in other processors. It is particularly appropriate for implementation in high speed memory applications because anticipatory detection can be faster than actual detection.

Modal Detector Circuits

Memory re-addressing and memory scanout detector circuits can be implemented by detecting changes in modes of operation that imply re-addressing. For example, a system that operates in a single block of memory with memory scanout operations in a particular mode and that operates in different blocks of memory for different modes can invoke re-addressing operations in response to detection of a mode change.

Modal detector circuits can be implemented as an alternate to or in addition to overflow detector circuits, comparitor detector circuits, anticipatory detector circuits, time available detector circuits, and other detector circuits. For example, in a modal detector configuration, a modal signal can be used to invoke re-addressing as being implicit in a mode change condition.

Mode changes often imply changes in operation. For example, in a display system, a change from the field sync pulse being high (i.e., field processing without display operations) to the field sync pulse being low (i.e., display operations without field processing) or alternately a change from the field sync pulse being low (i.e., display operations without field processing) to the field sync pulse being high (i.e., field processing without display operations) can involve a re-addressing operation implicit in the change in the modes of operation. Similarly, in a display system, a change from the line sync pulse being high (i.e., line processing without display operations) to the line sync pulse being low (i.e., display operations without line processing) or alternately a change from the line sync pulse being low (i.e., display operations without line processing) to the line sync pulse being high (i.e., line processing without display operations) can involve a re-addressing operation implicit in the change in the modes of operation. Also, a change from a run mode to a standby mode or alternately a change from a standby mode to a run mode can involve a re-addressing operation implicit in the change in the modes of operation. Also, a power turn on condition or a reset condition can involve a re-addressing operation implicit in the startup or initialization processing that is to be performed.

In various configurations, a mode change can imply a change in the memory address MSBs and hence possible, or probable, or certain re-addressing operation. Certain-type modal changes typically can be used to invoke re-addressing. Probable-type or possible-type modal changes can also be used to invoke re-addressing. For example, in a display system having a plurality of images each being stored in a different one or ones of the blocks of memory; an image change can imply certain re-addressing. Also, in a display system having a plurality of images being stored in a plurality of the blocks of memory but having at least portions of different images stored in the same block of memory; an image change can imply probable or possible re-addressing. Also, in a television system having a plurality of scanlines each being stored in a different one or ones of the blocks of memory; a scanline change can imply certain re-addressing. Also, in a television system having a plurality of scanlines being stored in a plurality of the blocks of memory but having at least portions of different scanlines stored in the same block of memory; an scanline change can imply probable or possible re-addressing. Also, in a microprocessor system having a plurality of program routines each being stored in a different one or ones of-the blocks of memory; transfer from one program routine to another program routine can imply certain re-addressing. Also, in a microprocessor system having a plurality of program routines being stored in a plurality of the blocks of memory but having at least portions of different program routines stored in the same block of memory; transfer from one program routine to another program routine can imply probable or possible re-addressing. Also, in an array processor system having a plurality of arrays each being stored in a different one or ones of the blocks of memory; an array change can imply certain re-addressing. Also, in an array processor system having a plurality of arrays being stored in a plurality of the blocks of memory but having at least portions of different arrays stored in the same block of memory; an array change can imply probable or possible re-addressing. Also, in a database system having a plurality of database pages each being stored in a different one or ones of the blocks of memory; a database page change can imply certain re-addressing. Also, in a database system having a plurality of database pages being stored in a plurality of the blocks of memory but having at least portions of different database pages stored in the same block of memory; a database page change can imply probable or possible re-addressing. Also, in a filter system having a plurality of input signals or reference signals each being stored in a different one or ones of the blocks of memory; a signal change or a reference change can imply certain re-addressing. Also, in a filter processor system having a plurality of signals or references being stored in a plurality of the blocks of memory but having at least portions of different signals or references stored in the same block of memory; a signal or reference change can imply probable or possible re-addressing. Also, in a signal processor system having a plurality of signals each being stored in a different one or ones of the blocks of memory; a signal change can imply certain re-addressing. Also, in a signal processor system having a plurality of signals being stored in a plurality of the blocks of memory but having at least portions of different signals stored in the same block of memory; a signal change can imply probable or possible re-addressing. Also, in a DMA system having information being stored in different blocks of memory; a new DMA transfer being invoked can imply certain re-addressing. Also, in a DMA system having information being stored in a plurality of the blocks of memory but having at least portions of the information stored in the same block of memory; a DMA transfer being invoked can imply probable or possible re-addressing. Also, in an artificial intelligence system having a plurality of inferences each being stored in a different one or ones of the blocks of memory; an inference change can imply certain re-addressing. Also, in a cache memory system having a plurality of pages each being stored in a different one or ones of the blocks of memory; a page change can imply certain re-addressing.

Particular implementations of modal detectors will now be discussed for a display configuration with reference to FIG. 6W. These FIG. 6W discussions are illustrative of many other types of modal detectors and are illustrative of many other applications of modal detectors (i.e.; display application, television application, stored program processor application, array processor application, signal processor application, filter processor application, DMA application, cache memory application, artificial intelligence application, and database processor application).

Figure 6E:
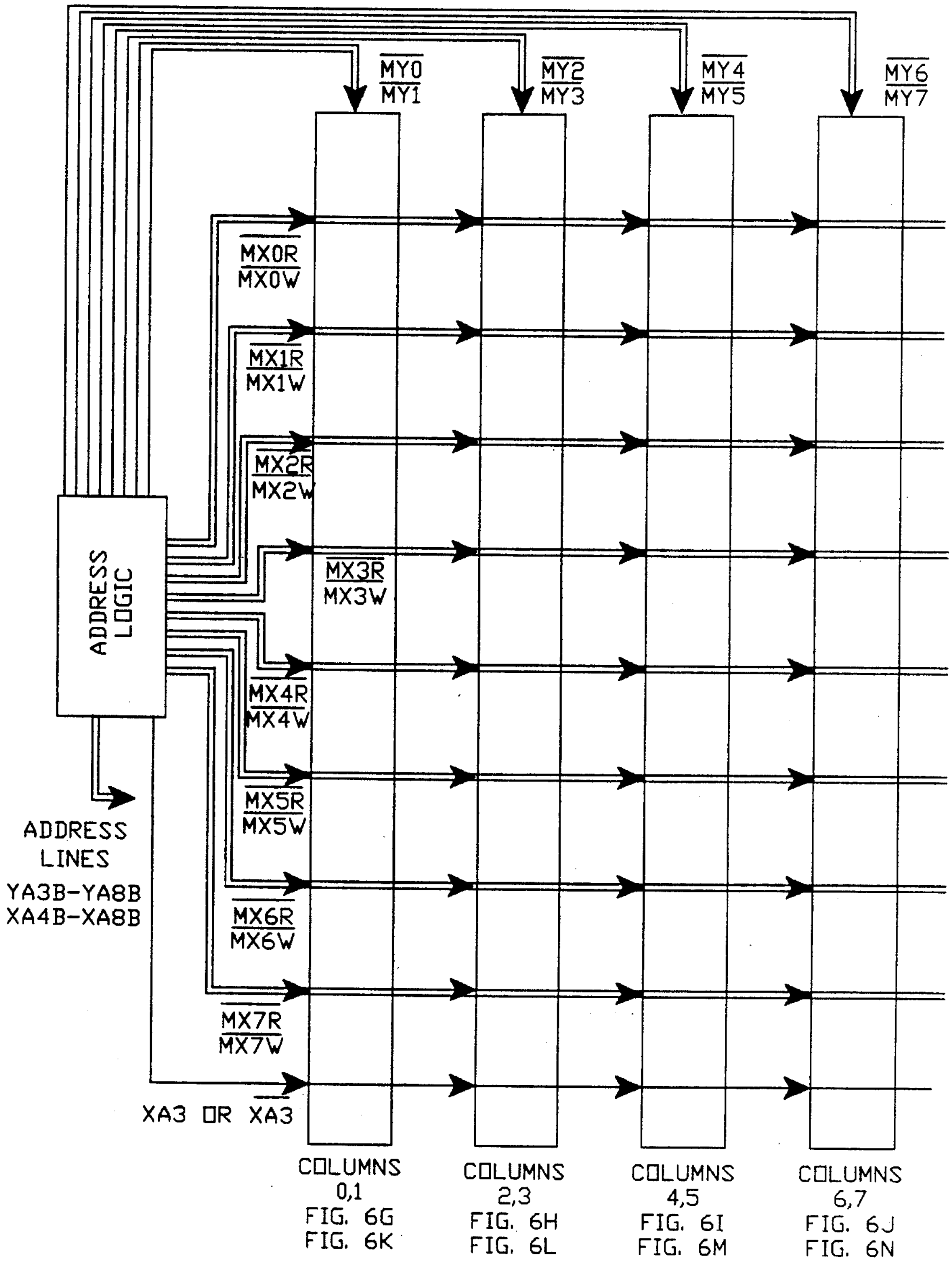
FIG. 6E is a block diagram of a configuration for implementing the memory of the present invention.
Figure 6F:
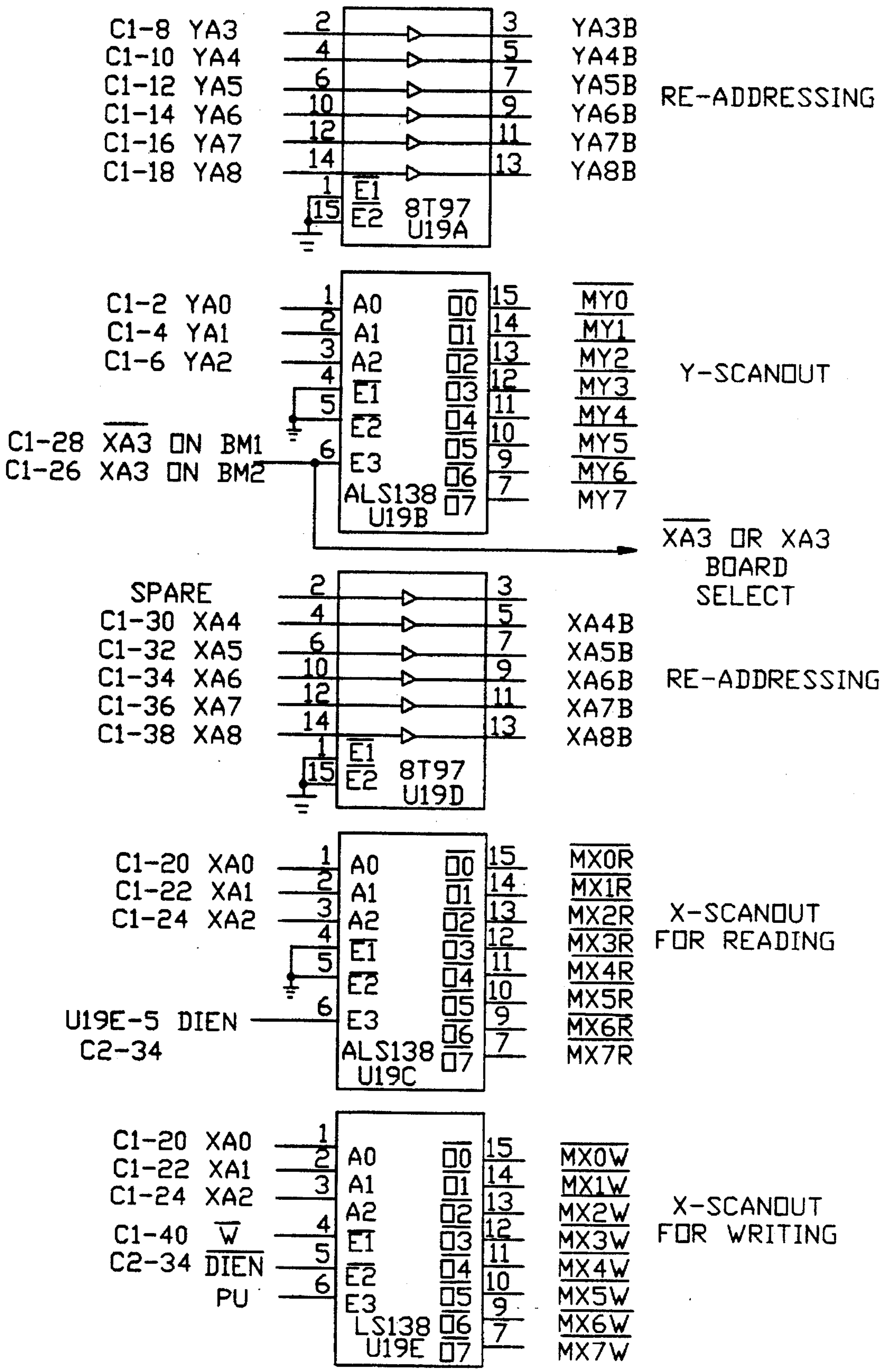
FIG. 6F is a detailed schematic representation of logic for addressing and scanning-out memory information in accordance with the memory of FIG. 6E.
Figure 6G:
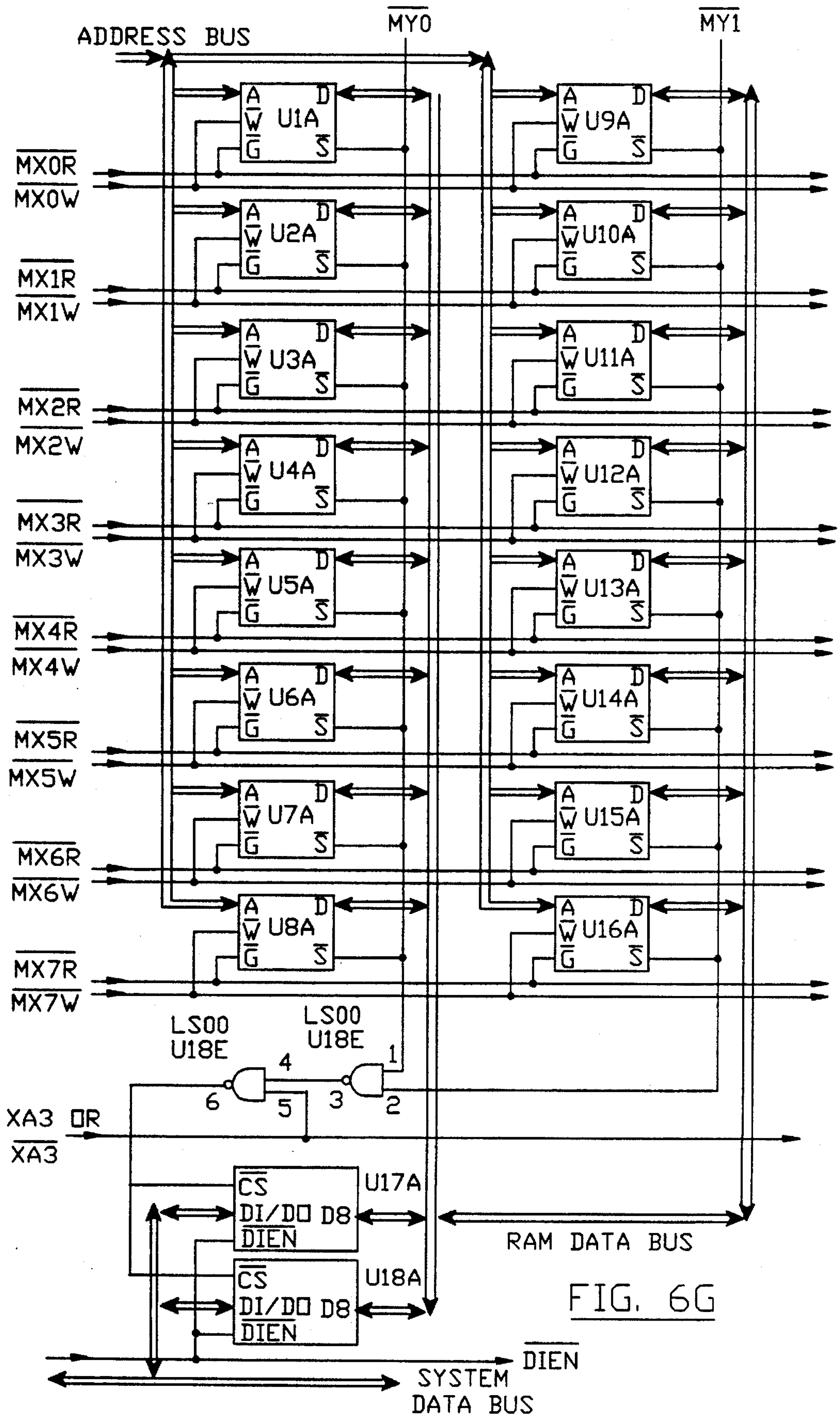
FIGS. 6G, 6H, 6I, and 6J are detailed block diagram representations in accordance with the memory of FIG. 6E.
Figure 6H:
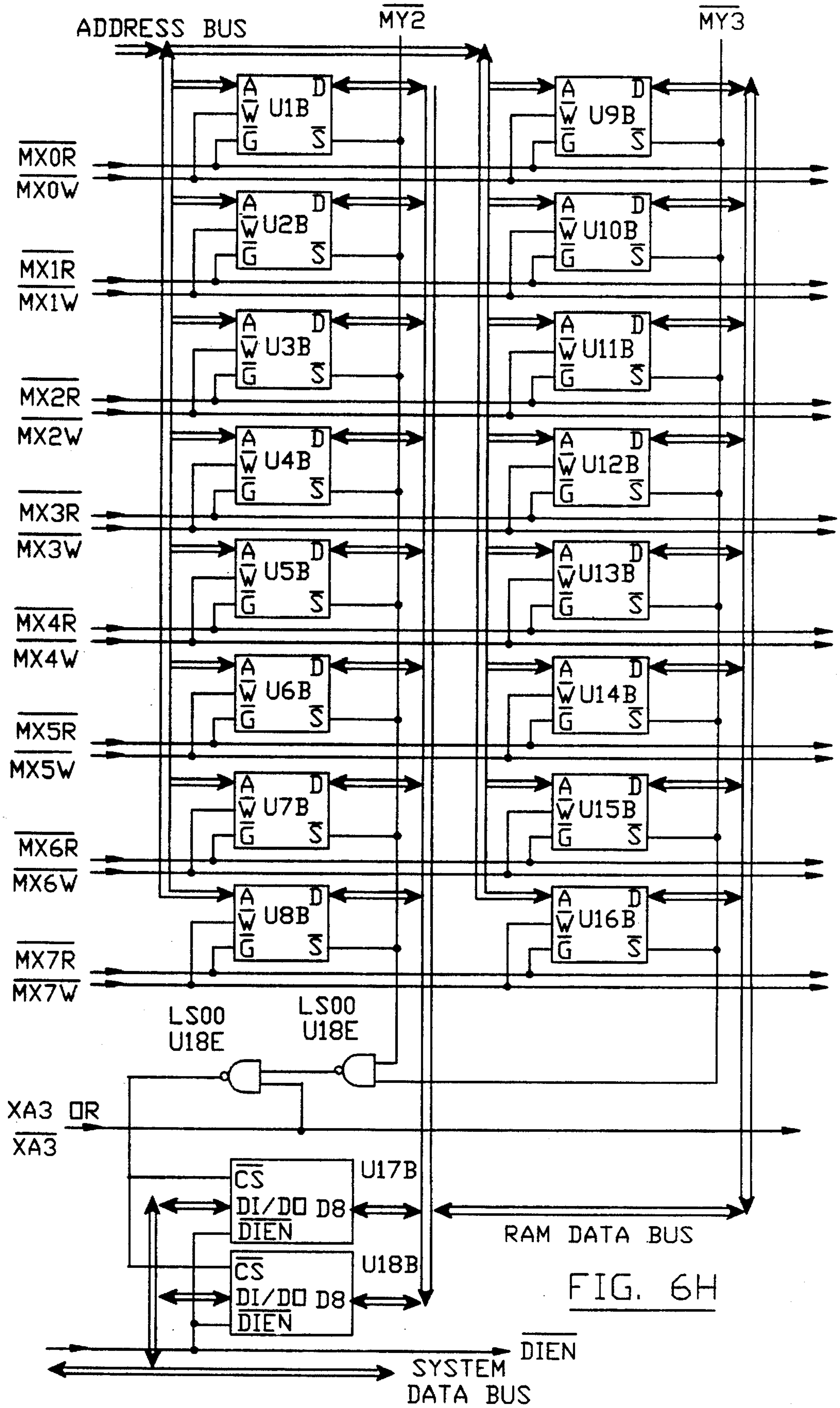
Figure 6I:
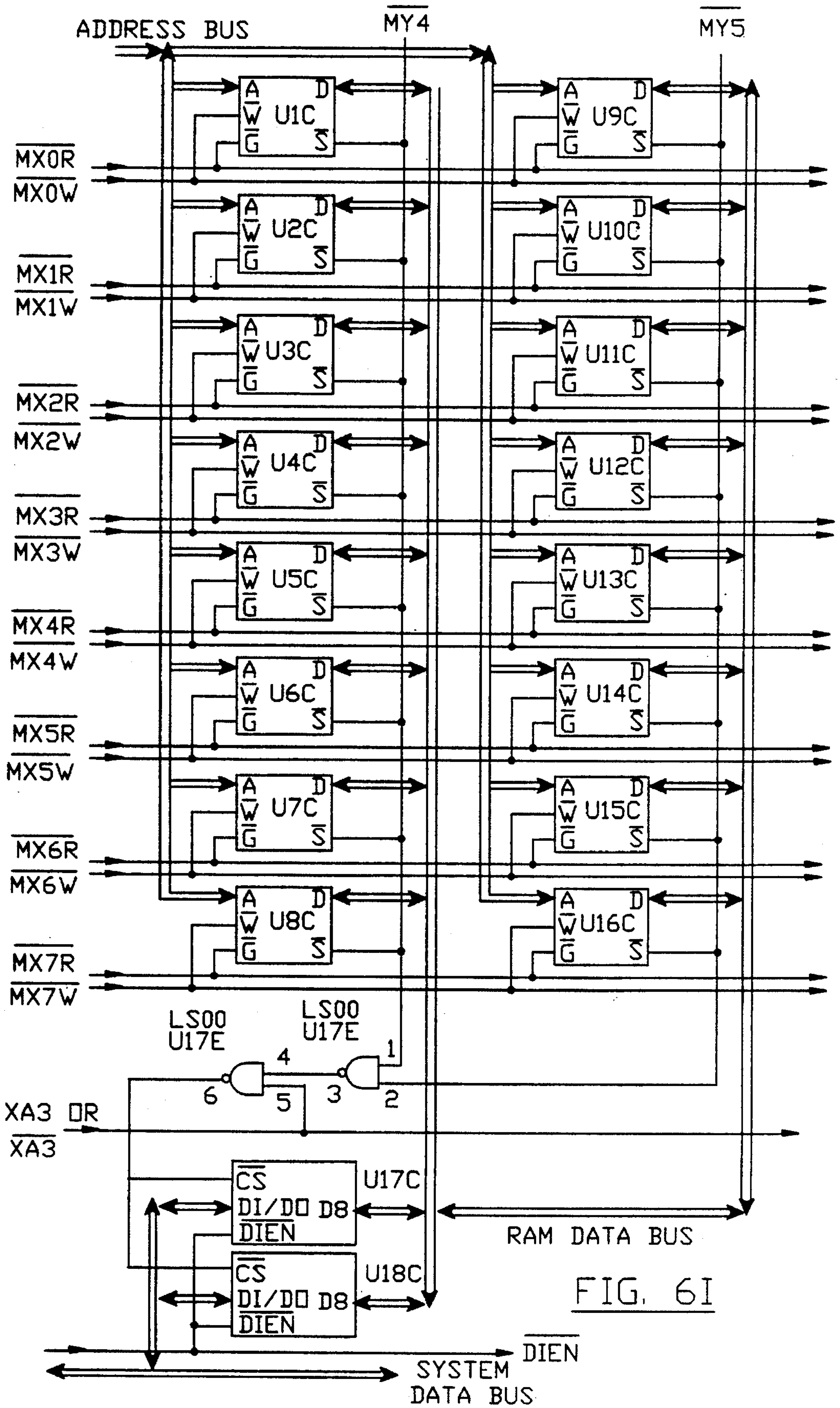
Figure 6J:
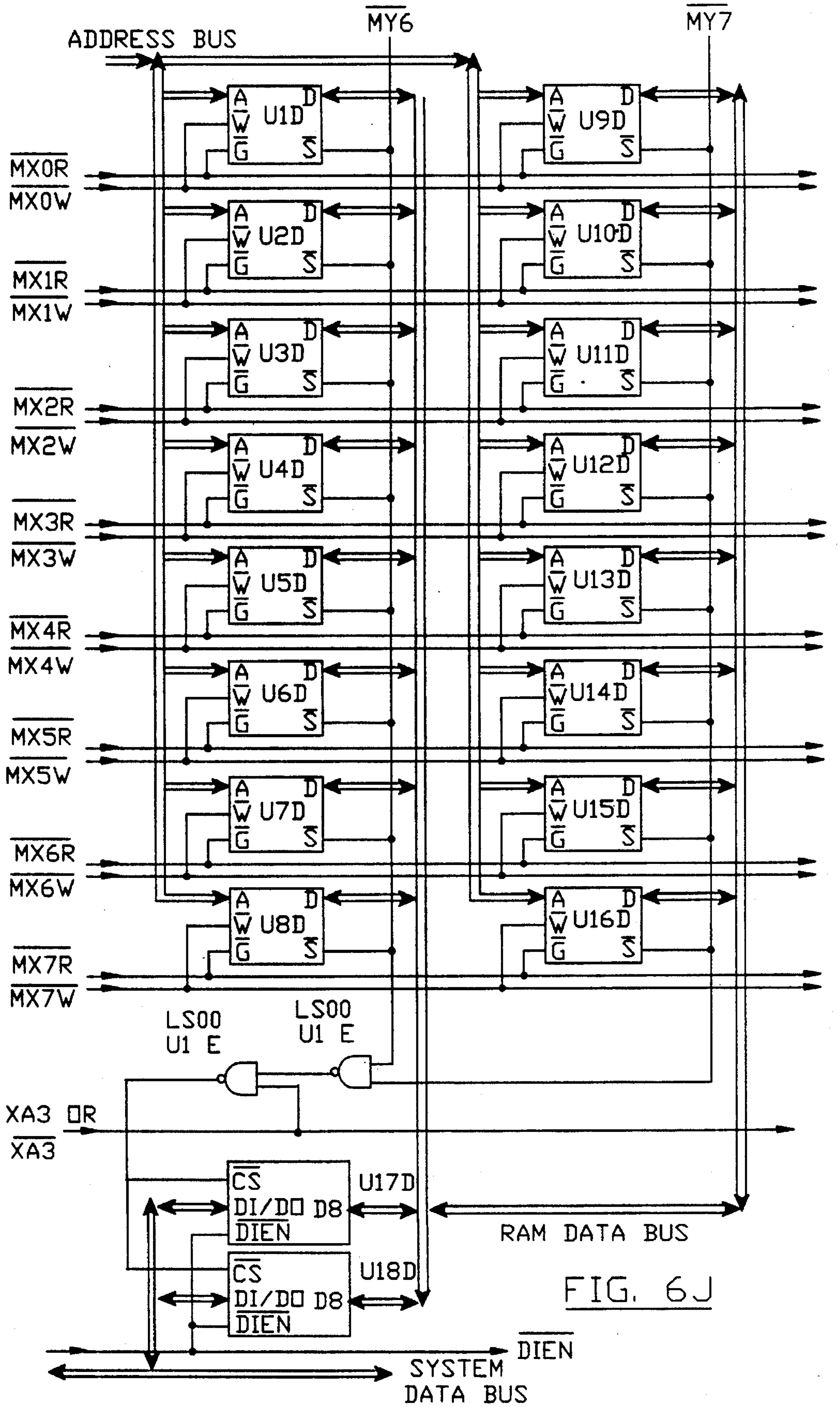
Figure 6K:
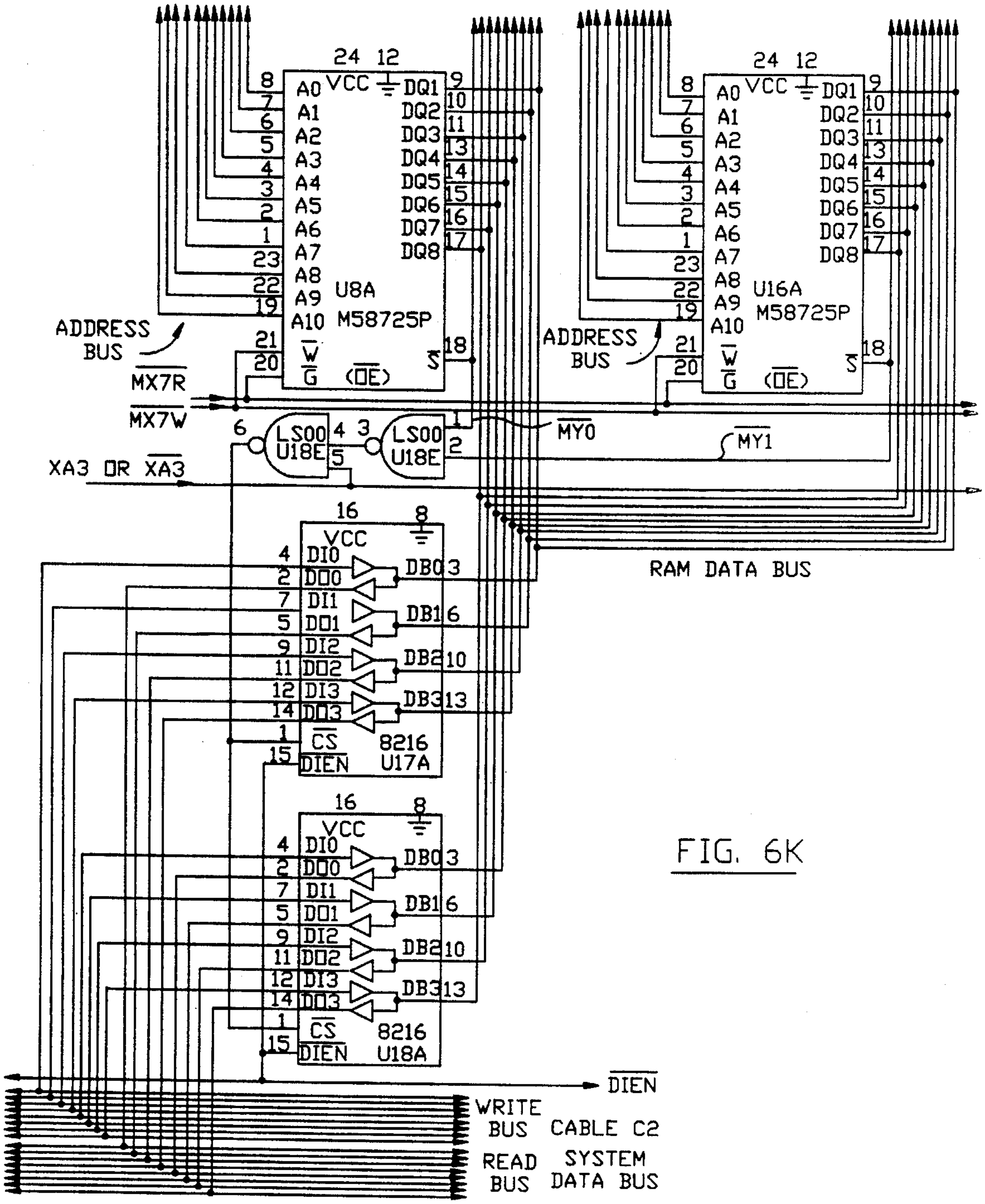
FIGS. 6K, 6L, 6M, and 6N are detailed schematic diagram representations in accordance with the memory of FIGS. 6F, 6G, 6H, 6I, and 6J.
Figure 6L:
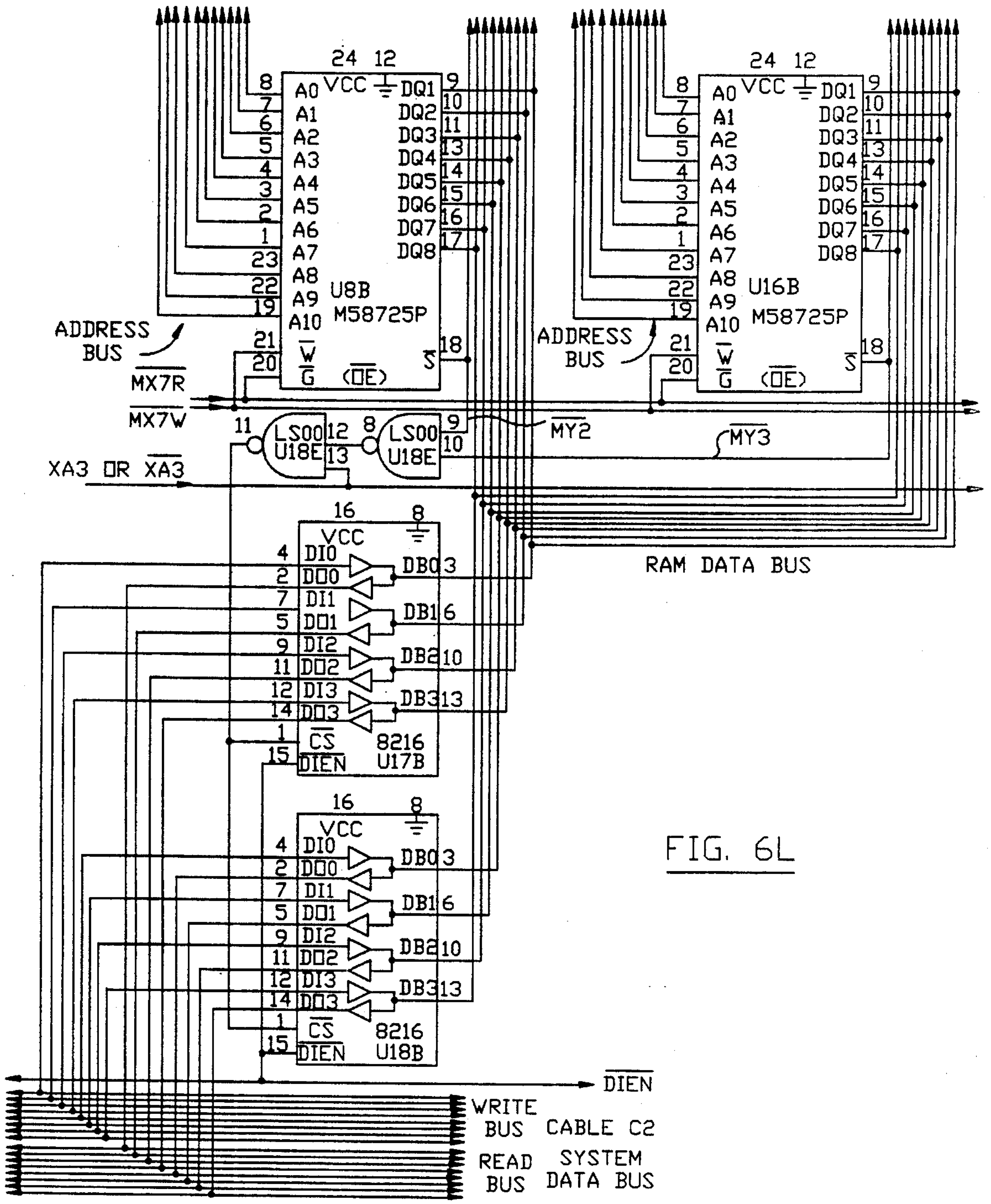
Figure 6M:
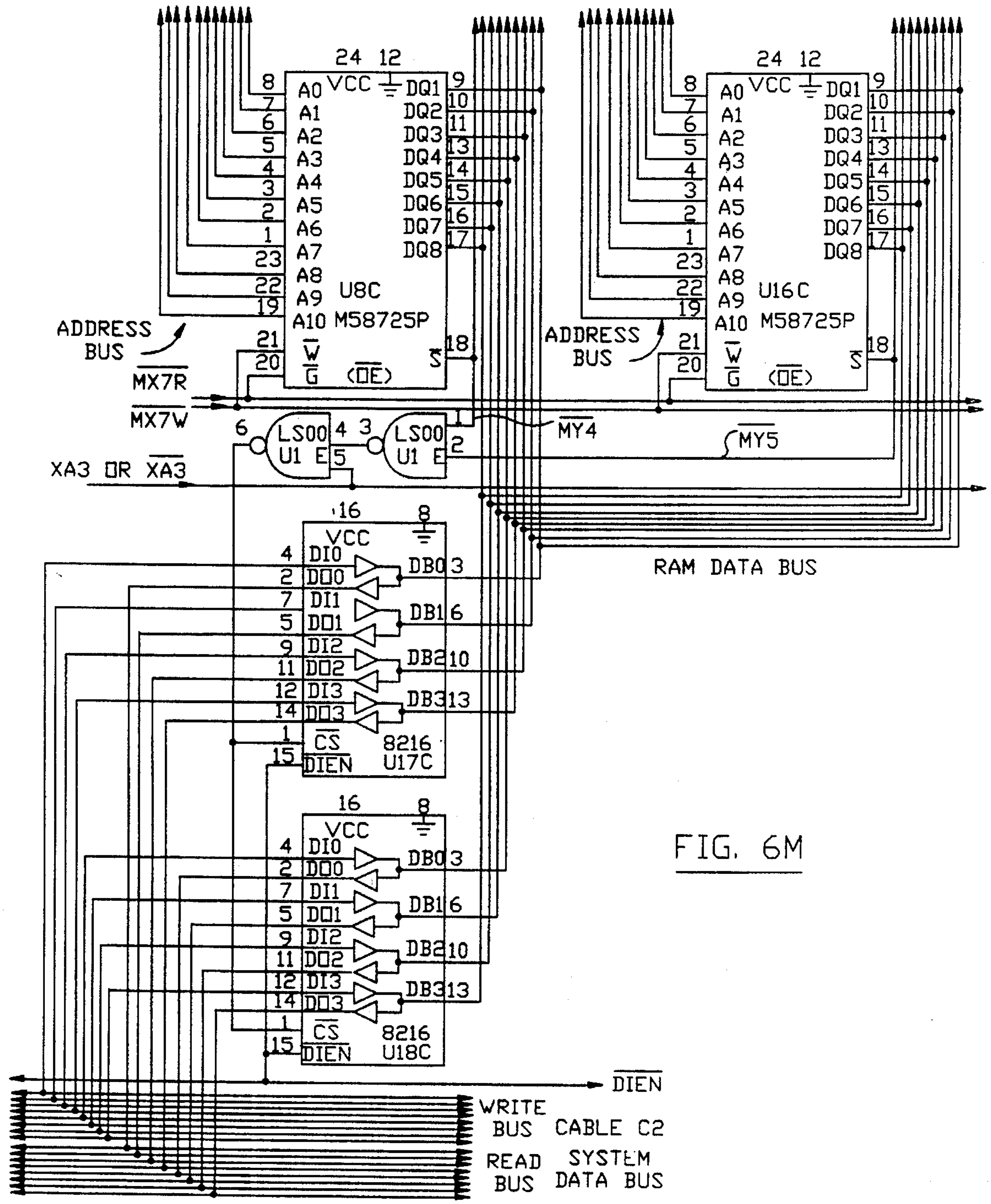
Figure 6N:
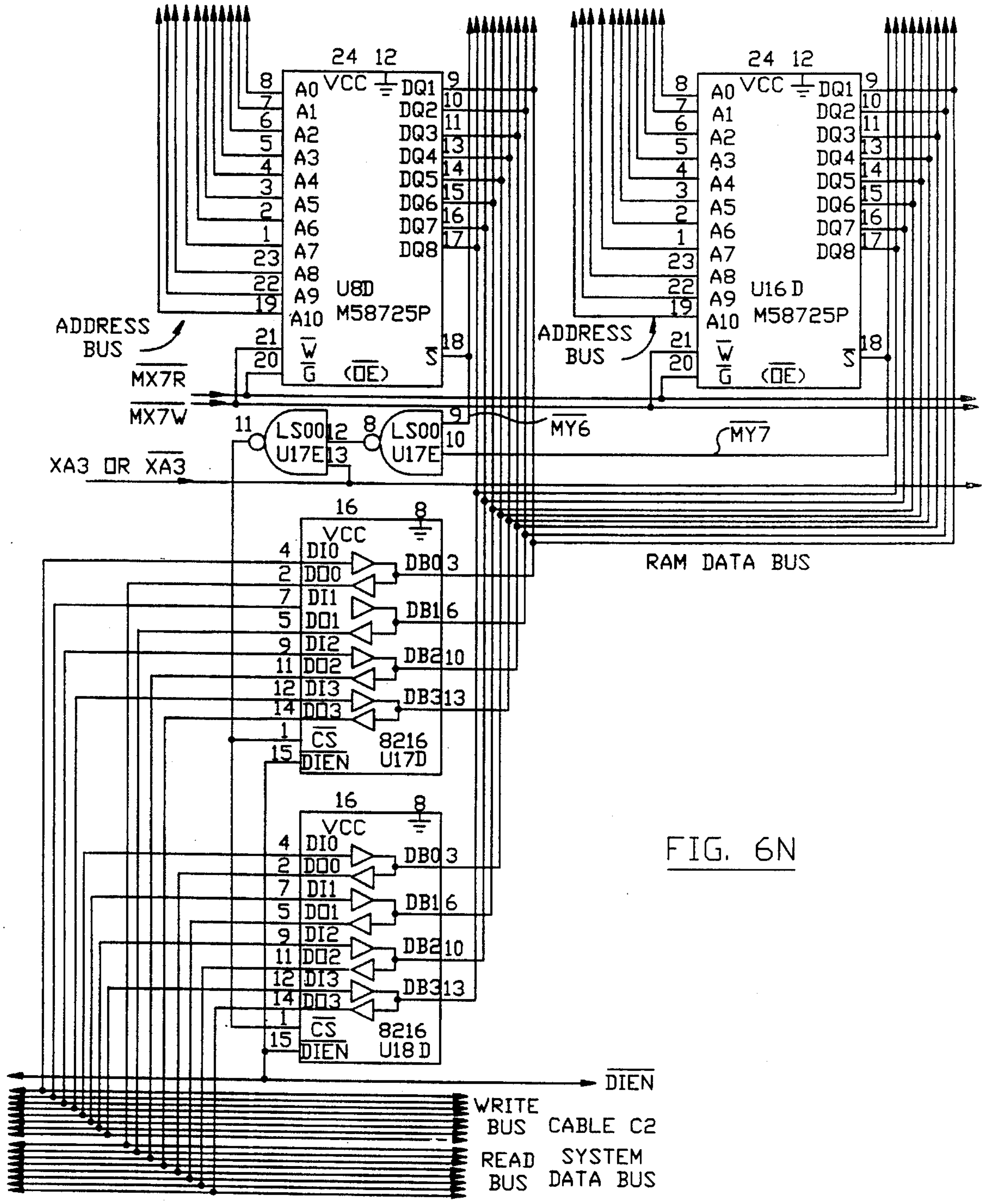
Figure 6D:
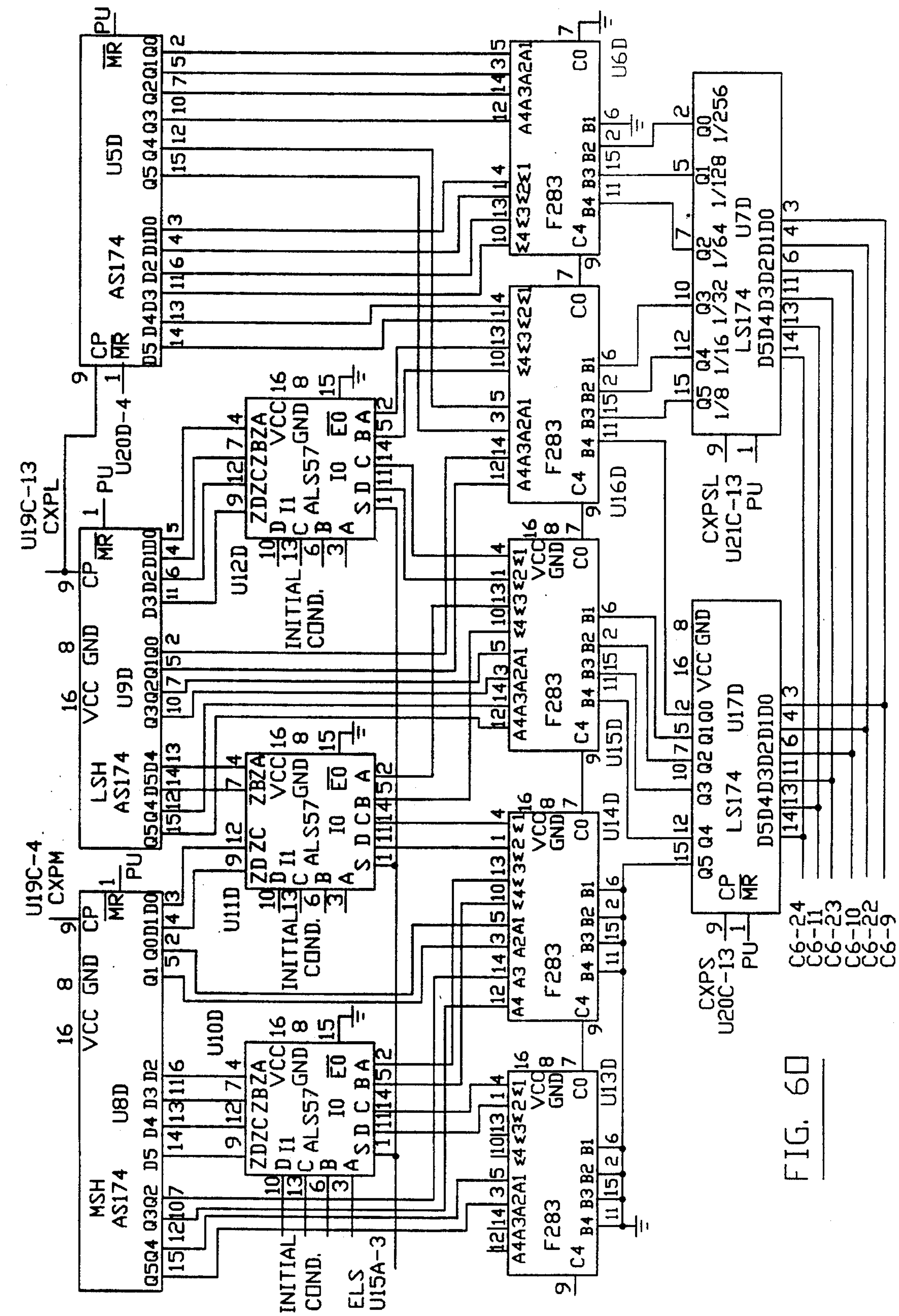
Figure 6P:
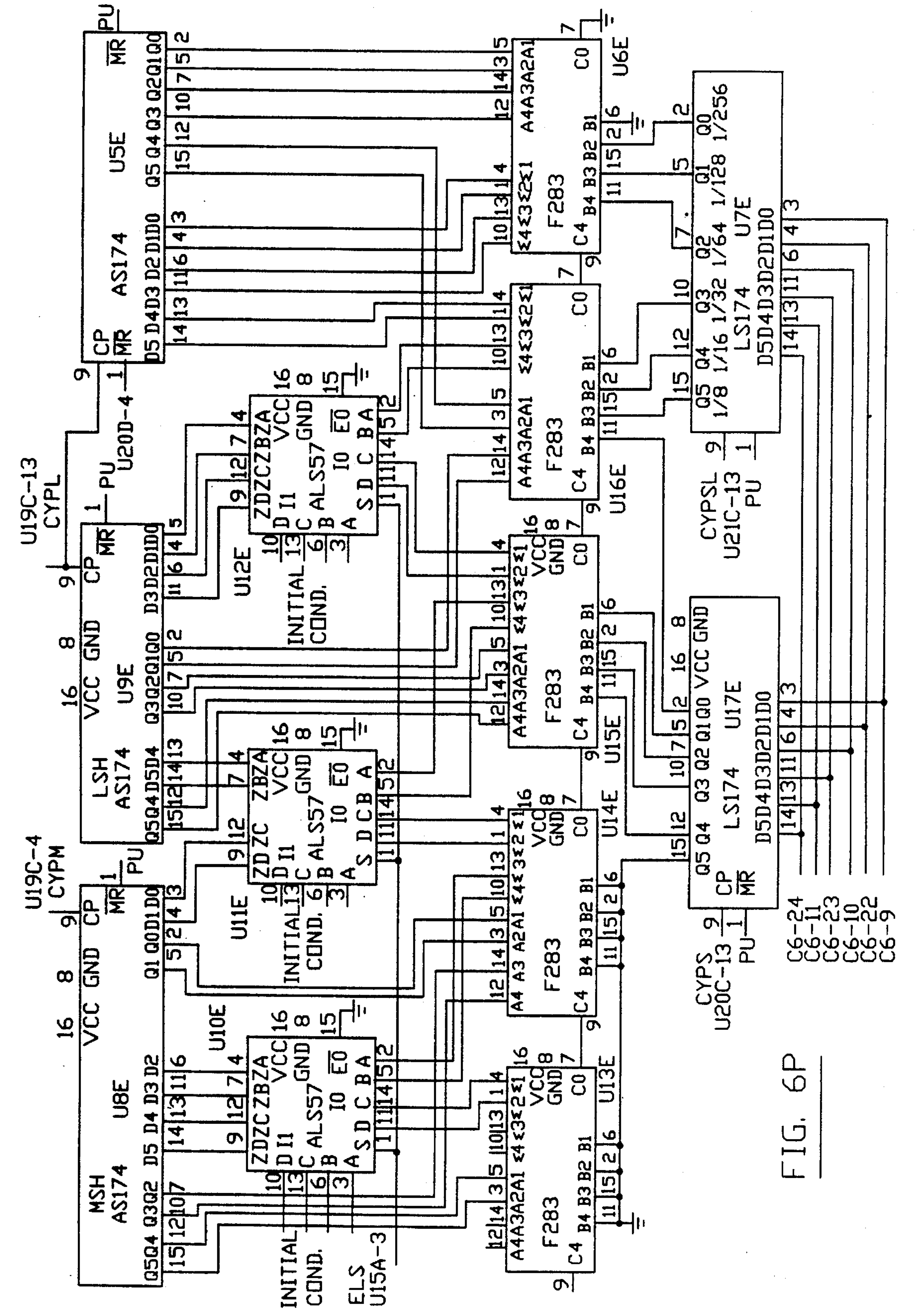
Figure 6Q:
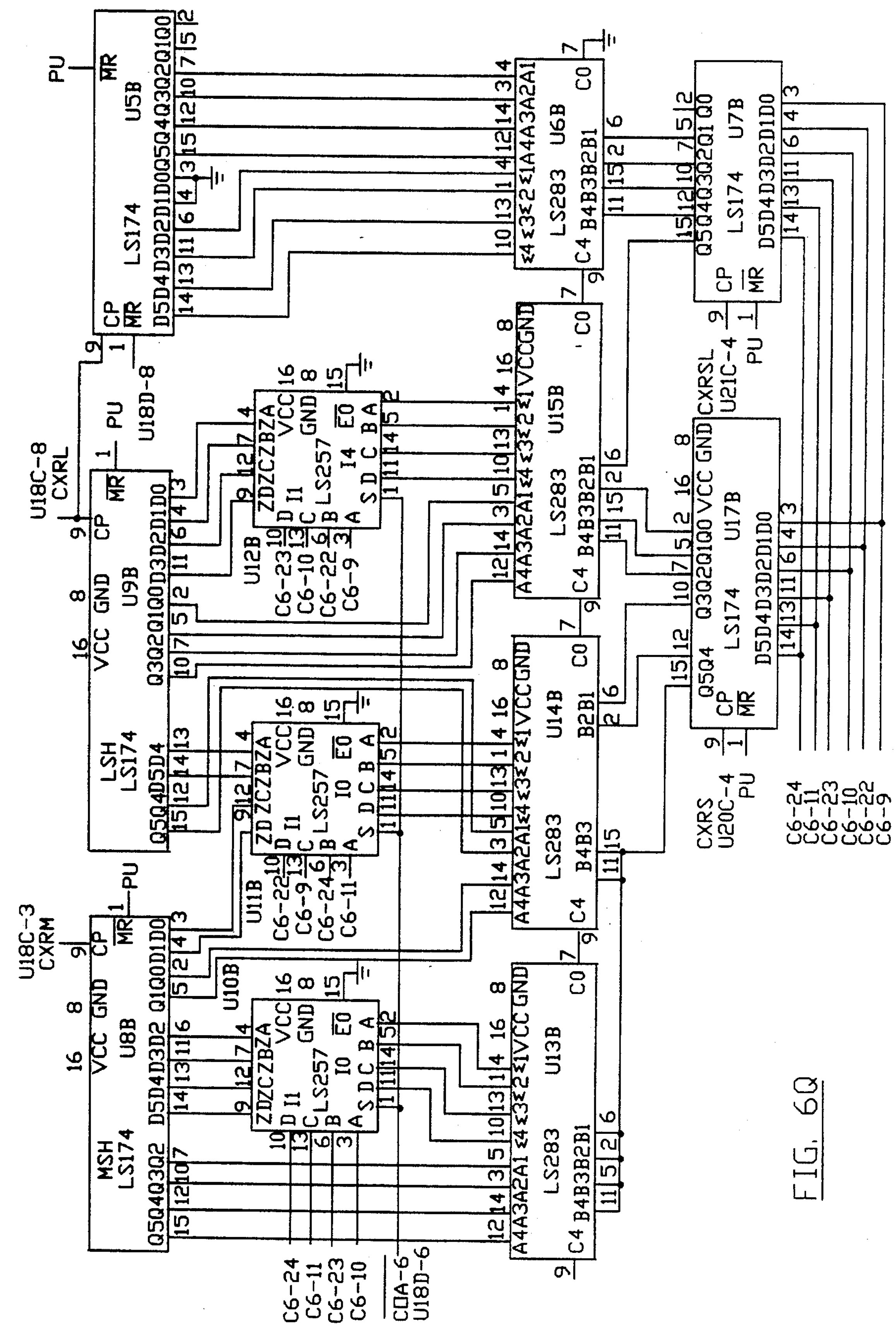
FIGS. 6Q and 6R are detailed schematic diagram representations of another configuration of an address generator that can be used in the system of the present invention.
Figure 6R:
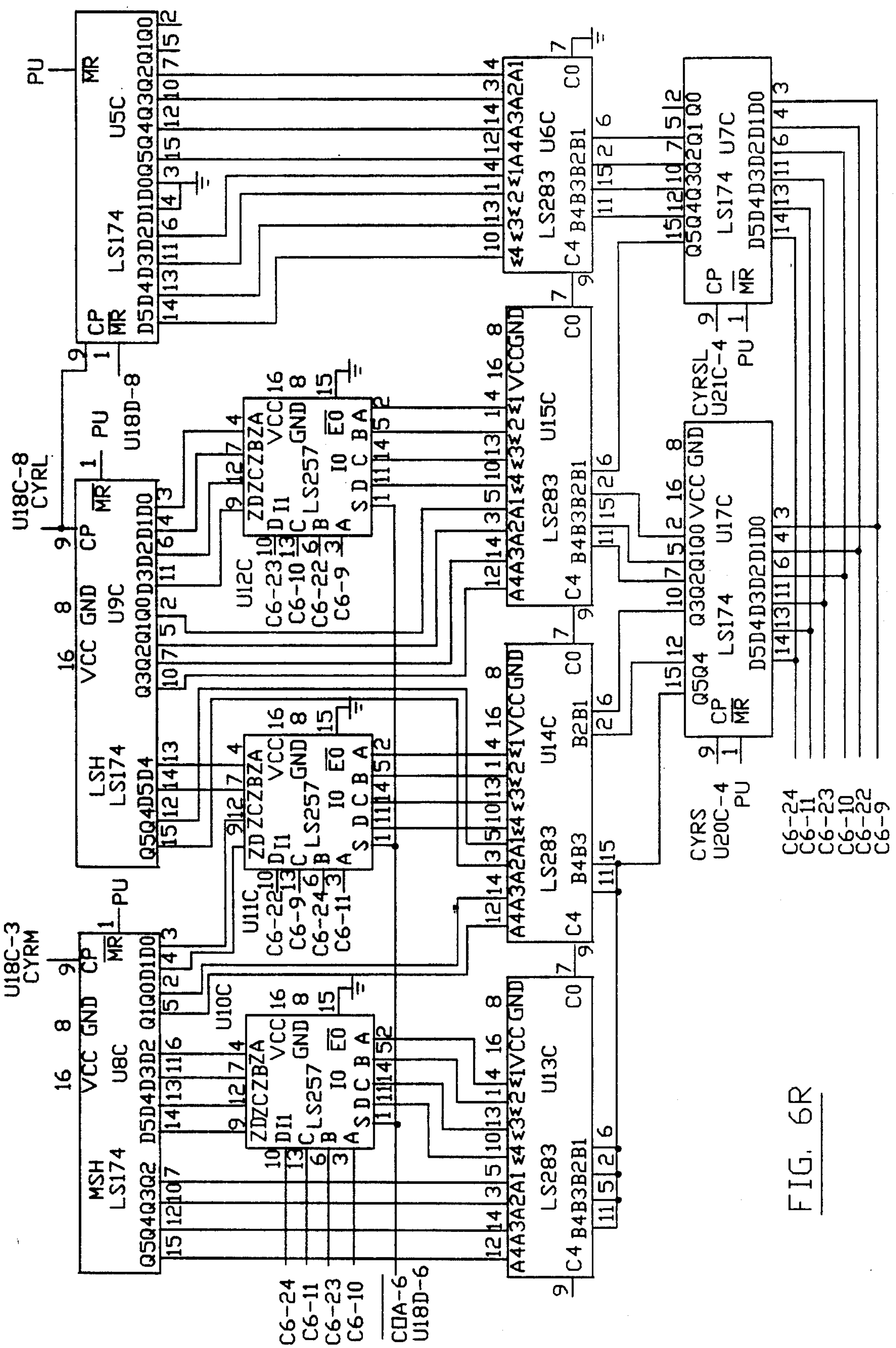
Figure 6S:
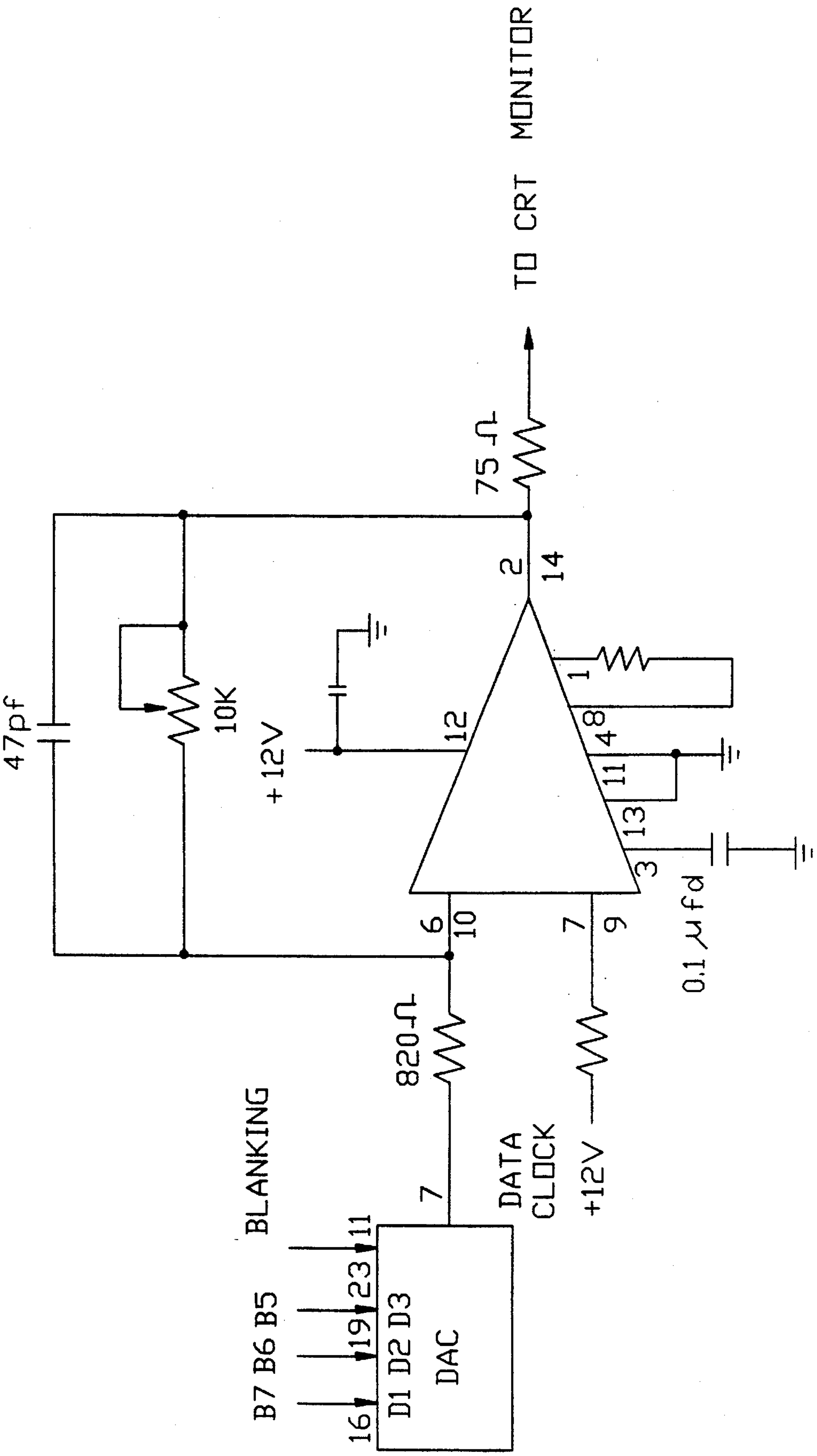
FIG. 6S is a detailed schematic diagram representation of a video DAC channel.
Figure 6T:
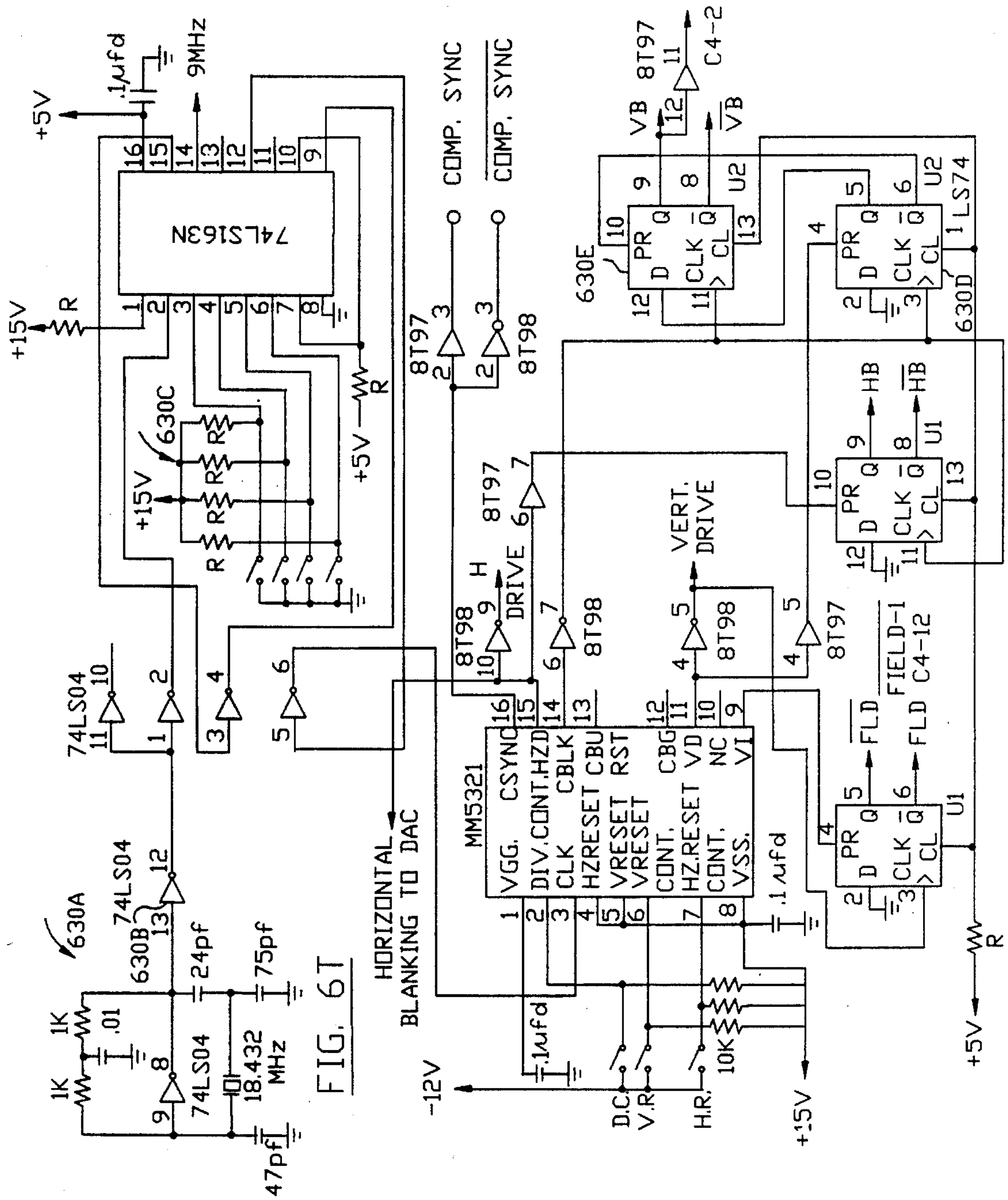
FIG. 6T is a detailed schematic diagram representation of a video synchronization pulse generator and clock pulse generator.
Figure 6U:
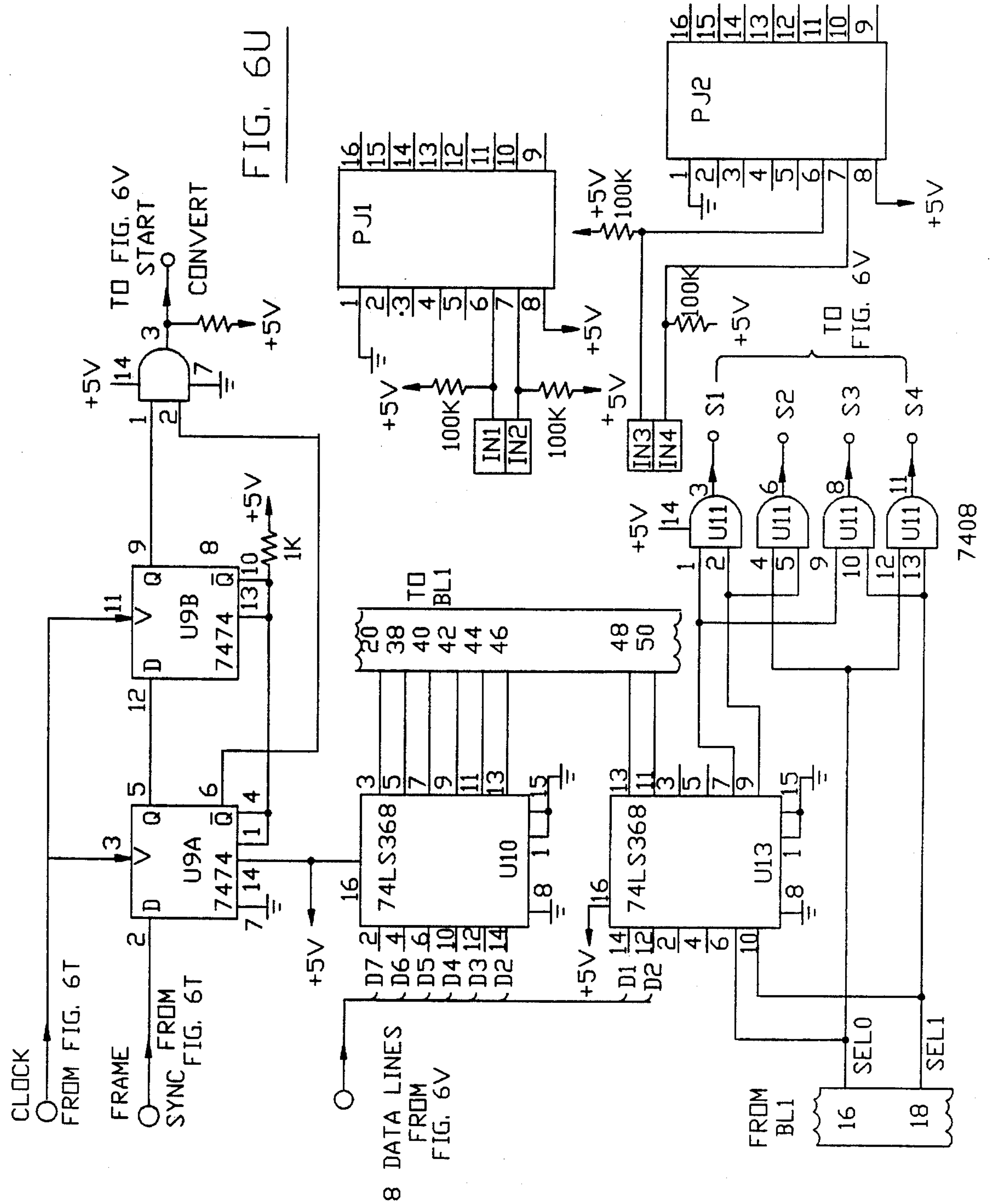
FIG. 6U is a detailed schematic diagram representation of joystick interface logic.
Figure 6V:
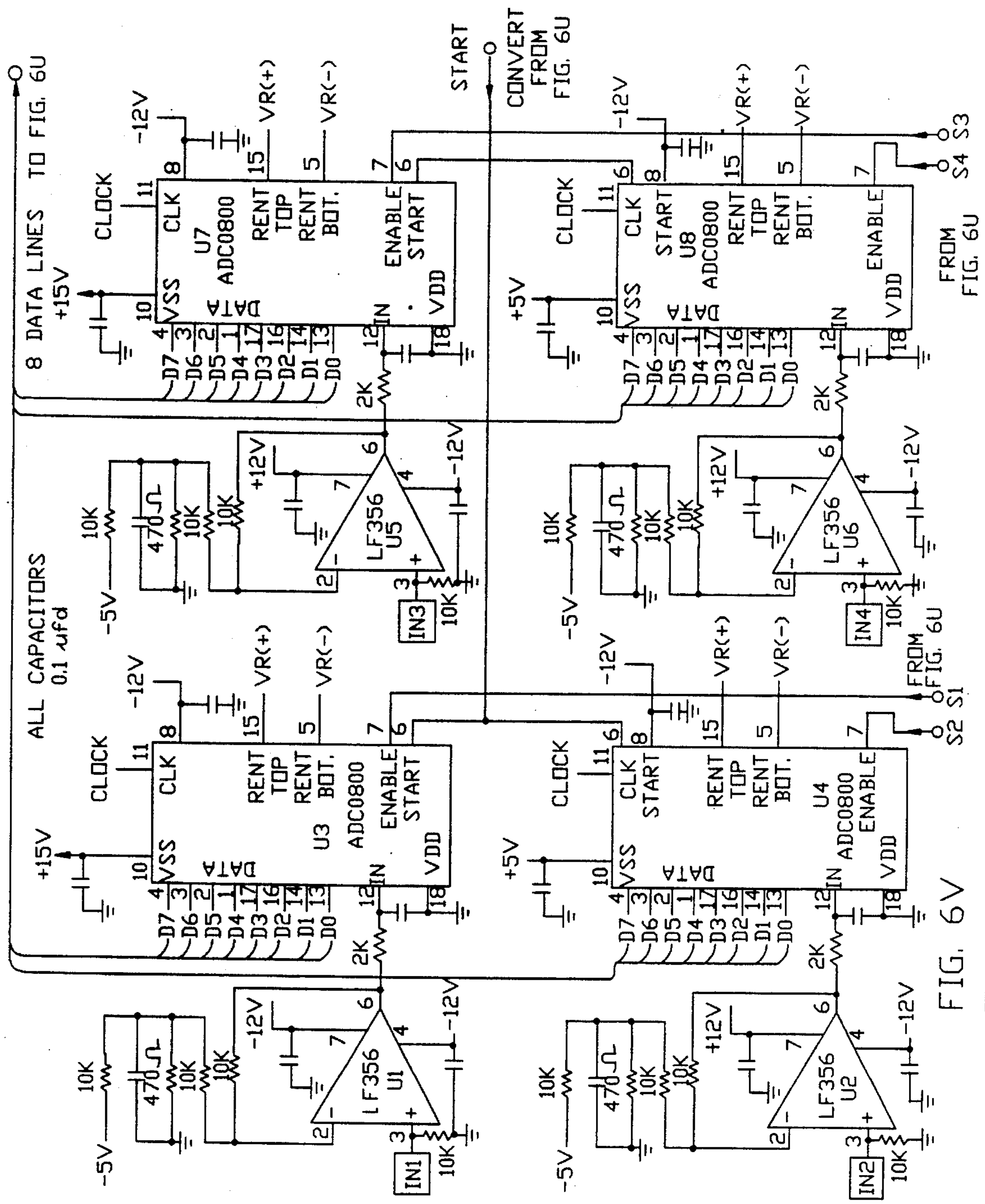
FIG. 6V is a detailed schematic diagram representation of joystick analog to digital converters.
Figure 6W:
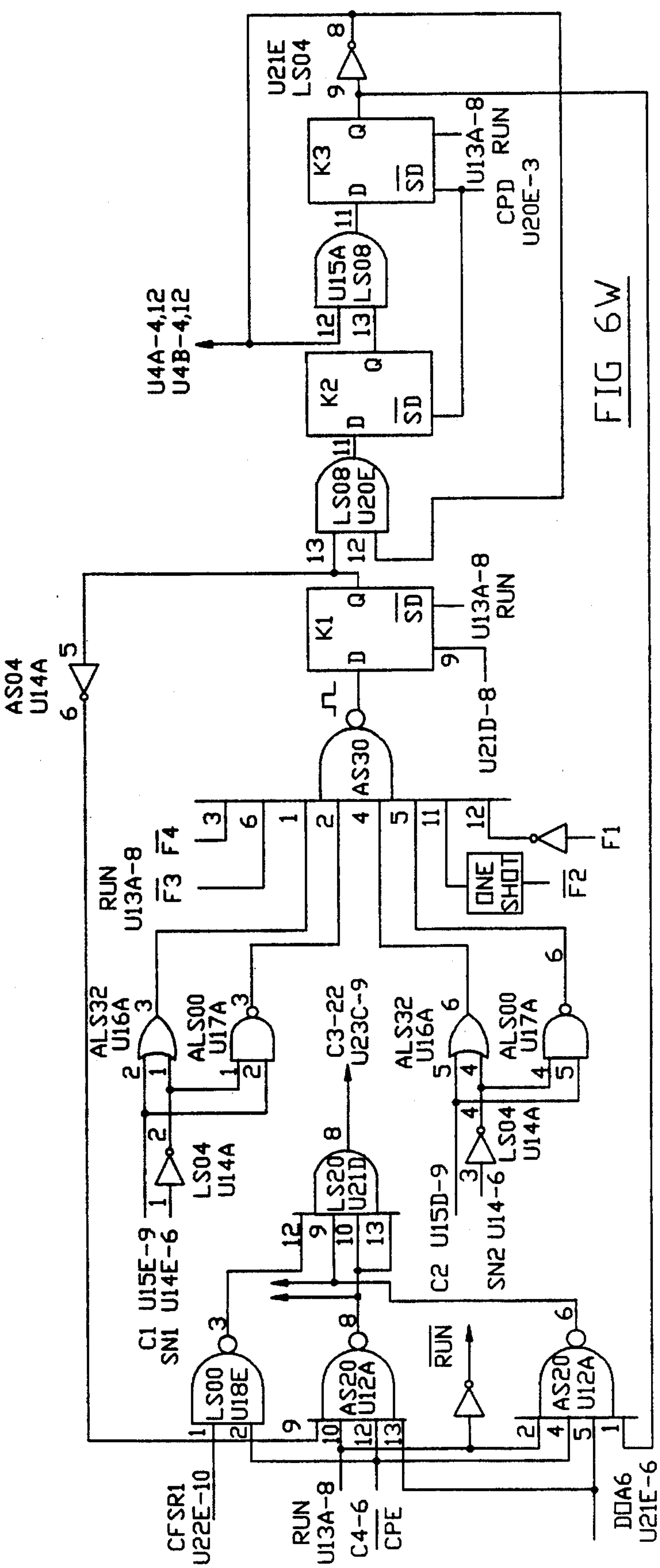
FIG. 6W is an alternate detailed schematic diagram of clock gating logic shown in FIG. 6C.

FIG. 6C, which is similar to FIG. 6W, is discussed in detail herein. Three primary changes have been made to FIG. 6C to arrive at FIG. 6W. First, gate U13A-6 has been changed from an AS20 4-input NAND gate to an AS30 eight input NAND gate having modal detector inputs F1*, F2*, F3*, and F4* to new pins 3, 6, 11, and 12. Second, flip-flops U23C and U21B have been changed from flip-flops not having a set input (74LS174 flip-flops) to flip-flops K1, K2, and K3 having a set input SD* (i.e., 74LS74 flip-flops). Third, the RUN signal U13A-8 is shown input to set inputs $S_D$* of flip-flops K1, K2, and K3.

74LS174 flip-flops implement a clear circuit MR, (FIG. 6C) and not a set circuit $S_D$*. Alternately, it is convenient for this example to use flip-flops having set circuits $S_D$* (FIG. 6W). Such set circuits $S_D$* are well known in the art, as used on LS74 flip-flops.

Gate AS30 has modal detector inputs F1*, F2*, F3*, and F4* to new pins 3, 6, 11, and 12 to supplement overflow detector inputs to pins 1, 2, 4, and 5. If any one or more of the detector inputs, including modal inputs and overflow detector inputs, to the pins of NAND gate AS30 goes low; then re-addressing operations will be invoked until the last of the detector inputs; either modal detector inputs, or overflow detector inputs, or other inputs; again goes high. The state of the modal signal can be Changed with an inverter, such as the inverter in the modal detector signal F1 line, so that a high modal signal (instead of a low modal signal) will invoke re-addressing operations. Also, a one-shot circuit can be used to generate a short re-addressing command pulse in response to a detector signal level. See the one-shot circuit in modal detector signal line F2*. For example, if the F3* modal detector. signal goes low and remains low for a period of time, such as for a mode period; then (in the FIG. 6W configuration) re-addressing is continuously invoked until the F3* modal detector signal again goes high. However, if the F2* modal detector signal goes low and remains low, then the one-shot circuit in the F2* signal line causes a relatively short pulse to be generated to invoke a single re-addressing operation independent of the amount of time that the F2* signal remains low.

Figure 6X:
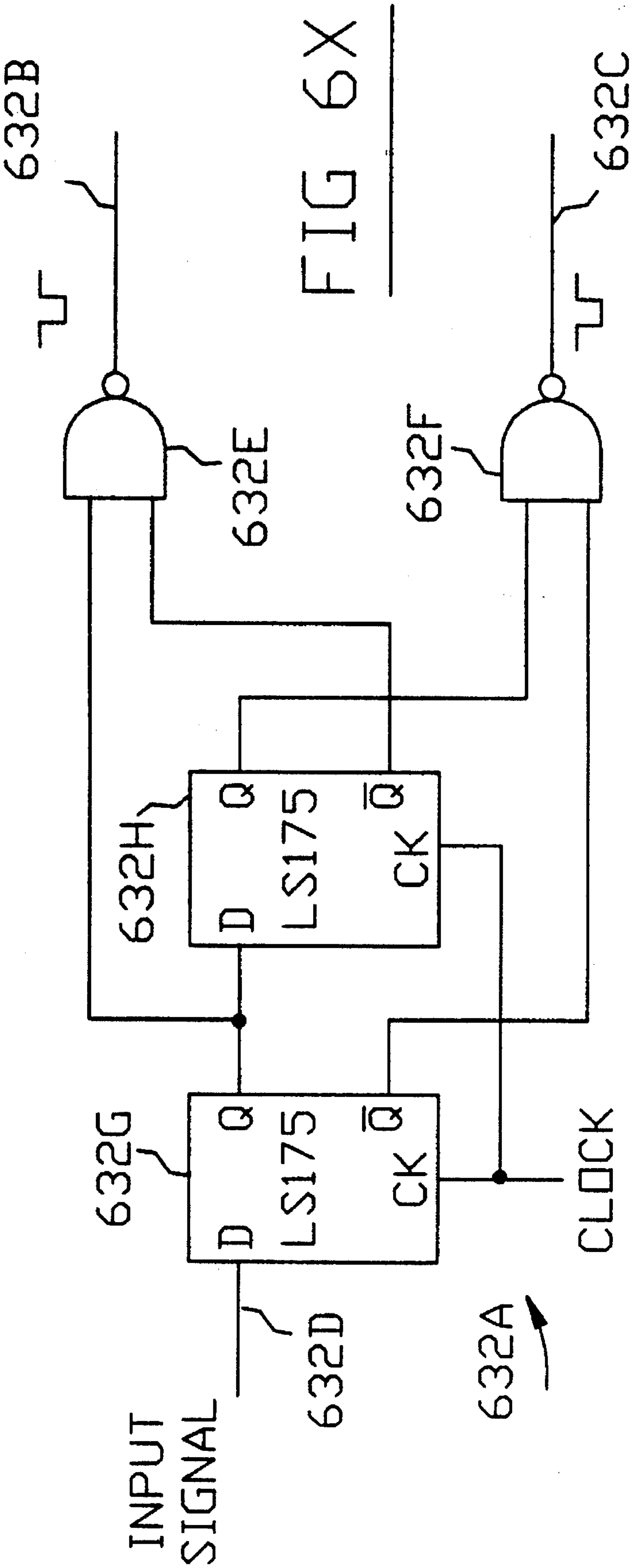
FIG. 6X is a detailed schematic diagram of a one shot circuit.

Various types of one-shot circuits can be used. For example, the 74LS221 monostable multivibrator can be used as a one-shot circuit to generate a single output pulse in response to an input level. Also, a synchronous one-shot circuit, such as shown in FIG. 6X, can be used to generate a short synchronous output pulse 632B and 632C in response to an input signal 632D. This synchronous one-shot circuit 632A generates a positive level transition output pulse 632B in response to the input signal 632D making a transition from a low signal level to a high signal level and generates a negative level transition output pulse 632C in response to the input signal 632D making a transition from a high signal level to a low signal level. One-shot circuit 632A shifts input signal 632D first into flip-flop 632G on a first clock pulse and then into flip-flop 632F on a second clock pulse. Following input signal 632D going high, the transitionary condition of flip-flop 632G being set and flip-flop 632F being reset after occurrence of said first clock pulse is detected by gate 632E. Following input signal 632D going low, the transitionary condition of flip-flop 632G being reset and flip-flop 632F being set after occurrence of said first clock pulse is detected by gate 632F. LS00 NAND gates 632E and 632F are shown in the output of one-shot circuit 632A to generate negative going output pulses to be consistent with the logic of the AS30 NAND gate (FIG. 6W). Alternately, LS08 AND gates can be used in place of the LS00 NAND gates in the output of one-shot circuit (FIG. 6X) to generate positive going output pulses for a detector circuit using a high signal level to invoke re-addressing. Such one-shot circuits are further disclosed in the referenced patent applications. Further, one skilled in the art will readily understand the operation thereof from the schematic diagram in FIG. 6X and the discussion of operation supra.

The RUN signal U13A-8 is shown input to the set inputs of flip-flops K1, K2, and K3 so that the RUN signal will set flip-flops K1, K2, and K3 when low and will permit normal flip-flop operation when high. Because the RUN signal sets flip-flops K1, K2, and K3 when low; flip-flops K1, K2, and K3 are in the set state when the RUN signal first goes high. Flip-flops K1, K2, and K3 being set implies a re-addressing operation, similar to an overflow signal to pins 1, 2, 4, or 5 of NAND gates U13A-6 and AS30 being in the low state when an overflow is detected. Hence, inputting of a normally high modal signal to the set inputs of flip-flops K1, K2, and K3 invokes a re-addressing operation for the first operation after the modal signal goes high. Similarly, a plurality of normally high modal signals can be ANDed together and input to the set input of flip-flops K1, K2, and K3 so that any one or more of these ANDed signals going low will invoke a re-addressing operation when all of these ANDed modal signals again become high. Similarly, a one-shot circuit can be used to set flip-flops K1, K2, and K3; such as by generating a negative going pulse in response to a positive level transition or a negative going transition supra. Other logical arrangements will permit other combinations of modal signals to set flip-flops K1, K2, and K3 in response to a modal signal implying re-addressing.

Alternately, the RUN signal U13A-8 is shown input to the F3* input of NAND gate AS30 so that the RUN signal will invoke re-addressing operations when low and hence will enter the run mode with a re-addressing operation. Because the RUN signal to F3* causes flip-flops K1, K2, and K3 to be set through the D input pins when low; flip-flops K1, K2, and K3 are in the set state when the RUN signal first goes high. Flip-flops K1, K2, and K3 being set implies a re-addressing operation, similar to an overflow signal to pins 1, 2, 4, or 5 of NAND gates U13A-6 and AS30 being in the low state when an overflow is detected. Hence, inputting of a normally high modal signal (i.e., RUN) to NAND gate AS30 invokes a re-addressing operation for the first operation after the modal signal goes high. Similarly, a plurality of normally high modal signals can be ANDed together and input to NAND gate AS30 so that any one or more of these ANDed signals going low will invoke a re-addressing operation when all of these ANDed modal signals again become high. Similarly, a one-shot circuit can be used to generate a modal detector signal (i.e., RUN) to NAND gate AS30, such as the one-shot circuit associated with the F2* detector signal generating a negative going pulse in response to a positive level transition of a modal signal (i.e., RUN) or a negative going transition of a modal signal (i.e., RUN) supra. Other logical arrangements will permit other combinations of modal signals to invoke re-addressing.

Time Available Detector Circuits

Time available detector circuits can be implemented as an alternate to or in addition to overflow detector circuits, comparitor detector circuits, anticipatory detector circuits, modal detector circuits, and other detector circuits. For example, in a time available detector configuration; a memory re-addressing operation may not actually be detected but may be executed because time is available for performing a re-addressing operation. Such time-available memory address operations can provide important advantages, such as enhancing performance.

A time available detector can be implemented by detecting a time available condition, such as modal condition having time available or an instruction execution condition having time available, to invoke memory addressing operations, such as independent of whether addressing is necessary or alternately by determining that addressing is necessary. For example, the RUN signal U13A-8 is generated to enable gating of clock signals with gates U12A-6 and U12A-8; where the RUN signal being low is indicative of a time that memory operations are not being invoked for displaying pixels and hence time may be available for memory refreshing and memory re-addressing. Certain modal signals described herein for invoking a modal detector can also implement a time available modal detector.

A time available detector arrangement can be implemented in a microprocessor, in a display processor, in a filter processor, in a database processor, in an artificial intelligence processor, or in other processors. It is particularly appropriate for implementation in high speed memory applications because scanout and re-addressing in response to actual detection of a suitable memory condition can provide higher performance than normal RAS* and CAS* addressing and because time available detection can provide higher performance than actual detection.

Time available detectors generate an addressing time available signal in response to detection of time being available for memory operations, such as memory re-addressing operations. For example; various time available memory refresh detectors are discussed herein, which discussions are also applicable to time available memory re-addressing detectors. These time available memory refresh detectors generate time available memory refresh detector signals to control memory refresh operations. Also; various modal detectors are discussed herein, which discussions are also applicable to time available memory addressing detectors. These modal detectors generate modal signals, many of which may have time available and hence may be characterized as time available detectors generating detector signals to control memory addressing operations.

Time available memory refresh detectors, such as disclosed herein, can be used as time available addressing detectors for memory addressing by generating time available addressing detector signals to invoke memory operations, such as memory re-addressing operations, in addition to or in place of generation of time available memory refresh detector signals. Also, time available memory refresh detector signals can be used to invoke memory operations, such as memory re-addressing operations, cotemporaneously or concurrently with memory refresh operations because the memory address register may be available for memory addressing operations, such as memory re-addressing operations, during memory refresh operations, such as in applications where the memory refresh address is being used to control the memory during memory refresh operations. For example, a time available memory refresh detector signal may be input to the F4* input or to the F2* one-shot input of the overflow detector circuit (FIG. 6W) to invoke a memory re-addressing operation concurrently with a refresh operation if a memory refresh operation is invoked or independent of a refresh operation if a memory refresh operation is not invoked.

The image memory line sync pulse memory refresh detectors and the image memory field sync pulse memory refresh detectors are discussed herein. Also discussed herein is a line sync memory refresh detector that detects a selected portion of a line sync pulse, the leading portion of a line sync pulse in this illustration. Alternately, the image memory line sync pulse memory refresh detectors may be implemented as image memory line sync pulse time available memory re-addressing detectors for generating line sync pulse time available memory re-addressing signals to invoke memory re-addressing; the image memory field sync pulse memory refresh detectors may be implemented as image memory field sync pulse time available memory re-addressing detectors for generating field sync pulse time available memory re-addressing signals to invoke memory re-addressing; and the image memory line sync pulse time available memory refresh detectors that detect a selected portion of a line sync pulse, the leading portion of a line sync pulse in this illustration may be implemented as image memory line sync pulse leading edge time available memory re-addressing detectors for generating field sync pulse leading edge time available memory re-addressing signals to invoke memory re-addressing.

A stored program computer time available memory addressing detector can be implemented to perform memory addressing operations, such as to perform memory re-addressing on a time shared basis with program operations. For example, an instruction detector can be used to detect instructions or portions of instructions that are suitable for memory re-addressing operations. In a micro-programmable computer, micro-instructions can be implemented to generate memory re-addressing detector signals to invoke a memory re-addressing operations and/or memory refreshing operations. In other computers, states can be implemented to generate memory re-addressing detector signals to invoke memory re-addressing operations and/or memory refreshing operations.

Time available memory addressing detectors that are responsive to execution of a computer instruction can be implemented by detecting a suitable portion of an instruction execution period, such as detecting selected micro-operations of an instruction, that are indicative of computer operations that do not use main memory for an appropriate period of time in order to invoke a memory addressing operation during that period of time. For example, an instruction that processes a register operand, such as an instruction that adds a register operand to the accumulator, may have to access an instruction from main memory (as with an instruction that adds a memory operand to the accumulator) but may not have to access an instruction from main memory. Hence, an instruction that processes a register operand may have time to invoke a memory re-addressing operation in place of the memory operand access that is not needed for such an instruction. Other instructions may have an instruction execution micro-operation that does not access main memory and hence leaves time available for memory re-addressing. For example, an add instruction may have an add instruction execution micro-operation that does not access main memory and hence leaves time available for memory re-addressing. Also, certain instructions may have significantly longer instruction execution micro-operations, such as multiple and divide instructions which may have eight or sixteen instruction execution micro-operations that do not access main memory and hence leaves time available for memory re-addressing. See the related application Ser. No. 101,881 and see U.S. Pat. No. 4,371,923 for computer micro-operation disclosures; such as FIGS. 5A and 5B and the discussion related thereto. For example, these disclosures discuss main memory resident operand instructions, discuss scratch pad memory resident operand instructions, and discuss micro-operations related thereto.

A stored program computer can implement time available memory addressing operations, such as implementing memory re-addressing and memory refresh operations on a time shared basis with stored program operations. For example, an instruction detector can be used to detect instructions or portions of instructions that are suitable for memory addressing operations, including memory re-addressing operations and memory refresh operations.

Various stored program computer configurations will now be discussed with reference to the computer disclosed in related patent application Ser. No. 101,881 and related U.S. Pat. No. 4,371,923; particularly with reference to FIGS. 5A and 5B therein and the discussions related thereto disclosing a microprogram having micro-instructions or micro-operations.

Time available memory addressing detectors that are responsive to execution of a computer instruction can be implemented by detecting a suitable portion of an instruction execution period, such as detecting selected micro-operations of an instruction, that are indicative of computer operations that do not use main memory for an appropriate period of time in order to invoke a memory addressing operation during that period of time. For example, a group B instruction processes a register operand, such as a DS add instruction that adds a register operand to the accumulator, accesses the DS instruction from main memory (as with a DP instruction that adds a memory operand to the accumulator) but accesses an operand from a scratch pad register and hence does not have to access an operand from main memory. Hence, an instruction that processes a register operand (i.e.; the group B instructions) may have time to invoke a memory re-addressing operation and/or a memory refreshing operation in place of the memory operand access that is not needed for such an instruction. Other instructions may have an instruction execution micro-operation that does not access main memory and hence leaves time available for memory re-addressing. For example, the DP add instruction has the FT add micro-operation that does not have a main memory access and hence leaves time available for memory re-addressing and memory refresh operations.

Micro-operation signals can be generated by micro-operation logic, such as defined by the micro-operation signals in Table III of related patent application Ser. No. 101,881 and related U.S. Pat. No. 4,371,923. These micro-operation signals can be combined; such as shown with the P29, P30, P31, P39, P40, and P41 terms in Table II therein; to combine the micro-operation signals that are suitable for invoking memory operations. For example, micro-operation signals FY, FT, FU, FV, FW, FX, FAQ, FAB, FAC, FAD, and FAE; word-1 micro-operations having 16-bit times; can be logically combined

FY+FT+FU+FV+FW+FX+FAQ+FAB+FAC+FAD+FAE to generate a time available detector signal to invoke memory re-addressing and memory refreshing operations. It may be desirable to inhibit retriggering, such as in a slower computer having relatively long micro-operation periods, and to insure completion of the memory operation cycle, such as in a faster computer having relatively short micro-operation periods. Retriggering can be inhibited with various circuits, such as with signal F2* having a one-shot circuit connected thereto (FIG. 6W). Completion of a memory operation cycle can be insured with various circuits; such as with the K1, K2, and K3 flip-flop circuits (FIG. 6W) that insure that the memory re-addressing cycle is completed before scanout operations are resumed.

Certain micro-operations are particularly suitable for performing auxiliary memory operations, such as re-addressing and refreshing. For example; the FA, FB, and FC micro-operations related patent application Ser. No. 101,881 and related U.S. Pat. No. 4,371,923 are particularly suited for memory refreshing operations because they constitute all of the word-0 micro-operations, because not one of these operations use the memory, and because each instruction executed invokes one of these micro-operations. Because the FA, FB, and FC micro-operations constitute all of the word-0 micro-operations and because not one of these operations use the memory, the logic to invoke refreshing is simply the word-0 (W0) logical signal. Because each instruction executed invokes one of the FA, FB, and FC micro-operations; refreshing is insured on a regular iterative basis.

Various stored program computer configurations will now be discussed with reference to the Motorola 68HC11 single chip microcomputer; particularly with reference to Section-5 of the Motorola 68HC11 Programmer's Reference Manual. An instruction execution cycle having time available is indicated with the symbol $FFFF in the "Address Bus" column and with the term "Irrelevant Data" in the "Data Bus" column. Many of the 68HC11 instructions have one time available cycle; some of the 68HC11 instructions have two time available cycles; the MUL 68HC11 instruction has eight time available cycles; and the FDIV and the IDIV 68HC11 instructions have 39 time available cycles. Each cycle represents 500-ns in the 2-MHz version of the 68HC11. 500-ns should be sufficient for one or more refresh operations involving up to 200-ns each and should be sufficient for a re-addressing operation involving 250-ns or less. Hence, there is usually a considerable amount of time available during instruction execution in the 68HC11 microprocessor.

The cycle logic in the 68HC11 is implemented on-the-chip. One skilled in the computer art reviewing the logical design of the 68HC11 microcomputer will find logical signals that can be logically combined with digital logic to uniquely define the cycles to be used for time available processing. For example; various signals can be combined, such as with AND gates, to form micro-operation signals (i.e., the cycle-4 signal and the MUL instruction) and the micro-operation signals can be logically combined, such as with OR gates, to form the detector signal that can be used to invoke the auxiliary memory operations, such as memory re-addressing and memory refreshing. The logical equations disclosed in the related patent application Ser. No. 101,881 and related U.S. Pat. No. 4,371,923 show how to combine various signals, such as with AND gates, to form micro-operation signals (i.e., the FAC micro-operation signal) and the micro-operation signals can be logically combined, such as with OR gates, to form memory detectors signal that can be used to invoke auxiliary memory operations.

Certain instructions are arithmetic and logic unit (ALU) intensive in the 68HC11 and consequently have a significant amount of time available. For example, the MUL 68HC11 instruction has eight time available cycles and the FDIV and the IDIV 68HC11 instruction has 39 time available cycles. Consequently, such ALU intensive instructions can provide extensive memory refreshing capability. For example, the 39 FDIV and IDIV time available can permit up to 100 refresh cycles to be performed, which can be 20% of the refresh requirements for an 8-ms period for the Toshiba DRAMs discussed herein.

The micro-operations in the 68HC11 can provide anticipatory micro-operation signals for memory re-addressing and memory refreshing; as discussed under anticipatory detector circuits herein.

A direct memory access (DMA) memory addressing detector can be implemented to invoke memory operations, such as re-addressing operations, on a time available basis in a DMA configuration that is suitable for time available memory re-addressing. For example, as discussed herein for memory refreshing; a DMA controller can have a separate DMA address register (just as many types of DRAMs have a separate refresh address register) and hence, during DMA operations using the DMA address register to address memory, the processor address register may be available for a time available re-addressing operation.

A cache memory addressing detector can be implemented to invoke memory operations, such as re-addressing operations, on a time available basis in a cache memory configuration that is suitable for time available memory re-addressing. For example, as discussed herein for memory refreshing; a cache memory controller can have a separate cache memory address register (just as many types of DRAMs have a separate refresh address register) and hence, during cache memory operations using the cache memory address register to address memory, the processor address register may be available for a time available re-addressing operation.

A filter processor, signal processor, or array processor memory re-addressing detector can be implemented to invoke memory addressing operations, such as memory re-addressing operations, on a time available basis in a filter processor, signal processor, or array processor configuration that is suitable for time available memory re-addressing. For example, if the processing operations are associated with one of a plurality of memories; then a memory not having processing operations at the particular time can be re-addressing at that time. Also, if the processing operations are relatively slower than memory speed; then a filter processing, signal processing, or array processing re-addressing detector can be implemented to detect the time available inbetween processing operations to invoke re-addressing operations. For example; filter processing, signal processing, or array processing of input information may receive and process and store one input sample each microsecond. However, the above-described Toshiba DRAM may be able to store that input sample in 50-ns using the fast page scanout addressing mode. Hence, 950-ns may be available for DRAM re-addressing.

An artificial intelligence processor memory re-addressing detector can be implemented to invoke memory addressing operations, such as memory re-addressing operations, on a time available basis in a artificial intelligence processor configuration that is suitable for time available memory re-addressing. For example, if the processing operations are associated with one of a plurality of memories; then a memory not having processing operations at the particular time can be re-addressing at that time. Also, if the processing operations are relatively slower than memory speed; then a artificial intelligence processing re-addressing detector can be implemented to detect the time available inbetween processing operations to invoke re-addressing operations. For example; artificial intelligence processing of inference information may process an inference operation each microsecond. However, the above-described Toshiba DRAM may be able to store the inference parameter in 50-ns using the fast page scanout addressing mode. Hence, 950-ns may be available for DRAM re-addressing.

A display processor memory re-addressing detector can be implemented to invoke memory addressing operations, such as memory re-addressing operations, on a time available basis in a display processor configuration that is suitable for time available memory re-addressing. For example, if the processing operations are associated with one of a plurality of memories; then a memory not having processing operations at the particular time can be re-addressing at that time. Also, if the processing operations are relatively slower than memory speed; then a display processing re-addressing detector can be implemented to detect the time available inbetween processing operations to invoke re-addressing operations. For example, display processing of pixel information may access and process and store one display pixel each microsecond. However, the above-described Toshiba DRAM may be able to store that input sample in 50-ns using the fast page scanout addressing mode. Hence, 950-ns may be available for DRAM re-addressing.

Primary memory operations (i.e., non-refresh memory operations) may not be performed for various types of modal conditions. Hence, these various types of modal conditions, such as the RUN modal condition discussed herein, may also be considered to be time available conditions. Consequently; modal detector circuits related to these modal time available conditions may be considered to be time available detector circuits in addition to being modal detector circuits and may be considered to generate time available detector signals in addition to generating modal detector signals.

Programmable Detector Circuits

A programmable detector can be implemented to detect a re-addressing condition or a refreshing condition under program control and to invoke re-addressing and/or refreshing operations. For example, a detection program can be a software program, such as stored in RAM; a firmware program, such as stored in ROM; a microprogram, such as implemented in a micro-programmable processor; or other program. The detector can be programmed in various ways; such as using a compiler or other higher level language, an assembler, or directly in machine code by a programmer. It can implement auxiliary memory operation strategy, such as a refresh strategy and a re-addressing strategy. For example, programming of a long branch or a long jump instruction can be used to invoke re-addressing and programming of an ALU intensive instruction, such as a multiply or a divide instruction, can be used to invoke re-addressing and refreshing, such as discussed with reference to the 68HC11 microcomputer herein. Also, an address change across a block boundary can be used to invoke a re-addressing operation.

One example disclosed herein uses a microprogram in a stored program processor for generating a detector signal in response to execution of an instruction having time available for auxiliary memory operations, such as re-addressing and refreshing. This detector signal can be generated on an anticipatory basis or a non-anticipatory basis.

Another example is a microprogram having a microinstruction bit or bits that can be set for invoking auxiliary memory operations at the appropriate times.

Still another example is a stored program computer having instructions for invoking auxiliary memory operations under program control. For example, the computer disclosed in said related application Ser. No. 101,881 and in said U.S. Pat. No. 4,371,923 can execute a discrete output instruction to invoke auxiliary memory operations and can execute a micro-operation to invoke memory auxiliary operations.

Retriggerable Detector Circuits

Memory detector circuits can be implemented in various configurations, such as retriggerable detector circuits and such as non-retriggerable detector circuits.

The re-addressing arrangement shown in FIGS. 6C and 6W may be considered to be a retriggerable re-addressing circuit. This is because; if an overflow condition is detected during a previously invoked re-addressing operation with one or more of gates U16A-3, U16A-6, U17A-3, and U17A-6; these gates will invoke another re-addressing operation. Similarly; if multiple continuous overflow conditions are detected during multiple continuous re-addressing operations with one or more of gates U16A-3, U16A-6, U17A-3, and U17A-6; these gates will continue to invoke re-addressing operations until the multiple continuous overflow conditions are concluded. Hence, a continuous sequence of re-addressing operations can be accommodated with such an overflow arrangement.

In certain detector configurations; it may be desirable to implement a non-retriggerable addressing detector circuit. One reason is that it may be desirable to complete a memory addressing operation before the end of a detected condition so that the addressing operation will be completed before the end of the detected condition. For example, in the arrangement shown in FIG. 6W; the modal RUN signal will invoke a re-addressing operation when detected as going low (the RUN* condition) by setting flip-flops K1, K2, and K3 in sequence to facilitate a time delay for re-addressing operations. However, if the RUN signal remains low after the re-addressing operation has been completed, the circuit shown in FIGS. 6C and 6W will retrigger thereby initiating another re-addressing operation. This may be desirable for an overflow detector and invoking circuit, where multiple overflow conditions can occur in sequence, but this may be undesirable for a modal or a time-available detector and invoking circuit, where multiple re-addressing operations may be redundant and unnecessary.

Retriggering of the circuit of FIG. 6W can be inhibited by various circuit features. For example, use of a one-shot (i.e., see the F2* detector signal line and the discussion related thereto) can inhibit retriggering.

The one-shot shown in FIG. 6W can generate a leading edge pulse to initiate a re-addressing operation at the beginning of the detector signal (i.e., the F2* signal) to invoke re-addressing. Hence, assuming that the detector signal (i.e., the F2* signal) is longer than the re-addressing period and assuming that the duration of the one-shot output signal (AS30-11) is long enough to facilitate triggering and short enough to prevent retriggering (i.e., two CPE clock periods); re-addressing operations can be concluded before the end of the detector signal (i.e., the F2* signal) and hence facilitate higher performance. Conversely, if retriggering is permitted, then the invoking circuit (FIG. 6W) will retrigger until the end of the detector signal (i.e., the F2* signal), which can result in a re-addressing delay continuing beyond the detector signal (i.e., the F2* signal) and hence causing lower performance.

Other circuits can be used to compensate for retriggering. For example, a memory addressing detector and invoking circuit can be configured to invoke one memory addressing operation, such as a memory re-addressing operation, and then to lockup, such as with the feedback signal U21E-8 which resets the re-addressing time delay flip-flops K2 and K3 feeding back to disable the detector signal until the detector signal concludes and resets the time delay flip-flops K2 and K3. The circuit shown in FIGS. 6C and 6W can readily be modified by one skilled in the logical design art to implement such a lockup. For example, feedback signals U21E-8 that resets flip-flops K2 and K3 can be removed to disable retriggering; the clock gating signal to U4A and U4B can be generated for only a single period of time, such as during the period that flip-flop K1 is high and flip-flop K3 is low as can be detected with an AND gate of a NAND gate; and the detector signal can be logically processed to reset the K2 and K3 flip-flops at the end of the detector signal period, such as during the period that flip-flop K1 is low and flip-flop K3 is high.

Alternately, the circuits associated with flip-flops K1, K2, and K3 can be replaced with a monostable multivibrator; such a 74LS122 or a 74LS123 retriggerable monostable multivibrator for implementing a retriggerable memory addressing detector and invoking circuits and such as a 74LS221 non-retriggerable monostable multivibrator for implementing a non-retriggerable memory addressing detector and invoking circuits.

Selection Circuits

Memory detector circuits are discussed herein for detecting changes in the MSBs of an address, such as for invoking memory re-addressing operations. Selecting, or partitioning or separating, the MSBs for re-addressing and the LSBs for scanout is shown in FIGS. 4H to 4K and is disclosed elsewhere herein. In various applications, it may be desirable to select the group of address MSBs that are used for invoking memory operations, such as for invoking memory re-addressing. Also, in various applications, it may be desirable to select the modes, time available conditions, etc. that are used for invoking memory operations, such as for invoking memory re-addressing. Also, in various applications, it may be desirable to select the group of address MSBs, the modes, the time available conditions, etc. that are used for invoking memory operations, in a convenient manner; such as by loading a configuration register with a parameter that automatically selects the group of address MSBs, the modes, the time available condition, etc. Two configurations for automatically selecting the group of address MSBs that are used for the invoking memory operations will now be discussed with reference to FIG. 4N for an overflow detector configuration that generates a plurality of overflow detector signals for selection of the desired detector signal and with reference to FIG. 40 for a comparitor detector configuration that selects the address MSBs to be processed by the comparitor. These two configurations are illustrative of selection of other detectors; such as anticipatory detectors, modal detectors, time available detectors, retriggerable and non-retriggerable detectors, etc. and these two configurations are illustrative of other selection circuits for selecting the address MSBs, the mode, the time available, etc.

The selector circuits disclosed herein are particularly applicable to systems that need to change the memory detector configuration and to systems having an address generator that is not readily rewired, such as an IC chip or a PC board having the address generator contained thereon.

In one configuration, it may be desirable to change the type of DRAM chips used in the system and hence it may be desirable to conveniently change the memory architecture without rewiring to adapt to the new type of DRAM chips. For example, the FIG. 4H configuration using by-1 DRAM chips has ten CAS column address bits and has ten RAS row address bits and the FIG. 4J configuration using by-4 DRAM chips has nine CAS column address bits and has nine RAS column address bits. Hence, a memory architecture using by-1 DRAM chips and optionally using by-4 DRAM chips (and not having external scanout as Shown in FIGS. 4H to 4K to extend the scanout addressing circuits) may have to select either MSBs A10 to A19 for by-1 DRAMs and may have to select MSBs A9 to A17 for by-4 DRAMs.

In another configuration, it may be desirable to change the amount of memory and hence to change the number of DRAM chips used in the system. This may involve changing the external scanout circuitry and hence it may be desirable to conveniently change the memory architecture without rewiring. For example, the second and third FIG. 4H configuration is disclosed as having 8-million words, ten internal scanout address bits, three external scanout address bits; indicating an overflow from the thirteenth address LSB.

Figure 4F:
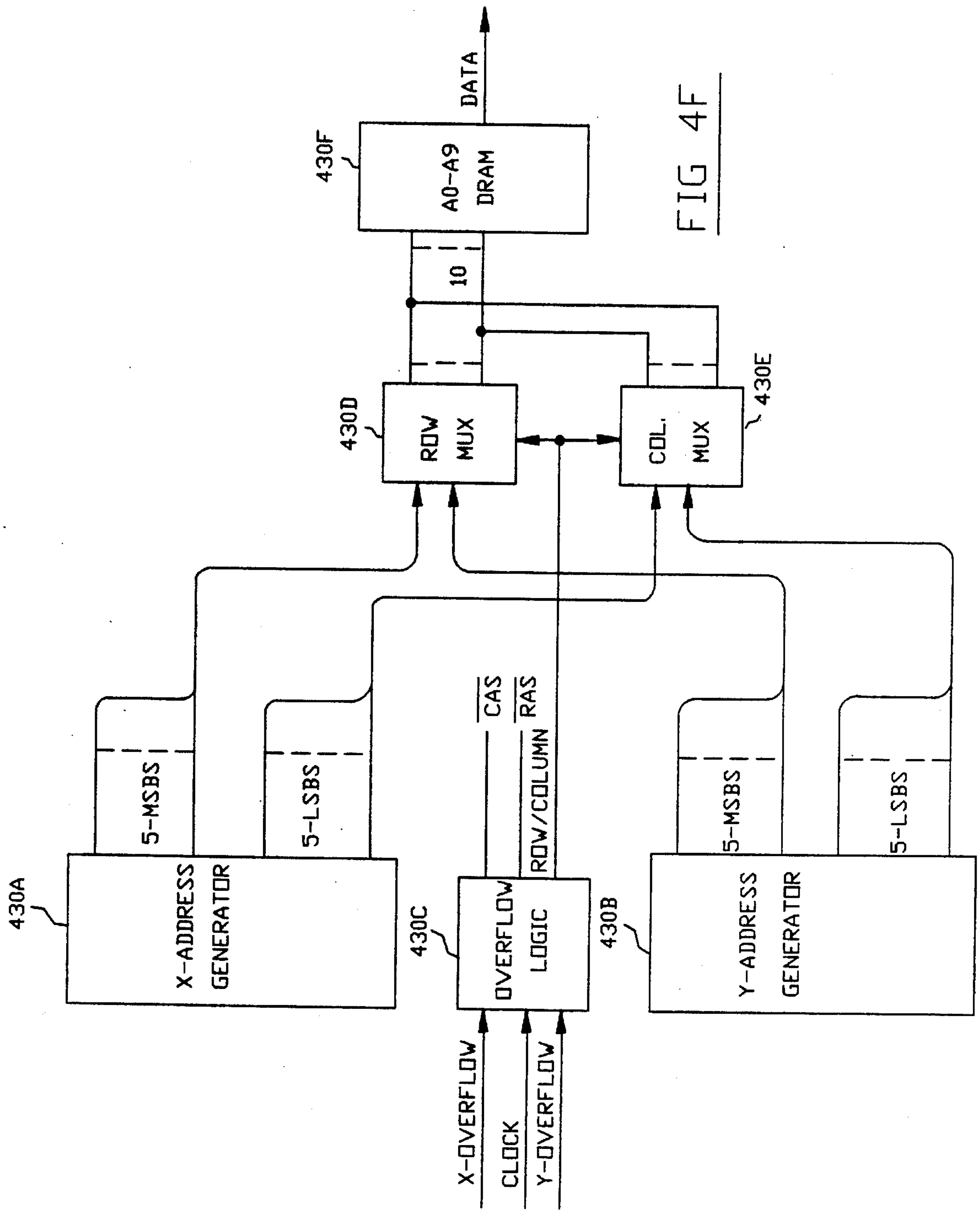
Figure 4G:
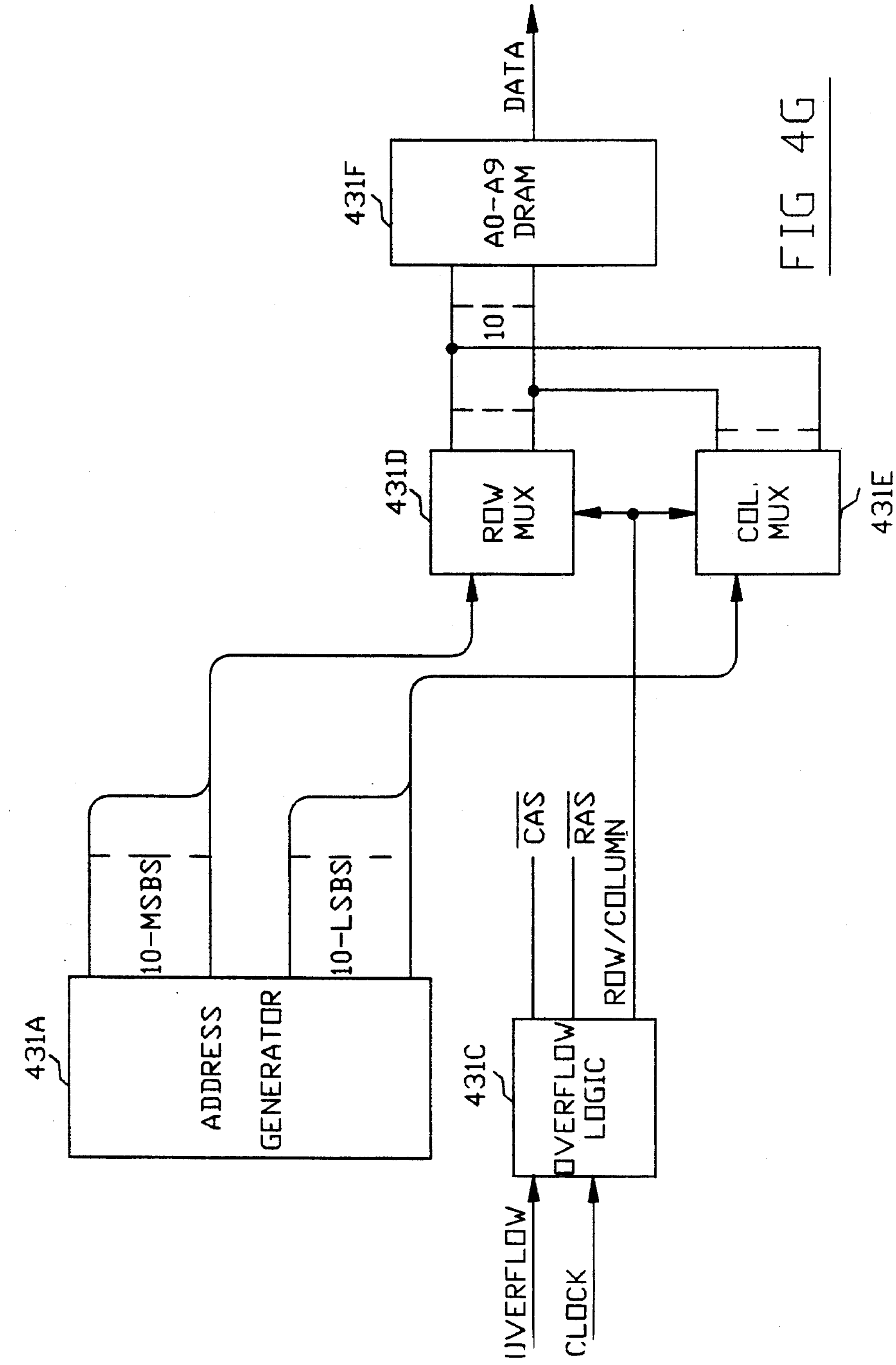
Figure 4H:
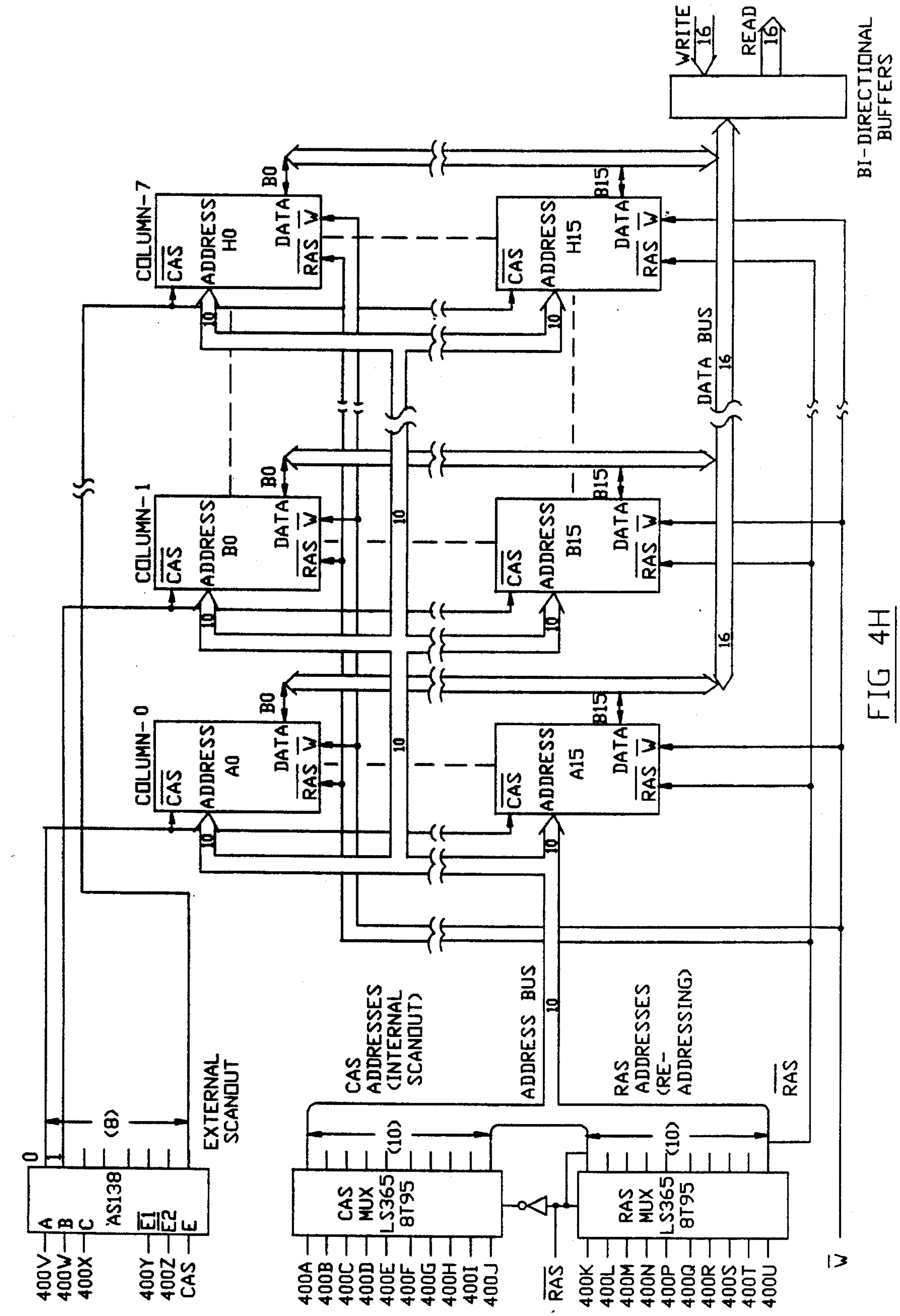

Alternately, for an example of a minimum memory architecture, the second and third FIG. 4H configurations can be adapted to having 1-million words; involving ten internal scanout address bits and no external scanout address bits; indicating an overflow from the tenth address LSB. Alternately, for an example of a maximum memory architecture, the second and third FIG. 4H configurations can be adapted to having 32-million words; involving ten internal scanout address bits and five external scanout address bits; indicating an overflow from the fifteenth address LSB. Consequently, in this example; it is desirable to be able to select an overflow from the tenth to the fifteenth address LSBs.

Figure 4I:
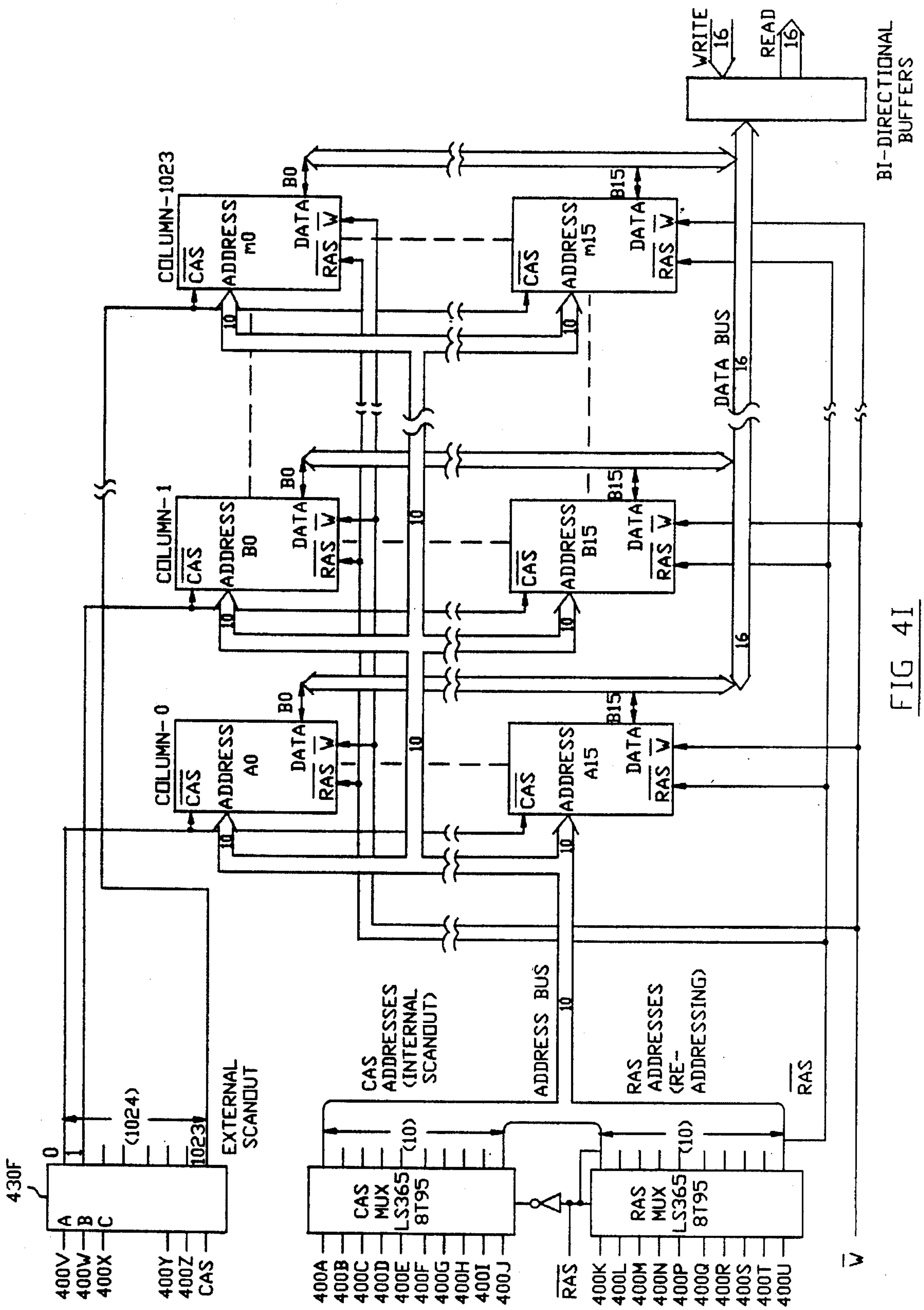
Figure 4J:
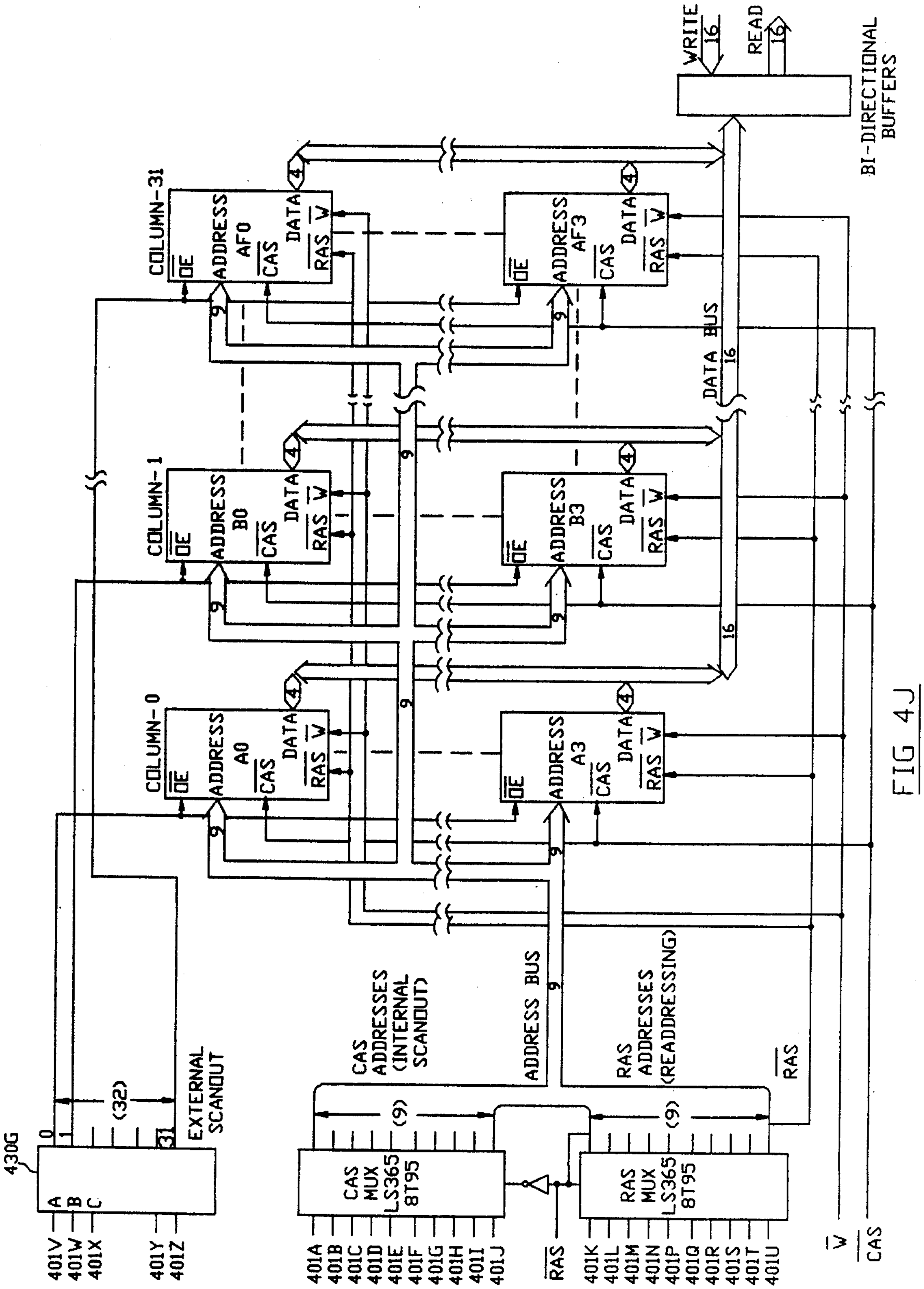
Figure 4K:
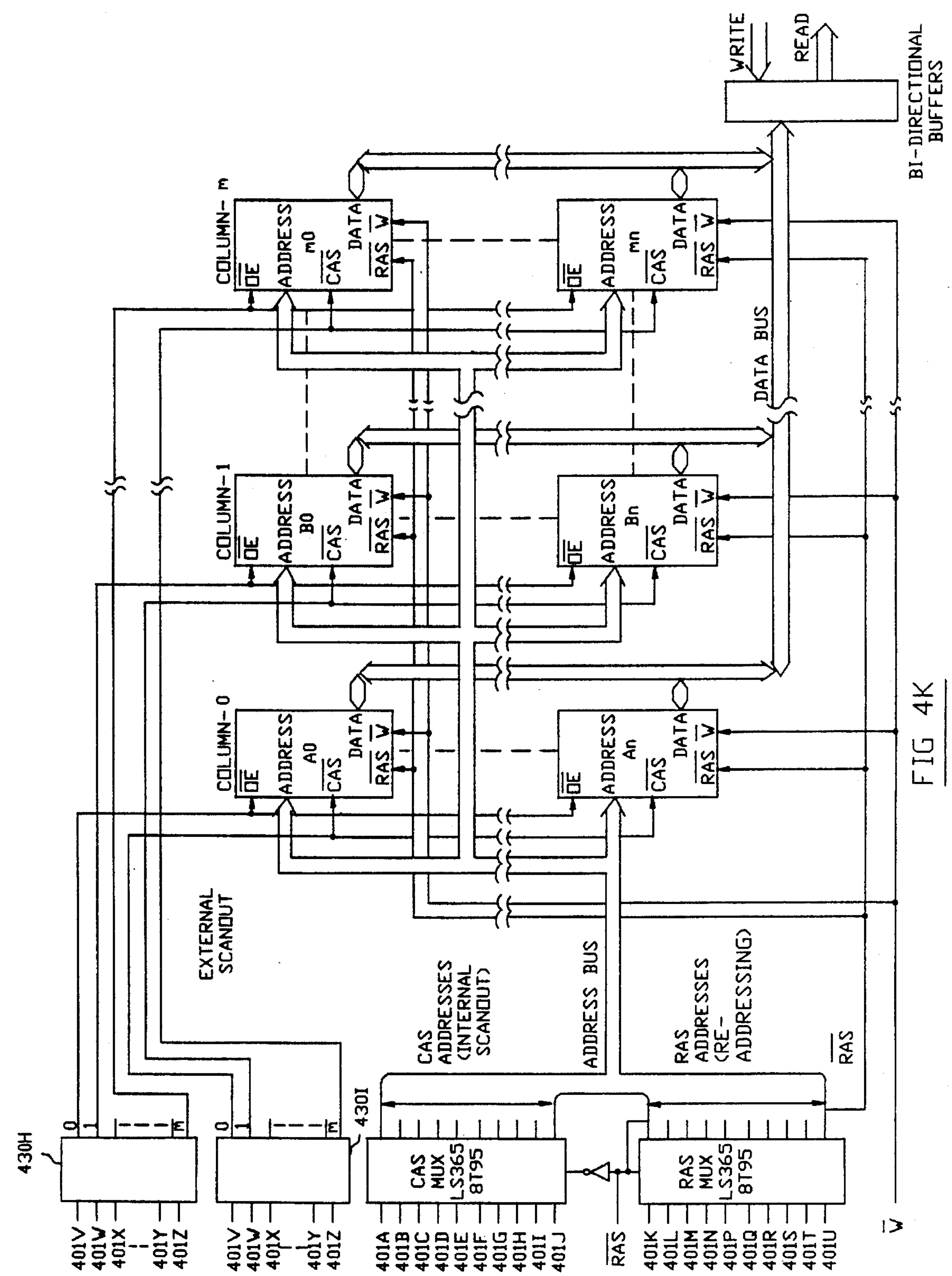
Figure 4L:
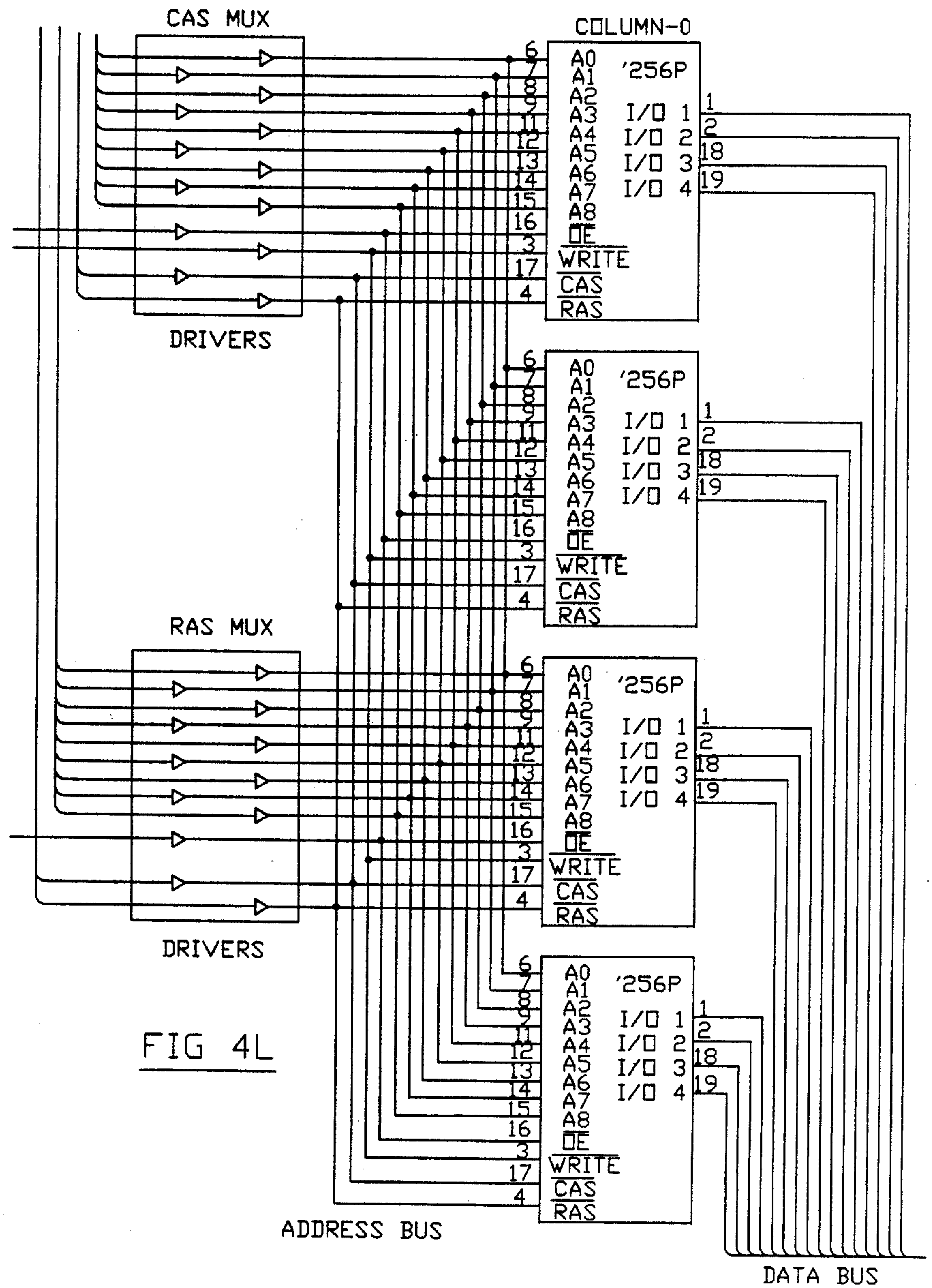
Figure 4M:
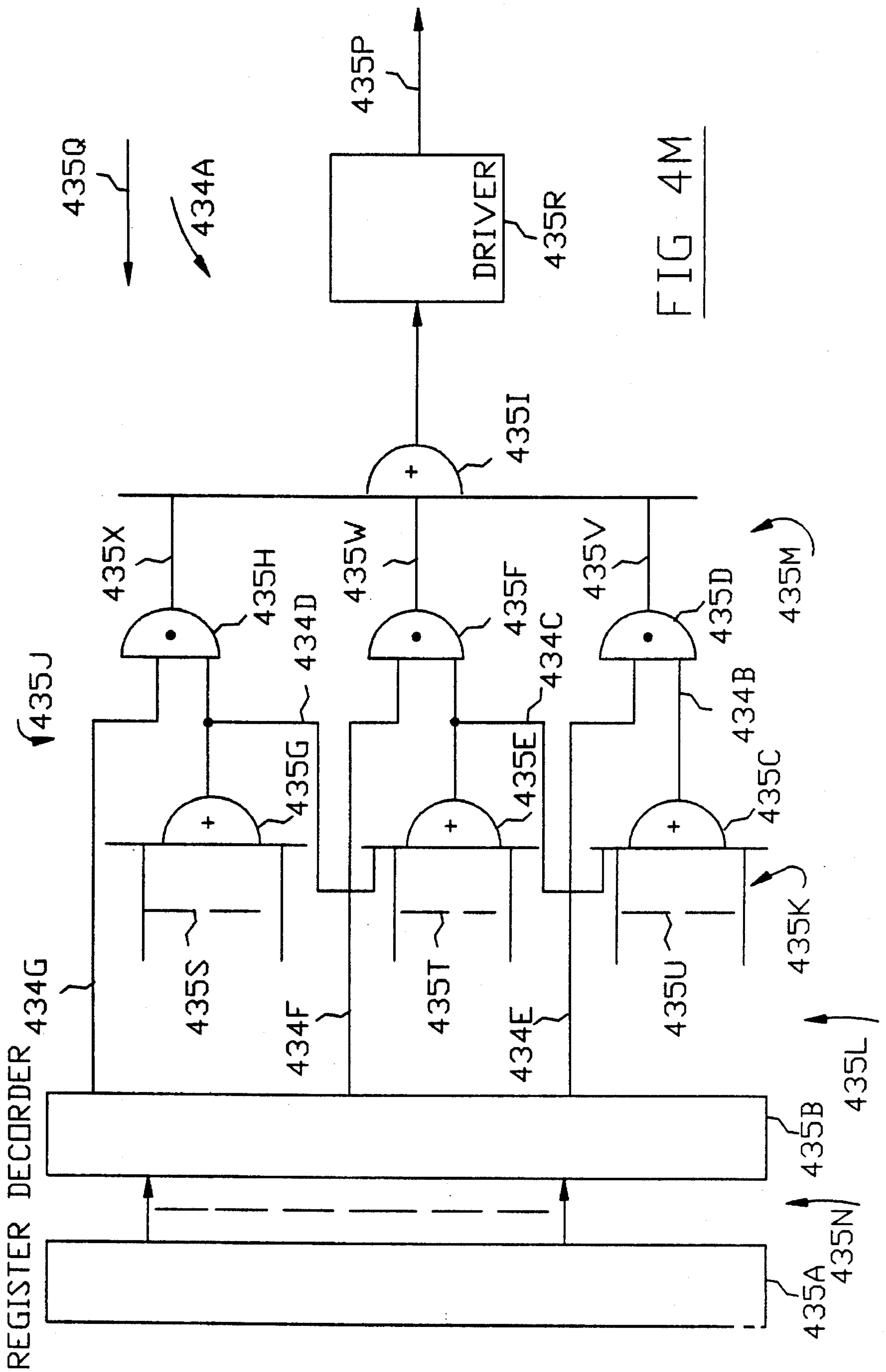
Figure 4P:
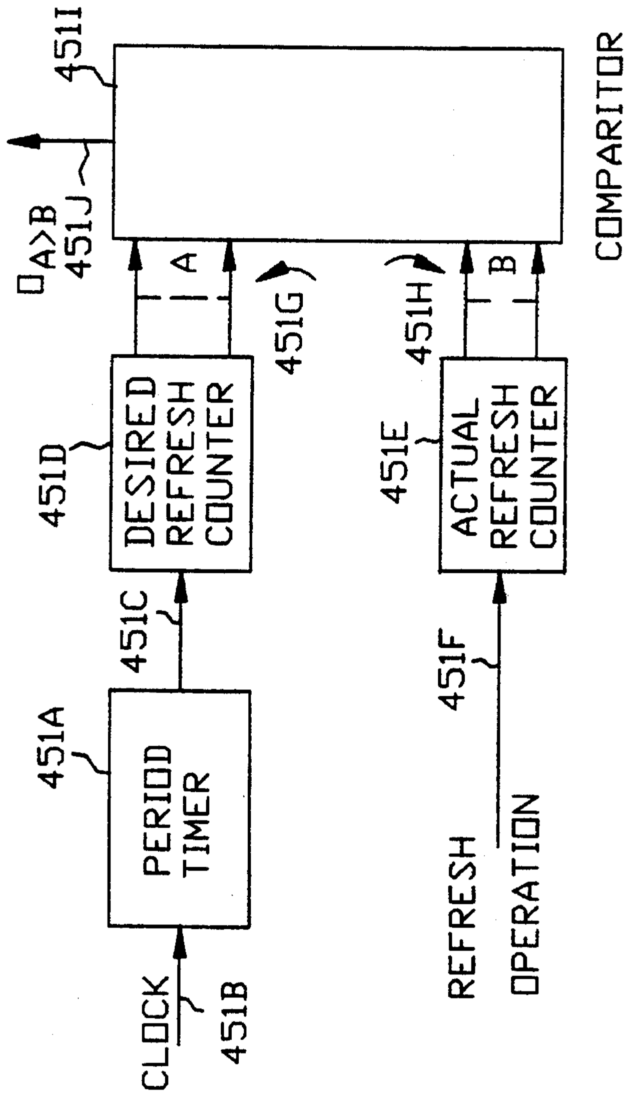
Figure 4N:
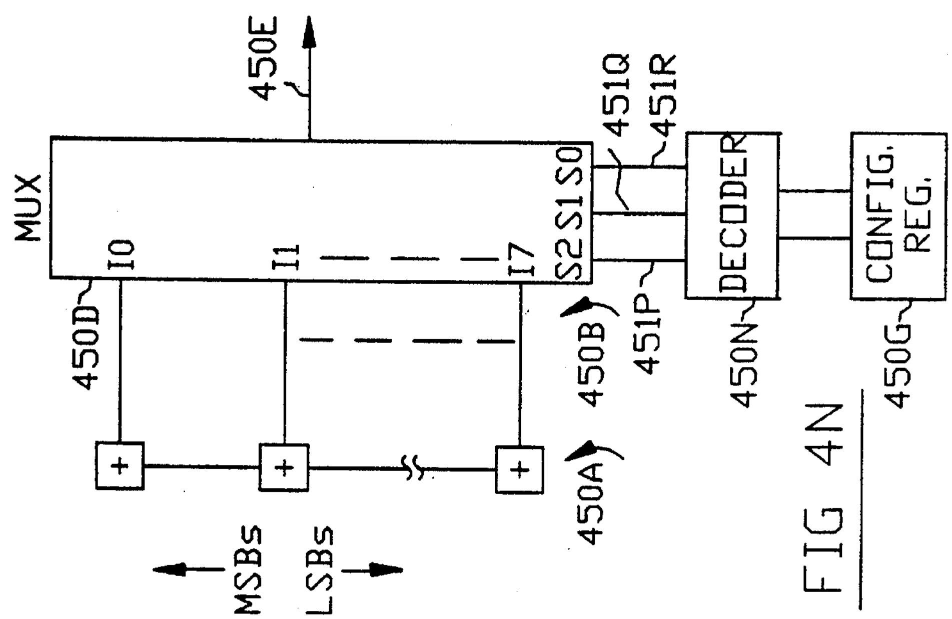

The selection configuration shown in FIG. 4N includes an adder 450A for adding address parameters having a plurality of overflow detectors for generating overflow detector signals 450B to invoke memory operations, a configuration register 450G for storing a configuration parameter, a decoder 450N for generating configuration control signals, and a selector 450D for selecting one of the detector signals 450B as selected detector signal 450E to be used for invoking memory operations. Alternately, a selection configuration can be implemented with an address counter (in place of adder 450A) for counting to update an address parameter having a plurality of counter carry signals from counter stage to counter stage provided as overflow detector signals 450B for invoking memory operations, can be implemented with a configuration latch (in place of register 450G) for storing a configuration parameter, or can be implemented with other circuits. Many other alternate overflow detector selection configurations can be implemented from the teachings herein.

Adder 450A can be implemented with 74LS183 dual adder circuits in place of the 74LS283 quad adder circuits disclosed in FIGS. 6O to 6R because, for the selection arrangement shown in FIG. 4N, it may be desirable to have access to the carry from each stage, which carry signals from each stage are available with said 74LS183 dual adder circuit but are not available with said 74LS283 quad adder circuit.

Configuration register 450G stores a configuration parameter for decoding with decoder 450N to generate configuration control signals 450P, 450Q, and 450R for selecting one of the overflow detector signals 450B to generate the selected overflow detector signal with multiplexer 450D. Configuration register 450G can be implemented with a 74LS174 hex flip-flop circuit. It can be loaded under program control, under operator control, or under other control methods for selecting the overflow signal.

Configuration decoder 450N can be implemented with a 74LS138 decoder circuit.

Selector 450D can be implemented with a 74LS151 multiplexer circuit for permitting the selected one of overflow signals 450B to pass through as signal 450E and for inhibiting the overflow signals 450B that are non-selected.

FIG. 4N shows eight overflow detector signals for simplicity of discussion. However; configuration register 450G and decoder 450N, adder 450A, and multiplexer 450D can readily be reduced or expanded to accommodate five, six, eight, sixteen, sixty-four, or other number of overflow detector signals. For configurations having less re-addressing MSBs; the reduction in re-addressing MSBs is offset by the increase in scanout LSBs.

Figure 4O:
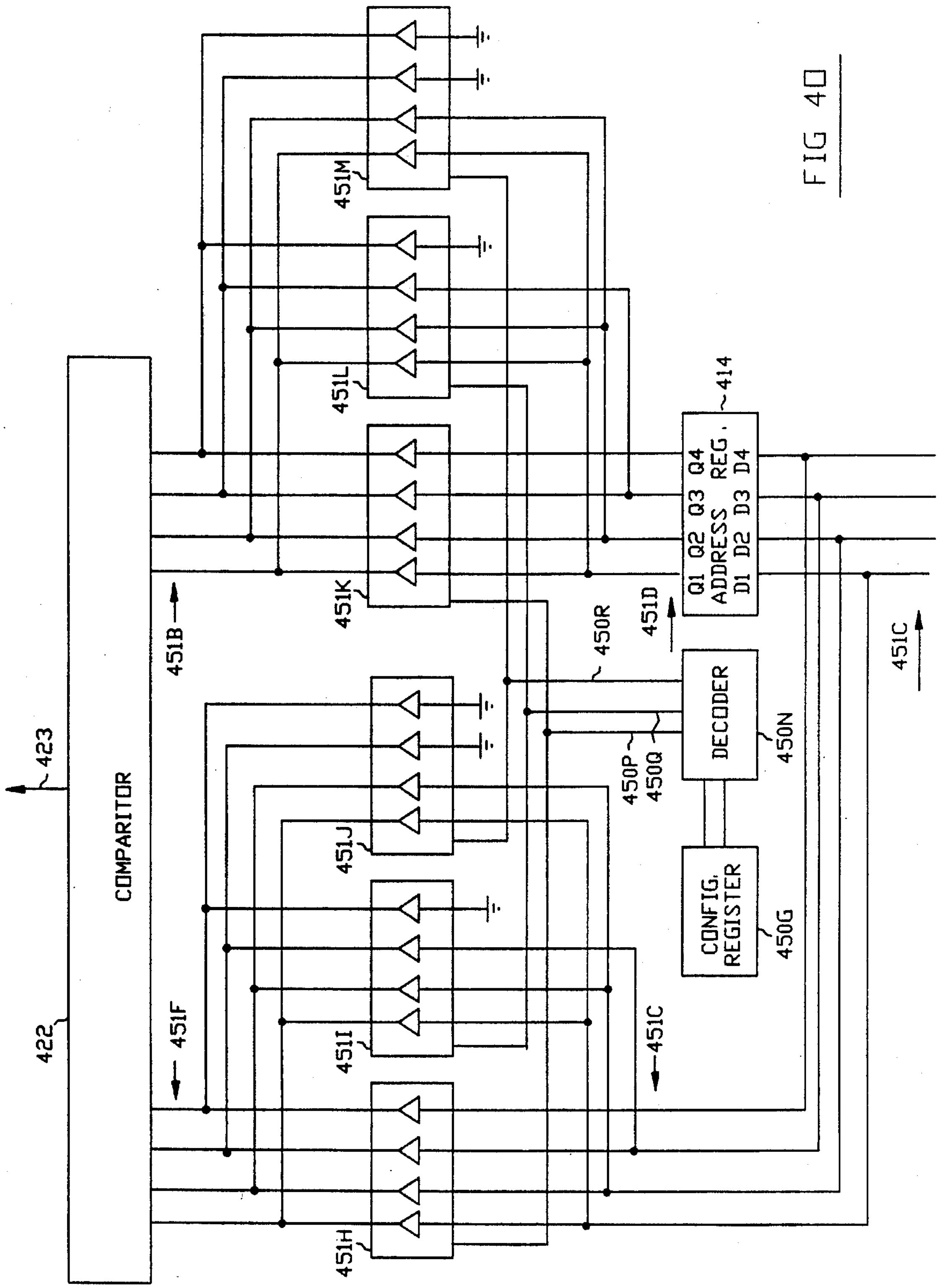

The selection configuration shown in FIG. 4O corresponds to the comparitor detector configurations shown in FIGS. 4D and 4E with the addition of selector circuits 451H, 451I, and 451J inserted in the next address bit lines and selector circuits 451K, 451L, and 451M inserted in the prior address bit lines operating under control of configuration register 450G and decoder 450N. MSB address register 414 corresponds to address register 414 (FIG. 4D) and corresponds to buffer register 414A (FIG. 4E). It loads address signals 451C corresponding to address signals 421A (FIG. 4D) and corresponding to address signals 421B (FIG. 4E) and it generates address signals 451D corresponding to address signals 421B (FIG. 4D) and corresponding to address signals 421C (FIG. 4E). Comparitor 422 corresponds to comparitor 422 (FIGS. 4D and 4E) for generating output signal 423 (FIGS. 4D and 4E) to be used for invoking memory operations in response to the address signals 451B corresponding to address signals 421B (FIG. 4D) and corresponding to address signals 421C (FIG. 4E) and in response to the address signals 451F corresponding to address signals 421A (FIG. 4D) and corresponding to address signals 421B (FIG. 4E). Configuration register 450G stores a configuration parameter for decoding with decoder 450N to generate configuration control signals 450P, 450Q, and 450R for selecting one of the groups of next address MSBs with next address selectors 451H, 451I, and 451J respectively to generate the selected next address MSBs 451F to comparitor 422 and for selecting one of the groups of prior address MSBs with prior address selectors 451K, 451L, and 451M respectively to generate the selected prior address MSBs 451B to comparitor 422.

In FIG. 4O; the groups of next address MSBs and the groups of prior address MSBs have correspondence therebetween. For example, the group of next address MSBs selected by selector circuit 451H under control of selection signal 451P and the group of prior address MSBs selected by selector circuit 451K under control of the same selection signal 451P have the same MSB configuration, all four address MSBs selected for MSB comparison. Also, the group of next address MSBs selected by selector circuit 451I under control of selection signal 451Q and the group of prior address MSBs selected by selector circuit 451L under control of the same selection signal 451Q have the same MSB configuration, three address MSBs selected for MSB comparison. Also, the group of next address MSBs selected by selector circuit 451J under control of selection signal 451R and the group of prior address MSBs selected by selector circuit 451M under control of the same selection signal 451R have the same MSB configuration, three address MSBs selected for MSB comparison. The ground signals on the corresponding address lines of corresponding groups of next address MSBs and prior address MSBs insure that these unused bits properly compare for the prior and next address MSBs.

FIG. 4O shows four MSB address bits for simplicity of discussion. However; configuration register 450G and decoder 450N, address register 414, selector circuits 451H to 451M, and comparitor 422 can readily be expanded to accommodate five, six, eight, sixteen, sixty-four, or other number of address MSBs. Also, for configurations having more scanout LSBs and less re-addressing MSBs (shown by the selectors having grounded inputs); the reduction in re-addressing MSBs is offset by the increase in LSBs and hence the address signals replaced by the grounded inputs are indicated to have been reassigned to scanout logic, such as by increasing the external scanout bits and/or increasing the internal scanout bits.

Configuration register 450G can be implemented with a 74LS174 hex flip-flop circuit. Configuration register 450G can be loaded under program control, under operator control, or under other control methods for selecting the overflow signal.

Configuration decoder 450N can be implemented with a 74LS138 decoder circuit.

Address register 414 can be implemented with a 74LS174 hex flip-flop circuit.

Address selectors 451H, 451I, 451K, 451L, and 451M can be implemented with 74LS365 tristate buffer circuits which are selected by signals from decoder 450N. In a configuration using a 74LS138 decoder and 74LS365 selector circuits, the decoder generates complement (NVL) output signals and the selector circuits use complement (NVL) input control signals.

Shared Address Register

In various applications, an address register may be shared for addressing other circuits in addition to the memory being discussed. The other circuits, other than the memory being discussed (the subject memory), may include another memory (another memory circuit) or a plurality of other memories (other memory circuits) in a multiple memory configuration. Shared address register configurations that share the address register between the subject memory and such other circuits will now be discussed.

Such other circuits may be dedicated to blocks of the address space that are different from the blocks of address Space dedicated to the subject memory. Hence, it may not be necessary to generate re-addressing operations for the subject memory when accessing data from or storing data into another circuit. For example, the RAS row address in a DRAM of the subject memory is typically changed to access data from or store data into a DRAM location in a different block of subject memory supra. However, accessing data from or storing data into another circuit may not affect the DRAMs of the subject memory and hence the DRAMs of the subject memory may not need to be re-addressed when accessing data from or storing data into another circuit. Similarly, when returning to operations in the subject memory after accessing data from or storing data into another circuit that is in another block of address space; it may not be necessary to re-address the subject memory for continuing operations in the subject memory in the same block that was addressed before the data was accessed from or stored into the other circuit. Conversely, when returning to operations in the subject memory after accessing data from or storing data into another circuit that is in another block of address space; it may be necessary to re-address the subject memory for continuing operations in the subject memory in a different block then was addressed before the data was accessed from or stored into the other circuit.

In summary, it may not be necessary to re-address the subject memory when an intervening operation for another circuit sharing the address register of the subject memory is in a different block then with the prior operation of the subject memory and the continuing operation of the subject memory is in the same block as with the prior operation of the subject memory. However, it may be necessary to re-address the subject memory independent of whether there is an intervening operation sharing the memory address register when the continuing operation in the subject memory is in a different block then with the prior operation of the subject memory.

Different memories may be memories that have separate re-addressing; such as different DRAMs having steered RAS signals and hence can be separately RAS re-addressed, different DRAMs having separate chip select signals and hence can be separately RAS re-addressed, and different memories having separate addressing structures and hence can be separately re-addressed. Each of the plurality of memories may be in blocks of address space that is different from the blocks address space of the other memories. Hence, it may not be necessary to generate re-addressing operations in other memory circuits when accessing data from or storing data into the subject memory. For example, the RAS row address in a subject DRAM is typically changed to access data from or store data into a DRAM location in a different block of the subject DRAM. However, accessing data from or storing data into another DRAM having separate re-addressing may not affect the subject DRAM and hence the subject DRAM may not need to be re-addressed when accessing data from or storing data into the other DRAM. Similarly, when returning to operations in the subject DRAM after accessing data from or storing data into the other DRAM that is in another block of address space; it may not be necessary to re-address the subject DRAM for continuing DRAM operations in the same block that was addressed before the data was accessed from or stored into the other DRAM. Conversely, when returning to operations in the subject DRAM after accessing data from or storing data into the other DRAM that is in another block of address space; it may be necessary to re-address the subject DRAM for continuing operations in a different block in the subject DRAM then was addressed before the data was accessed from or stored into the other DRAM.

In summary, it may not be necessary to re-address the subject DRAM when an intervening operation for another DRAM sharing the memory address register is in a different block then with the prior operation in the subject DRAM and the continuing operation in the subject DRAM is in the same block as with the prior operation of the subject DRAM. Further, it may be necessary to re-address the subject DRAM independent of whether there is an intervening operation sharing the memory address register when the continuing operation in the subject DRAM is in a different block then with the prior operation of the subject DRAM.

Multiple memories can be implemented with scanout and re-addressing. Each memory can have its own detector for detecting a re-addressing condition and each memory can have its own buffer register in the detector to store the prior address MSBs for subsequent operations following intervening of another one of the memories (i.e.; FIGS. 4C to 4E).

An example of multiple memory operations will now be discussed in an improved computer embodiment. An ROM can be implemented as a main memory for storing a program and an RAM can be implemented as an operand memory to store operands under control of the program because operands cannot be stored in ROM because ROM is not alterable by the program. The ROM may not have RAS/CAS internal scanout and re-addressing capability but the RAM may have RAS/CAS internal scanout and re-addressing capability. Hence, use of scanout and re-addressing for the RAM can provide important performance enhancement, with or without use of scanout and re-addressing for the ROM. In this configuration, the ROM and the RAM may be considered to be different memories sharing the memory address register. A memory detector and delay circuit can be implemented for RAM operand accesses and RAM operand stores under control of the program stored in the ROM to enhance performance of RAM accesses and stores. A memory detector and delay circuit can be implemented for ROM instruction accesses to enhance performance of the ROM in combination with the memory detector and delay circuit implemented for RAM operand accesses and RAM operand stores. Alternately, a memory detector and delay circuit need not be implemented for ROM instruction accesses in combination with the memory detector and delay circuit implemented for RAM operand accesses and RAM operand stores.

Examples of other circuits that can that share an address register with subject memory will now be discussed for a stored program computer application. A memory address register may be used for addressing input and output circuits in addition to addressing RAM, such as with memory mapped input and output circuits that are included in the address space addressed by the computer address register. Further, a memory address register may be used for addressing ROM in addition to addressing RAM, such as with the computers having a ROM included in the address space addressed by the microprocessor address register. Also, a memory address register may be used for addressing a display image memory in addition to addressing RAM, such as with computers having a display image memory included in the address space addressed by the microprocessor address register. Also, a memory address register may be used-for addressing a plurality of banks of memory each having a separate RAS addressing structure and hence may be considered to be different memory.

Examples of other devices and circuits that can share an address register with memory will now be discussed for a special purpose processor; such as a display processor, array processor, filter processor, signal processor, cache memory processor, artificial intelligence processor, or other application. A memory address register may be time shared for addressing input and output circuits in addition to addressing RAM. A memory address register may be used for addressing a ROM in addition to addressing main memory RAM.

An address detector 432J (FIG. 4E) for the subject memory can be implemented to generate an address detector signal 432H for the subject memory (a) to enable scanout and re-addressing of the subject memory when an address of the subject memory that is inside the address space of the subject memory is generated by the address register and (b) to disable scanout and re-addressing of the subject memory when another address that is outside the address space of the subject memory is generated by the address register. For operations inside of the address space of the subject memory, scanout and re-addressing operations for the subject memory proceed as if the memory address register were not shared. For operations outside of the address space of the subject memory, scanout and re-addressing operations for the subject memory are disabled. For changes in operations from the address space of the subject memory to the address space of the other circuits, scanout and re-addressing operations for the subject memory are disabled. For changes in operations from the address space of the other circuits to the address space of the subject memory, scanout and re-addressing operations for the subject memory commence from where they were disabled when the memory operations changed from the address space of the subject memory to the address space of the other circuits as if the operations of the subject memory had not been exited and as if the memory address register were not shared. For this latter example of changes in operations from the address space of the other circuits to the address space of the subject memory, (a) if the first continuing address in the address space of the subject memory is in the same block as the prior address stored in the buffer register representing the last block of operations before exiting the address space of the subject memory; then a scanout operation is invoked to maintain the same block of operations in the subject memory; and (b) if the first continuing address in the address space of the subject memory is in a different block compared to the prior address stored in the buffer register representing the last block of operations before exiting the address space of the subject memory; then a re-addressing operation is invoked to change blocks of the subject memory. If a shared memory address register configuration is implemented in accordance with the above, such as shown in FIG. 4E; then operations in the subject memory will proceed as if the memory address register is not shared and without invoking extra re-addressing operations notwithstanding intervening operations outside the address space of the subject memory.

For simplicity of discussion herein, the address space of the subject memory having scanout and re-addressing may be discussed as the subject memory address space, the subject memory addresses, and terms related thereto and the address space of the other circuits not having the subject memory scanout and re-addressing may be discussed as other memory address space, other memory addresses, and terms related thereto. Although other circuits may share the address register and the address space with the subject memory, such other circuits may not need to be implemented to share the subject memory and hence may not need to re-address the subject memory when the address register MSBs are changed to exit the address space of the subject memory in order to enter the address space of another circuit or when the address register MSBs are changed to exit the address space of another circuit in order to enter the address space of the subject memory or when the address register MSBs are changed between blocks of address space dedicated to other circuits. In such configurations, it may be desirable to disable the detector when addressing other circuits (including other memory circuits) that share the address space and the address register with the subject memory and to enable the detector when addressing the subject memory.

Various detector enabling and disabling control circuits can be configured for enabling and disabling an overflow detector, a comparitor detector, an anticipatory detector, a modal detector, a time available detector, and other detectors. Alternately, re-addressing circuitry, such as associated with the detector or the re-addressing invoking function, can be controlled for enabling and disabling of re-addressing operations. For example, in an overflow detector configuration (i.e., FIGS. 6C and 6W), an enable and disable control signal can be used to control overflow detection gates U16A-3, U16A-6, U17A-3, and U17A-6; or to control flip-flop U23C-10; or to otherwise control the overflow detector and re-addressing circuitry. Similarly, in a modal detector configuration, a time available detector configuration, or an anticipatory detector configuration (i.e., FIGS. 6C and 6W), an enable and disable control signal (i.e., the RUN signal) can be used to control overflow detection gates U16A-3, U16A-6, U17A-3, and U17A-6 (not shown in FIG. 6C and FIG. 6W); or to control flip-flop K1 (i.e., FIG. 6W); or to control flip-flops K2 and K3 (i.e., FIG. 6W); or to otherwise control a modal detector, a time available detector, or an anticipatory detector and re-addressing circuitry. Similarly, in a comparitor detector configuration (i.e., FIGS. 4D and 4E), an enable and disable control signal can be used to control comparitor 422 or to otherwise control the comparitor detector and re-addressing circuitry; as further discussed in the comparitor section herein. For example, as shown in FIG. 4E; control signal 432H can be generated by logic 432J detecting whether address signals 421B are within the RAM address space or are outside of the RAM address space. Logic 432J can be implemented to generate address detector signal 432H to detect when the address MSBs pertain to the RAM address space. Control signal 432H can be used to gate the Ø2 clock 432E with gate 432F to generate gated Ø2 clock 432G to selectively control buffer register 414A. Also, control signal 432H can be used to control comparitor 422, such as to enable and disable comparitor signal 423 for enabling auxiliary memory operations when in the RAM address space and for disabling auxiliary memory operations when not in the RAM address space. Other control circuits can readily be implemented; such as clock gating circuits, logical gates for enabling and disabling signals, and other control circuits.

A re-addressing strategy will now be discussed with reference to FIG. 4E. This re-addressing strategy can readily be implemented with circuitry in a hardware configuration (i.e., FIG. 4E) and alternately with program instructions in software or firmware configurations.

A processor is implemented to share an address register having operations in the subject memory needing re-addressing and having operations in other circuits not needing re-addressing. An address detector 432J (FIG. 4E) for the subject memory can be implemented to generate an address detector signal 432H for the subject memory (a) to enable scanout and re-addressing of the subject memory when an address of the subject memory that is inside the address space of the subject memory is generated by the address register and (b) to disable scanout and re-addressing of the subject memory when another address that is outside the address space of the subject memory is generated by the address register. For operations inside of the address space of the subject memory, scanout and re-addressing operations for the subject memory proceed as if the memory address register were not shared. For operations outside of the address space of the subject memory, scanout and re-addressing operations for the subject memory are disabled. For changes in operations from the address space of the subject memory to the address space of the other circuits, scanout and re-addressing operations for the subject memory are disabled. For changes in operations from the address space of the other circuits to the address space of the subject memory, scanout and re-addressing operations for the subject memory commence from where they were disabled when the memory operation changed from the address space of the subject memory to the address space of the other circuits as if the operations of the subject memory had not been exited and as if the memory address register were not shared. For this latter example of changes in operations from the address space of the other circuits to the address space of the subject memory, (a) if the first continuing address in the address space of the subject memory is in the same block as the prior address stored in the buffer register representing the last block of operations before exiting the address space of the subject memory; then a scanout operation is invoked to maintain the same block of operations in the subject memory; and (b) if the first continuing address in the address space of the subject memory is in a different block compared to the prior address stored in the buffer register representing the last block of operations before exiting the address space of the subject memory; then a re-addressing operation is invoked to change blocks of the subject memory. If a shared memory address register configuration is implemented in accordance with the above, such as shown in FIG. 4E; then operations in the subject memory will proceed as if the memory address register is not shared and without invoking extra re-addressing operations notwithstanding intervening operations outside the address space of the subject memory.

The above discussed configuration will now be discussed for the case where the other circuits include a second memory having scanout and re-addressing operations. A processor is implemented to share an address register having operations in a first memory (the subject memory) needing re-addressing and having operations in a second memory (the other circuits) needing re-addressing. In this configuration; the first memory and the second memory each have dedicated comparitor detectors that are the same as the comparitor detector shown in FIG. 4E being replicated for each of the two memories except that the address detector logic 432J is different for each of the two replicated comparitor detectors. The address 421B from register 414 is fanned out to two comparitor detector circuits each detector circuit having a buffer register 414A generating prior address signals 421C in response to next address signals 414A and in response to gated clock signal 432G generated by gate 432F under control of address detector signal 432H and clock 432E; an address detector 432J generating address signal 432H in response to address signals 421B; and comparitor 422 generating detector signal 423 in response to address signals 421C. The address detector logic 432J for each of the two memories is configured to detect the address space of the memory to which it is dedicated. Hence, as operations change back and forth between the two memories, the FIG. 4E detector dedicated to the memory whose address space is addressed by the memory address register is enabled by the address detector 432J therein to generate scanout and re-addressing operations and the FIG. 4E detectors dedicated to the memory whose memory space is not addressed by the memory address register is disabled by the address detector 432J therein and hence does not generate scanout and re-addressing operations. For example, as operations change from the first memory to the second memory; the FIG. 4E detector dedicated to the first memory detects the exiting of the address space of the first memory with address logic 432J to cease memory operations for the first memory and the FIG. 4E detector dedicated to the second memory detects the entering of the address space of the second memory with address logic 432J to commence memory operations for the second memory. Then, as operations change from the second memory back to the first memory; the FIG. 4E detector dedicated to the second memory detects the exiting of the address space of the second memory with address logic 432J to cease memory operations for the second memory and the FIG. 4E detector dedicated to the first memory detects the entering of the address space of the first memory with address logic 432J to commence memory operations for the first memory.

The above discussed configuration will now be discussed for the case where the other circuits include a second memory and a third memory each having scanout and re-addressing operations. A processor is implemented to share an address register having operations in a first memory (the subject memory) needing re-addressing and having operations in a second memory and in a third memory (the other circuits) each needing re-addressing. In this configuration; the first memory, the second memory, and the third memory each have dedicated comparitor detectors that are the same as the comparitor detector shown in FIG. 4E being replicated for each of the three memories except that the address detector logic 432J is different for each of the three replicated comparitor detectors. The address 421B from register 414 is fanned out to three comparitor detector circuits each detector circuit having a buffer register 414A generating prior address signals 421C in response to next address signals 414A and in response to gated clock signal 432G generated by gate 432F under control of address detector signal 432H and clock 432E; an address detector 432J generating address signal 432H in response to address signals 421B; and comparitor 422 generating detector signal 423 in response to address signals 421C. The address detector logic 432J for each of the three memories is configured to detect the address space of the memory to which it is dedicated. Hence, as operations change back and forth between the three memories, the FIG. 4E detector dedicated to the memory whose address space is addressed by the memory address register is enabled by the address detector 432J therein to generate scanout and re-addressing operations and the FIG. 4E detectors dedicated to the two memories whose memory space is not addressed by the memory address register are disabled by the address detectors 432J therein and hence do not generate scanout and re-addressing operations. For example, as operations change from the first memory to the second memory; the FIG. 4E detector dedicated to the first memory detects the exiting of the address space of the first memory with address logic 432J to cease memory operations for the first memory, the FIG. 4E detector dedicated to the second memory detects the entering of the address space of the second memory with address logic 432J to commence memory operations for the second memory, and the FIG. 4E detector dedicated to the third memory detects the address space of the second memory with address logic 432J to continue to disable memory operations for the third memory. Then, as operations change from the second memory back to the first memory; the FIG. 4E detector dedicated to the Second memory detects the exiting of the address space of the second memory with address logic 432J to cease memory operations for the second memory, the FIG. 4E detector dedicated to the first memory detects the entering of the address space of the first memory with address logic 432J to commence memory operations for the first memory, and the FIG. 4E detector dedicated to the third memory detects the address space of the second memory with address logic 432J to continue to disable memory operations for the third memory. Then, as operations change from the first memory to the third memory; the FIG. 4E detector dedicated to the first memory detects the exiting of the address space of the first memory with address logic 432J to cease memory operations for the first memory, the FIG. 4E detector dedicated to the third memory detects the entering of the address space of the third memory with address logic 432J to commence memory operations for the third memory, and the FIG. 4E detector dedicated to the second memory detects the address space of the third memory with address logic 432J to continue to disable memory operations for the second memory. Then, as operations change from the third memory to the second memory; the FIG. 4E detector dedicated to the third memory detects the exiting of the address space of the third memory with address logic 432J to cease memory operations for the third memory, the FIG. 4E detector dedicated to the second memory detects the entering of the address space of the second memory with address logic 432J to commence memory operations for the second memory, and the FIG. 4E detector dedicated to the first memory detects the address space of the second memory with address logic 432J to continue to disable memory operations for the first memory.

The above discussed shared address register configuration can readily have a single memory and one or more other circuits sharing the memory address register, a plurality of memories sharing the memory address register, a plurality of memories and one or more other circuits sharing the memory address register, or other such configuration.

The shared address register configuration is discussed herein in the context of the FIG. 4E detector configuration for simplicity of discussion. However, it will be readily recognized that multitudes of different types of memory detectors, such as the memory detectors disclosed herein, can be used to implement this shared address configuration. For example, the same type of detectors can be used for a plurality of different memories and circuits sharing the same address register. Alternately, different types of detectors can be used for each of a plurality of different memories and circuits sharing the same address register. Also, combinations of the same types of detectors and different types of detectors can be used for different memories and circuits sharing the same address register.

The shared address register configuration is discussed herein without specifically addressing delay circuits for simplicity of discussion. However, will be readily recognized that multitudes of different types of different types of delay circuits, such as the delay circuits disclosed herein, can be used to implement this shared address configuration. For example, the same type of delay circuits can be used for a plurality of different memories and circuits sharing the same address register. Alternately, different types of delay circuits can be used for each of a plurality of different memories and circuits sharing the same address register. Also, combinations of the same types of delay circuits and different types of delay circuits can be used for different memories and circuits sharing the same address register.

Further, it will be readily recognized that multitudes of different types of memory detectors and multitudes of different types of delay circuits can be used to implement this shared address configuration. For example, the same type of detectors and the same type of delay circuits can be used for a plurality of different memories and circuits sharing the same address register. Alternately, different types of detectors and different types of delay circuits can be used for each of a plurality of different memories and circuits sharing the same address register. Also, combinations of the same type of detectors and the same type of delay circuits and different types of detectors and different types of delay circuits can be used in various combinations and permutations for different memories and circuits sharing the same address register. For example; a first type of detector and a first type of delay circuit can be used with a first memory, the first type of detector and the first type of delay circuit can be used with a second memory, a second type of detector and a first type of delay circuit can be used with a third memory, and the second type of detector and a second type of delay circuit can be used with a forth memory.

Delaying Circuits

Introduction

Disabling and delaying circuits can be used in accordance with the present invention, such as in conjunction with detector circuits (i.e., FIGS. 4B and 4C). A clock gating arrangement for disabling or delaying memory operations is disclosed in detail with reference to FIG. 6C that is appropriate to a specially designed or custom processor that has a clock gating capability. Other arrangements for disabling or delaying memory operations can also be provided that are appropriate to non-custom processors and are appropriate to standard processors. For example, various standard processors, such as microprocessors, have circuits that provide for disabling or delaying processor operations; which disabling or delaying processor circuits are also appropriate for use in disabling or delaying processor and memory operations in accordance with re-addressing operations, as disclosed herein. These disabling and delaying circuits include wait, hold, DTACK, and other microprocessor-related circuits infra. Various control circuits-can be used to control such wait, hold, DTACK, and other circuits. In addition, custom processors can be designed to optimize uses of the features of the present invention. For example, a custom processor can be designed to operate at a higher speed scanout rate until a change is detected in address MSBs at which time the system can be disabled, slowed down, or otherwise adjusted for the re-addressing operation. Also, a custom microprocessor can be designed to generate instruction execution signals that are specific to scanout, re-addressing, and refresh mode operations.

Disabling and timing operations; such as the DTACK, READY, HOLD, etc. circuits of microprocessors; are well known in the art and are conventionally used for disabling and delaying for slow peripherals, slow memories, etc. However, these prior art uses are significantly different from the features of the present invention. For example, prior art devices invoke a fixed delay when they are selected. This can be illustrated with the IBM PC\XT memory circuits which generate a fixed RAS and CAS cycle for every DRAM access and invoke a wait state delay, such as a one wait state delay or a two wait state delay, for each RAS and CAS cycle. The IBM PC\XT does not have a memory address detector and certainly not a memory address detector to detect the state of the address MSBs, nor to detect a change in the address MSBs, nor to invoke a delay in response to detection of a change in the address MSBs, nor to inhibit a delay in response to detection of static (non-changed) address MSBs; as is disclosed in accordance with the system of the present invention. However, an upgrade of the IBM PC circuitry may be provided in accordance with the teachings of the present invention.

Clock Gating Delaying Circuits

Clock gating circuits have been found to be particularly useful for disabling or delaying memory operations. Clock gating hazards; such as shaving clock pulses, causing "glitches", and other hazards; have been considered in the previously described clock gating circuits shown in FIGS. 6C and 6D.

Synchronous devices operate in response to clock pulse signals, strobes, or other Synchronizing signals. Gating of a clock signal in a hazard free manner, as previously described, can provide a disabling or delaying operation. Clock gating logic can be implemented internal to a processor IC chip, such as being embedded in the IC processor logic; external to a processor IC chip, such as gating of a clock signal before the clock signal is input to a processor IC chip; and in other forms.

Wait State Delaying Circuits

Conventional microprocessors have circuits for disabling or delaying operations, sometimes implemented by introducing "wait states" supra. Such circuits can also be used for other types of processors.

The 8086 family of microprocessors provided by Intel Corp.; i.e. the 8086, 8088, and 80286 microprocessors; implement wait states that can be controlled by a READY input signal to the microprocessor IC chips. The READY signal can be generated by digital logic, such as implemented by Clock Generator IC chips that are available from Intel Corp.; i.e. the 8284 family including the 8284 and 82284 Clock Generator IC chips; that operate under control of a RDY input signal. See the 8086 Family User's Manual (October 1979) by Intel Corp.; such as at pages 410, A-23 to A-25, B-9, B-69, B-70. Also see the TECHNICAL REFERENCE (September 1985) by IBM Corp., such as at pages 1–76 and 1–82.

The 8085 microprocessor provided by Intel Corp. also implements wait states that can be controlled by a READY input signal to the microprocessor IC chip. See the MCS-85 USER'S MANUAL (September 1978), such as at pages 5-2 and 5-6. The READY signal can be generated by digital logic, such as implemented with the Intel 8284 and 82284 Clock Generator IC chips for the 8086 family of microprocessors supra.

The 68000 family of microprocessors provided by Motorola Inc.; i.e. the 68000, 68020, and 68030 microprocessors; implement a form of wait states that can be controlled by a DSACK input signal to the microprocessor IC chips. See the MC68020 User's Manual (1984) by Motorola Inc., such as at page 4-3. The DSACK signal can be generated by well known digital logic.

Other Delaying Circuits

Conventional computers have circuits other than "wait state" circuits for disabling or delaying operations. For example, processor operation can be disabled by a HOLD input signal to microprocessor IC chips that are available from Intel Corp.; i.e. the 8086 microprocessor family including the 8086 and 8088 microprocessors and the 8085 microprocessor. See the 8086 Family User's Manual (October 1979) by Intel Corp., such as at page B-11. Also see the MCS-85 USER'S MANUAL (September 1978), such as at pages 5-2 and 5-6. Also, processor operation can be disabled by a DTACK input signal to microprocessor IC chips that are available from Motorola Inc.; i.e. the 68000 family of microprocessors. Also, processor operation can be disabled by a HALT input signal to microprocessor IC chips that are available from Motorola Inc.; i.e. the 68020 and 6800 microprocessors. See the MC68020 User's Manual (1984) by Motorola Inc., such as at page 4-5. Also see the 8-BIT MICROPROCESSOR & PERIPHERAL DATA manual (1983) by Motorola Inc., such as at page 3-157.

In certain applications, it may be desirable to disable transferring of data rather than stopping the processor. For example, data can be stored in a register and, upon invoking of a delay or disabling operation, the data can be enabled to pass from the output of the register to the input of the register. Consequently, continued clocking of the register will result in the data stored in the register being preserved. This is an alternate to gating of the clock to preserving of the data in the register.

In configurations, such as micro-programmable computers and state machines discussed herein; disabling and delaying operations can be implemented by disabling or delaying micro-operations or states. Such micro-operations or states can hold for a period of time, loop for a period of time, or otherwise disable or delay operations. An auxiliary timer can be used to determine when the time is up for the disabling or timing operation.

Multiple Detector and Delay Circuits

Multiple detector and delay circuits can be implemented in accordance with the present invention. For example, a shared memory address configuration supra can be implemented having a plurality of detector and delay circuits, such as in a shared memory address configuration having a plurality of memory circuits each with scanout and re-addressing capability. Also, a detector circuit can have multiple detectors contained therewith, such as in a shared memory address configuration having an address space detector 432J to detect if the address register is addressing the address space of the subject memory and having a comparitor detector 422 to detect if the MSBs of the address register have been changed (FIG. 4E). Also, one or more memories may each have a plurality of detector and delay circuits, such as for multiple scanout modes (i.e., an internal scanout mode and an external scanout mode) each having its own detector and delay circuit for providing different delays. Multiple detector configurations for sharing a memory address register with multiple memories are discussed in detail in the section entitled Shared Address Register herein. A detector circuit having multiple detectors included therein is discussed in detail in the section entitled Shared Address Register herein. Multiple detector configurations for a particular memory are discussed in detail below.

Multiple detectors can be used for a single memory and for a plurality of memories to detect appropriate conditions and to invoke a time delay in response thereto. The detected condition may be either the same or different for each detector circuit and the time delay may be either the same of different for each time delay circuit.

A first multiple detector and delay example will now be discussed for the Second FIG. 4H Configuration herein. This configuration has internal scanout and external scanout with the internal scanout bits implemented as the least significant bits and the external scanout bits implemented as the middle significant bits. For this first multiple detector and delay example, it will be assumed that the internal scanout propagation delays are shorter than the external scanout propagation delays and hence the internal scanout operations can be implemented to be faster than the external scanout operations. The memory can be implemented with two detectors (i.e., FIGS. 4B and 4C), a first detector generating a first detector signal that is indicative of a memory address change in the middle significant bits and a second detector generating a second detector signal that is indicative of a memory address change in the most significant bits. For the condition that neither the first detector detects a memory address change in the middle significant bits nor the second detector detects a memory address change in the most significant bits; internal scanout can be controlled to proceed at the highest memory rate within the block of least significant bits. For the condition that the first detector detects a memory address change in the middle significant bits and the second detector does not detect a memory address change in the most significant bits; internal scanout can be disabled and external scanout can be controlled to proceed at the medium memory rate within the block of middle significant bits. For the condition that the second detector detects a memory address change in the most significant bits, independent of the condition detected by the first detector in the middle significant bits; internal scanout and external scanout can both be disabled and re-addressing can be controlled to proceed at the lowest memory rate within the block of most significant bits.

A second multiple detector and delay example will now be discussed for the Third FIG. 4H Configuration herein. This configuration has internal scanout and external scanout with the external scanout bits implemented as the least significant bits and the internal scanout bits implemented as the middle significant bits. For this second multiple detector and delay example, it will be assumed that the external scanout propagation delays are shorter than the internal scanout propagation delays and hence the external scanout operations can be implemented to be faster than the internal scanout operations. The memory can be implemented with two detectors, a first detector generating a first detector signal that is indicative of a memory address change in the middle significant bits and a second detector generating a second detector signal that is indicative of a memory address change in the most significant bits. For the condition that neither the first detector detects a memory address change in the middle significant bits nor the second detector detects a memory address change in the most significant bits; external scanout can be controlled to proceed at the highest memory rate within the block of least significant bits. For the condition that the first detector detects a memory address change in the middle significant bits and the second detector does not detect a memory address change in the most significant bits; external scanout can be disabled and internal scanout can be controlled to proceed at the medium memory rate within the block of middle significant bits. For the condition that the second detector detects a memory address change in the most significant bits, independent of the condition detected by the first detector in the middle significant bits; internal scanout and external scanout can both be disabled and re-addressing can be controlled to proceed at the lowest memory rate within the block of most significant bits.

A third multiple detector and delay example will now be discussed for a general configuration having more than two detectors and the related delay circuits. This configuration has more than three modes of operation having different data rates for each mode of operation. Each mode of operation is assigned to a different group of address bits. The memory can be implemented with more than two detectors; a first detector generating a first detector signal that is indicative of a memory address change in a first group of address bits, a second detector generating a second detector signal that is indicative of a memory address change in a second group of address bits, a third detector generating a third detector signal that is indicative of a memory address change in a third group of address bits, and so forth. For the condition that none of the detectors detect a memory address change in the more significant bits, memory operations can be controlled to proceed at the highest memory rate within the block of least significant bits; for the condition that the first detector detects a memory address change and the higher order detectors do not detect higher order memory address changes, memory operations can be controlled to proceed at a lower memory rate within the block of next more significant bits; for the condition that the second detector detects a memory address change and the higher order detectors do not detect higher order memory address changes, memory operations can be controlled to proceed at a still lower memory rate within the block of next more significant bits; for the condition that the third detector detects a memory address change and the higher order detectors do not detect higher order memory address changes, memory operations can be controlled to proceed at a still lower memory rate within the block of next more significant bits; and so forth.

Multiple detectors can be implemented for the same memory (as an alternate to multiple detectors for multiple memories discussed herein or in combinations with multiple detectors for multiple memories discussed herein). These multiple detectors can be the same type of detector (i.e., all overflow detectors or all comparitor detectors); can be the combinations of the same type of detector (i.e., two overflow detectors and three comparitor detectors); can be combinations of the same type of detector and single type of detectors (i.e., one overflow detectors and three comparitor detectors); etc. The multiple detectors can be configured to have different address detection magnitudes; such as to detect a change in internal scanout address bits, a change in external address bits, and a change in re-addressing address bits to facilitate addressing mode control.

Multiple detectors for the same memory to detect different memory speed conditions will now be described with reference to FIGS. 4Q and 4R. For simplicity of discussion, these multiple detectors will be discussed as the same type of detector; i.e., all overflow detectors (FIG. 4Q) or all comparitor detectors (FIG. 4R). These multiple detectors are shown configured to have different address detection magnitudes; different magnitude overflow bits (FIG. 4Q) and different magnitude input address bits (FIG. 4R). Alternately, different types of comparitors can be intermixed and address detection magnitudes can be selected to be combinations of the same address detection magnitude and different address detection magnitudes.

Figure 4Q:
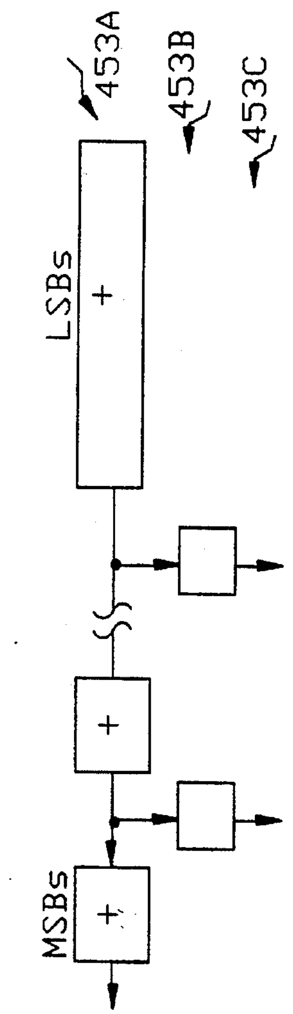
Figure 4R:
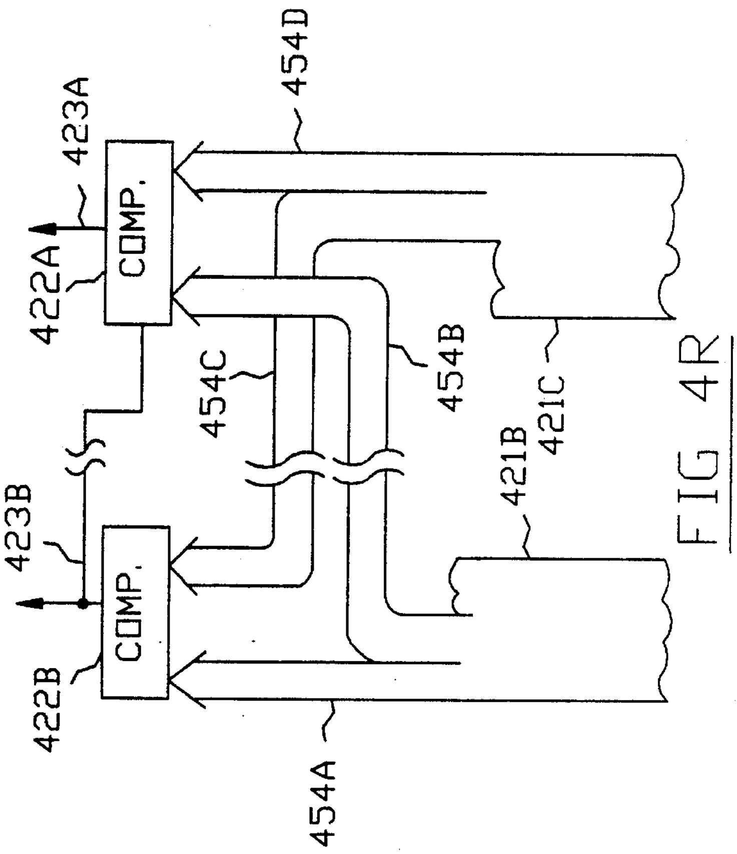

FIG. 4Q shows a plurality of address adder stages 453A (i.e., 74F283 chips in FIGS. 6O to 6R) having a plurality of overflow signals 453B (i.e., carry signals from the C4 pin from the 74F283 chips in FIGS. 6O to 6R) to a plurality of overflow circuits 453C (i.e., the overflow circuits shown in FIG. 6C having C1 and C2 carry inputs). The overflow circuit (FIG. 6C) can be expanded to accommodate additional carry inputs (i.e., FIG. 6W) or can be replicated to provide multiple separate overflow detectors for controlling different memory operations (i.e.; internal scanout, external scanout, and re-addressing). The break symbol in the signal line inbetween the adders illustrate that additional overflow detector channels can also be implemented in the combination.

FIG. 4R shows a plurality of comparitor stages 422A to 422B (i.e., comparitor 422 in FIGS. 4D and 4E) having a plurality of output signals 423A to 423B respectively (i.e., comparitor output signals 423 in FIGS. 4D and 4E) to control memory operations. Selected groupings of prior address bits 421C and next address bits 421B are shown compared with comparitors 422A to 422B. For example, a first grouping of prior address bits 454D and a first grouping of next address bits 454B are shown compared with comparitor 422A; a second grouping of prior address bits 454C and a second grouping of next address bits 454A are shown compared with comparitor 422B to generate detector signals 423A and 423B respectively. The break symbols in the signal lines inbetween comparitor 422A and comparitor 422B illustrate that additional comparitor detector channels can also be implemented in the combination. The signal line from detector signal 423B to comparitor 422A is illustrative of a disable of comparitor 422A and detector signal 423A when comparitor 422B generates a detector signal 423A.

Multiple time delay circuits for the same memory to control different memory speed conditions will now be discussed. In accordance with various configurations discussed herein, a detector circuit may have a delay circuit associated therewith, such as for controlling the rate of memory operations. Different detectors can have delay circuits with different delay characteristics associated therewith associated therewith. For example; an internal scanout detector may have a short delay characteristic associated therewith to provide a short delay for internal scanout operations, an external scanout detector may have a longer delay characteristic associated therewith to provide a longer delay for external scanout operations, and a re-addressing detector may have a still longer delay characteristic associated therewith to provide a still longer delay for re-addressing operations. The delay circuits may be the same type of delay circuit for each detector, may be different types of delay circuits for each detector, or may be combinations of the same type of delay circuit and different types of delay circuits for the various detectors. The delay circuit shown in FIG. 6C (i.e.; flip-flops U21B-5 and U21B-2) can be adapted for different time delay magnitudes. For example, the use of two flip-flops (U21B-5 and U21B-2) provides a time delay suitable for the FIG. 6C configuration. Alternately, removal of one of the two flip-flops (U21B-5 or U21B-2) and the gate (U20E-11 or U15A-11) associated with the removed flip-flop (i.e., removal of flip-flop U21B-2 and gate U15A-11) will reduce the magnitude of the time delay. Similarly, addition of another flip-flop and gate pair or multiple flip-flop and gate pairs will increase the time delay as a function of the number of flip-flop and gate pairs added. Other delay circuits, such as other time delay circuits disclosed herein, can be provided having suitable time delays to facilitate the multiple detector and time delay channel implementation disclosed herein.

Multiple detector configurations have been discussed for detectors in general for simplicity of discussion. However, it will be readily recognized that multitudes of different types of memory detectors, such as the memory detectors disclosed herein, can be used to implement this multiple detector configuration. For example, the same type of detectors can be used for a plurality of different detectors for the same memory. Alternately, different types of detectors can be used for each of a plurality of different detectors for the same memory. Also, combinations of the same types of detectors and different types of detectors can be used for each of a plurality of different detectors for the same memory.

Multiple delay circuit configurations have been discussed for delay circuits in general for simplicity of discussion. However, it will be readily recognized that multitudes of different types of memory delay circuits, such as the memory detectors disclosed herein, can be used to implement this multiple delay circuit configuration. For example, the same type of delay circuit can be used for a plurality of different delay circuits for the same memory. Alternately, different types of delay circuits can be used for each of a plurality of different delay circuits for the same memory. Also, combinations of the same types of delay circuit and different types of delay circuits can be used for each of a plurality of different delay circuits for the same memory.

Further, it will be readily recognized that multitudes of different types of memory detectors and multitudes of different types of delay circuits can be used to implement this multiple detector and delay circuit configuration. For example, the same type of detectors and the same type of delay circuits can be used for a plurality of different conditions for the same memory. Alternately, different types of detectors and different types of delay circuits can be used for each of a plurality of different conditions for the same memory. Also, combinations of the same type of detectors and the same type of delay circuits and different types of detectors and different types of delay circuits can be used in various combinations and permutations for different conditions with the same memory and for different memories. For example; a first type of detector and a first type of delay circuit can be used for a first condition with a first memory, the first type of detector and the first type of delay circuit can be used for a second condition with the first memory, a second type of detector and a first type of delay circuit can be used for a third condition with the first memory, the second type of detector and a second type of delay circuit can be used for a forth condition with the first memory, the first type of detector and the first type of delay circuit can be used for a first condition with a second memory, the first type of detector and the first type of delay circuit can be used for a second condition with the second memory, a third type of detector and the second type of delay circuit can be used for a third condition with the second memory, a forth type of detector and a third type of delay circuit can be used for a first condition with a third memory, and the first type of detector and the third type of delay circuit can be used for a second condition with the third memory.

Figure 4S:
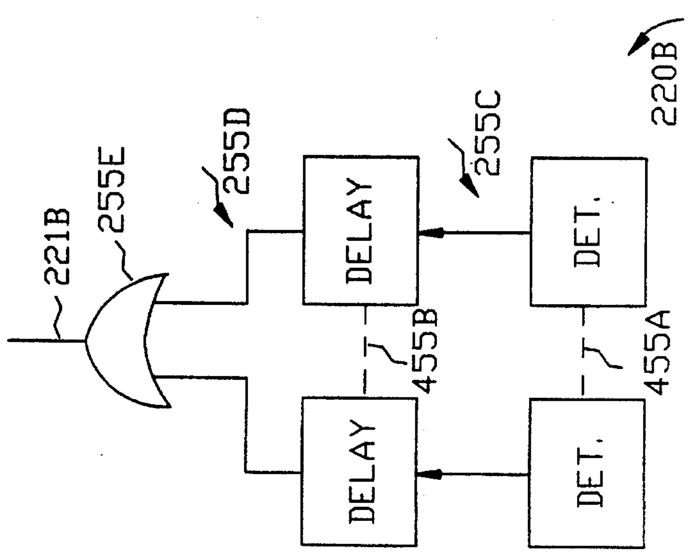

A multiple detector configuration will now be discussed with reference to FIGS. 4B and 4S. A plurality of detectors 220B can include a plurality of channels each containing a detector 455A generating a detector signal 455B to invoke a delay with a delay circuit 455C to generate a delay signal 455D. For example, a first channel may include a first overflow detector 455A generating a first detector signal 455B to invoke a first delay with a first delay circuit 455C to generate a first delay signal 455D (FIG. 6C), a second channel may include a second overflow detector 455A generating a second detector signal 455B to invoke a second longer delay with a second delay circuit 455C to generate a second longer delay signal 455D (FIG. 6C), a third channel may include a first comparitor detector 455A generating a third detector signal 455B to invoke a third delay with a first one shot delay circuit 455C to generate a third delay signal 455D, a forth channel may include a first modal detector 455A generating a first modal detector signal 455B to invoke a forth delay with a forth delay circuit 455C to generate a forth delay signal 455D, and so forth. The delay signals 455D can be combined; such as with a logical OR gate 455E, a wired OR circuit, a tristate circuit, a logical NAND gate, or other circuit; to generate combined delay detector signal 221B to invoke memory control signals and processor delay signals. Other arrangements for combining multiple detector signals can be readily provided from the teachings herein.

Memory Refresh

Introduction

DRAMs need to be refreshed within a specified refresh period in order to insure that the stored information is preserved. A typical DRAM refresh period is 8-ms, but long 64-ms DRAM refresh periods are also available. A typical RAS only refresh cycle for the Toshiba TC514256P DRAMs takes about 0.19-us per row or a minimum of about 100-us for 512 rows during each DRAM refresh period (each 8-ms or each 64-ms). This represents a refresh duty cycle of about 0.0125 for the 8-ms DRAMs and a refresh duty cycle of about 0.0016 for the 64-ms DRAMs.

Memory refresh, such as refreshing the Toshiba TC514256P DRAMs, can be implemented using on-the-chip refresh circuitry invoked by external signals, such as RAS and CAS signals. For example, Toshiba one-megabit DRAMs have 512-row addresses for the one-bit DRAMs, where refreshing can be commanded through the internal refresh counter by RAS-accessing each of the rows for each DRAM refresh period. Several forms of automatic refreshing include a RAS only refresh cycle where CAS* is maintained high and RAS* is cycled to invoke refresh operations, a CAS before RAS refresh cycle where CAS* goes low before RAS* goes low to invoke a refresh operation, and a hidden refresh cycle. See the MOS MEMORY PRODUCTS DATA BOOK by Toshiba at pages 127, 127, and 128 respectively.

A DRAM refresh controller can be implemented with a DRAM refresh address counter for generating refresh addresses and a refresh control signal generator for generating refresh control signals (i.e., RAS* signals). For refreshing, the DRAM refresh address and the refresh signals (i.e., RAS* signals) are applied to the DRAMs; disabling normal memory operations and enabling refreshing. For normal memory operations, addresses generated by a processor address register and RAS*/CAS* processor control signals are applied to the DRAMs; disabling refreshing and enabling processing operations. Available DRAMs, such as the Toshiba TC514256P DRAMs, have a refresh address counter and a refresh control signal generator on the DRAM chip.

Various examples are provided herein in the form of sync pulse related memory refreshing. For simplicity of discussion; an interlaced scan configuration will be discussed, such as having a 17-ms field sync period, a 34-ms frame sync period, and a 64-us line sync period. Other scan configurations can also be provided; such as a progressive scan configuration having a 17-ms frame sync period and a 32-us line sync period.

Various memory refresh configurations are discussed below. Refreshing is discussed in the context of detecting a time available period (i.e.; a horizontal sync pulse period or a vertical sync period in a display system, a suitable instruction execution period in a computer, etc) and invoking memory refreshing during this time available period. Alternately, memory refreshing may be performed on a cycle stealing basis by disabling processor memory operations and invoking one or more memory refresh operations periodically, or upon occurrence of a system condition, or otherwise. Alternately, memory refreshing may be performed concurrently with processor memory operations by partitioning the memory into multiple parts and invoking memory refreshing operations in one part while performing processor memory operations in another part.

Various implementations of memory re-addressing are discussed herein using overflow detectors, comparitor detectors, anticipatory detectors, modal detectors, time available detectors, and other detectors; which may also be used to implement memory refreshing. For example; a memory refresh operation can often be invoked concurrently with a memory re-addressing operation because the memory-related processing is often not being performed during a memory re-addressing operations. Alternately; a memory refresh operation can often be invoked in place of a memory re-addressing operation, such as during what is discussed in the context of a memory re-addressing operation condition, because the memory-related processing is often not being performed during such memory re-addressing related conditions, whether or not a re-addressing operation is invoked, and hence a memory refresh operation can be invoked in place of a memory re-addressing operation.

Other memory refreshing configurations can also be implemented.

The memory refresh configuration that uses a memory refresh detector to detect a suitable memory refresh period and that invokes a memory refresh operation in response thereto may be considered to be an adaptive memory refresh configuration. This is because it adapts to the operations of the memory and processor to provide memory refresh operations rather than having a fixed memory refresh cycle; which can result in advantages such as increased performance and reduced contention.

The memory architectures disclosed herein may be used with a range of memory controllers. For example, the memory architectures disclosed herein can be used with various scanout and re-addressing detector circuits, various delay circuits, and various refresh circuits, and others. Memory controller configuration-1 disclosed herein is one of many controllers that can be implemented to operate in conjunction with the memory architectures disclosed herein.

Various types of refreshing are known in the art. DRAM refreshing is well known in the art and is further discussed in detail herein. CCD refreshing, disclosed in detail in the related applications, involves shifting stored signals through a refresh circuit to reduce degradation of the stored information. Display refreshing involves iteratively or repetitively tracing the image over the display medium to reduce degradation of the displayed information. These different types of refreshing are herein characterized as DRAM refreshing, CCD refreshing, and display refreshing or terminology related thereto. For simplicity of discussion of various embodiments herein, refreshing may not expressly be shown in the figures nor discussed in the specification herein. However, it is intended that refreshing be implicit in these embodiments as needed.

Memory Refresh Detector Circuits

Introduction

Memory refresh detector circuits include circuits for detecting conditions that are suitable for memory refreshing; such as time available conditions and cycle stealing conditions; for invoking memory refresh operations. Invoking of memory refresh operations can include invoking of a single memory refresh operation for each detection or invoking of a plurality of memory refresh operations for each detection. For example, the vertical sync detector circuits and the line sync detector circuits discussed herein provide for detecting a sync signal condition that is suitable for invoking a plurality of memory refresh operations infra.

Time Available Refresh Detector Circuits

Time available memory refresh detectors can be implemented to generate a refresh time available signal in response to detection of time being available for one or more memory refresh operations. For example; the image memory line sync pulse detectors, image memory field sync pulse detectors, and suitable computer instruction detectors; are time available memory refresh detectors. The image memory line sync pulse memory refresh detectors and the image memory field sync pulse memory refresh detectors are discussed herein. Also discussed herein is a line sync memory refresh detector that detects a selected portion of a line sync pulse, the leading portion of a line sync pulse in this illustration.

The vertical sync memory refresh detector circuits and the line sync memory refresh detector circuits are discussed here for detecting a condition that is suitable for invoking a plurality of memory refresh operations for each detection. For-DRAMs needing 200-ns for each memory refresh operation, a 1-ms vertical sync pulse permits 5,000 DRAM refresh operations to be performed.

(1-ms)/(0.20-us)=5,000

The leading edge of a line sync pulse permits four or eight or other relatively small quantity of DRAM refresh operations to be performed, as discussed herein. For DRAMs needing 200-ns for each memory refresh operation, a full 6-us line sync pulse permits 30 DRAM refresh operations to be performed.

(6-us)/(0.20-us)=30

A stored program computer time available memory refresh detector can be implemented to perform memory refresh operations, such as on a time share basis with program operations. For example, an instruction detector can be used to detect instructions or portions of instructions that are suitable for memory refresh operations. In a micro-programmable computer, micro-instructions can be implemented to generate memory refresh detector signals to invoke a memory refresh operation at times suitable for memory refreshing. In state machines (including types of computers), states can be implemented to generate memory refresh detector signals to invoke a memory refresh operation at times suitable for memory refreshing.

Time available memory refresh detectors that are responsive to execution of a computer instruction can be implemented by detecting a suitable portion of an instruction execution period, such as detecting selected micro-operations of an instruction., that are indicative of computer operations which do not use main memory for an appropriate period of time in order to invoke refresh operations during that period of time. For example, an instruction that processes a register operand, such as an instruction that adds a register operand to the accumulator, may have to access an instruction from main memory (as with an instruction that adds a memory operand to the accumulator) but may not have to access an operand from main memory. Hence, an instruction that processes a register operand may have time to invoke a memory refresh cycle in place of the memory operand access that is not needed for such an instruction. Other instructions may have an instruction execution micro-operation that does not access main memory and hence leaves time available for memory refreshing. For example, an add instruction may have an add instruction execution micro-operation that does not access main memory and hence leaves time available for memory refreshing. Also, certain instructions may have significantly longer instruction execution micro-operations, such as multiply and divide instructions which may have eight instruction execution micro-operations (such as in an eight bit computer), or 16 instruction execution micro-operations (such as in a 16-bit computer), or 32 instruction execution micro-operations (such as in a 32-bit computer) that do not access main memory and hence leaves time available for memory refreshing. See related patent application Ser. No. 101,881 and see related U.S. Pat. No. 4,371,923 for computer micro-operation disclosures; such as at FIGS. 5A and 5B therein and the discussion related thereto. For example, these disclosures discuss main memory-resident operand instructions, discuss scratch pad register-resident operand instructions, and discuss micro-operations related thereto. Time available memory refresh detectors that are associated with computer operations can be implemented by detecting a suitable computer operation that is indicative of a condition that does not use main memory for an appropriate period of time in order to invoke refresh operations during that period of time. For example, in a computer that operates out of cache memory; a main memory refresh detector can invoke memory refresh operations when the computer is operating out of a cache memory that has sufficient information stored therein and hence does not require main memory accesses at that time. The Motorola 68020 microprocessor is an example of a computer having a cache memory. Other cache memory computers are well known in the art. For another example, in a computer that is delayed by external operations, such as by DTACK and READY circuits and wait state circuits; a memory refresh detector can invoke memory refresh operations when computer is delayed by an external operation.

A direct memory access (DMA) memory refresh detector can be implemented to invoke memory refreshing on a time available basis in a DMA configuration that is suitable for time available memory refreshing. For example, if the DMA operations are associated with one of a plurality of memories; then one of the memories not having DMA operations at a particular time can be refreshed at that time. Also, if the DMA operations are relatively slower than memory speed;

then a DMA refresh detector can be implemented to detect the time available inbetween DMA operations to invoke refresh operations. For example, DMA loading of information from a hard disk may transfer one 16-bit word each microsecond, being limited by disk memory rates. However, the above-described Toshiba DRAM may be able to load that word in 50-ns using the fast page scanout addressing mode. Hence, 950-ns may be available for DRAM refreshing. For DRAMs needing 200-ns for each memory refresh operation, about four memory refresh operations can be invoked in the 950-ns time available.

A cache memory refresh detector can be implemented to invoke memory refreshing on a time available basis in a cache memory configuration that is suitable for time available memory refreshing. For example, if the cache memory operations are associated with one of a plurality of memories; then one of the memories not having cache memory operations at a particular time can be refreshed at that time. Also, if the cache memory operations are relatively slower than memory speed; then a cache memory refresh detector can be implemented to detect the time available inbetween cache memory operations to invoke refresh operations. For example, cache memory loading of information from a hard disk may transfer one 16-bit word each microsecond. However, the above-described Toshiba DRAM may be able to load that word in 50-ns using the fast page scanout addressing mode. Hence, 950-ns may be available for DRAM refreshing. For DRAMs needing 200-ns for each memory refresh operation, about four memory refresh operations can be invoked in the 950-ns time available.

A filter processor, signal processor, or array processor memory refresh detector can be implemented to invoke memory refreshing on a time available basis in a filter processor, signal processor, or array processor configuration that is suitable for time available memory refreshing. For example, if the processing operations are associated with one of a plurality of memories; then one of the memories not having processing operations at a particular time can be refreshed at that time. Also, if the processing operations are relatively slower than memory speed; then a filter processing, signal processing, or array processing refresh detector can be implemented to detect the time available inbetween processing operations to invoke refresh operations. For example; filter processing, signal processing, or array processing of input information may receive and process and store one input sample each microsecond. However, the above-described Toshiba DRAM may be able to store that input sample in 50-ns using the fast page scanout addressing mode. Hence, 950-ns may be available for DRAM refreshing. For DRAMs needing 200-ns for each memory refresh operation, about four memory refresh operations can be invoked in the 950-ns time available.

An artificial intelligence memory processor memory refresh detector can be implemented to invoke memory refreshing on a time available basis in an artificial intelligence processor configuration that is suitable for time available memory refreshing. For example, if the processing operations are associated with one of a plurality of memories; then one of the memories not having processing operations at a particular time can be refreshed at that time. Also, if the processing operations are relatively slower than memory speed; then an artificial intelligence processing refresh detector can be implemented to detect the time available inbetween processing operations to invoke refresh operations. For example; artificial intelligence processing of inference information may perform one inference operation each microsecond. However, the above-described Toshiba DRAM may be able to store that input sample in 50-ns using the fast page scanout addressing mode. Hence, 950-ns may be available for DRAM refreshing. For DRAMs needing 200-ns for each memory refresh operation, about four memory refresh operations can be invoked in the 950-ns time available.

A display processor memory refresh detector can be implemented to invoke memory refreshing on a time available basis in a display processor configuration that is suitable for time available memory refreshing. For example, if the processing operations are associated with one of a plurality of memories; then one of the memories not having processing operations at a particular time can be refreshed at that time. Also, if the processing operations are relatively slower than memory speed; then a display processing refresh detector can be implemented to detect the time available inbetween processing operations to invoke refresh operations. For example, display processing of image memory pixels may access and process and store one pixel each microsecond. However, the above-described Toshiba DRAM may be able to access that pixel in 50-ns and to store that pixel in 50-ns using the fast page scanout addressing mode. Hence, 950-ns may be available for DRAM refreshing. For DRAMs needing 200-ns for each memory refresh operation, about four memory refresh operations can be invoked in the 950-ns time available.

Cycle Stealing Refresh Detector Circuits

Cycle stealing memory refresh detectors can be implemented to generate a refresh command signal to invoke one or more refresh operations in response to determination of time being appropriate to steal a cycle or to steal multiple cycles from the processor for one or more memory refresh operations. For example; a counter, a one-shot monostable multivibrator, a DMA circuit, or other timing circuit may be used to generate periodic cycle stealing memory refresh command signals. For example, the IBM PC/XT uses a DMA circuit to generate time intervals, to interrupt the computer after each time interval has expired, and to invoke a refresh operation after each time interval has expired. Cycle stealing can be implemented by temporarily disabling processing operations and invoking a memory refresh cycle while the processor is disabled. Various types of disabling and delaying circuits are disclosed herein; such as DTAC and READY delaying circuits in a computer, wait state circuits in a computer, clock gating circuits, etc; which can be used to temporarily disable processing to provide time for a refresh cycle.

A direct memory access (DMA) memory refresh detector can be implemented to invoke memory refreshing on a cycle stealing basis in a DMA configuration that needs cycle stealing memory refreshing. For example, if the DMA operations are about as fast as the DRAM being used; then there may not be sufficient time available for time available refreshing. Hence, a DMA refresh detector can be implemented to detect cycle stealing times for stealing cycles from DMA operations to invoke refresh operations.

A cache memory refresh detector can be implemented to invoke memory refreshing on a cycle stealing basis in a cache memory configuration that needs cycle stealing memory refreshing. For example, if the cache memory operations are about as fast as the DRAM being used; then there may not be sufficient time available for time available refreshing. Hence, a cache memory refresh detector can be implemented to detect cycle stealing times for stealing cycles from cache memory operations to invoke refresh operations.

A filter processor, signal processor, or array processor memory refresh detector can be implemented to invoke memory refreshing on a cycle stealing basis in a filter processor, signal processor, or array processor configuration that needs cycle stealing memory refreshing. For example, if the processor operations are about as fast as the DRAM being used; then there may not be sufficient time available for time available refreshing. Hence, a filter processor, signal processor, or array processor refresh detector can be implemented to detect cycle stealing times for stealing cycles from filter processor, signal processor, or array processor operations to invoke refresh operations.

An artificial intelligence processor memory refresh detector can be implemented to invoke memory refreshing on a cycle stealing basis in an artificial intelligence processor configuration that needs cycle stealing memory refreshing. For example, if the processor operations are about as fast as the DRAM being used; then there may not be sufficient time available for time available refreshing. Hence, an artificial intelligence processor refresh detector can be implemented to detect cycle stealing times for stealing cycles from artificial intelligence processor operations to invoke refresh operations.

A stored program computer cycle stealing memory refresh detector can be implemented to perform memory refresh operations, such as on a cycle stealing basis with program operations. For example, a counter or other timer can be used to generate a periodic memory refresh detector signal to detect the completion of a period of time between memory refresh operations and hence the need for another memory refresh operation. The computer program operations can be temporarily discontinued under control of the memory refresh detector signal to permit one or more memory refresh operations to be performed, followed by resumption of computer program operations. Computer disabling and delaying circuits are disclosed herein; such as DTAC, READY, and wait state circuits.

A display processor memory refresh detector can be implemented to invoke memory refreshing on a cycle stealing basis in a display processor configuration that needs cycle stealing memory refreshing. For example, if the processor operations are about as fast as the DRAM being used; then there may not be sufficient time available for time available refreshing. Hence, a display processor refresh detector can be implemented to detect cycle stealing times for stealing cycles from display processor operations to invoke refresh operations.

A DMA memory refresh detector can be implemented to invoke memory refreshing on a cycle stealing basis in a DMA configuration that needs cycle stealing memory refreshing. For example, if the DMA operations are about as fast as the DRAM being used; then there may not be sufficient time available for time available refreshing. Hence, a DMA refresh detector can be implemented to detect cycle stealing times for stealing cycles from DMA operations to invoke refresh operations.

Adaptive Refresh Detector Circuits

An adaptive refresh controller in accordance with the teachings of the present invention can provide many of the advantages of time available refreshing in a configuration that may not otherwise be able to support time available refreshing. Time available memory refreshing enhances performance because it performs memory refreshing when the memory has time available as an alternate to the performance-reducing cycle stealing memory refreshing. Various time available memory refreshing arrangements are disclosed herein having time available that is a function of the mode of operation., the type of processing, etc. However, in some systems; time available refreshing may be permissible for only .a portion of the time.

In one example, a stored program computer may have time available when a first type of instruction is executed and may not have time available when a second type of instruction is executed. Consequently, such a system may have sufficient time available for memory refreshing when the processing has a nominal mixture of first instruction type and second instruction type executions, the system may have excessive time available for memory refreshing when the processing is first instruction type intensive, and the system may not have enough time available for memory refreshing when the processing is second instruction type intensive.

In another example, a processor may have extensive time available for auxiliary memory operations, such as re-addressing and refreshing, during periods of low memory contention and may have little time available for auxiliary memory operations during periods of high memory contention; such as contention with external operations, or contention with instruction execution accesses of memory, or other contention for memory operations. Consequently, such a system may have sufficient time available for memory refreshing for periods of medium contention, the system may have excessive time available for memory refreshing for periods of low contention, and the system may not have enough time available for memory refreshing for periods of high contention.

In view of the above, it may be desirable to have an adaptive memory refresh controller that is responsive to the desired refresh conditions and to the actual refresh conditions for adjusting the refresh conditions. For example, an adaptive memory refresh controller can be implemented to keep track of the actual refreshing operations on a time available basis and the desired refreshing operations on a time period basis and can command cycle stealing refresh operations whenever the count of actual refreshing operations becomes less than the count of desired refreshing operations. Hence, as long as the time available refreshing operations satisfies the memory refresh requirements, the adaptive controller need not intercede. However, if the time available refreshing operations do not satisfy the memory refresh requirements, then the adaptive controller intercedes and invokes cycle stealing refresh operations until the memory refresh requirements are met. One such adaptive memory refresh controller is described with reference to FIG. 4P infra.

An adaptive memory refresh controller can be implemented to keep track of the actual refreshing operations on a time available basis and the desired refreshing operations on a time period basis and can command cycle stealing refresh operations, such as near the end of the refresh period or interspersed with time available refresh operations during the refresh period, if the actual refreshing operations are less than the desired refreshing operations. Hence, as long as the time available refreshing operations satisfies the memory refresh requirements or as long as there is suitable time in the refresh period for the quantity of actual refresh operations to catch up with the quantity of desired refresh operations, the adaptive controller need not intercede. However, if the time available refreshing operations do not satisfy the memory refresh requirements and there is no longer suitable time in the refresh period for the quantity of actual refresh operations to catch up with the quantity of desired refresh operations, then the adaptive controller intercedes and invokes cycle stealing refresh operations until the memory refresh requirements are met. This alternate configuration may provide a longer period of time for the time available refreshing operations to satisfy the memory refresh requirements, which may be an advantage in certain systems. This alternate configuration may result in invoking a group of stealing refresh operations over a short period of time near the end of the refresh cycle causing a peak contention condition, which may be a disadvantage in certain systems.

Other adaptive memory refresh controllers can also be implemented.

An adaptive memory refresh arrangement will now be discussed in greater detail with reference to FIG. 4P. Period timer 451A and desired refresh counter 451D keep track of desired memory refresh operations. Actual refresh counter 451E keeps track of actual memory refresh operations. Comparitor 451I compares the count of desired refresh operations generated by desired refresh counter 451D with the count of actual refresh operations generated by actual refresh counter 451E to generate output signal 451J that is indicative of the relationship between the quantity of desired refresh operations and the quantity of actual refresh operations. Output signal 451J can be used for invoking a cycle stealing refresh operation when the quantity of desired refresh operations exceeds the quantity of actual refresh operations, or when the quantity of desired refresh operations becomes equal to or exceeds the quantity of actual refresh operations, or otherwise.

In the FIG. 4P configuration, an insufficient quantity of actual refresh operations can be used to force the count in actual refresh counter 451E to follow the count in desired refresh counter 451D in response to the output signal 451J invoking refresh operations. However, an excessive quantity of actual refresh operations can result in the count in actual refresh counter 451E getting far ahead of the count in desired refresh counter 451D. This latter condition will not cause a problem as long as the high rate of time available refresh operations continues. However, a potential hazard can occur for the condition of a large number of time available refresh operations advancing the count in actual refresh counter 451E well beyond the count in desired refresh counter 451D followed by the condition of the number of time available refresh operations being substantially diminished so that the quantity of desired refresh operations are not achieved during this following condition. If the time for the count in desired refresh counter 451D to catch up with the count in actual refresh counter 451E plus the time to invoke an adequate number of cycle stealing refresh operations to complete refreshing of the memory exceeds the refresh period, stored information may be lost. A detector can be implemented to detect this contingency, such as with a subtractor circuit subtracting the count 451G from desired refresh counter 451D and the count 451H from actual refresh counter 451E to detect when the count 451G from desired refresh counter 451D is less than the count 451H from actual refresh counter 451E by a detector threshold. When this condition is detected, various corrective operations can be implemented. For example, actual refresh counter 451E can be disabled for the duration of time that the detector threshold is exceeded to prevent the Count 451G from desired refresh counter 451D from falling too far behind the count 451H from actual refresh counter 451E. Alternately, desired refresh counter 451D can be advanced to track actual refresh counter within a suitable threshold distance. Other corrective operations can also be implemented.

Period timer 451A can be implemented to generate a time interval output signal 451C to establish the desired time interval for a memory refresh operation to occur. For example, a DRAM having 512 rows and needing 512 refresh operations each 8-ms period may need a refresh operation each 15-us on the average.

(8000-us)/(512)=15.6-us/refresh operation

Hence, period timer 451A can be implemented to generate a period signal 451C each 15-us period. Period timer 451A can be implemented with various circuits; such as a 74LS161 counter for generating a counter overflow signal 451C, a rate multiplier for generating a rate multiplier output signal 451C, an astable multivibrator for generating as astable multivibrator cycle signal 451C, or a well known DMA arrangement.

Desired refresh counter 451D can be implemented to count period signals 451C to generate a count of desired refresh signals 451G as being indicative of the number of refresh operations that should have been performed. It can be implemented with a 74LS161 counter.

Actual refresh counter 451E can be implemented to count the actual refresh signals 451F to generate a count of actual refresh signals 451H as being indicative of the number of refresh operations that have actually been performed. It can be implemented with a 74LS161 counter.

The desired refresh signals 451G generated by desired refresh counter 451D can be compared with the actual refresh signals 451F generated by actual refresh counter 451E by comparitor 451I to generate output signals 451J that are indicative of the relationship therebetween. Comparitor 451I can be implemented with a 74LS85 comparitor. For example, if the desired refresh signals 451G are input to the A-inputs of comparitor 451I and the actual refresh signals 451F are input to the B-inputs of comparitor 451I, then output signal $O_{A>B}$ 451J is indicative of the quantity of actual refresh operations falling behind the quantity of desired refresh operations and hence can be used to invoke a cycle stealing memory refresh operation. Alternately, output signal $O_{A<B}$ 451J is indicative of the quantity of actual refresh operations getting ahead of the quantity of desired refresh operations and hence can be used to disable cycle stealing memory refresh operations.

The arrangement shown in FIG. 4P can be implemented with long counters 451D and 451E to reduce the occurrence of counter overflow. However, when a counter overflows; the comparitor output signals 451J can change meaning. For example, when the actual refresh counter 451E overflows as a result of counting of actual refresh operations, the actual refresh count will traverse from being larger than the desired refresh count to being smaller than the desired refresh count, which may be undesirable. However, various circuit configurations can be implemented to compensate for this condition. For example, counter conditions can be detected and can be used to reset, to preset, or to preload one or both of the counters, the actual refresh counter 451E and/or the desired refresh counter 451D. Counter conditions can be detected by logical gates, decoders, overflow detectors, etc. Well known counters have reset circuits for resetting the counter (i.e., the 74LS161 counter and the 74LS90 counter), have preset circuits for presetting the counter (i.e., the 74LS90 counter), and have preloading circuits for preloading a predetermined number into the counter (i.e., the 74LS161 counter). In one configuration, both counters, the actual refresh counter 451E and the desired refresh counter 451D, can be reset when the desired refresh counter 451D passes through a threshold. In another configuration, both counters, the actual refresh counter 451E and the desired refresh counter 451D, can be reset when the actual refresh counter 451E passes through a threshold. In another configuration, the actual refresh counter 451E can be preloaded to the condition of the desired refresh counter 451D when the desired refresh counter 451D passes through a threshold. In another configuration, both counters, the actual refresh counter 451E and the desired refresh counter 451D, can be preset or preloaded to predetermined conditions when the desired refresh counter 451D passes through a threshold. In another configuration, both counters, the actual refresh counter 451E and the desired refresh counter 451D, can be preloaded to predetermined conditions when the actual refresh counter 451E passes through a threshold. Also, these configurations can be used in combinations. For example; both counters, the actual refresh counter 451E and the desired refresh counter 451D, can be reset when the desired refresh counter 451D passes through a threshold and the actual refresh counter 451E can be preloaded to the condition of the desired refresh counter 451D when the desired refresh counter 451D passes through a threshold or overflows. Many other configurations can be implemented to overcome the overflow condition.

The adaptive memory refresh controller disclosed with reference to FIG. 4P can be implemented in various other ways and with various other components. Also, the components can be expanded to achieve greater dynamic range. For example, the 74LS161 counters can be expanded by connecting the terminal count TC* overflow bit of a prior stage to the count enable trickle CET carry input bit of a subsequent stage. Also, the 74LS85 comparitor can be expanded by connecting the three output condition circuit pins of a prior stage to the three input condition circuit pins of a subsequent stage.

Other Refresh Detector Circuits

Other memory refresh detectors, other than time available memory refresh detectors and cycle stealing memory refresh detectors, can be implemented to generate refresh command signals to invoke one or more refresh operations.

A memory refresh detector may be a combination of a time available memory refresh detector and a cycle stealing memory refresh detector. In one such a combination detector, a time available detector may initiate memory refresh operations and, when the time available detector terminates the time available period, a cycle stealing detector can steal one cycle or more than one cycle to permit any memory refresh operation that is in process when the time available detector terminates the time available period. In another such a combination detector, a time available detector may initiate memory refresh operations when time is available and a cycle stealing detector may initiate refresh operations when time is not available. A counter may be employed to keep track of the rate of refresh operations or the number of refresh operations and to invoke cycle stealing refresh operations when the time available refresh operations do not meet the minimum refresh requirements.

Sync Pulse Controlled Memory Refreshing

Introduction

Sync pulse memory refreshing is particularly advantageous in display systems; such as in a graphics display system, in an image processing display system, and in a television display system; where the display system may not need to perform memory intensive display processing operations during the sync pulse period. Such sync pulse memory refreshing can provide advantages, such as improved performance and reduced cycle stealing and contention.

A display system may have to perform image memory intensive display operations, such as display refreshing, during the period inbetween sync pulses and the display system may not have to perform image memory-related display operations during the sync pulse period. Hence, the display system can perform image memory refreshing operations during the sync pulse period. Also, in this example; the display system may perform display processing operations during the sync pulse period, such as concurrently with the DRAM refresh operations or on a time shared basis with memory refresh operations.

Vertical Sync Pulse Memory Refreshing

Vertical sync pulse memory refreshing will now be discussed for DRAM refreshing. Vertical sync pulse DRAM refreshing can be implemented for longer refresh period DRAMs that are tolerant to the vertical or field sync (FS) pulse period. Shorter refresh period DRAMs, such as 8-ms refresh period DRAMs, may not operate properly if refreshed on each vertical sync pulse, each 17-ms period. However, longer refresh period DRAMs, such as 64-ms refresh period DRAMs, should operate properly if refreshed on each vertical sync pulse. For example, the 64-ms period DRAMs can be refreshed during each vertical field pulse period, about each 17-ms period, or during each vertical frame pulse period, about each 34-ms period. The vertical sync pulse width is typically more than one-ms, which is 10-times more than required to perform the 100-us RAS-accessed refreshing of the DRAM 512-rows.

The vertical sync pulse period has more than enough time to perform refreshing for conventional DRAMs, assuming that the 17-ms period inbetween vertical sync pulses is not too long to meet the DRAM refreshing requirements. For example, the above calculations show that about 100-us per refresh period is needed for refreshing of the Toshiba TC514256P DRAMs. However, the vertical sync pulse has about 10-times the 100-us refresh time needed for DRAM refreshing per field sync period (based upon an 8-ms refresh period, a 17-ms field sync period, and a 1-ms field sync pulse width).

(1000-us/17-ms) (8-ms refresh)=470-us

Horizontal Sync Pulse Memory Refreshing

Horizontal sync pulse, also called line sync (LS) pulse, memory refreshing can be implemented for more frequent refreshing than available with vertical sync pulse memory refreshing, such as for shorter refresh period DRAMs. For example, the 8-ms period DRAMs may not operate properly if refreshed on each vertical sync pulse, each 17-ms period, but should operate properly if refreshed during multiple line sync pulse periods, such as each 63-us period.

The line sync pulse periods have more than enough time to perform refreshing for conventional DRAMs. For example, the above calculations show that about 100-us per refresh period is needed for refreshing of the Toshiba TC514256P DRAMs. However, the line sync pulses have over seven times the 100-us refresh time needed for DRAM refreshing per field sync (FS) period (based upon an 8-ms refresh period, a 63-us line sync period, and a 6-us line sync pulse width).

(8000-us/63-us) (6-us/line)=761-us

In the display system disclosed relative to FIG. 6A et seq herein; the display system performs image memory intensive display refreshing during the period inbetween line sync pulses and the display system need not perform any image memory-related display operations during the line sync pulse period. This display system can readily be adapted to performing image memory refreshing operations during the line sync pulse period infra, such as concurrently with the display processing operations or on a time shared basis with the display processing operations.

In this display system, an enhancement has been made to perform the display processing operations during a portion of the line sync pulse period infra, which can be called a shortened line sync pulse period for display processing purposes. A portion of the line sync pulse period can be used for performing display processing to load up a display buffer memory, which is located inbetween the display processor and the video DACs, with display information. This display configuration can be adapted to performing image memory refresh operations during the shortened line sync pulse period. For example, during the portion of the line sync period having display processing operations, refresh operations can be disabled, and during the portion of the line sync period not having display processing operations, refresh operations can be enabled.

Alternately, in a display system not having the above discussed enhancement, the DRAM image memory refresh operations can be performed during the whole line sync pulse period. Many other alternate configurations can also be provided.

In one configuration, DRAM refresh can be performed for the whole line sync pulse period. For example, for a display system having a line sync pulse width of about 6-us; about 17 line sync pulses are needed to perform the 100-us RAS-accessed refreshing of the DRAM 512-rows based upon a 0.19-us per row refresh period.

[(0.19-us)/(DRAM row)][(512 DRAM rows)/(6-us)]/[sync pulse]=16.2 line sync pulses In another configuration, DRAM refresh can be performed for a portion of each line sync pulse period for multiple line sync pulses. DRAM refresh that is performed for a portion of each line sync pulse period is particularly efficient, such as in a configuration that loads display information into a display buffer. For example, a configuration using a display buffer (i.e., a line buffer) inbetween the image memory and the video DACs can use a portion of the line sync pulse period for DRAM refreshing and can use the balance of the line sync pulse period for loading the display buffer. In such a display buffer configuration, loading the display buffer during the line sync pulse period or during a portion of the line sync pulse period increases the number of pixels per line, such as by almost 10% for the present illustrative example.

(6-us/sync pulse)/(63 us/sync pulse period)=0.095

About four DRAM rows need to be refreshed per line sync pulse in order to achieve refreshing of all 512 rows in each 8-ms refresh period with an 0.19-us row period, a 63-us per horizontal line, a 6-us per line sync pulse, and 512-rows per DRAM;

(horizontal lines)/(refresh period)=(8000 us)/(63 us)=126.98

(DRAM rows)/(horizontal line)=(512 DRAM rows)/(126.98 lines)=4.03 DRAM rows/line Assuming a safety factor of about two times (8 DRAM rows/line), about 1.5-us is needed out of each 6-us line sync pulse for DRAM refreshing.

(0.19 us/row)(8 DRAM rows)=1.52 us

This is about 2.4% of the 63-us horizontal line period, which results in a reduction of about 2.4% of the number of pixels per line to accommodate line sync pulse refreshing in such a display buffer configuration. Some of the line sync pulse period may also be used for display processing, such as to initialize the next display horizontal scan line. The time for such refresh operations may be performed concurrently with such display processing.

A configuration having DRAM refreshing performed for a portion of each line sync pulse period is implemented in the display system shown in FIGS. 6A et seq herein. Line sync pulse display processing can be performed concurrently with DRAM refreshing because, in this configuration, such display processing does not access DRAM image memory. For alternative implementations of refreshing DRAM image memory during the entire line sync pulse period, the line sync pulse signal can be used as the envelope to enable the refreshing logic. For the alternative implementations of refreshing DRAM image memory during a portion of the sync pulse period, the signal that defines the portion of the sync pulse to be used for the line sync pulse display processing can also be used as the envelope to enable the refreshing logic infra.

A first DRAM refreshing configuration will now be discussed with reference to FIG. 6A et seq. The front portion of the sync pulse can be used to perform DRAM refreshing operations, as enabled with the RUN* signal, which is generated by complementing the RUN signal U13A-8 (FIGS. 6W, 6D, 7C, and 7D). The RUN signal has the logical equation (CLSR1* AND CFSR1*)+(CFSR1* AND CLSR1 AND CLSR4)

The RUN signal covers the period of time when the CFSR1 signal (vertical sync pulse) is low and either the line sync pulse is low CLSR1* or the trailing portion of the line sync pulse (CLSR1 AND CLSR4) is true. This covers the whole period when the vertical sync pulse is low except for the leading portion (CLSR1 AND CLSR4*) of the line sync pulse. Similarly, other signals (including the complements of other signals); such as the DOA5, DOA6, and CFSR1 signals infra; can be logically combined (i.e., ANDing, ORing, etc) with the RUN signal by one skilled in the art. The RUN signal is shown being generated by the NANDing of the U13A-13 signal and the U13A-9 signal; the U13A-10,12 signal having no effect on the RUN signal. The U13A-13 signal defines the condition (CLSR1* AND CFSR1*), which is the period inbetween line sync pulses (CLSR1) during the period that the field sync pulse (CFSR1) is low. The U13A-9 signal defines the condition (CFSR1* AND CLSR1 AND CLSR4), which is the period in the trailing portion of the line sync pulse. All of the rest of the time, the vertical (field) sync pulse width period and the leading portion of the line sync pulse, is available for DRAM refreshing.

A second DRAM refreshing configuration will now be discussed with reference to FIG. 6A et seq. Similar to said first DRAM refreshing configuration; the front portion of the sync pulse can be used to perform DRAM refreshing operations, as enabled with the ELS signal U15A-3 (FIGS. 6D, 7C, and 7D). The ELS signal has the logical equation (CLSR1 AND CLSR4* AND DOA6)+DOA5

The ELS signal covers the period of time when the leading portion of the line sync pulse (CLSR1 AND CLSR4*) is true. The ELS signal is shown being generated by the ANDing of the CLSR1 AND CLSR4* signals with gate U19D-4 to generate the leading portion of the line sync pulse (CLSR1 AND CLSR4*). The ANDing and ORing of the DOA6 and DOA5 respectively is performed with gates U22C-3 and U15A-3. The DOA6 and DOA5 signals are modal signals, such as for controlling the write mode, and are not essential to the present discussion of line sync pulse leading edge refreshing. Similarly, the logical combining (i.e., ANDing, ORing, etc) of other signals (including the complements of other signals); such as the DOA5, DOA6, and CFSR1 signals; with the leading portion signal (CLSR1 AND CLSR4*) can readily be performed by one skilled in the art.

In the above first and second DRAM refreshing configurations; the leading portion of the line sync pulse, CLSR1 to CLSR4, involves three clock pulse periods of 100-ns each. This period can be increased, such as to the 1.4-us period needed for the eight DRAM refresh operations in the above example, by introducing additional delays. For example, placing 11 additional flip-flops inbetween CLSR1 and CLSR4 will increase the 3-clock period delay (300-ns) to a 14-clock period delay (1.4 us). Other arrangements can be used, such as a counter or a one-shot monostable multivibrator, to control the duration of the period of the leading edge of the line sync pulse for DRAM refresh operations.

Alternately, the whole line sync pulse or the whole field (vertical) sync pulse can be used to invoke DRAM refreshing and display processor updating, such as with the line sync pulse signal CLSR1 or with the field sync pulse signal CFSR1. For example, the whole line sync pulse period can be used for refreshing in said first configuration by removing the U13A-9 signal from the RUN equation by disconnecting the U17A-8 signal therefrom and connecting the U13A-9 pin to a high ($V_{BIAS}$ or $V_{CC}$) signal and in said second configuration by removing the CFSR4* delayed line sync pulse signal from the ELS equation by disconnecting the CLSR4 signal from U19D-5 and connecting U19D-5 to a ground.

On-The-Chip Memory Refresh

An on-the-chip memory refresh configuration will now be described in the context of a DRAM system.

Refresh can implemented with an internal or an external refresh counter to count the rows and to generate row addresses. RAS-only refresh uses an external refresh counter. CAS-before-RAS refresh and hidden refresh use an internal refresh counter which is internal to the DRAM IC chip. All three of these refresh modes permit multiple refresh cycles.

For CAS-before-RAS refresh and hidden refresh, the internal refresh counter initiates refreshing when RAS* goes low bracketed by CAS* being low and terminates refreshing when CAS* goes low bracketed by RAS* being low. Refreshing continues for each RAS* cycle until CAS* goes high and then goes low bracketed by RAS* being low. Hence, if RAS* goes low with CAS* being low, then internal refreshing is executed for each cycle of RAS* going low (independent of whether CAS* remains low). If CAS* remains low during refreshing, hidden refresh is performed and data is output. If CAS* remains high during refreshing, CAS-before-RAS refresh is performed and the output lines are at high impedance.

The primary difference between CAS-before-RAS refresh and hidden refresh is as follows. For hidden refresh, CAS* is left low while cycling RAS* so that the output is not at high impedance. For CAS-before-RAS refresh, CAS* is placed high while cycling RAS* so that the output is at high impedance. In applications where CAS-before-RAS refresh can be used; the design may be a little simpler and may be a little easier to check-out.

In a line sync pulse controlled arrangement, a logical "one" line sync pulse can be implemented to invoke the RAS* DRAM refresh control signals and to generate RAS* pulses to the DRAM for refresh operations and a logical "zero" line sync pulse can be implemented to invoke the scanout and re-addressing display operations. In a vertical sync pulse controlled arrangement, a logical "one" vertical sync pulse could be implemented to invoke the RAS* DRAM refresh control signals and to generate RAS* DRAM refresh control signals and to generate RAS* pulses to the DRAM for refresh operations and a logical "zero" vertical sync pulse could be implemented to invoke the scanout and re-addressing display operations.

Stored Program Computer DRAM Refresh

Various memory refresh configurations are discussed herein, which are applicable to refreshing of DRAMs in a stored program computer. Further, DRAM refresh detectors for a stored program computer are discussed with reference to FIG. 4M herein that is particularly suitable to an on-the-chip memory detector arrangement. Several additional configurations for refreshing DRAMs used in a computer main memory will now be discussed, supplementing the discussion of other configurations herein.

One configuration for refreshing DRAMs used in a computer main memory implements a refresh controller circuit to disable the computer; such as with a halt signal, a wait signal, or a cycle stealing control signal; when a refresh operation is necessary. However, this configuration reduces throughput of the computer.

A more efficient configuration implements a refresh detector to detect when the computer is performing a refresh-tolerant operation, such as execution of a time consuming instruction, that does not need to access main memory for at least a refresh period of time. Then, the refresh detector can command a refresh operation on this time available basis instead of on a cycle stealing basis. Detection of such a refresh tolerant condition can be enhanced if the computer, such as with its micro-instructions, generates a refresh enable signal to identify a refresh tolerant condition.

Memory Architecture

Introduction

Various memory architectures are disclosed as being implemented with Mitsubishi RAMs and alternately are disclosed as being implemented with Toshiba DRAMs. One skilled in the memory art will readily be able to implement DRAM memories from the Mitsubishi RAM memory teachings and one skilled in the memory art will readily be able to implement Mitsubishi RAM memories from the DRAM memory teachings.

Various memory architectural embodiments are disclosed herein; such as having addressing arrangements with external scanout, internal scanout, and re-addressing; having RAS and CAS arrangements with fanned-out (not steered) RAS and CAS and with fanned-out (not steered) RAS and steered CAS; having selection with and without an output enable; having signal output bit (by-1) DRAMs and four output bit (by-4) DRAMs; and others. These memory architectures are illustrative of other combinations, permutations, and alternatives of the various features. For example, one skilled in the memory art can readily implement other memories having other addressing arrangements of external scanout, internal scanout, and/or re-addressing; having other RAS and CAS arrangements, such as with steered RAS and steered CAS and with other combinations of fanned-out and steered RAS and CAS; having other configurations of selection with and without output enable selection; and having bit arrangements other than signal output bit (by-1) DRAMs and four output bit (by-4) DRAMs and other combinations of bit arrangements with other memory features.

Various memory architectures are disclosed herein and those skilled in the art will be able to implement many other memory architectures from the teachings herein. These memory architectures can be implemented with detectors, delaying circuits, refresh circuits, address generators, control signal generators, and other circuits. For example, FIGS. 4B and 4C teach the combination of a processor, an address generator, detector circuits, delay circuits, and memories; where memories 222 therein may be implemented with the memory architectures disclosed herein and implied thereby.

Many of the memory signals, such as memory address and memory control signals, are fanned out to a plurality of DRAM chips. Fanout drivers may be needed to meet fanout requirements of a particular configuration. Such drivers are well known in the art. Also, such drivers are disclosed herein (i.e., FIG. 6F). For example; Signetics 8T95 to 8T98 circuits can be used in place of or in addition to the 74LS365 to 74LS368 circuits. Also, address bus logic shown in FIGS. 6E and 6F and data bus logic shown in FIGS. 6K to 6N are pertinent to the DRAM address bus logic and data bus logic.

Memory Dimensions

Introduction

There are several forms of memory dimensioning disclosed herein. For example, there is the dimensions of the scanout and re-addressing operations, the dimensions of the memory spatial array for external scanout, and the dimensions of the memory address structure.

The scanout and re-addressing operations, discussed in detail herein, may be considered to be a two dimensional configuration (i.e., FIGS. 6E to 6N).

The external scanout arrangement can be partitioned into a multi-dimensional spatial memory array (i.e., FIGS. 6E to 6N). Multiple spatial scanout dimensions can be used to increase the size of the scanout blocks of memory to maximize scanout operations and to minimize re-addressing operations. For example, a two dimensional (XY) array of DRAM IC chips can be implemented; similar to the Mitsubishi RAM and DRAM alternate configurations (i.e., FIGS. 6E to 6N); to increase the scanout block size and hence to minimize re-addressing operations, to maximize scanout operations, and to reduce the amount of external scanout logic needed to address the array of DRAMs.

The dimensions of the memory address structure are further illustrated in FIGS. 4F and 4G. Memory dimensions associated with memory address structure may be considered to be resident in the memory address structure. For example, a two dimensional memory address structure (i.e., FIG. 4F) can be converted to a single dimensional address structure (i.e., FIG. 4G) by changing the address generators from two dimensional address generators to single dimensional address generators. Similarly, a single dimensional memory address structure (i.e., FIG. 4G) can be converted to a two dimensional address structure (i.e., FIG. 4F) by changing the address generators from single dimensional address generators to two dimensional address generators. Also, the address generators shown in FIG. 4F are partitioned into two independent address generators operating relatively independent of each other to implement a two dimensional memory. Alternately, the address generator shown in FIG. 4G is partitioned into a single address generator to implement a single dimensional memory. The address multiplexers and DRAM array are shown having twenty address lines relatively independent of whether the address lines are generated by two relatively independent address generators (FIG. 4F) or by a single address generator (FIG. 4G). Similarly, the address structure can be partitioned into a multi-dimensional address structure having 3-dimensions, 4-dimensions, and 8-dimensions, or more by partitioning the address generators to establish the desired memory dimensions by the number of address generators operating relatively independent of each other.

The memory architecture, illustrated in FIGS. 4F and 4G, consisting of the address multiplexers and the DRAM array need not be specific to the dimension of the address generators. However, it is desirable to adapt the memory architecture to the address structure; such as the number of MSBs, the number of LSBs, the external scanout configuration, and other considerations.

A two dimensional memory map display configuration may implicitly be a two dimensional array of pixels and hence may have particular advantages when implemented as an two dimensional address configuration. Such a configuration can be implemented by having two separate and relatively independent address registers, such as an X address register and a Y address register. Alternately, a stored program in a computer may implicitly be a single dimensional array of instructions and hence may have particular advantages when implemented as an single dimensional address configuration. Such a configuration can be implemented with a single address register instead of multiple relatively independent address registers. Alternately, other configurations may be provided. For example, a display system may be implemented as a single dimensional address configuration and a stored program computer may be implemented as a multi-dimensional address configuration.

Multi-Dimensional Memory (FIG. 4F)

A multi-dimensional memory architecture is disclosed in the embodiment of an image memory (FIGS. 6E to 6N). An alternate embodiment thereof will now be discussed with reference to the block diagram shown in FIG. 4F, which is consistent with the detailed memory schematic diagrams (i.e., FIGS. 6E to 6N).

Various DRAMs, such as the Toshiba TC514256P DRAMs, implement a fast page mode read cycle and a fast page mode write cycle, which can be used to implement the multi-dimensional memory architecture. See the Toshiba Corporation MOS MEMORY PRODUCTS DATA BOOK '86-7 at pages 119 et seq and particularly at page 125 therein. The fast page mode read cycle and the fast page mode write cycle can both use the multi-dimensional architecture of the present invention, where the fast page mode read cycle will be discussed herein as representative of both, read and write cycles. Also, multi-dimensional memory architecture is disclosed in FIGS. 6E to 6N showing a configuration of combining both, read and write circuits.

A multi-dimensional DRAM image memory architecture, such as for a display system, is shown in FIG. 4F as illustrative of other memory configurations in accordance with the present invention. The five LSBs of each, the X-address and the Y-address, provide the ten column address bits for the DRAMs. The five MSBs of each, the X-address and the Y-address, provide the ten row address bits for the DRAMs. Hence, a high speed fast page memory read cycle DRAM X/Y scanout can be implemented for a 5-bit by 5-bit (32-pixel by 32-pixel) image region; just as the high speed X/Y scanout generates a 3-bit by 3-bit (8-pixel by 8-pixel) image region (FIGS. 6E to 6N). In the present DRAM configuration; a detector, such as an overflow detector, can be implemented to monitor the fifth-bit address generator carry control signal to control the RAS* and CAS* fast page memory read cycle signals; just as the overflow detector monitors the third-bit address generator carry control signal to control the X/Y scanout and re-address (FIGS. 6E to 6N). Alternately, other types of detectors can be implemented.

Row and column multiplexers can be used (FIG. 4F) to multiplex row and column addresses into each DRAM under control of the detector signal, such as the fifth-bit address generator carry control signal in the FIG. 4F configuration; just as the third-bit address generator carry control signal generates an overflow signal to control the X/Y scanout and re-address modes (FIGS. 6E to 6N). Decoders and drivers can also be used (i.e., FIGS. 6F and 4H to 4J), although these circuits are not shown in FIG. 4F for simplicity.

Operation of this configuration in the context of a display system will now be discussed. The X-address generator 430A and the Y-address generator 430B generate addresses having X/Y scanout (LSB) signals and X/Y re-address (MSB) signals associated with geometric processing; just as the X-address generator and the Y-address generator generate addresses having X/Y scanout (LSB) signals and re-address (MSB) signals associated with geometric processing (FIGS. 6E to 6N). Operating in the fast page mode read cycle with the multiplexer selecting the column address (LSBs), the DRAMs 430F are accessed by the changing column addresses (LSBs) for a fixed row address (MSBs) as long as the addresses are within a 5-bit by 5-bit (32-pixel by 32-pixel) block; just as the RAMs are accessed by the changing LSB addresses for fixed MSB addresses as long as the addresses are within a 3-bit by 3-bit (8-pixel by 8-pixel) block (FIGS. 6E to 6N). When the DRAM addresses traverse a boundary of the 5-bit by 5-bit (32-pixel by 32-pixel) block, a row address changes and a fifth-bit overflow is detected; just as in said FIGS. 6E to 6N when the memory addresses traverse a boundary of the 3-bit by 3-bit (8-pixel by 8-pixel) block, an MSB address changes and a third-bit overflow is detected. When the overflow control bit in the DRAM address generator is detected, a RAS* operation is performed by selecting the row multiplexer and generating a RAS* strobe to change the row address and then to return to CAS* operations by selecting the column multiplexer and generating multiple CAS* strobes to scanout pixels in the new-address block; just as in FIGS. 6E to 6N when the overflow bit is detected, a re-addressing operation is performed to change the MSB address bits in the DRAM, thereby establishing a new address block, and then to return to scanout operations in order to scanout pixels in the new address block.

Single Dimensional Memory (FIG. 4G)

A multi-dimensional memory architecture is disclosed in an embodiment of an image memory (FIGS. 6E to 6N). An alternate single dimensional embodiment thereof will now be discussed with reference to the block diagram shown in FIG. 4G, which is consistent with the detailed memory schematic diagrams (i.e., FIGS. 6E to 6N).

Various DRAMs, such as the Toshiba TC514256P DRAMs, implement a fast page mode read cycle and a fast page mode write cycle, which can be used to implement a single dimensional memory architecture. See the Toshiba Corporation MOS MEMORY PRODUCTS DATA BOOK '86-7 at pages 119 et seq and particularly at page 125 therein. The fast page mode read cycle and the fast page mode write cycle can both use the multi-dimensional architecture of the present invention, where the fast page mode read cycle will be discussed as representative of both, read and write cycles. Also, memory architecture disclosed in FIGS. 6E to 6N shows a configuration combining both, read and write circuits.

A single dimensional DRAM main memory architecture, such as for a computer system, is shown in FIG. 4G as illustrative of other memory configurations in accordance with the present invention. The ten LSBs of the address provide the ten column address bits for the DRAMs. The ten MSBs of the address provide the ten row address bits for the DRAMs. Hence, a high speed fast page memory read cycle DRAM scanout can be implemented for a 10-bit (1024-word) main memory region; just as the high speed X/Y scanout generates a 6-bit (64-pixel) two dimensional image region (FIGS. 6E to 6N). In the present DRAM configuration; a detector, such as an overflow detector, can be implemented to monitor the tenth-bit address generator carry control signal to control the RAS* and CAS* fast page memory read cycle signals; just as the overflow detector monitors the third-bit address generator carry control signal to control the X/Y scanout and re-address (FIGS. 6E to 6N). Alternately, other types of detectors can be implemented.

Row and column multiplexers can be used (FIG. 4G) to multiplex row and column addresses into each DRAM under control of the detector signal, such as the tenth-bit address generator carry control signal in the FIG. 4G configuration; just as the third-bit address generator carry control signal generates an overflow signal to control the X/Y scanout and re-address modes (FIGS. 6E to 6N). Decoders and drivers can also be used (i.e., FIGS. 4H to 4J), although these circuits are not shown in FIG. 4G for simplicity.

Operation of this configuration in the context of a microprocessor system will now be discussed. The address generator 431A generates addresses having scanout (LSB) signals and re-address (MSB) signals associated with stored program processing; just as the X-address generator and the Y-address generator generate addresses having X/Y scanout (LSB) signals and re-address (MSB) signals associated with geometric processing in FIGS. 6E to 6N. Operating in the fast page mode read cycle with the multiplexer selecting the column address (LSBs), the DRAMs 431F are accessed by the changing column addresses (LSBs) for a fixed row address (MSBs) as long as the addresses are within a 10-bit (1024-word) block; just as the RAMs are accessed by the changing LSB addresses for fixed MSB addresses as long as the addresses are within a 3-bit by 3-bit (8-pixel by 8-pixel) block in FIGS. 6E to 6N. When the DRAM addresses traverse a boundary of the 10-bit (1024-word) block, a row address changes and a tenth-bit overflow is detected; just as in FIGS. 6E to 6N when addresses traverse a boundary of the 3-bit by 3-bit (8-pixel by 8-pixel) block, an MSB address changes and a third-bit overflow is detected. When the overflow control bit in the DRAM address generator is detected, a RAS* operation is performed by selecting the row multiplexer and generating a RAS* strobe to change the row address and then to return to CAS* operations by selecting the column multiplexer and generating multiple CAS* strobes to scanout pixels in the new address block; just as in FIGS. 6E to 6N when the overflow control bit address generator is detected, a re-addressing operation is performed to change the MSB address bits and then to return to scanout operations to scanout pixels in the new address block.

FIG. 4H Architecture

General

A memory architecture is disclosed in FIGS. 6E to 6N in an embodiment of an image memory. An alternate embodiment thereof will now be discussed with reference to FIG. 4H, which is consistent with the detailed memory schematic diagrams in FIGS. 6E to 6N.

The memory architecture shown in FIG. 4H uses fast page mode one megabit by-1 (one output bit) DRAM chips (such as the Toshiba TC511000P/J10 DRAMs), having a CAS chip select, having a CAS/RAS multiplexer, and not having output enable selection on-the-chip. Alternately, it can be implemented with other memory devices: such as with static column mode, nibble mode, or other mode devices; by-4 (four output bits), by-8 (eight output bits), or other output configuration; and other alternatives. It is arranged in an array of 8-columns (each column having 16-chips) by 16-rows (each row having 8-chips) for a total of 128 DRAM chips; providing 8-million words of memory. The 16-chip columns (columns 0 to 15) provide 16-bit words. Each column contains one million words, implicit in the one million addresses per DRAM chip. Hence, the total of 8 columns contain 8-million words. The vertical dashed lines inbetween the first row (at the top) and the last row (at the bottom) indicate 14 additional rows that are not shown for a total of 16 rows. The horizontal dashed lines inbetween the second column (the B column) and the right column (the H column) indicate 5 additional columns that are not shown for a total of 8 columns.

FIG. 4L is a detailed schematic of one configuration of the peripheral circuitry; the CAS multiplexers, the RAS multiplexers, the DRAM chip pinouts, the address bus, and the data bus; that can be used with the memory architecture shown in FIG. 4H. Many other peripheral circuitry configurations can also be implemented (i.e., FIG. 6F).

The address bits can be allocated, partitioned, and distributed in various ways; such as to the external scanout, the internal scanout, and the re-addressing operations. Also, the address bits can be arranged in accordance with single dimensional configurations and multi-dimensional configurations. For example, address bit assignments for a single dimensional configuration (the ONE column) and for a two dimensional configuration (the TWO column) with the allocation, partitioning, and distribution of address bits between external scanout, internal scanout, and re-addressing operations and the correspondence of address bits between a single dimensional configuration (the ONE column) and a two dimensional configuration (the TWO column) in accordance with the FIG. 4H configuration is shown in the various FIG. 4H Address Correspondence Tables herein.

The CAS address bits and the RAS address bits are shown selected by the RAS* signal; implemented by enabling the CAS multiplexer or the RAS multiplexer, respectively, to place the CAS address bits or the RAS address bits, respectively, on the 10-bit address bus to be fanned-out to the DRAM chips. Generation of a RAS cycle causes the RAS* signal to select the RAS multiplexer for placing the RAS row address bits on the address bus and for strobing the DRAM chips with the RAS* signal. Generation of a CAS cycle causes the RAS* signal to select the CAS multiplexer for placing the CAS column address bits on the address bus and for strobing the DRAM chips with the CAS* signal. Multiplexers are readily available, such as the 74LS365 to 74LS368 hex multiplexers and the 8T95 to 8T98 hex multiplexer drivers. Use of such multiplexers are shown in FIG. 6F. Alternately, other control signals can be used to select the RAS* and CAS* multiplexers and other multiplexer arrangements can be implemented.

RAS signal steering is not shown in FIG. 4H. However, RAS signal steering could also be used to select the column of DRAM chips to receive a RAS* signal strobe, such as in the same way that CAS signal steering is implemented. In this FIG. 4H configuration; RAS signal steering is not shown because it is not necessary for RAS steering to select the column of DRAM chips. This is because, for this display configuration, it is permissible to load the same RAS address bits into all of the DRAM chips for each RAS cycle. Also, for this FIG. 4H external scanout configuration, it is advantageous to load the same RAS address bits into all of the DRAM chips for each RAS cycle because the external scanout may be considered to be an extension of the internal scanout and hence is facilitated by the same block address, the RAS row address bits, being the same for all of the DRAM chips.

WRITE signal steering is not shown in FIG. 4H. However, WRITE signal (W) steering could also be used to select the column of DRAM chips for write operations, such as in the same way that CAS signal steering is implemented. In this FIG. 4H configuration; write signal steering is not shown because it is not necessary for write signal steering to select the column of DRAM chips. This is because, for this FIG. 4H configuration, it is permissible to invoke writing for all DRAM chips and to select the particular column of DRAM chips with the steered CAS* signal.

The single bit data output signal from each of the DRAM chips in a column are grouped into one 16-bit word per column. Each one of the 16-rows corresponds to a different one of the 16-bits in the data-word. The corresponding output data bit in each of the 8-columns (all of the 8-bits in the same row) are ORed together, and the one data bit in each group of ORed row data bits (the output data bit corresponding to the column selected by the steered CAS signal) is selected and all of the other 7-bits ORed therewith are non-selected. This ORing can be implemented by tristate outputs, such as controlled by an output enable signal or by a CAS* signal; by logical AND-OR gates; or by other well known methods. For the FIG. 4H configuration, CAS controlled tristate outputs are assumed; where the single column of DRAM chips that are selected with the steered CAS* signal are output-enabled while all of the other seven columns of DRAM chips that are non-selected with the steered CAS signals are output disabled.

The 16-bit output data bus from the columns of DRAM chips can be processed with a bi-directional buffer, such as the Intel 8216 bi-directional buffers shown in FIGS. 6G to 6N. The bi-directional buffer facilitates sharing of the data bus for both writing (inputting) and reading (outputting) of data.

The address input lines 400A to 400Z (FIG. 4H) are the input lines to the memory array from the address generators. The address input lines represent address input internal scanout lines 400A to 400J, address input external scanout lines 400V to 400X, and address input re-addressing lines 400K to 400U. Address input lines 400Y and 400Z are unused in this FIG. 4H configuration and symbol 4000 is not used for the sake of clarity. Single dimensional address signals from the least significant bit address signal A0 to the most significant bit address signal A22 and two dimensional address signals from the X-address least significant bit AX0 to the X-address most significant bit AX10 and from the Y-address least significant bit AY0 to the Y-address most significant bit AY11 are assigned to the address input lines 400A to 400X.

First FIG. 4H Configuration

In the first FIG. 4H configuration shown in the FIRST FIG. 4H ADDRESS CORRESPONDENCE TABLE, the least significant bits are assigned to internal scanout and the middle significant bits are assigned to external scanout for higher speed operations while the more significant bits are assigned to re-addressing. In addition, the .most significant bit, the A22 or AY11 bit, is assigned to external scanout for board selection, such as for a multi-board configuration; as disclosed with reference to FIGS. 6E to 6N. This configuration is discussed in more detail below.

In a single dimensional addressing configuration (the ONE column), such as used in a computer main memory, the address is divided into ten MSBs (the RAS address bits; A12 to A21) and ten LSBs (the CAS address bits; A0 to A9). The A character designates an address bit and the number designates the significance of the bit, with zero being the least significant bit. Also, the addresses are further divided into two CAS-steered external scanout bits (A10 and A11) and a board select CAS-steered board select scanout bit (A22).

In a two dimensional addressing configuration (the TWO column), such as used in a display image memory, the addresses are divided into ten MSBs (the RAS address bits; AX6 to AX10 and AY6 to AY10) and ten LSBs (the CAS address bits; AX0 to AX4 and AY0 to AY4). The A character designates an address bit; the X or Y characters designate the X-dimension and the Y-dimension, respectively; as disclosed with reference to FIGS. 6E to 6N; and the number designates the significance of the bit, with zero being the least significant bit. Also, the addresses are further divided into two CAS-steered external scanout bits (AX5 and AY5) and a board select CAS-steered board select scanout bit (AY11).

CAS signal steering selects the column of DRAM chips to receive a CAS signal strobe. This facilitates external scanout; as disclosed with reference to FIGS. 6E to 6N; by selecting different columns of RAM IC chips for different combinations of external scanout address bits. CAS signal steering can be implemented with a decoder, such as a 74AS138 decoder, that is gated with the CAS* signal. In a two dimensional addressing configuration, such as used in a display image memory; the CAS* signal is steered to one of eight outputs with three address bits (AX5, AY5, and AY11). Alternately, in a single dimensional addressing configuration, such as used in a computer main memory; the CAS* signal is steered to one of eight outputs with three address bits (A10, A11, and A22; respectively). See the FIRST FIG. 4H ADDRESS CORRESPONDENCE TABLE. For a multi-board memory partitioning, one of the three address bits (i.e., A22 or AY11) can be provided as an uncomplemented signal for one of the memory boards and can be provided as a complemented signal for another one of the memory boards; as discussed with reference to FIGS. 6E to 6N.

The relationship between the groupings of bits will now be discussed for the first single dimensional configuration. The internal scanout bits (A0 to A9) are adjacent therebetween so that activity in the least significant bits is within the internal scanout region. The external scanout bits (A10 and A11) are adjacent therebetween so that activity in the middle significant bits is within the external scanout region and the external scanout bits (A10 and A11) are adjacent to the internal scanout bits so that activity in the least significant bits and in the middle significant bits is within the scanout (internal and external) region. The RAS re-addressing bits (A12 to A21) are adjacent therebetween so that activity in the most significant bits is within the re-addressing region and the re-addressing bits (A12 to A21) are adjacent to the external scanout bits to facilitate the above .internal scanout and external scanout with a minimum of slow down from re-addressing operations. The most significant bit (A22) is assigned to an external scanout connection to implement board selection.

The relationship between the groupings of bits will now be discussed for the first two dimensional configuration. The internal scanout bits (AX0 to AX4 and AY0 to AY4) are adjacent therebetween so that activity in the least significant bits is within the internal scanout region. The external scanout bits (AX5 and AY5) are adjacent therebetween so that activity in the middle significant bits is within the external scanout region and the external scanout bits are adjacent to the internal scanout bits so that activity in the least significant bits and in the middle significant bits is within the scanout (internal and external) region. The RAS re-addressing bits (AX6 to AX10 and AY6 to AY10) are adjacent therebetween so that activity in the most significant bits is within the re-addressing region and the re-addressing bits are adjacent to the external scanout bits to facilitate the above internal scanout and external scanout with a minimum of slowdown from re-addressing operations. The most significant bit (AY11) is assigned to an external scanout connection, such as to implement board selection.

For the two dimensional configuration; the internal scanout bits are arranged in a square array having an equal number of least significant X-address bits and Y-address bits; the external scanout bits are arranged in a square array having an equal number of middle significant X-address bits and Y-address bits; the combination of internal scanout bits and external scanout bits (AX0 to AX5 and AY0 to AY5) are arranged in a square array having an equal number of less significant X-address bits and Y-address bits; and the re-addressing bits are arranged in a square array having an equal number of most significant X-address bits and Y-address bits. This facilitates a square array for scanout; the internal scanout bits and/or the external scanout bits; to maximize scanout operations and to minimize re-addressing operations for a configuration (i.e., a two dimensional display configuration) that is suitable for such square array enhancements. Alternately, non-square arrays may be provided from the teachings herein to enhance configurations that are suitable for such non-square array enhancements; i.e., a two dimensional configuration having a non-square number of internal scanout bits or a two dimensional configuration having a non-square number of external scanout bits. Alternately, other square and non-square arrays may be provided from the teachings herein to enhance memory performance or other memory characteristics.

Second FIG. 4H Configuration

The second FIG. 4H configuration shown in the SECOND FIG. 4H ADDRESS CORRESPONDENCE TABLE is similar to the first FIG. 4H configuration shown in the FIRST FIG. 4H ADDRESS CORRESPONDENCE TABLE except that the external scanout bit 400X has been reassigned to a less significant external scanout bit position. This assigns all of the internal scanout bits to the less significant bit positions, all of the external scanout bits to the middle significant bit positions, and all of the RAS re-addressing bits to the most significant bit positions. The purpose is to increase the scanout page size for enhanced performance. In particular, the external scanout bit 400X is assigned to a middle significant external address bit and the more significant address bits are each moved down to a one bit more significant position in order to make room for bit 400X.

For the two dimensional configuration; the external scanout bits, which were arranged in a square array having an equal number of middle significant X-address bits and Y-address bits in said first FIG. 4H configuration, are now arranged in a non-square array (AX5, AY5, and AX6) having an unequal number of middle significant X-address bits (2) and Y-address bits (1) in said second FIG. 4H configuration. Alternately, other square and non-square arrays may be provided from the teachings herein to enhance memory performance or other memory characteristics.

Third FIG. 4H Configuration

The third FIG. 4H configuration shown in the THIRD FIG. 4H ADDRESS CORRESPONDENCE TABLE is similar to the second FIG. 4H configuration shown in the SECOND FIG. 4H ADDRESS CORRESPONDENCE TABLE except that the external scanout bits and the internal scanout bits have been interchanged and the less significant two dimensional bits (AX and AY) have been reassigned. This assigns the external scanout bits to the less significant bit positions, the internal scanout bits to the middle significant bit positions, and the RAS re-addressing bits to the most significant bit positions. The purpose is to place the external scanout bits in the more active LSB positions, such as for a three dimensional external scanout configuration and such as for a configuration having higher speed external scanout compared to internal scanout.

The relationship between the groupings of bits will now be discussed for the third two dimensional configuration. The external scanout bits (AX0, AX1, and AY0) are adjacent therebetween so that activity in the least significant bits is within the external scanout region. The internal scanout bits (AX2 to AX6 and AY1 to AY5) are adjacent therebetween so that activity in the middle significant bits is within the internal scanout region and the external scanout bits (AX0, AX1, and AY0) are adjacent to the internal scanout bits so that activity in the least significant bits and in the middle significant bits is within the scanout (internal and external) region. The RAS re-addressing bits (AX7 to AX10 and AY6 to AY11) are adjacent therebetween so that activity in the most significant bits is within the re-addressing region and the re-addressing bits are adjacent to the external scanout bits to facilitate the above internal scanout and external scanout with a minimum of slow down from re-addressing operations.

For the two dimensional configuration; the external scanout bits are arranged in a nearly square array having a nearly equal number of least significant X-address bits and Y-address bits; the internal scanout bits are arranged in a square array having an equal number of middle significant X-address bits and Y-address bits; the combination of internal scanout bits and external scanout bits (AX0 to AX6 and AY0 to AY5) are arranged in a nearly square array having a nearly equal number of less significant X-address bits and Y-address bits; and the re-addressing bits are arranged in a square array having an equal number of most significant X-address bits and Y-address bits. This facilitates a nearly square array for scanout; the internal scanout bits and/or the external scanout bits; to maximize scanout operations and to minimize re-addressing operations for a configuration (i.e., a two dimensional display configuration) that is suitable for such square or nearly square array enhancements. Alternately, non-square arrays may be provided from the teachings herein to enhance configurations that are suitable for such non-square array enhancements; i.e., a two dimensional configuration having a non-square number of internal scanout bits or a two dimensional configuration having a non-square number of external scanout bits. Alternately, other square and non-square arrays may be provided from the teachings herein to enhance memory performance or other memory characteristics.

Forth FIG. 4H Configuration

The forth FIG. 4H configuration shown in the FORTH FIG. 4H ADDRESS CORRESPONDENCE TABLE-is similar to the second FIG. 4H configuration shown in the SECOND FIG. 4H ADDRESS CORRESPONDENCE TABLE except that the external scanout bits and the internal scanout bits have been intermixed and the two dimensional AX and AY address bits have been reassigned. The purpose is to illustrate another alternate configuration in accordance with the present invention. For example, in a configuration having memory speeds that are comparable for both, internal scanout and for external scanout, internal scanout address bits and external scanout address bits can be intermixed without the need to slow down memory operations when operations traverse between internal scanout and external scanout operations. Other intermixed configurations can be provided, where the internal scanout bits, external scanout bits, and RAS re-addressing bits can be otherwise intermixed; such as by assigning the internal scanout bits to the least significant bit positions and by intermixing the external scanout bits and RAS re-addressing bits in the more significant bit positions; or such as other configurations of address bit intermixing.

Fifth FIG. 4H Configuration

The fifth FIG. 4H configuration shown in the FIFTH FIG. 4H ADDRESS CORRESPONDENCE TABLE is similar to the forth FIG. 4H configuration shown in the FORTH FIG. 4H ADDRESS CORRESPONDENCE TABLE except that the external scanout bits, the internal scanout bits, and the re-addressing bits have been intermixed and the two dimensional AX and AY address bits have been reassigned. The purpose is to illustrate another alternate configuration in accordance with the present invention. However, this intermixed configuration may have reduced performance for a configuration having slower re-addressing operations compared to scanout operations. This is because LSB activity can invoke re-addressing operations. However, this configuration is shown for completeness. Other intermixed configurations can be provided, where the internal scanout bits, external scanout bits, and RAS re-addressing bits can be otherwise intermixed; such as by assigning the internal scanout bits to the least significant bit positions and by intermixing the external scanout bits and RAS re-addressing bits in the more significant bit positions; or such as other configurations of address bit intermixing.

Sixth FIG. 4H Configuration

The sixth FIG. 4H configuration shown in the SIXTH FIG. 4H ADDRESS CORRESPONDENCE TABLE is similar to the third FIG. 4H configuration shown in the THIRD FIG. 4H ADDRESS CORRESPONDENCE TABLE except that the address lines associated with the external scanout bits have been intermixed therebetween and have been selectively complemented, the address lines associated with the internal scanout bits have been intermixed therebetween and have been selectively complemented, and the address lines associated with the re-addressing bits have been intermixed therebetween and have been selectively complemented. The purpose is to illustrate another alternate configuration in accordance with the present invention where the address lines within a group (i.e.; internal scanout, external scanout, and re-addressing groups) can be interchanged and complemented without affecting the operation of the memory system. Other intermixed and complemented configurations can be provided, where the internal scanout bits, external scanout bits, and RAS re-addressing bits can be otherwise intermixed and complemented.

Seventh FIG. 4H Configuration

The seventh FIG. 4H configuration shown in the SEVENTH FIG. 4H ADDRESS CORRESPONDENCE TABLE is similar to the second FIG. 4H configuration shown in the SECOND FIG. 4H ADDRESS CORRESPONDENCE TABLE except that, for the two dimensional configuration, the address lines associated with the internal scanout bits, external scanout bits, and re-addressing bits have been changed from square or nearly square arrays to non-square arrays. For example, the address lines associated with the internal scanout bits have been changed to be long in the X-dimension (AX0 to AX7) and short in the Y-dimension (AY0 and AY1); the address lines associated with the external scanout bits have been changed to be long in the X-dimension (AX8 and AX9) and short in the Y-dimension (AY2); and the address lines associated with the re-addressing bits have been changed to be long in the Y-dimension (AY3 to AY11) and short in the X-dimension (AX10). The purpose is to illustrate another alternate two dimensional configuration in accordance with the present invention where the address lines within a group (i.e.; internal scanout, external scanout, and re-addressing groups) are non-square. For example, such a non-square configuration can be used in conjunction with processors having a preferred dimension and a non-preferred dimension.

FIG. 4I Architecture

General

The quantity of internal scanout addresses is typically constrained by IC chip complexity, pinouts, and other well known IC constraints. The quantity of external scanout is not as limited because the scanout logic is external to the IC chip, such as on a PC board or on a plurality of PC boards, and hence can be expanded to 64 RAM chips (the Mitsubishi RAM configuration); 128 RAM chips (the FIG. 4H to FIG. 4K Toshiba RAM configurations); 1024 RAM chips; 16384 RAM chips (the FIG. 4I Toshiba RAM configuration); 65536 RAM chips; or other number of RAM chips. For example, the FIG. 4H configuration has a 23-bit address register (or registers) with 10 internal scanout bits, 3 external scanout bits, and 10 re-addressing bits. It can be expanded to the FIG. 4I configuration having a 30-bit address register (or registers) with 10 internal scanout bits, 10 external scanout bits, and 10 re-addressing bits. The 10 external scanout bits can be decoded in a single dimensional scanout decoder with 10-bit decoder logic to generate 1.024 decoded output signals in response to the 10 encoded input address signals. Each of the 1024 decoded output signals can select a DRAM column; i.e., a 16 chip column for the FIG. 4H configuration (see FIG. 4I) or a 4-chip column for the FIG. 4J configuration.

The memory architecture shown in FIG. 4H supra is the same as the memory shown in FIG. 4I; except that the board select bit is grouped with the external scanout bits for simplicity of discussion and except that the external scanout address has been expanded from 3-bits (400V to 400X) to 10-bits (400V to 400AE) to illustrate the extensive memory expansion capability in accordance with the present invention. This address expansion extends the number of DRAM chips from 128 DRAM chips in 8-columns to 16384 DRAM chips in 1024 columns. This also extends the number of words from 8-million words to 1-billion words.

As with the FIG. 4H configuration; the memory architecture shown in FIG. 4I uses fast page mode one megabit by-1 (one output bit) DRAM chips (such as the Toshiba TC511000P/J10 DRAMs), having a CAS chip select, having a CAS/RAS multiplexer, and not having output enable selection. In contrast to FIG. 4H; it is arranged in an array of 1024-columns (each column having 16-chips) by 16-rows (each row having 1024-chips) for a total of 16384 DRAM chips; providing 1-billion words of memory. The 16-chip columns (columns 0 to m) provide 16-bit words. Each column contains one million words, implicit in the one million addresses per DRAM chip. Hence, the total of 1024-columns contain 1-billion words. The vertical dashed lines inbetween the first row (at the top) and the last row (at the bottom) indicate 14 additional rows that are not shown for a total of 16 rows. The horizontal dashed lines inbetween the second column (the B column) and the right column (the m column) indicate 1021 additional columns that are not shown for a total of 1024 columns.

The address input lines 400A to 400AE (FIG. 4I) are the input lines to the memory array from the address generators. The address input lines represent address input internal scanout lines 400A to 400J, address input external scanout lines 400V to 400AE, and address input re-addressing lines 400K to 400U. Single dimensional address signals from the least significant bit address signal A0 to the most significant bit address signal A29 and two dimensional address signals from the X-address least significant bit AX0 to the X-address most significant bit AX15 and from the Y-address least significant bit AY0 to the Y-address most significant bit AY15 are assigned to the address input lines 400A to 400AE.

The second FIG. 4I configuration is disclosed below, similar to the second FIG. 4H configuration supra. The first and the third to seventh FIG. 4I configurations are not explicitly disclosed because the disclosure of the first and the third to seventh FIG. 4I configurations are similar to the first and the third to seventh FIG. 4H configurations discussed above and hence the first and the third to seventh FIG. 4I configurations can readily be generated by one skilled in the art from the first and the third to seventh FIG. 4H configurations discussed above and the second FIG. 4I configuration discussed below.

FIG. 4I Configuration

As in the second FIG. 4H configuration; in the second FIG. 4I configuration shown in the FIG. 4I ADDRESS CORRESPONDENCE TABLE, the least significant bits are assigned to internal scanout and the middle significant bits are assigned to external scanout for higher speed operations while the more significant bits are assigned to re-addressing.

In a single dimensional addressing configuration (the ONE column), such as used in a computer main memory, the address is divided into ten MSBs (the RAS address bits; A20 to A29) and ten LSBs (the CAS address bits; A0 to A9). The A character designates an address bit and the number designates the significance of the bit, with zero being the least significant bit. Also, the addresses are further divided into ten CAS-steered external scanout bits (A10 and A19).

In a two dimensional addressing configuration (the TWO column), such as used in a display image memory, the addresses are divided into ten MSBs (the RAS address bits; AX10 to AX14 and AY10 to AY14) and ten LSBs (the CAS address bits; AX0 to AX4 and AY0 to AY4). The A character designates an address bit; the X or Y characters designate the X-dimension and the Y-dimension, respectively, as disclosed with reference to FIGS. 6E to 6N; and the number designates the significance of the bit, with zero being the least significant bit. Also, the addresses are further divided into ten CAS-steered external scanout bits (AX5 to AX9 and AY5 to AY9).

FIG. 4J Architecture

General

A memory architecture is disclosed in FIGS. 6E to 6N in an embodiment of an image memory. An alternate embodiment thereof will now be discussed with reference to FIG. 4J, which is consistent with the detailed memory schematic diagrams in FIGS. 6E to 6N.

The memory architecture shown in FIG. 4J uses fast page mode one megabit by-4 (four output bits) DRAM chips (such as the Toshiba TC514256P/J10 DRAMs), having an output enable chip select, having a CAS/RAS multiplexer, and not having CAS steering. Alternately, it can be implemented with other memory devices: such as with static column mode, nibble mode, or other mode devices; by-1 (one output bit), by-8 (eight output bits), or other output configuration; and other alternatives. It is arranged in an array of 32-columns (each column having 4 chips) by 4 rows (each row having 32 chips) for a total of 128 DRAM chips; providing 8-million words of memory. The 4-chip columns (columns 0 to 3) provide 16-bit words. Each column contains 256K words, implicit in the 256K addresses per DRAM chip. The total of 32 columns hence contain 8-million words. The vertical dashed lines inbetween the first row (at the top) and the last row (at the bottom) indicate two additional rows that are not shown for a total of 4 rows. The horizontal dashed lines inbetween the second column (the B column) and the right column (the AF column) indicate 29 additional columns that are not shown for a total of 32 columns.

FIG. 4L is a detailed schematic of one configuration of the peripheral circuitry; the CAS multiplexers, the RAS multiplexer, the DRAM chip pinouts, the address bus, and the data bus; that can be used with the memory architecture shown in FIG. 4J. Many other peripheral circuitry configurations can also be implemented (i.e., FIG. 6F).

The address bits can be allocated, partitioned, and distributed in various ways; such as to the external scanout, the internal scanout, and the re-addressing operations. Also, the address bits can be arranged in accordance with single dimensional configurations and multi-dimensional configurations. For example, address bit assignments for a single dimensional configuration (the ONE column) and for a two dimensional configuration (the TWO column) with the allocation, partitioning, and distribution of address bits between external scanout, internal scanout, and re-addressing operations and the correspondence of address bits between a single dimensional configuration (the ONE column) and a two dimensional configuration (the TWO column) in accordance with the FIG. 4J configuration is shown in the various FIG. 4J Address Correspondence Tables herein.

The CAS address bits and the RAS address bits are shown selected by the RAS* signal; implemented by enabling the CAS multiplexer or the RAS multiplexer, respectively, to place the CAS address bits or the RAS address bits, respectively, on the 9-bit address bus to be fanned-out to the DRAM chips. Generation of a RAS cycle causes the RAS* signal to select the RAS multiplexer for placing the RAS row address bits on the address bus and for strobing the DRAM column chips with the RAS signal. Generation of a CAS cycle causes the RAS* signal to select the CAS multiplexer for placing the CAS column address bits on the address bus and for strobing the DRAM chips with the CAS* signal. Multiplexers are readily available, such as the 74LS365 to 74LS368 hex multiplexers and the 8T95 to 8T98 hex multiplexers. Use of such multiplexers are shown in FIG. 6F. Alternately, other control signals can be used to select the RAS* and CAS* multiplexers and other multiplexer arrangements can be implemented.

Neither CAS nor RAS signal steering is shown in FIG. 4J. However, CAS signal steering and/or RAS signal steering could be used to select the column of DRAM chips to receive a CAS* or a RAS* signal strobe, such as in the same way that CAS signal steering is implemented in FIG. 4H for external scanout. In this FIG. 4J configuration; neither CAS signal steering nor RAS signal steering is shown. RAS signal steering is not shown for the same reasons that RAS signal steering is not shown for the FIG. 4H configuration, as discussed with reference to FIG. 4H. CAS signal steering is not shown because the output enable signal steering provides a IC chip select function. Alternately, CAS signal steering can be implemented in place of or in addition to output enable steering, such as discussed with reference to FIG. 4H. For example, CAS signal steering can be implemented to provide write selection for a configuration where the output enable signal performs a chip select function for reading but not for writing.

WRITE signal steering is not shown in FIG. 4J. However, WRITE signal (W) steering could also be used to select the column of DRAM chips for write operations, such as in the same way that CAS signal steering is implemented with reference to FIG. 4H. In this FIG. 4J configuration; write signal steering is not shown because it is not necessary for write signal steering to select the column of DRAM chips. This is because, for this FIG. 4J configuration, it is permissible to invoke writing for all DRAM chips and to select the particular column of DRAM chips with the steered output enable signal.

The four data output signals from each of the DRAM chips in a column are grouped into one 16-bit word per column. Each one of the 4-rows corresponds to a different group of four of the 16-bits in the data word. The corresponding output data bit in each of the 32-columns (all of the 32-bits corresponding in the same row) are ORed together, and the one data bit in each group of ORed row data bits (the output data bit corresponding to the column selected by the steered output enable signal) is selected and all of the other 31-bits ORed therewith are non-selected. This ORing can be implemented by tristate outputs, such as controlled by an output enable signal or by a CAS* signal; by logical AND-OR gates; or by other well known methods. For the FIG. 4J configuration, output enable (OE) controlled tristate outputs are assumed; where the column of four DRAM chips that are selected with the steered output enable signal are output-enabled while all of the other columns of DRAM chips that are non-selected with the steered output enable signal are output disabled.

The 16-bit output data bus from the columns of DRAM chips can be processed with a bi-directional buffer, such as the Intel 8216 bi-directional buffers shown in FIGS. 6G to 6N. The bi-directional buffer facilitates the sharing of the data bus for both writing (inputting) and reading (outputting) of data.

The address input lines 400A to 400Z (FIG. 4J) are the input lines to the memory array from the address generators. The address input lines represent address input internal scanout lines 400A to 400J, address input external scanout lines 400V to 400Z, and address input re-addressing lines 400K to 400U. Symbol 400O is not used for the sake of clarity. Single dimensional address signals from the least significant bit address signal A0 to the most significant bit address signal A22 and two dimensional address signals from the X-address least significant bit AX0 to the X-address most significant bit AX11 and from the Y-address least significant bit AY0 to the Y-address most significant bit AY10 are assigned to the address input lines 400A to 400Z.

The various FIG. 4H configurations disclosed herein can be adapted to the FIG. 4J architecture by one skilled in the art from the teachings herein. For example, the FIG. 4J configuration can be modified to have a most significant board select bit in accordance with the first FIG. 4H configuration; can be modified to have the external scanout bits input to the least significant bits and the internal scanout bits input to the middle significant bits in accordance with the third FIG. 4H configuration; can be modified to have the external scanout bits and the internal scanout bits intermixed in the least significant bits in accordance with the forth FIG. 4H configuration; can be modified to have the external scanout bits, the-internal scanout bits, and the re-addressing bits all intermixed in accordance with the fifth FIG. 4H configuration; can be modified to have the address lines associated with the external scanout bits intermixed therebetween and selectively complemented, to have the address lines associated with the internal scanout bits intermixed therebetween and selectively complemented, and to have the address lines associated with the re-addressing bits intermixed therebetween and selectively complemented in accordance with the sixth FIG. 4H configuration; and can be modified to have the two dimensional address lines associated with the internal scanout bits, external scanout bits, and re-addressing bits implement non-square arrays in accordance with the seventh FIG. 4H configuration.

The second FIG. 4J configuration is disclosed below, similar to the second FIG. 4H configuration supra. The first and the third to seventh FIG. 4J configurations are not explicitly disclosed because the disclosure of the first and the third to seventh FIG. 4J configurations are similar to the first and the third to seventh FIG. 4H configurations discussed above and hence the first and the third to seventh FIG. 4J configurations can readily be generated by one skilled in the art from the first and the third to seventh FIG. 4H configurations discussed above and the second FIG. 4J configuration discussed below.

FIG. 4J Configuration

In the second FIG. 4J configuration shown in the FIG. 4J ADDRESS CORRESPONDENCE TABLE, the least significant bits are assigned to internal scanout and the middle significant bits are assigned to external scanout for higher speed operations while the more significant bits are assigned to re-addressing. This configuration is discussed in more detail below.

In a single dimensional addressing configuration (the ONE column), such as used in a computer main memory, the addresses are divided into nine MSBs (the RAS address bits; A14 to A22) and nine LSBs (the CAS address bits; A0 to AS). The A character designates an address bit and the number designates the significance of the bit with zero being the least significant bit. Also, the addresses are further divided into five output enable steered external scanout bits (A9 to A13).

In a two dimensional addressing configuration (the TWO column), such as used in a display image memory, the addresses are divided into nine MSBs (the RAS address bits; AX7 to AX11 and AY7 to AY10) and nine LSBs (the CAS address bits; AX0 to AX4 and AY0 to AY3). The A character designates an address bit; the X or Y characters designate the X-dimension and the Y-dimension, respectively, as disclosed with reference to FIGS. 6E to 6N; and the number designates the significance of the bit with zero being the least significant bit. Also, the addresses are further divided into five output enable steered external scanout bits (AX5, AX6, AY4, AY5, and AY6).

Output enable signal steering selects the column of DRAM chips to be enabled with the output enable signal. This facilitates external scanout; as disclosed with reference to FIGS. 6E to 6N; by selecting different columns of RAM chips for different combinations of external scanout address bits. Output enable signal steering can be implemented with a decoder, such as a 74AS138 decoder, that decode address bits. In a two dimensional addressing configuration, such as used in a display image memory; the output enable signal is steered to one of 32 outputs with five address bits (AX5, AX6, AY4, AY5, and AY6). Alternately, in a single dimensional addressing configuration, such as used in a computer main memory; the CAS* signal is steered to one of 32 outputs with five address bits (A9 to A13; respectively). See the FIG. 4J ADDRESS CORRESPONDENCE TABLE. In a configuration using 74AS138 decoders, four decoders can be used to decode the five address bits into the 32 output enable signals. This can be implemented by decoding two of the five address bits (i.e., AX5 and AX6) to select one of the four decoders and decoding each of the other three of the five address bits with the A, B, and C input ports on each of the four decoders.

The relationship between the groupings of bits will now be discussed for the second single dimensional configuration. The internal scanout bits (A0 to A8) are adjacent therebetween so that activity in the least significant bits is within the internal scanout region. The external scanout bits (A9 and A13) are adjacent therebetween so that activity in the middle significant bits is within the external scanout region and the external scanout bits (A9 and A13) are adjacent to the internal scanout bits so that activity in the least significant bits and in the middle significant bits is within the scanout (internal and external) region. The RAS re-addressing bits (A14 to A22) are adjacent therebetween so that activity in the most significant bits is within the re-addressing region and the re-addressing bits (A14 to A22) are adjacent to the external scanout bits to facilitate the above internal scanout and external scanout with a minimum of slow down from re-addressing operations.

The relationship between the groupings of bits will now be discussed for the second two dimensional configuration. The internal scanout bits (AX0 to AX4 and AY0 to AY3) are adjacent therebetween so that activity in the least significant bits is within the internal scanout region. The external scanout bits (AX5, AX6, AY4, AY5, and AY6) are adjacent therebetween so that activity in the middle significant bits is within the external scanout region and the external scanout bits are adjacent to the internal scanout bits so that activity in the least significant bits and in the middle significant bits is within the scanout (internal and external) region. The RAS re-addressing bits (AX7 to AX11 and AY7 to AY10) are adjacent therebetween so that activity in the most significant bits is within the re-addressing region and the re-addressing bits are adjacent to the external scanout bits to facilitate the above internal scanout and external scanout with a minimum of slow down from re-addressing operations.

For the two dimensional configuration; the internal scanout bits are arranged in a nearly square array having a nearly equal number of least significant X-address bits and Y-address bits; the external scanout bits are arranged in a nearly square array having a nearly equal number of middle significant X-address bits and Y-address bits; the combination of internal scanout bits and external scanout bits (AX0 to AX6 and AY0 to AY6) are arranged in a square array having an equal number of less significant X-address bits and Y-address bits; and the re-addressing bits are arranged in a nearly square array having a nearly equal number of most significant X-address bits and Y-address bits. This facilitates a square array for scanout; the internal scanout bits and/or the external scanout bits; to maximize scanout operations and to minimize re-addressing operations for a configuration (i.e., a two dimensional display configuration) that is suitable for such square array enhancements. Alternately, non-square arrays may be provided from the teachings herein to enhance configurations that are suitable for such non-square array enhancements; i.e., a two dimensional configuration having a non-square number of internal scanout bits or a two dimensional configuration having a non-square number of external scanout bits. Alternately, other square and non-square arrays may be provided from the teachings herein to enhance memory performance or other memory characteristics.

FIG. 4K Architecture

Memory architecture is disclosed herein for various DRAM applications (FIGS. 4F to 4J) and in an embodiment of an image memory (FIGS. 6K to 6N). An alternate embodiment thereof will now be discussed with reference to FIG. 4K, which is consistent with the detailed memory schematic diagrams (i.e., FIGS. 6E to 6N).

The memory architecture shown in FIG. 4K uses fast page mode one megabit by-4 DRAM chips (such as the Toshiba TC514256P/J10 DRAMs), having an output enable chip select, having a CAS/RAS multiplexer, and not having CAS steering. Alternately, it can be implemented with other memory devices: such as with static column mode, nibble mode, or other mode devices; by-1, by-8, or other output configuration; and other alternatives. It is arranged in an array of m-columns of chips by n-rows of chips (m-by-n array of DRAM chips). The rows of chips (rows A to m) define the number of words in the memory and columns of chips (columns 0 to n) define the number of bits per word. The vertical dashed lines inbetween the first row (at the top) and the last row (at the bottom) indicate (n-2) additional rows that are not shown for a total of n-rows. The horizontal dashed lines inbetween the second column (the B column) and the right column (the m-column) indicate (m-3) additional columns that are not shown for a total of m-columns.

FIG. 4K is shown in a form consistent with FIGS. 4H, 4I, and 4J and the implementation and operation of the FIG. 4K configuration can be understood from the discussions provided FIGS. 4H, 4I, and 4J. In particular, the FIG. 4J configuration has been updated to provide the FIG. 4K configuration by providing steering for the CAS signals, by generalizing the number of data bits and the number of chips per column (n), by generalizing the number of columns of chips and the external scanout size (m), and by generalizing the number of RAS and CAS address bits.

Hardware Implementation

Introduction

Memory related hardware can be implemented in various ways; such with discrete components on a PC board, on a separate memory controller IC chip, together with memory on a memory IC chip, and/or together with a processor on a processor IC chip. For example, detector circuits are disclosed herein with reference to FIGS. 4D and 4M for being resident with a stored program computer on a computer chip. Also, a detector circuit is disclosed herein with reference to FIG. 4E for being implemented off the processor chip, such as with discrete logic or with a custom IC chip. Also, delay circuits are disclosed herein for being resident with a stored program computer on a computer chip. Also, detector circuits and delay circuits are disclosed herein with reference to FIGS. 6C and 6W for being implemented with discrete components on a wire wrap board. Also, detector circuits and delay circuits are disclosed herein with reference to FIGS. 6C and 6W that can be implemented on a separate memory controller custom IC chip or can be implemented together with a processor on the processor IC chip.

In view of the above, it is herein intended that the inventions disclosed herein be implementable in various ways; including distributing or partitioning portions of the circuitry or all of the circuitry onto various IC chips that can include a processor IC chip, a memory IC chip, and a memory controller chip and distributing or partitioning portions of the circuitry or all of the circuitry onto a custom IC controller chip. For example; a memory re-addressing and/or refresh detector circuit can be implemented on a processor IC chip together with the processor, can be implemented on a memory IC chip together with the memory, can be implemented on an IC chip having an address register together with the address register, can be implemented on a custom memory controller IC chip, can be implemented on a PC board with discrete components, or can be implemented in various other ways. Also; a memory refresh controller circuit can be implemented on a processor IC chip together with the processor, can be implemented on a memory IC chip together with the memory, can be implemented on an IC chip having an address register together with the address register, can be implemented on a custom memory controller IC chip, can be implemented on a PC board with discrete components, or can be implemented in various other ways. Also, a memory scanout and re-addressing controller circuit can be implemented on a processor IC chip together with the processor, can be implemented on a memory IC chip together with the memory, can be implemented on an IC chip having an address register together with the address register, can be implemented on a custom memory controller IC chip, can be implemented on a PC board with discrete components, or can be implemented in various other ways. Also, a memory delay circuit can be implemented on a processor IC chip together with the processor, can be implemented on a memory IC chip together with the memory, can be implemented on an IC chip having an address register together with the address register, can be implemented on a custom memory controller IC chip, can be implemented on a PC board with discrete components, or can be implemented in various other ways. Also; a memory detector, a memory refresh controller, and a memory scanout and re-addressing controller can be implemented together on a memory controller IC chip.

Custom IC Chip Implementation

Various memory control arrangements will now be discussed in the context of custom IC chip implementation. These arrangements are also directly applicable to other implementations; such as implementations having discrete IC chips on a PC board or wire wrap board. Also; various memory control arrangements are discussed herein without specific discussions of being IC chip implementations. These arrangements are also directly applicable to IC chip implementations; such as IC chip implementations of stored program computers, filter processors, and other computers and processors disclosed herein. Also; certain memory control arrangements are discussed herein with specific mention of being particularly suitable for IC chip implementation. These arrangements are placed in other sections herein for convenience of organization.

Particular advantages can be achieved by configuring IC chips having features indicated by the present invention. For example, various on the chip configurations and off the chip configurations are disclosed herein, showing advantages that can be achieved with on the chip configurations. For example, a detector on a processor chip configuration and a detector off a processor chip configuration are disclosed herein, showing advantages that can be achieved with the on the chip configuration for a processor IC chip. Also, a detector on a memory chip configuration and a detector off a memory chip configuration are disclosed herein, showing advantages that can be achieved with the on the chip configuration for a memory IC chip. Other related features that are particularly appropriate for implementing on-the-chip are disclosed below.

Particular advantages can be obtained by configuring the LSBs of the address, which are the address bits that are most often changed in sequence or in close proximity to each other, to be implemented in the scanout dimension (the row dimension in the Mitsubishi RAM configuration and the column dimension in the Toshiba DRAM configuration) and by configuring the MSBs of the address to be implemented in the re-addressing dimension (the column dimension in the Mitsubishi RAM configuration and the row dimension in the Toshiba DRAM configuration).

Particular advantages can be obtained by configuring computer instructions so that they maximize use of the same block of memory to minimize re-addressing operations and to maximize scanout operations.

Particular advantages can be obtained if the system of the present invention is utilized in particular forms. For example, performance can be enhanced by executing instructions that can be scanned out with a minimum of re-addressing, implying maximizing use of instructions within a block and minimizing memory operations in other blocks. For example, this can be implemented by increasing use of sequential instructions, by increasing use of instructions within a block, by reducing use of long transfer instructions to addresses outside of the current block, by reducing use of operands in-other blocks, and other such implementations.

Detector Circuits

Particular advantages can be obtained by providing detector circuits on memory chips. For example, one or more detector circuits associated with a memory chip can be readily integrated on the memory chip to operate in conjunction with the address signals contained thereon. Detector signals can be output from the chip and can be combined with detector signals from other chips to invoke time delays. Alternately, in configurations where time delay circuits are contained on-the-chip with the related detector circuits, time delay signals can be output from the chip and can be combined with time delay signals from other chips to execute time delays. Combining of multiple chip signals can be performed with well known combining circuits, such as the circuits used to combine data output signals. Such combining circuits can be implemented with gates (i.e.; AND, OR, tristate, etc. gates), wired-OR circuits, and other circuits.

Micro-Operation Circuits

Particular advantages can be obtained by generating micro-operation signals during instruction execution that are appropriate for controlling memory scanout and re-addressing operations, CAS and RAS modes, clock gating, etc. For example, a detector can be used to detect scanout and re-addressing conditions to control a clock gating circuit, or a wait state circuit, or a disable circuit, or other such circuit within the processor, on the processor IC chip, or otherwise closely coupled to the processor.

Particular advantages can be obtained by generating micro-operation signals during instruction execution that are appropriate for controlling refreshing. For example, a signal can be generated that identifies a portion of an instruction that leaves memory available for refreshing; where this signal can be used to control refreshing of the memory, such as on a time available basis. Also, a refresh address counter can be implemented to count the time available refresh operations to aid in determining that the proper number of refreshes have been performed in the required period of time (i.e., 512 refresh operations in 8-milliseconds). Further, an automatic refresh controller can be provided to determine when the time available refresh operations are not sufficient and to control generation of additional refresh operations, such as cycle stealing refresh operations (FIG. 4P).

A computer micro-operation, or micro-instruction, or state arrangement that is particularly suitable for use with a custom IC chip implementation will now be discussed with reference to FIG. 4M. A plurality of detector signals; such as micro-operation detector signals, micro-instruction detector signals, state detector signals, or other detector signals; which are related to memory operations; such as re-addressing and refresh memory operations; are generated on IC chip 434A for outputting from IC chip 434A through pinouts to be used as memory detector signals to invoke memory operations. Output signals can be processed with well known bi-directional bus circuits 435R; such as 74LS620, 74LS621, 74LS622, and 74LS623 octal bus transceivers; to time share the pins for input and output signals. Various pinout configurations will now be discussed with reference to FIG. 4M. These pinout configurations are intended to illustrate the general concepts of generating detector signals for a stored program computer, or for an IC chip, or for other applications and are not intended to be limited to the specific implementation shown in FIG. 4M.

In a first pinout configuration, detector signal lines 435K to OR gates 435C, 435E, and 435G (signal lines 435S to gate 435G, signal lines 435T to gate 435E, and signal lines 435U to gate 435C) can be output on pinouts from the IC chip without being processed with OR gates 435C, 435E, and 435G. This can involve a relatively large number of pinouts; such as 5, 10, 20, or more pinouts.

In a second pinout configuration, detector signal lines 435K discussed for the first pinout configuration above, can be grouped into related signal groups, such as to reduce the number of pinouts; each related signal group being input into a different OR gate; such as OR gates 435C, 435E, and 435G; and the output signals 435J (including output signals 434B, 434C, and 434D) from OR gates 435C, 435E, and 435G can be output on pinouts from the IC chip. The group of detector signals 435S into OR gate 435G may represent the conditions having the longest time available or other such characteristic, the group of detector signals 435T into Or gate 435E may represent the conditions having a shorter time available or other such characteristic, and the group of detector signals 435U into Or gate 435C may represent the conditions having the shortest time available or other such characteristic. Hence, a designer can use external logic to select the proper one of detector signals 435J to provide the time available needed to implement memory operations in response to detector signals 435J.

In a third pinout configuration, detector signal lines 435J (including signal lines 434B, 434C, and 434D) discussed for the first and second pinout configurations above, can be input to related AND gates 435D, 435F, and 435H respectively for selecting one of the plurality of detector signals 435J from OR gates 435C, 435E, and 435G for outputting from the IC chip. The detector signals 435M; including detector signals 435V, 435W, and 435X; output from AND gates 435D, 435F, and 435H respectively are shown being ORed together with OR gate 435I and the output signal 435P from OR gate 435I is shown being output from the IC chip on a single pinout. The enabling signals 435L; including enable signals 434E, 434F, and 434G; used to select one of the AND gates 435D, 435F, and 435H respectively are shown generated by configuration register 435A; which can be implemented with well known registers, such as a 74LS174 register; used for storing configuration signals for configuring the IC chip. Configuration register 435A may be used to establish a configuration of the device. For example, configuration register 435A can be loaded by the processor, such as a stored program computer under program control during startup or initialization operations. Configuration signals 435N from configuration register 435A are shown being decoded by decoder 435B; which can be implemented with well known decoders, such as a 74LS138 decoder; to generate selection signals 435L to select the proper configuration of output signals on pinout 435P.

In a forth pinout configuration, detector signal lines 435J discussed for the first and second pinout configurations above, can be input to the next OR gate having a shorter time available. For example, detector signal 434D output from the OR gate 435G having the longest time available detector signals can be input to the OR gate 435E having the next shortest time available detector signals. Similarly, the detector signal 434C output from the OR gate 435E having the next-longest time available detector signals can be input to the OR gate 435C having next shortest time available detector signals. Hence, each detector signal 435J generated by OR gates 435C, 435E, and 435G can be generated in response to the detector signals 435K having related time available conditions and can also be generated in response to the detector signals 435K having longer time available conditions.

In another configuration, feedback signal 435Q can be used to feedback information, such as memory operations completed or memory operations in process, to control operation of the IC chip device.

Experimental System Architecture

General Description

An experimental system is configured with a host computer, a display processor, and memory, and a color monitor. The host computer is implemented with an S100 bus configuration using S100 compatible boards, such as Compupro boards; together with disk drives, printers, and other peripherals. The CRT monitor is a conventional color monitor having an analog RGB input, shown with monitor documentation included herewith. The display processor and memory arrangement is configured with a plurality of wire wrap boards. These boards include a logic board, BL1; 2-memory boards, BM1 and BM2; a rear-end board, BR1; and a buffer board, BB1.

Operation of hardware and software in the experimental system discussed herein in conjunction with a color monitor demonstrates operation of the system, meeting of system objectives, and providing actual reduction to practice. For example, information has been loaded into image memory and has been display processed and displayed to demonstrate operation.

Supervisory Process of Interface

The interface between the supervisory processor and the display processor comprises input synchronization signals from the display processor to the supervisory processor to synchronize the supervisory processor with the display processor operations and output commands from the supervisory computer to initialize the display processor.

Synchronization signals include a frame synchronization signal and a line synchronization signal. The frame synchronization signal occurs during vertical retrace and vertical blanking of the video signal. The line synchronization signal occurs during horizontal retrace and horizontal blanking of the video signal. An interlaced scan arrangement is used for the experimental system, although other scan arrangements can readily be accommodated. A field identification signal is provided that identifies whether the field is a first field or a second field of the interlaced scan.

Communication between the supervisory processor and the display processor is performed with a 3-port parallel interface to a Compupro Interfacer-II board under program control. Each port has 8-parallel input lines and 8-parallel output lines. The port assignments are listed in the COMPUTER PORT TABLE included herein. Output signals are defined as DO signals and input signals are defined as DI signals. Port identification; A, B, or C; follows the DO or DI symbol. Signal line identification follows the port identification; i.e., DOA7 identifies output line-7 in port-A.

Signal DOA5 controls loading in sequential and random access form. Sequential loading is selected when DOA5 is high and random access loading is selected when DOA5 is low. When DOA5 is high, an output strobe on DOA7 causes the pixel address registers to be updated with the related slope parameters on the falling edge of the strobe. This insures compatibility with the DOA7 strobe used as a write-bar signal to write the previous pixel information into the previously addressed pixel in image memory.

Signal DOA6 controls loading and running operations. Running is selected when DOA6 is high and loading is selected when DOA6 is low. In general, DOA6 is high during displaying of images and DOA6 is low during loading of images into memory.

Signal DOA7 strobes the information output with Port-B and Port-C into the destinations. DOA7 is normally low, and DOA7 is pulsed high and then pulsed low under program control to form an output strobe.

Signal DIA0 inputs the frame sync pulse from the CRT monitor interface. This frame sync pulse is the blanking pulse that blanks the CRT monitor during the vertical retrace period and during a predetermined number of lines prior to and subsequent to the vertical retrace period. This frame sync pulse occurs once per field, twice per frame, in the interlaced scan system as implemented with the demonstration system. The rising edge of the frame sync pulse, detected under program control, initiates loading of the parameters for a new field from the supervisory processor into the display processor.

Signal DIA2 inputs the line sync signal from the CRT monitor interface, which is implemented for hardware control but not software control in the experimental system.

Signal DIA4 inputs the frame identification signal from the CRT monitor interface. DIA4 is high during the field-1 period and low during the field-2 period.

Signals DOB0 through DOB7 output the information to be loaded into the destination identified with Port-C. This information can be delta information to be loaded into the delta registers, pixel address information to be loaded into the pixel address registers, and pixel data to be loaded into image memory.

Signals DOB0 through DOC7 output the address of the destination to be loaded with the Port-B output signals. The various destinations are listed in the TABLE OF DESTINATION SELECT ASSIGNMENTS included herein; including the 4-delta registers each having an MSH and an LSH, 2-address registers each having an MSH and an LSH, data to be written into image memory, and weights to be written into a weight table memory.

Image Loading

Loading of an image into memory is performed by loading the XP and YP-address registers with the address of each pixel to be loaded, then outputting the pixel information to be loaded with Port-B, and then strobing the pixel information into image memory with the DOA7 signal. A sequential load feature is provided under control of the DOA5 signal. When the DOA5 signal is high, a vector can be loaded; where the previously loaded pixel address is incremented with the related delta parameter to obtain the next pixel address to reduce software overhead and thereby speedup loading of image memory.

Loading of image memory with the supervisory processor is performed with a 3-port output arrangement having 8-bits per port. The first port, Port-A, communicates control signals between the supervisory processor and the display processor. The second port, Port-B, communicates address and data information to be loaded into the display processor between the supervisory processor and the display processor. The third port, Port-C, selects the register or memory in the display processor for loading. The protocol involves outputting of the destination address on Port-C, outputting of information to be loaded into the display processor on Port-B, and then outputting of a data strobe on Port-A. The data strobe loads the output information into the selected destination.

A program to load vectors into memory is provided herein as the BASIC PROGRAM LISTING LD.ASC and is briefly discussed in the section entitled Software herein.

Software

Programs have been developed to operate the experimental system and are included herein in the tables BASIC PROGRAM LISTINGS. These programs are source programs, that are compiled with a Basic compiler and linked with a Basic linker to obtain compiled Basic programs. Compiled Basic programs run significantly faster that interpretive Basic programs, which maintains real time synchronization between the display processor and the supervisory processor. The source listings may be readily compiled and linked by one skilled in the art to provide the compiled Basic programs executed to perform the image loading and image processing operations. The programs are programmed to be menu driven, prompting the operator to select various operator-selectable options.

The Basic listings included herein have extensive annotation to teach one skilled in the art the features implemented therein.

The BASIC PROGRAM LISTING LD.ASC provided herein teaches loading of vectors into memory. The BASIC PROGRAM LISTING GRAPH.ASC provided herein teaches refreshing of a CRT monitor from memory. These listings are clearly coded and amply annotated to teach one skilled in the are how to operate the experimental system disclosed herein under program control.

Circuit Boards

The experimental system is implemented with wire wrap circuit boards consisting of 2-Memory Boards (BM1 and BM2), 1-Logic Board (BL1), 1-Buffer Board (BB1), and 1-Rear End Board (BR1). Each board is constructed with a Vector board, manufactured by Vector Electronic Company of Sylmar Calif., having 1/10th inch hole spacings on a 17-inch by 8½-inch board. Wire wrap DIP sockets and cable connectors are inserted into the Vector board and interconnected with wire wrap interconnections. Information-on the DIPs plugged-in to the DIP sockets is provided for selected boards in the printout of the TABLE OF DIP LAYOUT ON BOARDS included herewith. Information on the cable connectors is provided for each cable in the printout of the CABLE CONNECTION TABLE included herewith.

DIP assignments are provided for selected boards in the TABLE OF DIP LAYOUT ON BOARDS included herewith, for each board. DIPs are arranged on the boards as rows identified with alphabetical symbols; i.e., A to E; and as columns identified with numerical symbols; i.e., 1 to 23. Each DIP position on a board is identified with a U symbol followed by the column and row symbols (i.e., U3A).

Logical schematic diagrams showing implementation of the experimental system are provided herewith, such as shown in FIG. 6. These logical diagrams show standard commercially available integrated circuits; such as TTL series 7400 ICs, Mitsubishi M58725 RAMs, and 8216 bi-directional bus drivers, and Signetics 8T97 buffers. Specifications for these integrated circuits are available in catalogs and specification sheets from the abovementioned manufacturers and are well known in the art.

The schematic diagrams show the logical function in symbolic form, identify the type of IC, identify the DIP numbers and pin numbers, and show wiring interconnections between DIP and pin numbers. Device types are often shortened, such as shortening the name 74LS02 to LS02. DIP assignments are identified with U numbers, such as U20C representing the DIP at row-20 column-C on the subject circuit board. For example, a NOR-gate is shown at the top portion of FIG. 6B identified with the designation LSO2 as being a 74LSO2 quad NOR-gate integrated circuit, identified with the designation U21C as being located on the BL1 circuit board at row-C column-21, and having 2-input signals on pin-11 and pin-12 of the DIP and one output signal on pin-13 of the DIP. The input to pin-11 is shown connected to the output of DIP U22B pin-3, the input to pin-12 is shown connected to the output of DIP U20B pin-12, and the output from pin-13 is shown connected to DIP U7D pin-9. For convenience of documentation, interconnections may be designated by the DIP identification number and pin number separated by a dash; i.e., U21C-13 representing pin-13 of DIP U21C. For convenience of discussion, logical circuits may be designated by the DIP identification number and the output pin number separated by a dash; i.e., U21C-13 representing pin-13 of DIP U21C.

Cable List

A cable list is provided in the CABLE CONNECTION TABLE included herewith. This cable list identifies the cables between the various Vector boards and between the Vector boards and the supervisory processor. Each cable between display processor boards is implemented with a 50-pin ribbon cable having odd pins connected to ground for signal isolation. Each cable between the Vector boards and the supervisory processor is implemented with an RS-232 type 25-pin ribbon cable, consistent with the signal representations for the Compupro Interfacer-II board. The cable list identifies the pin associated with a signal, a symbol associated with the signal, a description of the signal, a representative source of the signal and a representative destination of the signal.

S-100 Bus System

The experimental system has been implemented with an S-100 bus based system performing supervisory processor functions in conjunction with the novel software and hardware, as discussed herein. Two S-100 bus based systems have been configured, the Camille system and the Murphy system. The configuration of the Camille system will be discussed in detail hereinafter. The Camille system comprises a computer, a pair of floppy disk drives, a terminal, and printers as discussed below.

The floppy disk drives are implemented with a pair of 8-inch disk drives in an enclosure and operating in conjunction with a DMA controller in the computer. The disk drives are manufactured by Siemens as the FDD 100-8; the drive enclosure is manufactured by International Instrumentation, Incorporated; and the DMA Controller is manufactured by CompuPro as the Disk 1 DMA Controller; all described in detail in the referenced manuals.

The terminal is manufactured by Applied Digital Data Systems, Inc. (ADDS) as the Model Viewpoint/3A Plus; described in detail in the referenced manual.

The printers include a dot matrix printer manufactured by Star Micronics, Inc. as the Gemini-10, a dot matrix printer manufactured by Epson as the FX-100, and a daisywheel printer manufactured by Smith-Corona as the TP-I; all described in detail in the referenced manuals.

The computer is implemented with a cabinet manufactured by Fulcrum Computer Products as the I8080 Microcomputer System Cabinet and having a backplane S-100 board manufactured by CPA which is described in detail in the referenced CPA manual.

The computer is implemented with various S-100 boards manufactured by CompuPro including the 8085-8088 CPU board, RAM 16 and RAM 17 memory boards, a System Support board, and a pair of Interfacer 2 boards. One Interfacer 2 board is used to interface to the terminal and printers. The other Interfacer 2 board provides the 3-channel parallel interface to the control logic. These boards are described in detail in the referenced manuals.

The joysticks are implemented with the Computer Compatible Joystick; described in the referenced applications notes.

The operating system is CP/M 80, which is described in detail in the referenced documents.

The applications program runs under Basic, which is described in detail in the referenced documents.

The following documents provide supplemental data on the computer system and are herein incorporated by reference.

1. Technical Manual, Siemens, OEM Floppy Disk Drive FDD 100-8, Technical Manual, Model 100-80.

2. Manual, International Instrumentation, Incorporated, Universal Disk Enclosures, General Information/Pricing, 1982.

3. User Manual, CompuPro Division of Godbout Electronics, Disk 1 Arbitrated 24 Bit DMA Floppy Disk Controller, 1981.

4. User's Manual, Applied Digital Data Systems, Inc., Viewpoint/3A Plus, 518-31100.

5. Operation Manual, Star Micronics, Inc., Gemini-10.

6. Operation Manual, Epson, FX Printer, 1983.

7. Operator's Manual, Smith-Corona, TP-I.

8. Functional Description, CP-A, Revision 1.

9. Technical Manual, CompuPro Division of Godbout Electronics, 8085/8088 CPU Dual CPU, 2/83.

10. Technical Manual, CompuPro Division of Godbout Electronics, RAM 16 Static Memory, 4/82.

11. Technical Manual, CompuPro Division of Godbout Electronics, RAM 17 64K Static Memory, 9/82.

12. User's Manual, CompuPro Division of Godbout Electronics, System Support 1, 8/81.

13. Technical Manual, CompuPro Division of Godbout Electronics, Interfacer 2, 4/82.

14. The CP/M Handbook with MP/M, by Rodnay Zaks, published by Sybex, 1980.

15. CP/M Primer, by Stephen Murtha and Mitchell Waite, published by Howard W. Sams & Co., Inc., 1980.

16. An Introduction to CP/M Features and Facilities, published by Digital Research, January 1978.

17. Microsoft Basic Reference Book, published by Microsoft, 1979.

18. Microsoft Basic Compiler Documentation, published by Microsoft.

19. The Basic Handbook (2nd Edition), by David Lien, published by Compusoft Publishing, 1981.

20. Microsoft Basic (2nd Edition), by Ken Knecht, published by Dilithium Press, 1983.

21. Basic Basic (2nd Edition), by James Coan, published by Hayden Book Company, Inc., 1978.

22. Computer Compatible Joystick Instruction, applicable to: Apple-II.

Logic Board

Control Logic

Various control arrangements can be provided for controlling operation. For example; counter, ROM, and logical control arrangements of synchronous or asynchronous design can be used. A gated clock arrangement has been implemented for control, which is illustrative of other forms of gated clock control logic and other non-gated clock control logic implementations. This gated clock control arrangement will now be discussed with references to FIGS. 6B to 6D.

The gated clock control logic shown in FIGS. 6B to 6D controls the clock pulses to various logic devices; such as address generators, memories, and other devices; to clock the various operations associated therewith. For example, the write strobe W-bar to the memories is generated with U22C-11 and clocks to various registers are gated with circuits U21C, U20C, U19C, U19D, U18C, U9A, and U10A (FIG. 6B). Several different types of clocks are generated at different times and are controlled to be non-conflicting with other clocks. Load clocks are generated under computer control to load computer generated parameters into various registers. Address generator clocks can be generated under control of external sync pulses. High speed clocks can be generated under control of various signals to generate addresses that are not in contention with other signals generating clocks and are not generated at times that such addresses are not needed.

The logic composed of U18D-6, U22B-3, U21E-6, U19B, U20B, and U21D-6 (FIG. 6B) is controlled by the computer for generating strobe signals and control signals for loading computer information into the address generators and for disabling operations during loading of computer information. Logic gates U20C and U21C (FIG. 6B) gate the computer strobe to load delta registers. Logic gates U19C, U19D, and U18C (FIG. 6B) gate various clock signals to load and update R-registers. Logic gates U9A and U10A (FIG. 6B) gate various clock signals to load and update P-registers. Flip-flops U22E and associated logic U20D-4, U22A-4, U18D-8, U21E-4, U15A-3, U22C-3, U20D-13, U18D-2, U21E-10, U18E-6, U20D-1, U21E-12, U19D-4, U18E-3, U21D-8, U20E-6, U17A-8, U17A-11, U22A-2, U13A-8, U21E-2, U20E-3, and other related elements (FIG. 6D) synchronize and process the sync signals CFS and CLS to generate clock and control signals for processor operation. Logic gates and flip-flops U12A, U21D-8, U18E-3, U14A-2, U14A-4, U16A-3, U17A-3, U16A-6, U17A-6, U13A-6, U23C-10, U14A-6, U20E-11, U21B-5, U15A-11, U21B-2, U21E-8, and related gates (FIG. 6C) control the gated clock pulses for address generation operations.

The computer interface signals are defined in the tables of computer interface signals; PORT-A, PORT-B, AND PORT-C. Port-A input and output signals are control signals. Port-B output signals are address and data signals to load into the selected destination. Port-C output signals are destination select signals.

Computer load logic will now be discussed with reference to FIG. 6B. Computer control signals DOA6 and DOA7 control loading of initial conditions. When DOA6 is 1-set, run operation is commanded and loading of initial conditions from the computer with the load strobe DOA7 is disabled with gate U22B-3. When DOA6 is 0-set, run operation is disabled and load operation is enabled through inverter U18D-6 by enabling gate U22B-3 to pass an inverted computer strobe DOA7 as signal U22B-3. This gated strobe is used to clock the selected register, steered with the register address decoders U19B and U20B to gates U21C, U20C, U19C, and U19D. The inverted DOA6 signal U18D-6 is inverted with U21E-6 to generate the DIEN-bar signal for memory read and write operations. When DOA6 is high, defining the run mode; DIEN-bar is high establishing the memory read mode. When DOA6 is low, defining the load mode; DIEN-bar is low establishing the memory write mode. DIEN-bar control operations are discussed in detail with reference to FIGS. 6E to 6N for the memory logic.

Write signals U22C-6 and U22C-8 control writing into a peripheral RAM by enabling write pulses W2 and W3 when addressed through U19B-10 and U19B-9 respectively.

Gate U22C-11 is an OR-gate that is enabled with the address of the memory U19B-11 to load data into the memory for steering of the computer strobe U22B-3 to generate a write strobe to load the computer generated parameter into memory.

Gates U20C and U21C are NOR-gates that are enabled with the destination register address signals from U19B and U20B to select the delta register to be loaded by steering of the computer strobe U22B-3 to clock the appropriate delta register to load the computer generated parameter into the selected register.

A master clock, shown as CPE-bar (FIG. 6D), is fanned-out, gated, and applied to the synchronous elements. The CPE-bar clock is derived from a clock pulse generator and communicated to the logic board on cable C4-6. Alternately, clock CPE-bar can be generated with a self-contained clock generating operating asynchronously with reference to the external clock to permit optimization of clock periods for system operation. For example, the external clock may be constrained to a clock frequency consistent with the requirements of a sync generator for the CRT monitor, which may not be an optimum clock frequency for the address generators. Therefore, a separate clock can be provided having a clock frequency that is optimum for the address generators in place of the external clock.

Clock logic will now be discussed with reference to FIG. 6D. The clock CPE-bar is logically processed to clock synchronous elements in the address generators at the same time. For convenience of definition, clocking occurs at the rising edge of the delayed clock pulse CPD, which is delayed by 2-gate propagation delays after the early clock CPE-bar and one inversion of the early clock CPE-bar. For example, CPE-bar propagates through inverter U21E-2 and non-inverting AND-gate U20E-3 to provide one inversion and 2-delays to generate delayed clock CPD prior to being used to synchronously clock register U22E. Similarly, clock CPE-bar is delayed by gating logic U12A-8 and U12A-6 (FIG. 6C), providing one stage of delay and one stage of inversion, and by non-inverting gates U9A-6, U9A-8, U10A-6, and U10A-8 (FIG. 6B) to provide the 2-propagation delays and the single inversion from the early clock CPE-bar to the clock signals for registers U8D, U9D, U5D, U8E, U5E, and U9E.

In one display configuration, register U22E is used to synchronize operation of the logic with a frame sync signal CFS and a line sync signal CLS. A short synchronous pulse is generated in conjunction with the line sync signal CLS. CFS is synchronously clocked into flip-flop U22E-10 and CLS is synchronously clocked into flip-flop U22E-12 to latch these signals as CFSR1 and CLSR1 respectively synchronous with the address generator clock. Latched line sync signal CLSR1 is then latched in flip-flop U22E-15 one clock period later for a delayed line sync signal CLSR2. The delayed line sync signal CLSR2 U22E-15 is inverted with inverter U21E-10 and NANDed with the non-delayed line sync signal CLSR1 with NAND-gate U18E-6 to generate a short inverted pulse bracketing the first clock period of line sync signal CFSR1.

Clock signal CPE-bar (FIG. 6D) is gated with NAND-gates U12A-8 and U12A-6 (FIG. 6C) to generate a gated clock signal for address generation; which is performed with registers U8D, U9D, U5D, U8E, U9E, and U5E. Gating of the clocks to these registers with AND-gates U9A-6, U9A-8, U10A-6, and U10A-8 gates address generator operations.

Control logic for a display configuration will now be discussed with reference to FIG. 6D. Signal U13A-8 is a clock gate control signal for gating the address generator clock, as described herein with reference to FIG. 6C. This gate signal is comprised of three components; U17A-8, U17A-11, and U22A-4. These components cause the clock to be generated at the appropriate time in conjunction with the display sync signals. Gate U20D-4 ORs together the field sync and frame sync signals to enable the address generator clock through U22A-4 and U13A-8 when neither a frame sync signal CFSR1 nor a line sync signal CLSR1 is present. Gate U20E-6 ANDs together the inverted frame sync signal CFSR1 through inverter U18D-8 and the line sync signal. Gate U17A-8 NANDs together U20E-6 and the delayed line sync signal CLSR4 to enable the address generator clock through U13A-8. Gate U17A-11 NANDs together U20E-6 and the undelayed inverted line sync signal CLSR1 through inverter U22A-2 to enable the address generator clock through U13A-8.

The ELS signal U15A-3 controls multiplexers U10D, U11D, U12D, U10E, U11E, and U12E (FIG. 6D). During the appropriate portions of the load mode, the address generator P-registers are loaded from the address generator R-registers under control of the ELS signal. During other periods of time, the address generator p-registers are updated from the related delta registers under control of the ELS signal. The ELS signal is disabled by the sequential load control signal DOA5 inverted with U21E-4. This permits the P-registers to be updated from the delta registers to generate vectors into memory, such as for a display configuration. The ELS signal is strobed with a short pulse U19D-4 during the load mode DOA6 as controlled with U22C-3. During the load mode, the ELS signal is enabled with DOA6 enabling U22C-3 to pass the short pulse U22C-2. The short pulse is generated by the early line sync signal CLSR1 U22E-12 and the thrice delayed line sync signal CLSR4 U22E-7 for a 3-clock period transfer pulse to transfer information from the R-registers to the P-registers. The 3-period pulse U19D-4 is generated when CLSR4 U22E-7 is low and when CLSR1 U22E-10 is high, as inverted with U21E-12 to define the period that the undelayed line sync signal CLSR1 has gone high and before the delayed line sync signal CLSR4 has gone high; indicative of the first 3-clock periods at the start of a line sync pulse.

The XA3 and XA3-bar signals are shown gated with U19A-1 to disable both the XA3-bar signal and hence memory board-1 and the XA3 signal and hence memory board-2 with gates U19C-13 and U19C-4 respectively. This provides for blanking of the display and clearing of the buffer memory by outputting zeros from the disabled memory board when either the frame sync signal CFSR1 or the sequential load signal DOA5 are true. U19C-1 disables the memory boards during sequential loading with DOA5 U19A-3 and during the vertical blanking period with the inverted CFSR1 signal from inverter U18D-8.

Registers U22E and U23C are used to latch signals. U23C-2 and U23C-5 latch signals C2-30 and C2-32 to provide latched signals C4-32 and C4-36 respectively. U23C-10 is used in the clock gating logic, as discussed with reference to FIG. 6C. U22E-10 and U22E-12 latch signals CFS and CLS respectively. U22E-15, U22E-2, and U22E-7 provide 1-clock delay, 2-clock delays, and 3-clock delays respectively for the CLSR1 signal.

Gated clock operations will now be discussed with reference to FIG. 6C. Gated clock signals U12A-8 and U12A-6 each gate early clock CPE-bar with DOA6 from U21E-6 so that address generation will only be performed when the run/load-bar signal DOA6 is high, indicative of run operations. Gated clock signals U12A-8 and U12A-6 also gate early clock CPE-bar with U13A-8, which is composed of 3-gating conditions; U17A-8, U17A-11, and U22A-4; discussed in greater detail with reference to FIG. 6D. Gated clock signal U12A-8 also gates early clock CPE with U14A-6, which enables high clock rate memory scanout operations within a block. Gated clock signal U12A-6 also gates early clock CPE-bar with U21B-2, which enables low clock rate memory block re-addressing operations. Consequently, when memory operations are proceeding within a block of 64-pixels, the address generator clock is generated as shorter period clock signal U12A-8 and, when memory operations are making a transition between blocks and need additional clock time for re-addressing, the address generator clock is generated as longer period clock signal U12A-6.

Determination of whether memory scanout or re-addressing is being performed for the particular clock period is determined by detecting an overflow of an address generator, as indicative of re-addressing, or detecting of a non-overflow of all address generators, as indicative of scanout. Overflow for this condition is defined as an overflow for a positive delta condition and an underflow for a negative delta condition. Therefore, detection of a carry condition for a positive delta or detection of a non-carry condition for a negative delta represents an overflow condition for gating a clock. An overflow condition on either the X-address generator or the Y-address generator causes a re-addressing condition.

As shown in FIG. 6C, a re-addressing condition is detected with NAND-gate U13A-6 from any one or combination of the 4-conditions U16A-3, U17A-3, U16A-6, and U17A-6. U16A-3 compares the inverted overflow bit C1-bar U15E-9 of the Y-address generator with the non-inverted sign bit SN1 U14E-6 of the Y-delta register to detect a Y-negative overflow condition. U17A-3 compares the overflow bit C1 U15E-9 of the Y-address generator with the inverted sign bit SN1 U14E-6 of the Y-delta register to detect a Y-positive overflow condition. U16A-6 compares the inverted overflow bit C2-bar U15D-9 of the X-address generator with the non-inverted sign bit SN2 U14D-6 of the X-delta register to detect an X-negative overflow condition. U17A-6 compares the overflow bit C2 U15D-9 of the X-address generator with the inverted sign bit SN2 U14D-6 of the X-delta register to detect a X-positive overflow condition. An overflow signal U13A-6 is latched and delayed with flip-flop D23C-10 for enabling of the scanout clock U12A-8 for scanout, in the absence of an overflow condition. Flip-flop U23C-10 provides a one-clock period delay so that an extended re-addressing clock period occurs in the clock period following the overflow condition, which is the clock period during which the re-addressing is performed. Latched overflow signal U23C-10 is inverted with inverter U14A to form a non-overflow signal U14A-6 and used to enable the scanout clock U12A-8.

Latched overflow signal U23C-10 is also processed with flip-flops U21B-5 and U21B-2 to provide a triple clock period for an overflow. These flip-flops are clocked with the non-gated delayed clock pulse CPD U20E-3 to control non-gated clock period time delays. If clocked with the gated clock pulse, such as with U15A-8; then the gating clock logic could cause the clock signal to lock-up.

A triple clock period for re-addressing will now be discussed with reference to FIG. 6C. Detection of an overflow condition U23C-10 with gate U20E-11 sets flip-flop U21B-5 on the first clock period and sets flip-flop U21B-2 on the second clock period, which adds 2-clock periods to the basic single clock period; yielding a triple clock period to facilitate re-addressing. At the completion of the third clock period, the 1-set signal U21B-2 enables a single clock signal U12A-6 and is inverted to a 0-set signal U21E-8 to reset U21B-5 through U20E-11 and to reset U21B-2 through U15A-11 on the next clock to clock flip-flops U21B-5 and U21B-2, respectively. This triple clock period logic is designed to operate for a single overflow condition surrounded by non-overflow conditions, or for two overflow conditions immediately following each other, and for many overflow conditions immediately following each other. For a single overflow condition; scanout clock U12A-8 has a series of single period clocks and has 3-clock periods missing that are coincident with overflow conditions and re-addressing clock U12A-6 has a single clock coincident with the overflow condition. For multiple sequential overflow conditions; scanout clock U12A-8 has a series of single period clocks with a series of triple clock periods missing that are coincident with the multiple sequential overflow conditions and re-addressing clock U12A-6 has multiple sequential clocks each separated by 2-clock periods.

The scanout clock U12A-8 and the re-addressing clock U12A-6 are generated separately for gating purposes. They are ORed together with gate U21D-8 for loading the buffer memory with signal C3-22 and for clocking register U23C-9. This causes the pipeline from the memory output through the buffer memory to be clocked by an out-of-phase signal, yielding a 1.5 clock period propagation delay time for the memory. The design is carefully configured so that the pipeline propagation delay is greater than the 0.5 clock periods and less than the 1.5 clock periods to facilitate proper clocking of the memory output signal into the buffer memory with a propagation delay that can approach the 1.5 clock period.

The clock signals to the address generation registers are implemented as the logical-OR of a plurality of different clock signals. In order to equalize clock delays so that each clock is twice delayed, including the once inverted CPE-bar signal with U12A-8 and U12A-6, the two address generator clocks U12A-8 and U12A-6 are separately ORed together with each of the address generator clock gates U9A-6, U9A-8, U10A-6, and U10A-8 (FIG. 6B) rather than using the pre-ORed clock signal U21D-8 in order to reduce clock skew.

Clock gating logic will now be discussed in greater detail with reference to FIG. 6B. Address decoders U20B and U19B decode the destination address DOC0 to DOC7 to generate a decoded address signal at the outputs of U19B and U20B to select the gated clock channel. This steers the computer load strobe U22B-3 to the addressed register to load that register. The address assignments are set forth in the table entitled DESTINATION SELECT ASSIGNMENTS. The most significant 16-address block is decoded using block decode logic U21D-6 to enable decoders U19B and U20B when the 4-MSBs DOC4, DOC5, DOC6, and DOC7 are all 1-set. The block enable signal U21D-6 enables U19B and U20B with the E1-bar inputs. The most significant address signal DOC3 enables U20B when low, indicated by the E2-bar input, and enables U19B when high, indicated by the E3 input. Consequently, U20B generates the LSH addresses and U19B generates the MSH addresses. One of the 8-addresses for the selected half is selected with the 3-least significant address bits DOC0, DOC1, and DOC2 which go to each address decoder U19B and U20B. The address decoder that has been selected with the DOC3 to DOC7 address signals has one of 8-address output lines low, as determined by the DOC0 to DOC2 least significant address bits. The low output line enables the register clock gating logic to steer the clock to the addressed register. The clock is the negative going strobe U22B-3 generated under computer control. Effectively, the decoded address signals steer the computer strobe to the appropriate register clock input to clock the computer output data word into that register.

Control logic for a display configuration will now be discussed with reference to FIG. 6D. Signal U20D-1 is a single pulse clock signal occurring at the leading edge of the line sync signal except when a frame sync pulse or a computer load signal is generated. This clock pulse is generated by U18E-6, as previously described. Disabling of this clock pulse during the frame sync pulse and the computer load period is performed by Oring together the computer load signal DOA6-bar U20D-12 and the synchronized frame sync signal CFSR1 U20D-11. When either the computer load signal DOA6-bar or the computer frame sync signal CFSR1 are high, NOR gate U20D-13 and inverter U18D-2 apply a high signal to U20D-2, which causes U20D-1 to be low independent of the line sync clock pulse. Only when the computer load signal is in the run state (DOA6-bar is low) and the frame sync signal CSFR1 is low can the line sync clock U20D-1 go high to generate a clock pulse.

The line sync clock U20D-1 is generated from the line sync signal CLS. The CLS signal is latched in flip-flop U22E-12 to generate a resynchronized line sync signal CLSR1. The resynchronized line sync signal CLSR1 is delayed one clock period by latching in flip-flop U22E-15 to generate a delayed resynchronized line sync signal CLSR2. NAND-gate U18E-6 generates a one clock period negative pulse when the resynchronized line sync signal CLSR1 U22E-12 is high and when the delayed resynchronized line sync signal CLSR2 U22E-15 is still low, indicative of the first clock period of the resynchronized line sync signal. Inverter U21E-10 inverts the delayed line sync signal CLSR2 U22E-15 for NANDing with the non-delayed line sync signal CFSR1 U22E-12 for generation of the one clock period signal U18E-6. Therefore, U20D-1 is a one clock period positive pulse that occurs at the leading edge of each line sync pulse that is disabled by the computer being in the load mode or that is disabled by the frame sync signal. This clock U20D-1 is used to clock the R-registers for updating with the delta parameter at the positive edge and to transfer the updated number in the R-registers to the R-registers at the negative edge.

The computer strobe DOA7 is generated under software control. It is a short positive pulse, typically about 3-microseconds in width. It is NANDed with the computer run signal DOA6 using inverter U18D-6 and NAND-gate U22B-3 to generate a short negative pulse when enabled by the DOA6 run/load-bar signal being low, as indicative of a load command. The negative pulse U22B-3 is used to clock the register that is addressed with the computer destination address signal with decoders U19B and U20B to load data from the computer into that selected register.

Address generator clock gating logic will now be discussed with reference to FIG. 6B. This logic is composed of gates U19C, U19D, U18C, U8A, U9A, and U10A. This logic comprises 4-channels of clock logic for the address generation registers, where the clock gating logic for each channel is similar to the clock gating logic for the other 3-channels.

R-register gating logic will now be discussed with reference to FIG. 6B.

Gate U19C-1 steers the load strobe U22B-3 to clock the register with the computer generated strobe to load the computer generated parameter into the related register. Steering signal U19C-3 steers the computer pulse U19C-2 to the input of gate U18C-1. Gate U18C-3 combines the two mutually exclusive clock signals, the computer strobe and the line sync strobe to clock the XR-register CXRM with signal U18C-3 for the computer strobe and on the rising edge of the line sync pulse.

Gate U19C-10 steers the load strobe U22B-3 to clock the register with the computer generated strobe to load the computer generated parameter into the related register. Steering signal U19C-9 steers the computer pulse U19C-8 to the input of gate U18C-9. Gate U18C-8 combines the two mutually exclusive clock signals, the computer strobe and the line sync strobe to clock the XR-register CXRL with signal U18C-8 for the computer strobe and on the rising edge of the line sync pulse.

Gate U19D-1 steers the load strobe U22B-3 to clock the register with the computer generated strobe to load the computer generated parameter into the related register. Steering signal U19D-3 steers the computer pulse U19D-2 to the input of gate U18C-4 Gate U18C-6 combines the two mutually exclusive clock signals, the computer strobe and the line sync strobe to clock the YR-register CYRM with signal U18C-6 for the computer strobe and on the rising edge of the line sync pulse.

Gate U19D-13 steers the load strobe U22B-3 to clock the register with the computer generated strobe to load the computer generated parameter into the related register. Steering signal U19D-12 steers the computer pulse U19D-11 to the input of gate U18C-12. Gate U18C-11 combines the two mutually exclusive clock signals, the computer strobe and the line sync strobe to clock the YR-register CYRL with signal U18C-11 for the computer strobe and on the rising edge of the line sync pulse.

P-register clock logic will now be discussed with reference to FIG. 6B.

The XP-register clock signal U9A-6 to XP-register CXPM is generated from the inverted XR-register clock signal CXRM U8A-2, the gated write signal U18E-11, the re-addressing clock U12A-8, and the scanout clock U12A-6. The inverted R-register clock signal U8A-2 causes the XP-register CXRM to be clocked with the computer strobe and with the trailing edge of the line sync signal, the inverted clock signal from U18C-3. The gated write signal U18E-11 clocks the XP-registers for each write strobe U22C-11 that loads a parameter into memory in order to advance the address generators to the next address. The gated re-addressing clock signal U12A-6 and the gated scanout signal U12A-8 have been discussed above with reference to FIG. 6C.

The XP-register clock signal U9A-8 to XP-register CXPL is generated from the inverted XR-register clock signal CXRL U8A-4, the gated write signal U18E-11, the re-addressing clock U12A-8, and the scanout clock U12A-6. The inverted R-register clock signal U8A-4 causes the XP-register CXRL to be clocked with the computer strobe and with the trailing edge of the line sync signal, the inverted clock signal from U18C-8. The gated write signal U18E-11 clocks the XP-registers for each write strobe U22C-11 that loads a parameter into memory in order to advance the address generators to the next address. The gated re-addressing clock signal U12A-6 and the gated scanout signal U12A-8 have been discussed above with reference to FIG. 6C.

The YP-register clock signal U10A-6 to YP-register CYPM is generated from the inverted YR-register clock signal CYRM U8A-6, the gated write signal U18E-11, the re-addressing clock U12A-8, and the scanout clock U12A-6. The inverted YR-register clock signal U8A-6 causes the YP-register CYRM to be clocked with the computer strobe and with the trailing edge of the line sync signal, the inverted clock signal from U18C-6. The gated write signal U18E-11 clocks the YP-registers for each write strobe U22C-11 that loads a parameter into memory in order to advance the address generators to the next address. The gated re-addressing clock signal U12A-6 and the gated scanout signal U12A-8 have been discussed above with reference to FIG. 6C.

The YP-register clock signal U10A-8 to YP-register CYPL is generated from the inverted YR-register clock signal CYRL U8A-8, the gated write signal U18E-11, the re-addressing clock U12A-8, and the scanout clock U12A-6. The inverted YR-register clock signal U8A-8 causes the YP-register CYRL to be clocked with the computer strobe and with the trailing edge of the line sync signal, the inverted clock signal from U18C-11. The gated write signal U18E-11 clocks the YP-registers for each write strobe U22C-11 that loads a parameter into memory in order to advance the address generators to the next address. The gated re-addressing clock signal U12A-6 and the gated scanout signal U12A-8 have been discussed above with reference to FIG. 6C.

Gates U22C-11, U18D-12, and U18E-11 provide a write strobe to clock the address registers to advance the address in the address registers in accordance with the delta parameters loaded in the delta registers. This write clock clocking of the address registers is used for writing a sequence of words into memory without the need to reload the address registers, where the address registers are incremented with the write strobe to advance the address from the initially loaded address in accordance with the delta parameters. This write strobe is gated with the DOA5 signal with gate U18E-11 to enable advancing the address generators during the load mode and to disable advancing the address generators during the run mode.

Address Generators

Two address generator configurations are shown in FIGS. 6O to 6R. The address generators shown in FIGS. 6O to 6R provide for overflow detection to gate a clock in accordance with the arrangement shown in FIG. 6C. The address generators shown in FIGS. 6O to 6R do not provide for such overflow detection. In this configuration, overflow detection is enhanced by arranging the adder logic so that the overflow from an adder chip coincides with the desired position of overflow detection. In order to provide this feature, an extra adder chip is used in the address generators of FIGS. 6O and 6P. The address generators shown in FIGS. 6Q and 6R do not have such overflow detection and consequently can be implemented with one less adder chip.

The XP-address generator will now be discussed with reference to FIG. 6O. Register U8D, U9D, and U5D store the address parameter. Register U17D and U7D store the delta parameter for updating the address parameter. Adders U13D to U16D and U6D add the delta parameter to the address parameter to obtain an updated address parameter. Multiplexers U10D to U12D provide for loading initial conditions into the address register during the load mode and provide for updating the address parameter in the address register in response to the delta parameter in the delta register in the run mode.

The delta parameter initial condition is loaded into the delta register from the computer output port. The 6-LSBs from the computer output byte are applied to the D-inputs of delta register U17D and U7D. The CXPS clock provides a clock pulse at the appropriate time, as described with reference to FIG. 6B, to clock the initial conditions into the delta registers.

The address parameter initial condition is loaded into the address register from the computer output port. The 6-LSBs from the computer output byte are applied to the D-inputs of address register U8D, U9D, and U5D. The CXPM and CXPL clocks provide clock pulses at the appropriate times, as described with reference to FIG. 6B, to clock the initial conditions into the address register.

In the run mode, the address register is clocked with the CXPM and CXPL clocks to update the address parameter in response to the delta parameter. The output of the address register; the Q-outputs of the U8D, U9D, and U5D register; are applied to the A-inputs of adder circuits U13D to U16D and U6D. The output of the delta register; the Q-outputs of the U17D and U7D register; are applied to the B-inputs of adder circuits U13D to U16D and U6D. The output of the adder circuits on the summation lines is the binary sum of the A-inputs from the address register and the B-inputs from the delta register, providing an updated address parameter that is input to the address register through the multiplexers to the D-inputs of the address register. Consequently, each time the address register is clocked, the updated address is loaded into the address register and the updated address that is loaded into the address register is output on the Q-lines from the address register to again be added to the delta parameter with the adders to provide the next updated address to the address register.

The multiplexers U10D, U11D, and U12D multiplex the updated address parameter from the adders into the address register to load the initial conditions into the address register at the beginning of the load mode and to load the updated address parameter from the adders thereafter. The ELS signal from U15A-3, as described with reference to FIG. 6D, controls the multiplexer to load initial conditions at the start of a line sync pulse and to enable updating of the address parameter with the delta parameter thereafter.

The adders are connected with the carry output from the preceding stage connected to the carry input of the next subsequent stage for a rapid carry propagating through the adder. The adders are arranged so that the overflow from U15D-9 coincides with the point that divides the scanout bits and the re-addressing bits, where the scanout bits are the three less significant bits and the re-addressing bits are the six more significant bits. The next most significant bit XA3 for the XP address generator is used as the board control bit instead of a re-addressing bit for the XP-address generator. The overflow signal U15D-9 is input to U16A-5 and U17A-5 (FIG. 6C) for controlling gating of the clock.

The YP-address generator will now be discussed with reference to FIG. 6P. Register USE, U9E, and U5E store the address parameter. Register U17E and U7E store the delta parameter for updating the address parameter. Adders U13E to U16E and U6E add the delta parameter to the address parameter to obtain an updated address parameter. Multiplexers U10E to U12E provide for loading initial conditions into the address register during the load mode and provide for updating the address parameter in the address register in response to the delta parameter in the delta register in the run mode.

The delta parameter initial condition is loaded into the delta register from the computer output port. The 6-LSBs from the computer output byte are applied to the D-inputs of delta register U17E and U7E. The CYPS clock provides a clock pulse at the appropriate time, as described with reference to FIG. 6B, to clock the initial conditions into the delta registers.

The address parameter initial condition is loaded into the address register from the computer output port. The 6-LSBs from the computer output byte are applied to the D-inputs of address register U8E, U9E, and U5E. The CYPM and CYPL clocks provide clock pulses at the appropriate times, as described with reference to FIG. 6B, to clock the initial conditions into the address register.

In the run mode, the address register is clocked with the CYPM and CYPL clocks to update the address parameter in response to the delta parameter. The output of the address register; the Q-outputs of the U8E, U9E, and U5E register; are applied to the A-inputs of adder circuits U13E to U16E and U6E. The output of the delta register; the Q-outputs of the U17E and U7E register; are applied to the B-inputs of adder circuits U13E to U16E and U6E. The output of the adder circuits on the summation lines is the binary sum of the A-inputs from the address register and the B-inputs from the delta register, providing an updated address parameter that is input to the address register through the multiplexers to the D-inputs of the address register. Consequently, each time the address register is clocked, the updated address is loaded into the address register and the updated address that is loaded into the address register is output on the Q-lines from the address register to again be added to the delta parameter with the adders to provide the next updated address to the address register.

The multiplexers U10E, U11E, and U12E multiplex the updated address parameter from the adders into the address register to load the initial conditions into the address register at the beginning of the load mode and to load the updated address parameter from the adders thereafter. The ELS signal from U15A-3, as described with reference to FIG. 6D, controls the multiplexer to load initial conditions at the start of a line sync pulse and to enable updating of the address parameter with the delta parameter thereafter.

The adders are connected with the carry output from the preceding stage connected to the carry input of the next subsequent stage for a rapid carry propagating through the adder. The adders are arranged so that the overflow from U15E-9 coincides with the point that divides the scanout bits and the re-addressing bits, where the scanout bits are the three less significant bits and the re-addressing bits are the six more significant bits. The overflow signal U15E-9 is input to U16A-2 and U17A-2 (FIG. 6C) for controlling gating of the clock.

The XR-address generator will now be discussed with reference to FIG. 6Q. Register U8B, U9B, and U5B store the address parameter. Register U17B and U7B store the delta parameter for updating the address parameter. Adders U13B to U15B and U6B add the delta parameter to the address parameter to obtain an updated address parameter. Multiplexers U10B to U12B provide for loading initial conditions into the address register during the load mode and provide for updating the address parameter in the address register in response to the delta parameter in the delta register in the run mode.

The delta parameter initial condition is loaded into the delta register from the computer output port. The 6-LSBs from the computer output byte are applied to the D-inputs of delta register U17B and U7B. The CXRS clock provides a clock pulse at the appropriate time, as described with reference to FIG. 6B, to clock the initial conditions into the delta registers.

The address parameter initial condition is loaded into the address register from the computer output port. The 6-LSBs from the computer output byte are applied to the D-inputs of address register U8B, U9B, and U5B. The CXRM and CXRL clocks provide clock pulses at the appropriate times, as described with reference to FIG. 6B, to clock the initial conditions into the address register.

In the run mode, the address register is clocked with the CXRM and CXRL clocks to update the address parameter in response to the delta parameter. The output of the address register; the Q-outputs of the U8B, U9B, and U5B register; are applied to the A-inputs of adder circuits U13B to U15B and U6B. The output of the delta register; the Q-outputs of the U17B and U7B register; are applied to the B-inputs of adder circuits U13B to U15B and U6B. The output of the adder circuits on the summation lines is the binary sum of the A-inputs from the address register and the B-inputs from the delta register, providing an updated address parameter that is input to the address register through the multiplexers to the D-inputs of the address register. Consequently, each time the address register is clocked, the updated address is loaded into the address register and the updated address that is loaded into the address register is output on the Q-lines from the address register to again be added to the delta parameter with the adders to provide the next updated address to the address register.

The multiplexers U10B, U11B, and U12B multiplex the updated address parameter from the adders into the address register to load the initial conditions into the address register during the load mode and to load the updated address parameter from the adders during the run mode. The DOA6-bar signal from U18D-6, as described with reference to FIG. 6B, controls the multiplexer to load initial conditions in the load mode and to enable updating of the address parameter with the delta parameter in the run mode.

The adders are connected with the carry output from the preceding stage connected to the carry input of the next subsequent stage for a rapid carry propagating through the adder.

The YR-address generator will now be discussed with reference to FIG. 6R. Register U8C, U9C, and U5C store the address parameter. Register U17C and U7C store the delta parameter for updating the address parameter. Adders U13C to U15C and U6C add the delta parameter to the address parameter to obtain an updated address parameter. Multiplexers U10C to U12C provide for loading initial conditions into the address register during the load mode and provide for updating the address parameter in the address register in response to the delta parameter in the delta register in the run mode.

The delta parameter initial condition is loaded into the delta register from the computer output port. The 6-LSBs from the computer output byte are applied to the D-inputs of delta register U17C and U7C. The CYRS clock provides a clock pulse at the appropriate time, as described with reference to FIG. 6B, to clock the initial conditions into the delta registers.

The address parameter initial condition is loaded into the address register from the computer output port. The 6-LSBs from the computer output byte are applied to the D-inputs of address register U8C, U9C, and U5C. The CYRM and CYRL clocks provide clock pulses at the appropriate times, as described with reference to FIG. 6B, to clock the initial conditions into the address register.

In the run mode, the address register is clocked with the CYRM and CYRL clocks to update the address parameter in response to the delta parameter. The output of the address register; the Q-outputs of the U8C, U9C, and U5C register; are applied to the A-inputs of adder circuits U13C to U15C and U6C. The output of the delta register; the Q-outputs of the U17C and U7C register; are applied to the B-inputs of adder circuits U13C to U15C and U6C. The output of the adder circuits on the summation lines is the binary sum of the A-inputs from the address register and the B-inputs from the delta register, providing an updated address parameter that is input to the address register through the multiplexers to the D-inputs of the address register. Consequently, each time the address register is clocked, the updated address is loaded into the address register and the updated address that is loaded into the address register is output on the Q-lines from the address register to again be added to the delta parameter with the adders to provide the next updated address to the address register.

The multiplexers U10C, U11C, and U12C multiplex the updated address parameter from the adders into the address register to load the initial conditions into the address register during the load mode and to load the updated address parameter from the adders during the run mode. The DOA6-bar signal from U18D-6, as described with reference to FIG. 6B, controls the multiplexer to load initial conditions in the load mode and to enable updating of the address parameter with the delta parameter in the run mode.

The adders are connected with the carry output from the preceding stage connected to the carry input of the next subsequent stage for a rapid carry propagating through the adder.

Output of the address signals will now be discussed with reference to FIGS. 6O and 6P. The Q-outputs of the XP-address register and YP-address register are routed to the memory for accessing and for loading of information. The address connections between the memory and the address generators are listed in the CABLE CONNECTION TABLE here under the heading CABLE-I BM1,2/BL1 (C1). The Y-address bits Y0 to Y8 and the X-address bits X0 to X8, including the complemented and uncomplemented X3 memory board address select bit, are listed therein together with source circuits on the control logic board and destination circuits on the memory boards.

In the run mode, the XP-address register and YP-address register are continually clocked with the gated clock, as discussed with reference to FIG. 6B; resulting in the address parameters being continually updated with the delta parameters and resulting in the memory being continually addressed by the updated address parameters. The XA3 and XA3-bar memory board select signals are gated with U19A-1 in order to blank the CRT monitor and clear the buffer, as discussed with reference to FIG. 6D herein.

Memory Boards

A detailed design of one configuration of the memory of the present invention is shown in FIGS. 6E to 6N. The architecture of one of the memory boards is shown in block diagram form in FIG. 6E, is shown in detailed block diagram form in FIGS. 6F to 6J, and is shown in detailed logical diagram form in FIGS. 6K to 6N. Commonality of symbols and features in these diagrams provide for cross referencing to different levels of detail between these diagrams. This memory uses Mitsubishi M58725P RAMs having 16,384 (16K) bits per RAM, organized in a 2,048 (2K) words by 8-bits per word configuration. Logical diagrams of RAM chips are shown in FIGS. 6K to 6N. Each RAM chip comprises 11-address lines A0 to A10, 8-data lines DQ1 to DQ8, a chip select line S-bar, an output enable line OE-bar, and a write pulse line W-bar. The address lines address 1-word out of 2K-words stored in the memory chip. The data lines output the addressed word in the read mode and input a word for storage in the write mode. The data lines are tristate lines that, when in the read mode, output the addressed information when enabled with the chip select line S-bar and, when in the write mode, store the data in the addressed location. The output enable signal G-bar controls inputting and outputting of data from the RAM. When disabled with the chip select line or the output enable line, the data lines are in the floating tristate condition.

The memory control logic is comprised of circuits U19A to U19E, as shown in FIG. 6F. Buffers U19A and U19D are non-inverting buffers that buffer the address signals for fanout to the RAMs. In this configuration, 11-address signals YA3B to YA8B and XA4B to XA8B are fanned out to the address inputs A0 to A10 of the RAMs. Decoders U19B, U19C, and U19E decode the scanout portion of the address word for control of the tristate data lines of the RAMs. Decoder U19B decodes the Y-scanout portion YA0 to YA2 of the scanout portion of the Y-address. Decoders U19C and U19E decode the X-scanout portion XA0 to XA2 of the X-scanout portion of the address. Decoder U19C is enabled for, read operations and decoder U19E is enabled for write operations. Each of decoders; U19B, U19C, and U19E; receive 3-input scanout address lines and generate 8-decoded scanout control lines in response to the decoding. Decoded signals MY0-bar to MY7-bar from U19B generate Y-control signals to select one column of 8-RAMs with the chip select pin S-bar. Decoded signals MX0R-bar to MX7R-bar from U19C generate X-control signals in the read mode to select one row of 8-RAMs with the output enable pin G-bar. Decoded signals MX0W-bar to MX7W-bar from U19E generate X-control signals in the write mode to select one row of 8-RAMs with the output enable pin G-bar. Therefore, selection of a column of 8-RAMs with the Y-scanout signals and selection of a row of 8-RAMs with the X-scanout signals selects a single RAM common to both the selected row and the selected column for read and write operations.

The decoders have gating signals E1-bar, E2-bar, and E3. Signals E1-bar and E2-bar are permanently enabled on decoders U19B and U19C with a ground connection and signal E3 is permanently enabled on decoder U19E with a pullup connection. Signal E3 on decoder U19B is used to place the RAMs on the non-selected memory board in the standby mode for reduced power consumption. This is achieved by disabling U19B on the non-selected board and enabling U19B on the selected board with the XA3 and XA3-bar signals, which select the board to be utilized. Disabling U19B on the non-selected board disables the Y-scanout signals to the chip select pin S-bar, which in turn places the non-selected RAMs into the standby mode for reduced power consumption. The XA3 and XA3-bar gating of the U19B decoder is not necessary for memory operation, but is used for reduction of power consumption. Pin E3 on decoder U19C and pin E2-bar on decoder U19E are controlled with the DIEN-bar signal which is derived from the computer run/load mode signal for enabling decoder U19C in the run mode to read from memory, to disable decoder U19E in the run mode to prevent writing into memory, to enable decoder U19E in the load mode to write into memory and to disable decoder U19C in the load mode to read from memory. When decoder U19E is enabled in the load mode, the write pulse W-bar controls decoder U19E; where decoder U19E effectively steers the W-bar write pulse to the one of eight decoded signal lines MXOW-bar to MX7W-bar under control of the XA0, XA1, and XA2 scanout address signals.

A discussion will now be provided relative to FIGS. 6G to 6N to illustrate the logical design of the memory. FIGS. 6G to 6K each show 16-RAMs organized in 2-logical columns and constructed on one row on a memory board, where each memory board has 4-groups of 16-RAMs each shown in one of FIGS. 6G to 6J. The manner in which these 4-pairs of logical columns connect together is shown in FIG. 6E and is shown by the interconnections between FIGS. 6G to 6J and FIGS. 6K to 6N and by the discussions hereinafter.

All RAMs are addressed by the same 11-address lines; shown as the address bus to the A-input of each RAM in FIGS. 6G to 6J and shown in greater detail as the address bus to the A0 to A10 inputs of RAMs U8 and U16 for each pair of logical columns in FIGS. 6K to 6N. The addresses are placed on the address bus by U19A and U19D (FIG. 6F) and are routed to all 16-RAMs on each of the RAM groups (FIGS. 6G to 6J) to excite the RAM address inputs A (FIGS. 6G to 6J) and A0 to A10 (FIGS. 6K to 6N).

Each logical column of RAMs is selected by a single one of the eight Y-scanout signals from U19B (FIG. 6F), shown connected to the S-bar pin of each RAM in the logical column in FIGS. 6G to 6J and shown in greater detail to the S-bar inputs of RAMs U8 and U16 for each pair of logical columns in FIGS. 6K to 6N.

Each logical row of RAMs is selected by a single one of the eight X-scanout signals; MX0R to MX7R in the read mode to the output enable pin G-bar and MX0W to MX7W in the write mode to the W-bar from U19C and U19E respectively (FIG. 6F). Each of these signals are shown connected to the pair of RAM in the logical row for each pair of logical columns in FIGS. 6G to 6J and shown in greater detail for RAMs U8 and U16 for each pair of logical columns in FIGS. 6K to 6N. Each of these X-scanout signals enable the same pair of RAMs in each of the 4-pairs of logical columns (FIGS. 6G to 6J and FIGS. 6K to 6N).

All RAMs in the pair of columns shown in each of FIGS. 6G to 6J and FIGS. 6K to 6N have the corresponding data bus pins collected together; shown as the data bus to the D-input of each RAM in FIGS. 6G to 6J and shown in greater detail as the data bus to the D0 to D7 pins of RAMs U8 and U16 for each pair of logical columns in FIGS. 6K to 6N. The data bus and control signals are connected to a pair of Intel 8216 bus interface chips for each pair of logical columns, as shown in simplified form in FIGS. 6G to 6J and in detailed form in FIGS. 6K to 6N. The operation of the data bus interface is discussed in greater detail hereinafter.

In view of the above, all RAMs are addressed with the same address signals and one RAM that is at the intersection of the enabled X-row scanout signal and the enabled Y-column scanout signal alone is permitted to place the addressed word on the data bus in the read mode and alone is written into at the addressed location from the data bus.

In the read mode, one RAM is enabled to output the addressed word onto the system data bus. This can be implemented by busing together the corresponding 8-data lines from each RAM. However, busing together a large number of RAM data lines, such as 128-RAM data lines in this configuration, can result in reduced RAM speed, such as due to bus and chip capacitance. Therefore, Intel 8216 bi-directional bus drivers are provided to isolate groups of RAMs from the system data bus and from other groups of RAMs.

The system data bus interface will now be described with reference to FIGS. 6K to 6N. FIG. 6K shows the data bus interface for row-A on each of the two memory boards. FIG. 6L shows the data bus interface for row-B on each of the two memory boards. FIG. 6M shows the data bus interface for row-C on each of the two memory boards. FIG. 6N shows the data bus interface for row-D on each of the two memory boards.

For this configuration, 16-RAMs are bused together through each system data bus interface circuit, comprising two Intel 8216 components. The bi-directional signals DB0, DB1, DB2, and DB3 are connected to the RAM data bus and the uni-directional signals DI0 and DO0, DI1 and DO1, DI2 and DO2, and DI3 and DO3 are connected to the uni-directional system bus for reading from RAM through the DO0 to DO3 unidirectional outputs and for writing into RAM on the DI0 to DI3 unidirectional inputs. A pair of Intel 8216 4-bit bus drivers are used to control the 8-data bus lines for the RAM data bus.

The Intel 8216s are controlled with the board select signal XA3 or XA3-bar and the scanout address select signals for the 2 -columns of RAMs associated with the Intel 8216 circuits. The board select signal, XA3-bar for memory board-1 and XA3 for memory board-2, control all of the Intel 8216s on the board. Therefore, the Intel 8216s on the enabled board are partially enabled to connect the RAM data buses on that board to the system bus and the Intel 8216 on the disabled board are fully disabled to disconnect the RAM databuses on that board from the system bus. Similarly, the column select signals for the 2-columns of RAMs connected to the particular Intel 8216s are controlled with the column select signals so that the column select signal enabling a column of RAMs will also partially enabled the Intel 8216s associated with that column to connect the selected column data bus to the system data bus. Because 2-columns of RAMs are connected to each Intel 8216 circuit, the related column select signals are ORed together with a NAND gate; where the column select signals are in complement logic form and consequently a NAND gate can perform an OR function; and are then ANDed with the board select signal XA3 or XA3-bar in a second NAND gate in non-complement logic form to generate the control signal in complement logic form as needed for the Intel 8216 chip select. The Intel 8216 circuits are steered with the DIEN-bar control, which is connected to the DIEN signal generated with U21E-6 (FIG. 6B). Therefore, in the run mode; the DIEN signal controls the Intel 8216s to connect the RAM data bus through the DO0 to DO3 buffers to output the RAM signals onto the system output data bus and, in the load mode; the DIEN signal controls the Intel 8216s to connect the RAM data bus through the DI0 to DI3 buffers to input the write signals from the system data bus to the RAMs.

Row A on the board has 2-logical columns of RAMs (FIGS. 6G and 6K), comprising the first column with RAMs U1A to U8A and the second column with RAMs U9A to U16A. As shown in greater detail with reference to FIGS. 6K to 6N; the first column is selected with the MY0-bar column select scanout signal and the second column is selected with the MY1-bar column select signal. The 2-column select signals are ORed together with U18E-3 and are ANDed with the board select signal with U18E-6 to enable U17A and U18A.

Row B on the board has 2-logical columns of RAMs (FIGS. 6H and 6L), comprising the third column with RAMs U1B to U8B and the fourth column with RAMs U9B to U16B. As shown in greater detail with reference to FIGS. 6K to 6N; the third column is selected with the MY2-bar column select scanout signal and the fourth column is selected with the MY3-bar column select signal. The 2-column select signals are ORed together with U18E-8 and are ANDed with the board select signal with U18E-11 to enable U17B and U18B.

Row C on the board has 2-logical columns of RAMs (FIGS. 6I and 6M), comprising the fifth column with RAMs U1C to U8C and the sixth column with RAMs U9C to U16C. As shown in greater detail with reference to FIGS. 6K to 6N; the fifth column is selected with the MY4-bar column select scanout signal and the sixth column is selected with the MY5-bar column select signal. The 2-column select signals are ORed together with U17E-3 and are ANDed with the board select signal with U17E-6 to enable U17C and U18C.

Row D on the board has 2-logical columns of RAMs (FIGS. 6J and 6N), comprising the seventh column with RAMs U1D to U8D and the eighth column with RAMs U9D to U16D. As shown in greater detail with reference to FIGS. 6K to 6N; the seventh column is selected with the MY6-bar column select scanout signal and the eighth column is selected with the MY7-bar column select signal. The 2-column select signals are ORed together with U17E-8 and are ANDed with the board select signal with U17E-11 to enable U17D and U18D.

Buffer Board

The buffer board is implemented with a buffer to buffer the outputs of memory and to apply these outputs to the rear-end board (FIG. 6A). The buffer can be implemented with various forms of buffer memories, such as double buffers and FIFOs. Alternately, the buffer can be eliminated and the memory output can be routed directly to the rear-end board. The CABLE CONNECTION TABLE provided herein illustrates an arrangement for connecting the buffer board inbetween the memory and logic boards and the rear-end board. The buffer board receives memory information and a gated clock from the memory and logic boards to clock the memory information into the buffer and receives a rear-end board clock to clock the buffered information into the rear-end board, as generally discussed with reference to FIG. 6A.

Alternately, the memory and logic boards can provide the unbuffered information directly to the rear-end board without an intervening buffer board for clocking the memory information into the DACs on the rear-end board with the gated clock from the logic board.

Rear-End Board

The rear-end board interfaces the system to a CRT monitor and provides synchronization and clock signals for the CRT monitor and for the rest of the system. The rear-end board also performs auxiliary functions, such as converting analog joystick signals to digital form for control of a display processor. The rear-end board is shown in FIGS. 6S to 6V in detailed schematic diagram form.

A clock pulse generator 630A is implemented with a pair of inverters, an 18.432-MHz ( herein referred to as 18-MHz for convenience) crystal, resistors, and capacitors as shown in FIG. 6T to generate a square wave signal from inverter 630B pin-12. A counter circuit (74LS163N) is clocked from the inverted 18-MHz signal to pin-2 through inverter 74LS04 pin 2 for counting down the 18-MHz signal to about a 9-MHz clock signal for the display processor output from pin-14 and about a 2-MHz clock signal to the sync generator circuit MM5321 from pin-12. A group of 4-switches with pull-up resistors are connected to the preload inputs of the counter on pins 3 to 6 to preload a selected amount for implementing count periods other than binary numbers.

A synchronization signal generator is implemented with a National Semiconductor MM5321 component. The MM5321 is connected in a usual fashion, such as described in the specification sheets and shown in FIG. 6T. Switches D.C., V.R., and H.R. select MM5321 modes of operation.

The MM5321 horizontal drive signal is output from pin-15 and is used to blank the digital to analog converters (DACs) and is output through an 8T98-9 inverter H-DRIVE for generating the horizontal sync signal or line sync signal CLS to the digital logic boards. The horizontal drive signal is also output to flip-flop U1-9, which is used to experiment with horizontal blanking HB signals.

The MM5321 vertical drive signal is output from pin-11 and is used to generate vertical blanking signals through an 8T97-5 to vertical blanking flip-flops U2, generating vertical blanking signal VB which is used to blank the video DACs. The vertical blanking signal VB U2-9 is buffered with 8T97-11 through cable C4-2 to apply the vertical blanking signal to the digital logic as the CFS signal.

The MM5321 composite sync signal is output from pin-16 and is used as the composite sync signal to the CRT monitor, buffered with an 8T97-3 and an 8T98-3 for complement signals.

The MM5321 blanking clock signal is output from pin-14 and is used to clock the vertical blanking flip-flops U2 and the horizontal blanking flip-flops U1-9 HB through an inverter 8T98-7.

The MM5321 interlace control signal is output from pin-9 and is used to control flip-flop U1-5 FLD-bar to generate the field-1-bar signal on cable C4-12 to the control logic board.

Joystick input circuits are shown in FIGS. 6U and 6V. FIG. 6U provides the control circuits for the joystick analog to digital converters (ADCs) and FIG. 6V shows the ADCs. These ADCs are input to the computer through the control logic board to provide operator control of display processing.

The joysticks utilized in this configuration are Apple-2 Compatible Joysticks named Computer Compatible Joystick. They are analog joysticks having analog potentiometers for analog control. The joystick signals are input through plugs PJ1 and PJ2 at pin-6 and pin-7 for connection to the scaling amplifiers and ADCs shown in FIG. 6V. The ADCs are controlled to start the conversion with the frame sync transition of the frame sync signal by shifting the frame sync signal through flip-flops U9A-5 and U9A-9 and detecting the condition of U9A-5 being in the 0-state and U9A-9 being in the 1-state with AND-gate U12-3 to generate a 1-clock period start convert pulse to the ADCs. The ADCs will start the conversion in response to this start convert pulse and will latch up the converted digital number for input to the computer under program control.

The two computer signals SEL0 and SEL1 are received from the computer through the control logic board to select one of four ADC numbers for input to the computer. These signals are inverted with U13-7 and U13-9. The inverted and non-inverted SEL0 and SEL1 signals are decoded with U11-3 for ADC 1-selection with signal S1, ADC-2 selection with signal S2, ADC-3 selection with signal S3, and ADC-4 selection with signal S4. Inverters U10 and U13 receive 8 signals from the ADCs, shown in FIG. 6V, and buffers these 8-signals to drive the cable for input to the computer through the control logic board.

Consequently, the computer under program control generates select signals SEL0 and SEL1 and reads the 8-bit number from the selected ADC. In one implementation, the computer under program control generates four sequential select signal codes on lines SEL0 and SEL1 to address the four ADCs in sequence and inputs the selected ADCs output number for processing under program control.

The 4-ADCs and associated scaling amplifiers are shown in FIG. 6V. The ADCs are implemented with the well known ADC0800 components, such as manufactured by National Semiconductor. The scaling amplifiers are implemented with the well known LF356 amplifiers. Each of the 4-joystick inputs from plugs PJ1 and PJ2 (FIG. 6U) are shown connected to a different ADC channel through a scaling amplifier U1, U2, U5, and U6 (FIG. 6V). The scaling amplifiers are connected in a conventional manner with resistor and capacitor networks to scale the joystick signals. Each scaling amplifier has its output on pin-6 connected to the input of its related ADC on pin-12. The ADCs convert the analog signal input at pin-12 in response to the start convert signal to pin-6 and latch the converted number in an internal register. The internal register is implemented with a tristate output controlled by the output enable signal to pin-7. The corresponding output lines of each ADC are connected together to form an 8-bit bus DO to D7 which is routed to buffer amplifiers U10 and U13 (FIG. 6U). Consequently, when one of the ADCs is tristate-enabled with one of the decoded select signals S1 to S4 (FIG. 6U) input to pin-7 of the ADCs (FIG. 6V), the number converted by that ADC is applied to the 8-bit data bus for communication to the computer.

One channel of video DAC is shown in FIG. 6S. Each of the three channels are implemented with similar signals, except that the green channel having 3-bits is connected to data bits D5 to D7 and the red and blue channels having 2-bits are connected to data bits D6 and D7. These video DACs are high speed DACs for converting intensity signals from digital signal form, as generated by the display processor, to analog signal form for exciting a CRT monitor. Three video DACs are used to convert three video signals; the red video signal, the blue video signal, and the green video signal; to generate the RGB signals to the CRT monitor. The video DACs can be implemented with the TDC1016 DACs manufactured by TRW. The connections for this DAC are shown in the VIDEO DAC CONNECTION TABLE provided herein. The D9 and D10 data pins are connected to ground. The digital red and blue signals having 2-bits resolution are connected to the D7 and D8 data pins. The digital green signal having 3-bits resolution is connected to the D6 and D8 data pins. The other data pins are connected to ground.

Buffer amplifiers are implemented with the well known LM359 buffer amplifier, where the buffer amplifier connections are shown in FIG. 6S. The output of each buffer amplifier excites one of the red, green, or blue inputs to the CRT monitor.

Circuit Specifications

The circuits used in the experimental system are generally commercially available circuits that are well known and that are described in widely distributed specification sheets and component catalogs. A list of these specification sheets and catalogs is provided hereinafter and the materials referenced therein are incorporated herein by reference. For example, the 74LS00, 74ALS00, and 74AS00 specifications are set forth in the referenced Texas Instruments and Motorola catalogs and the Intel 8216 bus interface and the Intel 2149 RAM specifications are set forth in the referenced Intel catalogs; which are herein incorporated by reference.

1. Texas Instruments, ALS/AS Logic Circuits Data Book, 1983.

2. Texas Instruments, The TTL Data Book, Volume 3, 1984.

3. Texas Instruments, The TTL Pocket Data Book, 1983.

4. Intel, Component Data Catalog, 1981.

5. Intel, Memory Components Handbook, 1984.

6. Motorola, Schottky TTL Databook, 1981.

Various circuits used in the experimental system are described in the following list of component specifications, which are herein incorporated by reference.

1. TRW, LSI D/A Converters, TDC1016J-8/9/10.

2. TRW, Monolithic Video D/A Converters; TDC1016J-8, TDC0106J-9, TDC1016J-10; 1979.

3. Texas Instruments, TMS-4016, 2048-Word By 8-Bit Static RAM.

4. National Semiconductor, ADC0800 8-Bit A/D Converter.

5. National Semiconductor, MM5321 TV Camera Sync Generator.

6. Signetics, Hex Buffers/Inverters; 8T95, 96, 97, 98.

7. Mitsubishi; M58725P,S;P-15,S-15; 16384-BIT (2048-word by 8-bit static RAM.

Memory Expandability

Introduction

The memory configurations disclosed herein can be readily expanded; such as in the bit direction, the word direction, and the memory direction. For example; the bits per word can be varied from one bit, to four bits, to eight bits, to sixteen bits, and more bits per word; the words per memory can be varied from 16, to 1K, to 256K, to 1 meg, to 8 meg, to 1 billion, and more words per memory; and the number of memories can be varied from one memory, to four memories, to 16 memories, and more memories per system. Various memory configurations are discussed herein illustrating memory expandability, either explicitly or implicitly. See the FIGS. 4H to 4K configurations disclosed herein.

Memory expandability may be discussed in the context of a display system. However, such display system expandability is illustrative of multitudes of other applications for the memory technology disclosed herein.

For example, in a display configuration, the memory can be expanded in pixel depth and in image area (pixel quantity). Expandability in pixel depth and in image area are disclosed separately infra. However, expandability in both, pixel depth and image area, can be achieved by combining these two disclosures. Similarly, in a computer main memory configuration, the memory can be expanded in word length and in word quantity. Expandability in word length and in word quantity are disclosed separately infra. However, expandability in both, word length and word quantity, can be achieved by combining these two disclosures.

Pixel Depth

The eight bits per pixel disclosed for the Mitsubishi RAM configuration (FIGS. 6E to 6N) can be readily varied.

The memory system shown in FIG. 4F can be implemented with one megabit DRAMs for a display system having one-million pixels of one bit each, Paralleling eight of these DRAMs with common addressing and separate output bits will yield one-million pixels of eight bits each, Paralleling nine of these DRAMs with common addressing and separate output bits will yield one-million pixels of nine bits each, Paralleling sixteen of these DRAMs with common addressing and separate output bits will yield one-million pixels of sixteen bits each.

The memory system shown in FIG. 4F can be implemented with one megabit DRAMs for a display system having 250K-pixels of 4-bits each. Paralleling two of these DRAMs with common addressing and separate output bits will yield 250K-pixels of eight bits each. Paralleling three of these DRAMs with common addressing and separate output bits will yield 256K-pixels of twelve bits each. Paralleling four of these DRAMs with common addressing and separate output bits will yield 250K-pixels of sixteen bits each, Image Area The 250K-pixels disclosed for the Mitsubishi RAM configuration (FIGS. 6E to 6N) can be readily varied, The memory system shown in FIG. 4F can be implemented with one megabit DRAMs for a display system having one-million pixels of one bit each. Paralleling two of these DRAMs with different addressing (common address bits and chip selection with different chip select addresses) and bussed output bits will yield two-million pixels of one bit each, Paralleling eight of these DRAMs with different addressing (common address bits and chip selection with different chip select addresses) and bussed output bits will yield eight-million pixels of one bit each.

The memory system shown in FIG. 4F can be implemented with one megabit DRAMs for a display system having 250K-pixels of 4-bits each. Paralleling two of these DRAMs with different addressing (common address bits and chip selection with different chip select addresses) and bussed output bits will yield 500K-pixels of 4-bits each. Paralleling eight of these DRAMs with different addressing (common address bits and chip selection with different chip select addresses) and bussed output bits will yield two-million pixels of 4-bits each.

Bit Planes

The pixel depth configuration disclosed above can be adapted to provide different bit planes, where a particular one or particular groups of bits in the pixels can be written into or read out of separate from other bits in the pixels. For example, one bit in each pixel can be used as an overlay bit plane that can be loaded independent of the other bits in the pixel and can be scanned-out together with the other bits in the pixel. An overlay bit plane in image memory can be rotated, compressed, translated, and perspective-processed with the image; such as for gridlines, map notations, and others. An overlay bit plane in refresh memory can be fixed in the viewport; not rotated, compressed, translated, and perspective-processed with the image; such as for reticles and others.

The geometric processor is disclosed herein relative to writing an image into image memory on a line-by-line basis. This configuration can also be used to write graphic vectors into an overlay bit plane in image memory on a vector-by-vector basis. This can be implemented by directly writing the vectors under control of a supervisory processor or indirectly by loading a vector memory under control of a supervisory processor and then writing the vectors under control of the vector memory.

Word Length

In a computer main memory configuration, the eight bits per word disclosed for the Mitsubishi RAM configuration (FIGS. 6E to 6N) can be readily varied.

The memory system shown in FIG. 4G can be implemented for a computer main memory with one megabit DRAMs having one-million words of one bit each. Paralleling eight of these DRAMs with common addressing and separate output bits will yield one-million words of eight bits each. Paralleling nine of these DRAMs with common addressing and separate output bits will yield one-million words of nine bits each. Paralleling sixteen of these DRAMs with common addressing and separate output bits will yield one-million words of sixteen bits each.

The memory system shown in FIG. 4G can be implemented for a computer main memory with one megabit DRAMs having 250K-words of 4-bits each. Paralleling two of these DRAMs with common addressing and separate output bits will yield 250K-words of eight bits each. Paralleling three of these DRAMs with common addressing and separate output bits will yield 256K-words of twelve bits each. Paralleling four of these DRAMs with common addressing and separate output bits will yield 250K-words of sixteen bits each.

Word Quantity

In a computer main memory configuration, the 250K-words disclosed for the Mitsubishi RAM configuration (FIGS. 6E to 6N) can be readily varied.

The memory system shown in FIG. 4G can be implemented for a computer main memory with one megabit DRAMs having one-million words of one bit each. Paralleling two of these DRAMs with different addressing (common address bits and chip selection with different chip select addresses) and bussed output bits will yield two-million words of one bit each. Paralleling eight of these DRAMs with different addressing (common address bits and chip selection with different chip select addresses) and bussed output bits will yield eight-million words of one bit each.

The memory system shown in FIG. 4G can be implemented for a computer main memory with one megabit DRAMs having 250K-words of 4-bits each. Paralleling two of these DRAMs with different addressing (common address bits and chip selection with different chip select addresses) and bussed output bits will yield 500K-words of 4-bits each. Paralleling eight of these DRAMs with different addressing (common address bits and chip selection with different chip select addresses) and bussed output bits will yield two-million words of 4-bits each.

Memory Pipeline

A memory pipeline configuration can provide a price and performance improvement. Propagation delays in the address signal generation (including address multiplexing) and in the output data signals reduces the clock rates for the memory. Pipelining of the memory, both address signals and output data signals, can be implemented by combinations of intermediate registers to limit propagation delays and multi-phase clocks to compensate for propagation delays. Both of the techniques are shown in the embodiment of a display system using Mitsubishi RAMs herein.

Multi-phase clocking will now be discussed. Multi-phase clocking involves keeping track of both, maximum and minimum, propagation delays in order to select the correct clock phase and to insure that this phase boundaries will not be exceeded. A multi-phase clock can be generated by counting-down a high speed clock and by logically combining various counter signals.

Reducing memory propagation delays; whether with high speed circuits, or parallel logic, or pipeline registers, or multi-phase clocking, can be important. For example, memory speed can be increased by using higher cost DRAMs, but this can have a significant effect on system cost in systems that are memory intensive. Hence, reducing propagation delays outside of the DRAMs is important. However, gate array propagation delays may be low enough to render such DRAM outside delays to be small.

Memory Controller

Introduction

A memory controller can be used to generate signals to control a memory; such as for DRAM addressing and refreshing operations. Various memory architectures are disclosed herein, such as in FIGS. 4F to 4K, which can be used in combination with the various memory controller configurations disclosed herein; such as memory controller configuration-1 and such as memory detector, delay, and refresh circuits disclosed herein. Alternately, the memory controller teachings disclosed herein may be used in combination with conventional memory architectures and the memory architectures disclosed herein may be used in combination with conventional controllers. Similarly, portions of the memory controllers disclosed herein may be used in combination with portions of conventional controllers and portions of the memory architectures disclosed herein may be used in combination with portions of conventional memory architectures.

The memory waveforms disclosed herein are sufficient to teach one skilled in the art how to practice the features of the present invention. For example, said Toshiba data book defines the characteristics of the Toshiba DRAMs with such waveforms to teach one skilled in the art how to construct a DRAM controller for memory operation. Hence, memory waveforms by themselves are sufficient disclosure. However, additional logical design disclosure is provided herein to further facilitate the practice of the features of the present invention.

Memory Controller Waveforms

Memory data books and specification sheets for memories (i.e., DRAMs) provide waveforms and timing parameters that are well known in the art for design of memory systems. For example, see the Toshiba MOS MEMORY PRODUCTS DATA BOOK '86-7 referenced herein. These well known waveforms and timing parameters can be used by one skilled in the art in accordance with the teachings herein to implement memories having the features of the present invention. For example, said Toshiba DATA BOOK has waveform diagrams for normal and OE* controlled read cycles; for read cycles, write cycles, and read-modify-write cycles; for fast page mode, static column mode, nibble mode operations; and for RAS* only refresh, CAS* before RAS* refresh, and hidden refresh operations. Also, said Toshiba DATA BOOK has tables of ELECTRICAL CHARACTERISTICS AND RECOMMENDED AC OPERATING CONDITIONS listing the timing parameters. One skilled in the art can use these well known waveforms and timing parameters to design specific timing diagrams in accordance with the teachings of the present invention and can implement circuits to practice the features of the present from the teachings herein. Examples of use of well known waveforms and timing parameters for the Toshiba TC514256P/J-10 DRAMs from said Toshiba DATA BOOK to design specific timing diagrams in accordance with the teachings of the present invention are disclosed in FIGS. 7A to 7D and in the discussions related thereto and circuits implementing these waveforms and timing parameters for a memory system are disclosed in FIGS. 7E to 7I and in the discussions related thereto.

Various memory architectures are disclosed herein; such as discussed with reference to FIGS. 4F to 4K and such as discussed for memory controller configuration-1 herein; and various memory circuits are disclosed herein; such as detector circuits and delay circuits; which can be used to implement various memory architectures.

Memory controller waveforms will now be discussed as providing an alternate method of disclosing features of the present invention. These memory controller waveforms are discussed with reference to specific embodiments; such as memory scanout and re-addressing related waveforms (FIGS. 7A and 7B) in the context of the configuration-1 disclosure herein and sync pulse related operations in a display configuration (FIGS. 7C and 7D). These waveforms (FIGS. 7A to 7D) are illustrative of many other implementations of the features of the present invention. For example, one skilled in the art will now be able to generate other waveforms to implement other configurations in accordance with the present invention from the teachings herein.

Figure 7A:
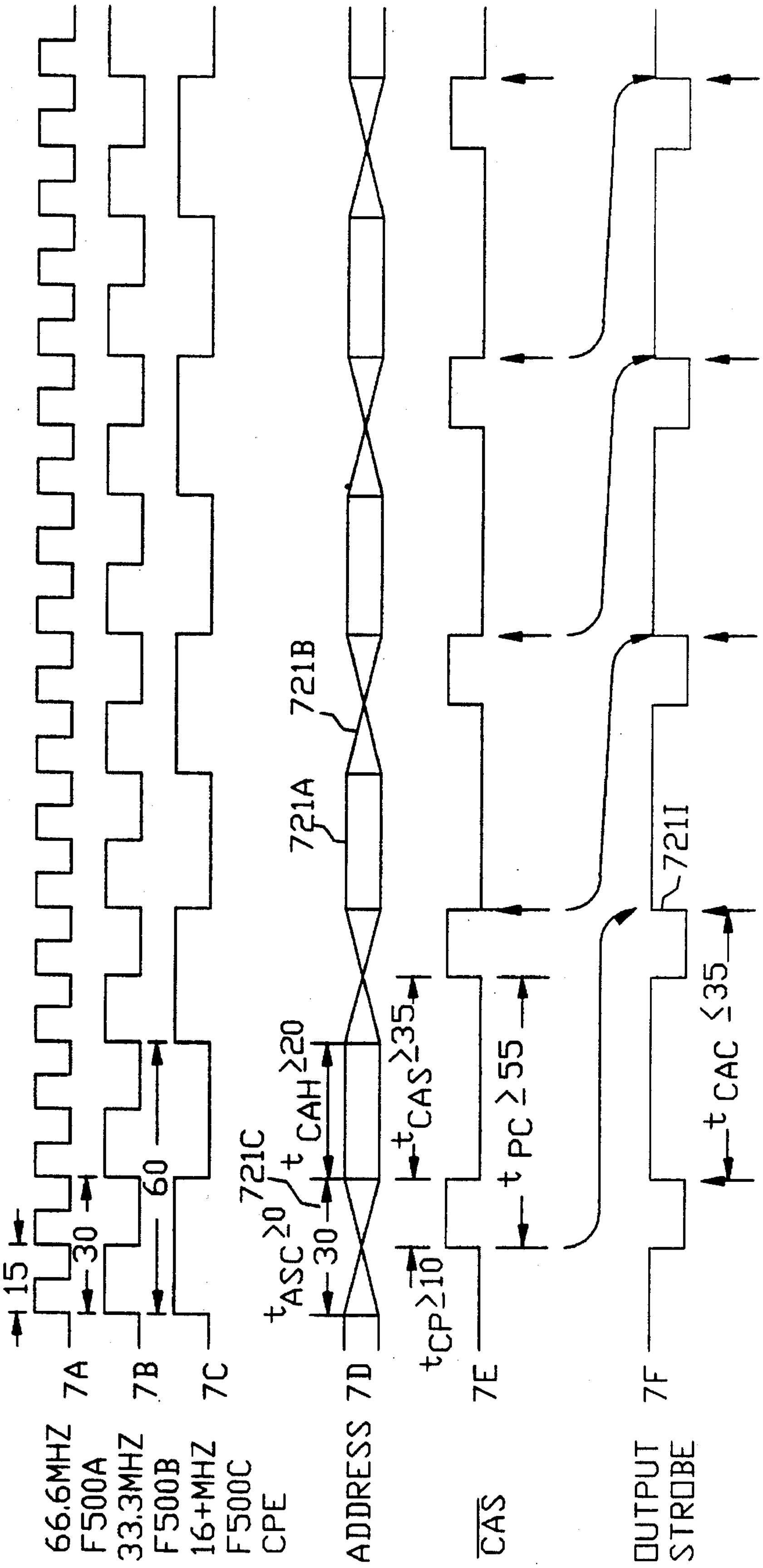
FIGS. 7A, 7B, 7C, 7D, 7E, 7F, 7G, 7H, and 7I (herein referred to as FIG. 7) comprise controller waveform and schematic diagrams; where
Figure 7B:
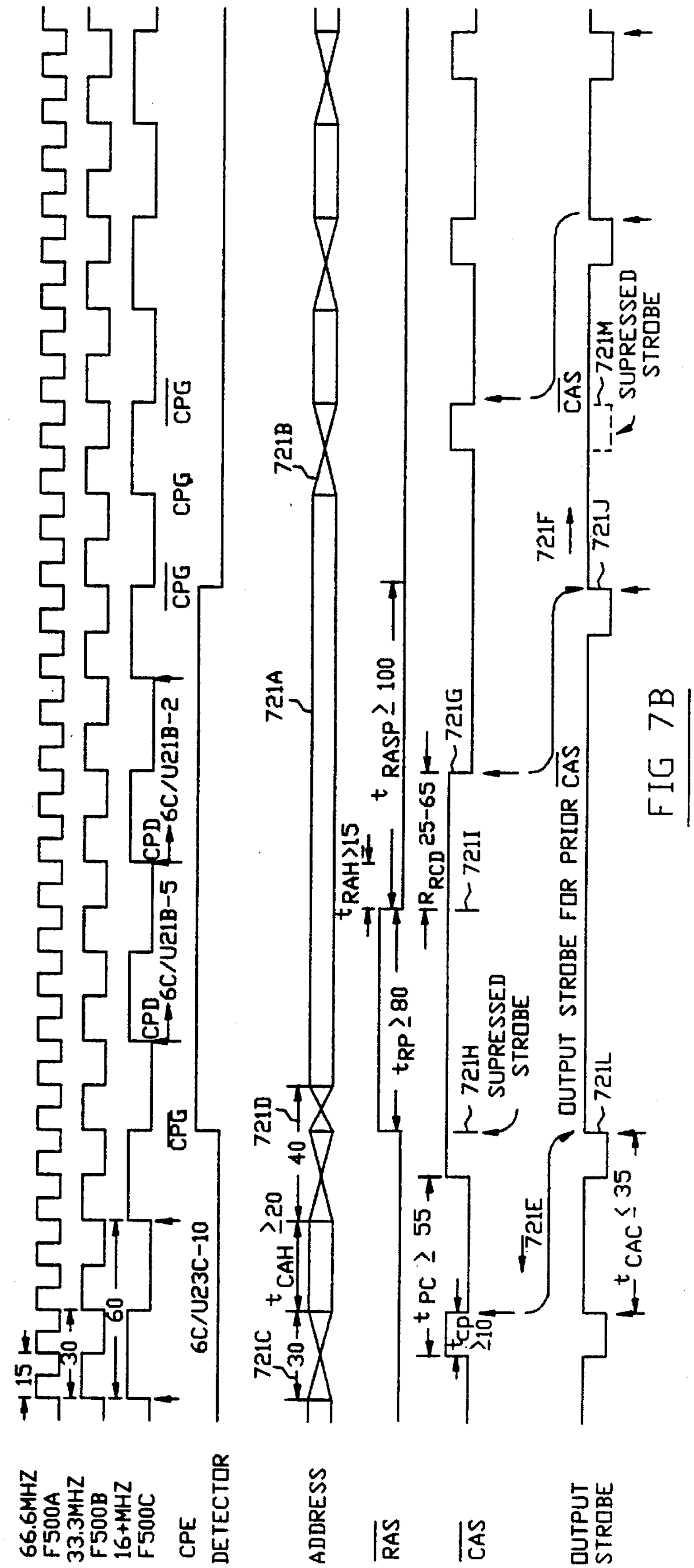
Figure 7C:
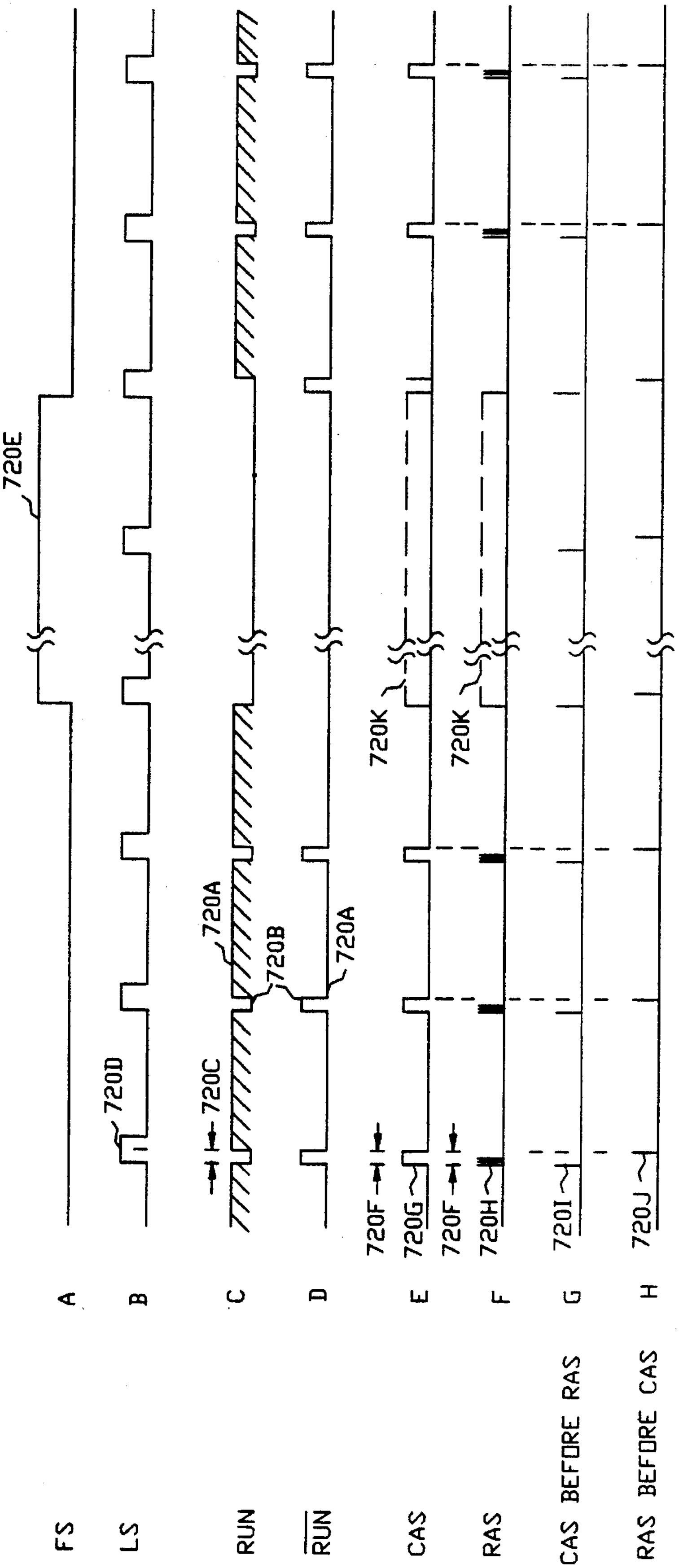
Figure 7D:
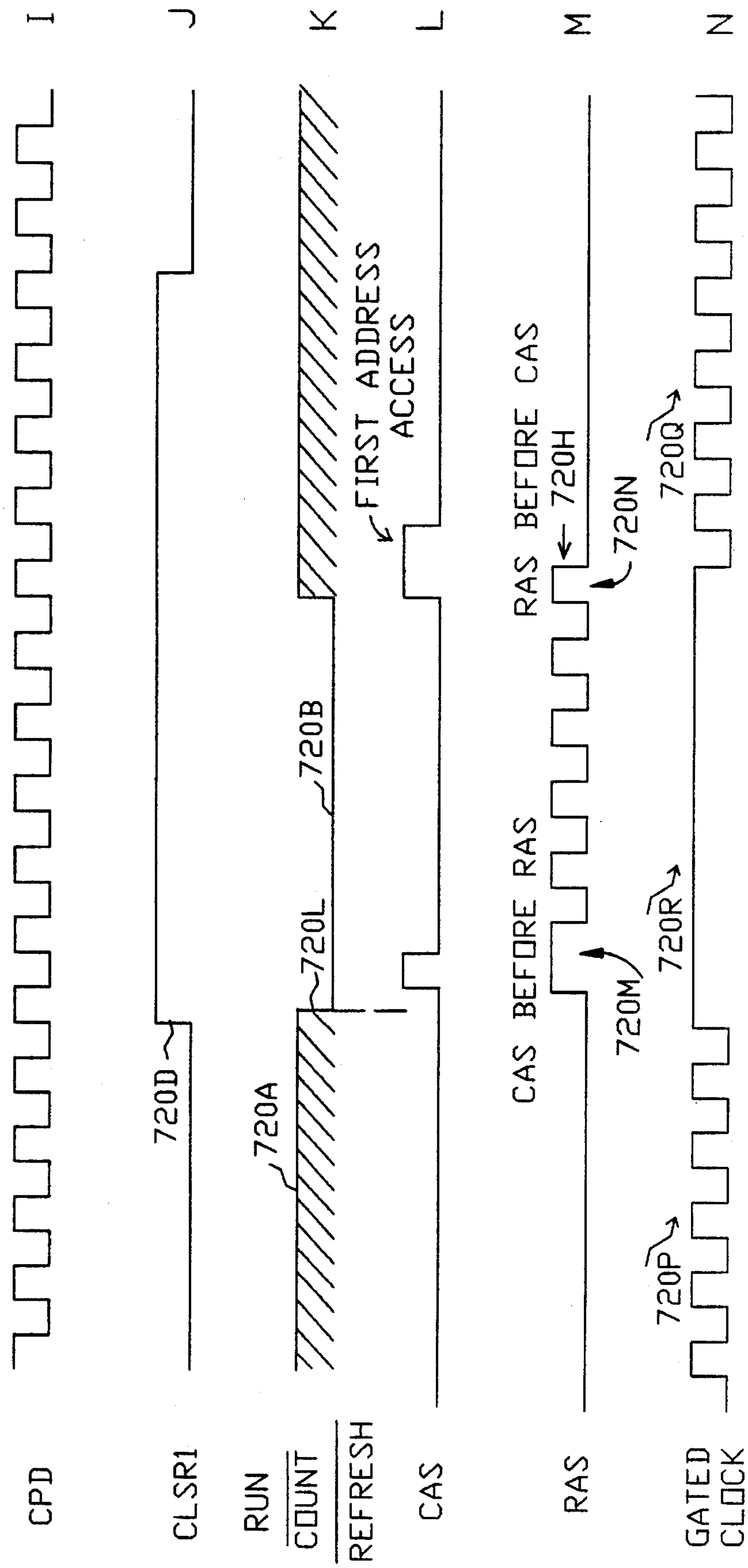

The waveforms shown in FIG. 7A disclose details .associated with internal scanout operations, the waveforms shown in FIG. 7B disclose details associated with detector signal occurrences, and the waveforms shown in FIGS. 7C and 7D disclose details associated with sync pulse occurrences. Also, the waveforms shown in FIGS. 7A to 7D are consistent with the arrangement disclosed in FIGS. 6C to 6N; where particular reference is made to FIGS. 6C and 6D therein and FIG. 6W herein. Also, the waveforms shown in FIGS. 7C and 7D are consistent with the waveforms shown in FIGS. 7A and 7B. These memory controller waveforms shown in FIGS. 7A to 7D are illustrative of various alternate configurations.

Memory scanout waveforms in accordance with configuration-1 herein are shown in detail in FIG. 7A and are discussed in detail in the section related to configuration-1 herein. Such memory scanout waveforms are illustrative of various alternate configurations; such as configurations operating with memory scanout within a block of memory without needing re-addressing in that block of memory and such as configurations combining memory scanout with other memory operations, such as memory re-addressing operations (FIG. 7B) and memory refresh operations (FIGS. 7C and 7D).

Memory scanout and re-addressing waveforms in accordance with configuration-1 herein are shown in detail in FIG. 7B and are discussed in detail in the section related to configuration-1 herein. Such memory scanout and re-addressing waveforms are illustrative of various alternate configurations; such as configurations operating with memory scanout within a block of memory and operating with memory re-addressing between blocks of memory and such as configurations combining memory scanout and memory re-addressing with other memory operations, such as memory refresh operations (FIGS. 7C and 7D).

The waveforms shown in FIGS. 7A to 7D disclose operation of one memory configuration in accordance with the present invention. One skilled in the art will be able to practice the present invention illustrated in these waveforms from the waveforms in FIGS. 7A to 7D and the discussion herein. One skilled in the logical design art will be able to implement circuitry to generate such waveforms and to practice the inventive features disclosed therein with digital logic; such as illustrated in FIGS. 6C and 6D for the Mitsubishi RAM configuration. Further, one skilled in the art will be able to apply these waveforms to other applications and other configurations of the present invention; such as frame sync pulse memory operations, computer instruction-related memory operations, time available memory operations, cycle stealing memory operations, and other memory operations.

Display-related memory operations are shown operating under control of a RUN signal envelope; such as for memory refreshing and for memory scanout. Other memory control signals can be substituted for this RUN signal in the control of memory operations. For example, a DTAC, READY, HOLD, or other processor delay type signal in a computer system, as discussed herein, can be used to initiate memory refresh operations and memory re-addressing operations in a similar way to that shown for the RUN signal controlling of memory operations herein.

Memory addressing waveforms (i.e., memory scanout and re-addressing waveforms) and memory refresh waveforms in conjunction with a time available signal (i.e., a line sync pulse signal) are shown in detail in FIGS. 7C and 7D and will now be discussed in more detail.

FIG. 7C shows the relationship of the field sync pulse FS (waveform-A), the line sync pulse LS (waveform-B), and the memory waveforms (waveform-C to waveform-H).

FIG. 7C shows the RUN signal (waveform-C and waveform-D) which defines the portion of the LS pulse that is to be used for displaying 720A (RUN) and the portion of the LS pulse that is used for DRAM refreshing, for modal detector re-addressing, and for updating of the display parameters 720B (RUN*). The RUN* signal 720B is coincident with the front portion 720C of the LS pulse 720D and the RUN* signal 720C is shorter than the LS pulse 720D. For the LS pulse controlled memory operations shown in FIG. 7C, neither the RUN signal 720A nor the RUN* signal 720B is enabled during the FS pulse 720E; consistent with the implementation shown in said FIGS. 6C, 6D, and 6W. In alternate configurations, such as FS pulse refreshing operations, memory refreshing can be performed during the FS pulse period.

FIG. 7C further shows a CAS refresh envelope 720G (waveform-E) and a RAS refresh envelope 720H (waveform-F) coincident with the RUN* signal envelope 720F for controlling memory refresh operations. CAS before RAS signals 720I (waveform-G) are initially generated in response to the start of the RUN* envelope 720B to initiate DRAM refresh operations followed by multiple RAS refresh pulses 720H (waveform-F and waveform-M) to invoke multiple refresh operations for the duration of the RUN* envelope 720B. RAS before CAS signals 720J (waveform-H) are generated in response to the end of the RUN* envelope 720B to terminate DRAM refresh operations and to invoke display operations. For the alternate embodiment of FS pulse refreshing, the CAS and RAS refreshing operations can be implemented during the FS pulse period 720K; similar to the configuration discussed for LS pulse refreshing operations discussed with reference to waveform-E and waveform-F. For example; DRAM refreshing can be performed during the FS pulse; such as by adapting the memory refresh-related waveforms shown associated with the LS pulse (i.e.; waveforms E, F, G, and H) to operate in conjunction with the FS pulse.

FIG. 7D shows in more detail the waveforms associated with a single one of the line sync pulses 720D shown in FIG. 7C. The display clock CPD (waveform-I) synchronizes display processing operations. An LS pulse 720D is shown synchronized with the CPD clock as synchronized LS pulse CLSR1 (waveform-J and FIG. 6D). A single cycle (waveform-K) of the RUN signal 720B establishes the portion of the LS pulse 720D that is to be used for display (RUN) 720A and the portion of the LS pulse 720D that is to be used for DRAM refresh and for updating of the display parameters (RUN*) 720B. The RUN* signal 720B is shown as being initiated coincident with the front portion 720L of the LS pulse 720D and the RUN* signal 720B is shown as being shorter than the LS pulse 720D, as implemented in said FIGS. 6C, 6D, and FIG. 6W.

The CAS and RAS signals are shown in waveform-L and waveform-M generating a CAS (negative going edge) before RAS (negative going edge) operation 720M when the RUN signal makes a high to low transition (the beginning of the RUN* signal) for initiating memory refresh operations and are shown generating a first RAS (negative going edge) before CAS (negative going edge) operation 720N when the RUN signal makes a low to high transition (the end of the RUN* signal) for initiating memory read operations.

FIG. 7D shows how the RAS signal and the CAS signal contribute to the generation of a CAS before RAS condition 720M at the beginning of the RUN* signal to initiate refreshing and contribute to the generation of a RAS before CAS condition 720N at the end of the RUN* signal to initiate reading information from the DRAM (waveform-M). In addition, a sequence of RAS pulses are generated inbetween the CAS before RAS leading condition and the RAS before CAS trailing condition (waveform-M) to command multiple DRAM refresh operations in the refresh mode.

FIG. 7D shows the gated clock signal (waveform-N), such as gated clock signal U21D-8 (FIGS. 6C and 6W) as being representative of DRAM read operations. It is shown proceeding at a scanout rate 720P and 720Q while the RUN signal is high and it is shown disabled 720R while the RUN signal is low. When the RUN signal goes high, the RAS before CAS operation initiates scanout cycles 720Q.

Scanout and re-addressing signals, such as CAS and RAS signals, are enabled by the RUN signal 720A, as indicated by the hatched areas of waveform-C and waveform-K (FIG. 7C and 7D), and are discussed in detail with reference to FIGS. 7A and 7B herein. For simplicity of illustration of memory operations and because of the detailed memory read operations shown in FIGS. 7A and 7B, the CAS signals (waveform-E and waveform-L shown in FIGS. 7C and 7D, respectively) and the RAS signals (waveform-F and waveform-M shown in FIGS. 7C and 7D, respectively) do not redundantly show the scanout CAS pulses and the re-addressing RAS pulses, respectively, that are shown in detail in FIGS. 7A and 7B. Such CAS and RAS read signals are illustrated in FIGS. 7C and 7D as being coincident with the hatched areas in waveform-C and waveform-K, respectively. However; it is intended for this example that the CAS signal (waveform-E and waveform-L) have CAS read pulses for accessing the DRAMs when the RUN signal is high, as indicated by the hatched areas in waveform-C and waveform-K (FIGS. 7C and 7D), and that the RAS signal (waveform-F and waveform-M) have RAS read pulses for re-addressing the DRAMs when the RUN signal is high, as indicated by the hatched areas in waveform-C and waveform-K (FIGS. 7C and 7D).

Memory Controller Configuration

Introduction

Various DRAM system configurations can be generated to illustrate the features of the present invention; including memory architectures and memory controllers. One of these memory controller configurations, memory controller configuration-1, is implemented to control Toshiba TC514256P/J-10 DRAMs; which are by-4 (4-bit output), 100 ns (RAS access time), fast page mode DRAMs. See the Toshiba data book (referenced herein) at pages 119 et seq. This memory controller configuration is shown implemented in the form of an image memory controller for a display system and is designed to be expandable to 4-megapixels of 16-bits per pixel. However, this memory controller configuration can be readily reconfigured for a microcomputer main memory or other system applications. Also, it can be readily designed to be expandable to 100-megawords (or 100-megapixels), to 500-megawords (or 500-megapixels), or more and it can be readily designed having 8-bits per word (or per pixel), 16-bits per word (or per pixel), 32-bits per word (or per pixel), or more.

Further, the memory controller configuration can be readily configured to use DRAMs having modes other than the fast page mode, such as the static column mode and the nibble mode. The waveforms for the fast page, static column, and nibble modes are set forth in the Toshiba Data Book referenced herein. A specific adaptation of the fast page mode waveforms to practice the present invention is discussed in detail herein with reference to FIGS. 7A to 7D. One skilled in the art can readily reconfigure FIGS. 7A to 7D to use static column mode and nibble mode DRAMs in place of the fast page mode DRAMs from the teachings herein.

Memory controller configuration-1 can be used with a range of memory architectures. For example, memory controller configuration-1 can be used in conjunction with multi-dimensional memory architectures (FIG. 4E), with single dimensional memory architectures (FIG. 4F), with memory architectures having internal scanout and external scanout (FIGS. 4H to 4K), with memory architectures having internal scanout without external scanout, memory architectures having external scanout without internal scanout, and others.

The memory controller configuration-1 design is specific to one embodiment; having specific components, specific timing, specific schematics, etc. of one specific configuration. This configuration is intended to be illustrative of one configuration of the present invention, not limiting of the scope of the present invention. Many other controller configurations can be implemented by one skilled in the art to practice the features of the present invention for other applications, other memory chips, other system requirements, etc.

One design objective is to optimize the memory data rate (i.e., access rate and writing rate) using a scanout operation. Another design objective is to minimize the clock rate of the highest speed master clock needed to provide the memory access rate.

Memory Controller Waveforms

Memory controller waveforms are shown in FIGS. 7A and 7B, which illustrate memory addressing operations, such as memory scanout and re-addressing operations. The memory waveforms shown in FIG. 7A illustrates internal scanout using CAS* cycles without re-addressing RAS* cycles for simplicity of illustration. The memory waveforms shown in FIG. 7B illustrates internal scanout using CAS* cycles with an interspersed re-addressing RAS* cycle. These FIG. 7A and 7B memory waveforms have been briefly discussed herein in conjunction with the FIG. 7C and 7D memory waveforms herein and will now be discussed in greater detail below.

The FIG. 7A and 7B memory waveforms has been carefully designed to optimize performance and to meet the timing requirements for the Toshiba TC514256P/J-10 DRAMs. They are applicable to an image memory for a display system, a main memory for a stored program computer, an array memory for an array processor, a DMA memory for a DMA processor, a filter memory for a filter processor, a cache memory processor, an artificial intelligence processor, and other memory applications. For convenience of discussion, signals may be discussed with reference to an image memory for the display system; which is illustrative of many other configurations.

There is significant commonality between read and write operations. The primary difference is control of the WRITE* signal to generate a read operation when high and to generate a write operation when low. Address-related signals (i.e.; CAS*, RAS*, and addresses) are generally common to both, read and write operations. The read and write circuits (i.e., control of the WRITE* signal) is discussed with reference to the logic diagrams herein.

FIG. 7A illustrates internal scanout operations without the need for re-addressing, such as for the data being accessed from a single memory page. FIG. 7B illustrates internal scanout operations and a single re-addressing operation, such as for the data being accessed from two memory pages. The waveforms shown in FIGS. 7A and 7B will now be discussed in more detail.

Signal F500A (waveform-7A in FIGS. 7A and 7B) is a higher speed master clock, selected to be 66.6 MHz having a 15-ns period for this memory controller configuration-1 in order to meet the memory data rate objectives with a relatively slow speed master clock. Increased memory performance can be obtained by using a higher frequency master clock to obtain finer time resolution control of the generated signals.

Signals F500B and F500C (waveform-7B and waveform-7C, respectively, in FIGS. 7A and 7B) are lower speed secondary and tertiary clocks, respectively; selected to be one half and one quarter, respectively, of the frequency of master clock signal F500A. Signals F500B and F500C are used in combination with signal F500A to generate various clocks, strobes, and other signals having the desired phases, time relationships, and pulse widths. Signal F500C is used as the main display processor free running early clock CPE, is slightly earlier than the main display processor free running delayed clock CPD, and is also slightly earlier than the main display processor gated delayed clock CPG; which are described with reference to FIGS. 6B to 6D. Signal F500A is configured to have a 15-ns period so that tertiary clock signal F500C (having 4-times the F500A clock signal period) will have a half cycle of 30-ns to be equal to the minimum CAS* scanout address update period.

The address signals (waveform-7D in FIG. 7A) are shown as horizontal lines 721A for stable address signal conditions and as diagonal crossed lines 721B for changing address signal conditions. The address change periods 721C (i.e., 30-ns) are related to the propagation delay for CAS cycles. The address signals (waveform-7D) are changed on the positive going edge of the CPD clock signal in accordance with the gated clock for the address generators (i.e., FIGS. 6B to 6D).

Increased memory performance can be obtained by using a shorter $t_{CAH}$ address period (waveform-7D in FIG. 7A), such a 20-ns $t_{CAH}$ address period, instead of the longer 30-ns period obtained from the F500C clock signal half cycle period. For example, a higher frequency master clock F500A or different logic circuits may be used to shorten this $t_{CAH}$ address period. However, for simplicity of implementation and discussion, the 30-ns F500C clock signal half cycle period is used to generate this $t_{CAH}$ address period in memory controller configuration-1.

The RAS* signal need not be generated for scanout without re-addressing operations addressing operation in accordance with FIG. 7A.

The CAS* signal (waveform-7E in FIG. 7A) is generated during the scanout period. The internal scanout-related CAS* signal is generated from the F500B and F500C secondary and tertiary clocks to form the (F500B*)(F500C) logical signal. The negative edge of the CAS* signal is used to strobe the DRAMs, as shown by the upwardly pointing arrows under the CAS* waveform (waveform-7E).

Increased memory performance can be obtained by using a shorter $t_{CP}$ CAS* period, such a 55-ns $t_{CP}$ CAS* period, instead of the longer 60-ns period obtained from the F500C clock signal half cycle period. For example, a higher frequency master clock F500A or different logic circuits may be used to shorten this $t_{PC}$ CAS* period. However, for simplicity of implementation and discussion, the 60-ns F500C clock signal full cycle period is used to generate this $t_{PC}$ CAS* period in memory controller configuration-1.

The output strobe (waveform-7F in FIG. 7A), like the CAS* signal, is generated during the scanout period. The scanout-related output strobe (in complement form) is generated from the F500B and F500C secondary and tertiary clocks to form the (F500B*)(F500C) logical signal, similar to the CAS* signal generation. The positive edge 721L of the output strobe is used to strobe the output register, consistent with the data being available from the prior CAS* cycle; as shown by the upwardly pointing arrows under the output strobe waveform (waveform-7F).

Increased memory performance can be obtained by using a shorter $t_{CAC}$ output strobe period, such a 35-ns $t_{CAC}$ output strobe period, instead of the longer 60-ns period obtained from the F500C clock signal half cycle period (waveform-7P). For example, a higher frequency master clock F500A or different logic circuits may be used to shorten this $t_{CAC}$ output strobe period. However, because the output strobe period is related to the longer CAS* period and for simplicity of implementation and discussion, the 60-ns F500C clock signal full cycle period is used to generate this $t_{CAC}$ output strobe period in memory controller configuration-1.

The output strobe is delayed one CAS* period from the corresponding CAS* signal that strobed the DRAM, satisfying the 35-ns $t_{CAC}$ requirement. See the downwardly curved arrows from the negative edge of the CAS* signal to the output positive edge of the enable pulse. Each CAS* negative edge is shown having an output strobe positive edge that is one F500C period later, satisfying the 35-ns $t_{CAC}$ requirement. See the downwardly curved arrows from the CAS* negative edge to the output strobe positive edge.

The detector signal (waveform-7K in FIG. 7B) is disclosed in FIG. 6C as an address overflow signal 6C/U14A-6 generated to command a re-addressing operation, but can be generated with various other configurations disclosed herein. It is synchronous with CPG*, the gated clock. It is shown having three CPD/CPG periods for a single overflow operation, starting and ending with CPG* transitions and having two intervening CPD pulses to control time delay flip-flops 6C/U21B-5 and 6C/U21B-2 (BL1). The detector signal changes on the positive going edge of the CPG* clock signal, which is about coincident with the positive going edge of the CPD clock signal, in accordance with the gated clock logic (i.e., FIGS. 6B to 6D). The detector signal is generated to have a period equal to the sum of the $t_{RP}$ period and the $t_{RASP}$ period to facilitate a RAS cycle. The RAS* signal could be implemented to start earlier and hence to reduce the RAS cycle period, such as by implementing a shorter detector signal propagation delay or implementing an anticipatory detector signal. Other memory detectors, such as discussed herein, can be used with this memory controller configuration-1.

The address signals (waveform-7L in FIG. 7B) are shown as horizontal lines 721A for stable address signal conditions and as diagonal crossed lines 721B for changing address signal conditions. The shorter address change periods 721C (i.e., 30-ns) are related to the propagation delay for CAS cycles and the longer address change periods 721D (i.e., 40-ns) are related to the propagation delay for RAS cycles. The address signals (waveform-7L) are changed on the positive going edge of the CPD clock signal in accordance with the gated clock for the address generators (i.e., FIGS. 6B to 6D).

Increased memory performance can be obtained by using a shorter $t_{CAH}$ address period (waveform-7L in FIG. 7B), such a 20-ns $t_{CAH}$ address period, instead of the longer 30-ns period obtained from the F500C clock signal half cycle period. For example, a higher frequency master clock F500A or different logic circuits may be used to shorten this $t_{CAH}$ address period. However, for simplicity of implementation and discussion, the 30-ns F500C clock signal half cycle period is used to generate this $t_{CAH}$ address period in memory controller configuration-1.

The RAS* signal (waveform-7M in FIG. 7B) is generated to execute a re-addressing operation. It is implemented to be coincident with the leading portion of the detector signal and having a $t_{RP}$ period duration. The negative going edge of the RAS* signal strobes the row address into the DRAMs.

The CAS* signal (waveform-7N in FIG. 7B) is generated during the scanout period having CAS* scanout signals shown preceding the RAS* signal 721E and following the RAS* signal 721F. The internal scanout-related CAS* signal is generated from the F500B and F500C secondary and tertiary clocks to form the (F500B*)(F500C) logical signal. The negative edge of the CAS* signal is used to strobe the DRAMs, as shown by the upwardly pointing arrows under the CAS* waveform (waveform-7N).

Increased memory performance can be obtained by using a shorter $t_{CP}$ CAS* period, such a 55-ns $t_{CP}$ CAS* period, instead of the longer 60-ns period obtained from the F500C clock signal half cycle period. For example, a higher frequency master clock F500A or different logic circuits may be used to shorten this $t_{PC}$ CAS* period. However, for simplicity of implementation and discussion, the 60-ns F500C clock signal full cycle period is used to generate this $t_{PC}$ CAS* period in memory controller configuration-1, The CAS* signal is also generated during the re-addressing period, being maintained high during the leading portion of the detector signal for a period of $t_{RP}$ and $t_{RCD}$ prior to generating a negative going CAS* strobe 721G. The CAS* cycle at the beginning of a re-addressing period has the negative going edge suppressed 721H, with the CAS* pulse being extended or stretched for the $t_{RP}$ and $t_{RCD}$ period supra.

The output strobe (waveform-7P in FIG. 7B), like the CAS* signal, is generated during the scanout period having output strobes shown preceding the RAS* signal 721E and following the RAS* signal 721F. The scanout-related output strobe (in complement form) is generated from the F500B and F500C secondary and tertiary clocks to form the (F500B*)(F500C) logical signal, similar to the CAS* signal generation. The positive edge 721L of the output strobe is used to strobe the output register, consistent with the data being available from the prior CAS* cycle; as shown by the upwardly pointing arrows under the output strobe waveform (waveform-7P).

Increased memory performance can be obtained by using a shorter $t_{CAC}$ output strobe period, such a 35-ns $t_{CAC}$ output strobe period, instead of the longer 60-ns period obtained from the F500C clock signal half cycle period (waveform-7P). For example, a higher frequency master clock F500A or different logic circuits may be used to shorten this $t_{CAC}$ output strobe period. However, because the output strobe period is related to the longer CAS* period and for simplicity of implementation and discussion, the 60-ns F500C clock signal full cycle period is used to generate this $t_{CAC}$ output strobe period in memory controller configuration-1.

The output strobe is also generated during the re-addressing period, being maintained high during the leading portion of the detector signal and generating a positive edge output strobe 721J at the end of the detector signal to strobe the DRAM data accessed by the RAS*-related re-addressing CAS* cycle into the output register. Similarly, the first scanout-related output strobe 721M following a RAS* cycle; defined by the (F500B*)(F500C) logical term; is suppressed because the CAS* signal associated with the (F500B*)(F500C) logical term occurring in the RAS* re-addressing cycle is suppressed as a result of the RAS* cycle.

The output strobe is delayed one CAS* period from the corresponding CAS* signal that strobed the DRAM, satisfying the 35-ns $t_{CAC}$ requirement. See the downwardly curved arrows from the negative edge of the CAS* signal to the output positive edge of the enable pulse, such as at the beginning of the RAS* re-addressing cycle. This applies to the CAS* signal, independent of whether it is a scanout CAS* cycle or a re-addressing CAS* cycle. For example; see FIG. 7A where each CAS* negative edge is shown having an output strobe positive edge that is one F500C period later, satisfying the 35-ns $t_{CAC}$ requirement. See the downwardly curved arrows from the CAS* negative edge to the output strobe positive edge.

A disabling or delaying signal; such as for input to a microprocessor READY, DTAC, HOLD, wait state control, or other such circuit; can be derived in accordance with the teachings herein. For example, the detector signal (waveform-7K) (FIG. 7B) may be used directly as a disabling or delaying signal or may be logically processed, such as with the multiple clock signals (the i.e.; F500A, F500B, and F500C) to form a reduced period disabling or delaying signal. Alternately, the RAS* signal (waveform-7M) (FIG. 7B) may be used directly as a disabling or delaying signal or may be logically processed, such as with the multiple clock signals (i.e.; F500A, F500B, and F500C) to form a reduced period disabling or delaying signal. Alternately, other disabling or delaying signals may be generated, such as by logically combining the multiple clock signals (i.e.; F500A, F500B, and F500C) with other memory system signals, to form a disabling or delaying signal.

Refresh Operations

Refresh operations in general are discussed herein for a range of different system applications. Now, a particular refresh configuration will be discussed to illustrate how the refresh teachings can be applied to a multi-mode sync pulse refreshed display system.

Sync pulse refreshing is particularly applicable to a display system. Other refreshing can be provided; such as for a computer executing read and write operations and a filter processor. In memory controller configuration-1 of the display processor DRAM image memory, four separate display processor modes involve refreshing are implemented, as listed below.

1) The computer write mode.

2) The burst write mode.

3) The read mode.

4) The standby mode.

The refresh modes can be implemented in various forms, such as concurrent modes or mutually exclusive modes. In the memory controller configuration-1 embodiment, a mutually exclusive arrangement is implemented. This means that only one mode of refreshing is active at a time. For DRAMs that need to be refreshed periodically, one mode should always be active. For example, the standby mode can be implemented to be a default mode that is active whenever the other modes are all inactive; such as with mode OR-NOT logic.

The computer write mode can be used for loading the image memory from a supervisory computer, such as the Imsai S-100 computer. It can be executed at relatively low speed as the computer outputs pixel after pixel under program control. It may be used to write other information, in addition to pixels, into image memory. For example, other information may need to be written into image memory; such as the sky colors, and other information may have to be read from image memory, such as table information for the table lookup processing.

Refreshing during the computer write mode can be executed in various ways, such as being performed under control of a computer output strobe (i.e., DOA7 for the FIG. 6B configuration and STRB for a 68HC11 configuration) synchronous with computer output operations or being performed under control of special purpose circuits inbetween computer output operations. For said synchronous refreshing, the computer output strobe (i.e., DOA7 for the FIG. 6B configuration and STRB for a 68HC11 configuration), which is generated for each output operation can also be used to generate a RAS* refresh strobe. For said inbetween refreshing, refreshing can be performed inbetween computer output strobes by implementing refresh circuitry to generate RAS* refresh strobes when a computer output strobe (i.e., DOA7 for the FIG. 6B configuration and STRB for a 68HC11 configuration) is not present.

The burst write mode can be used for loading the image memory from a high speed disk memory. It can be executed at relatively high speed as a disk memory loads pixel after pixel under control of a disk controller. It too may be used to write other information, in addition to pixels, into image memory supra. For example, it may be invoked to burst load pixels and other information during the field sync pulse period in order to avoid contention with display operations and also to simplify refreshing. Refreshing may be simplified by enabling refreshing operations for each mode (except possibly for the computer write mode which may have its own self contained computer synchronized refreshing) at the beginning of each line sync pulse and leaving the field sync pulse period-free of refreshing requirements. Consequently, refreshing of image memory during the burst write mode can be consistent with line sync refreshing discussed herein.

The read mode, when scanning out the image, and the standby mode, when not scanning out the image nor writing, can both be implemented to enable refreshing during the beginning of each line sync pulse, as discussed herein. This line sync refreshing may be less desirable for the computer write mode because it may be more inefficient to synchronize the computer write operations with the computer output strobe (i.e., DOA7 for the FIG. 6B configuration and STRB for a 68HC11 configuration) then with the sync pulses. Consequently; in order to avoid contention, the write mode signals (DOA5 and DOA6) can be used to disable the line sync and field sync commanded refresh operations. Hence, line sync refreshing can be disabled whenever the image memory is not in a computer write mode.

Alternately, the read mode, when scanning out the image, and the standby mode, when not scanning out the image nor writing, can both be implemented to enable refreshing at times other than during the beginning of each line sync pulse. For example, refreshing can be implemented on a cycle stealing basis, such as by stealing cycles from image scanout at 5-refresh operations per line period or other more suitable rate, or on a field sync basis, such as during each field sync period, or on another basis.

The number of refresh cycles per scanline will now be calculated. Assuming the condition of 480 video scanlines/frame, an interlaced video scan of 2-fields/frame, a video frame period of 0.034 seconds, and a DRAM refresh period of 0.008 seconds; a minimum of 5-refresh cycles can be generated per line sync pulse.

$$\frac{\text{(512 DRAM rows/DRAM refresh period)}}{\text{(480 scanlines/0.034 seconds)(0.008 seconds/DRAM refresh period)}} = 512/113 = 4.5$$

Assuming a 100 ns DRAM having a 200 ns refresh cycle period and a 16 MHz clock (memory controller configuration-1), 5-refresh cycles involve about 1 us.

Refreshing of a disk input buffer memory will now be discussed. It may not be necessary to refresh a disk input buffer memory in the burst write mode for conditions where disk loading operations implicitly refresh the DRAMs during read and write operations. Refreshing of the disk input buffer memory can be implemented as discussed herein for DRAM refreshing. Also, refreshing of the disk input buffer memory at times other than during disk loading operations can be implemented, such as discussed for the standby refresh mode of the image memory.

In view of the above, disk input buffer memory refreshing may be performed in two different modes, as listed below.

a) In the disk load mode when the disk input buffer memory is being loaded from disk.

b) In the standby mode when the disk input buffer memory is not being loaded from disk and is not in a burst write mode.

In the disk load mode, the disk input buffer can be refreshed for each byte transferred from disk similar to the implementation of the computer write mode supra because of the relative slowness of the disk load operations. In the standby mode, the disk input buffer may not be performing other operations and hence may be continuously refreshed supra.

Read And Write Operations

Figure 7E:
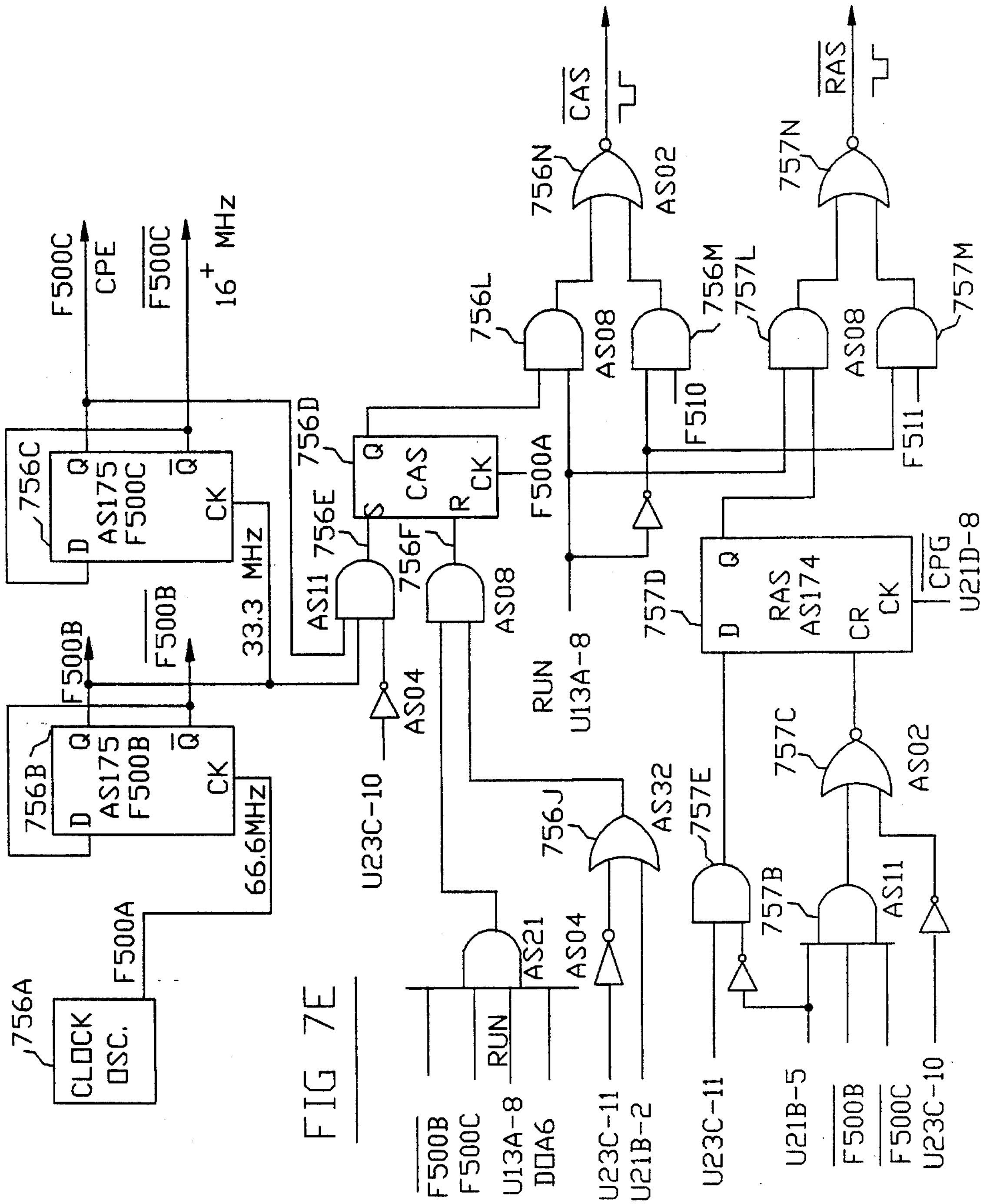
Figure 7F:
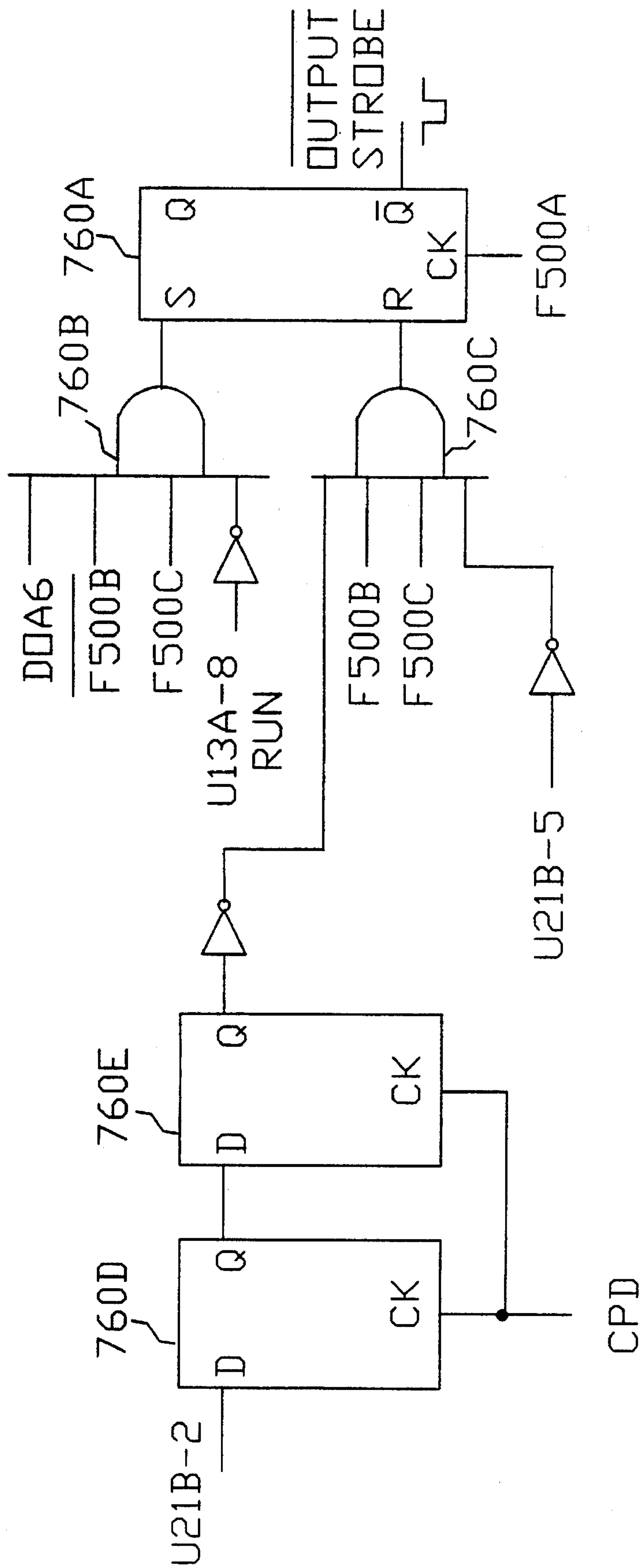

Read and write operations for memory controller configuration-1 are shown in the timing diagrams (FIGS. 7A and 7B) and the logic diagram (FIGS. 7E and 7F). The internal CAS scanout maximum rate is a function of the address counter propagation delay and the DRAM register hold time. RAS re-addressing maximum rate is a function of the RAS* delays ($t_{RP}$ and $t_{RASP}$).

Mode Transitions

The transitions between the various modes has been carefully considered and has been designed to be hazard free. For example, modes have been designed to be mutually exclusive, operation has been designed to resolve contention, and guardbands have been used to improve modal transitions to teach the artisan use of these features. Various other mutually exclusive modal arrangements, designs to resolve contention, and guardbands can be implemented by the artisan from the teachings herein. Alternately; modes can be interspersed and guardbands can be reduced or eliminated.

The transitions between the scanout read mode and the re-addressing read mode are hazard free, as shown in FIGS. 7A and 7B supra. In order to simplify the configuration-1 example, it is herein assumed that the slope parameters for updating the address registers are selected to eliminate multiple sequential overflows. For example, slopes of 0.5 pixels, or 0.25 pixels, or 0.125 pixels, etc. will provide such operation.

The transitions between the read modes and the burst write mode is hazard free, particularly when the burst write mode is invoked during the field sync pulse period. This is because, in this memory controller configuration-1, the read modes are disabled during this field sync pulse period. A guardband having a small delay precedes the start and follows the end of the burst write operations.

The transitions between the read modes and the computer write mode is hazard free because of the following. For startup or initialization computer write operations in memory controller configuration-1, any in-process read operations are transitionary operations and hence of no concern. For continuing computer write operations in memory controller configuration-1, such as for loading a table lookup; write operations are invoked during the field sync pulse period with a guardband and hence are hazard free.

Signal Generation

Configuration-1 controller signal generation can be implemented in various ways; such as with different types of synchronous circuits, asynchronous circuits, or combined synchronous and asynchronous circuits. A synchronous implementation is shown in FIGS. 7A to 7I using clock oscillator 756A generating master clock signal F500A, flip-flop 756B counting down master clock F500A to get secondary clock F500B, and flip-flop 756C counting down secondary clock F500B to get tertiary clock F500C. These clock signals are used to synchronously generate the various memory control signals.

CAS operations will now be discussed for memory controller configuration-1. CAS operations can be invoked during various conditions, such as during the three modes listed and discussed below.

1) The run mode.

2) The computer write mode.

3) The refresh mode.

There is no contention between these three modes because they are mutually exclusive and because the present implementation has a built in guardband (extra time) separating the different modes. For example, the write mode is implemented under control of the supervisory computer during the FS pulse when the run mode and the refresh mode are disabled and the write mode has a guardband separating write cycles resulting from software delays in the supervisory computer which generates the write strobe (DOA7) under program control. Also, the run mode is generated inbetween line sync pulses and the refresh mode is generated during line sync pulses with U22E flip-flop propagation delays separating these modes. Also, the U22E register (FIG. 7G) is shown having an extra stage at the beginning before the CLSR1 stage for a guardband delay before invoking refresh cycles.

During the run mode, the CAS signal can be generated for internal scanout operations (FIG. 7A) and for internal scanout and re-addressing operations (FIG. 7B). The CAS signal can be generated by properly setting and resetting the CAS flip-flop 756D. Zero setting of the CAS flip-flop is enabled by the RUN signal U13A-8 and by the DOA6 signal, as discussed for clock signals U12A-6 and U12A-8 (FIG. 6C). The CAS signal is controlled to follow the F500B* AND F500C signal condition (FIG. 7A); except that this sequence is interrupted during the RAS re-addressing operation (FIG. 7B); by being clocked high by the F500B AND F500C signal 756E and being clocked low by the F500B, AND F500C signal 756F. Because the DRAM CAS operation is invoked by the negative going edge of the CAS signal, the reset input to the CAS flip-flop may be considered to be more important than the set input is to the CAS flip-flop.

FIG. 7A run mode CAS signal generation will now be discussed. During the run mode and for the condition that detector signal U14A-6 is high (indicative of internal scanout operations), the CAS signal follows the (F500B*)(F500C) clock phases. The CAS flip-flop 756D can be set by the F500A clock signal clocking the F500B AND F500C signal (756E) into the CAS flip-flop just before the F500B signal is clocked to go low in the middle of the F500C clock pulse period when the F500C clock pulse is high (F500B AND F500C). The CAS flip-flop can be reset by the F500A clock signal clocking the F500B signal (756F) into the CAS flip-flop just before the F500B signal is clocked to go high at the end of the F500C clock pulse period when the F500C clock pulse is high and going low (F500B AND F500C*).

FIG. 7B run mode CAS signal generation will now be discussed. During the run mode and for the condition that the detector signal U23C-10 is high (indicative of the re-addressing operation) and in addition to the FIG. 7A conditions; two additional conditions need be to be considered.

1) The start of the RAS signal 721H (FIG. 7B).

2) The RAS-related CAS operation 721G (FIG. 7B).

The CAS signal can be kept from going low at the start of the RAS signal 721H and can be kept high until the RAS-related CAS operation 721G with the circuitry shown in FIG. 7E, as discussed below. The CAS signal can be kept from going low at the start of the RAS signal 721H by disabling the resetting of the CAS flip-flop with the anticipatory gate (detector) signal U23C-11 (FIG. 6C), where the anticipatory gate (detector) signal U23C-11 (FIG. 6C) anticipates an immediately following gate (detector) signal. In this configuration, the CAS signal is kept high during the RAS-related gate (detector) signal (FIG. 7B, 721H to 721G) until the RAS-related CAS operation is executed by enabling the resetting of the CAS flip-flop with the proper gate (detector) signal U21B-2 (FIG. 6C), thereby over-riding the gate (detector) signal disabling of the CAS signal through gate 756J. It should be noted that, in this configuration, the CAS signal is kept high during the gate (detector) period because the same anticipatory gate (detector) signal U23C-11 (FIG. 6C) that disables the resetting of the CAS flip-flop supra is kept unchanged because the gated clock (CPG) is disabled during the gate (detector) period and hence the address counter is not clocked and does not change. After generating the RAS-related CAS operation 721G, the CAS signal is kept low through the next F500B* AND F500C operation by disabling the CAS flip-flop from being set with the U23C-10 detector signal.

During the computer write mode, the CAS signal can be controlled as part of a full RAS/CAS write cycle for every computer write operation. This can be accomplished by generating a sequence of RAS and CAS pulses that is initiated with the computer output strobe (i.e., DOA7 for the FIG. 6B configuration and STRB for a 68HC11 configuration). One write configuration is disclosed with reference to FIGS. 7G and 7H, as discussed in detail below.

During the memory refresh mode, the CAS signal can be controlled as part of RAS and CAS refresh cycles for every LS pulse that occurs during the FS* period. This can be accomplished by generating a sequence of RAS and CAS pulses that is initiated with the LS pulse. One refresh configuration is disclosed with reference to FIGS. 7G and 7H, as discussed in detail below.

The F510 signal from the refresh mode and write mode circuit (FIG. 7G) is shown input to gate 756M in FIG. 7E for combining with the run mode CAS signal from CAS flip-flop 756D to generate the CAS output signal from gate 756N to the DRAM chips. When in the run mode, the run signal U13A-8 disables gate 756M through the inverter and enables gate 756L to pass the run mode CAS signal from flip-flop 756D through gate 756N to the DRAM chips. When in the refresh mode or write mode, the run signal U13A-8 disables gate 756L and enables gate 756M through the inverter to pass the refresh mode and write mode CAS signal F510 generated in FIG. 7G through gate 756N to the DRAM chips.

RAS operations will now be discussed for memory controller configuration-1. RAS operations can be invoked during various conditions, such as during the three modes listed and discussed below.

1) The run mode.

2) The computer write mode.

3) The refresh mode.

There is no contention between these three modes because they are mutually exclusive and because the present implementation has a built in guardband (extra time) separating the different modes supra.

During the run mode, the RAS signal is held low during the fast page operations (FIG. 7A) and is selectively controlled to go high during the re-addressing operations (FIG. 7B). As shown in FIG. 7B, the RAS signal is controlled to go high for 80-ns or more beginning at the start of the re-addressing gate (detector) signal. This is achieved with the RAS flip-flop 757D being set simultaneously with the gate (detector) flip-flop (U23C) using the anticipatory gate (detector) signal (U23C-11). The RAS signal is then reset to be low after 80 ns or more, achieved with the RAS flip-flop being cleared with the proper logical combination of the F500B, and F500C, clocks and the first gate (detector) phase signal (U21B-5).

FIG. 7B run mode RAS signal generation will now be discussed. During the run mode and for the condition that the detector signal U23C-10 is low (indicative of the internal scanout operation) as shown in FIG. 7A; the RAS flip-flop 757D is kept low, having previously been cleared and having the D input held low with the U21B-5 signal being low. During the run mode and for the condition that the detector signal U23C-11 is high (indicative of the re-addressing operation) and in addition to the FIG. 7A conditions; two additional conditions need be to be considered.

1) The start of the RAS signal 721H (FIG. 7B).

2) The end of the RAS signal 721I (FIG. 7B).

The RAS flip-flop can be set high at time 721H and can be kept high until the end of the RAS signal 721I with the circuitry shown in FIG. 7E, as discussed below. The RAS flip-flop can be set high at the start of the RAS signal 721H condition with the U23C-11 anticipatory gate (detector) signal through gate 757E to the D input of the RAS flip-flop 757D enabled by the U21B-5 signal being set low and inverted for inputting to gate 757E. The anticipatory gate (detector) signal U23C-11 (FIG. 6C) anticipates an immediately following gate (detector) signal.

In this configuration, the RAS signal is kept high during the RAS-related gate (detector) signal period (FIG. 7B, 721H to 721I) until the RAS flip-flop is cleared with the proper gate (detector) signal U21B-5 (FIG. 6C). It should be noted that, in this configuration, the RAS signal is kept high during the gate (detector) period until the RAS flip-flop is cleared because the same anticipatory gate (detector) signal U23C-11 (FIG. 6C) that controls the RAS flip-flop supra is kept unchanged because the gated clock (CPG) is disabled during the gate (detector) period and hence the address counter is not clocked and does not change. At time 721I, the RAS signal is cleared with the F500B* and F500C* clock condition and the U21B-5 gate (detector) signal, which has gone high, and is maintained low through the rest of the detector period U23C-10 by disabling the RAS flip-flop from being set by the U21B-5, detector signal to gate 757E. Further, the RAS signal is assured of being set low for scanout operations by clearing the RAS flip-flop with the U23C-10 detector signal through the inverter to gate 757C to the clear-bar input of the RAS flip-flop.

During the computer write mode, the RAS signal can be controlled as part of a full RAS/CAS write cycle for every computer write operation. This can be accomplished by generating a sequence of RAS and CAS pulses that is initiated with the computer output strobe (i.e., DOA7 for the FIG. 6B configuration and STRB for a 68HC11 configuration). The $t_{RCD}$ period has a maximum value requirement in addition to a minimum value requirement. The RAS signal going low should precede the CAS signal going low by the $t_{RCD}$ period (25 ns to 65 ns). The one CPD clock period separating the CAS and RAS signals is 60 ns, which meets this maximum timing requirement for this configuration.

During the memory refresh mode, the RAS signal can be controlled as part of RAS and CAS refresh cycles for every LS pulse. This can be accomplished by generating a sequence of RAS and CAS pulses initiated with the LS pulse. One refresh configuration is disclosed with reference to FIGS. 7G and 7H, as discussed in detail below.

The F511 signal from the refresh mode and write mode circuit (FIG. 7G) is shown input to gate 757M in FIG. 7E for combining with the run mode RAS signal from RAS flip-flop 757D to generate the RAS output signal from gate 757N to the DRAM chips. When in the run mode, the run signal U13A-8 disables gate 757M through the inverter and enables gate 757L to pass the run mode RAS signal from flip-flop 757D through gate 757N to the DRAM chips. When in the refresh mode or write mode, the run signal U13A-8 disables gate 757L and enables gate 757M through the inverter to pass the refresh mode and write mode RAS signal F511 generated in FIG. 7G through gate 757N to the DRAM chips.

During the refresh mode, such as for refreshing during the line sync LS condition; refreshing can be implemented by generating the RAS and CAS signals for one of the various refresh modes, such as the CAS before RAS refresh mode. Implementation of the CAS before RAS refresh mode enabled by the CLSR signals generated by the CLSR register U22E (FIGS. 6D and 7G) will now be discussed for this configuration-1 for convenience. Many other configurations can also be implemented.

Figure 7G:
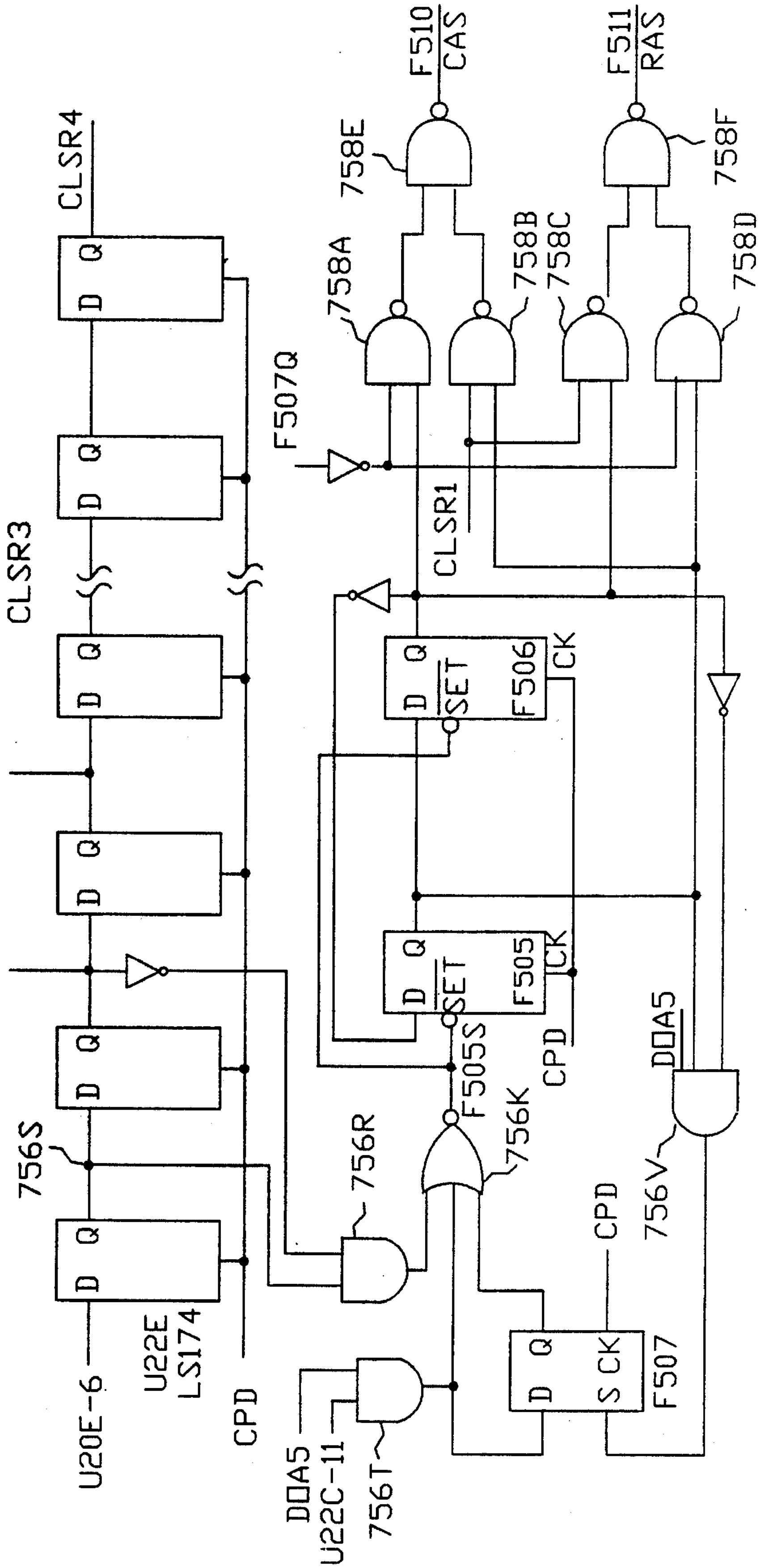

The U22E register circuit, as modified for this refresh operation, is shown in FIG. 7G. The U22E register has the U20E-6 signal (FIG. 6D) as an input. This U20E-6 signal has the logical equation CLSR1 AND CFSR1* so that it will follow the CLS line sync signal during the CFS* condition but not during the CFS condition. This resolves contention between write operations that are performed during the CFS period and with refresh operations that are performed during the CLS* period. The U22E register is clocked with the CPD signal (FIGS. 6D and 7G). The various register stages generate the CLSR1, CLSR2, and CLSR4 signals and are separated by the stage generating the CLSR3 signal (FIGS. 6D and 7G) and are modified to have a plurality of additional stages related to the CLSR3 stage and to have a guardband stage preceding the CLSR1 stage (FIG. 7G).

For the modified FIG. 7G configuration, the CAS refresh signal F505Q and the RAS refresh signal F506Q are shown being generated under control of clock CPD and hence the refresh gray code counter flip-flops F505Q and F506Q (discussed below) are clocked at the CPD (and hence the CPE) clock rate. Consequently, the four phases of the two bit gray code counter F505 and F506 take four CPD clocks for a refresh operation. The number of CLSR3 flip-flops in the CLSR register can be selected in various ways; such as to make the total number of stages in the CLSR register equal to four times the number of refresh cycles to be generated during the LS pulse plus the guardband stage or stages. For example, if one guardband stage is to be used and if eight refresh cycles are to be generated, the CLSR1 to CLSR4 stages (including the multiple CLSR3 stages) total 32 stages plus one guardband stage for a total of 33 stages. Further, extra stages can be inserted before the CLSR1 stage, for the CLSR3 stages, after the CLSR4 stage, etc. as needed for guardband stages and as needed to adjust the stages of delay to synchronize the CLSR signal U19D-4 with the refresh operations.

It is desirable that the F505 and F506 flip-flops are both left in the high state following the refresh operation so that the transition from the refresh mode and the run mode is made with the F505 and F506 flip-flops in the high state. This is accomplished by selecting the number of U22E stages to end in this condition. For example, the abovementioned 32 stages (less guardband) starts the F505 and F506 flip-flops in the high state and concludes with the F505 and F506 flip-flops in the high state.

In alternate configurations; a counter, such as implemented with 74LS161 counter circuits, can be used to perform the functions performed with register U22E. For example, the 32 CLSR register stages discussed for the configuration-1 refresh implementation supra can be reduced to five counter stages.

Figure 7H:
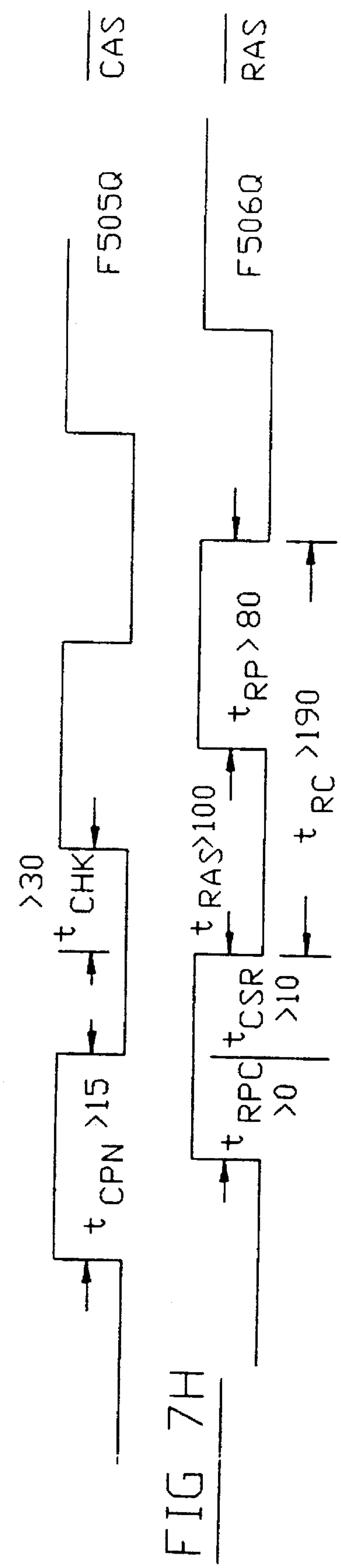

FIGS. 7G and 7H show the refresh signal generation circuitry and waveforms, respectively. A review of the CAS before RAS refresh waveforms at page 127 in Toshiba Data Book referenced herein indicates that the CAS and RAS waveforms have the general form of two squarewaves that are 90 degrees out of phase. These waveforms are shown in simplified form in FIG. 7H having the refresh timing symbols (t) superimposed thereon and having the related minimum values for these timing symbols (shown with greater-than < symbols) for the Toshiba TC514256P/J-10 superimposed thereon. Such waveforms can be generated in various ways, such as by a gray code counter having the following transition table.

TRANSITION TABLE

| PRESENT STATE | | NEXT STATE | |
|---|---|---|---|
| F505Q | F506Q | F505D | F506D |
| 0 | 0 | 0 | 1 |
| 0 | 1 | 1 | 1 |
| 1 | 0 | 0 | 0 |
| 1 | 1 | 1 | 0 |

One configuration of a gray code counter is shown in schematic form in FIG. 7G with flip-flops F505 and F506 for implementing this transition table.

Review of the minimum time values (FIG. 7G) indicates that a gray code counter clock having a 50-ns clock period (quarter cycle period) can meet the refresh cycle CAS and RAS timing requirements. The 60-ns F500C clock signal can be used because it is conveniently available and because it has a wide safety margin for this gray code counter clock.

The gray code counter is shown being set with the output of gate 756R, comprising the complement of the CLSR1 signal and the output of the guardband stage 756S, through gate 756K so that the gray code counter will start off in the set state, consistent with the start of the CAS before RAS refresh waveform in said Toshiba Data Book. The output of gate 756R occurs at the beginning of a CLS period when the CLS signal (included in the U20E-6 signal) has just set the guardband flip-flop but has not as yet set the CLSR1 flip-flop, thereby generating a short one clock period wide pulse out of gate 756R to preset the gray code counter. A D flip-flop having an asynchronous SET* circuit, such as the 74LS74 D flip-flop, is shown for convenience of discussion. However, other circuits, such as RS or JK flip-flops or counter circuits, can be used. Also, the asynchronous SET* circuit can be replaced with initializing circuitry, such as at the synchronous input (i.e., D input) circuits. Also, other circuit arrangements can be used to implement the configuration-1 controller.

The CAS refresh signal F505Q and the RAS refresh signal F506Q are shown enabled with the CLSR1 signal to perform refreshing operations during the CLSR1 condition. The CLSR1 signal enables gate 758B to permit the F505Q signal to be output as the F510 CAS signal from gate 758E and enables gate 758C to permit the F506Q signal to be output as the FS11 RAS signal from gate 758F while the F507Q* signal disables gates 758A and 758D to prevent the F506Q signal from being output as the F510 CAS signal from gate 758E and to prevent the F505Q signal from being output as the F511 RAS signal from gate 758F.

Figure 7I:
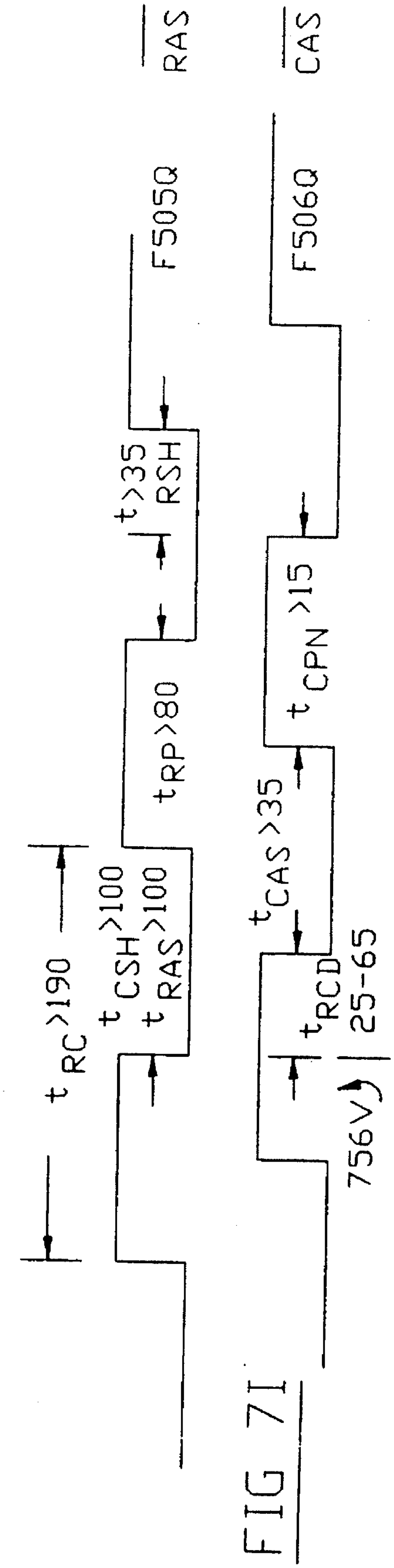

The write circuit implementation will now be discussed with reference to FIGS. 7G and 7I.

The write operations for this configuration-1 are simplified for the following reasons. The address signals and the write mode signal DOA5 are setup by the computer before generating the DOA7 pulse to perform the write operation (i.e., FIG. 6B). Also, the RAS signal automatically controls the RAS and CAS multiplexers to generate the sequence of first the RAS address and then CAS address being applied to the DRAMs in synchronization with the RAS and CAS signals (i.e., FIGS. 4H to 4K).

The write mode is invoked with the DOA5 signal being high and the DOA6 signal being low. Then, the DOA7 pulse going high initiates a write cycle. See FIG. 6B at U22B-3, U22C-11, U18E-11, etc. Gate 756T (FIG. 7G) generates a signal to set the F507 flip-flop during the write mode before the write strobe DOA7 is generated to initialize the gray code counter through gate 756K. The U22C-11 signal and the DOA5 signal (FIG. 6B) are NANDed together with NAND gate 756T to generate a set signal when in the write mode (DOA5) and before the write strobe (U22C-11) is generated to set the F505 and F506 flip-flops (FIG. 7G). This initializes the gray code counter in the write mode when a DOA7 write pulse is not present and initiates a RAS and CAS write cycle when a DOA7 write pulse is generated. After a single RAS and CAS write cycle is completed, the feedback signal from gate 756U sets the F507 flip-flop to terminate the RAS and CAS write cycle with the F505 and F506 flip-flops in the set condition. Many other configurations can also be implemented.

The F505 and F506 flip-flops are controlled to generate a single RAS/CAS sequence (FIG. 7I) starting from the F505 and F506 flip-flops both being in the high state and ending with the F505 and F506 flip-flops both being in the high state. The starting of the F505 and F506 flip-flops in the high state is performed with the signal from gate 756T, as discussed above. The ending with the F505 and F506 flip-flops in the high state is discussed below. The F505 and F506 flip-flops are sequenced from both flip-flops being in the high state through the gray code counter states shown in the transition table supra and in the waveforms in FIG. 7I through the F505Q* AND F506Q and F505Q* AND F506Q* states to the F505Q AND F506Q* state. This F505Q AND F506Q* state is detected with gate 756U (enabled with the write mode signal DOA5) to set flip-flop F507. Flip-flop F507 was reset by the signal from gate 756T that initialized the F505 and F506 flip-flops. Now, flip-flop F507 being set causes the F505 and F506Q flip-flops to be set through gate 756K until the signal from gate 756T again resets flip-flop F507 for another write cycle or until another mode in selected. The setting of the F506 flip-flop when the F505 flip-flop goes high (when the F506 flip-flop is low) through gate 756U, flip-flop F507, and gate 756K is consistent with the write cycle timing waveforms in said Toshiba Data Book at page 124 because there is no time delay required between the RAS signal going high and the CAS signal going high, where it is even permissible for the CAS signal to go high before the RAS signal goes high.

Flip-flop F507 insures that only a single write cycle will be generated with the gray code counter. This is achieved by the following. The F507 flip-flop is reset in the write mode during the period that the write strobe U22C-11 is high by resetting the F507 flip-flop with the U22C-11 signal and the DOA5 signal through gate 756T. When the write strobe U22C-11 goes low, the reset input circuit is disabled and the set input circuit is enabled. When the gray code counter is advanced to the F505Q AND F506Q* state, indicative of the completion of the write cycle; the F507 flip-flop is clocked to the set condition, setting the F505 and F506 flip-flops through the 756K gate and maintaining the F505 and F506 flip-flops set. The F505 and F506 flip-flops are maintained set until the write strobe U22C-11 ends; thereby resetting the F507 flip-flop, ending the lockup of the F505 and F506 flip-flops, and preparing for the next write or refresh cycle.

It is desirable that the F505 and F506 flip-flops are both left in the high state following the write operation so that the transition from the write mode and the run mode is made with the F505 and F506 flip-flops in the high state. This is accomplished by setting the F505 and F506 flip-flops with the F507 flip-flop through gate 756K at the end of the write operation.

The circuitry shown in FIG. 7G, previously discussed for refresh signal generation circuitry is shown time shared for write cycle operations in the configuration-1 controller. Alternately, a non-time shared (dedicated) configuration can be implemented having the gray code counter F505 and F506 duplicated for refresh and for write operations and having the refresh-related control circuitry dedicated to the refresh counter and having the write-related control circuitry dedicated to the write counter.

A review of the CAS and RAS write cycle waveforms for the Toshiba TC514256P/J-10 at page 124 in Toshiba Data Book referenced herein indicates that the CAS and RAS waveforms have the general form of two squarewaves that are 90 degrees out of phase with each other, similar to the CAS before RAS refresh waveforms supra except that the RAS and CAS waveform leading and trailing characteristics are reversed from the refresh waveforms. For example, the CAS before RAS refresh operations involve the CAS signal leading the RAS signal while the write operations involve the RAS signal leading the CAS signal. Hence, the refresh waveforms may be considered to be 180 degrees out of phase with each other. The write waveforms, shown in simplified form in FIG. 7I, are similar to but reversed in phase from the refresh waveforms shown in simplified form in FIG. 7H. The write waveforms (FIG. 7I) can be generated in various ways, such as by a gray code counter having the above discussed transition table. The configuration of a gray code counter shown in schematic form in FIG. 7G can be used for implementing this transition table. However, the CAS and RAS outputs of the gray code counter need to be reversed for write operations.

The minimum time values for the DRAM write cycle indicates that the gray code counter clock used for refresh operations having a 50-ns clock period (quarter cycle period) can meet the write cycle CAS and RAS timing requirements. As with refreshing operations, the 60-ns F500C clock signal can be used for writing operations because it is conveniently available and because it has a wide safety margin for this gray code counter clock. The gray code counter is shown being set with the F505S signal from gate 756K so that the gray code counter will start off in the set state, consistent with the start of the CAS and RAS cycle write cycle waveform in said Toshiba Data Book. The RAS write signal F505Q and the CAS write signal F506Q are shown enabled with the U22C-11 signal to gate 756T (FIG. 7E) to enable a write cycle operation during the DOA5 write mode.

The CAS write signal F506Q and the RAS write signal F505Q are shown enabled with the F507Q* signal to enable writing operations during the F507Q condition. The F507Q* signal enables gate 758A to permit the F506Q signal to be output as the F510 CAS signal from gate 758E and enables gate 758D to permit the F505Q signal to be output as the F511 RAS signal from gate 758F while the CLSR1 signal disables gates 758B and 758C to prevent the F505Q signal from being output as the F510 CAS signal from gate 758E and to prevent the F506Q signal from being output as the F511 RAS signal from gate 758F.

The run, refresh, and write modes are assured of starting without contention and of being completed without contention. As discussed above; the refresh, write, and run modes are mutually exclusive and are separated by guardbands. Hence, they do not have contention during operations. Further; the CAS and RAS flip-flops for the refresh, write, and run modes are initialized before starting the modes to insure proper startup. For example, the gray code counter (FIG. 7G) is initialized by the signal from gate 756T prior to starting a write cycle and is initialized by the signal from gate 756R prior to starting a refresh operation. Also, the detector can be initialized to a re-addressing operation, such as with the RUN signal U13A-8 to the SET* input of flip-flop K1 (FIG. 6W), to insure that the memory is properly RAS addressed at the beginning of a scanline when entering the run mode. Still further, the CAS flip-flop 756D and the RAS flip-flop 757D can be set with the RUN signal, similar to the setting of the detector flip-flop K1 (FIG. 6W) with the RUN signal U13A-8 to the SET* input and similar to the setting of the gray code counter (FIG. 7G) with the F505S signal, in a configuration where it is desired to start run mode operations at the 721H operating point (FIG. 7B). Further, the refresh and write cycles are assured of being completed without interruption because the CLS signal controlling the maximum length of the refresh period and the DOA7 signal controlling the maximum length of the write period are much longer than the refresh and write cycles, respectively; because the U22E counter insures that the multiple refresh cycles will be completed before terminating the refresh operation; and because the gray code counter insures that the write cycle will be completed before terminating the write cycle. Similarly, the RAS and CAS logic for the run mode (FIG. 7E) insures that the RAS and CAS cycles will be properly cycled. Further, the run mode is implemented as a read only mode and hence interruption of a run mode RAS or CAS cycle will only affect reading of a parameter which is at the end of a scanline and hence of no practical consequence.

Output strobe operations will now be discussed for memory controller configuration-1 relative to FIG. 7F. Output strobe operations can be invoked during various conditions, such as during the three modes listed and discussed below.

1) The run mode.

2) The computer write mode.

3) The refresh mode.

There is no contention between these three modes because they are mutually exclusive and because the present implementation has a built in guardband (extra time) separating the different modes supra.

During the run mode, the output strobe signal is the complement of the CAS* signal (FIGS. 7A and 7B). Two conditions need be considered.

1) The end of the re-addressing operation (FIG. 7B).

2) The start of the fast page operation (FIG. 7B).

At the end of the re-addressing operation 721J (FIG. 7B), an output strobe is generated to load the pixel accessed with the RAS/CAS re-addressing operation into the output register. This is achieved by gating the proper (F500B*)(F500C) clock phase with the delayed second re-addressing phase (U21B-2). The delayed second re-addressing phase is generated by the flip-flops 760D and 760E delaying the U21B-2 signal to gate 760C (FIG. 7F).

The output strobe is invoked at the end of the re-addressing operation instead of at the beginning of the fast page mode scanout to cover an alternate configuration where multiple re-addressing operations might occur in sequence and hence each re-addressing operation should be self contained. However, such multiple re-addressing operations cannot occur in configuration-1 supra.

It should be noted that the last output strobe (in a fast page mode immediately before a re-addressing operation) is generated even though a simultaneously generated CAS negative edge may be disabled. This is because this last output strobe is used to strobe the pixel accessed with the last CAS negative edge. The output strobes correspond to the prior CAS access, not the simultaneously generated CAS access.

At the start of the fast page internal scanout operation following a re-addressing operation, the first output strobe 721M is disabled because the last accessed pixel (during the re-addressing operation) has already been strobed into the output register. This can be achieved by stretching the gate (detector) signal U14A-6 (FIG. 6C) with flip-flop 760E to detect the first output strobe following a re-addressing operation for disabling of this first output strobe.

The output strobe is enabled for read operations, which occur during the run mode but not during the refresh mode or the write mode. Hence, the output strobe is enabled with the run mode signal U13A-8.

For all read operations except for re-addressing (the fast page scanout), the output strobe is shown as an inverted CAS* signal with an active positive edge at the same time as the CAS* active negative edge. This is because the data out is stable for the prior CAS* operation when the next CAS* operation is initiated with the negative going CAS edge. Hence, the output strobe is offset one CAS* cycle. The output strobe immediately before a RAS* cycle is the output strobe for the immediately prior CAS* cycle.

For the re-addressing read operation (the non-fast page scanout), the output strobe is also shown as an inverted CAS* signal with an active positive edge at the same time as the CAS* active negative edge would occur (F500B* AND F500C). In contrast to the fast page scanout operations, the read re-addressing output strobe and the CAS* signal are shown as being mutually exclusive (not occurring together) 721J and 721M.

Output strobe generation will now be discussed in greater detail with referenced to FIG. 7F.

During the run mode, the output strobe signal can be generated for internal scanout operations (FIG. 7A) and for internal scanout and re-addressing operations (FIG. 7B). The output strobe signal can be generated by properly setting and resetting the output strobe flip-flop 760A. One setting of the output strobe flip-flop is enabled by the RUN signal U13A-8 and by the DOA6 signal, as discussed for clock signals U12A-6 and U12A-8 (FIG. 6C). This insures that output strobes will not be generated at other times, such as during the write mode and the refresh mode. The output strobe signal is controlled to follow the F500B* AND F500C signal condition (FIG. 7A); except that this sequence is interrupted during the RAS re-addressing operation (FIG. 7B); by being clocked low by the F500B AND F500C signal from gate 760C and being clocked high by the F500B* AND F500C signal from gate 760B (in reverse of the CAS logic supra). Because the DRAM output strobe operation is invoked by the positive going edge of the output strobe signal, the set input to the output strobe flip-flop 760A may be considered to be more important than the reset input is to the output strobe flip-flop.

FIG. 7A run mode output strobe signal generation will now be discussed. During the run mode and for the condition that detector signal U14A-6 is high (indicative of internal scanout operations), the output strobe signal follows the (F500B*)(F500C) clock phases. The output strobe flip-flop 760A can be reset by the F500A clock signal clocking the F500B AND F500C signal from gate 760C into the output strobe flip-flop 760A just before the F500B signal is clocked to go low in the middle of the F500C clock pulse period when the F500C clock pulse is high (F500B AND F500C). The output strobe flip-flop can be set by the F500A clock signal clocking the F500B signal from gate 760B into the output strobe flip-flop 760A just before the F500B signal is clocked to go high at the end of the F500C clock pulse period when the F500C clock pulse is high and going low (F500B AND F500C*).

FIG. 7B run mode output strobe signal generation will now be discussed. During the run mode and for the condition that the detector signal U23C-10 is high (indicative of the re-addressing operation) and in addition to the FIG. 7A conditions; two additional conditions need be to be considered.

1) The re-addressing operation (FIG. 7B).

2) The start of the internal scanout operation (FIG. 7B). The output strobe signal can be kept from going low during the re-addressing operation until the end of the detector signal U23C-10 721J by disabling the reset input signal from gate 760C with the U21B-5 signal through an inverter. The output strobe signal can be kept from going low at the start of the internal scanout operation 721M by delaying the U21B-2 signal for two CPD (or CPE or F500C) clock periods through flip-flops 760D and 760E to disable the output strobe flip-flop from being reset with this delayed U21B-2 signal to gate 760C through an inverter.

The configuration-1 controller disclosed herein illustrates the features of the present invention to one skilled in the art. It will be readily recognized that high speed logical circuits may need tuning; such as varying the clock oscillator frequency, adjusting propagation delays, using one-shot circuits and delay lines to generate pulses and to delay pulses, etc. Propagation delays can be adjusted by selecting circuits having the desired speeds, using RC networks to slow down signals, using 74AS04 and 74AS08 circuits in signal lines to increase propagation delays, etc.

Miscellaneous Considerations

Assignment of Memory Addresses

Various arrangements are discussed herein that obtain particular advantages when operations are concentrated within a block of memory and when re-addressing between blocks of memory is reduced. In many applications, proper assignment of memory addresses facilitates such reduction of re-addressing operations. Various methods of assigning addresses in accordance with the present invention will now be discussed.

A software programming package, such as an assembler or compiler, is typically used for assigning of addresses for instructions and for data in a stored program computer system. Hence, such a software programming package can be programmed to assign addresses for instructions and for data in an optimum manner in accordance with the present invention. For example, routines of instructions can be assigned addresses within a block of memory that minimizes re-addressing operations. Iterative routines of instructions can be assigned addresses within a block of memory so that the iterative operations minimize iterating back and forth and back and forth across blocks of memory. Subroutines can be assigned addresses within a block of memory so that the subroutine operations minimize changing blocks of memory. Operands can be stored in the same block of memory with the accessing instructions so that re-addressing is not necessary for operand accessing or storage. Transfer addresses can be assigned to the same block of memory, where for example a transfer instruction or a subroutine call instruction can be placed in the same block of memory as the transfer address or the subroutine address, respectively.

Applications

Introduction

The teachings of the present invention can provide substantial advantages in many different types of systems. These systems include display systems, television systems, database memory systems, array processor systems, signal processor systems, filter systems, stored program computer systems, DMA systems, cache memory systems, artificial intelligence systems, and others. Such systems are disclosed in significant detail in the related patent applications. The display (including television), filter, array, database, DMA, and stored program computer systems are disclosed in further detail below.

The teachings of the present invention can provide substantial advantages in many different types of memories. These memories include image memories, array memories, computer main memories, scratch pad memories, first-in first-out (FIFO) memories, cache memories, pipeline memories, buffer memories, and other memories. Such memories are disclosed in further detail below. Also, various types of memories are disclosed in significant detail in the related patent applications.

The display system includes loading of address registers from a supervisory computer and updating of address registers by adding delta parameters thereto: which is similar to a stored program computer loading an address register with a transfer address and updating of an address register with a program counter; or an array processor, signal processor, or filter processor loading an address register with a start address and updating of an address register with an array address sequencer; or a DMA controller loading an address register with a start address and incrementing of an address register; or a database loading an address register with a start address and incrementing of an address register with a database address sequencer; or a cache memory controller loading an address register with a start address and incrementing of an address register; or an artificial intelligence processor loading an address register with a start address and updating of an address register with an array address sequencer;

The display system includes scanout of display information: which is similar to a stored program computer scanning out information to a hard disk memory; or an array processor, signal processor, or filter processor memory scanning out information to be processed; or an artificial intelligence processor scanning out information to be processed; or a DMA controller memory scanning out information to load into a hard disk memory; or a cache memory controller scanning out information to load into a hard disk memory; or a database memory scanning out information to be relationally processed.

Television Applications

The features of the present invention are also particularly advantageous for television configurations. A television system may involve a frame buffer and a display processor; such as for scan conversion and for transforming, filtering, and otherwise processing a television image. A memory or a hierarchy of memories can be used to implement the television system; such as a frame buffer memory implemented with DRAMs or CCDs for temporarily storing a frame of television image.

The multi-dimensional arrangement discussed in the context of a display processor having an X addressing dimension and a Y addressing dimension is particularly pertinent to a television system.

Particular advantage can be obtained in a television frame buffer by storing image information in a memory map form so that adjacent pixels on the screen are stored in the same memory block to the degree reasonably permitted. Similarly, particular advantage can be obtained in a television frame buffer by storing image information in a memory map form so that pixels in the same scanline on the screen are stored in the same memory block to the degree reasonably permitted.

A television system can be implemented with an image memory for storing image information, an address register for generating image memory addresses, a memory refresh detector for generating a memory refresh detector signal to invoke memory refresh operations, a memory scanout detector for generating a memory scanout detector signal to invoke memory scanout operations, and a memory re-addressing detector for generating a memory re-addressing detector signal to invoke memory re-addressing operations. These features of the present invention may be used separately or in combinations and may be implemented with the various alternate configurations disclosed herein and disclosed in the related patent applications and may be implemented with many other configurations that will now become apparent to one skilled in the art from the teachings herein. For example, a television image memory can be implemented with the memories discussed herein for any one or combination thereof; such as in FIGS. 6E to 6N, FIGS. 4F to 4K, DRAM configuration-1, or others disclosed herein: a television image memory address register can be implemented with the address registers discussed herein for any one or combination thereof; such as in FIGS. 6O to 6R, FIGS. 4B to 4G, DRAM configuration-1, or others disclosed herein: a memory refresh detector can be implemented with the memory refresh detectors discussed herein for any one or combination thereof; such as disclosed in the section herein directed to memory refresh detector circuits (i.e., a sync pulse refresh detector circuit) or others disclosed herein: memory scanout and re-addressing detectors can be implemented with the memory scanout and re-addressing detectors discussed herein for any one or combination thereof; such as disclosed in the section herein directed to memory addressing detector circuits (i.e., an address overflow detector shown, in FIG. 6C or an address comparitor detector shown in FIGS. 4D and 4E) or others disclosed herein. Read operations, write operations, and read-modify-write operations; such as having scanout and re-addressing in accordance with the present invention; are particularly pertinent for a television system. Read operations can be used to scanout image memory or the frame buffer for refreshing the display monitor. Write operations can be used for loading image memory or the frame buffer with a new frame of information. Read-modify-write operations can be used for processing the image in image memory or the frame buffer, such as for filtering the image or otherwise processing the image.

Database Processor Applications

The features of the present invention are also particularly advantageous for database processor configurations. A database processor typically processes information stored in a database memory, such as for relational database operations. A memory or a hierarchy of memories can be used to implement the database memory system; such as a main database memory implemented on a disk memory and a database buffer or cache memory. (i.e., implemented with DRAMs) for temporarily buffering database information accessed from the disk memory, or such as a main database memory implemented with DRAMs, or such as a main database memory implemented with CCDs and a database buffer or cache memory (i.e., implemented with DRAMs) for temporarily buffering database information accessed from the CCD memory.

A relational database can be implemented using the memory of the present invention. One configuration of a relational database includes a relational processor that searches the database for particular information. The relational database system can be implemented with DRAMs. For example, the main database memory can be implemented with DRAMs, a buffer or cache memory can be implemented with DRAMs, and/or other parts of the system can be implemented with DRAMs supra. The relational processor searches the database information to attempt to find a match with the reference information. The searching process involves multitudes of memory accesses and comparisons. The memory accesses typically involve information stored in close proximity, such as related information stored in the same block of memory. Accessing of information stored in the same block can be performed with the scanout operation discussed herein. Accessing of information stored in different blocks can be performed with combinations of the scanout and re-addressing operations discussed herein.

Particular advantage can be obtained in a database memory system by storing database information that is related and is to be accessed substantially together in the same block of memory in order to maximize higher speed scanout operations and to minimize lower speed re-addressing operations.

A database system can be implemented with a database memory for storing database information, an address register for generating database memory addresses, a memory refresh detector for generating a memory refresh detector signal to invoke memory refresh operations, a memory scanout detector for generating a memory scanout detector signal to invoke memory scanout operations, and a memory re-addressing detector for generating a memory re-addressing detector signal to invoke memory re-addressing operations. These features of the present invention may be used separately or in combinations and may be implemented with the various alternate configurations disclosed herein and disclosed in the related patent applications and may be implemented with many other configurations that will now become apparent to one skilled in the art from the teachings herein. For example, a database memory can be implemented with the memories discussed herein for any one or combination thereof; such as in FIGS. 6E to 6N, FIGS. 4F to 4K, DRAM configuration-1, or others disclosed herein: a database memory address register can be implemented with the address registers discussed herein for any one or combination thereof; such as in FIGS. 6O to 6R, FIGS. 4B to 4G, DRAM configuration-1, or others disclosed herein: a memory refresh detector can be implemented with the memory refresh detectors discussed herein for any one or combination thereof; such as disclosed in the section herein directed to memory refresh detector circuits (i.e., a time available refresh detector circuit). or others disclosed herein: memory scanout and re-addressing detectors can be implemented with the memory scanout and re-addressing detectors discussed herein for any one or combination thereof; such as disclosed in the section herein directed to memory addressing detector circuits (i.e., an address overflow detector shown in FIG. 6C or an address comparitor detector shown in FIGS. 4D and 4E) or others disclosed herein. Read operations, write operations, and read-modify-write operations; such as having scanout and re-addressing in accordance with the present invention; are particularly pertinent for a database memory system. Read operations can be used to scanout the database memory for loading a cache memory or a buffer memory or for relational processing. Write operations can be used for writing into a cache memory or a buffer memory or for writing new database information into the database memory. Read-modify-write operations can be used for processing the information in a cache memory, in a buffer memory, or in the database memory; such as for sorting the database information or otherwise processing the database information.

Array Processor Applications

The features of the present invention are also particularly advantageous for array processor configurations. An array processor typically processes arrays of numbers; such as for filter processing disclosed in related U.S. Pat. No. 4,209,843. A memory or a hierarchy of memories can be used to implement the array processor system; such as a main array memory implemented on a disk memory and an array buffer or cache memory (i.e., implemented with DRAMs) for temporarily buffering array information accessed from the disk memory, or such as a main array memory implemented with DRAMs, or such as a main array memory implemented with CCDs and an array buffer or cache memory (i.e., implemented with DRAMs) for temporarily buffering array information accessed from the CCD memory.

The multi-dimensional arrangement discussed in the context of a display processor having an X addressing dimension and a Y addressing dimension is particularly pertinent to a two dimensional array processor for processing a two dimensional array of information. A multi-dimensional arrangement is also applicable to an array processor having a multi-dimensional array of information to be processed. The display processor previously discussed may be considered to be a type of array processor that processes an array of pixels.

An array processor memory can be implemented using the memory features of the present invention. One configuration of an array processing system includes an array processor that processes arrays of numbers stored in a main array memory. The array processor system can be implemented with DRAMs. For example, the main array memory can be implemented with DRAMs, a buffer or cache memory can be implemented with DRAMs, and/or other parts of the system can be implemented with DRAMs supra. The array processor accesses, processes, and restores the array information. The array processing involves multitudes of memory accesses and restores; typically involving information stored in close proximity, such as related information stored in the same block of memory. Accessing of information stored in the same block can be performed with the scanout operation discussed herein. Accessing of information stored in different blocks can be performed with combinations of the scanout and re-addressing operations discussed herein.

Particular advantage can be obtained in an array processor system by storing array information that is related and is to be accessed substantially together in the same block of memory in order to maximize higher speed scanout operations and to minimize lower speed re-addressing operations.

An array system can be implemented with an array memory for storing array information, an address register for generating array memory addresses, a memory refresh detector for generating a memory refresh detector signal to invoke memory refresh operations, a memory scanout detector for generating a memory scanout detector signal to invoke memory scanout operations, and a memory re-addressing detector for generating a memory re-addressing detector signal to invoke memory re-addressing operations., These features of the present invention may be used separately or in combinations and may be implemented with the various alternate configurations disclosed herein and disclosed in the related patent applications and may be implemented with many other configurations that will now become apparent to one skilled in the art from the teachings herein. For example, an array memory can be implemented with the memories discussed herein for any one or combination thereof; such as in FIGS. 6E to 6N, FIGS. 4F to 4K, DRAM configuration-1, or others disclosed herein: an array memory address register can be implemented with the address registers discussed herein for any one or combination thereof; such as in FIGS. 6O to 6R, FIGS. 4B to 4G, DRAM configuration-1, or others disclosed herein: a memory refresh detector can be implemented with the memory refresh detectors discussed herein for any one or combination thereof; such as disclosed in the section herein directed to memory refresh detector circuits (i.e., a time available refresh detector circuit) or others disclosed herein: memory scanout and re-addressing detectors can be implemented with the memory scanout and re-addressing detectors discussed herein for any one or combination thereof; such as disclosed in the section herein directed to memory addressing detector circuits (i.e., an address overflow detector shown in FIG. 6C or an address comparitor detector shown in FIGS. 4D and 4E) or others disclosed herein.

Read operations, write operations, and read-modify-write operations; such as having scanout and re-addressing in accordance with the present invention; are particularly pertinent for array processor system. Read operations can be used to scanout the array memory for loading a cache memory or a buffer memory or for array processing. Write operations can be used for writing into a cache memory or a buffer memory or for writing new array information into the array memory. Read-modify-write operations can be used for processing the array information in a cache memory, in a buffer memory, or in the array memory; such as for array processing of the information or otherwise processing the array information.

Signal Processing Applications

The features of the present invention are also particularly advantageous for signal processing configurations. A signal processor typically processes digitized signals; such as seismic signals discussed in related U.S. Pat. No. 4,209,843. A memory or a hierarchy of memories can be used to implement the signal processing system; such as a main signal processing memory implemented on a disk memory and buffer or cache memory (i.e., implemented with DRAMs) for temporarily buffering signal processing information accessed from the disk memory, or such as a main signal processing memory implemented with DRAMs, or such as a main signal processing memory implemented with CCDs and a signal processing buffer or cache memory (i.e., implemented with DRAMs) for temporarily buffering signal processing information accessed from the CCD memory. Signal processing information can include input signal samples to be processed and output signal samples that have been processed.

The multi-dimensional arrangement discussed in the context of a display processor having an X addressing dimension and a Y addressing dimension is particularly pertinent to a two dimensional signal processor for processing two dimensional information. A multi-dimensional arrangement is .also applicable to a signal processor having multi-dimensional signal processing information to be processed.

A signal processor memory can be implemented using the memory features of the present invention. One configuration of a signal processing system includes a signal processor that processes information stored in a main memory. The signal processing system can be implemented with DRAMs. For example, the main memory can be implemented with DRAMs, a buffer or cache memory can be implemented with DRAMs, and/or other parts of the system can be implemented with DRAMs supra. The signal processor accesses, processes, and restores the signal information. The signal processing involves multitudes of memory accesses and restores; typically involving information stored in close proximity, such as related information stored in the same block of memory. Accessing of signal processing information stored in the same block can be performed with the scanout operation discussed herein. Accessing of signal processing information stored in different blocks can be performed with combinations of the scanout and re-addressing operations discussed herein.

Particular advantage can be obtained in a signal processing system by storing signal processing information that is related and is to be accessed substantially together in the same block of memory in order to maximize higher speed scanout operations and to minimize lower speed re-addressing operations.

A signal processing system can be implemented with a signal sample memory for storing signal samples, an address register for generating signal sample memory addresses, a memory refresh detector for generating a memory refresh detector signal to invoke memory refresh operations, a memory scanout detector for generating a memory scanout detector signal to invoke memory scanout operations, and a memory re-addressing detector for generating a memory re-addressing detector signal to invoke memory re-addressing operations. These features of the present invention may be used separately or in combinations and may be implemented with the various alternate configurations disclosed herein and disclosed in the related patent applications and may be implemented with many other configurations that will now become apparent to one skilled in the art from the teachings herein. For example, a signal sample memory can be implemented with the memories discussed herein for any one or combination thereof; such as in FIGS. 6E to 6N, FIGS. 4F to 4K, DRAM configuration-1, or others disclosed herein: a signal sample memory address register can be implemented with the address registers discussed herein for any one or combination thereof; such as in FIGS. 6O to 6R, FIGS. 4C to 4G, DRAM configuration-1, or others disclosed herein: a memory refresh detector can be implemented with the memory refresh detectors discussed herein for any one or combination thereof; such as disclosed in the section herein directed to memory refresh detector circuits (i.e., a time available refresh detector circuit) or others disclosed herein: memory scanout and re-addressing detectors can be implemented with the memory scanout and re-addressing detectors discussed herein for any one or combination thereof; such as disclosed in the section herein directed to memory addressing detector circuits (i.e., an address overflow detector shown in FIG. 6C or an address comparitor detector shown in FIGS. 4D and 4E) or others disclosed herein.

Read operations, write operations, and read-modify-write operations; such as having scanout and re-addressing in accordance with the present invention; are particularly pertinent for a signal processor system. Read operations can be used to scanout the signal memory for loading a cache memory or a buffer memory or for signal processing. Write operations can be used for writing into a cache memory or a buffer memory or for writing new signal information into the signal memory. Read-modify-write operations can be used for processing the signal information in a cache memory, in a buffer memory, or in the signal memory; such as for signal processing of the information or otherwise processing the signal information.

Filter Processor Applications

The features of the present invention are also particularly advantageous for filter processor configurations. A filter processor typically processes arrays of numbers; such as discussed in related U.S. Pat. No. 4,209,843. A memory or a hierarchy of memories can be used to implement the filter processor system; such as a main filter memory implemented on a disk memory and buffer or cache memory (i.e., implemented with DRAMs) for temporarily buffering filter information accessed from the disk memory, or such as a main filter memory implemented with DRAMs, or such as a main filter memory implemented with CCDs and a filter buffer or cache memory (i.e., implemented with DRAMs) for temporarily buffering filter information accessed from the CCD memory. Filter information can include input signal samples to be filtered, reference signal samples to be used in the filtering, and output signal samples that have been filtered.

The multi-dimensional arrangement discussed in the context of a display processor having an X addressing dimension and a Y addressing dimension is particularly pertinent to a two dimensional filter processor for processing two dimensional information. A multi-dimensional arrangement is also applicable to a filter processor having multi-dimensional filter information to be processed.

A filter processor memory can be implemented using the memory features of the present invention. One configuration of a filter processing system includes a filter processor that processes information to be filtered stored in a main filter memory. The filter processor system can be implemented with DRAMs. For example, the main filter memory can be implemented with DRAMs, a buffer or cache memory can be implemented with DRAMs, and/or other parts of the system can be implemented with DRAMs supra. The filter processor accesses, processes, and restores the filter information. The filter processing involves multitudes of memory accesses and restores; typically involving information stored in close proximity, such as related information stored in the same block of memory. Accessing of filter information stored in the same block can be performed with the scanout operation discussed herein. Accessing of filter information stored in different blocks can be performed with combinations of the scanout and re-addressing operations discussed herein.

Particular advantage can be obtained in a filter processor system by storing filter information that is related and is to be accessed substantially together in the same block of memory in order to maximize higher speed scanout operations and to minimize lower speed re-addressing operations.

A filter processing system can be implemented with a filter sample memory for storing filter samples, an address register for generating filter sample memory addresses, a memory refresh detector for generating a memory refresh detector signal to invoke memory refresh operations, a memory scanout detector for generating a memory scanout detector signal to invoke memory scanout operations, and a memory re-addressing detector for generating a memory re-addressing detector signal to invoke memory re-addressing operations. These features of the present invention may be used separately or in combinations and may be implemented with the various alternate configurations disclosed herein and disclosed in the related patent applications and may be implemented with many other configurations that will now become apparent to one skilled in the art from the teachings herein. For example, a filter sample memory can be implemented with the memories discussed herein for any one or combination thereof; such as in FIGS. 6E to 6N, FIGS. 4F to 4K, DRAM configuration-1, or others disclosed herein: a filter sample memory address register can be implemented with the address registers discussed herein for any one or combination thereof; such as in FIGS. 6O to 6R, FIGS. 4B to 4G, DRAM configuration-1, or others disclosed herein: a memory refresh detector can be implemented with the memory refresh detectors discussed herein for any one or combination thereof; such as disclosed in the section herein directed to memory refresh detector circuits (i.e., a time available refresh detector circuit) or others disclosed herein: memory scanout and re-addressing detectors can be implemented with the memory scanout and re-addressing detectors discussed herein for any one or combination thereof; such as disclosed in the section herein directed to memory addressing detector circuits (i.e., an address overflow detector shown in FIG. 6C or an address comparitor detector shown in FIGS. 4D and 4E) or others disclosed herein.

Read operations, write operations, and read-modify-write operations; such as having scanout and re-addressing in accordance with the present invention; are particularly pertinent for filter processor systems. Read operations can be used to scanout the filter memory for loading a cache memory or a buffer memory or for filter processing. Write operations can be used for writing into a cache memory or a buffer memory or for writing new filter information into the filter memory. Read-modify-write operations can be used for processing the filter information in a cache memory, in a buffer memory, or in the filter memory; such as for filter processing of the information or otherwise processing the filter information.

The memory features of the present invention can be readily practiced with a filter system, such as the filter system of related U.S. Pat. No. 4,209,843. This filter system application is also representative of other applications; such as an array processor, signal processor, DMA processor, and database processor system applications.

A disclosure of filter processor applications in accordance with the present invention will now be discussed with reference to FIG. 6D therein ("therein" meaning in said related U.S. Pat. No. 4,209,843). Z-RAM 614 may be a RAM in accordance with the present invention, such as a Mitsubishi RAM or a Toshiba RAM as discussed herein. Also, P-RAM 625 may be implemented with a ROM in accordance with the present invention or alternately P-RAM 625 may be implemented with a RAM in accordance with the present invention, such as with a Mitsubishi RAM or with a Toshiba RAM as discussed herein. Although the filter processor discussed with reference to said FIG. 6D is shown as a single bit filter processor, alternate multi-bit configurations are also disclosed therein. The number of bits per word, or per sample, or per memory address can be varied from 1-bit to 32-bits or more as disclosed herein.

The arrangement shown in FIG. 6D of said U.S. Pat. No. 4,209,843 will now be compared with reference to FIG. 4B relative to implementation of memory 614. Z-RAM 614 generating output signals ZK in response to address signals K from address generator 619 therein can be implemented as memory 222 generating memory output signals 223 in response to address signals 219 herein. Filter processor including counter 613, multiplier 626, and associated logic therein can be implemented as processor 216 herein. Detector 220 herein can be added to the system of said FIG. 6D therein, such as for detecting a change in the address MSBs from address generator 619 therein and invoking a delay, such as by gating the clock C to C-counter 616.

The arrangement shown in FIG. 6D of said U.S. Pat. No. 4,209,843 will now be compared with reference to FIG. 4B herein relative to implementation of memory 625; which is shown implemented as a ROM and alternately can be implemented as a RAM or other memory. P-ROM 625 generating output signals PJ0 in response to address signals J from address generator 617 therein can be implemented as memory 222 generating memory output signals 223 in response to address signals 219 herein. Filter processor including counter 613, multiplier 626, and associated logic therein can be implemented as processor 216 herein. Detector 220 herein can be added to the system of said FIG. 6D therein, such as for detecting a change in the address MSBs from address generator 617 therein and invoking a delay, such as by gating the clock C to C-counter 616.

The sequential nature of the addressing to memory 614 and memory 625 therein facilitates the scanout and re-addressing features of the present invention. For example, in a single dimensional configuration in accordance with FIG. 4G herein having incremental counter addressing in accordance with FIG. 6D therein; an array of 1024 filter samples, based upon a 10-bit column address, can be processed in the scanout mode of operation before a re-addressing operation need be invoked. Alternately, non-incremental addressing may be implemented. In either incremental or non-incremental addressing configuration; filter processing that does not need to move between different blocks of memory, such as with all data being maintained within one block of memory, has increased performance because of reduced need for re-addressing operations; filter processing that does not often need to move between different blocks of memory, such as with all data being maintained within a few blocks of memory, has slightly lower performance compared to the above example because of a slightly increased need for re-addressing operations; and filter processing that more often needs to move between different blocks of memory, such as with data being distributed over many blocks of memory, has further reduced performance compared to the above examples because of an increased need for re-addressing operations. Consequently, it is desirable to configure the system to maximize scanout operations and to minimize re-addressing operations.

The arrangement shown in FIG. 10E of said U.S. Pat. No. 4,209,843 will now be compared with reference to FIG. 4B herein relative to implementation of memories 1010, 1011, and 1018. Memories 1010, 1011, and 1018 generating output signals 1013, 1012, and 1016 respectively in response to address signals from an address generator therein can be implemented as memory 222 generating memory output signals 223 in response to address signals 219 herein. Filter processor including multiplier 1014 and summer 1017 therein can be implemented as processor 216 herein. Detector 220 herein can be added to the system of said FIG. 10E therein, such as for detecting a change in the address MSBs from the address generator therein and invoking a delay.

The other disclosures in said U.S. Pat. No. 4,209,843 can also be implemented in accordance with the teachings in the present invention.

Artificial Intelligence Processor Applications

The features of the present invention are also particularly advantageous for artificial intelligence processor configurations. An artificial intelligence processor typically processes inferences. A memory or a hierarchy of memories can be used to implement the artificial intelligence processor system; such as a main artificial intelligence memory implemented on a disk memory and buffer or cache memory (i.e., implemented with DRAMs) for temporarily buffering artificial intelligence information accessed from the disk memory, or such as a main artificial intelligence memory implemented with DRAMs, or such as a main artificial intelligence memory implemented with CCDs and a artificial intelligence buffer or cache memory (i.e., implemented with DRAMs) for temporarily buffering artificial intelligence information accessed from the CCD memory. Artificial intelligence information can include inference information to be processed.

An artificial intelligence processor memory can be implemented using the memory features of the present invention. One configuration of a artificial intelligence processing system includes a artificial intelligence processor that processes information stored in a main artificial intelligence memory. The artificial intelligence processor system can be implemented with DRAMs. For example, the main artificial intelligence memory can be implemented with DRAMs, a buffer or cache memory can be implemented with DRAMs, and/or other parts of the system can be implemented with DRAMs supra. The artificial intelligence processor accesses and processes the artificial intelligence information. Accessing of artificial intelligence information stored in the same block can be performed with the scanout operation discussed herein. Accessing of artificial intelligence information stored in different blocks can be performed with combinations of the scanout and re-addressing operations discussed herein.

Particular advantage can be obtained in an artificial intelligence processor system by storing artificial intelligence information that is related and is to be accessed substantially together in the same block of memory in order to maximize higher speed scanout operations and to minimize lower speed re-addressing operations.

An artificial intelligence processing system can be implemented with an artificial intelligence memory for storing artificial intelligence information, an address register for generating artificial intelligence memory addresses, a memory refresh detector for generating a memory refresh detector signal to invoke memory refresh operations, a memory scanout detector for generating a memory scanout detector signal to invoke memory scanout operations, and a memory re-addressing detector for generating a memory re-addressing detector signal to invoke memory re-addressing operations. These features of the present invention may be used separately or in combinations and may be implemented with the various alternate configurations disclosed herein and disclosed in the related patent applications and may be implemented with many other configurations that will now become apparent to one skilled in the art from the teachings herein. For example, an artificial intelligence memory can be implemented with the memories discussed herein for any one or combination thereof; such as in FIGS. 6E to 6N, FIGS. 4F to 4K, DRAM configuration-1, or others disclosed herein: an artificial intelligence memory address register cam be implemented with the address registers discussed herein for any one or combination thereof; such as in FIGS. 6O to 6R, FIGS. 4C to 4G, DRAM configuration-1, or others disclosed herein: a memory refresh detector can be implemented with the memory refresh detectors discussed herein for any one or combination thereof; such as disclosed in the section herein directed to memory refresh detector circuits (i.e., a time available refresh detector circuit) or others disclosed herein: memory scanout and re-addressing detectors can be implemented with the memory scanout and re-addressing detectors discussed herein for any one or combination thereof; such as disclosed in the section herein directed to memory addressing detector circuits (i.e., an address overflow detector shown in FIG. 6C or an address comparitor detector shown in FIGS. 4D and 4E) or others disclosed herein.

Read operations, write operations, and read-modify-write operations; such as having scanout and re-addressing in accordance with the present invention; are particularly pertinent for artificial intelligence processor systems. Read operations can be used to scanout the artificial intelligence memory for loading a cache memory or a buffer memory or for artificial intelligence processing. Write operations can be used for writing into a cache memory or a buffer memory or for writing new artificial intelligence information into the artificial intelligence memory. Read-modify-write operations can be used for processing the artificial intelligence information in a cache memory, in a buffer memory, or in the artificial intelligence memory; such as for artificial intelligence processing of the information or otherwise processing the artificial intelligence information.

The sequential nature of the addressing to memory 614 and memory 625 therein facilitates the scanout and re-addressing features of the present invention. For example, in a single dimensional configuration in accordance with FIG. 4G herein having incremental counter addressing in accordance with FIG. 6D therein; an array of 1024 inference parameters, based upon a 10-bit column address, can be processed in the scanout mode of operation before a re-addressing operation need be invoked. Alternately, non-incremental addressing may be implemented. In either incremental or non-incremental addressing configuration; artificial intelligence processing that does not need to move between different blocks of memory, such as with all data being maintained within one block of memory, has increased performance because of reduced need for re-addressing operations; artificial intelligence processing that does not often need to move between different blocks of memory, such as with all data being maintained within a few blocks of memory, has slightly lower performance compared to the above example because of a slightly increased need for re-addressing operations; and artificial intelligence processing that more often needs to move between different blocks of memory, such as with data being distributed over many blocks of memory, has further reduced performance compared to the above examples because of an increased need for re-addressing operations. Consequently, it is desirable to configure the system to maximize scanout operations and to minimize re-addressing operations.

DMA Applications

The features of the present invention are also particularly advantageous for direct memory access (DMA) configurations; such as appropriate for computer systems and other systems. A DMA processor typically transfers information between a memory and an external device; such as transferring information from an off-line disk memory into a computer main memory and from a computer main memory into an off-line disk memory. Conventional DMA controllers transfer information to and from blocks of adjacent memory locations. Hence, the scanout and re-addressing features of the present invention can be used efficiently. For example, the single dimensional memory architecture discussed herein with reference to FIG. 4G having 10-LSBs for scanout facilitates the transfer of 1024 words at high speed scanout data rates before a single re-addressing operation is invoked. This is such a high scanout duty cycle that the re-addressing operation has negligible effect on performance.

A DMA system can be implemented with a DMA memory for storing information transferred under DMA control, an address register for generating DMA memory addresses, a memory refresh detector for generating a memory refresh detector signal to invoke memory refresh operations, a memory scanout detector for generating a memory scanout detector signal to invoke memory scanout operations, and a memory re-addressing detector for generating a memory re-addressing detector signal to invoke memory re-addressing operations. These features of the present invention may be used separately or in combinations and may be implemented with the various alternate configurations disclosed herein and disclosed in the related patent applications and may be implemented with many other configurations that will now become apparent to one skilled in the art from the teachings herein. For example, a DMA memory can be implemented with the memories discussed herein for any one or combination thereof; such as in FIGS. 6E to 6N, FIGS. 4F to 4K, DRAM configuration-1, or others disclosed herein: a DMA memory address register can be implemented with the address registers discussed herein for any one or combination thereof; such as in FIGS. 6O to 6R, FIGS. 4B to 4G, DRAM configuration-1, or others disclosed herein: a memory refresh detector can be implemented with the memory refresh detectors discussed herein for any one or combination thereof; such as disclosed in the section herein directed to memory refresh detector circuits (i.e., a time available refresh detector circuit) or others disclosed herein: memory scanout and re-addressing detectors can be implemented with the memory scanout and re-addressing detectors discussed herein for any one or combination thereof; such as disclosed in the section herein directed to memory addressing detector circuits (i.e., an address overflow detector shown in FIG. 6C or an address comparitor detector shown in FIGS. 4D and 4E) or others disclosed herein. Read operations, write operations, and read-modify-write operations; such as having scanout and re-addressing in accordance with the present invention; are particularly pertinent for a DMA system. Read operations can be used to scanout the memory, such as for outputting to a hard disk. Write operations can be used for writing into memory, such as for inputting from a hard disk. Read-modify-write operations can be used for processing the information loaded into the memory, such as from a hard disk.

Cache Memory Applications

The features of the present invention are also particularly advantageous for cache memory configurations; such as appropriate for computer systems and other systems. A cache memory processor typically provides a high speed buffer memory inbetween a slower speed memory and a processor. Conventional cache memory controllers transfer information to and from blocks of adjacent memory locations. Hence, the scanout and re-addressing features of the present invention can be used efficiently. For example, the single dimensional memory architecture discussed herein with reference to FIG. 4G having 10-LSBs for scanout facilitates the transfer of 1024 words at high speed scanout data rates before a single re-addressing operation is invoked. This is such a high scanout duty cycle that the re-addressing operation may have negligible effect on performance.

One cache memory configuration can be implemented with a RAM having an address counter for addressing a memory location for read and write operations. A record of information can be loaded into the cache memory from a lower speed memory, such as from a disk memory or from a lower speed RAM. A processor can processor the information stored in cache memory at higher speed to facilitate higher speed processing than possible with the lower speed memory without the cache memory. The record of information can then be unloaded from the cache memory to be stored back into the lower speed memory to free the cache memory for other operations.

Loading and unloading information with cache memory can be implemented as a sequential writing and reading respectively, which facilitates higher speed scanout operations in accordance with the present invention. Some re-addressing operations are invoked, such as resulting from the scanout address crossing a block boundary. However, such re-addressing operations represent a relatively low duty cycle compared to scanout operations.

Processing of information out of cache memory provides advantages similar to the advantages discussed for the array, filter, and signal processors and the stored program computer supra.

The cache memory system can be implemented with a cache memory for storing information, a cache memory address register for generating cache memory addresses, a cache memory refresh detector for generating a cache memory refresh detector signal to invoke cache memory refresh operations, a cache memory scanout detector for generating a cache memory scanout detector signal to invoke cache memory scanout operations, and a cache memory re-addressing detector for generating a cache memory re-addressing detector signal to invoke cache memory re-addressing operations. These features of the present invention may be used separately or in combinations and may be implemented with the various alternate configurations disclosed herein and disclosed in the related patent applications and may be implemented with many other configurations that will now become apparent to one skilled in the art from the teachings herein. For example, a cache memory can be implemented with the memories discussed herein for any one or combination thereof; such as in FIGS. 6E to 6N, FIGS. 4F to 4K, DRAM configuration-1, or others disclosed herein: a cache memory address register can be implemented with the address registers discussed herein for any one or combination thereof; such as in FIGS. 6O to 6R, FIGS. 4B to 4G, DRAM configuration-1, or others disclosed herein: a memory refresh detector can be implemented with the memory refresh detectors discussed herein for any one or combination thereof; such as disclosed in the section herein directed to memory refresh detector circuits (i.e., a time available refresh detector circuit) or others disclosed herein: memory scanout and re-addressing detectors can be implemented with the memory scanout and re-addressing detectors discussed herein for any one or combination thereof; such as disclosed in the section herein directed to memory addressing detector circuits (i.e., an address overflow detector shown in FIG. 6C or an address comparitor detector shown in FIGS. 4D and 4E) or others disclosed herein.

Read operations, write operations, and read-modify-write operations; such as having scanout and re-addressing in accordance with the present invention; are particularly pertinent for a cache memory system. Read operations can be used to scanout the memory, such as for outputting to a hard disk. Write operations can be used for writing into memory, such as for inputting from a hard disk. Read-modify-write operations can be used for processing the information loaded into the memory, such as from a hard disk.

Stored Program Computer Applications

The features of the present invention are also particularly advantageous for stored program computer configurations. A stored program computer is herein intended to include microcomputers and microprocessors, such as the Intel 80286 and 80386 and the Motorola 68000 families; personal computers, such as the IBM PC (PC/XT and PC/AT) and the IBM PS2 personal computer families; a general purpose computer; a micro-programmable computer; a minicomputer; a small scale computer; a large scale computer; and a super computer, such as manufactured by Cray and by Amdahl. A stored program computer typically processes information under control of a stored program, such as discussed in the related patent applications (i.e.; Ser. No. 101,881). A memory or a hierarchy of memories can be used to implement the stored program computer system; such as an off-line or peripheral memory implemented on a disk memory, a main memory (i.e., implemented with DRAMs) for storing a program and for storing information to be processed some or all of which being loaded from the disk memory, or such as a main memory implemented with DRAMs for storing a program and for storing information to be processed, or such as an off-line or peripheral memory implemented with CCDs and a main memory (i.e., implemented with DRAMs) for storing a program and for storing information to be processed some or all of which being loaded from the CCD memory.

A stored program computer memory can be implemented using the memory features of the present invention. One configuration of a stored program computer system includes a stored program computer that processes information stored in a main memory. The main memory can be implemented with DRAMs. For example, the main memory can be implemented with DRAMs, a buffer or cache memory can be implemented with DRAMs, and/or other parts of the system can be implemented with DRAMs supra. The computer accesses, processes, and restores the information. The processing involves multitudes of memory accesses and restores; typically involving instructions stored in close proximity and information stored in close proximity, such as related instructions stored in the same block of memory and such as related information stored in the same block of memory. Accessing of instructions stored in the same block can be performed with the scanout operation discussed herein. Accessing of information stored in the same block can also be performed with the scanout operation discussed herein. Accessing of instructions or information stored in different blocks can be performed with combinations of the scanout and re-addressing operations discussed herein.

Particular advantage can be obtained in a computer system by storing instructions that are related and are to be accessed substantially together in the same block of memory and by storing information that is related and is to be accessed substantially together in the same block of memory in order to maximize higher speed scanout operations and to minimize lower speed re-addressing operations.

In addition to the improved instruction execution time supra, other performance improvements can be obtained in a stored program computer system. For example, many stored program computer systems use off-line disk memory, such as floppy disk memory and hard disk memory, to store information off-line until needed. The information is then loaded from disk memory into the computers main memory for processing. After processing, the information is then unloaded from main memory into the disk memory for storage. Also, during processing, the information is often saved by unloading from main memory into the disk memory for storage. This loading from and unloading to the disk memory is usually a sequential information transfer from disk memory to main memory and to disk memory from main memory respectively. This is partially because the information is store on disk in sequential form, such as in sectors and tracks, implicit in the electro-mechanical nature of a disk memory and partially because information files, such data files and program files, are constructed or assembled in a sequential format.

In view of the above, computer data formats are appropriate for sequential transfers; which can utilize the scanout and re-addressing features of the present invention for performance enhancement. In many applications; operations, such as overlaying from disk memory and saving to disk memory can obtain the full advantage of the scanout and re-addressing feature of the present invention, such as almost four times performance enhancement obtainable from the Toshiba DRAMs supra. This performance enhancement is available for computers that transfer data in various ways, such as under program control and under DMA control. A DMA based computer system should be able to obtain important performance enhancement, such as due to the relatively high performance capability available with DMA data transfers. Program execution for data transfers should be able to obtain significant performance enhancement from the scanout and re-addressing features of the present invention, such as when the program for transferring data under program control is small and iterative. This is because the program may readily fit within a block of memory and hence may be able to operate with mostly scanout operations and with relatively few re-addressing operations.

A stored program computer system can be implemented with a main program memory for storing program instructions, an address register for generating main program memory addresses, a memory refresh detector for generating a memory refresh detector signal to invoke memory refresh operations, a memory scanout detector for generating a memory scanout detector signal to invoke memory scanout operations, and a memory re-addressing detector for generating a memory re-addressing detector signal to invoke memory re-addressing operations. These features of the present invention may be used separately or in combinations and may be implemented with the various alternate configurations disclosed herein and disclosed in the related patent applications and may be implemented with many other configurations that will now become apparent to one skilled in the art from the teachings herein. For example, a main program memory can be implemented with the memories discussed herein for any one or combination thereof; such as in FIGS. 6E to 6N, FIGS. 4F to 4K, DRAM configuration-1, or others disclosed herein: a main program memory address register can be implemented with the address registers discussed herein for any one or combination thereof; such as in FIGS. 6O to 6R, FIGS. 4B to 4G, DRAM configuration-1, or others disclosed herein: a memory refresh detector can be implemented with the memory refresh detectors discussed herein for any one or combination thereof; such as disclosed in the section herein directed to memory refresh detector circuits (i.e., a time available refresh detector circuit) or others disclosed herein: memory scanout and re-addressing detectors can be implemented with the memory scanout and re-addressing detectors discussed herein for any one or combination thereof; such as disclosed in the section herein directed to memory addressing detector circuits (i.e., an address overflow detector shown in FIG. 6C or an address comparitor detector shown in FIGS. 4D and 4E) or others disclosed herein.

Read operations, write operations, and read-modify-write operations; such as having scanout and re-addressing in accordance with the present invention; are particularly pertinent for a computer system. Read operations can be used to scanout the memory, such as for outputting to a peripheral. Write operations can be used for writing into memory, such as for inputting from a peripheral. Read-modify-write operations can be used for processing the information loaded into the memory.

FIFO Memories

A first-in first-out (FIFO) memory can achieve significant advantages by using the features of the present invention.

One FIFO configuration can be implemented with a RAM having an input address counter for addressing a memory location for writing the next input word, having an output address counter for addressing a memory location for accessing the next output word, and control logic for advancing the input address counter and the output address counter in response to writing and reading respectively and for insuring that the address counters do not pass each other for an overflow or an underflow condition.

A FIFO can be implemented as an incremental memory having an incrementally advanced input address counter and having an incrementally advanced output address counter for incrementally advancing the input address and for incrementally advancing output address as words are written and read from the FIFO respectively. Consequently, writing into a FIFO can be implemented within a scanout and .reading from a FIFO can be implemented within a scanout.

If the input address and the output address are within the same block of memory, such as with the output address closely following the input address; then input and output operations can be interleaved without invoking a re-addressing operation. If the input address and the output address are not within the same block of memory, such as with the output address following the input address from a long distance; then interleaving input and output operations invokes a re-addressing operation when changing from an input operation to an output operation invokes a re-addressing operation. However, regardless of whether changes between input and output operations invoke re-addressing operations; many input operations can typically be performed before a re-addressing operation is invoked as a result of the input address crossing a block boundary and many output operations can typically be performed before a re-addressing operation is invoked as a result of the output address crossing a block boundary. However, such re-addressing operations represent a relatively low duty cycle compared to scanout operations.

Multiple Buffer Memories

Multiple buffer memory; such as double, triple, and quadruple buffer memories; can achieve significant advantages by using the features of the present invention. A double buffer memory will be discussed as being illustrative of other multiple buffer memories.

One double buffer memory configuration can be implemented with two relatively independent RAM memories each having an address counter for addressing a memory location for read or write operations. Information in one of the two memories is being processed while information in the other of the two memories is being loaded for subsequent processing or is being unloaded of processed information.

Loading and unloading information with a multiple buffer memory can be implemented as a sequential writing and reading respectively, which facilitates higher speed scanout operations in accordance with the present invention. Some re-addressing operations are invoked, such as resulting from the scanout address crossing a block boundary. However, such re-addressing operations represent a relatively low duty cycle compared to scanout operations.

Processing of information out of a multiple buffer memory provides advantages similar to the advantages discussed for the array, filter, and signal processors and the stored program computer supra.

Pipeline Memories

Pipeline memories can achieve significant advantages by using the features of the present invention.

One pipeline memory configuration can be implemented with two relatively independent RAM memories each having an address counter for addressing a memory location for read or write operations. Information from one of the two memories is processed by a first processor and the first processed information is loaded into the second of the two memories in pipeline form as it is being processed. The first processed information stored in the second of the two memories is concurrently being processed by a second processor in pipeline form.

Loading and unloading information with a multiple buffer memory can be implemented as a sequential writing and reading respectively, which facilitates higher speed scanout operations in accordance with the present invention. Some re-addressing operations are invoked, such as resulting from the scanout address crossing a block boundary. However, such re-addressing operations represent a relatively low duty cycle compared to scanout operations.

Processing of information out of a multiple buffer memory provides advantages similar to the advantages discussed for the array, filter, and signal processors and the stored program computer supra.

PC/XT BIOS Program Application

Stored program computer applications are discussed herein. An application to a BIOS program for a PC/XT computer will now be discussed to illustrate some of the features of the present invention. For example, the PC/XT main memory can be re configured in accordance with the scanout and re-addressing features of the present invention to obtain significant performance enhancement.

The PC/XT BIOS program listing is provided in the IBM Technical Reference manual dated April 1984 at pages 5-24 to 5-105. It is usually assembled for storage in the ROM portion of the PC/XT main memory, but one skilled in the art can readily assemble it for storage in the RAM portion of main memory to facilitate this example.

The PC/XT BIOS code is stored in addresses $F000_H$ to $FFEE_H$ having $0FEE_H$ bytes or $4078_D$ bytes.

$$F000_H \text{ to } FFEE_H = FEE_H = 4078_D$$

Additional bytes of scratchpad memory are used, as defined by the EQU statements in the BIOS program listing.

The PC/XT has a main memory that is organized with 64K DRAMs having 8-bits of RAS address and 8-bits of CAS address, equating to 64K bytes of RAM per bank, and having 10-banks of DRAMs. If the PC/XT main memory was reconfigured in accordance with the present invention, then the 8-bits of CAS address would provide 256-bytes of internal scanout and the 10-banks of DRAMs would provide a 10-times improvement using external scanout, yielding $2560_D$-bytes per block of scanout. This is more than half of the PC/XT BIOS program of $4078_D$ bytes. Hence, if the PC/XT BIOS program were stored in the RAM portion of the PC/XT main memory, the PC/XT BIOS program and the related scratch pad memory can readily fit in two blocks of main memory.

Further performance enhancement can be obtained by improved program partitioning.

In a first partitioning example, the PC/XT BIOS program, as with many programs, can be partitioned into independent routines that have minimal interaction therebetween. The PC/XT BIOS program can be partitioned into a plurality of blocks so that the routines that are stored in different blocks are independent therebetween to minimize interaction between PC/XT BIOS routines stored in different blocks of memory. Such minimal interaction between blocks of memory implies improved performance in accordance with the scanout and re-addressing features of the present invention.

In a second partitioning example, scanout can be increased and re-addressing can be reduced by partitioning the scratchpad memory in the block of memory with the routine by which it is more often utilized. For example, accessing operands from or storing operands to a block of memory different from the block of memory containing the instructions will invoke re-addressing operations but accessing operands from or storing operands to the same block of memory containing the instructions will not invoke re-addressing operations.

In view of the above improvements in the architecture of the PC/XT main memory; the BIOS program should be able to run significantly faster, almost 4-times faster for the above Toshiba DRAM example, then as implemented in the conventional PC/XT computer.

General Considerations

Abbreviations may be used herein, which abbreviations are defined below.

"ns" means nanoseconds.

"us" means microseconds.

"ms" means milliseconds.

An asterisk "*" following a logical symbol or a line over a logical symbol is read as "bar" and means that the logical symbol is in complemented signal form.

Components in the schematic diagrams have been selected For simplicity of discussion. For example, AND gates and OR gates may be used in place of NAND gates and RS flip-flops may be used in place of D flip-flops or JK flip-flops. These schematic diagrams can be changed by one skilled in the logical design art from the teachings herein optimization of propagation delays, use of a different line of integrated circuits, etc.

Well known flip-flops have synchronous inputs that are controlled by the clock and asynchronous inputs that are independent of the clock. The asynchronous inputs typically over-ride the synchronous inputs. For example, flip-flops 756D and F507 (FIGS. 7E and 7H) each has synchronous inputs S and R that are controlled by the clock CK; flip-flop 757D (FIG. 7E) has synchronous input D that is controlled by the clock CK and asynchronous clear input CR that is not controlled by the clock and that over-rides the D synchronous input; and flip-flops F505 and F506 (FIG. 7H) each has synchronous input D that is controlled by the clock CK and asynchronous set input SET* that is not controlled by the clock and that over-rides the D synchronous input.

Disclosure Document

A disclosure document has been filed in the U.S. Patent and Trademark Office on Oct. 17, 1984 Disclosure Document No. 131,747; which is herein incorporated by reference. This disclosure document has copies of many of the documents and specification sheets referenced herein as follows.

1. National Semiconductor specification sheet for the MM5321 synchronization generator.
2. Signetics specification sheet for the 8T95, 96, 97, 98 hex buffers/inverters.
3. National Semiconductor specification sheet for the ADC 0800 A/D converter.
4. Texas Instruments specification sheet for the TNS-4016 RAM.
5. TRW specification sheet for the TDC1016J-8, TDC1016J-9, TDC1016J-10 video D/A converters.
6. Mitsubishi Electric specification sheet for the M58725P, S;P-15, S-15, RAMs.
7. Computer Compatible Joystick Instruction sheet.
8. CompuPro CPU 8085/88 Technical Manual.
9. Viewpoint/3A Plus User's Manual.
10. CompuPro RAM 17 Technical Manual.
11. CompuPro RAM 16 Technical Manual.
12. CompuPro 8080 Multi-User Monitor program listing.
13. CompuPro System Support 1 User Manual.
14. International Instrumentation Incorporated Universal Disk Enclosures manual.
15. Siemens OEM Floppy Disk Drive FDD 100-8 manual.
16. CompuPro Disk 1 User Manual.

Related Documents

Various documents are pertinent hereto and are herein incorporated by reference.

1) 8086 Family User's Manual; October 1979; by Intel Corp.

2) TECHNICAL REFERENCE; September 1985; by IBM Corp.

3) MCS-85 USER'S MANUAL; September 1978; by Intel Corp.

4) MC68020 User's Manual; 1984; by Motorola Inc.

5) 8-BIT MICROPROCESSOR & PERIPHERAL DATA manual; 1983; by Motorola Inc.

6) MOS MEMORY PRODUCTS DATA BOOK; 1986–1987; by Toshiba.

7) Shottky TTL Data Book; 1983; by Motorola Inc.

8) 8086 Family User's Manual; October 1979; by Intel Corp.; particularly at pages 4-10, A-23 to A-25, B-9, B-11, B-69, B-70.

9) TECHNICAL REFERENCE; September 1985; by IBM Corp.; particularly at pages 1-76, 1-82, and at Bibliography-1.

10) MCS-85 USER'S MANUAL; September 1978; by Intel Corp.; particularly at pages 5-2 and 5-6.

11) MC68020 User's Manual; 1984; by Motorola Inc.; particularly at pages 4-3 and 4-5.

12) 8-BIT MICROPROCESSOR & PERIPHERAL DATA manual; 1983; by Motorola Inc.; particularly at page 3-157.

13) MOS MEMORY PRODUCTS DATA BOOK; 1986–1987; Toshiba; particularly at pages 119, 121, 123, 125, 127, and 128.

14) Motorola Shottky TTL Data Book; 1983; particularly at pages 4-59 to 4-62.

15) Intel Memory Design Handbook; 1977.

16) MC68HC11 HCMOS Single-Chip Microcomputer Programmer's Reference Manual; First Edition; particularly at Section 5 therein.

Another disclosure document has been filed in the U.S. Patent and Trademark Office on or about Sep. 19, 1988 No. 210,594; which material has been integrated herein and which disclosure document is herein incorporated by reference.

The prior art is further indicated by the references cited on the List Of Art Cited By Applicant filed herewith as may be predated in view of the effective filing dates of the various disclosures in the present application. The references cited on the List Of Art Cited By Applicant filed herewith are herein incorporated by reference as if fully set forth at length herein.

TABLES

| INPUT LINE (FIG. 4H) | ADDRESS DIMENSIONS ONE | TWO | ADDRESS GROUP |
|---|---|---|---|
| | FIRST FIG. 4H ADDRESS CORRESPONDENCE TABLE | | |
| 400A | A0 | AX0 | INTERNAL SCANOUT |
| 400B | A1 | AX1 | \| |
| 400C | A2 | AX2 | \| |
| 400D | A3 | AX3 | \| |
| 400E | A4 | AX4 | \| |
| 400F | A5 | AY0 | \| |
| 400G | A6 | AY1 | \| |
| 400H | A7 | AY2 | \| |
| 400I | A8 | AY3 | \| |
| 400J | A9 | AY4 | INTERNAL SCANOUT |
| 400V | A10 | AX5 | EXTERNAL SCANOUT |
| 400W | A11 | AY5 | EXTERNAL SCANOUT |
| 400K | A12 | AX6 | RAS RE-ADDRESS |
| 400L | A13 | AX7 | \| |
| 400M | A14 | AX8 | \| |
| 400N | A15 | AX9 | \| |
| 400P | A16 | AX10 | \| |
| 400Q | A17 | AY6 | \| |
| 400R | A18 | AY7 | \| |
| 400S | A19 | AY8 | \| |
| 400T | A20 | AY9 | \| |
| 400U | A21 | AY10 | RAS RE-ADDRESS |
| 400X | A22 | AY11 | EXTERNAL SCANOUT |
| 400Y | | | NOT USED |
| 400Z | | | NOT USED |
| | SECOND FIG. 4H ADDRESS CORRESPONDENCE TABLE | | |
| 400A | A0 | AX0 | INTERNAL SCANOUT |
| 400B | A1 | AX1 | \| |
| 400C | A2 | AX2 | \| |
| 400D | A3 | AX3 | \| |
| 400E | A4 | AX4 | \| |
| 400F | A5 | AY0 | \| |
| 400G | A6 | AY1 | \| |
| 400H | A7 | AY2 | \| |
| 400I | A8 | AY3 | \| |
| 400J | A9 | AY4 | INTERNAL SCANOUT |
| 400V | A10 | AX5 | EXTERNAL SCANOUT |
| 400W | A11 | AY5 | \| |
| 400X | A12 | AX6 | EXTERNAL SCANOUT |

TABLES-continued

| | | | |
|---|---|---|---|
| 400K | A13 | AX7 | RAS RE-ADDRESS |
| 400L | A14 | AX8 | \| |
| 400M | A15 | AX9 | \| |
| 400N | A16 | AX10 | \| |
| 400P | A17 | AY6 | \| |
| 400Q | A18 | AY7 | \| |
| 400R | A19 | AY8 | \| |
| 400S | A20 | AY9 | \| |
| 400T | A21 | AY10 | \| |
| 400U | A22 | AY11 | RAS RE-ADDRESS |
| 400Y | | | NOT USED |
| 400Z | | | NOT USED |

THIRD FIG. 4H ADDRESS CORRESPONDENCE TABLE

| | | | |
|---|---|---|---|
| 400V | A0 | AX0 | EXTERNAL SCANOUT |
| 400W | A2 | AX1 | \| |
| 400X | A2 | AY0 | EXTERNAL SCANOUT |
| 400A | A3 | AX2 | INTERNAL SCANOUT |
| 400B | A4 | AX3 | \| |
| 400C | A5 | AX4 | \| |
| 400D | A6 | AX5 | \| |
| 400E | A7 | AX6 | \| |
| 400F | A8 | AY1 | \| |
| 400G | A9 | AY2 | \| |
| 400H | A10 | AX3 | \| |
| 400I | A11 | AY4 | \| |
| 400J | A12 | AY5 | INTERNAL SCANOUT |
| 400K | A13 | AX7 | RAS RE-ADDRESS |
| 400L | A14 | AX8 | \| |
| 400M | A15 | AX9 | \| |
| 400N | A16 | AX10 | \| |
| 400P | A17 | AY6 | \| |
| 400Q | A18 | AY7 | \| |
| 400R | A19 | AY8 | \| |
| 400S | A20 | AY9 | \| |
| 400T | A21 | AY10 | \| |
| 400U | A22 | AY11 | RAS RE-ADDRESS |
| 400Y | | | NOT USED |
| 400Z | | | NOT USED |

FORTH FIG. 4H ADDRESS CORRESPONDENCE TABLE

| | | | |
|---|---|---|---|
| 400A | A0 | AX0 | INTERNAL SCANOUT |
| 400B | A1 | AX1 | INTERNAL SCANOUT |
| 400V | A2 | AX2 | EXTERNAL SCANOUT |
| 400C | A3 | AX3 | INTERNAL SCANOUT |
| 400W | A4 | AX4 | EXTERNAL SCANOUT |
| 400D | A5 | AY0 | INTERNAL SCANOUT |
| 400E | A6 | AY1 | INTERNAL SCANOUT |
| 400X | A7 | AY2 | EXTERNAL SCANOUT |
| 400F | A8 | AY3 | INTERNAL SCANOUT |
| 400G | A9 | AY4 | INTERNAL SCANOUT |
| 400H | A10 | AX5 | \| |
| 400I | A11 | AY5 | \| |
| 400J | A12 | AX6 | INTERNAL SCANOUT |
| 400K | A13 | AX7 | RAS RE-ADDRESS |
| 400L | A14 | AX8 | \| |
| 400M | A15 | AX9 | \| |
| 400N | A16 | AX10 | \| |
| 400P | A17 | AY6 | \| |
| 400Q | A18 | AY7 | \| |
| 400R | A19 | AY8 | \| |
| 400S | A20 | AY9 | \| |
| 400T | A21 | AY10 | \| |
| 400U | A22 | AY11 | RAS RE-ADDRESS |
| 400Y | | | NOT USED |
| 400Z | | | NOT USED |

FIFTH FIG. 4H ADDRESS CORRESPONDENCE TABLE

| | | | |
|---|---|---|---|
| 400A | A0 | AX0 | INTERNAL SCANOUT |
| 400K | A1 | AX1 | RAS RE-ADDRESS |
| 400V | A12 | AX6 | EXTERNAL SCANOUT |
| 400B | A3 | AX3 | INTERNAL SCANOUT |
| 400W | A4 | AX4 | EXTERNAL SCANOUT |
| 400C | A5 | AY0 | INTERNAL SCANOUT |
| 400L | A6 | AY1 | RAS RE-ADDRESS |
| 400X | A9 | AY4 | EXTERNAL SCANOUT |
| 400D | A8 | AY3 | INTERNAL SCANOUT |
| 400E | A7 | AY2 | INTERNAL SCANOUT |
| 400M | A10 | AX5 | RAS RE-ADDRESS |

TABLES-continued

| | | | |
|---|---|---|---|
| 400F | A11 | AY5 | INTERNAL SCANOUT |
| 400G | A2 | AX2 | INTERNAL SCANOUT |
| 400H | A13 | AX7 | INTERNAL SCANOUT |
| 400I | A14 | AX8 | INTERNAL SCANOUT |
| 400J | A15 | AX9 | INTERNAL SCANOUT |
| 400N | A16 | AX10 | RAS RE-ADDRESS |
| 400P | A17 | AY6 | \| |
| 400Q | A18 | AY7 | \| |
| 400R | A19 | AY8 | \| |
| 400S | A20 | AY9 | \| |
| 400T | A21 | AY10 | \| |
| 400U | A22 | AY11 | RAS RE-ADDRESS |
| 400Y | | | NOT USED |
| 400Z | | | NOT USED |

SIXTH FIG. 4H ADDRESS CORRESPONDENCE TABLE

| | | | |
|---|---|---|---|
| 400V | A2 | AY0* | EXTERNAL SCANOUT |
| 400W | A1* | AX1* | \| |
| 400X | A0 | AX0* | EXTERNAL SCANOUT |
| 400A | A10* | AY5* | INTERNAL SCANOUT |
| 400B | A4 | AX6* | \| |
| 400C | A12 | AX3* | \| |
| 400D | A5 | AY2 | \| |
| 400E | A3* | AX2* | \| |
| 400F | A9 | AY1 | \| |
| 400G | A6* | AX5 | \| |
| 400H | A8* | AX4* | \| |
| 400I | A11 | AY4 | \| |
| 400J | A7 | AY3* | INTERNAL SCANOUT |
| 400K | A20 | AY8* | RAS RE-ADDRESS |
| 400L | A15 | AX8 | \| |
| 400M | A19 | AY7* | \| |
| 400N | A14 | AX9 | \| |
| 400P | A22 | AX7 | \| |
| 400Q | A18* | AY6* | \| |
| 400R | A13 | AY10 | \| |
| 400S | A21 | AX10* | \| |
| 400T | A16 | AY9 | \| |
| 400U | A17 | AY11 | RAS RE-ADDRESS |
| 400Y | | | NOT USED |
| 400Z | | | NOT USED |

SEVENTH FIG. 4H ADDRESS CORRESPONDENCE TABLE

| | | | |
|---|---|---|---|
| 400A | A0 | AX0 | INTERNAL SCANOUT |
| 400B | A1 | AX1 | \| |
| 400C | A2 | AX2 | \| |
| 400D | A3 | AX3 | \| |
| 400E | A4 | AX4 | \| |
| 400F | A5 | AX5 | \| |
| 400G | A6 | AX6 | \| |
| 400H | A7 | AX7 | \| |
| 400I | A8 | AY0 | \| |
| 400J | A9 | AY1 | INTERNAL SACNOUT |
| 400V | A10 | AX8 | EXTERNAL SCANOUT |
| 400W | A11 | AX9 | \| |
| 400X | A12 | AY2 | EXTERNAL SCANOUT |
| 400K | A13 | AX10 | RAS RE-ADDRESS |
| R00L | A14 | AY3 | \| |
| 400M | A15 | AY4 | \| |
| 400N | A16 | AY5 | \| |
| 400P | A17 | AY6 | \| |
| 400Q | A18 | AY7 | \| |
| 400R | A19 | AY8 | \| |
| 400S | A20 | AY9 | \| |
| 400T | A21 | AY10 | \| |
| 400U | A22 | AY11 | RAS RE-ADDRESS |
| 400Y | | | NOT USED |
| 400Z | | | NOT USED |

| INPUT LINE (FIG. 4I) | ADDRESS DIMENSIONS ONE | TWO | ADDRESS GROUP |
|---|---|---|---|

FIG. 4I ADDRESS CORRESPONDENCE TABLE

| | | | |
|---|---|---|---|
| 400A | A0 | AX0 | INTERNAL SCANOUT |
| 400B | A1 | AX1 | \| |
| 400C | A2 | AX2 | \| |

TABLES-continued

| | | | |
|---|---|---|---|
| 400D | A3 | AX3 | \| |
| 400E | A4 | AX4 | \| |
| 400F | A5 | AY0 | \| |
| 400G | A6 | AY1 | \| |
| 400H | A7 | AY2 | \| |
| 400I | A8 | AY3 | \| |
| 400J | A9 | AY4 | INTERNAL SCANOUT |
| 400V | A10 | AX5 | EXTERNAL SCANOUT |
| 400W | A11 | AX6 | \| |
| 400X | A12 | AX7 | \| |
| 400Y | A13 | AX8 | \| |
| 400Z | A14 | AX9 | \| |
| 400AA | A15 | AY5 | \| |
| 400AB | A16 | AY6 | \| |
| 400AC | A17 | AY7 | \| |
| 400AD | A18 | AY8 | \| |
| 400AE | A19 | AY9 | EXTERNAL SCANOUT |
| 400K | A20 | AX10 | RAS RE-ADDRESS |
| 400L | A21 | AX11 | \| |
| 400M | A22 | AX12 | \| |
| 400N | A23 | AX13 | \| |
| 400P | A24 | AX14 | \| |
| 400Q | A25 | AY10 | \| |
| 400R | A26 | AY11 | \| |
| 400S | A27 | AY12 | \| |
| 400T | A28 | AY13 | \| |
| 400U | A29 | AY14 | RAS RE-ADDRESS |

FIG. 4J ADDRESS CORRESPONDENCE TABLE

| INPUT LINE (FIG. 4J) | ADDRESS DIMENSIONS ONE | ADDRESS DIMENSIONS TWO | ADDRESS GROUP |
|---|---|---|---|
| 401A | A0 | AX0 | INTERNAL SCANOUT |
| 401B | A1 | AX1 | \| |
| 401C | A2 | AX2 | \| |
| 401D | A3 | AX3 | \| |
| 401E | A4 | AX4 | \| |
| 401F | A5 | AY0 | \| |
| 401G | A6 | AY1 | \| |
| 401H | A7 | AY2 | \| |
| 401I | A8 | AY3 | INTERNAL SCANOUT |
| 401V | A9 | AY4 | EXTERNAL SCANOUT |
| 401W | A10 | AY5 | \| |
| 401X | A11 | AY6 | \| |
| 401Y | A12 | AX5 | \| |
| 401Z | A13 | AX6 | EXTERNAL SCANOUT |
| 401L | A14 | AX7 | RAS RE-ADDRESS |
| 401M | A15 | AX8 | \| |
| 401N | A16 | AX9 | \| |
| 401P | A17 | AX10 | \| |
| 401Q | A18 | AX11 | \| |
| 401R | A19 | AY7 | \| |
| 401S | A20 | AY8 | \| |
| 401T | A21 | AY9 | \| |
| 401U | A22 | AY10 | RAS RE-ADDRESS |
| 401J | | | NOT USED |
| 401K | | | NOT USED |

VIDEO DAC CONNECTION TABLE

| | | |
|---|---|---|
| 1 | NC | NO CONNECTION |
| 2 | VEE | −5VDC |
| 3 | COMP | 6.8 MICROFARAD CAPACITOR TO −5 VDC |
| 4 | REF | −1V |
| 5 | AGND | GROUND |
| 6 | AGND | GROUND |
| 7 | OUT | VIDEO OUTPUT TO BUFFER AMPLIFIER |
| 8 | GND | GROUND |
| 9 | VCC | +5VDC |
| 10 | DGND | GROUND |
| 11 | NDIS | BLANKING SIGNAL |
| 12 | $\overline{CLK}$ | CLOCK |
| 13 | $\overline{CLK}$ | |
| 14 | $\overline{NDIS}$ | |
| 15 | $\overline{DI}$ | MOST SIGNIFICANT BIT, COMPLEMENT |
| 16 | D1 | MOST SIGNIFICANT BIT, UNCOMPLEMENT |

TABLES-continued

| | | |
|---|---|---|
| 17 | N2C | +5VDC |
| 18 | D2 | DATA BIT 2, COMPLEMENT |
| 19 | D2 | DATA BIT 2, UNCOMPLEMENT |
| 20 | NFH | GROUND |
| 21 | NFL | GROUND |
| 22 | D3 | DATA BIT 3, COMPLEMENT - GROUND |
| 23 | D3 | DATA BIT 3, UNCOMPLEMENT - GROUND |
| 24 | D4 | DATA BIT 4, COMPLEMENT - GROUND |
| 25 | D4 | DATA BIT 4, UNCOMPLEMENT - GROUND |
| 26 | D5 | DATA BIT 5, COMPLEMENT - GROUND |
| 27 | D5 | DATA BIT 5, UNCOMPLEMENT - RED, BLUE GROUND; GREEN SIGNAL |
| 28 | D6 | DATA BIT 6, COMPLEMENT - GROUND |
| 29 | D6 | DATA BIT 6, UNCOMPLEMENT - RED, BLUE, GREEN SIGNAL |
| 30 | D7 | DATA BIT 7, COMPLEMENT - GROUND |
| 31 | D7 | DATA BIT 7, UNCOMPLEMENT - GROUND |
| 32 | D8 | DATA BIT 8, COMPLEMENT - GROUND |
| 33 | D8 | DATA BIT 8, UNCOMPLEMENT - GROUND |
| 34 | D9 | DATA BIT 9, COMPLEMENT - GROUND |
| 35 | D9 | DATA BIT 9, UNCOMPLEMENT |
| 36 | D10 | LEAST SIGNIFICANT BIT, COMPLEMENT |
| 37 | D10 | LEAST SIGNIFICANT BIT, UNCOMPLEMENT |
| 38 | NC | NO CONNECTION |
| 39 | NC | NO CONNECTION |
| 40 | NC | NO CONNECTION |

COMPUTER PORT TABLE

| BIT | NAME | PORT-A FUNCTION | CONTROL PORT NOTES |
|---|---|---|---|
| 0 | DOA0 | TEST PULSE-1 | |
| 1 | DOA1 | JOYSTICK SELECT-1 | |
| 2 | DOA2 | JOYSTICK SELECT-0 | |
| 3 | DOA3 | | |
| 4 | DOA4 | UNBLANK | HIGH IS UNBLANKED, LOW IS BLANKED |
| 5 | DOA5 | SEQUENTIAL-LOAD | SEQUENTIAL LOAD OF IMAGE MEMORY |
| 6 | DOA6 | LOAD-BAR/RUN | BRACKETED BY FRAME BLANKING CFS |
| 7 | DOA7 | DATA STROBE | BRACKETED BY PBO AND PCO |
| 0 | DIA0 | FRAME SYNC | VERTICAL FIELD BLANKING PULSE |
| 1 | DIA1 | | |
| 2 | DIA2 | LINE SYNC | HORIZONTAL LINE BLANKING PULSE |
| 3 | DIA3 | | |
| 4 | DIA4 | FRAME-1 | |
| 5 | DIA5 | | |
| 6 | DIA6 | | |
| 7 | DIA7 | | |

SEQUENTIAL CONTROL OF IMAGE LOADING (1) RESET DOA5
(2) LOAD X+Y START ADDRESSES, (PIXEL ADDRESS TIMES 8)
(3) LOAD SLOPES TIMES 256
(4) SET DOA5
(5) GENERATE A SEQUENCE OF STROBED DATA OUTPUTS ALONG LINE
(6) ADDRESS COUNTER WILL AUTOMATICALLY ADVANCE
(7) DOA5 must be set before storbing data into memory independent of wheter one or a sequence of strobes is to be generated.

| BIT | NAME | PORT-B FUCNTION | ADDRESS/DATA PORT NOTES |
|---|---|---|---|
| 0 | DOB0 | LSB | |
| 1 | DOB1 | ! | |
| 2 | DOB2 | ! | |
| 3 | DOB3 | ! | |
| 4 | DOB4 | ! | |
| 5 | DOB5 | ! | |
| 6 | DOB6 | ! | |
| 7 | DOB7 | MSB | |
| 0 | DIB0 | LSB | |
| 1 | DIB1 | ! | |
| 2 | DIB2 | ! | |
| 3 | DIB3 | ! | |
| 4 | DIB4 | ! | |
| 5 | DIB5 | ! | |
| 6 | DIB6 | ! | |
| 7 | DIB7 | MSB | |

TABLES-continued

| BIT | NAME | PORT-C FUNCTION | DESTINATION SELECT PORT NOTES |
|---|---|---|---|
| 0 | DOC0 | LSB | |
| 1 | DOC1 | ! | |
| 2 | DOC2 | ! | |
| 3 | DOC3 | ! | |
| 4 | DOC4 | ! | |
| 5 | DOC5 | ! | |
| 6 | DOC6 | ! | |
| 7 | DOC7 | MSB | |
| 0 | DIC0 | LSB | |
| 1 | DIC1 | ! | |
| 2 | DIC2 | ! | |
| 3 | DIC3 | ! | |
| 4 | DIC4 | ! | |
| 5 | DIC5 | ! | |
| 6 | DIC6 | ! | |
| 7 | DIC7 | MSB | |

DESTINATION SELECT ASSIGNMENTS

| P | B7 | B6 | B5 | B4 | B3 | B2 | B1 | B0 | REGISTER | B7 | B6 | B5 | B4 | B3 | B2 | B1 | B0 |
|---|---|---|---|---|---|---|---|---|---|---|---|---|---|---|---|---|---|
| 0 | 0 | 0 | 0 | 0 | 0 | 0 | 0 | 0 | | | | | | | | | |
| 1 | 0 | 0 | 0 | 0 | 0 | 0 | 0 | 1 | | | | | | | | | |
| 2 | 0 | 0 | 0 | 0 | 0 | 0 | 1 | 0 | | | | | | | | | |
| | . | | | | | | | | | | | | | | | | |
| | . | | | | | | | | | | | | | | | | |
| | . | | | | | | | | | | | | | | | | |
| | v | | | | | | | | | | | | | | | | |
| 127 | 0 | 0 | 0 | 0 | 1 | 1 | 1 | 1 | | | | | | | | | |
| 128 | 0 | 0 | 0 | 1 | 0 | 0 | 0 | 0 | | | | | | | | | |
| 129 | 0 | 0 | 0 | 1 | 0 | 0 | 0 | 1 | | | | | | | | | |
| 130 | 0 | 0 | 0 | 1 | 0 | 0 | 1 | 0 | | | | | | | | | |
| | . | | | | | | | | | | | | | | | | |
| | . | | | | | | | | | | | | | | | | |
| | . | | | | | | | | | | | | | | | | |
| | v | | | | | | | | | | | | | | | | |
| 240 | 1 | 1 | 1 | 1 | 0 | 0 | 0 | 0 | XR-DELTA LSH | 0 | 0 | A5 | A4 | A3. | A2 | A1 | A0 |
| 241 | 1 | 1 | 1 | 1 | 0 | 0 | 0 | 1 | YR-DELTA LSH | 0 | 0 | A5 | A4 | A3. | A2 | A1 | A0 |
| 242 | 1 | 1 | 1 | 1 | 0 | 0 | 1 | 0 | XP-DELTA MSH | 0 | 0 | A5 | A4 | A3. | A2 | A1 | A0 |
| 243 | 1 | 1 | 1 | 1 | 0 | 0 | 1 | 1 | XP-DELTA LSH | 0 | 0 | A5 | A4 | A3. | A2 | A1 | A0 |
| 244 | 1 | 1 | 1 | 1 | 0 | 1 | 0 | 0 | YP-DELTA LSH | 0 | 0 | A5 | A4 | A3. | A2 | A1 | A0 |
| 245 | 1 | 1 | 1 | 1 | 0 | 1 | 0 | 1 | YP-DELTA MSH | 0 | 0 | A5 | A4 | A3. | A2 | A1 | A0 |
| 246 | 1 | 1 | 1 | 1 | 0 | 1 | 1 | 0 | XR-ADDRESS MSH | 0 | 0 | A11 | A10 | A9 | A8 | A7 | A6 |
| 247 | 1 | 1 | 1 | 1 | 0 | 1 | 1 | 1 | XR-ADDRESS LSH | 0 | 0 | A5 | A4 | A3. | A2 | A1 | A0 |
| 248 | 1 | 1 | 1 | 1 | 1 | 0 | 0 | 0 | XR-DELTA MSH | 0 | 0 | A5 | A4 | A3. | A2 | A1 | A0 |
| 249 | 1 | 1 | 1 | 1 | 1 | 0 | 0 | 1 | YR-ADDRESS MSH | 0 | 0 | A11 | A10 | A9 | A8 | A7 | A6 |
| 250 | 1 | 1 | 1 | 1 | 1 | 0 | 1 | 0 | YR-ADDRESS MSH | 0 | 0 | A5 | A4 | A3. | A2 | A1 | A0 |
| 251 | 1 | 1 | 1 | 1 | 1 | 0 | 1 | 1 | YR-DELTA MSH | 0 | 0 | A5 | A4 | A3. | A2 | A1 | A0 |
| 252 | 1 | 1 | 1 | 1 | 1 | 1 | 0 | 0 | DATA | D7 | D6 | D5 | D4 | D3 | D2 | D1 | D0 |
| 253 | 1 | 1 | 1 | 1 | 1 | 1 | 0 | 1 | WEIGHT, LS BYTE (W2) | W7 | W6 | W5 | W4 | W3 | W2 | W1 | W0 |
| 254 | 1 | 1 | 1 | 1 | 1 | 1 | 1 | 0 | WEIGHT, MS NIBBLE(W3) | 0 | 0 | 0 | 0 | W11 | W10 | W9 | W8 |
| 255 | 1 | 1 | 1 | 1 | 1 | 1 | 1 | 1 | SPARE | | | | | | | | |

NOTES

1. Frame sync and CP-bar must be synchronized
2. Gated clock.
3. First line sync per frame is under the frame sync envelope. Therefore, U20D-1 generates second line sync as first pulse.
4. First line sync under frame sync envelope loads pixel registers.

CXPSM XP-DELTA MSB CLOCK
CXPSL XP-DELTA LSB CLOCK
CYPSM YP-DELTA MSB CLOCK
CYPSL XP-DELTA LSB CLOCK
CXRSM XR-DELTA MSB CLOCK
CXRSL XR-DELTA LSB CLOCK
CYRSM YR-DELTA MSB CLOCK
CYRSL YR-DELTA LSB CLOCK
CD DATA STROBE
CXRM XR-ADDRESS MSH CLOCK
CXRL XR-ADDRESS LSH CLOCK
CXPM XP-ADDRESS MSH CLOCK
CXPL XP-ADDRESS LSH CLOCK
CYRM YR-ADDRESS MSH CLOCK

TABLES-continued

| | |
|---|---|
| CYRL | YR-ADDRESS LSH CLOCK |
| CYPM | YP-ADDRESS MSH CLOCK |
| CYPL | YP-ADDRESS LSH CLOCK |

CABLE CONNECTION TABLE

| PIN | SIGNAL | SIGNAL DESCRIPTION | SOURCE | DESTINATION |
|---|---|---|---|---|
| | | CABLE-I, BM1,2/BL1 (C1) | | |
| 1 | GROUND | GROUND | | |
| 2 | YA0 | MEMORY ADDRESS, BIT-Y0 | BL1-U9E-10 | BM1,2-U19B-1 |
| 3 | GROUND | GROUND | | |
| 4 | YA1 | MEMORY ADDRESS, BIT-Y1 | BL1-U9E-12 | BM1,2-U19B-2 |
| 5 | GROUND | GROUND | | |
| 6 | YA2 | MEMORY ADDRESS, BIT-Y2 | BL1-U9E-15 | BM1,2-U19B-3 |
| 7 | GROUND | GROUND | | |
| 8 | YA3 | MEMORY ADDRESS, BIT-Y3 | BL1-U8E-2 | BM1,2-U19A-2 |
| 9 | GROUND | GROUND | | |
| 10 | YA4 | MEMORY ADDRESS, BIT-Y4 | BL1-U8E-5 | BM1,2-U19A-4 |
| 11 | GROUND | GROUND | | |
| 12 | YA5 | MEMORY ADDRESS, BIT-Y5 | BL1-U8E-7 | BM1,2-U19A-6 |
| 13 | GROUND | GROUND | | |
| 14 | YA6 | MEMORY ADDRESS, BIT-Y6 | BL1-U8E-10 | BM1,2-U19A-10 |
| 15 | GROUND | GROUND | | |
| 16 | YA7 | MEMORY ADDRESS, BIT-Y7 | BL1-U8E-12 | BM1,2-U19A-12 |
| 17 | GROUND | GROUND | | |
| 18 | YA8 | MEMORY ADDRESS, BIT-Y8 | BL1-U8E-15 | BM1,2-U19A-14 |
| 19 | GROUND | GROUND | | |
| 20 | XA0 | MEMORY ADDRESS, BIT-X0 | BL1-U9D-10 | BM1,2-U19C-1 |
| 21 | GROUND | GROUND | | |
| 22 | XA1 | MEMORY ADDRESS, BIT-X1 | BL1-U9D-12 | BM1,2-U19C-2 |
| 23 | GROUND | GROUND | | |
| 24 | XA2 | MEMORY ADDRESS, BIT-X2 | BL1-U9D-15 | BM1,2-U19C-3 |
| 25 | GROUND | GROUND | | |
| 26 | XA3 | EMMORY ADDRESS, BIT-X3 (BM2) | BL1-U8D-2 | BM1,2-U19B-6 |
| 27 | GROUND | GROUND | | |
| 28 | XA3-BAR | MEMORY ADDRESS, BIT-X3-BAR (BM1) | BL1-U18D-4 | BM1,2-U19B-6 |
| 29 | GROUND | GROUND | | |
| 30 | XA4 | MEMORY ADDRESS, BIT-X4 | BL1-U8D-5 | BM1,2-U19D-4 |
| 31 | GROUND | GROUND | | |
| 32 | XA5 | MEMORY ADDRESS, BIT-X5 | BL1-U8D-7 | BM1,2-U19D-6 |
| 33 | GROUND | GROUND | | |
| 34 | XA6 | MEMORY ADDRESS, BIT-X6 | BL1-U8D-10 | BM1,2-U19D-10 |
| 35 | GROUND | GROUND | | |
| 36 | XA7 | MEMORY ADDRESS, BIT-X7 | BL1-U8D-12 | BM1,2-U19D-12 |
| 37 | GROUND | GROUND | | |
| 38 | XA8 | MEMORY ADDRESS, BIT-X8 | BL1-U8D-15 | BM1,2-U19D-14 |
| 39 | GROUND | GROUND | | |
| 40 | W1-BAR | MEMORY READ/WRITE (LOW => WRITE) | BL1-U22C-11 | BM1,2-U19E-4 |
| 41 | GROUND | GROUND | | |
| 42 | | | | |
| 43 | GROUND | GROUND | | |
| 44 | | | | |
| 45 | GROUND | GROUND | | |
| 46 | | | | |
| 47 | GROUND | GROUND | | |
| 48 | | | | |
| 49 | GROUND | GROUND | | |
| 50 | | | | |
| | | CABLE II BM1,2/BL1/BB1 (C2) | | |
| 1 | GROUND | GROUND | | |
| 2 | MI1 | MEMORY DATA INPUT, BIT-0 (PB0) | BL1-C6-9 | BM1,2-U17A,B,C,D-4 |
| 3 | GROUND | GROUND | | |
| 4 | MI1 | MEMORY DATA INPUT, BIT-1 (PB1) | BL1-C6-22 | BM1,2-U17A,B,C,D-7 |
| 5 | GROUND | GROUND | | |
| 6 | MI2 | MEMORY DATA INPUT, BIT-2 (PB2) | BL1-C6-10 | BM1,2-U17A,B,C,D-9 |
| 7 | GROUND | GROUND | | |
| 8 | MI3 | MEMORY DATA INPUT, BIT-3 (PB3) | BL1-C6-23 | BM1,2-U17A,B,C,D-12 |
| 9 | GROUND | GROUND | | |
| 10 | MI4 | MEMORY DATA INPUT, BIT-4 (PB4) | BL1-C6-11 | BM1,2-U18A,B,C,D-4 |
| 11 | GROUND | GROUND | | |
| 12 | MI5 | MEMORY DATA INPUT, BIT-5 (PB5) | BL1-C6-24 | BM1,2-U18A,B,C,D-7 |
| 13 | GROUND | GROUND | | |
| 14 | MI6 | MEMORY DATA INPUT, BIT-6 (PB6) | BL1-C6-12 | BM1,2-U18A,B,C,D-9 |
| 15 | GROUND | GROUND | | |
| 16 | MI7 | MEMORY DATA INPUT, BIT-7 (PB7) | BL1-C6-25 | BM1,2-U18A,B,C,D,-12 |
| 17 | GROUND | GROUND | | |

TABLES-continued

| | | | | |
|---|---|---|---|---|
| 18 | MO0 | MEMORY DATA OUTPUT, BIT-0 (GREEN) | BM1,2-U17A,B,C,D-2 | BB1-U...;C4-22 |
| 19 | GROUND | GROUND | | |
| 20 | MO1 | MEMORY DATA OUTPUT, BIT-1 (GREEN) | BM1,2-U17A,B,C,D-5 | BB1-U...;C4-24 |
| 21 | GROUND | GROUND | | |
| 22 | MO2 | MEMORY DATA OUTPUT, BIT-2 (GREEN) | BM1,2-U17A,B,C,D-11 | BB1-U...;C4-26 |
| 23 | GROUND | GROUND | | |
| 24 | MO3 | MEMORY DATA OUTPUT, BIT-3 (RED) | BM1,2-U17A,B,C,D-14 | BB1-U...;C4-28 |
| 25 | GROUND | GROUND | | |
| 26 | MO4 | MEMORY DATA OUTPUT, BIT-4 (RED) | BM1,2-U18A,B,C,D-2 | BB1 ;C4-30 |
| 27 | GROUND | GROUND | | |
| 28 | MO5 | MEMORY DATA OUTPUT, BIT-5 (BLUE) | BM1,2-U17A,B,C,D-5 | BB1 ;C4-32 |
| 29 | GROUND | GROUND | | |
| 30 | MO6 | MEMORY DATA OUTPUT, BIT-6 (BLUE) | BM1,2-U18A,B,C,D-11 | BB1 ;C4-34 |
| 31 | GROUND | GROUND | | |
| 32 | MO7 | MEMORY DATA OUTPUT, BIT-7 (SPARE) | BM1,2-U18A,B,C,D-14 | BB1 ;C4-36 |
| 33 | GROUND | GROUND | | |
| 34 | DIEN-BAR | MEMORY READ/WRITE BM1,2-U17A,B,C,D-15, U19C-6, BB1-234C-1,15, BB1-U23D-1,15 | BL1-U21E-6 | BM1,2-U18A,B,C,D-15 |
| 35 | GROUND | GROUND | | |
| 36 | | | | |
| 37 | GROUND | GROUND | | |
| 38 | | | | |
| 39 | GROUND | GROUND | | |
| 40 | | | | |
| 41 | GROUND | GROUND | | |
| 42 | | | | |
| 43 | GROUND | GROUND | | |
| 44 | | | | |
| 45 | GROUND | GROUND | | |
| 46 | | | | |
| 47 | GROUND | GROUND | | |
| 48 | | | | |
| 49 | GROUND | GROUND | | |
| 50 | | | | |

CABLE-III BR1/BL1/BB1 (C3)

| | | | | |
|---|---|---|---|---|
| 1 | GROUND | GROUND | | |
| 2 | YW0 | WEIGHT ADDRESS | | BB1-822C-10 |
| 3 | GROUND | GROUND | | |
| 4 | YW1 | WEIGHT ADDRESS | | BB1-U22C-13 |
| 5 | GROUND | GROUND | | |
| 6 | YW2 | WEIGHT ADDRESS | | BB1-U22C-6 |
| 7 | GROUND | GROUND | | |
| 8 | XW0 | WEIGHT ADDRESS | | BB1-U22C-3 |
| 9 | GROUND | GROUND | | |
| 10 | XW1 | WEIGHT ADDRESS | | BB1-U22D-3 |
| 11 | GROUND | GROUND | | |
| 12 | XW2 | WEIGHT ADDRESS | | BB1-U22D-6 |
| 13 | GROUND | GROUND | | |
| 14 | YA0 | WEIGHT ADDRESS | | BB1-U22D-13 |
| 15 | GROUND | GROUND | | |
| 16 | YA1 | WEIGHT ADDRESS | | BB1-U22D-10 |
| 17 | GROUND | GROUND | | |
| 18 | DOA6 | | BL1-U21E-6 | BB1-U7B-4 |
| 19 | GROUND | GROUND | | |
| 20 | | | | |
| 21 | GROUND | GROUND | | |
| 22 | CPG | GATED CLOCK PULSE | BL1-U21D-8 | BB1-U7A,86A,85A-2 |
| 23 | GROUND | GROUND | | |
| 24 | | | | |
| 25 | GROUND | GROUND | | |
| 26 | | | | |
| 27 | GROUND | GROUND | | |
| 28 | | | | |
| 29 | GROUND | GROUND | | |
| 30 | | | | |
| 31 | GROUND | GROUND | | |
| 32 | | | | |
| 33 | GROUND | GROUND | | |
| 34 | | | | |
| 35 | GROUND | GROUND | | |
| 36 | | | | |
| 37 | GROUND | GROUND | | |
| 38 | | | | |
| 39 | GROUND | GROUND | | |
| 40 | | | | |
| 41 | GROUND | GROUND | | |
| 42 | | | | |
| 43 | GROUND | GROUND | | |

TABLES-continued

| | | | | |
|---|---|---|---|---|
| 44 | | | | |
| 45 | GROUND | GROUND | | |
| 46 | | | | |
| 47 | GROUND | GROUND | | |
| 48 | W2-BAR | WEIGHT RAM READ/WRITE(LOW=>WRITE) | BL1-U22C-6 | BB1-U21E,U22E-10 |
| 49 | GROUND | GROUND | | |
| 50 | W3-BAR | WEIGHT RAM READ/WRITE(LOW=>WRITE) | BL1-U22C-8 | BB1-U23E-10 |
| | | CABLE-IV BR1/BL1/BB1 (C4) | | |
| 1 | GROUND | GROUND | | |
| 2 | FRAME | SYNC (CFS) | BR1 | BL1-U22E-11, C5-2 |
| 3 | GROUND | GROUND | | |
| 4 | LINE | SYNC (CLS) | BR1 | BL1-U22E-13, C5-3 |
| 5 | GROUND | GROUND | | |
| 6 | INPUT | PIXEL CLOCK EARLY (CPE-BAR) | BR1 | BL1-U21E-1 |
| 7 | GROUND | GROUND | | |
| 8 | DAC | PIXEL CLOCK (CPD) (CHANGE TO BF1-10MHZ) | BB1-87B-6 | BR1 |
| 9 | GROUND | GROUND | | |
| 10 | OUTPUT | PIXEL CLOCK (CPO) | BR1 | BB1 |
| 11 | GROUND | GROUND | | |
| 12 | FIELD-1 | (F1) | BR1 | C5-4 |
| 13 | GROUND | GROUND | | |
| 14 | | | BR1 | C5-5 |
| 15 | GROUND | GROUND | | |
| 16 | SEL0 | ADC SELECT LSB DOA2 | C5-10 | BR1-U11,U13 |
| 17 | GROUND | GROUND | | |
| 18 | SEL1 | ADC SELECT MSB DOA1 | C5-22 | BR1-U11,U13 |
| 19 | GROUND | GROUND | | |
| 20 | DJ7 | JOYSTICK COMMAND MSB | BR1-U10-3 | C6-18 |
| 21 | GROUND | GROUND | | |
| 22 | MO0R | BUFFER OUTPUT TO CRT DACS (GREEN) | BB1-U19B-7 BR-U | |
| 23 | GROUND | GROUND | | |
| 24 | MO1R | BUFFER OUTPUT TO CRT DACS (GREEN) | BB1-U19B-10 | BR-U |
| 25 | GROUND | GROUND | | |
| 26 | MO2R | BUFFER OUTPUT TO CRT DACS (GREEN) | BB1-U19B-12 | BR-U |
| 27 | GROUND | GROUND | | |
| 28 | MO3R | BUFFER OUTPUT TO CRT DACS (RED) | BB1-U19B-15 | BR-U |
| 29 | GROUND | GROUND | | |
| 30 | MO4R | BUFFER OUTPUT TO CRT DACS (RED) | BB1-U19C-2 | BR-U |
| 31 | GROUND | GROUND | | |
| 32 | MO5R | BUFFER OUTPUT TO CRT DACS (BLUE) | BB1-U19C-5 | BR-U |
| 33 | GROUND | GROUND | | |
| 34 | MO6R | BUFFER OUTPUT TO CRT DACS (BLUE) | BB1-U19C-7 | BR-U |
| 35 | GROUND | GROUND | | |
| 36 | MO7R | BUFFER OUTPUT TO CRT DACS (SPARE) | BB1-U19C-10 | |
| 37 | GROUND | GROUND | | |
| 38 | DJ6 | JOYSTICK COMMAND | BR1-U10-5 | C6-5 |
| 39 | GROUND | GROUND | | |
| 40 | DJ5 | JOYSTICK COMMAND | BR1-U10-7 | C6-17 |
| 41 | GROUND | GROUND | | |
| 42 | DJ4 | JOYSTICK COMMAND | BR1-U10-9 | C6-4 |
| 43 | GROUND | GROUND | | |
| 44 | DJ3 | JOYSTICK COMMAND | BR1-U10-11 | C6-16 |
| 45 | GROUND | GROUND | | |
| 46 | DJ2 | JOYSTICK COMMAND | BR1-U10-13 | C6-3 |
| 47 | GROUND | GROUND | | |
| 48 | DJ1 | JOYSTICK COMMAND | BR1-U13-13 | C6-15 |
| 49 | GROUND | GROUND | | |
| 50 | DJ0 | JOYSTICK COMMAND | BR1-U13-11 | C6-2 |
| | | CABLE-V BL1/COMPUTER PORT-A CONTROL (C5) | | |
| 1 | −12V | | | |
| 2 | DIA0 | COMPUTER DATA INPUT, FRAME SYNC | C4-2 | COMPUTER |
| 3 | DIA2 | COMPUTER DATA INPUT, LINE SYNC | C4-4 | COMPUTER |
| 4 | DIA4 | COMPUTER DATA INPUT, FIELD 1-BAR | C4-12 | COMPUTER |
| 5 | DIA6 | COMPUTER DATA INPUT | | COMPUTER |
| 6 | | | | |
| 7 | +5V | | | |
| 8 | | | | |
| 9 | DOA0 | COMPUTER DATA OUTPUT, TEST PULSE-1 | COMPUTER | |
| 10 | DOA2 | COMPUTER DATA OUTPUT, JOYSTICK SEL.-0 | COMPUTER | C4-16 |
| 11 | DOA4 | COMPUTER DATA OUTPUT, TEST PULSE-16 | COMPUTER | |
| 12 | DOA6 | COMPUTER DATA OUTPUT, LOAD-BAR/RUN | | |
| 13 | +12V | | | |
| 14 | GROUND | GROUND | | |
| 15 | DIA1 | COMPUTER DATA INPUT | | COMPUTER |
| 16 | DIA3 | COMPUTER DATA INPUT | | COMPUTER |
| 17 | DIA5 | COMPUTER DATA INPUT | | COMPUTER |

TABLES-continued

| | | | | |
|---|---|---|---|---|
| 18 | DIA7 | COMPUTER DATA INPUT | | COMPUTER |
| 19 | GROUND | GROUND | | |
| 20 | GROUND | GROUND | | |
| 21 | | | | |
| 22 | DOA1 | COMPUTER DATA OUTPUT, JOYSTICK SEL.-1 | COMPUTER | C4-18 |
| 23 | DOA3 | COMPUTER DATA OUTPUT, UNBLANK | COMPUTER | C4- |
| 24 | DOA5 | COMMAND SEQ. LOAD OF IMAGE MEMORY | COMPUTER | BL1-U18E-12 |
| 25 | DOA7 | OUTPUT DATA STROBE | COMPUTER | BL1-U22B-2 |
| 26 | | | | |

CABLE-VI BL1/COMPUTER PORT-B ADDRESS/DATA (C6)

| | | | | |
|---|---|---|---|---|
| 1 | −12V | | | |
| 2 | DIB0 | COMPUTER DATA INPUT, JOYSTICK | C4-50 | COMPUTER |
| 3 | DIB2 | COMPUTER DATA INPUT, JOYSTICK | C4-46 | COMPUTER |
| 4 | DIB4 | COMPUTER DATA INPUT, JOYSTICK | C4-42 | COMPUTER |
| 5 | DIB6 | COMPUTER DATA INPUT, JOYSTICK | C4-38 | COMPUTER |
| 6 | | | | |
| 7 | +5V | | | |
| 8 | | | | |
| 9 | DOB0 | COMPUTER DATA OUTPUT | COMPUTER | C2-2; U17C-3 |
| 10 | DOB2 | COMPUTER DATA OUTPUT | COMPUTER | C2-6; U17C-6 |
| 11 | DOB4 | COMPUTER DATA OUTPUT | COMPUTER | C2-10; U17C-13 |
| 12 | DOB6 | COMPUTER DATA OUTPUT | COMPUTER | C2-14 |
| 13 | +12V | | | |
| 14 | GROUND | GROUND | | |
| 15 | DIB1 | COMPUTER DATA INPUT, JOYSTICK | C4-48 | COMPUTER |
| 16 | DIB3 | COMPUTER DATA INPUT, JOYSTICK | C4-44 | COMPUTER |
| 17 | DIB5 | COMPUTER DATA INPUT, JOYSTICK | C4-40 | COMPUTER |
| 18 | DIB7 | COMPUTER DATA INPUT, JOYSTICK | C4-20 | COMPUTER |
| 19 | GROUND | GROUND | | |
| 20 | GROUND | GROUND | | |
| 21 | | | | |
| 22 | DOB1 | COMPUTER DATA OUTPUT | COMPUTER | C2-4; U17C-4 |
| 23 | DOB3 | COMPUTER DATA OUTPUT | COMPUTER | C2-8; U17C-11 |
| 24 | DOB5 | COMPUTER DATA OUTPUT | COMPUTER | C2-12; U17C-14 |
| 25 | DOB7 | COMPUTER DATA OUTPUT | COMPUTER | C2-16 |
| 26 | | | | |

CABLE-VII BL1/COMPUTER PORT-C REGISTER SELECT (C7)

| | | | | |
|---|---|---|---|---|
| 1 | −12V | | | |
| 2 | DIC0 | COMPUTER DATA INPUT | | COMPUTER |
| 3 | DIC2 | COMPUTER DATA INPUT | | COMPUTER |
| 4 | DIC4 | COMPUTER DATA INPUT | | COMPUTER |
| 5 | DIC6 | COMPUTER DATA INPUT | | COMPUTER |
| 6 | | | | |
| 7 | +5V | | | |
| 8 | | | | |
| 9 | DOC0 | COMPUTER DATA OUTPUT | COMPUTER | BL1-U19B-1, U20B-1 |
| 10 | DOC2 | COMPUTER DATA OUTPUT | COMPUTER | BL1-U19B-3, U20B-3 |
| 11 | DOC4 | COMPUTER DATA OUTPUT | COMPUTER | BL1-U21D-5 |
| 12 | DOC6 | COMPUTER DATA OUTPUT | COMPUTER | BL1-U21D-2 |
| 13 | +12V | | | |
| 14 | GROUND | GROUND | | |
| 15 | DIC1 | COMPUTER DATA INPUT | | COMPUTER |
| 16 | DIC3 | COMPUTER DATA INPUT | | COMPUTER |
| 17 | DIC5 | COMPUTER DATA INPUT | | COMPUTER |
| 18 | DIC7 | COMPUTER DATA INPUT | | COMPUTER |
| 19 | GROUND | GROUND | | |
| 20 | GROUND | GROUND | | |
| 21 | | | | |
| 22 | DOC1 | COMPUTER DATA OUTPUT | COMPUTER | BL1-U19B-2, U20B-2 |
| 23 | DOC3 | COMPUTER DATA OUTPUT | COMPUTER | BL1-U19B-6, U20B-5 |
| 24 | DOC5 | COMPUTER DATA OUTPUT | COMPUTER | BL1-U21D-4 |
| 25 | DOC7 | COMPUTER DATA OUTPUT | COMPUTER | BL1-U21D-1 |
| 26 | | | | |

TABLE OF DIP LAYOUT ON BOARDS

| BOARD-BM1,2 | | MEMORY BOARD | |
|---|---|---|---|
| POSITION | TYPE | PINS | SPARES |
| U1A | 58725 | 24 | NONE |
| U1B | 58725 | 24 | NONE |
| U1C | 58725 | 24 | NONE |
| U1D | 58725 | 24 | NONE |
| U1E | | | |
| U2A | 58725 | 24 | NONE |
| U2B | 58725 | 24 | NONE |

TABLES-continued

| | | | |
|---|---|---|---|
| U2C | 58725 | 24 | NONE |
| U2D | 58725 | 24 | NONE |
| U2E | | | |
| U3A | 58725 | 24 | NONE |
| U3B | 58725 | 24 | NONE |
| U3C | 58725 | 24 | NONE |
| U3D | 58725 | 24 | NONE |
| U3E | | | |
| U4A | 58725 | 24 | NONE |
| U4B | 58725 | 24 | NONE |
| U4C | 58725 | 24 | NONE |
| U4D | 58725 | 24 | NONE |
| U4E | | | |
| U5A | 58725 | 24 | NONE |
| U5B | 58725 | 24 | NONE |
| U5C | 58725 | 24 | NONE |
| U5D | 58725 | 24 | NONE |
| U5E | | | |
| U6A | 58725 | 24 | NONE |
| U6B | 58725 | 24 | NONE |
| U6C | 58725 | 24 | NONE |
| U6D | 58725 | 24 | NONE |
| U6E | | | |
| U7A | 58725 | 24 | NONE |
| U7B | 58725 | 24 | NONE |
| U7C | 58725 | 24 | NONE |
| U7D | 58725 | 24 | NONE |
| U7E | | | |
| U8A | 58725 | 24 | NONE |
| U8B | 58725 | 24 | NONE |
| U8C | 58725 | 24 | NONE |
| U8D | 58725 | 24 | NONE |
| U8E | | | |
| U9A | 58725 | 24 | NONE |
| U9B | 58725 | 24 | NONE |
| U9C | 58725 | 24 | NONE |
| U9D | 58725 | 24 | NONE |
| U9E | | | |
| U10A | 58725 | 24 | NONE |
| U10B | 58725 | 24 | NONE |
| U10C | 58725 | 24 | NONE |
| U10D | 58725 | 24 | NONE |
| U10E | | | |
| U11A | 58725 | 24 | NONE |
| U11B | 58725 | 24 | NONE |
| U11C | 58725 | 24 | NONE |
| U11D | 58725 | 24 | NONE |
| U11E | | | |
| U12A | 58725 | 24 | NONE |
| U12B | 58725 | 24 | NONE |
| U12C | 58725 | 24 | NONE |
| U12D | 58725 | 24 | NONE |
| U12E | | | |
| U13A | 58725 | 24 | NONE |
| U13B | 58725 | 24 | NONE |
| U13C | 58725 | 24 | NONE |
| U13D | 58725 | 24 | NONE |
| U13E | | | |
| U14A | 58725 | 24 | NONE |
| U14B | 58725 | 24 | NONE |
| U14C | 58725 | 24 | NONE |
| U14D | 58725 | 24 | NONE |
| U14E | | | |
| U15A | 58725 | 24 | NONE |
| U15B | 58725 | 24 | NONE |
| U15C | 58725 | 24 | NONE |
| U15D | 58725 | 24 | NONE |
| U15E | | | |
| U16A | 58725 | 24 | NONE |
| U16B | 58725 | 24 | NONE |
| U16C | 58725 | 24 | NONE |
| U16D | 58725 | 24 | NONE |
| U16E | | | |
| U17A | 8216 | 16 | NONE |
| U17B | 8216 | 16 | NONE |
| U17C | 8216 | 16 | NONE |
| U17D | 8216 | 16 | NONE |
| U17E | LS00 | 14 | NONE |
| U18A | 8216 | 16 | NONE |

TABLES-continued

| | | | | |
|---|---|---|---|---|
| U18B | 8216 | 16 | NONE | |
| U18C | 8216 | 16 | NONE | |
| U18D | 8216 | 16 | NONE | |
| U18E | LS00 | 14 | NONE | |
| U19A | 8T97 | 16 | NONE | (LS365 EQUIVALENT) |
| U19B | ALS138 | 16 | NONE | |
| U19C | ALS138 | 16 | NONE | |
| U19D | 8T97 | 16 | 2/3 | (LS365 EQUIVALENT) |
| U19E | LS138 | 16 | NONE | |
| U20A | | | | |
| U20B | | | | |
| U20C | | | | |
| U20D | | | | |
| U20E | | | | |

| BOARD-BL1 | | LOGIC BOARD | |
|---|---|---|---|
| POSITION | TYPE | PINS | SPARES |
| U1A | | | |
| U1B | | | |
| U1C | | | |
| U1D | | | |
| U1E | | | |
| U2A | | | |
| U2B | | | |
| U2C | | | |
| U2D | | | |
| U2E | | | |
| U3A | | 14 | |
| U3B | | 14 | |
| U3C | | 14 | |
| U3D | | 14 | |
| U3E | | 14 | |
| U4A | | 14 | |
| U4B | | 14 | |
| U4C | | 14 | |
| U4D | | 14 | |
| U4E | | | |
| U5A | | | |
| U5B | LS174 | 16 | NONE |
| U5C | LS174 | 16 | NONE |
| U5D | LS174 | 16 | NONE |
| U5E | LS174 | 16 | NONE |
| U6A | | | |
| U6B | LS283 | 16 | NONE |
| U6C | LS283 | 16 | NONE |
| U6D | S283 | 16 | NONE |
| U6E | F283 | 16 | NONE |
| U7A | | | |
| U7B | LS174 | 16 | NONE |
| U7C | LS174 | 16 | NONE |
| U7D | LS174 | 16 | NONE |
| U7E | LS174 | 16 | NONE |
| U8A | LS04 | 14 | 11/10;13/12 |
| U8B | LS174 | 16 | NONE |
| U8C | LS174 | 16 | NONE |
| U8D | AS174 | 16 | NONE |
| U8E | AS174 | 16 | NONE |
| U9A | AS21 | 14 | NONE |
| U9B | LS174 | 16 | NONE |
| U9C | LS174 | 16 | NONE |
| U9D | AS174 | 16 | NONE |
| U9E | AS174 | 16 | NONE |
| U10A | AS21 | 14 | NONE |
| U10B | LS257 | 16 | NONE |
| U10C | LS257 | 16 | NONE |
| U10D | ALS257 | 16 | NONE |
| U10E | ALS257 | 16 | NONE |
| U11A | LS02 | 14 | 2,3/1;5,6/4;8,9/10;11,12/13 |
| U11B | LS257 | 16 | NONE |
| U11C | LS257 | 16 | NONE |
| U11D | ALS257 | 16 | NONE |
| U11E | ALS257 | 16 | NONE |
| U12A | AS20 | 14 | NONE |
| U12B | LS257 | 16 | NONE |
| U12C | LS257 | 16 | NONE |
| U12D | ALS257 | 16 | NONE |
| U12E | ALS257 | 16 | NONE |

TABLES-continued

| | | | |
|---|---|---|---|
| U13A | AS20 | 14 | NONE |
| U13B | LS283 | 16 | NONE |
| U13C | LS283 | 16 | NONE |
| U13D | S283 | 16 | NONE |
| U13E | S283 | 16 | NONE |
| U14A | AS04 | 14 | 9/8;11/10;13/12 |
| U14B | LS283 | 16 | NONE |
| U14C | LS283 | 16 | NONE |
| U14D | S283 | 16 | NONE |
| U14E | S283 | 16 | NONE |
| U15A | LS08 | 14 | 9,10/8 |
| U15B | LS283 | 16 | NONE |
| U15C | LS283 | 16 | NONE |
| U15D | F283 | 16 | NONE |
| U15E | F283 | 16 | NONE |
| U16A | ALS32 | 14 | 8,9/10;11,12/13 |
| U16B | | 16 | |
| U16C | | 16 | |
| U16D | F283 | 16 | NONE |
| U16E | F283 | 16 | NONE |
| U17A | ALS00 | 14 | NONE |
| U17B | LS174 | 16 | NONE |
| U17C | LS174 | 16 | NONE |
| U17D | LS174 | 16 | NONE |
| U17E | LS174 | 16 | NONE |
| U18A | | 14 | |
| U18B | LS04 | 14 | 1/2;3/4;9/8;11/10;13/12;5/6 |
| U18C | LS32 | 14 | NONE |
| U18D | LS04 | 14 | 11/10 |
| U18E | LS00 | 14 | 10/8 |
| U19A | LS02 | 14 | 5,6/4; 8,9/10; 11,12/13 |
| U19B | LS138 | 16 | NONE |
| U19C | LS02 | 14 | NONE |
| U19D | LS02 | 14 | 8,9/10 |
| U19E | | 14 | |
| U20A | | 14 | |
| U20B | LS138 | 16 | NONE |
| U20C | LS02 | 14 | NONE |
| U20D | LS02 | 14 | NONE |
| U20E | LS08 | 14 | NONE |
| U21A | | | |
| U21B | LS174 | 16 | 6/7;11/10;13/12;14/15 (CPD CLOCK) |
| U21C | LS02 | 14 | NONE |
| U21D | LS20 | 14 | NONE |
| U21E | LS04 | 14 | NONE |
| U22A | LS04 | 14 | 5/6;11/10 |
| U22B | LS00 | 14 | 4,5/6;9,10/8;12,13/11 |
| U22C | LS32 | 14 | NONE |
| U22D | | 14 | |
| U22E | ALS174 | 16 | 3/2;4/5 |
| U23A | OSC | — | NONE |
| U23B | | | |
| U23C | LS174 | 16 | 6/7;13/12;14/15 |
| U23D | ALS174 | 16 | NONE |
| U23E | | | |
| U24A | OSC | — | NONE |
| U24B | | | |
| U24C | | | |
| U24D | | | |
| U24E | | | |

MEMORY TABLE-A TO MEMORY TABLE-D

MEMORY TABLE-A

| RAM | PIN-1 | PIN-2 | PIN-3 | PIN-4 | PIN-5 | PIN-6 |
|---|---|---|---|---|---|---|
| U1A | U19D-7 | U19D-5 | U19D-13 | U19D-11 | U19D-9 | U19D-7 |
| U2A | U19D-7 | U19D-5 | U19D-13 | U19D-11 | U19D-9 | U19D-7 |
| U3A | U19D-7 | U19D-5 | U19D-13 | U19D-11 | U19D-9 | U19D-7 |
| U4A | U19D-7 | U19D-5 | U19D-13 | U19D-11 | U19D-9 | U19D-7 |
| U5A | U19D-7 | U19D-5 | U19D-13 | U19D-11 | U19D-9 | U19D-7 |
| U6A | U19D-7 | U19D-5 | U19D-13 | U19D-11 | U19D-9 | U19D-7 |
| U7A | U19D-7 | U19D-5 | U19D-13 | U19D-11 | U19D-9 | U19D-7 |
| U8A | U19D-7 | U19D-5 | U19D-13 | U19D-11 | U19D-9 | U19D-7 |
| U9A | U19D-7 | U19D-5 | U19D-13 | U19D-11 | U19D-9 | U19D-7 |
| U10A | U19D-7 | U19D-5 | U19D-13 | U19D-11 | U19D-9 | U19D-7 |
| U11A | U19D-7 | U19D-5 | U19D-13 | U19D-11 | U19D-9 | U19D-7 |
| U12A | U19D-7 | U19D-5 | U19D-13 | U19D-11 | U19D-9 | U19D-7 |

TABLES-continued

| | | | | | | |
|---|---|---|---|---|---|---|
| U13A | U19D-7 | U19D-5 | U19D-13 | U19D-11 | U19D-9 | U19D-7 |
| U14A | U19D-7 | U19D-5 | U19D-13 | U19D-11 | U19D-9 | U19D-7 |
| U15A | U19D-7 | U19D-5 | U19D-13 | U19D-11 | U19D-9 | U19D-7 |
| U16A | U19D-7 | U19D-5 | U19D-13 | U19D-11 | U19D-9 | U19D-7 |
| U1B | U19D-7 | U19D-5 | U19D-13 | U19D-11 | U19D-9 | U19D-7 |
| U2B | U19D-7 | U19D-5 | U19D-13 | U19D-11 | U19D-9 | U19D-7 |
| U3B | U19D-7 | U19D-5 | U19D-13 | U19D-11 | U19D-9 | U19D-7 |
| U4B | U19D-7 | U19D-5 | U19D-13 | U19D-11 | U19D-9 | U19D-7 |
| U5B | U19D-7 | U19D-5 | U19D-13 | U19D-11 | U19D-9 | U19D-7 |
| U6B | U19D-7 | U19D-5 | U19D-13 | U19D-11 | U19D-9 | U19D-7 |
| U7B | U19D-7 | U19D-5 | U19D-13 | U19D-11 | U19D-9 | U19D-7 |
| U8B | U19D-7 | U19D-5 | U19D-13 | U19D-11 | U19D-9 | U19D-7 |
| U9B | U19D-7 | U19D-5 | U19D-13 | U19D-11 | U19D-9 | U19D-7 |
| U10B | U19D-7 | U19D-5 | U19D-13 | U19D-11 | U19D-9 | U19D-7 |
| U11B | U19D-7 | U19D-5 | U19D-13 | U19D-11 | U19D-9 | U19D-7 |
| U12B | U19D-7 | U19D-5 | U19D-13 | U19D-11 | U19D-9 | U19D-7 |
| U13B | U19D-7 | U19D-5 | U19D-13 | U19D-11 | U19D-9 | U19D-7 |
| U14B | U19D-7 | U19D-5 | U19D-13 | U19D-11 | U19D-9 | U19D-7 |
| U15B | U19D-7 | U19D-5 | U19D-13 | U19D-11 | U19D-9 | U19D-7 |
| U16B | U19D-7 | U19D-5 | U19D-13 | U19D-11 | U19D-9 | U19D-7 |

| RAM | PIN-7 | PIN-8 | PIN-9 | PIN-10 | PIN-11 | PIN-12 |
|---|---|---|---|---|---|---|
| U1A | U19A-5 | U19A-3 | U17A-3 | U17A-6 | U17A-10 | GROUND |
| U2A | U19A-5 | U19A-3 | U17A-3 | U17A-6 | U17A-10 | GROUND |
| U3A | U19A-5 | U19A-3 | U17A-3 | U17A-6 | U17A-10 | GROUND |
| U4A | U19A-5 | U19A-3 | U17A-3 | U17A-6 | U17A-10 | GROUND |
| U5A | U19A-5 | U19A-3 | U17A-3 | U17A-6 | U17A-10 | GROUND |
| U6A | U19A-5 | U19A-3 | U17A-3 | U17A-6 | U17A-10 | GROUND |
| U7A | U19A-5 | U19A-3 | U17A-3 | U17A-6 | U17A-10 | GROUND |
| U8A | U19A-5 | U19A-3 | U17A-3 | U17A-6 | U17A-10 | GROUND |
| U9A | U19A-5 | U19A-3 | U17A-3 | U17A-6 | U17A-10 | GROUND |
| U10A | U19A-5 | U19A-3 | U17A-3 | U17A-6 | U17A-10 | GROUND |
| U11A | U19A-5 | U19A-3 | U17A-3 | U17A-6 | U17A-10 | GROUND |
| U12A | U19A-5 | U19A-3 | U17A-3 | U17A-6 | U17A-10 | GROUND |
| U13A | U19A-5 | U19A-3 | U17A-3 | U17A-6 | U17A-10 | GROUND |
| U14A | U19A-5 | U19A-3 | U17A-3 | U17A-6 | U17A-10 | GROUND |
| U15A | U19A-5 | U19A-3 | U17A-3 | U17A-6 | U17A-10 | GROUND |
| U16A | U19A-5 | U19A-3 | U17A-3 | U17A-6 | U17A-10 | GROUND |
| U1B | U19A-5 | U19A-3 | U17B-3 | U17B-6 | U17B-10 | GROUND |
| U2B | U19A-5 | U19A-3 | U17B-3 | U17B-6 | U17B-10 | GROUND |
| U3B | U19A-5 | U19A-3 | U17B-3 | U17B-6 | U17B-10 | GROUND |
| U4B | U19A-5 | U19A-3 | U17B-3 | U17B-6 | U17B-10 | GROUND |
| U5B | U19A-5 | U19A-3 | U17B-3 | U17B-6 | U17B-10 | GROUND |
| U6B | U19A-5 | U19A-3 | U17B-3 | U17B-6 | U17B-10 | GROUND |
| U7B | U19A-5 | U19A-3 | U17B-3 | U17B-6 | U17B-10 | GROUND |
| U8B | U19A-5 | U19A-3 | U17B-3 | U17B-6 | U17B-10 | GROUND |
| U9B | U19A-5 | U19A-3 | U17B-3 | U17B-6 | U17B-10 | GROUND |
| U10B | U19A-5 | U19A-3 | U17B-3 | U17B-6 | U17B-10 | GROUND |
| U11B | U19A-5 | U19A-3 | U17B-3 | U17B-6 | U17B-10 | GROUND |
| U12B | U19A-5 | U19A-3 | U17B-3 | U17B-6 | U17B-10 | GROUND |
| U13B | U19A-5 | U19A-3 | U17B-3 | U17B-6 | U17B-10 | GROUND |
| U14B | U19A-5 | U19A-3 | U17B-3 | U17B-6 | U17B-10 | GROUND |
| U15B | U19A-5 | U19A-3 | U17B-3 | U17B-6 | U17B-10 | GROUND |
| U16B | U19A-5 | U19A-3 | U17B-3 | U17B-6 | U17B-10 | GROUND |

MEMORY TABLE-B

| RAM | PIN-1 | PIN-2 | PIN-3 | PIN-4 | PIN-5 | PIN-6 |
|---|---|---|---|---|---|---|
| U1C | U19D-7 | U19D-5 | U19D-13 | U19A-11 | U19A-9 | U19A-7 |
| U2C | U19D-7 | U19D-5 | U19D-13 | U19A-11 | U19A-9 | U19A-7 |
| U3C | U19D-7 | U19D-5 | U19D-13 | U19A-11 | U19A-9 | U19A-7 |
| U4C | U19D-7 | U19D-5 | U19D-13 | U19A-11 | U19A-9 | U19A-7 |
| U5C | U19D-7 | U19D-5 | U19D-13 | U19A-11 | U19A-9 | U19A-7 |
| U6C | U19D-7 | U19D-5 | U19D-13 | U19A-11 | U19A-9 | U19A-7 |
| U7C | U19D-7 | U19D-5 | U19D-13 | U19A-11 | U19A-9 | U19A-7 |
| U8C | U19D-7 | U19D-5 | U19D-13 | U19A-11 | U19A-9 | U19A-7 |
| U9C | U19D-7 | U19D-5 | U19D-13 | U19A-11 | U19A-9 | U19A-7 |
| U10C | U19D-7 | U19D-5 | U19D-13 | U19A-11 | U19A-9 | U19A-7 |
| U11C | U19D-7 | U19D-5 | U19D-13 | U19A-11 | U19A-9 | U19A-7 |
| U12C | U19D-7 | U19D-5 | U19D-13 | U19A-11 | U19A-9 | U19A-7 |
| U13C | U19D-7 | U19D-5 | U19D-13 | U19A-11 | U19A-9 | U19A-7 |
| U14C | U19D-7 | U19D-5 | U19D-13 | U19A-11 | U19A-9 | U19A-7 |
| U15C | U19D-7 | U19D-5 | U19D-13 | U19A-11 | U19A-9 | U19A-7 |
| U16C | U19D-7 | U19D-5 | U19D-13 | U19A-11 | U19A-9 | U19A-7 |
| U1D | U19D-7 | U19D-5 | U19D-13 | U19A-11 | U19A-9 | U19A-7 |
| U2D | U19D-7 | U19D-5 | U19D-13 | U19A-11 | U19A-9 | U19A-7 |
| U3D | U19D-7 | U19D-5 | U19D-13 | U19A-11 | U19A-9 | U19A-7 |

TABLES-continued

| | | | | | | |
|---|---|---|---|---|---|---|
| U4D | U19D-7 | U19D-5 | U19D-13 | U19A-11 | U19A-9 | U19A-7 |
| U5D | U19D-7 | U19D-5 | U19D-13 | U19A-11 | U19A-9 | U19A-7 |
| U6D | U19D-7 | U19D-5 | U19D-13 | U19A-11 | U19A-9 | U19A-7 |
| U7D | U19D-7 | U19D-5 | U19D-13 | U19A-11 | U19A-9 | U19A-7 |
| U8D | U19D-7 | U19D-5 | U19D-13 | U19A-11 | U19A-9 | U19A-7 |
| U9D | U19D-7 | U19D-5 | U19D-13 | U19A-11 | U19A-9 | U19A-7 |
| U10D | U19D-7 | U19D-5 | U19D-13 | U19A-11 | U19A-9 | U19A-7 |
| U11D | U19D-7 | U19D-5 | U19D-13 | U19A-11 | U19A-9 | U19A-7 |
| U12D | U19D-7 | U19D-5 | U19D-13 | U19A-11 | U19A-9 | U19A-7 |
| U13D | U19D-7 | U19D-5 | U19D-13 | U19A-11 | U19A-9 | U19A-7 |
| U14D | U19D-7 | U19D-5 | U19D-13 | U19A-11 | U19A-9 | U19A-7 |
| U15D | U19D-7 | U19D-5 | U19D-13 | U19A-11 | U19A-9 | U19A-7 |
| U16D | U19D-7 | U19D-5 | U19D-13 | U19A-11 | U19A-9 | U19A-7 |

| RAM | PIN-7 | PIN-8 | PIN-9 | PIN-10 | PIN-11 | PIN-12 |
|---|---|---|---|---|---|---|
| U1C | U19A-5 | U19A-3 | U17C-3 | U17C-6 | U17C-10 | GROUND |
| U2C | U19A-5 | U19A-3 | U17C-3 | U17C-6 | U17C-10 | GROUND |
| U3C | U19A-5 | U19A-3 | U17C-3 | U17C-6 | U17C-10 | GROUND |
| U4C | U19A-5 | U19A-3 | U17C-3 | U17C-6 | U17C-10 | GROUND |
| U5C | U19A-5 | U19A-3 | U17C-3 | U17C-6 | U17C-10 | GROUND |
| U6C | U19A-5 | U19A-3 | U17C-3 | U17C-6 | U17C-10 | GROUND |
| U7C | U19A-5 | U19A-3 | U17C-3 | U17C-6 | U17C-10 | GROUND |
| U8C | U19A-5 | U19A-3 | U17C-3 | U17C-6 | U17C-10 | GROUND |
| U9C | U19A-5 | U19A-3 | U17C-3 | U17C-6 | U17C-10 | GROUND |
| U10C | U19A-5 | U19A-3 | U17C-3 | U17C-6 | U17C-10 | GROUND |
| U11C | U19A-5 | U19A-3 | U17C-3 | U17C-6 | U17C-10 | GROUND |
| U12C | U19A-5 | U19A-3 | U17C-3 | U17C-6 | U17C-10 | GROUND |
| U13C | U19A-5 | U19A-3 | U17C-3 | U17C-6 | U17C-10 | GROUND |
| U14C | U19A-5 | U19A-3 | U17C-3 | U17C-6 | U17C-10 | GROUND |
| U15C | U19A-5 | U19A-3 | U17C-3 | U17C-6 | U17C-10 | GROUND |
| U16C | U19A-5 | U19A-3 | U17C-3 | U17C-6 | U17C-10 | GROUND |
| U1D | U19A-5 | U19A-3 | U17D-3 | U17D-6 | U17D-10 | GROUND |
| U2D | U19A-5 | U19A-3 | U17D-3 | U17D-6 | U17D-10 | GROUND |
| U3D | U19A-5 | U19A-3 | U17D-3 | U17D-6 | U17D-10 | GROUND |
| U4D | U19A-5 | U19A-3 | U17D-3 | U17D-6 | U17D-10 | GROUND |
| U5D | U19A-5 | U19A-3 | U17D-3 | U17D-6 | U17D-10 | GROUND |
| U6D | U19A-5 | U19A-3 | U17D-3 | U17D-6 | U17D-10 | GROUND |
| U7D | U19A-5 | U19A-3 | U17D-3 | U17D-6 | U17D-10 | GROUND |
| U8D | U19A-5 | U19A-3 | U17D-3 | U17D-6 | U17D-10 | GROUND |
| U9D | U19A-5 | U19A-3 | U17D-3 | U17D-6 | U17D-10 | GROUND |
| U10D | U19A-5 | U19A-3 | U17D-3 | U17D-6 | U17D-10 | GROUND |
| U11D | U19A-5 | U19A-3 | U17D-3 | U17D-6 | U17D-10 | GROUND |
| U12D | U19A-5 | U19A-3 | U17D-3 | U17D-6 | U17D-10 | GROUND |
| U13D | U19A-5 | U19A-3 | U17D-3 | U17D-6 | U17D-10 | GROUND |
| U14D | U19A-5 | U19A-3 | U17D-3 | U17D-6 | U17D-10 | GROUND |
| U15D | U19A-5 | U19A-3 | U17D-3 | U17D-6 | U17D-10 | GROUND |
| U16D | U19A-5 | U19A-3 | U17D-3 | U17D-6 | U17D-10 | GROUND |

MEMORY TABLE-C

| RAM | PIN-13 | PIN-14 | PIN-15 | PIN-16 | PIN-17 | PIN-18 |
|---|---|---|---|---|---|---|
| U1A | U17A-13 | U18A-3 | U18A-6 | U18A-10 | U18A-13 | U19B-15 |
| U2A | U17A-13 | U18A-3 | U18A-6 | U18A-10 | U18A-13 | U19B-15 |
| U3A | U17A-13 | U18A-3 | U18A-6 | U18A-10 | U18A-13 | U19B-15 |
| U4A | U17A-13 | U18A-3 | U18A-6 | U18A-10 | U18A-13 | U19B-15 |
| U5A | U17A-13 | U18A-3 | U18A-6 | U18A-10 | U18A-13 | U19B-15 |
| U6A | U17A-13 | U18A-3 | U18A-6 | U18A-10 | U18A-13 | U19B-15 |
| U7A | U17A-13 | U18A-3 | U18A-6 | U18A-10 | U18A-13 | U19B-15 |
| U8A | U17A-13 | U18A-3 | U18A-6 | U18A-10 | U18A-13 | U19B-15 |
| U9A | U17A-13 | U18A-3 | U18A-6 | U18A-10 | U18A-13 | U19B-14 |
| U10A | U17A-13 | U18A-3 | U18A-6 | U18A-10 | U18A-13 | U19B-14 |
| U11A | U17A-13 | U18A-3 | U18A-6 | U18A-10 | U18A-13 | U19B-14 |
| U12A | U17A-13 | U18A-3 | U18A-6 | U18A-10 | U18A-13 | U19B-14 |
| U13A | U17A-13 | U18A-3 | U18A-6 | U18A-10 | U18A-13 | U19B-14 |
| U14A | U17A-13 | U18A-3 | U18A-6 | U18A-10 | U18A-13 | U19B-14 |
| U15A | U17A-13 | U18A-3 | U18A-6 | U18A-10 | U18A-13 | U19B-14 |
| U16A | U17A-13 | U18A-3 | U18A-6 | U18A-10 | U18A-13 | U19B-14 |
| U1B | U17B-13 | U18B-3 | U18B-6 | U18B-10 | U18B-13 | U19B-13 |
| U2B | U17B-13 | U18B-3 | U18B-6 | U18B-10 | U18B-13 | U19B-13 |
| U3B | U17B-13 | U18B-3 | U18B-6 | U18B-10 | U18B-13 | U19B-13 |
| U4B | U17B-13 | U18B-3 | U18B-6 | U18B-10 | U18B-13 | U19B-13 |
| U5B | U17B-13 | U18B-3 | U18B-6 | U18B-10 | U18B-13 | U19B-13 |
| U6B | U17B-13 | U18B-3 | U18B-6 | U18B-10 | U18B-13 | U19B-13 |
| U7B | U17B-13 | U18B-3 | U18B-6 | U18B-10 | U18B-13 | U19B-13 |
| U8B | U17B-13 | U18B-3 | U18B-6 | U18B-10 | U18B-13 | U19B-13 |
| U9B | U17B-13 | U18B-3 | U18B-6 | U18B-10 | U18B-13 | U19B-12 |
| U10B | U17B-13 | U18B-3 | U18B-6 | U18B-10 | U18B-13 | U19B-12 |

TABLES-continued

| | | | | | | |
|---|---|---|---|---|---|---|
| U11B | U17B-13 | U18B-3 | U18B-6 | U18B-10 | U18B-13 | U19B-12 |
| U12B | U17B-13 | U18B-3 | U18B-6 | U18B-10 | U18B-13 | U19B-12 |
| U13B | U17B-13 | U18B-3 | U18B-6 | U18B-10 | U18B-13 | U19B-12 |
| U14B | U17B-13 | U18B-3 | U18B-6 | U18B-10 | U18B-13 | U19B-12 |
| U15B | U17B-13 | U18B-3 | U18B-6 | U18B-10 | U18B-13 | U19B-12 |
| U16B | U17B-13 | U18B-3 | U18B-6 | U18B-10 | U18B-13 | U19B-12 |

| RAM | PIN-19 | PIN-20 | PIN-21 | PIN-22 | PIN-23 | PIN-24 |
|---|---|---|---|---|---|---|
| U1A | U19D-13 | U19C-15 | U19E-15 | U19D-11 | U19E-9 | VCC |
| U2A | U19D-13 | U19C-14 | U19E-14 | U19D-11 | U19D-9 | VCC |
| U3A | U19D-13 | U19C-13 | U19E-13 | U19D-11 | U19D-9 | VCC |
| U4A | U19D-13 | U19C-12 | U19E-12 | U19D-11 | U19D-9 | VCC |
| U5A | U19D-13 | U19C-11 | U19E-11 | U19D-11 | U19D-9 | VCC |
| U6A | U19D-13 | U19C-10 | U19E-10 | U19D-11 | U19D-9 | VCC |
| U7A | U19D-13 | U19C-9 | U19E-9 | U19D-11 | U19D-9 | VCC |
| U8A | U19D-13 | U19C-7 | U19E-7 | U19D-11 | U19D-9 | VCC |
| U9A | U19D-13 | U19C-15 | U19E-15 | U19D-11 | U19D-9 | VCC |
| U10A | U19D-13 | U19C-14 | U19E-14 | U19D-11 | U19D-9 | VCC |
| U11A | U19D-13 | U19C-13 | U19E-13 | U19D-11 | U19D-9 | VCC |
| U12A | U19D-13 | U19C-12 | U19E-12 | U19D-11 | U19D-9 | VCC |
| U13A | U19D-13 | U19C-11 | U19E-11 | U19D-11 | U19D-9 | VCC |
| U14A | U19D-13 | U19C-10 | U19E-10 | U19D-11 | U19D-9 | VCC |
| U15A | U19D-13 | U19C-9 | U19E-9 | U19D-11 | U19D-9 | VCC |
| U16A | U19D-13 | U19C-7 | U19E-7 | U19D-11 | U19D-9 | VCC |
| U1B | U19D-13 | U19C-15 | U19E-15 | U19D-11 | U19E-9 | VCC |
| U2B | U19D-13 | U19C-14 | U19E-14 | U19D-11 | U19D-9 | VCC |
| U3B | U19D-13 | U19C-13 | U19E-13 | U19D-11 | U19D-9 | VCC |
| U4B | U19D-13 | U19C-12 | U19E-12 | U19D-11 | U19D-9 | VCC |
| U5B | U19D-13 | U19C-11 | U19E-11 | U19D-11 | U19D-9 | VCC |
| U6B | U19D-13 | U19C-10 | U19E-10 | U19D-11 | U19D-9 | VCC |
| U7B | U19D-13 | U19C-9 | U19E-9 | U19D-11 | U19D-9 | VCC |
| U8B | U19D-13 | U19C-7 | U19E-7 | U19D-11 | U19D-9 | VCC |
| U9B | U19D-13 | U19C-15 | U19E-15 | U19D-11 | U19D-9 | VCC |
| U10B | U19D-13 | U19C-14 | U19E-14 | U19D-11 | U19D-9 | VCC |
| U11B | U19D-13 | U19C-13 | U19E-13 | U19D-11 | U19D-9 | VCC |
| U12B | U19D-13 | U19C-12 | U19E-12 | U19D-11 | U19D-9 | VCC |
| U13B | U19D-13 | U19C-11 | U19E-11 | U19D-11 | U19D-9 | VCC |
| U14B | U19D-13 | U19C-10 | U19E-10 | U19D-11 | U19D-9 | VCC |
| U15B | U19D-13 | U19C-9 | U19E-9 | U19D-11 | U19D-9 | VCC |
| U16B | U19D-13 | U19C-7 | U19E-7 | U19D-11 | U19D-9 | VCC |

MEMORY TABLE-D

| RAM | PIN-13 | PIN-14 | PIN-15 | PIN-16 | PIN-17 | PIN-18 |
|---|---|---|---|---|---|---|
| U1C | U17C-13 | U18C-3 | U18C-6 | U18C-10 | U18C-13 | U19B-11 |
| U2C | U17C-13 | U18C-3 | U18C-6 | U18C-10 | U18C-13 | U19B-11 |
| U3C | U17C-13 | U18C-3 | U18C-6 | U18C-10 | U18C-13 | U19B-11 |
| U4C | U17C-13 | U18C-3 | U18C-6 | U18C-10 | U18C-13 | U19B-11 |
| U5C | U17C-13 | U18C-3 | U18C-6 | U18C-10 | U18C-13 | U19B-11 |
| U6C | U17C-13 | U18C-3 | U18C-6 | U18C-10 | U18C-13 | U19B-11 |
| U7C | U17C-13 | U18C-3 | U18C-6 | U18C-10 | U18C-13 | U19B-11 |
| U8C | U17C-13 | U18C-3 | U18C-6 | U18C-10 | U18C-13 | U19B-11 |
| U9C | U17C-13 | U18C-3 | U18C-6 | U18C-10 | U18C-13 | U19B-10 |
| U10C | U17C-13 | U18C-3 | U18C-6 | U18C-10 | U18C-13 | U19B-10 |
| U11C | U17C-13 | U18C-3 | U18C-6 | U18C-10 | U18C-13 | U19B-10 |
| U12C | U17C-13 | U18C-3 | U18C-6 | U18C-10 | U18C-13 | U19B-10 |
| U13C | U17C-13 | U18C-3 | U18C-6 | U18C-10 | U18C-13 | U19B-10 |
| U14C | U17C-13 | U18C-3 | U18C-6 | U18C-10 | U18C-13 | U19B-10 |
| U15C | U17C-13 | U18C-3 | U18C-6 | U18C-10 | U18C-13 | U19B-10 |
| U16C | U17C-13 | U18C-3 | U18C-6 | U18C-10 | U18C-13 | U19B-10 |
| U1D | U17D-13 | U18D-3 | U18D-6 | U18D-10 | U18D-13 | U19B-9 |
| U2D | U17D-13 | U18D-3 | U18D-6 | U18D-10 | U18D-13 | U19B-9 |
| U3D | U17D-13 | U18D-3 | U18D-6 | U18D-10 | U18D-13 | U19B-9 |
| U4D | U17D-13 | U18D-3 | U18D-6 | U18D-10 | U18D-13 | U19B-9 |
| U5D | U17D-13 | U18D-3 | U18D-6 | U18D-10 | U18D-13 | U19B-9 |
| U6D | U17D-13 | U18D-3 | U18D-6 | U18D-10 | U18D-13 | U19B-9 |
| U7D | U17D-13 | U18D-3 | U18D-6 | U18D-10 | U18D-13 | U19B-9 |
| U8D | U17D-13 | U18D-3 | U18D-6 | U18D-10 | U18D-13 | U19B-9 |
| U9D | U17D-13 | U18D-3 | U18D-6 | U18D-10 | U18D-13 | U19B-7 |
| U10D | U17D-13 | U18D-3 | U18D-6 | U18D-10 | U18D-13 | U19B-7 |
| U11D | U17D-13 | U18D-3 | U18D-6 | U18D-10 | U18D-13 | U19B-7 |
| U12D | U17D-13 | U18D-3 | U18D-6 | U18D-10 | U18D-13 | U19B-7 |
| U13D | U17D-13 | U18D-3 | U18D-6 | U18D-10 | U18D-13 | U19B-7 |
| U14D | U17D-13 | U18D-3 | U18D-6 | U18D-10 | U18D-13 | U19B-7 |
| U15D | U17D-13 | U18D-3 | U18D-6 | U18D-10 | U18D-13 | U19B-7 |
| U16D | U17D-13 | U18D-3 | U18D-6 | U18D-10 | U18D-13 | U19B-7 |

TABLES-continued

| RAM | PIN-19 | PIN-20 | PIN-21 | PIN-22 | PIN-23 | PIN24 |
|---|---|---|---|---|---|---|
| U1C | U19D-13 | U19C-15 | U19E-15 | U19D-11 | U19D-9 | VCC |
| U2C | U19D-13 | U19C-14 | U19E-14 | U19D-11 | U19D-9 | VCC |
| U3C | U19D-13 | U19C-13 | U19E-13 | U19D-11 | U19D-9 | VCC |
| U4C | U19D-13 | U19C-12 | U19E-12 | U19D-11 | U19D-9 | VCC |
| U5C | U19D-13 | U19C-11 | U19E-11 | U19D-11 | U19D-9 | VCC |
| U6C | U19D-13 | U19C-10 | U19E-10 | U19D-11 | U19D-9 | VCC |
| U7C | U19D-13 | U19C-9 | U19E-9 | U19D-11 | U19D-9 | VCC |
| U8C | U19D-13 | U19C-7 | U19E-7 | U19D-11 | U19D-9 | VCC |
| U9C | U19D-13 | U19C-15 | U19E-15 | U19D-11 | U19D-9 | VCC |
| U10C | U19D-13 | U19C-14 | U19E-14 | U19D-11 | U19D-9 | VCC |
| U11C | U19D-13 | U19C-13 | U19E-13 | U19D-11 | U19D-9 | VCC |
| U12C | U19D-13 | U19C-12 | U19E-12 | U19D-11 | U19D-9 | VCC |
| U13C | U19D-13 | U19C-11 | U19E-11 | U19D-11 | U19D-9 | VCC |
| U14C | U19D-13 | U19C-10 | U19E-10 | U19D-11 | U19D-9 | VCC |
| U15C | U19D-13 | U19C-9 | U19E-9 | U19D-11 | U19D-9 | VCC |
| U16C | U19D-13 | U19C-7 | U19E-7 | U19D-11 | U19D-9 | VCC |
| U1D | U19D-13 | U19C-15 | U19E-15 | U19D-11 | U19D-9 | VCC |
| U2D | U19D-13 | U19C-14 | U19E-14 | U19D-11 | U19D-9 | VCC |
| U3D | U19D-13 | U19C-13 | U19E-13 | U19D-11 | U19D-9 | VCC |
| U4D | U19D-13 | U19C-12 | U19E-12 | U19D-11 | U19D-9 | VCC |
| U5D | U19D-13 | U19C-11 | U19E-11 | U19D-11 | U19D-9 | VCC |
| U6D | U19D-13 | U19C-10 | U19E-10 | U19D-11 | U19D-9 | VCC |
| U7D | U19D-13 | U19C-9 | U19E-9 | U19D-11 | U19D-9 | VCC |
| U8D | U19D-13 | U19C-7 | U19E-7 | U19D-11 | U19D-9 | VCC |
| U9D | U19D-13 | U19C-15 | U19E-15 | U19D-11 | U19D-9 | VCC |
| U10D | U19D-13 | U19C-14 | U19E-14 | U19D-11 | U19D-9 | VCC |
| U11D | U19D-13 | U19C-13 | U19E-13 | U19D-11 | U19D-9 | VCC |
| U12D | U19D-13 | U19C-12 | U19E-12 | U19D-11 | U19D-9 | VCC |
| U13D | U19D-13 | U19C-11 | U19E-11 | U19D-11 | U19D-9 | VCC |
| U14D | U19D-13 | U19C-10 | U19E-10 | U19D-11 | U19D-9 | VCC |
| U15D | U19D-13 | U19C-9 | U19E-9 | U19D-11 | U19D-9 | VCC |
| U16D | U19D-13 | U19C-7 | U19E-7 | U19D-11 | U19D-9 | VCC |

BASIC PROGRAM LISTING GRAPH.ASC

```
100   PRINT: PRINT: PRINT "FILE: GRAPH.ASC"
110   CLEAR
1940  R%=INP (236): S%=R% AND 1: IF S%=1 THEN 1940     'LOCKUP ON VERT.SYNC=1
1980  R%=INP (236): S%=R% AND 16: IF S%=0 THEN 1940    'CHECK FIELD
1990  OUT 236,64     'INITIALIZE GRAPHICS GENERATOR
1992  R%=INP (236): S%=R% AND 1
1993  IF S%=0 THEN 1992      'LOCKUP ON VERT.SYNC=0
1994  OUT 236,0                  'COMMAND LOAD, RUN-BAR
1995        OUT 238, 246: OUT 237, 0: OUT 236,128: OUT 236,0        'X-ROW MSH
1996        OUT 238, 247: OUT 237, 0: OUT 236,128: OUT 236,0        'X-ROW LSH
1997        OUT 238,242: OUT 237, 0: OUT 236,128: OUT 236,0         'X-PIXEL SLOPE MSH
1998        OUT 238,245: OUT 237, 0: OUT 236,128: OUT 236,0         'Y-PIXEL SLOPE MSH
1999        OUT 238,248: OUT 237, 0: OUT 236,128: OUT 236,0         'X-ROW SLOPE MSH
2000        OUT 238,251: OUT 237, 0: OUT 236,128: OUT 236,0         'Y-ROW SLOPE MSH
2001        OUT 238,244: OUT 237, 0: OUT 236,128: OUT 236,0         'Y-PIXEL SLOPE LSH
2002        OUT 238,240: OUT 237, 0: OUT 236,128: OUT 236,0         'X-ROW SLOPE LSH
2003        OUT 238,243: OUT 237, 255: OUT 236,128: OUT 236,0       'X-PIXEL SLOPE LSH
2004        OUT 238,241: OUT 237, 255: OUT 236,128: OUT 236,0       'Y-ROW SLOPE LSH
2005  OUT 236,80 'COMMAND RUN, LOAD-BAR ;PULSE-1 BRACKETING COMPUTATION PERIOD
2006  R%=INP (236): S%=R% AND 1: IF S%=1 THEN 2006     'LOCKUP ON VERT.SYNC=1
2007  R%=INP (236): S%=R% AND 16: IF S%=0 THEN 2006    'CHECK FIELD
2060  'ITERATIVE PROCESSING
2100  OUT 236,64
2140  'RESYNCHRONIZATION AND FIELD CONTROL PROCESSOR
2220  R%=INP (236): S%=R% AND 1
2300  IF S%=0 THEN 2220     'LOCKUP ON VERT.SYNC=0
3060        'INTERLACED SCAN CALCULATIONS
3100        'INPUT BYTE    128 064 032 016 008 004 002 001
3140        '                   F2      F1      LS      FS
```

TABLES-continued

```
3180   OUT 236,0                       'COMMAND LOAD, RUN-BAR
3220   R%=INP (236): S%=R% AND 16: IF S%=0 THEN 3540 ELSE 3260   'CHECK
FIELD              'FIELD-2
3300      'OUTPUT POSITION PARAMETERS
3340          OUT 238, 249: OUT 237, 0: OUT 236,128: OUT 236,0    'Y-ROW
MSH
3380          OUT 238, 250: OUT 237, 4: OUT 236,128: OUT 236,0    'Y-ROW
LSH
3500   GOTO 4140
3540               'FIELD-1
3580      'OUTPUT POSITION PARAMETERS
3620          OUT 238, 249: OUT 237, 0: OUT 236,128: OUT 236,0    'Y-ROW
MSH
3660          OUT 238, 250: OUT 237, 0: OUT 236,128: OUT 236,0    'Y-ROW
LSH
4140   OUT 236,80    'COMMAND RUN, LOAD-BAR ;PULSE-1 BRACKETING
COMPUTATION PERIOD
4220   GOTO 2060                              'LOOP BACK FOR NEXT FIELD
20000  END
```

BASIC PROGRAM LISTING LD.ASC

```
50     PRINT "ACCESSED "LD" FILE TO LOAD IMAGE MEMORY: REV.5/15/84
09:00"
55     INPUT "MURPHY (M) OR CAMILLE (C)";K200$
100    INT1%=0: D%=0: K8%=1: K9%=1
112    PRINT: PRINT "*******************************************"
114    PRINT "     SELECT OPERATION"
116    PRINT "*****************************************": PRINT
118    PRINT "RETURN TO OPERATING SYSTEM . . . . . . . . . . . . . . . . . . . .          0"
120    PRINT "SELECT OVERLAY FOR LOADING INTO IMAGE MEMORY . . .                          1"
122    PRINT "SELECT IMAGE TO BE LOADED INTO IMAGE MEMORY"
124    PRINT "              CONCENTRIC SQUARE FRAMES . . . . . . . . . . . . . . . .      2"
126    PRINT "              RECTANGLES AND LINES . . . . . . . . . . . . . . . . . . .    3"
128    PRINT "              SPIRALS . . . . . . . . . . . . . . . . . . . . . . . . . . . 4"
130    PRINT "              VIEWPORT COORDINATE SYMBOLS . . . . . . . . . . . .           5"
132    PRINT "              PATTERN #6 . . . . . . . . . . . . . . . . . . . . . . . . .  6"
134    PRINT "              PATTERN #7 . . . . . . . . . . . . . . . . . . . . . . . . .  7"
136    PRINT "              SQUARE PATTERN . . . . . . . . . . . . . . . . . . . . . .    8"
138    PRINT "              SQUARE FRAMES . . . . . . . . . . . . . . . . . . . . . . . . 9"
140    PRINT "              PERIPHERAL SQUARES . . . . . . . . . . . . . . . . . . . .    10"
141    PRINT "              PERIPHERAL TRIANGLES . . . . . . . . . . . . . . . . . .      11"
142    PRINT "              HOUSE . . . . . . . . . . . . . . . . . . . . . . . . . . . . 12"
151    INPUT "                     SELECT OPERATION NUMBER";A20
152    IF A20%<13 THEN 155
153    PRINT "****************": PRINT "IMPROPER SELECTION": PRINT
"****************"
154    GOTO 112
155    IF A20%>0 THEN 158
156           SYSTEM
158    ON A20% GOSUB 170, 4400, 4530, 5500, 4500, 7500, 8500, 9000,
9040, 9180, 9280, 11070
159    GOTO 112
170    PRINT: PRINT "*******************************************"
171    PRINT "    SELECT OVERLAY FOR LOADING INTO IMAGE MEMORY"
172    PRINT "*********************************************": PRINT
173    PRINT "  RETURN TO MAIN MENU . . . . . . . . . . . . . . . . . . . . . . . . .     0"
174    PRINT "  SELECT RECTANGULAR IMAGE MEMORY PATTERN"
180    PRINT "              HORIZONTAL BARS"
200    PRINT "                 3-2-2 WIDTH BARS, INTENSITY VARATIONS .                    1"
220    PRINT "                 1-1-1 WIDTH BARS, MAXIMUM INTENSITY . . .                  2"
240    PRINT "                 LINEAR COUNT, ALL COLOR COMBINATIONS . .                   8"
260    PRINT "              SOLID SINGLE COLORED IMAGES"
265    PRINT "                 RECTANGLE . . . . . . . . . . . . . . . . . . . . . . . . . 3"
270    PRINT "                 BACKGROUND . . . . . . . . . . . . . . . . . . . . . . . .  4"
400    PRINT "              CHECKERBOARD"
420    PRINT "                 4-COLORS . . . . . . . . . . . . . . . . . . . . . . . . .  6"
440    PRINT "                 2-COLORS . . . . . . . . . . . . . . . . . . . . . . . . .  7"
442    PRINT "              VARIABLE SINGLE COLORS"
443    PRINT "                 GREEN SAWTOOTH . . . . . . . . . . . . . . . . . . . . .    10"
460    PRINT "              CENTER ELEMENT"
480    PRINT "                 9-PIXEL SQUARE . . . . . . . . . . . . . . . . . . . . .    11"
482    PRINT "  SELECT SLOPING LINE . . . . . . . . . . . . . . . . . . . . . . . . .     12"
484    INPUT "
NUMBER";A5%
486    IF A5%>0 THEN 502
500           RETURN
502    IF A5%<13 THEN 520
503    PRINT "****************": PRINT "IMPROPER SELECTION": PRINT
```

TABLES-continued

```
"***************"
504     GOTO 170
520     IF A5%=3 OR A5%=4 OR A5%=12 THEN 523 ELSE 535
523     PRINT "COLOR CODE"
524     PRINT "          BLACK . . . . . . . .     0"
526     PRINT "          GREEN . . . . . . . .     1 TO 7"
527     PRINT "          RED . . . . . . . . . .   8, 16, 24"
528     PRINT "          BLUE . . . . . . . . .   32, 64, 96"
529     INPUT"                    SELECT COLOR CODE
SUM";INT1%
530     IF INT1%<128 THEN 535
531     PRINT:PRINT "*************************************"
532     PRINT "IMPROPER COLOR CODE; ENTER COLOR CODE AGAIN"
533     PRINT "****************************************":PRINT
534     GOTO 523
535     IF A5%=11 THEN 2040
540     IF A5%=6 OR A5%=7 GOTO 560 ELSE 570
560             INPUT "CHECKERBOARD RESOLUTION, PIXELS PER SIDE";A6%
570     IF A5%=4 THEN 575 ELSE 580
575             A5%=3: XB%=0: YB%=0: XE%=511: YE%=511: GOTO 623
580     INPUT "    START PIXEL COORDINATE";XB%,YB%
620     INPUT "    STOP  PIXEL COORDINATE";XE%,YE%
623     GOSUB 630
624     GOTO 170
630     '*************************************************
632     'SUBROUTINE TO OVERLAY A RECTANGLE
635             XB%=(XB%+1)*8: YB%=(YB%+1)*8
640             XE%=(XE%+1)*8: YE%=(YE%+1)*8
642'    IF XB%=>8 AND XB%<XE% AND XE%=>8 AND XB%=<512*8 AND
XE%=<512*8 THEN 643 ELSE 656
643'    IF YB%=>8 AND YB%<YE% AND YE%=>8 AND YB%=<512*8 AND
YE%=<512*8 THEN 660 ELSE 656
656'    PRINT:PRINT "**************************************"
657'    PRINT "IMPROPER PIXEL COORDINATES, ENTER PIXEL COORDINATES
AGAIN"
658'    PRINT "****************************************":PRINT
659'    GOTO 580
660'    PRINT: PRINT "****************************************"
665'    PRINT "          IMAGE MEMORY IS BEING LOADED"     'PRINT
"ROW","COLOR INTENSITY"
666'    PRINT "*********************************************": PRINT
667     IF A5%=12 THEN 4200
690     XPS%=256: YPS%=0: XRP%=XB%-8
695     GOSUB 3000
700     FOR OUTLP1%=YB% TO YE% STEP 8             'ROW LOOP
710     YRP%=OUTLP1%-8              'UPDATE TO NEXT ROW
711     XRP%=XB%-8
712     GOSUB 3000                  'LOAD IMP REGISTERS
948     OUT 236,32                  'SET SEQUENTIAL LOAD COMMAND
1230    'DETERMINE INTENSITY (INT1%)
1240    ON A5% GOTO 1260,1460,1720,1250,1250,1920,1980,1800,1250,1820
1250    PRINT "*************": PRINT "SELECT A DIFFERENT IMAGE":
PRINT "************"
1260    IF D%<8 THEN 1340           'IMAGE PATTERN 1
1280    IF D%<32 THEN 1380          ' !-64-32-!-16-08-!-04-02-01-!
1300    IF D%<128 THEN 1420         ' ! BLUE ! RED   ! GREEN    !
1320    INT1%=0: D%=0: GOTO 1980
1340    INT1%=D% AND 7
                D%=D%+1: GOTO 1980
1380    INT1%=D% AND 24
1400            D%=D%+8: GOTO 1980
1420    INT1%=D% AND 96
1440            D%=D%+32: GOTO 1980
1460    A3%=FIX ((OUTLP1%-8)/8)                    'IMAGE PATTERN 2
1480    GOSUB 1520
1500    GOTO 1980
1520    '***** SUBROUTINE, MAXIMUM COLOR *******************
1540            A4%=A3% AND 3
1560            A7%=A4%+1
1580            ON A7% GOTO 1600, 1620, 1640, 1660
1600            INT1%=0: GOTO 1680
1620            INT1%=7: GOTO 1680
1640            INT1%=24: GOTO 1680
1660            INT1%=96
1680    RETURN
1700 '********************************************************
1720            INT1%=INT1%: GOTO 1980              'PATTERN-3, SOLID COLOR
1800            K2%=(OUTLP1%-8)/8: INT1%= K2% AND 127: GOTO 1980        'PAT
LINEAR COUNT
```

TABLES-continued

```
1820    INT1%=K8%: K10%=K9% AND 1
1840    IF K10%=0 THEN 1920
1860    K8%=K8%+1                                          'UPCOUNT, ADD
1880    IF K8%<8 THEN 1980
1900      K9%=K9%+1: K8%=6: GOTO 1980                               'CHANGE COUNT DIRECT
1920    K8%=K8*-1
1940    IF K8%>0 THEN 1980
1960      K9%=K9%+1: K8%=2: GOTO 1980
1980    SP1%=INIT1% AND 1: SP2%= INIT1 AND 3: SP3%=INT1% AND 7:
SP4%=INT1% AND 15: SP5%=INT1% AND 31: SP6%=INT1% AND 63:
SP7%=INT1% AND 127
1985    OUT 238, 252: OUT 237, SP1%: OUT 237, SP2%: OUT 237, SP3%:
OUT 237, SP4%: OUT 237,SP5%: OUT 237,SP6%: OUT 237, SP7%: OUT
237, INT1%    'DATA TO LOAD IN IMAGE MEMORY
1991    ON A5% GOTO
1994,1994,1994,1994,1994,1992,1993,1994,1994,1994
1992    A3%=FIX((2*OUTLP1%+INLP1%)/A6%): GOSUB 1520: GOTO 1994
1993    A3%=FIX((2*OUTLP1%+2*INLP1%)/A6%): GOSUB 1520: GOTO 1994
1994    FOR INLP1%=XB% TO XE% STEP 8         'PIXEL LOOP
1995    OUT 236,160: OUT 236,32
1996    NEXT INLP1%
1997    OUT 237, SP7%: OUT 237, SP6%: OUT 237, SP5%: OUT 237, SP4%:
OUT 237,SP3%: OUT 237,SP2%: OUT 237, SP1%: OUT 237,0      'DATA TO LOAD
IN IMAGE MEMORY
1999    IF K200$="M" THEN
2000    A8%=INP (93): A8%=A8% AND 2: IF A8%=0 THEN 2009               'OPERATOR
RESET
2001    A8%=INP (92): GOTO 2006
2002    A8%=INP (1): A8%=A8% AND 2: IF A8%=0 THEN 2009                'OPERATOR
RESET
2003    A8%=INP (0)
2006            A9%=A8% XOR 155: IF A9%=0 THEN 100    'ESCAPE TO MENU
2007            A9%=A8% XOR 127: IF A9%=0 THEN 2008 ELSE 2009         'DELETE TO
SYSTEM
2008                    SYSTEM
2009    NEXT OUTLP1%
2010'   PRINT CHR$(7); :PRINT 'MEMORY LOAD COMPLETE"
2020    RETURN          'RETURN TO OVERLAY MENU
2040    'PATTERN 11
2060    INT1%=7: K17%=(256-3)*8: K18%=(256+3)*8
2080    FOR OUTLP1%=K17% TO K18% STEP 8
2100      OUT 238, 249                          'Y-ROW MSH
2120          C%=FIX(OUTLP1%/64): OUT 237, C%: OUT 236,129: OUT 236,1
2140      OUT 238, 250                          'Y-ROW LSH
2160          C%=OUTLP1% AND 63: OUT 237, C%: OUT 236,129: OUT 236,1
2180    FOR INLP1%=K17% TO K18% STEP 8                  'PIXEL LOOP
2200      OUT 238, 246                          'X-ROW MSH
2220          C%=FIX(INLP1%/64): OUT 237, C%: OUT 236,129: OUT 236,1
2240      OUT 238, 247                          'X-ROW LSH
2260          C%=INLP1% AND 63: OUT 237, C%: OUT 236,129: OUT 236,1
2280      OUT 238, 252                          'DATA TO LOAD IN IMAGE MEMORY
2300    OUT 237, INT1%: OUT 236,129: OUT 236,1
2320    NEXT INLP1%
2340    NEXT OUTLP1%
2360      OUTLP1%=(256-5)*8
2380      OUT 238, 249                          'Y-ROW MSH
2400          C%=FIX(OUTLP1%/64): OUT 237, C%: OUT 236,129: OUT 236,1
2420      OUT 238, 250                          'Y-ROW LSH
2440          C%=OUTLP1% AND 63: OUT 237, C%: OUT 236,129: OUT 236,1
2460    K17%=(256-6)*8: K18%=(256)*8
2480    FOR INLP1%=K17% TO K18% STEP 8                  'PIXEL LOOP
2500      OUT 238, 246                          'X-ROW MSH
2520          C%=INLP1%/64): OUT 237, C%: OUT 236,129: OUT 236,1
2540      OUT 238, 247                          'X-ROW LSH
2560          C%=INLP1% AND 63: OUT 237, C%: OUT 236,129: OUT 236,1
2580      OUT 238, 252                          'DATA TO LOAD IN IMAGE MEMORY
2600    OUT 237, INT1%: OUT 236,129: OUT 236,1
2620    NEXT INLP1%
2640    GOTO 2000
3000    '************** SUBROUTINE TO OUTPUT POSITION AND SLOPE
PARAMETERS
3001    OUT 236,0       'D0A5 TURNED OFF TO DISABLE SEQUENCING DURING
LOADING OF REGISTERS
3002    'SLOPE SCALE FACTOR=256*PIXELS/STEP
3003    'POSITION SCALE FACTOR =8*PIXELS
3004    XPSM%=FIX(XPS%/64):      XPSL%=XPS% AND 63
3005        OUT 238,242: OUT 237,XPSM%: OUT 236,128: OUT
236,0   'X-PIXEL SLOPE MSH
3006        OUT 238,243: OUT 237,XPSL%: OUT 236,128: OUT 236,0          'X-
```

TABLES-continued

```
PIXEL SLOPE LSH
3007    YPSM%=FIX(YPS%/64):     YPSL%=YPS% AND 63
3008            OUT 238,245: OUT 237,YPSM%: OUT 236,128: OUT 236,0          'Y-
PIXEL SLOPE MSH
3009            OUT 238,244: OUT 237,YPSL%: OUT 236,128: OUT 236,0          'Y-
PIXEL SLOPE LSH
3010'   OUT 236, 0      'SUBROUTINE ENTRY POINT
3020    XRPM%=FIX(XRP%/64):     XRPL%=XRP% AND 63
3091    YRPM%=FIX(YRP%/64):     YRPL%=YRP% AND 63                           'FORMAT POSI
OUTPUTS
3095            OUT 238,249: OUT 237,YRPM%: OUT 236,128: OUT 236,0          'Y-ROW
MSH (Y-PIXEL MSH)
3096            OUT 238,250: OUT 237,YRPL%: OUT 236,128: OUT 236,0          'Y-ROW
LSH (Y-PIXEL LSH)
3097            OUT 238,246: OUT 237,XRPM%: OUT 236,128: OUT 236,0          'X-ROW
MSH (X-PIXEL MSH)
3098            OUT 238,247: OUT 237,XRPL%: OUT 236,128: OUT 236,0          'X-ROW
LSH (X-PIXEL LSH)
4200    '****************************************************
4210    'DRAW A LINE
4220    DX=XE%-XB%: DY=YE%-YB%
4221    DTG=0
4222    IF DX=0 AND DY=0 THEN 4228
4224    IF ABS(DX)>ABS(DY) THEN 4227
4226    YSP%=(DY*256)/ABS(DY): XPS%=(DX*256)/ABS(DY):   DTG=ABS(DY):
GOTO 4228
4227    YPS%=(DY*256)/ABS(DX): XPS%=(DX*256)/ABS(DX):   DTG=ABS(DX)
4228    XRP%=XB%-8: YRP%=YB%-8
4255    GOSUB 3000
4270    OUT 238, 252: OUT 237, INT1%                'DATA TO LOAD IN IMAGE MEMOR
4273    OUT 236,32                          'SET SEQUENTIAL LOAD COMMAND
4274    DTG=DTG+8
4276    IF DTG>8 THEN 4288
4287    OUT 236,160: OUT 236,32: GOTO 4305
4288    FOR INLP1=8 TO DTG STEP 8                   'PIXEL LOOP
4390     OUT 236,160: OUT 236,32
4300     NEXT INLP1
4305    OUT 236,0                           'RESET SEQUENTIAL LOAD COMMAND
4350    RETURN
4400    '**************************************************
4410    INIT1%=7: XB%=225: YB%=255: YPS%=0: XPS%=256
4420    FOR OUTLP1%=1 TO 10
4435    XRP%=XB%: YB%=YB%
4437    XB%=XB%-1: YB%=YB%+1
4440    DX=2*OUTLP1%+1
4470    GOSUB 3000
4480    OUT 238, 252: OUT 237, INT1%                'DATA TO LOAD IN IMAGE MEMOR
4484    OUT 236,32                          'SET SEQUENTIAL LOAD COMMAND
4488    FOR INLP1=8 TO DX STEP 8                    'PIXEL LOOP
4492     OUT 236,160: OUT 236,32
4493     NEXT INLP1
4495    OUT 236,0                           'RESET SEQUENTIAL LOAD COMMAND
4497    RETURN
4500    '***************************************************
4510    'BLACK BACKGROUND WITH COORDINATE SYMBOLS
4520'   A5%=3:    INT1%=0:    XB%=0:      YB%=0:      XE%=511:    YE%=511:
GOSUB 630
4522    A5%=12:   INT1%=3:    XB%=0:      YB%=0:      XE%=0:      YE%=511:
GOSUB 630
4523    A5%=12:   INT1%=3:    XB%=0:      YB%=0:      XE%=511:    YE%=0:
GOSUB 630
4524    A5%=3:    INT1%=3:    XB%=252:    YB%=252:    XE%=258:    YE%=258:
GOSUB 630
4525    A5%=3:    INT1%=3:    XB%=250:    YB%=250:    XE%=260:    YE%=260:
GOSUB 630
4526    A5%=3:    INT1%=3:    XB%=0:      YB%=0:      XE%=10:     YE%=10:
GOSUB 630
4527    RETURN
4530    '***************************************************
4531    'RECTANGLE AND LINE PATTERN
4540    A5%=3:    INT1%=24:   XB%=100:    YB%=400:    XE%=200:    YE%=500:
GOSUB 630
4550    A5%=1:                XB%=400:    YB%=100:    XE%=500:    YE%=200:
GOSUB 630
4555    A5%=10:               XB%=100:    YB%=100:    XE%=200:    YE%=200:
GOSUB 630
4556    A5%=12:   INT1%=24:   XB%=0:      YB%=0:      XE%=511:    YE%=511:
GOSUB 630
4557    A5%=12:   INT1%=24:   XB%=0:      YB%=511:    XE%=511:    YE%=0:
```

TABLES-continued

```
GOSUB 630
4561    RETURN
5500    '****************************************************
5510    'SPIRAL LINES
5535    A5%=12:   INT1%=24:   XB%=0:     YB%=0:     XE%=10000:   YE%=200:
GOSUB 630
5540    A5%=12:   INT1%=96:   XB%=0:     YB%=511:   XE%=30000:   YE%=200:
GOSUB 630
5561    RETURN
6500    '****************************************************
6520    A5%=3:    INT1%=96:   XB%=0:     YB%=0:     XE%=511:     YE%=511:
GOSUB 630
6530    A5%=3:    INT1%=24:   XB%=100:   YB%=500:   XE%=200:     YE%=400:
GOSUB 630
6550    A5%=1:                XB%=500:   YB%=100:   XE%=400:     YE%=200:
GOSUB 630
6560    A5%=10:               XB%=100:   YB%=100:   XE%=200:     YE%=200:
GOSUB 630
6561    RETURN
7500    '****************************************************
7520    A5%=3:    INT1%=96:   XB%=0:     YB%=0:     XE%=511:     YE%=511:
GOSUB 630
7530    A5%=3:    INT1%=24:   XB%=100:   YB%=500:   XE%=200:     YE%=400:
GOSUB 630
7535    A5%=12:   INT1%=24:   XB%=0:     YB%=0:     XE%=511:     YE%=511:
GOSUB 630
7540    A5%=12:   INT1%=24:   XB%=0:     YB%=511:   XE%=511:     YE%=0:
GOSUB 630
7550    A5%=1:                XB%=500:   YB%=100:   XE%=400:     YE%=200:
GOSUB 630
7560    A5%=10:               XB%=100:   YB%=100:   XE%=200:     YE%=200:
GOSUB 630
7561    RETURN
8500    '****************************************************
8520    A5%=3:    INT1%=96:   XB%=0:     YB%=0:     XE%=511:     YE%=511:
GOSUB 630
8530    A5%=3:    INT1%=24:   XB%=100:   YB%=500:   XE%=200:     YE%=400:
GOSUB 630
8535    A5%=12:   INT1%=24:   XB%=0:     YB%=0:     XE%=511:     YE%=511:
GOSUB 630
8540    A5%=12:   INT1%=24:   XB%=0:     YB%=511:   XE%=511:     YE%=0:
GOSUB 630
8550    A5%=1:                XB%=500:   YB%=100:   XE%=400:     YE%=200:
GOSUB 630
8560    A5%=10:               XB%=100:   YB%=100:   XE%=200:     YE%=200:
GOSUB 630
8561    RETURN
9000    '********************************************************
9001    A5%=3:    INT1%=7:    XB%=128:   YB%=128:   XE%=256:     YE%=256:
GOSUB 630
9010    A5%=3:    INT1%=16:   XB%=256:   YB%=128:   XE%=384:     YE%=256:
GOSUB 630
9020    A5%=3:    INT1%=96:   XB%=256:   YB%=256:   XE%=384:     YE%=384:
GOSUB 630
9030    A5%=3:    INT1%=24:   XB%=128:   YB%=256:   XE%=256:     YE%=386:
GOSUB 630
9031    RETURN
9032    '********************************************************
9040    A5%=3:    INT1%=32:   XB%=0:     YB%=0:     XE%=511:     YE%=511:
GOSUB 630
9050    A5%=3:    INT1%=7:    XB%=104:   YB%=104:   XE%=127:     YE%=407:
GOSUB 630
9060    A5%=3:    INT1%=7:    XB%=104:   YB%=104:   XE%=407:     YE%=127:
GOSUB 630
9070    A5%=3:    INT1%=7:    XB%=104:   YB%=384:   XE%=407:     YE%=407:
GOSUB 630
9080    A5%=3:    INT1%=7:    XB%=384:   YB%=104:   XE%=407:     YE%=407:
GOSUB 630
9090    A5%=3:    INT1%=24:   XB%=150:   YB%=150:   XE%=173:     YE%=361:
GOSUB 630
9100    A5%=3:    INT1%=24:   XB%=150:   YB%=150:   XE%=361:     YE%=173:
GOSUB 630
9110    A5%=3:    INT1%=24:   XB%=150:   YB%=338:   XE%=361:     YE%=361:
GOSUB 630
9120    A5%=3:    INT1%=24:   XB%=338:   YB%=150:   XE%=361:     YE%=361:
GOSUB 630
9130    A5%=3:    INT1%=96:   XB%=196:   YB%=196:   XE%=219:     YE%=315:
GOSUB 630
9140    A5%=3:    INT1%=96:   XB%=196:   YB%=196:   XE%=315:     YE%=219:
```

TABLES-continued

```
GOSUB 630
9150  A5%=3:   INT1%=96:  XB%=196:  YB%=292:  XE%=315:  YE%=315:
GOSUB 630
9160  A5%=3:   INT1%=96:  XB%=292:  YB%=196:  XE%=315:  YE%=315:
GOSUB 630
9171  RETURN
9172  '*******************************************************
9180  A5%=3:   INT1%=96:  XB%=0:    YB%=0:    XE%=511:  YE%=511:
GOSUB 630
9190  A5%=1:              XB%=96:   YB%=96:   XE%=159:  YE%=159:
GOSUB 630
9200  A5%=1:              XB%=352:  YB%=352:  XE%=415:  YE%=415:
GOSUB 630
9210  A5%=10:             XB%=96:   YB%=352:  XE%=159:  YE%=415:
GOSUB 630
9220  A5%=10:             XB%=352:  YB%=96:   XE%=415:  YE%=159:
GOSUB 630
9230  A5%=3:   INT1%=24:  XB%=224:  YB%=224:  XE%=287:  YE%=287:
GOSUB 630
9240  A5%=12:  INT1%=7:   XB%=159:  YB%=159:  XE%=224:  YE%=224:
GOSUB 630
9250  A5%=12:  INT1%=7:   XB%=287:  YB%=287:  XE%=352:  YE%=352:
GOSUB 630
9260  A5%=12:  INT1%=7:   XB%=159:  YB%=352:  XE%=224:  YE%=287:
GOSUB 630
9270  A5%=12:  INT1%=7:   XB%=287:  YB%=224:  XE%=352:  YE%=159:
GOSUB 630
9271  RETURN
9272  '*******************************************************
9280  A5%=3:   INT1%=96:  XB%=0:    YB%=0:    XE%=511:  YE%=511:
GOSUB 630
9300  A5%=12:  INT1%=7:   XB%=5:    YB%=6:    XE%=252:  YE%=253:
GOSUB 630
9310  A5%=12:  INT1%=7:   XB%=259:  YB%=260:  XE%=506:  YE%=507:
GOSUB 630
9320  A5%=12:  INT1%=7:   XB%=5:    YB%=507:  XE%=252:  YE%=260:
GOSUB 630
9330  A5%=12:  INT1%=7:   XB%=259:  YB%=253:  XE%=506:  YE%=6:
GOSUB 630
9340  A5%=12:  INT1%=96:  XB%=5:    YB%=5:    XE%=252:  YE%=252:
GOSUB 630
9350  A5%=12:  INT1%=96:  XB%=259:  YB%=259:  XE%=506:  YE%=506:
GOSUB 630
9360  A5%=12:  INT1%=96:  XB%=5:    YB%=506:  XE%=252:  YE%=259:
GOSUB 630
9370  A5%=12:  INT1%=96:  XB%=259:  YB%=252:  XE%=506:  YE%=5:
GOSUB 630
9380  A5%=12:  INT1%=24:  XB%=5:    YB%=4:    XE%=252:  YE%=251:
GOSUB 630
9390  A5%=12:  INT1%=24:  XB%=259:  YB%=258:  XE%=506:  YE%=505:
GOSUB 630
9400  A5%=12:  INT1%=24:  XB%=5:    YB%=505:  XE%=252:  YE%=258:
GOSUB 630
9410  A5%=12:  INT1%=24:  XB%=259:  YB%=251:  XE%=506:  YE%=4:
GOSUB 630
9420  A5%=3:   INT1%=7:   XB%=0:    YB%=0:    XE%=511:  YE%=511:
GOSUB 630
9430  A5%=3:   INT1%=7:   XB%=0:    YB%=0:    XE%=0:    YE%=511:
GOSUB 630
9440  A5%=3:   INT1%=7:   XB%=511:  YB%=0:    XE%=511:  YE%=511:
GOSUB 630
9450  A5%=3:   INT1%=7:   XB%=0:    YB%=511:  XE%=511:  YE%=511:
GOSUB 630
9460  A5%=3:   INT1%=96:  XB%=1:    YB%=1:    XE%=510:  YE%=1:
GOSUB 630
9470  A5%=3:   INT1%=96:  XB%=1:    YB%=1:    XE%=1:    YE%=510:
GOSUB 630
9480  A5%=3:   INT1%=96:  XB%=510:  YB%=1:    XE%=510:  YE%=510:
GOSUB 630
9490  A5%=3:   INT1%=96:  XB%=510:  YB%=510:  XE%=510:  YE%=510:
GOSUB 630
9500  A5%=3:   INT1%=24:  XB%=2:    YB%=2:    XE%=509:  YE%=2:
GOSUB 630
9510  A5%=3:   INT1%=24:  XB%=2:    YB%=2:    XE%=2:    YE%=509:
GOSUB 630
9520  A5%=3:   INT1%=24:  XB%=509:  YB%=2:    XE%=509:  YE%=509:
GOSUB 630
9530  A5%=3:   INT1%=24:  XB%=2:    YB%=509:  XE%=509:  YE%=509:
GOSUB 630
```

TABLES-continued

```
9540 A5%=3: INT1%=7: XB%=3: YB%=3: XE%=508: YE%=3:
GOSUB 630
9550 A5%=3: INT1%=7: XB%=3: YB%=3: XE%=3: YE%=508:
GOSUB 630
9560 A5%=3: INT1%=7: XB%=508: YB%=3: XE%=508: YE%=508:
GOSUB 630
9570 A5%=3: INT1%=7: XB%=3: YB%=508: XE%=508: YE%=508:
GOSUB 630
9580 A5%=3: INT1%=96: XB%=4: YB%=4: XE%=507: YE%=4:
GOSUB 630
9590 A5%=3: INT1%=96: XB%=4: YB%=4: XE%=4: YE%=507:
GOSUB 630
9600 A5%=3: INT1%=96: XB%=507: YB%=4: XE%=507: YE%=507:
GOSUB 630
9610 A5%=3: INT1%=96: XB%=4: YB%=507: XE%=507: YE%=507:
GOSUB 630
9620 A5%=3: INT1%=24: XB%=5: YB%=5: XE%=506: YE%=5:
GOSUB 630
9630 A5%=3: INT1%=24: XB%=5: YB%=5: XE%=5: YE%=506:
GOSUB 630
9640 A5%=3: INT1%=24: XB%=506: YB%=5: XE%=506: YE%=506:
GOSUB 630
9650 A5%=3: INT1%=24: XB%=5: YB%=506: XE%=506: YE%=506:
GOSUB 630
9660 A5%=12: INT1%=7: XB%=192: YB%=128: XE%=319: YE%=128:
GOSUB 630
9670 A5%=12: INT1%=96: XB%=193: YB%=129: XE%=318: YE%=129:
GOSUB 630
9680 A5%=12: INT1%=24: XB%=194: YB%=130: XE%=317: YE%=130:
GOSUB 630
9690 A5%=12: INT1%=7: XB%=200: YB%=136: XE%=311: YE%=136:
GOSUB 630
9700 A5%=12: INT1%=96: XB%=201: YB%=137: XE%=310: YE%=137:
GOSUB 630
9710 A5%=12: INT1%=24: XB%=202: YB%=138: XE%=309: YE%=138:
GOSUB 630
9720 A5%=12: INT1%=7: XB%=208: YB%=144: XE%=303: YE%=144:
GOSUB 630
9730 A5%=12: INT1%=96: XB%=209: YB%=145: XE%=302: YE%=145:
GOSUB 630
9740 A5%=12: INT1%=24: XB%=210: YB%=146: XE%=301: YE%=146:
GOSUB 630
9750 A5%=12: INT1%=7: XB%=216: YB%=152: XE%=295: YE%=152:
GOSUB 630
9760 A5%=12: INT1%=96: XB%=217: YB%=153: XE%=294: YE%=153:
GOSUB 630
9770 A5%=12: INT1%=24: XB%=218: YB%=154: XE%=293: YE%=154:
GOSUB 630
9780 A5%=12: INT1%=7: XB%=224: YB%=160: XE%=287: YE%=160:
GOSUB 630
9790 A5%=12: INT1%=96: XB%=225: YB%=161: XE%=286: YE%=161:
GOSUB 630
9800 A5%=12: INT1%=24: XB%=226: YB%=162: XE%=285: YE%=162:
GOSUB 630
9810 A5%=12: INT1%=7: XB%=232: YB%=168: XE%=279: YE%=168:
GOSUB 630
9820 A5%=12: INT1%=96: XB%=233: YB%=169: XE%=278: YE%=169:
GOSUB 630
9830 A5%=12: INT1%=24: XB%=234: YB%=170: XE%=277: YE%=170:
GOSUB 630
9840 A5%=12: INT1%=7: XB%=240: YB%=176: XE%=271: YE%=176:
GOSUB 630
9850 A5%=12: INT1%=96: XB%=241: YB%=177: XE%=270: YE%=177:
GOSUB 630
9860 A5%=12: INT1%=24: XB%=242: YB%=178: XE%=269: YE%=178:
GOSUB 630
9870 A5%=12: INT1%=7: XB%=248: YB%=184: XE%=263: YE%=184:
GOSUB 630
9890 A5%=12: INT1%=96: XB%=249: YB%=185: XE%=262: YE%=185:
GOSUB 630
9900 A5%=12: INT1%=24: XB%=250: YB%=186: XE%=261: YE%=186:
GOSUB 630
9910 A5%=3: INT1%=7: XB%=255: YB%=192: XE%=256: YE%=192:
GOSUB 630
9920 A5%=3: INT1%=7: XB%=255: YB%=420: XE%=256: YE%=420:
GOSUB 630
9930 A5%=12: INT1%=7: XB%=250: YB%=426: XE%=261: YE%=426:
GOSUB 630
9940 A5%=12: INT1%=96: XB%=249: YB%=427: XE%=262: YE%=427:
```

TABLES-continued

```
GOSUB 630
9950   A5%=12:   INT1%=24:   XB%=248:   YB%=428:   XE%=263:   YE%=428:
GOSUB 630
9960   A5%=12:   INT1%=7:    XB%=242:   YB%=434:   XE%=269:   YE%=434:
GOSUB 630
9970   A5%=12:   INT1%=96:   XB%=241:   YB%=435:   XE%=270:   YE%=435:
GOSUB 630
9980   A5%=12:   INT1%=24:   XB%=240:   YB%=436:   XE%=271:   YE%=436:
GOSUB 630
9990   A5%=12:   INT1%=7:    XB%=234:   YB%=442:   XE%=277:   YE%=442:
GOSUB 630
10000  A5%=12:   INT1%=96:   XB%=233:   YB%=443:   XE%=278:   YE%=443:
GOSUB 630
10010  A5%=12:   INT1%=24:   XB%=232:   YB%=444:   XE%=279:   YE%=444:
GOSUB 630
10020  A5%=12:   INT1%=7:    XB%=226:   YB%=450:   XE%=285:   YE%=450:
GOSUB 630
10030  A5%=12:   INT1%=96:   XB%=225:   YB%=451:   XE%=286:   YE%=451:
GOSUB 630
10040  A5%=12:   INT1%=24:   XB%=224:   YB%=452:   XE%=287:   YE%=452:
GOSUB 630
10050  A5%=12:   INT1%=7:    XB%=218:   YB%=458:   XE%=293:   YE%=458:
GOSUB 630
10060  A5%=12:   INT1%=96:   XB%=217:   YB%=459:   XE%=294:   YE%=459:
GOSUB 630
10070  A5%=12:   INT1%=24:   XB%=2216:  YB%=460:   XE%=295:   YE%=460:
GOSUB 630
10080  A5%=12:   INT1%=7:    XB%=210:   YB%=466:   XE%=301:   YE%=466:
GOSUB 630
10090  A5%=12:   INT1%=96:   XB%=209:   YB%=467:   XE%=302:   YE%=467:
GOSUB 630
11000  A5%=12:   INT1%=24:   XB%=208:   YB%=468:   XE%=303:   YE%=468:
GOSUB 630
11010  A5%=12:   INT1%=7:    XB%=202:   YB%=474:   XE%=309:   YE%=474:
GOSUB 630
11020  A5%=12:   INT1%=96:   XB%=201:   YB%=475:   XE%=310:   YE%=475:
GOSUB 630
11030  A5%=12:   INT1%=24:   XB%=200:   YB%=476:   XE%=311:   YE%=476:
GOSUB 630
11040  A5%=12:   INT1%=7:    XB%=194:   YB%=482:   XE%=317:   YE%=482:
GOSUB 630
11050  A5%=12:   INT1%=96:   XB%=193:   YB%=483:   XE%=318:   YE%=483:
GOSUB 630
11059  A5%=12:   INT1%=24:   XB%=192:   YB%=484:   XE%=319:   YE%=484:
GOSUB 630
11060  A5%=3:    INT1%=24:   XB%=248:   YB%=248:   XE%=263:   YE%=263:
GOSUB 630
11061  RETURN
11062  '*******************************************************
11070  A5%=3:    INT1%=7:    XB%=0:     YB%=0:     XE%=511:   YE%=256:
GOSUB 630
11080  A5%=3:    INT1%=96:   XB%=0:     YB%=256:   XE%=511:   YE%=511:
GOSUB 630
11090  A5%=3:    INT1%=24:   XB%=256:   YB%=128:   XE%=352:   YE%=256:
GOSUB 630
12000  A5%=3:    INT1%=16:   XB%=352:   YB%=128:   XE%=432:   YE%=256:
GOSUB 630
12010  A5%=12:   INT1%=0:    XB%=256:   YB%=256:   XE%=296:   YE%=296:
GOSUB 630
12020  A5%=12:   INT1%=0:    XB%=256:   YB%=255:   XE%=296:   YE%=295:
GOSUB 630
12030  A5%=12:   INT1%=0:    XB%=256:   YB%=257:   XE%=296:   YE%=297:
GOSUB 630
12040  A5%=12:   INT1%=0:    XB%=296:   YB%=296:   XE%=392:   YE%=296:
GOSUB 630
12050  A5%=12:   INT1%=0:    XB%=296:   YB%=295:   XE%=392:   YE%=295:
GOSUB 630
12060  A5%=12:   INT1%=0:    XB%=296:   YB%=397:   XE%=392:   YE%=297:
GOSUB 630
12070  A5%=12:   INT1%=0:    XB%=392:   YB%=296:   XE%=352:   YE%=256:
GOSUB 630
12080  A5%=12:   INT1%=0:    XB%=392:   YB%=295:   XE%=352:   YE%=255:
GOSUB 630
12090  A5%=12:   INT1%=0:    XB%=392:   YB%=297:   XE%=352:   YE%=257:
GOSUB 630
13000  A5%=12:   INT1%=0:    XB%=256:   YB%=256:   XE%=352:   YE%=256:
GOSUB 630
13010  A5%=12:   INT1%=0:    XB%=256:   YB%=255:   XE%=352:   YE%=255:
GOSUB 630
```

TABLES-continued

```
13020  A5%=12:  INT1%=0:    XB%=256:  YB%=257:  XE%=352:  YE%=257:
GOSUB 630
13030  A5%=12:  INT1%=0:    XB%=256:  YB%=128:  XE%=256:  YE%=256:
GOSUB 630
13040  A5%=12:  INT1%=0:    XB%=256:  YB%=127:  XE%=256:  YE%=255:
GOSUB 630
13050  A5%=12:  INT1%=0:    XB%=256:  YB%=129:  XE%=256:  YE%=257:
GOSUB 630
13060  A5%=12:  INT1%=0:    XB%=256:  YB%=128:  XE%=432:  YE%=128:
GOSUB 630
13070  A5%=12:  INT1%=0:    XB%=256:  YB%=127:  XE%=432:  YE%=127:
GOSUB 630
13080  A5%=12:  INT1%=0:    XB%=256:  YB%=129:  XE%=432:  YE%=129:
GOSUB 630
13090  A5%=12:  INT1%=0:    XB%=352:  YB%=128:  XE%=352:  YE%=256:
GOSUB 630
14000  A5%=12:  INT1%=0:    XB%=352:  YB%=127:  XE%=352:  YE%=255:
GOSUB 630
14010  A5%=12:  INT1%=0:    XB%=352:  YB%=129:  XE%=352:  YE%=257:
GOSUB 630
14020  A5%=12:  INT1%=0:    XB%=392:  YB%=296:  XE%=432:  YE%=256:
GOSUB 630
14030  A5%=12:  INT1%=0:    XB%=392:  YB%=295:  XE%=432:  YE%=255:
GOSUB 630
14040  A5%=12:  INT1%=0:    XB%=392:  YB%=297:  XE%=432:  YE%=257:
GOSUB 630
14050  A5%=12:  INT1%=0:    XB%=432:  YB%=256:  XE%=432:  YE%=128:
GOSUB 630
14060  A5%=12:  INT1%=0:    XB%=432:  YB%=255:  XE%=432:  YE%=127:
GOSUB 630
14070  A5%=12:  INT1%=0:    XB%=432:  YB%=257:  XE%=432:  YE%=129:
GOSUB 630
14080  A5%=12:  INT1%=127:  XB%=12:   YB%=480:  XE%=12:   YE%=496:
GOSUB 630
14090  A5%=12:  INT1%=127:  XB%=12:   YB%=496:  XE%=16:   YE%=500:
GOSUB 630
15000  A5%=12:  INT1%=127:  XB%=16:   YB%=500:  XE%=32:   YE%=500:
GOSUB 630
15010  A5%=12:  INT1%=127:  XB%=32:   YB%=500:  XE%=36:   YE%=496:
GOSUB 630
15020  A5%=12:  INT1%=127:  XB%=36:   YB%=496:  XE%=36:   YE%=480:
GOSUB 630
15030  A5%=12:  INT1%=127:  XB%=36:   YB%=480:  XE%=32:   YE%=476:
GOSUB 630
15040  A5%=12:  INT1%=127:  XB%=32:   YB%=476:  XE%=16:   YE%=476:
GOSUB 630
15050  A5%=12:  INT1%=127:  XB%=16:   YB%=476:  XE%=12:   YE%=480:
GOSUB 630
15060  A5%=12:  INT1%=127:  XB%=6:    YB%=476:  XE%=12:   YE%=480:
GOSUB 630
15070  A5%=12:  INT1%=127:  XB%=6:    YB%=500:  XE%=12:   YE%=496:
GOSUB 630
15080  A5%=12:  INT1%=127:  XB%=12:   YB%=506:  XE%=16:   YE%=500:
GOSUB 630
15090  A5%=12:  INT1%=127:  XB%=36:   YB%=506:  XE%=32:   YE%=500:
GOSUB 630
16000  A5%=12:  INT1%=127:  XB%=42:   YB%=500:  XE%=36:   YE%=496:
GOSUB 630
16010  A5%=12:  INT1%=127:  XB%=36:   YB%=470:  XE%=32:   YE%=476:
GOSUB 630
16020  A5%=12:  INT1%=127:  XB%=12:   YB%=470:  XE%=16:   YE%=476:
GOSUB 630
16030  A5%=12:  INT1%=127:  XB%=42:   YB%=476:  XE%=36:   YE%=480:
GOSUB 630
16031  RETURN
16032  '********************************************************
40000  END
```

Conclusion

From the above description it will be apparent that there is thus provided an invention of the character described possessing the particular features of advantage before enumerated as desirable, but which obviously is susceptible to modification in its form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred from of various modes of putting the invention into effect, and the invention is, therefore, claimed in any of its forms or modifications within the legitimate and valid scope of the appended claims.

I claim the following:

1. A memory system comprising:

a memory storing data to be processed;

an address generator generating an address having less significant bits and having more significant bits;

a read accessing circuit coupled to the memory, coupled to the address generator, and read accessing data stored by the memory in response to the address generated by the address generator;

a processor coupled to the read accessing circuit and processing data read accessed by the read accessing circuit;

a first detector circuit coupled to the address generator and generating a first detector signal in response to detection of a change in the more significant bits of the address generated by the address generator;

a second detector circuit coupled to the address generator and generating a second detector signal in response to detection of a change in the less significant bits of the address generated by the address generator; and a delay circuit coupled to the first detector circuit, coupled to the second detector circuit, and delaying generating of the address by the address generator in response to the first detector signal and in response to the second detector signal.

2. A memory system as set forth in claim 1, wherein the memory is a dynamic random access memory storing the data to be processed in dynamic form and wherein the memory system further comprises:

a third detector circuit coupled to the processor and generating a third detector signal in response to detection of time available by the processor to refresh the dynamic random access memory; and a refresh circuit coupled to the third detector circuit, coupled to the dynamic random access memory, and refreshing the data stored by the dynamic random access memory in response to the third detector signal.

3. A memory system as set forth in claim 1, wherein the first detector circuit includes a comparator circuit generating the first detector signal in response to detection of a change in the more significant bits of the address generated by the address generator by comparison of the present value of the more significant bits of the address and the prior value of the more significant bits of the address and wherein the second detector circuit includes a comparator circuit generating the second detector signal in response to detection of a change in the less significant bits of the address generated by the address generator by comparison of the present value of the less significant bits of the address and the prior value of the less significant bits of the address.

4. A memory system as set forth in claim 1, wherein the memory includes:

a refreshable memory circuit storing the data as dynamic data;

a refresh circuit generating a refresh input signal;

a control circuit coupled to the refresh circuit, coupled to the read accessing circuit, and generating a refresh control signal in response to the read accessing of data by the read accessing circuit and in response to the refresh input signal to resolve contention between the read accessing of data by the read accessing circuit and the refresh input signal; and a memory refresh circuit refreshing the dynamic data stored by the refreshable memory circuit in response to the refresh control signal.

5. A memory system as set forth in claim 1, wherein the memory includes:

a refreshable memory circuit storing the data as dynamic data;

a refresh circuit generating a refresh input signal;

a control circuit coupled to the refresh circuit, coupled to the processor, and generating a refresh control signal in response to the processing of data by the processor and in response to the refresh input signal to resolve contention between the processing of data by the processor and refreshing of the data stored by the refreshable memory circuit; and a memory refresh circuit refreshing the dynamic data stored by the refreshable memory circuit in response to the refresh control signal.

6. A memory system comprising:

a data memory storing data to be processed;

an address generator generating an address having less significant bits and having more significant bits;

a continuous output extended tristate read accessing circuit coupled to the data memory, coupled to the address generator, and generating continuously output read accessed data that is extended without tristate interruption during a plurality of read accessing operations;

a first detector circuit coupled to the address generator and generating a first detector signal in response to detection of a change in the more significant bits of the address generated by the address generator;

a second detector circuit coupled to the address generator and generating a second detector signal in response to detection of a change in the less significant bits of the address generated by the address generator;

a delay circuit coupled to the first detector circuit, coupled to the second detector circuit, and delaying generating of the address by the address generator in response to the first detector signal and in response to the second detector signal;

a program memory storing a computer program;

a stored program computer coupled to receive the computer program stored by the program memory and coupled to receive the continuously output read accessed data generated by the continuous output extended tristate read accessing circuit, the stored program computer generating processed output data by processing the received continuously output read accessed data in response to the received computer program; and a write accessing circuit coupled to the data memory, coupled to receive the address generated by the address generator, and coupled to receive the processed output data generated by the stored program computer, the write accessing circuit writing the received processed output data into the data memory in response to the received address and in response to the received processed output data.

7. A memory system as set forth in claim 1, wherein the processor includes a display processor coupled to the accessing circuit and generating display data by processing the data accessed by the accessing circuit; wherein the memory system further comprises a display monitor coupled to the display processor and displaying an image in response to the display data.

8. A memory system as set forth in claim 1, wherein the processor includes an image processor processing the data accessed by the accessing circuit to generate image display data; wherein the memory system further comprises a display monitor coupled to the image processor and displaying an image in response to the image display data.

9. A memory system comprising:

a memory storing data to be processed;

an address generator generating an address having less significant bits and having more significant bits;

a read accessing circuit coupled to the memory, coupled to the address generator, and read accessing data stored by the memory in response to the address generated by the address generator;

a processor coupled to the read accessing circuit, the processor being a television image processor processing the data read accessed by the read accessing circuit to generate television image data;

a first detector circuit coupled to the address generator and generating a first detector signal in response to detection of a change in the more significant bits of the address generated by the address generator;

a second detector circuit coupled to the address generator and generating a second detector signal in response to detection of a change in the less significant bits of the address generated by the address generator;

a delay circuit coupled to the first detector circuit, coupled to the second detector circuit, and delaying generating of the address by the address generator in response to the first detector signal and in response to the second detector signal; and a television monitor coupled to the television image processor and displaying a television image in response to the television image data.

10. A memory system as set forth in claim 1, further comprising a read only memory storing a computer program; wherein the processor includes a stored program computer coupled to the read only memory and processing the data read accessed by the accessing circuit in response to the program stored by the read only memory.

11. A memory system comprising:

a dynamic random access memory storing data;

an address generator generating addresses;

a continuous output read accessing circuit coupled to read access data stored by the dynamic random access memory and coupled to receive addresses generated by the address generator, the continuous output read accessing circuit generating continuous output read accessed data by read accessing data stored by the dynamic random access memory in response to the received addresses, the continuous output read accessing circuit generating continuous output read accessed data during a plurality of read operations in response to the read accessing of data stored by the dynamic random access memory;

a processor coupled to receive continuous output read accessed data generated by the continuous output read accessing circuit and coupled to receive addresses generated by the address generator, the processor processing the received continuous output read accessed data generated by the continuous output read accessing circuit;

a detector circuit coupled to receive addresses generated by the address generator, the detector circuit generating a detector signal in response to detection of a change in a received address; and a delaying circuit coupled to receive the detector signal generated by the detector circuit and coupled to the address generator, the delaying circuit delaying generating of the addresses by the address generator in response to the received detector signal.

12. A memory system comprising:

a dynamic random access memory storing data, the dynamic random access memory including a refreshable memory circuit storing the data as dynamic data;

an address generator generating addresses;

a continuous output read accessing circuit coupled to read access data stored by the dynamic random access memory and coupled to receive addresses generated by the address generator, the continuous output read accessing circuit generating continuous output read accessed data by read accessing data stored by the dynamic random access memory in response to the received addresses, the continuous output read accessing circuit generating continuous output read accessed data during a plurality of read operations in response to the read accessing of data stored by the dynamic random access memory;

a processor coupled to receive continuous output read accessed data generated by the continuous output read accessing circuit and coupled to receive addresses generated by the address generator, the processor processing the received continuous output read accessed data generated by the continuous output read accessing circuit;

a detector circuit coupled to receive addresses generated by the address generator, the detector circuit generating a detector signal in response to detection of a change in a received address;

a delaying circuit coupled to receive the detector signal generated by the detector circuit and coupled to the address generator, the delaying circuit delaying generating of the addresses by the address generator in response to the received detector signal;

a refresh circuit generating a refresh input signal;

a control circuit coupled to the processor, coupled to the refresh circuit, and generating a refresh control signal in response to the processing by the processor of data stored by the dynamic random access memory to resolve contention between the processing of the data by the processor and the refresh input signal; and a memory refresh circuit refreshing the dynamic data stored by the refreshable memory circuit in response to the refresh control signal.

13. A memory system as set forth in claim 11, wherein the dynamic random access memory includes:

a dynamic random access memory circuit storing the data as dynamic data;

a refresh circuit generating a refresh input signal;

a control circuit coupled to the refresh circuit, coupled to the processor, and generating a refresh control signal in response to the processing of data by the processor and in response to the refresh input signal to resolve contention between the processing of data by the processor and the refresh input signal; and a memory refresh circuit refreshing the dynamic data stored by the dynamic random access memory circuit in response to the refresh control signal.

14. A memory system as set forth in claim 11, further comprising:

a program memory storing a computer program, wherein the processor includes a stored program computer coupled to the program memory and processing the continuous output read accessed data in response to the program stored by the program memory; and a write accessing circuit coupled to the dynamic random access memory, coupled to the address generator, coupled to the stored program computer, and write accessing data into the dynamic random access memory in response to the addresses and in response to the processing of the continuously generated output read accessed data.

15. A memory system comprising a dynamic random access memory storing data;

an address generator generating addresses;

a continuous output read accessing circuit coupled to read access data stored by the dynamic random access memory and coupled to receive addresses generated by the address generator, the continuous output read accessing circuit generating continuous output read accessed data by read accessing data stored by the dynamic random access memory in response to the received addresses, the continuous output read accessing circuit generating continuous output read accessed data during a plurality of read operations in response to the read accessing of data stored by the dynamic random access memory;

a processor coupled to receive continuous output read accessed data generated by the continuous output read accessing circuit and coupled to receive addresses generated by the address generator, the processor being a display processor processing the received continuous output read accessed data to generate display data;

a detector circuit coupled to receive addresses generated by the address generator, the detector circuit generating a detector signal in response to detection of a change in a received address;

a delaying circuit coupled to receive the detector signal generated by the detector circuit and coupled to the address generator, the delaying circuit delaying generating of the addresses by the address generator in response to the received detector signal; and a display monitor coupled to the display processor and displaying an image in response to the display data.

16. A memory system as set forth in claim 11, wherein the processor includes an artificial intelligence processor processing the continuous output read accessed data to generate artificial intelligence data.

17. A memory system as set forth in claim 11, wherein the processor includes an image processor processing the continuous output read accessed data to generate image display data; the memory system further comprising a display monitor coupled to the image processor and displaying an image in response to the image display data.

18. A memory system as set forth in claim 11, wherein the processor includes a television image processor processing the continuous output read accessed data to generate television image data; wherein the memory system further comprises a television monitor coupled to the television image processor and displaying a television image in response to the television image data.

19. A memory system as set forth in claim 11, further comprising a read only memory storing a computer program; wherein the processor includes a stored program computer coupled to the read only memory and processing the continuous output read accessed data in response to the program stored by the read only memory.

20. A memory system as set forth in claim 11, further comprising:

an external scanout address update circuit coupled to the detector circuit and updating the addresses generated by the address generator at a first address update rate in response to a first state of the detector signal; and a re-addressing address update circuit coupled to the detector circuit and updating the addresses generated by the address generator at a second address update rate that is lower than the first address update rate in response to a second state of the detector signal.

21. A memory system comprising:

a memory storing data to be processed;

an address generator generating an address;

a processor coupled to the memory and to the address generator and processing data stored by the memory in response to the address generated by the address generator; and a plurality of detector circuits coupled to the address generator and generating a plurality of detector signals in response to the address.

22. A memory system comprising:

a dynamic random access memory storing data to be processed in dynamic form;

an address generator generating an address;

a processor coupled to the dynamic random access memory and coupled to the address generators, the processor processing data stored by the dynamic random access memory in response to the address generated by the address generator;

a plurality of detector circuits coupled to the address generator and generating a plurality of detector signals in response to the address; and a refresh circuit coupled to the memory, coupled to the processor, and refreshing the data stored by the dynamic random access memory in response to the processing of the data by the processor.

23. A memory system comprising:

a memory storing data to be processed;

an address generator generating an address;

a processor coupled to the memory and to the address generator and processing data stored by the memory in response to the address generated by the address generator; and a plurality of detector circuits coupled to the address generator and generating a plurality of detector signals in response to the address, wherein at least one of the plurality of detector circuits includes a comparator circuit generating a comparator detector signal in response to detection of a change in the address generated by the address generator.

24. A memory system comprising:

a memory storing data to be processed;

an address generator generating an address;

a processor coupled to the memory and to the address generator and processing data stored by the memory in response to the address generated by the address generator;

a plurality of detector circuits coupled to the address generator and generating a plurality of detector signals in response to the address; and a delaying circuit coupled to receive a detector signal generated by at least one of the plurality of detector circuits, coupled to the address generator, and delaying generating of the address by the address generator in response to the received detector signal.

25. A memory system comprising:

a refreshable memory storing dynamic data;

an address generator generating an address;

a processor coupled to the refreshable memory and coupled to the address generator, the processor processing dynamic data stored by the refreshable memory in response to the address generated by the address generator;

a plurality of detector circuits coupled to the address generator and generating a plurality of detector signals in response to the address;

a refresh circuit generating a refresh input signal;

a control circuit coupled to the refresh circuit, coupled to the processor, and generating a refresh control signal in response to the processing of the dynamic data by the processor and in response to the refresh input signal to resolve contention between the processing of the dynamic data by the processor and the refresh input signal; and a memory refresh circuit refreshing the dynamic data stored by the refreshable memory in response to the refresh control signal.

26. A memory system comprising:

a dynamic random access memory storing dynamic data;

an address generator generating an address having more significant bits and having less significant bits;

an extended read accessing circuit coupled to read access dynamic data stored by the dynamic random access memory and coupled to receive the address generated by the address generator, the extended read accessing circuit continually generating output read accessed data extended without interruption during a plurality of read operations by read accessing dynamic data stored by the dynamic random access memory in response to the received address generated by the address generator;

a processor coupled to the dynamic random access memory and to the address generator and processing dynamic data stored by the dynamic random access memory in response to the address generated by the address generator;

a plurality of detector circuits coupled to receive the address generated by the address generator, the plurality of detector circuits generating a plurality of detector signals in response to detection of a change in the received address;

a refresh circuit generating a refresh input signal;

a control circuit coupled to the refresh circuit, coupled to the processor, and generating a refresh control signal in response to the processing of dynamic data by the processor and in response to the refresh input signal to resolve contention between the processing of dynamic data by the processor and the refresh input signal; and a memory refresh circuit refreshing the data stored by the dynamic random access memory in response to the refresh control signal.

27. A memory system comprising:

a dynamic random access memory storing data;

an address generator generating an address;

a plurality of detector circuits coupled to the address generator and generating a plurality of detector signals in response to the address;

a continuous output extended tristate read accessing circuit coupled to receive the address generated by the address generator and coupled to read access data stored by the dynamic random access memory, the continuous output extended tristate read accessing circuit generating continuously output read accessed data that is extended without tristate interruption during a plurality of read accessing operations; and a processor coupled to receive the continuously output read accessed data generated by the continuous output extended tristate read accessing circuit, the processor generating processed data in response to the received continuously output read accessed data.

28. A memory system comprising:

a data memory storing data to be processed;

an address generator generating an address;

a plurality of detector circuits coupled to the address generator and generating a plurality of detector signals in response to the address;

a program memory storing a computer program;

a processor coupled to the data memory and to the address generator and processing data stored by the data memory in response to the address generated by the address generator, the processor being a stored program computer coupled to receive data stored by the data memory and coupled to receive the computer program stored by the program memory, the stored program computer generating processed output data by processing the received data in response to the received computer program;

a write accessing circuit coupled to the data memory, coupled to receive the address generated by the address generator, and coupled to receive the processed output data generated by the stored program computer, the write accessing circuit writing data into the data memory in response to the received address and in response to the received processed output data.

29. A memory system comprising:

a memory storing data to be processed;

an address generator generating an address;

a plurality of detector circuits coupled to the address generator and generating a plurality of detector signals in response to the address;

a processor coupled to the memory and to the address generator and processing data stored by the memory in response to the address generated by the address generator, the processor being a display processor coupled to receive data stored by the memory, the display processor generating display data by processing the received data; and a display monitor coupled to receive the display data generated by the display processor, the display monitor displaying an image in response to the received display data.

30. A memory system comprising:

a memory storing data to be processed;

an address generator generating an address;

a plurality of detector circuits coupled to the address generator and generating a plurality of detector signals in response to the address; and a processor coupled to the memory and to the address generator and processing data stored by the memory in response to the address generated by the address generator, the processor being an artificial intelligence processor coupled to receive data stored by the memory, the artificial intelligence processor generating artificial intelligence output data by processing the received data.

31. A memory system comprising:

a memory storing data to be processed;

an address generator generating an address;

a plurality of detector circuits coupled to the address generator and generating a plurality of detector signals in response to the address;

a processor coupled to the memory and to the address generator and processing data stored by the memory in response to the address generated by the address generator, the processor being an image processor coupled to receive the data stored by the memory, the image processor generating image display data by processing the received data; and a display monitor coupled to receive image display data generated by the image processor, the display monitor displaying an image in response to the received image display data.

32. A memory system comprising:

a memory storing data to be processed;

an address generator generating an address;

a plurality of detector circuits coupled to the address generator and generating a plurality of detector signals in response to the address;

a processor coupled to the memory and to the address generator and processing data stored by the memory in response to the address generated by the address generator, the processor being a television image processor coupled to receive data stored by the memory, the television image processor generating television image data by processing the received data; and a television monitor coupled to receive the television image data generated by the television image processor, the television monitor displaying a television image in response to the received television image data.

33. A memory system comprising:

a data memory storing data to be processed;

an address generator generating an address;

a plurality of detector circuits coupled to the address generator and generating a plurality of detector signals in response to the address;

a read only memory storing a computer program; and a processor coupled to the data memory and to the address generator and processing data stored by the data memory in response to the address generated by the address generator, the processor being a stored program computer coupled to receive data stored by the data memory and coupled to receive the computer program stored by the read only memory, the stored program computer generating processed output data by processing the received data in response to the received program.

34. A memory system comprising:

a plurality of random access memories storing data to be processed;

an address generator generating an address;

a processor coupled to the plurality of random access memories and to the address generator and processing data stored by the plurality of random access memories in response to the address generated by the address generator;

a plurality of detector circuits coupled to the address generator and generating a plurality of detector signals in response to the address;

a scanout address update circuit coupled to the plurality of detector circuits and coupled to the address generator, the scanout address update circuit updating the address generated by the address generator at a first address update rate in response to a first state of a selected detector signal; and a re-addressing address update circuit coupled to the plurality of detector circuits and coupled to the address generator, the re-addressing address update circuit updating the address generated by the address generator at a second address update rate that is lower than the first address update rate in response to a second state of the selected detector signal.

35. A memory system as set forth in claim 21, wherein the memory includes a plurality of random access memories storing the data and wherein the memory system further comprises:

an external scanout address update circuit coupled to the plurality of detector circuits and updating the address generated by the address generator at a first address update rate in response to a first state of a selected detector signal; and a re-addressing address update circuit coupled to the plurality of detector circuits and updating the address generated by the address generator at a second address update rate that is lower than the first address update rate in response to a second state of the selected detector signal.

36. A memory system comprising:

a dynamic random access memory storing data to be processed;

an address generator generating an address;

a tristate control circuit generating a tristate control signal to continuously enable an extended tristate memory output circuit during a plurality of read access operations;

a memory accessing circuit coupled to access data stored by the dynamic random access memory and coupled to receive the address generated by the address generator, the memory accessing circuit performing read access operations to access data stored by the dynamic random access memory in response to the received address;

the extended tristate memory output circuit coupled to receive accessed data accessed by the memory accessing circuit and coupled to receive the tristate control signal generated by the tristate control circuit, the extended tristate memory output circuit generating continuous output data extended without tristate disable during a plurality of sequential read access operations in response to the received tristate control signal and in response to the received accessed data;

a processor coupled to receive the continuous output data generated by the extended tristate memory output circuit, the processor generating processed output data by processing the received continuous output data;

a detector circuit coupled to receive the address generated by the address generator, the detector circuit generating a detector signal in response to the received address; and a address update circuit coupled to receive the detector signal generated by the detector circuit and coupled to the address generator, the address update circuit updating the address generated by the address generator in response to the received detector signal.

37. A memory system comprising:

a dynamic random access memory storing data to be processed;

an address generator generating an address;

a tristate control circuit generating a tristate control signal to continuously enable an extended tristate memory output circuit during a plurality of read access operations;

a memory accessing circuit coupled to access data stored by the dynamic random access memory and coupled to receive the address generated by the address generator, the memory accessing circuit performing read access operations to access data stored by the dynamic random access memory in response to the received address;

the extended tristate memory output circuit coupled to receive accessed data accessed by the memory accessing circuit and coupled to receive the tristate control signal generated by the tristate control circuit, the extended tristate memory output circuit generating continuous output data extended without tristate disable during a plurality of sequential read access operations in response to the received tristate control signal and in response to the received accessed data;

a processor coupled to receive the continuous output data generated by the extended tristate memory output circuit, the processor generating processed output data by processing the received continuous output data;

a detector circuit coupled to receive the address generated by the address generator, the detector circuit generating a detector signal in response to the received address;

an address update circuit coupled to receive the detector signal generated by the detector circuit and coupled to the address generator, the address update circuit updating the address generated by the address generator in response to the received detector signal; and a refresh circuit coupled to the dynamic random access memory, coupled to the processor, and refreshing the data stored by the dynamic random access memory in response to the processing of the received continuous output data by the processor.

38. A memory system as set forth in claim 36, wherein the detector circuit includes an overflow circuit generating the detector signal in response to detection of an overflow in the address generated by the address generator.

39. A memory system comprising:

a dynamic random access memory storing data to be processed, an address generator generating an address;

a tristate control circuit generating a tristate control signal to continuously enable an extended tristate memory output circuit during a plurality of read access operations;

a memory accessing circuit coupled to access data stored by the dynamic random access memory and coupled to receive the address generated by the address generator, the memory accessing circuit performing read access operations to access data stored by the dynamic random access memory in response to the received address;

the extended tristate memory output circuit coupled to receive accessed data accessed by the memory accessing circuit and coupled to receive the tristate control signal generated the tristate control circuit, the extended tristate memory output circuit generating continuous output data extended without tristate disable during a plurality of sequential read access operations in response to the received tristate control signal and in response to the received accessed data;

a processor coupled to receive the continuous output data generated by the extended tristate memory output circuit, the processor generating processed output data by processing the received continuous output data;

a comparator detector circuit coupled to receive the address generated by the address generator, the comparator detector circuit generating a detector signal in response to detection of a change in the received address generated by the address generator; and an address update circuit coupled to receive the detector signal generated by the comparator detector circuit and coupled to the address generator, the address update circuit updating the address generated by the address generator in response to the received detector signal.

40. A memory system as set forth in claim 36, wherein the detector circuit includes an anticipatory circuit generating the detector signal in response to anticipation of a change in the address generated by the address generator.

41. A memory system comprising a dynamic random access memory storing data to be processed;

an address generator generating an address;

a continuous tristate control circuit generating a tristate control signal to continuously enable a continuous tristate memory output circuit during a plurality of read access operations;

a memory accessing circuit coupled to access data stored by the dynamic random access memory and coupled to receive the address generated by the address generator, the memory accessing circuit executing read access operations to access data stored by the dynamic random access memory in response to the received address;

the continuous tristate memory output circuit coupled to receive data accessed from the memory accessing circuit and coupled to receive the tristate control signal generated by the continuous tristate control circuit, the continuous tristate memory output circuit generating continuous output data without tristate disable during a plurality of read access operations response to the received tristate control signal and in response to the received accessed data;

a processor coupled to the continuous tristate memory output circuit and processing the continuous output data generated be the continuous tristate memory output circuit;

a detector circuit coupled to the address generator and generating a detector signal in response to the address generated by the address generator; and an address update circuit coupled to the address generator, coupled to the detector circuit, and updating the address generated by the address generator in response to the detector signal generated by the detector circuit.

42. A memory system comprising:

a dynamic random access memory storing data to be processed;

an address generator generating an address;

a tristate control circuit generating a tristate control signal to continuously enable an extended tristate memory output circuit during a plurality of read access operations;

a memory accessing circuit coupled to access data stored by the dynamic random access memory and coupled to receive the address generated by the address generator, the memory accessing circuit performing read access operations to access data stored by the dynamic random access memory in response to the received address;

the extended tristate memory output circuit coupled to receive accessed data accessed by the memory accessing circuit and coupled to receive the tristate control signal generated by the tristate control circuit, the extended tristate memory output circuit generating continuous output data extended without tristate disable during a plurality of sequential read access operations in response to the received tristate control signal and in response to the received accessed data;

a processor coupled to receive the continuous output data generated by the extended tristate memory output circuit, the processor generating processed output data by processing the received continuous output data;

a detector circuit coupled to receive the address generated by the address generator, the detector circuit generating a detector signal in response to the received address;

an address update circuit coupled to receive the detector signal generated by the detector circuit and coupled to the address generator, the address update circuit updating the address generated by the address generator in response to the received detector signal; and a delaying circuit coupled to receive the detector signal generated by the detector circuit and coupled to the address generator, the delaying circuit delaying generating of the address by the address generator in response to the received detector signal.

43. A memory system as set forth in claim 36, wherein the memory includes:

a refreshable memory circuit storing the data as dynamic data;

a refresh circuit generating a refresh input signal;

a control circuit coupled to the refresh circuit, coupled to the processor, and generating a refresh control signal in response to the processing of data by the processor and in response to the refresh input signal to resolve contention between the processing of the data by the processor and the refresh input signal; and a memory refresh circuit refreshing the dynamic data stored by the refreshable memory circuit in response to the refresh control signal.

44. A memory system comprising:

a dynamic random access memory storing data to be processed;

an address generator generating an address;

a tristate control circuit generating a tristate control signal to continuously enable an extended tristate memory output circuit during a plurality of read access operations;

a memory accessing circuit coupled to access data stored by the dynamic random access memory and coupled to receive the address generated by the address generator, the memory accessing circuit performing read access operations to access data stored by the dynamic random access memory in response to the received address;

the extended tristate memory output circuit coupled to receive accessed data accessed by the memory accessing circuit and coupled to receive the tristate control signal generated by the tristate control circuit, the extended tristate memory output circuit generating continuous output data extended without tristate disable during a plurality of sequential read access operations in response to the received tristate control signal and in response to the received accessed data;

a processor coupled to receive the continuous output data generated by the extended tristate memory output circuit, the processor generating processed output data by processing the received continuous output data;

a detector circuit coupled to receive the address generated by the address generator, the detector circuit generating a detector signal in response to the received address;

an address update circuit coupled to receive the detector signal generated by the detector circuit and coupled to the address generator, the address update circuit updating the address generated by the address generator in response to the received detector signal; and the dynamic random access memory comprising:

a) a dynamic random access memory circuit storing the data as dynamic data, b) a refresh circuit generating a refresh input signal, c) a control circuit coupled to the refresh circuit, coupled to the processor, and generating a refresh control signal in response to the processing of data by the processor and in response to the refresh input signal to resolve contention between the processing of data by the processor and the refresh input signal, and d) a memory refresh circuit refreshing the dynamic data stored by the dynamic random access memory circuit in response to the refresh control signal.

45. A memory system comprising:

a plurality of dynamic random access memories storing data;

an extended read accessing circuit coupled to read access data stored by the plurality of dynamic random access memories, the extended read accessing circuit read accessing the data stored by the plurality of dynamic random access memories to generate output read accessed data extended without interruption during a plurality of read operations; and a processor coupled to receive the output read accessed data that is extended without interruption during a plurality of read operations, the processor generating processed output data in response to the received output read accessed data.

46. A memory system as set forth in claim 36, further comprising a program memory storing a computer program; wherein the processor includes a stored program computer coupled to the program memory and processing the continuous output data in response to the program stored by the program memory.

47. A memory system as set forth in claim 36, wherein the processor includes a display processor processing the continuous output data to generate display data; wherein the memory system further comprises a display monitor coupled to the display processor and displaying an image in response to the display data.

48. A memory system as set forth in claim 36, wherein the processor includes an artificial intelligence processor processing the continuous output data to generate artificial intelligence data.

49. A memory system comprising:

a dynamic random access memory storing data to be processed;

an address generator generating an address;

a tristate control circuit generating a tristate control signal to continuously enable an extended tristate memory output circuit during a plurality of read access operations;

a memory accessing circuit coupled to access data stored by the dynamic random access memory and coupled to receive the address generated by the address generator, the memory accessing circuit performing read access operations to access data stored by the dynamic random access memory in response to the received address;

the extended tristate memory output circuit coupled to receive accessed data accessed by the memory accessing circuit and coupled to receive the tristate control signal generated by the tristate control circuit, the extended tristate memory output circuit generating continuous output data extended without tristate disable during a plurality of sequential read access operations in response to the received tristate control signal and in response to the received accessed data;

a detector circuit coupled to receive the address generated by the address generator, the detector circuit generating a detector signal in response to the received address;

an address update circuit coupled to receive the detector signal generated by the detector circuit and coupled to the address generator, the address update circuit updating the address generated by the address generator in response to the received detector signal;

an image processor coupled to receive the continuous output data generated by the extended tristate memory output circuit, the image processor generating image display data by processing the received continuous output data; and a display monitor coupled to receive the image display data generated by the image processor, the display monitor displaying an image in response to the received image display data.

50. A memory system as set forth in claim 36, further comprising a read only memory storing a computer program; wherein the processor includes a stored program computer coupled to the read only memory and processing the continuous output data in response to the program stored by the read only memory.

51. A memory system comprising:

a dynamic random access memory storing data to be processed, the dynamic random access memory including a cache memory storing the data;

an address generator generating an address;

a tristate control circuit generating a tristate control signal to continuously enable an extended tristate memory output circuit during a plurality of read access operations;

a memory accessing circuit coupled to access data stored by the dynamic random access memory and coupled to receive the address generated by the address generator, the memory accessing circuit performing read access operations to access data stored by the dynamic random access memory in response to the received address;

the extended tristate memory output circuit coupled to receive accessed data accessed by the memory accessing circuit and coupled to receive the tristate control signal generated by the tristate control circuit, the extended tristate memory output circuit generating continuous output data extended without tristate disable during a plurality of sequential read access operations in response to the received tristate control signal and in response to the received accessed data;

a processor coupled to receive the continuous output data generated by the extended tristate memory output circuit, the processor generating processed output data by processing the received continuous output data;

a detector circuit coupled to receive the address generated by the address generator, the detector circuit generating a detector signal in response to the received address; and an address update circuit coupled to receive the detector signal generated by the detector circuit and coupled to the address generator, the address update circuit updating the address generated by the address generator in response to the received detector signal.

52. A memory system comprising:

a dynamic random access memory storing data to be processed;

an address generator generating an address;

a tristate control circuit generating a tristate control signal to continuously enable an extended tristate memory output circuit during a plurality of read access operations;

a memory accessing circuit coupled to access data stored by the dynamic random access memory and coupled to receive the address generated by the address generator, the memory accessing circuit performing read access operations to access data stored by the dynamic random access memory in response to the received address;

the extended tristate memory output circuit coupled to receive accessed data accessed by the memory accessing circuit and coupled to receive the tristate control Signal generated by the tristate control circuit, the extended tristate memory output circuit generating continuous output data extended without tristate disable during a plurality of sequential read access operations in response to the received tristate control signal and in response to the received accessed data;

a processor coupled to receive the continuous output data generated by the extended-tristate memory output circuit, the processor generating processed output data by processing the received continuous output data;

a detector circuit coupled to receive the address generated by the address generator, the detector circuit generating a detector signal in response to the received address;

a scanout address update circuit coupled to receive the detector signal generated by the detector circuit and coupled to the address generator, the scanout address update circuit updating the address generated by the address generator at a first address update rate in response to a first state of the received detector signal; and a re-addressing address update circuit coupled to receive the detector signal generated by the detector circuit and coupled to the address generator, the re-addressing address update circuit updating the address generated by the address generator at a second address update rate that is lower than the first address update rate in response to a second state of the received detector signal.

53. A memory system as set forth in claim 36, wherein the address update circuit comprises:

an external scanout address update circuit coupled to the detector circuit and updating the address generated by the address generator at a first address update rate in response to a first state of the detector signal and a re-addressing address update circuit coupled to the detector circuit and updating the address generated by the address generator at a second address update rate that is lower than the first address update rate in response to a second state of the detector signal.

54. A memory system comprising:

a dynamic random access memory storing data;

an address generator generating addresses, each address having less significant bits and more significant bits;

an extended read accessing circuit coupled to read access data stored by the dynamic random access memory and coupled to receive the addresses generated by the address generator, the extended read accessing circuit generating output read accessed data extended without interruption during a plurality of read operations by read accessing data stored by the dynamic random access memory in response to the addresses generated by the address generator;

a buffer circuit coupled to receive the addresses generated by the address generator, the buffer circuit buffering the more significant bits of an address received from the address generator; and a comparator circuit coupled to receive the addresses generated by the address generator and coupled to receive the more significant bits of an address buffered by the buffer circuit the comparator generating a detector signal in response to comparison of the received more significant bits of the address and the more significant bits of an address received from the address generator.

55. A memory system comprising:

a memory storing data;

an address generator generating An address having less significant bits and having more significant bits;

an accessing circuit coupled to the memory, coupled to the address generator, and accessing data stored by the memory in response to the address generated by the address generator;

a detector circuit coupled to the address generator and generating a detector signal in response to the more significant bits of the address generated by the address generator;

a buffer circuit coupled to the address generator, coupled to the detector circuit, and buffering the more significant bits of the address in response to the detector signal; and a comparator circuit coupled to the address generator, coupled to the buffer circuit, and generating a comparator signal in response to comparison of the more significant bits of the address buffered by the buffer circuit and the more significant bits of the address generated by the address generator.

56. A memory system comprising:

a memory storing data;

a first address generator generating a first address;

a second address generator generating a second address;

an accessing circuit coupled to the memory, coupled to the first address generator, coupled to the second address generator, and accessing data stored by the memory in response to the first address generated by the first address generator and in response to the second address generated by the second address generator;

a first detector circuit coupled to the first address generator and generating a first detector signal in response to detection of a change in the first address generated by the first address generator;

a second detector circuit coupled to the second address generator and generating a second detector signal in response to detection of a change in the second address generated by the second address generator; and a delay circuit coupled to the first detector circuit, coupled to the second detector circuit, coupled to the first address generator, coupled to the second address generator, and delaying generating of the first address by the first address generator in response to the first detector signal and in response to the second detector signal and delaying generating of the second address by the second address generator in response to the first detector signal and in response to the second detector signal.

57. A memory system comprising:

a memory storing data;

a first address generator generating a first address having less significant bits and having more significant bits;

a second address generator generating a second address having less significant bits and having more significant bits;

an accessing circuit coupled to the memory, coupled to the first address generator, coupled to the second address generator, and accessing data stored by the memory in response to the first address generated by the first address generator and in response to the second address generated by the second address generator;

a first detector circuit coupled to the first address generator and generating a first detector signal in response to detection of a change in the more significant bits of the first address generated by the first address generator;

a second detector circuit coupled to the second address generator and generating a second detector signal in response to detection of a change in the more significant bits of the second address generated by the second address generator; and a delaying circuit coupled to the first detector circuit, coupled to the second detector circuit, coupled to the first address generator, coupled to the second address generator, and delaying generating of the first address by the first address generator in response to the first detector signal and in response to the second detector signal and delaying generating of the second address by the second address generator in response to the first detector signal and in response to the second detector signal.

58. A memory system comprising:

a memory storing data in an X dimension and in a Y dimension array of data;

an X dimension address generator generating an X dimension address having less significant X dimension address bits and having more significant X dimension address bits;

a Y dimension address generator generating a Y dimension address having less significant Y dimension address bits and having more significant Y dimension address bits;

an accessing circuit coupled to the memory, coupled to the X dimension address generator, coupled to the Y dimension address generator, and accessing the X dimension and the Y dimension array of data stored by the memory in response to the X dimension address generated by the X dimension address generator and in response to the Y dimension address generated by the Y dimension address generator;

a processor coupled to the accessing circuit and processing the X dimension and the Y dimension array of data accessed by the accessing circuit;

an X dimension detector circuit coupled to the X dimension address generator and generating an X dimension detector signal in response to detection of a change in the more significant YXdimension address bits of the X dimension address generated by the X dimension address generator;

a Y dimension detector circuit coupled to the Y dimension address generator and generating a Y dimension detector signal in response to detection of a change in the more significant Y dimension address bits of the Y dimension address generated by the Y dimension address generator; and a delay circuit coupled to the X dimension detector circuit, coupled to the Y dimension detector circuit, coupled to the X dimension address generator, coupled to the Y dimension address generator, and delaying generating of the X dimension address bit the X dimension address generator in response to the X dimension detector signal and in response to the Y dimension detector signal and delaying generating of the Y dimension address by the Y dimension address generator in response to the X dimension detector signal and in response to the Y dimension detector signal.

59. A memory system comprising:

a memory storing data;

a first address generator generating a first address;

a second address generator generating a second address;

an accessing circuit coupled to the memory, coupled to the first address generator, coupled to the second address generator, and accessing data stored by the memory in response to the first address generated by the first address generator and in response to the second address generated by the second address generator;

a processor coupled to the accessing circuit and processing data accessed by the accessing circuit;

a first detector circuit coupled to the first address generator and generating a first detector signal in response to detection of a change in the first address generated by the first address generator;

a second detector circuit coupled to the second address generator and generating a second detector signal in response to detection of a change in the second address generated by the second address generator; and a delay circuit coupled to the first address generator, coupled to the second address generator, coupled to the first detector circuit, and coupled to the second detector circuit, delaying generation of the first address by the first address generator in response to the first detector signal and in response to the second detector signal, and delaying generation of the second address by the second address generator in response to the first detector signal and in response to the second detector signal.

60. A memory system comprising:

a dynamic random access memory storing data;

an address generator generating an address;

an extended tristate read accessing circuit coupled to read access data stored by the dynamic random access memory and coupled to receive the address generated by the address generator, the extended tristate read accessing circuit read accessing data stored by the dynamic random access memory in response to the received address, the extended tristate read accessing circuit generating output data that is extended during a plurality of read accessing operations without tristate disable in response to the read accessed data and in response to a tristate control signal;

an extended tristate control circuit coupled to the extended tristate read accessing circuit, the extended tristate control circuit generating the tristate control Signal to disable the extended tristate read accessing circuit after generating output data that is extended during the plurality of read accessing operations without tristate disable; and a detector circuit coupled to the address generator and generating a detector signal in response to the address generated by the address generator.

61. A memory system comprising:

a plurality of random access memories storing data;

an address generator generating an address having less significant bits and having more significant bits;

an accessing circuit coupled to the plurality of random access memories, coupled to the address generator, and accessing data stored by the random access memories in response to the address generated by the address generator;

a detector circuit coupled to the address generator and generating a detector signal in response to detection of a change in the more significant bits of the address generated by the address generator;

a scanout address update circuit coupled to the detector circuit and updating the address generated by the address generator at a first address update rate in response to a first state of the detector signal; and a re-addressing address update circuit coupled to the detector circuit and updating the address generated by the address generator at a second address update rate that is lower than the first address update rate in response to a second state of the detector signal.

62. A memory system comprising:

a plurality of dynamic random access memories storing data;

an address generator generating addresses, each address having less significant bits and having more significant bits;

an extended read accessing circuit coupled to read access data stored by the plurality of dynamic random access memories and coupled to receive addresses generated by the address generator, the extended read accessing circuit read accessing data stored by the plurality of dynamic random access memories in response to the received addresses, the extended read accessing circuit generating output read accessed data extended without interruption during a plurality of read operations in response to the read accessed data;

a detector circuit coupled to receive the addresses generated by the address generator, the detector circuit generating a detector signal in response to detection of changes in the more significant bits of the received addresses;

a scanout address update circuit coupled to receive the detector signal generated by the detector circuit and coupled to the address generator, the scanout address update circuit updating the addresses generated by the address generator at a first address update rate in response to a first state of the received detector signal; and a re-addressing address update circuit coupled to receive the detector signal generated by the detector circuit and coupled to the address generator, the re-addressing address update circuit updating the addresses generated by the address generator at a second address update rate that is lower than the first address update rate in response to a second state of the received detector signal.

63. A memory system comprising:

a dynamic random access memory storing data in dynamic form;

an accessing circuit coupled to the dynamic random access memory and accessing data stored by the dynamic random access memory;

a line sync circuit generating a line sync signal;

a dynamic random access memory refresh circuit coupled to the dynamic random access memory, coupled to the line sync circuit, and refreshing data stored by the dynamic random access memory in response to the line sync signal;

a display refresh circuit coupled to the accessing circuit, coupled to the line sync circuit, and generating a display refresh signal in response to data accessed by the accessing circuit and in response to the line sync signal; and a display device coupled to the display refresh circuit and displaying an image in response to the display refresh signal generated by the display refresh circuit.

64. A memory system comprising:

a memory storing data;

an address generator generating an address having more significant bits and having less significant bits;

a processor coupled to the memory, coupled to the address generator, and processing data stored by the memory in response to the address generated by the address generator;

a configuration circuit coupled to the address generator and generating a plurality of configuration address bits by selecting a plurality of the more significant bits of the address;

a detector circuit coupled to the configuration circuit and generating a detector signal in response to detection of a change in the plurality of configuration address bits generated by the configuration circuit; and a delaying circuit coupled to the address generator, coupled to the detector circuit, and delaying generating of the address by the address generator in response to the detector signal generated by the detector circuit.

65. A memory system comprising:

a memory storing data;

an address generator generating addresses, each address having less significant bits and having more significant bits;

a buffer circuit coupled to the address generator and buffering the less significant bits and the more significant bits of addresses generated by the address generator;

an accessing circuit coupled to the memory, coupled to the buffer circuit, and accessing data stored by the memory in response to the addresses buffered by the buffer circuit;

a comparator circuit coupled to the address generator, coupled to the buffer circuit, and generating a detector signal in response to comparison of the more significant bits of an address buffered by the buffer circuit and the more significant bits of an address generated by the address generator; and a delay circuit coupled to the comparator circuit and delaying generating of the addresses by the address generator in response to the detector signal.

66. A memory system comprising:

a dynamic random access memory storing data;

an address generator generating an address;

a continuous output extended tristate read accessing circuit coupled to read access data stored by the dynamic random access memory and coupled to receive the address generated by the address generator, the continuous output extended tristate read accessing circuit read accessing data stored by the dynamic random access memory in response to the received address, the continuous output extended tristate read accessing circuit generating continuously output data that is extended without tristate interruption during a plurality of read accessing operations;

a detector circuit coupled to receive the address generated by the address generator, the detector circuit generating a detector signal in response to the received address.

67. A memory system comprising:

a memory storing data;

a first address generator generating a first address;

a second address generator generating a second address;

a first address initialization number generator generating a first address initialization number;

a second address initialization number generator generating a second address initialization number;

a first address change number generator generating a first address change number;

a second address change number generator generating a second address change number;

a first address initialization circuit coupled to the first address generator, coupled to the first address initialization number generator, and initializing the first address generator in response to the first address initialization number;

a second address initialization circuit coupled to the second address generator, coupled to the second address initialization number generator, and initializing the second address generator in response to the second address initialization number;

a first address update circuit coupled to the first address generator, coupled to the first address change number generator, and updating the first address generator in response to the first address change number;

a second address update circuit coupled to the second address generator, coupled to the second address change number generator, and updating the second address generator in response to the second address change number;

an accessing circuit coupled to the memory, coupled to the first address generator, coupled to the second address generator, and accessing data stored by the memory in response to the first address generated by the first address generator and in response to the second address generated by the second address generator;

a first detector circuit coupled to the first address generator and generating a first detector signal in response to detection of a change in the first address generated by the first address generator; and a second detector circuit coupled to the second address generator and generating a second detector signal in response to detection of a change in the second address generated by the second address generator.

68. A memory system comprising:

a memory storing data;

a first address generator generating a first address;

a second address generator generating a second address;

a third address generator generating a third address;

a forth address generator generating a forth address;

a first address change number generator generating a first address change number;

a second address change number generator generating a second address change number;

a third address change number generator generating a third address change number;

a forth address change number generator generating a forth address change number;

a first address initialization circuit coupled to the first address generator, coupled to the third address generator, and initializing the first address generator in response to the third address;

a second address initialization circuit coupled to the second address generator, coupled to the forth address generator, and initializing the second address generator in response to the forth address;

a first address Update circuit coupled to the first address generator, coupled to the first address change number generator, and updating the first address generator in response to the first address change number;

a second address update circuit coupled to the second address generator, coupled to the second address change number generator, and updating the second address generator in response to the second address change number;

a third address update circuit coupled to the third address generator, coupled to the third address change number generator, and updating the third address generator in response to the third address change number;

a forth address update circuit coupled to the forth address generator, coupled to the forth address change number generator, and updating the forth address generator in response to the forth address change number; and an accessing circuit coupled to the memory, coupled to the first address generator, coupled to the second address generator, and accessing data stored by the memory in response to the first address generated by the first address generator and in response to the second address generated by the second address generator.

69. A memory system comprising:

a plurality of dynamic random access memories storing data an address generator generating an address;

a continuous output tristate read accessing circuit coupled to access data stored by the plurality of dynamic random access memories, coupled to receive the address generated by the address generator, and coupled to receive a tristate control signal generated by a tristate control circuit, the continuous output tristate read accessing circuit read accessing data stored by the plurality of dynamic random access memories in response to the received address, the continuous output tristate read accessing circuit generating continuously output data without tristate disable during a plurality of sequential read accessing operations of the plurality of dynamic random access memories in response to the received tristate control signal;

a tristate control circuit coupled to the tristate read accessing circuit, the tristate control circuit generating the tristate control signal to disable the tristate read accessing circuit after generating continuously output data without tristate disable during the plurality of sequential read accessing operations of the plurality of dynamic random access memories;

a detector circuit coupled to receive the address generated by the address generator, the detector circuit generating a detector signal in response to the received address.

70. A memory system comprising:

a memory storing data;

an address generator generating an address having more significant bits, having less significant bits, and having least significant bits;

an accessing circuit coupled to the memory, coupled to the address generator, and accessing data stored by the memory in response to the address generated by the address generator;

a first detector circuit coupled to the address generator and generating a first detector signal in response to detection of a change in the more significant bits of the address generated by the address generator;

a second detector circuit coupled to the address generator and generating a second detector signal in response to detection of a change in the less significant bits of the address generated by the address generator;

a first delay circuit coupled to the first detector circuit and delaying generating of the address by the address generator for a first delay in response to the first detector signal; and a second delay circuit coupled to the second detector circuit and delaying generating of the address by the address generator for a second delay that is different from the first delay in response to the second detector signal.

71. A memory system comprising:

a plurality of dynamic random access memories storing data;

an address generator generating an address;

an extended output tristate read accessing circuit coupled to read access data stored by the plurality of dynamic random access memories, coupled to receive the address generated by the address generator and coupled to receive a tristate control signal, the extended output tristate read accessing circuit read accessing data stored by the plurality of dynamic random access memories in response to the received address, the extended output tristate read accessing circuit generating continuously output data extended during a plurality of sequential read accessing operations without tristate disable of the extended tristate read accessing circuit in response to the read accessed data and in response to the tristate control signal;

a tristate control circuit coupled to the extended output tristate read accessing circuit, the tristate control circuit generating the tristate control signal to disable the extended output tristate read accessing circuit after generating the continuously output data that is extended during the plurality of sequential read accessing operations without tristate disable of the extended tristate read accessing circuit;

a detector circuit coupled to receive the address generated by the address generator, the detector circuit generating a detector signal in response to the received address;

a scanout address update circuit coupled to receive the detector signal generated by the detector circuit and coupled to the address generator, the scanout address update circuit updating the address generated by the address generator at a first address update rate in response to a first state of the received detector signal; and a re-addressing address update circuit coupled to receive the detector signal generated by the detector circuit and coupled to the address generator, the re-addressing address update circuit updating the address generated by the address generator at a second address update rate that is lower than the first address update rate in response to a second state of the received detector signal.

72. A memory system comprising:

a memory storing data and being addressed by row address signal lines, by column address signal lines, and by external scanout address signal lines;

an address generator generating an address having more significant bits coupled to the row address signal lines of the memory, having less significant bits coupled to the column address signal lines of the memory, and having least significant bits coupled to the external scanout address signal lines of the memory;

an accessing circuit coupled to the memory, coupled to the address generator, and accessing data stored by the memory in response to the address generated by the address generator;

a first detector circuit coupled to the address generator and generating a first detector signal in response to detection of a change in the more significant bits of the address generated by the address generator;

a second detector circuit coupled to the address generator and generating a second detector signal in response to detection of a change in the less significant bits of the address generated by the address generator;

a first delay circuit coupled to the first detector circuit, coupled to the address generator, and delaying generating of the address by the address generator by a first delay in response to the first detector signal; and a second delay circuit coupled to the second detector circuit, coupled to the address generator, and delaying generating of the address by the address generator by a second delay that is shorter than from the first delay in response to the second detector signal.

73. A memory system comprising:

a dynamic random access memory storing data;

an address generator generating an address having more significant bits and having less significant bits;

an extended read accessing circuit coupled to read access data stored by the dynamic random access memory and coupled to receive the address generated by the address generator, the extended read accessing circuit continually generating output read accessed data extended without interruption during a plurality of read operations by read accessing data stored by the dynamic random access memory in response to the received address generated by the address generator; and a detector circuit coupled to receive the more significant bits of the address generated by the address generator, the detector circuit generating a detector signal in response to detection of a change in the received more significant bits of the address.

74. A memory system comprising:

a memory storing data and being addressed by row address signals on row address signal lines, by column address signals on column address signal lines, and by external scanout address signals an external scanout address signal lines;

a first address generator generating a first address and a second address generator generating a second address, wherein the first address and the second address are coupled to the row address signal lines of the memory to provide the row address signals, wherein the first address and the second address are coupled to the column address signal lines of the memory to provide column address signals, and wherein the first address and the second address are coupled to the external scanout address signal lines of the memory;

an accessing circuit coupled to the memory, coupled to the first address generator, coupled to the second address generator, and accessing data stored by the memory in response to the first address and in response to the second address;

a first detector circuit coupled to the address generator and generating a first detector signal in response to detection of a change in the row address signals on the row address signal lines of the memory;

a second detector circuit coupled to the address generator and generating a second detector signal in response to detection of a change in the column address signals on the column address signal lines of the memory;

a first delay circuit coupled to the first detector circuit, coupled to the first address generator, coupled to the second address generator, and delaying generating of the first address by the first address generator and delaying generation of the second address by the second address generator for a RAS period in response to the first detector signal; and a second delay circuit coupled to the second detector circuit, coupled to the first address generator, coupled to the second address generator, and delaying generating of the first address by the first address generator and generation of the second address by the second address generator for a CAS period that is shorter than the RAS delay in response to the second detector signal.

75. A memory system comprising:

a dynamic random access memory storing data;

an extended read accessing circuit coupled to read access data stored by the dynamic random access memory, the extended read accessing circuit read accessing the data stored by the dynamic random access memory to generate memory output data extended during a plurality of read operations; and a processor coupled to receive the memory output data that is extended during a plurality of read operations, the processor generating processed output data in response to the received output read accessed data.

76. A memory system comprising:

a memory storing data;

an address generator generating an address;

a television image processor coupled to the memory, coupled to the address generator, and processing data stored by the memory in response to the address generated by the address generator to generate television image data;

a detector circuit coupled to the address generator and generating a detector signal in response to the address;

a delaying circuit coupled to the detector circuit, coupled to the address generator, and delaying generating of the address by the address generator in response to the detector signal; and a television monitor coupled to the television image processor and displaying a television image in response to the television image data.

* * * * *